US011785844B2

(12) United States Patent
Yu et al.

(10) Patent No.: US 11,785,844 B2
(45) **Date of Patent: *Oct. 10, 2023**

(54) ORGANIC LIGHT EMITTING DEVICE, METHOD FOR MANUFACTURING SAME AND COMPOSITION FOR ORGANIC MATERIAL LAYER

(71) Applicant: LT MATERIALS CO., LTD., Yongin-Si (KR)

(72) Inventors: Seok-Hyeon Yu, Yongin (KR); Geon-Yu Park, Yongin (KR); Young-Seok No, Yongin (KR); Dong-Jun Kim, Yongin (KR)

(73) Assignee: LT MATERIALS CO., LTD., Yongin-si (KR)

( * ) Notice: Subject to any disclaimer, the term of this patent is extended or adjusted under 35 U.S.C. 154(b) by 495 days.

This patent is subject to a terminal disclaimer.

(21) Appl. No.: 16/938,147

(22) Filed: Jul. 24, 2020

(65) Prior Publication Data

US 2021/0057651 A1 Feb. 25, 2021

(30) Foreign Application Priority Data

Aug. 23, 2019 (KR) ........................ 10-2019-0103920

(51) Int. Cl.

| | |
|---|---|
| ***H10K 85/60*** | (2023.01) |
| ***C09K 11/02*** | (2006.01) |
| ***C09K 11/06*** | (2006.01) |
| *H10K 50/11* | (2023.01) |
| *H10K 50/15* | (2023.01) |
| *H10K 50/16* | (2023.01) |
| *H10K 50/17* | (2023.01) |
| *H10K 50/18* | (2023.01) |
| *H10K 71/00* | (2023.01) |
| *H10K 71/16* | (2023.01) |
| *H10K 101/10* | (2023.01) |

(52) U.S. Cl.

CPC .......... *H10K 85/6572* (2023.02); *C09K 11/02* (2013.01); *C09K 11/06* (2013.01); *H10K 85/654* (2023.02); *H10K 85/6574* (2023.02); *H10K 85/6576* (2023.02); *C09K 2211/1007* (2013.01); *C09K 2211/1029* (2013.01); *C09K 2211/185* (2013.01); *H10K 50/11* (2023.02); *H10K 50/15* (2023.02); *H10K 50/16* (2023.02); *H10K 50/17* (2023.02); *H10K 50/171* (2023.02); *H10K 50/18* (2023.02); *H10K 71/00* (2023.02); *H10K 71/164* (2023.02); *H10K 2101/10* (2023.02)

(58) Field of Classification Search

CPC ............. H10K 85/6572; H10K 85/654; H10K 85/6574; H10K 85/6576; H10K 50/11; H10K 50/15; H10K 50/16; H10K 50/17; H10K 50/171; H10K 50/18; H10K 71/00; H10K 71/164; H10K 2101/10; H10K 2101/90; H10K 85/657; H10K 85/624; H10K 85/649; H10K 50/12; C09K 11/02; C09K 11/06; C09K 2211/1007; C09K 2211/1029; C09K 2211/185; C07D 405/14; C07D 409/04; C07D 409/14; C07D 487/04; C07D 491/04; C07D 495/04

USPC .......................................................... 428/690

See application file for complete search history.

(56) References Cited

U.S. PATENT DOCUMENTS

| | | | | |
|---|---|---|---|---|
| 4,356,429 A | 10/1982 | Tang | | |
| 9,732,069 B2 | 8/2017 | Lee et al. | | |
| 10,026,908 B2 | 7/2018 | Park et al. | | |
| 10,381,577 B2 | 8/2019 | Park et al. | | |
| 11,387,418 B2 * | 7/2022 | No | ......................... | C09K 11/06 |
| 2017/0054087 A1 | 2/2017 | Zeng et al. | | |
| 2017/0331052 A1 * | 11/2017 | Park | ....................... | C09K 11/06 |
| 2017/0358756 A1 | 12/2017 | Chung et al. | | |
| 2018/0037546 A1 | 2/2018 | Sugino et al. | | |
| 2019/0372012 A1 | 12/2019 | Cho et al. | | |
| 2020/0111969 A1 | 4/2020 | No et al. | | |
| 2020/0119285 A1 | 4/2020 | No et al. | | |
| 2020/0381629 A1 * | 12/2020 | No | ....................... | C07D 519/00 |
| 2021/0094914 A1 * | 4/2021 | Park | ..................... | H10K 85/631 |

FOREIGN PATENT DOCUMENTS

| | | | | |
|---|---|---|---|---|
| KR | 10-2015-0134248 A | 12/2015 | | |
| KR | 10-2017-0013153 A | 2/2017 | | |
| KR | 10-1693744 B1 | 2/2017 | | |
| KR | 10-2017-0102000 A | 9/2017 | | |
| KR | 10-2017-0140989 A | 12/2017 | | |
| KR | 10-1856728 B1 | 5/2018 | | |
| KR | 10-2018-0096444 A | 8/2018 | | |
| KR | 10-2018-0108427 A | 10/2018 | | |
| KR | 10-2018-0108428 A | 10/2018 | | |
| KR | 10-2019-0030963 A | 3/2019 | | |
| WO | WO-2018174681 A1 * | 9/2018 | ........... | C07D 209/86 |
| WO | WO 2019/066250 A1 | 4/2019 | | |

OTHER PUBLICATIONS

Kuwahara et al., “Thermally Stable Multilayered Organic Electroluminescent Devices Using Novel Starburst Molecules, 4,4' ,4"-Tri(N-carbazolyl)triphenylamine (TCTA) and 4,4' ,4"-Tris(3-methylphenylphenylamino)triphenylamine (m-MTDATA), as Hole-Transport Materials”, Advanced Material, vol. 6, No. 9, 1994, pp. 677-679.

* cited by examiner

*Primary Examiner* — Douglas J McGinty

(74) *Attorney, Agent, or Firm* — Birch, Stewart, Kolasch & Birch, LLP

(57) ABSTRACT

The present specification relates to an organic light emitting device, a method for manufacturing the same, and a composition for an organic material layer.

17 Claims, 2 Drawing Sheets

【FIG. 1】
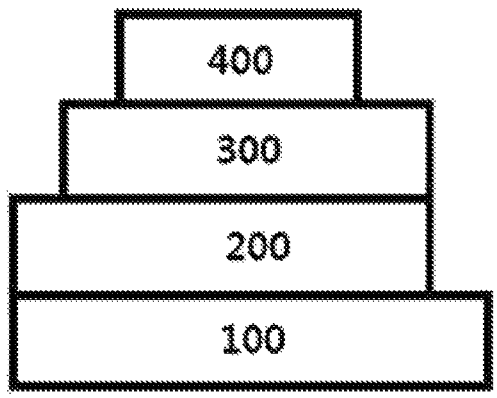
【FIG. 2】
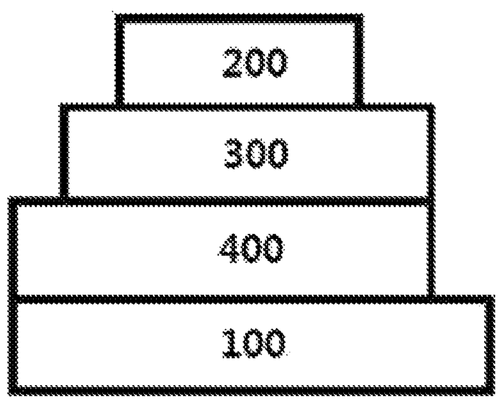

【FIG. 3】
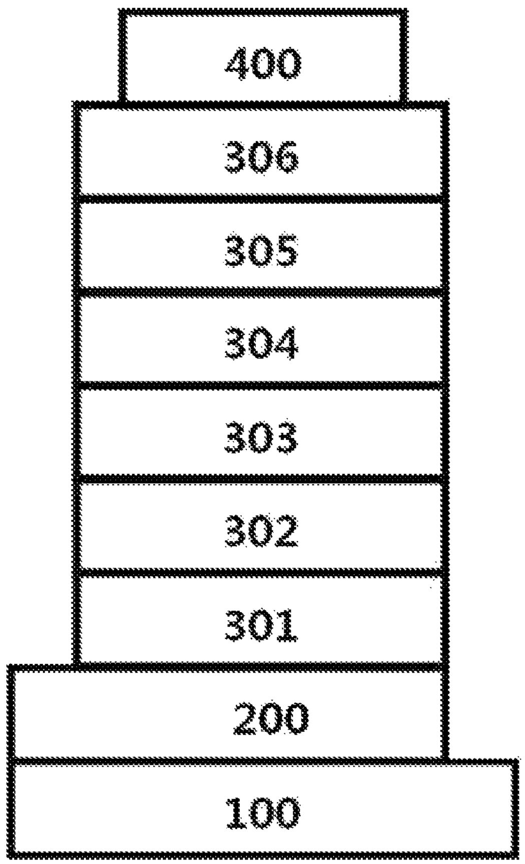

ORGANIC LIGHT EMITTING DEVICE, METHOD FOR MANUFACTURING SAME AND COMPOSITION FOR ORGANIC MATERIAL LAYER

TECHNICAL FIELD

This application claims priority to and the benefits of Korean Patent Application No. 10-2019-0103920, filed with the Korean Intellectual Property Office on Aug. 23, 2019, the entire contents of which are incorporated herein by reference.

The present specification relates to an organic light emitting device, a method for manufacturing the same, and a composition for an organic material layer.

BACKGROUND ART

An electroluminescent device is one type of self-emissive display devices, and has an advantage of having a wide viewing angle, and a high response speed as well as having an excellent contrast.

An organic light emitting device has a structure disposing an organic thin film between two electrodes. When a voltage is applied to an organic light emitting device having such a structure, electrons and holes injected from the two electrodes bind and pair in the organic thin film, and light emits as these annihilate. The organic thin film may be formed in a single layer or a multilayer as necessary.

A material of the organic thin film may have a light emitting function as necessary. For example, as a material of the organic thin film, compounds capable of forming a light emitting layer themselves alone may be used, or compounds capable of performing a role of a host or a dopant of a host-dopant-based light emitting layer may also be used. In addition thereto, compounds capable of performing roles of hole injection, hole transfer, electron blocking, hole blocking, electron transfer, electron injection and the like may also be used as a material of the organic thin film.

Development of an organic thin film material has been continuously required for enhancing performance, lifetime or efficiency of an organic light emitting device.

PRIOR ART DOCUMENTS

Patent Documents (Patent Document 1) U.S. Pat. No. 4,356,429

DISCLOSURE

Technical Problem

The present application relates to an organic light emitting device, a method for manufacturing the same, and a composition for an organic material layer.

Technical Solution

One embodiment of the present application provides an organic light emitting device comprising a first electrode, a second electrode, and one or more organic material layers provided between the first electrode and the second electrode, wherein one or more layers of the organic material layers comprise a heterocyclic compound represented by the following Chemical Formula 1 and a heterocyclic compound represented by the following Chemical Formula 24.

[Chemical Formula 1]

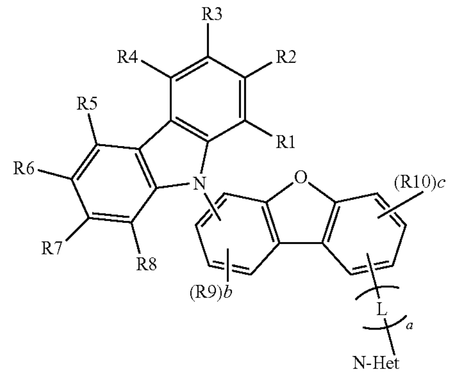

[Chemical Formula 24]

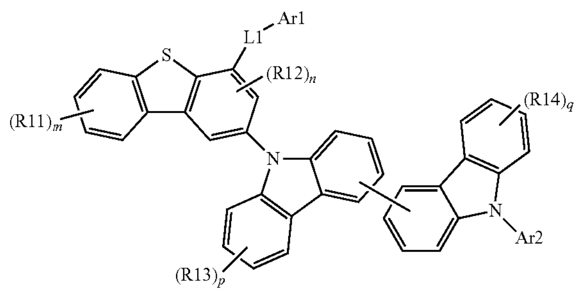

In Chemical Formulae 1 and 24,

N-Het is a monocyclic or polycyclic heterocyclic group substituted or unsubstituted and comprising one or more Ns, L and L1 are a direct bond; a substituted or unsubstituted C6 to C60 arylene group; or a substituted or unsubstituted C2 to C60 heteroarylene group, a is an integer of 1 to 3, and when a is 2 or greater, Ls are the same as or different from each other, R1 to R14 are the same as or different from each other, and each independently selected from the group consisting of hydrogen; deuterium; halogen; a cyano group; a substituted or unsubstituted C1 to C60 alkyl group; a substituted or unsubstituted C2 to C60 alkenyl group; a substituted or unsubstituted C2 to C60 alkynyl group; a substituted or unsubstituted C2 to C60 alkoxy group; a substituted or unsubstituted C3 to C60 cycloalkyl group; a substituted or unsubstituted C2 to C60 heterocycloalkyl group; a substituted or unsubstituted C6 to C60 aryl group; a substituted or unsubstituted C2 to C60 heteroaryl group; a substituted or unsubstituted phosphine oxide group; and a substituted or unsubstituted amine group, or two or more groups adjacent to each other bond to each other to form a substituted or unsubstituted C6 to C60 aromatic hydrocarbon ring or a substituted or unsubstituted C2 to C60 heteroring, b and c are each an integer of 1 to 3, and when b is 2 or greater, R9s are the same as or different from each other, and when c is 2 or greater, R10s are the same as or different from each other, m, p and q are an integer of 0 to 4, n is an integer of 0 to 2, when m is 2 or greater, R11s are the same as or different from each other, when n is an integer of 2, R12s are the same as or different from each other, when p is 2 or greater, R13s are the same as or different from each other, and when q is 2 or greater, R14s are the same as or different from each other, Ar1 is a substituted or unsubstituted C6 to C60 aryl group; or a C2 to C60 heteroaryl group substituted or unsubstituted and comprising at least one of S and O, and Ar2 is a substituted or unsubstituted C6 to C60 aryl group; or a substituted or unsubstituted C2 to C60 heteroaryl group.

In addition, another embodiment of the present application provides a composition for an organic material layer of an organic light emitting device, the composition comprising the heterocyclic compound represented by Chemical Formula 1 and the heterocyclic compound represented by Chemical Formula 24.

Lastly, one embodiment of the present application provides a method for manufacturing an organic light emitting device, the method comprising preparing a substrate; forming a first electrode on the substrate; forming one or more organic material layers on the first electrode; and forming a second electrode on the organic material layer, wherein the forming of organic material layers comprises forming one or more organic material layers using the composition for an organic material layer according to the present application.

Advantageous Effects

A heterocyclic compound according to one embodiment of the present application can be used as a material of an organic material layer of an organic light emitting device. The heterocyclic compound can be used as a material of a hole injection layer, a hole transfer layer, a light emitting layer, an electron transfer layer, an electron injection layer, a charge generation layer or the like in an organic light emitting device. Particularly, a heterocyclic compound represented by Chemical Formula 1; and a compound represented by Chemical Formula 24 can be used as a material of a light emitting layer of an organic light emitting device at the same time. In addition, when using the heterocyclic compound represented by Chemical Formula 1 and the heterocyclic compound represented by Chemical Formula 2 in an organic light emitting device at the same time, a driving voltage of the device can be lowered, light efficiency can be enhanced, and lifetime properties of the device can be enhanced by thermal stability of the compound.

Particularly, a more electron stable structure is obtained in the heterocyclic compound represented by Chemical Formula 1 by the benzene ring on one side of the dibenzofuran structure being substituted with an N-containing ring and the benzene ring not substituted with the N-containing ring in the dibenzofuran structure being substituted with a carbazole structure, and as a result, a device lifetime can be enhanced.

DESCRIPTION OF DRAWINGS

FIG. 1 to FIG. 3 are diagrams each schematically illustrating a lamination structure of an organic light emitting device according to one embodiment of the present application.

MODE FOR DISCLOSURE

Hereinafter, the present application will be described in detail.

A term "substitution" means a hydrogen atom bonding to a carbon atom of a compound being changed to another substituent, and the position of substitution is not limited as long as it is a position at which the hydrogen atom is substituted, that is, a position at which a substituent can substitute, and when two or more substituents substitute, the two or more substituents may be the same as or different from each other.

In the present specification, "substituted or unsubstituted" means being substituted with one or more substituents selected from the group consisting of C1 to C60 linear or branched alkyl; C2 to C60 linear or branched alkenyl; C2 to C60 linear or branched alkynyl; C3 to C60 monocyclic or polycyclic cycloalkyl; C2 to C60 monocyclic or polycyclic heterocycloalkyl; C6 to C60 monocyclic or polycyclic aryl; C2 to C60 monocyclic or polycyclic heteroaryl; —SiRR'R"; P(═O)RR'; C1 to C20 alkylamine; C6 to C60 monocyclic or polycyclic arylamine; and C2 to C60 monocyclic or polycyclic heteroarylamine, or being unsubstituted, or being substituted with a substituent linking two or more substituents selected from among the substituents illustrated above, or being unsubstituted. R, R' and R" are the same as or different from each other, and each independently hydrogen; deuterium; a cyano group; a substituted or unsubstituted alkyl group; a substituted or unsubstituted cycloalkyl group; a substituted or unsubstituted aryl group; or a substituted or unsubstituted heteroaryl group.

In one embodiment of the present application, R, R' and R" are the same as or different from each other, and may be each independently hydrogen; a substituted or unsubstituted alkyl group; a substituted or unsubstituted aryl group; or a substituted or unsubstituted heteroaryl group.

In the present specification, the halogen may be fluorine, chlorine, bromine or iodine.

In the present specification, the alkyl group comprises linear or branched having 1 to 60 carbon atoms, and may be further substituted with other substituents. The number of carbon atoms of the alkyl group may be from 1 to 60, specifically from 1 to 40 and more specifically from 1 to 20. Specific examples thereof may comprise a methyl group, an ethyl group, a propyl group, an n-propyl group, an isopropyl group, a butyl group, an n-butyl group, an isobutyl group, a tert-butyl group, a sec-butyl group, a 1-methyl-butyl group, a 1-ethyl-butyl group, a pentyl group, an n-pentyl group, an isopentyl group, a neopentyl group, a tert-pentyl group, a hexyl group, an n-hexyl group, a 1-methylpentyl group, a 2-methylpentyl group, a 4-methyl-2-pentyl group, a 3,3-dimethylbutyl group, a 2-ethylbutyl group, a heptyl group, an n-heptyl group, a 1-methylhexyl group, a cyclopentylmethyl group, a cyclohexylmethyl group, an octyl group, an n-octyl group, a tert-octyl group, a 1-methylheptyl group, a 2-ethylhexyl group, a 2-propylpentyl group, an n-nonyl group, a 2,2-dimethylheptyl group, a 1-ethyl-propyl group, a 1,1-dimethyl-propyl group, an isohexyl group, a 2-methylpentyl group, a 4-methylhexyl group, a 5-methylhexyl group and the like, but are not limited thereto.

In the present specification, the alkenyl group comprises linear or branched having 2 to 60 carbon atoms, and may be further substituted with other substituents. The number of carbon atoms of the alkenyl group may be from 2 to 60, specifically from 2 to 40 and more specifically from 2 to 20. Specific examples thereof may comprise a vinyl group, a 1-propenyl group, an isopropenyl group, a 1-butenyl group, a 2-butenyl group, a 3-butenyl group, a 1-pentenyl group, a 2-pentenyl group, a 3-pentenyl group, a 3-methyl-1-butenyl group, a 1,3-butadienyl group, an allyl group, a 1-phenylvinyl-1-yl group, a 2-phenylvinyl-1-yl group, a 2,2-diphenylvinyl-1-yl group, a 2-phenyl-2-(naphthyl-1-yl)vinyl-1-yl group, a 2,2-bis(diphenyl-1-yl)vinyl-1-yl group, a stilbenyl group, a styrenyl group and the like, but are not limited thereto.

In the present specification, the alkynyl group comprises linear or branched having 2 to 60 carbon atoms, and may be further substituted with other substituents. The number of carbon atoms of the alkynyl group may be from 2 to 60, specifically from 2 to 40 and more specifically from 2 to 20.

In the present specification, the alkoxy group may be linear, branched or cyclic. The number of carbon atoms of the alkoxy group is not particularly limited, but is preferably from 1 to 20. Specific examples thereof may comprise methoxy, ethoxy, n-propoxy, isopropoxy, n-butoxy, isobutoxy, tert-butoxy, sec-butoxy, n-pentyloxy, neopentyloxy, isopentyloxy, n-hexyloxy, 3,3-dimethylbutyloxy, 2-ethylbutyloxy, n-octyloxy, n-nonyloxy, n-decyloxy, benxyloxy, p-methylbenzyloxy and the like, but are not limited thereto.

In the present specification, the cycloalkyl group comprises monocyclic or polycyclic having 3 to 60 carbon atoms, and may be further substituted with other substituents. Herein, the polycyclic means a group in which the cycloalkyl group is directly linked to or fused with other cyclic groups. Herein, the other cyclic groups may be a cycloalkyl group, but may also be different types of cyclic groups such as a heterocycloalkyl group, an aryl group and a heteroaryl group. The number of carbon groups of the cycloalkyl group may be from 3 to 60, specifically from 3 to 40 and more specifically from 5 to 20. Specific examples thereof may comprise a cyclopropyl group, a cyclobutyl group, a cyclopentyl group, a 3-methylcyclopentyl group, a 2,3-dimethylcyclopentyl group, a cyclohexyl group, a 3-methylcyclohexyl group, a 4-methylcyclohexyl group, a 2,3-dimethylcyclohexyl group, a 3,4,5-trimethylcyclohexyl group, a 4-tert-butylcyclohexyl group, a cycloheptyl group, a cyclooctyl group and the like, but are not limited thereto.

In the present specification, the heterocycloalkyl group comprises O, S, Se, N or Si as a heteroatom, comprises monocyclic or polycyclic having 2 to 60 carbon atoms, and may be further substituted with other substituents. Herein, the polycyclic means a group in which the heterocycloalkyl group is directly linked to or fused with other cyclic groups. Herein, the other cyclic groups may be a heterocycloalkyl group, but may also be different types of cyclic groups such as a cycloalkyl group, an aryl group and a heteroaryl group. The number of carbon atoms of the heterocycloalkyl group may be from 2 to 60, specifically from 2 to 40 and more specifically from 3 to 20.

In the present specification, the aryl group comprises monocyclic or polycyclic having 6 to 60 carbon atoms, and may be further substituted with other substituents. Herein, the polycyclic means a group in which the aryl group is directly linked to or fused with other cyclic groups. Herein, the other cyclic groups may be an aryl group, but may also be different types of cyclic groups such as a cycloalkyl group, a heterocycloalkyl group and a heteroaryl group. The aryl group comprises a spiro group. The number of carbon atoms of the aryl group may be from 6 to 60, specifically from 6 to 40 and more specifically from 6 to 25. Specific examples of the aryl group may comprise a phenyl group, a biphenyl group, a triphenyl group, a naphthyl group, an anthryl group, a chrysenyl group, a phenanthrenyl group, a perylenyl group, a fluoranthenyl group, a triphenylenyl group, a phenalenyl group, a pyrenyl group, a tetracenyl group, a pentacenyl group, a fluorenyl group, an indenyl group, an acenaphthylenyl group, a benzofluorenyl group, a spirobifluorenyl group, a 2,3-dihydro-1H-indenyl group, a fused ring thereof, and the like, but are not limited thereto.

In the present specification, the fluorenyl group may be substituted, and adjacent substituents may bond to each other to form a ring.

When the fluorenyl group is substituted,

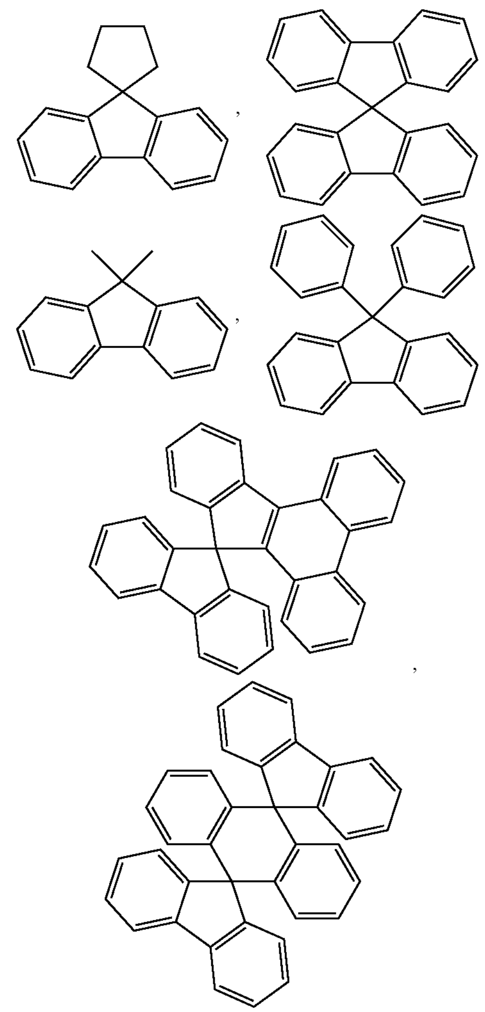

and the like may be included, however, the structure is not limited thereto.

In the present specification, the heteroaryl group comprises O, S, Se, N or Si as a heteroatom, comprises monocyclic or polycyclic having 2 to 60 carbon atoms, and may be further substituted with other substituents. Herein, the polycyclic means a group in which the heteroaryl group is directly linked to or fused with other cyclic groups. Herein, the other cyclic groups may be a heteroaryl group, but may also be different types of cyclic groups such as a cycloalkyl group, a heterocycloalkyl group and an aryl group. The number of carbon atoms of the heteroaryl group may be from 2 to 60, specifically from 2 to 40 and more specifically from 3 to 25. Specific examples of the heteroaryl group may comprise a pyridyl group, a pyrrolyl group, a pyrimidyl group, a pyridazinyl group, a furanyl group, a thiophene group, an imidazolyl group, a pyrazolyl group, an oxazolyl group, an isoxazolyl group, a thiazolyl group, an isothiazolyl group, a triazolyl group, a furazanyl group, an oxadiazolyl group, a thiadiazolyl group, a dithiazolyl group, a tetrazolyl group, a pyranyl group, a thiopyranyl group, a diazinyl group, an oxazinyl group, a thiazinyl group, a dioxynyl group, a triazinyl group, a tetrazinyl group, a quinolyl group, an isoquinolyl group, a quinazolinyl group, an isoquinazolinyl group, a qninozolinyl group, a naphthyridyl group, an acridinyl group, a phenanthridinyl group, an imidazopyridinyl group, a diazanaphthalenyl group, a triazaindene group, an indolyl group, an indolizinyl group, a benzothiazolyl group, a benzoxazolyl group, a benzimidazolyl group, a benzothiophene group, a benzofuran group, a dibenzothiophene group, a dibenzofuran group, a carbazolyl group, a benzocarbazolyl group, a dibenzocarbazolyl group, a phenazinyl group, a dibenzosilole group, spirobi(dibenzosilole), a dihydrophenazinyl group, a phenoxazinyl group, a phenanthridyl group, an imidazopyridinyl group, a thienyl group, an indolo[2,3-a]carbazolyl group, an indolo[2,3-b]carbazolyl group, an indolinyl group, a 10,11-dihydrodibenzo[b,f]azepine group, a 9,10-dihydroacridinyl group, a phenanthrazinyl group, a phenothiathiazinyl group, a phthalazinyl group, a naphthylidinyl group, a phenanthrolinyl group, a benzo[c][1,2,5]thiadiazolyl group, a 5,10-dihydrobenzo[b,e][1,4]azasilinyl, a pyrazolo[1,5-c]quinazolinyl group, a pyrido[1,2-b]indazolyl group, a pyrido[1,2-a]imidazo[1,2-e]indolinyl group, a 5,11-dihydroindeno[1,2-b]carbazolyl group and the like, but are not limited thereto.

In the present specification, the amine group may be selected from the group consisting of a monoalkylamine group; a monoarylamine group; a monoheteroarylamine group; $—NH_2$; a dialkylamine group; a diarylamine group; a diheteroarylamine group; an alkylarylamine group; an alkylheteroarylamine group; and an arylheteroarylamine group, and although not particularly limited thereto, the number of carbon atoms is preferably from 1 to 30. Specific examples of the amine group may comprise a methylamine group, a dimethylamine group, an ethylamine group, a diethylamine group, a phenylamine group, a naphthylamine group, a biphenylamine group, a dibiphenylamine group, an anthracenylamine group, a 9-methyl-anthracenylamine group, a diphenylamine group, a phenylnaphthylamine group, a ditolylamine group, a phenyltolylamine group, a triphenylamine group, a biphenylnaphthylamine group, a phenylbiphenylamine group, a biphenylfluorenylamine group, a phenyltriphenylenylamine group, a biphenyltriphenylenylamine group and the like, but are not limited thereto.

In the present specification, the arylene group means the aryl group having two bonding sites, that is, a divalent group. Descriptions on the aryl group provided above may be applied thereto except for those that are each a divalent. In addition, the heteroarylene group means the heteroaryl group having two bonding sites, that is, a divalent group. Descriptions on the heteroaryl group provided above may be applied thereto except for those that are each a divalent.

In the present specification, the phosphine oxide group is represented by $—P(=O)R_{101}R_{102}$, and $R_{101}$ and $R_{102}$ are the same as or different from each other and may be each independently a substituent formed with at least one of hydrogen; deuterium; a halogen group; alkyl group; alkenyl group; alkoxy group; cycloalkyl group; aryl group; and heterocyclic group. Specifically, the phosphine oxide group may be specifically substituted with an aryl group, and as the aryl group, examples described above may be used. Examples of the phosphine oxide group may comprise a diphenylphosphine oxide group, a dinaphthylphosphine oxide group and the like, but are not limited thereto.

In the present specification, the silyl group is a substituent comprising Si, having the Si atom directly linked as a radical, and is represented by $—SiR_{104}R_{105}R_{106}$. $R_{104}$ to $R_{106}$ are the same as or different from each other, and may be each independently a substituent formed with at least one of hydrogen; deuterium; a halogen group; an alkyl group; an alkenyl group; an alkoxy group; a cycloalkyl group; an aryl group; and a heterocyclic group. Specific examples of the silyl group may comprise a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group and the like, but are not limited thereto.

In the present specification, an "adjacent" group may mean a substituent substituting an atom directly linked to an atom substituted by the corresponding substituent, a substituent sterically most closely positioned to the corresponding substituent, or another substituent substituting an atom substituted by the corresponding substituent. For example, two substituents substituting ortho positions in a benzene ring, and two substituents substituting the same carbon in an aliphatic ring may be interpreted as groups "adjacent" to each other.

As the aliphatic or aromatic hydrocarbon ring or heteroring that adjacent groups may form, the structures illustrated as the cycloalkyl group, the cycloheteroalkyl group, the aryl group and the heteroaryl group described above may be used except for those that are not monovalent.

One embodiment of the present application provides an organic light emitting device comprising a first electrode, a second electrode, and one or more organic material layers provided between the first electrode and the second electrode, wherein one or more layers of the organic material layers comprise a heterocyclic compound represented by Chemical Formula 1 and a heterocyclic compound represented by Chemical Formula 24.

In one embodiment of the present application, Chemical Formula 1 may be represented by the following Chemical Formula 2 or Chemical Formula 3.

[Chemical Formula 2]

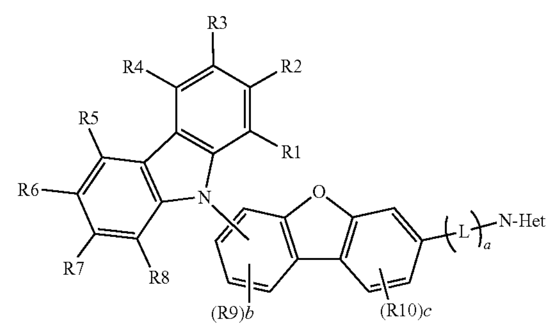

[Chemical Formula 3]

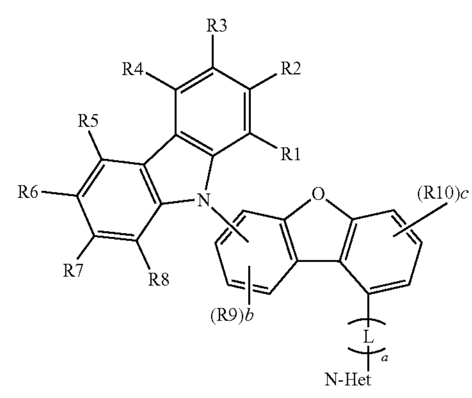

In Chemical Formulae 2 and 3,

R1 to R10, L, N-Het, a, b and c have the same definitions as in Chemical Formula 1.

In one embodiment of the present application, Chemical Formula 2 may be represented by any one of the following Chemical Formulae 4 to 7.

[Chemical Formula 4]

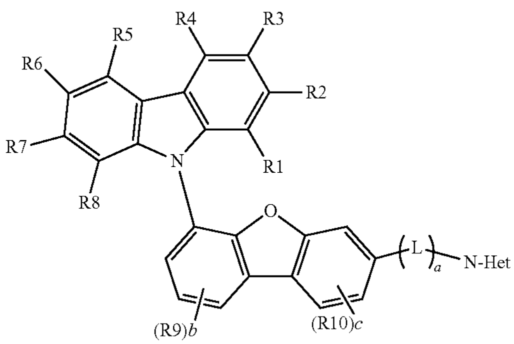

[Chemical Formula 5]

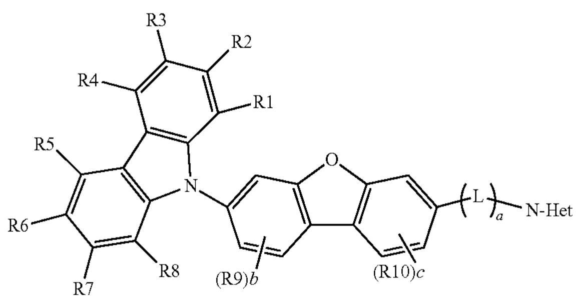

[Chemical Formula 6]

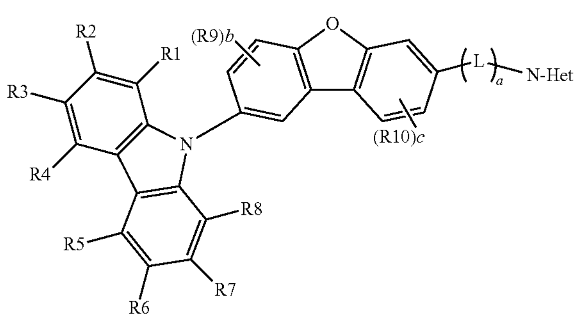

[Chemical Formula 7]

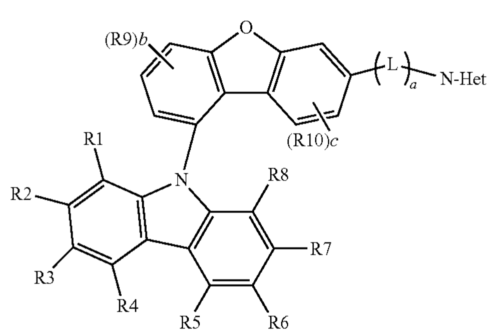

In Chemical Formulae 4 to 7,

R1 to R10, L, N-Het, a, b and c have the same definitions as in Chemical Formula 2.

In one embodiment of the present application, Chemical Formula 3 may be represented by one of the following Chemical Formulae 8 to 11.

[Chemical Formula 8]

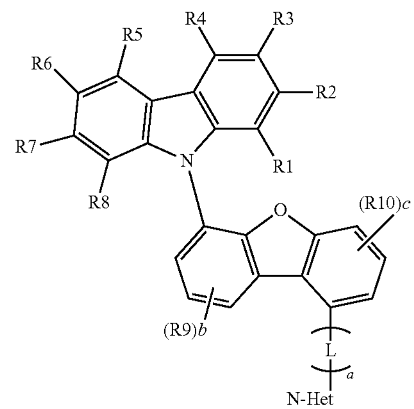

[Chemical Formula 9]

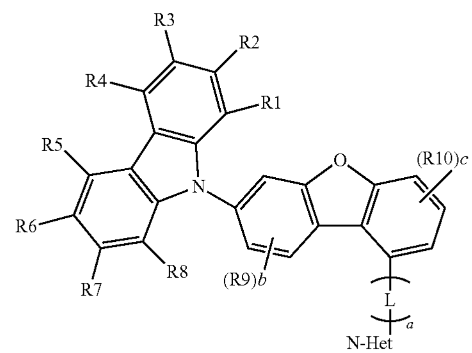

[Chemical Formula 10]

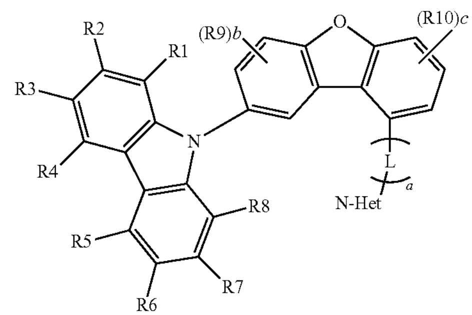

[Chemical Formula 11]

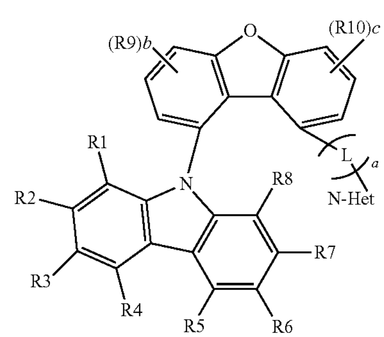

In Chemical Formulae 8 to 11,

R1 to R10, L, N-Het, a, b and c have the same definitions as in Chemical Formula 3.

In one embodiment of the present application, the N-Het is a monocyclic or polycyclic heteroring substituted or unsubstituted, and comprising one or more Ns.

In another embodiment, the N-Het is a monocyclic or polycyclic heteroring unsubstituted or substituted with one or more substituents selected from the group consisting of an aryl group and a heteroaryl group, and comprising one or more Ns.

In another embodiment, the N-Het is a monocyclic or polycyclic heteroring unsubstituted or substituted with one or more substituents selected from the group consisting of a phenyl group, a biphenyl group, a naphthyl group, a dimethylfluorene group, a dibenzofuran group and a dibenzothiophene group, and comprising one or more Ns.

In another embodiment, the N-Het is a monocyclic or polycyclic heteroring unsubstituted or substituted with one or more substituents selected from the group consisting of a phenyl group, a biphenyl group, a naphthyl group, a dimethylfluorene group, a dibenzofuran group and a dibenzothiophene group, and comprising one or more and three or less Ns.

In one embodiment of the present application, the N-Het is a monocyclic heteroring substituted or unsubstituted, and comprising one or more Ns.

In one embodiment of the present application, the N-Het is a divalent or higher heteroring substituted or unsubstituted, and comprising one or more Ns.

In one embodiment of the present application, the N-Het is a monocyclic or polycyclic heteroring substituted or unsubstituted, and comprising two or more Ns.

In one embodiment of the present application, the N-Het is a divalent or higher polycyclic heteroring comprising two or more Ns.

In one embodiment of the present application, Chemical Formula 1 is represented by one of the following Chemical Formulae 12 to 14.

[Chemical Formula 12]

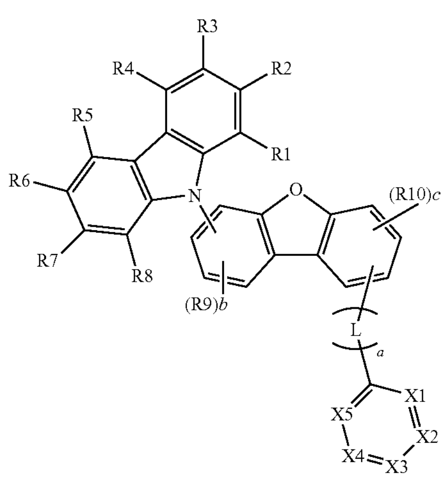

-continued

[Chemical Formula 13]

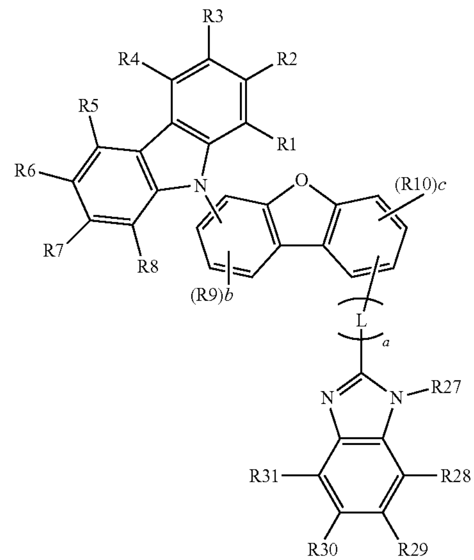

[Chemical Formula 14]

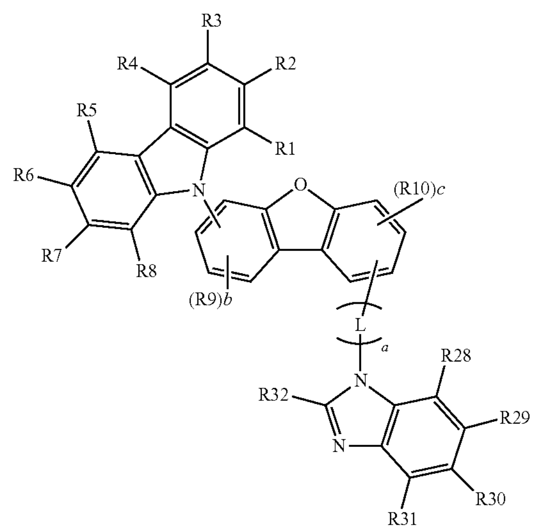

In Chemical Formulae 12 to 14,

X1 is CR21 or N, X2 is CR22 or N, X3 is CR23 or N, X4 is CR24 or N, X5 is CR25 or N, and at least one of X1 to X5 is N, R21 to R25 and R27 to R32는 are the same as or different from each other, and each independently selected from the group consisting of hydrogen; deuterium; halogen; a cyano group; a substituted or unsubstituted C1 to C60 alkyl group; a substituted or unsubstituted C2 to C60 alkenyl group; a substituted or unsubstituted C2 to C60 alkynyl group; a substituted or unsubstituted C2 to C60 alkoxy group; a substituted or unsubstituted C3 to C60 cycloalkyl group; a substituted or unsubstituted C2 to C60 heterocycloalkyl group; a substituted or unsubstituted C6 to C60 aryl group; a substituted or unsubstituted C2 to C60 heteroaryl group; a substituted or unsubstituted phosphine oxide group; and a substituted or unsubstituted amine group, or two or more groups adjacent to each other bond to each other to form a substituted or unsubstituted C6 to C60 aromatic hydrocarbon ring or a substituted or unsubstituted C2 to C60 heteroring.

In one embodiment of the present application,

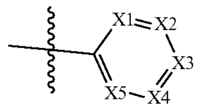

of Chemical Formula 12 may be represented by one of the following Chemical Formulae 15 to 18. Herein,

is site linked to L.

[Chemical Formula 15]

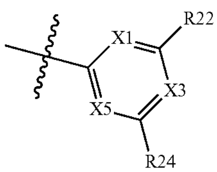

[Chemical Formula 16]

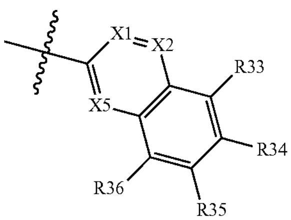

[Chemical Formula 17]

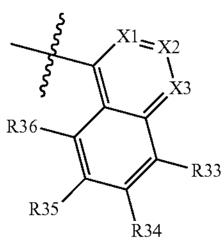

[Chemical Formula 18]

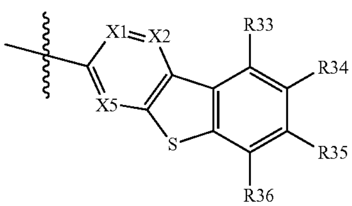

In Chemical Formula 15, one or more of X1, X3 and X5 are N, and the rest have the same definitions as in Chemical Formula 12, in Chemical Formula 16, one or more of X1, X2 and X5 are N, and the rest have the same definitions as in Chemical Formula 12, in Chemical Formula 17, one or more of X1 to X3 are N, and the rest have the same definitions as in Chemical Formula 12, in Chemical Formula 18, one or more of X1, X2 and X5 are N, and the rest have the same definitions as in Chemical Formula 12, and R22, R24 and R33 to R36 are the same as or different from each other, and each independently selected from the group consisting of hydrogen; deuterium; halogen; a cyano group; a substituted or unsubstituted C1 to C60 alkyl group; a substituted or unsubstituted C2 to C60 alkenyl group; a substituted or unsubstituted C2 to C60 alkynyl group; a substituted or unsubstituted C2 to C60 alkoxy group; a substituted or unsubstituted C3 to C60 cycloalkyl group; a substituted or unsubstituted C2 to C60 heterocycloalkyl group; a substituted or unsubstituted C6 to C60 aryl group; a substituted or unsubstituted C2 to C60 heteroaryl group; a substituted or unsubstituted phosphine oxide group; and a substituted or unsubstituted amine group, or two or more groups adjacent to each other bond to each other to form a substituted or unsubstituted C6 to C60 aromatic hydrocarbon ring or a substituted or unsubstituted C2 to C60 heteroring.

In one embodiment of the present application, Chemical Formula 15 may be selected from among the following structural formulae.

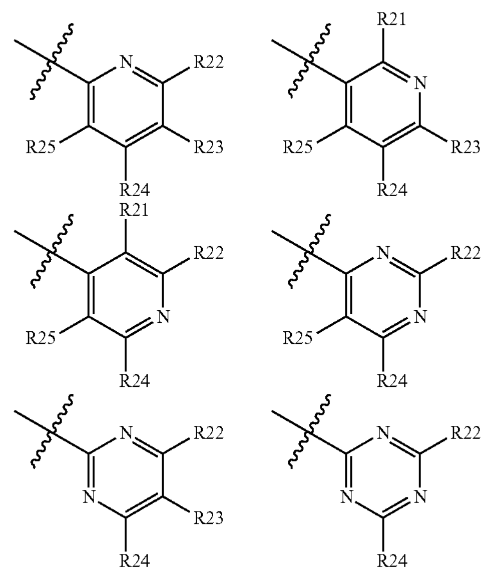

In the structures, R21 to R25 have the same definitions as in Chemical Formula 15.

In one embodiment of the present application, Chemical Formula 16 may be represented by the following Chemical Formula 19.

[Chemical Formula 19]

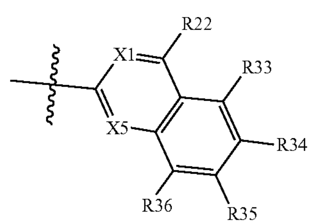

Substituents of Chemical Formula 19 have the same definitions as in Chemical Formula 16.

In one embodiment of the present application, Chemical Formula 17 may be represented by the following Chemical Formula 20.

[Chemical Formula 20]

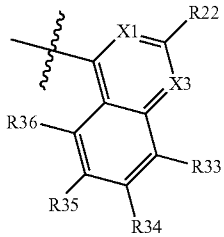

Substituents of Chemical Formula 20 have the same definitions as in Chemical Formula 17.

In one embodiment of the present application, Chemical Formula 16 may be represented by the following Chemical Formula 21.

[Chemical Formula 21]

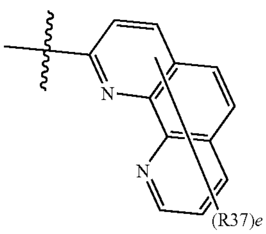

In Chemical Formula 21,

R37 is selected from the group consisting of hydrogen; deuterium; halogen; a cyano group; a substituted or unsubstituted C1 to C60 alkyl group; a substituted or unsubstituted C2 to C60 alkenyl group; a substituted or unsubstituted C2 to C60 alkynyl group; a substituted or unsubstituted C2 to C60 alkoxy group; a substituted or unsubstituted C3 to C60 cycloalkyl group; a substituted or unsubstituted C2 to C60 heterocycloalkyl group; a substituted or unsubstituted C6 to C60 aryl group; a substituted or unsubstituted C2 to C60 heteroaryl group; a substituted or unsubstituted phosphine oxide group; and a substituted or unsubstituted amine group, or two or more groups adjacent to each other bond to each other to form a substituted or unsubstituted C6 to C60 aromatic hydrocarbon ring or a substituted or unsubstituted C2 to C60 heteroring, e is an integer of 0 to 7, and when e is 2 or greater, R37s are the same as or different from each other.

In one embodiment of the present application, Chemical Formula 18 may be represented by the following Chemical Formula 22.

[Chemical Formula 22]

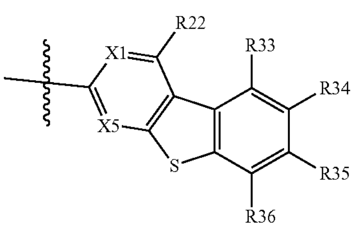

Substituents of Chemical Formula 22 have the same definitions as in Chemical Formula 18.

In one embodiment of the present application, L is a direct bond or a C6 to C60 arylene group.

In another embodiment, L is a direct bond or a phenylene group.

In another embodiment, R9 and R10 are hydrogen; or deuterium.

In another embodiment, R9 and R10 are hydrogen.

In another embodiment, R1 to R8 are hydrogen; deuterium; a C6 to C60 aryl group unsubstituted or substituted with a C1 to C60 alkyl group, a C6 to C60 aryl group or a C2 to C60 heteroaryl group; or a C2 to C60 heteroaryl group unsubstituted or substituted with a C6 to C60 aryl group or a C2 to C60 heteroaryl group.

In another embodiment, R1 to R8 are hydrogen; deuterium; a C6 to C60 aryl group; a C2 to C60 heteroaryl group; or a C2 to C60 heteroaryl group substituted with a C6 to C60 aryl group.

In another embodiment, R1 to R8 are hydrogen; deuterium; a phenyl group; a dibenzofuran group; a dibenzothiophene group; a carbazole group; or a carbazole group substituted with a phenyl group.

In another embodiment, R1 to R8 are hydrogen; deuterium; a phenyl group; a dibenzofuran group; or a carbazole group substituted with a phenyl group.

In another embodiment, adjacent two or more substituents among R1 to R8 bond to each other to form a substituted or unsubstituted ring.

In another embodiment adjacent two or more substituents among R1 to R8 bond to each other to form a ring unsubstituted or substituted with a C6 to C60 aryl group or a C1 to C60 alkyl group.

In another embodiment, adjacent two or more substituents among R1 to R8 bond to each other to form a C6 to C60 aromatic hydrocarbon ring or a C2 to C60 heteroring unsubstituted or substituted with a C6 to C60 aryl group or a C1 to C60 alkyl group.

In another embodiment, adjacent two or more substituents among R1 to R8 bond to each other to form a C6 to C60 aromatic hydrocarbon ring or a C2 to C60 heteroring unsubstituted or substituted with a phenyl group or a methyl group.

In another embodiment, adjacent two or more substituents among R1 to R8 may bond to each other to form a benzene ring; an indole ring unsubstituted or substituted with a phenyl group; a benzothiophene ring; a benzofuran ring; or an indene ring unsubstituted or substituted with a methyl group.

In another embodiment,

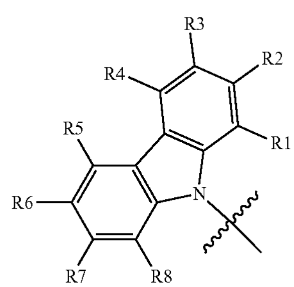

of Chemical Formula 1 may be represented by the following Chemical Formula 23. Herein,

is a site linked to the dibenzofuran structure.

[Chemical Formula 23]

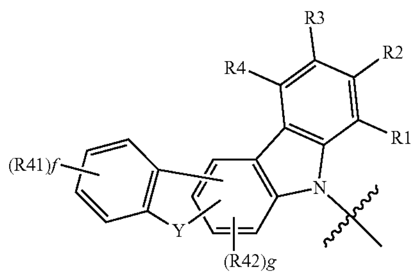

In Chemical Formula 23,

R1 to R4 have the same definitions as in Chemical Formula 1,

Y is O, S, $NR_d$ or $CR_eR_f$, $R_d$, $R_e$, $R_f$, R41 and R42 are the same as or different from each other, and selected from the group consisting of hydrogen; deuterium; halogen; a cyano group; a substituted or unsubstituted C1 to C60 alkyl group; a substituted or unsubstituted C2 to C60 alkenyl group; a substituted or unsubstituted C2 to C60 alkynyl group; a substituted or unsubstituted C2 to C60 alkoxy group; a substituted or unsubstituted C3 to C60 cycloalkyl group; a substituted or unsubstituted C2 to C60 heterocycloalkyl group; a substituted or unsubstituted C6 to C60 aryl group; a substituted or unsubstituted C2 to C60 heteroaryl group; a substituted or unsubstituted phosphine oxide group; and a substituted or unsubstituted amine group, or two or more groups adjacent to each other bond to each other to form a substituted or unsubstituted C6 to C60 aromatic hydrocarbon ring or a substituted or unsubstituted C2 to C60 heteroring, f is an integer of 0 to 4, and when f is 2 or greater, R41s are the same as or different from each other, g is an integer of 0 to 2, and when g is 2 or greater, R42s are the same as or different from each other.

In another embodiment, Chemical Formula 23 may be selected from among the following structural formulae.

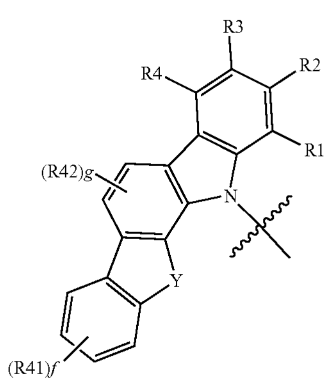

-continued

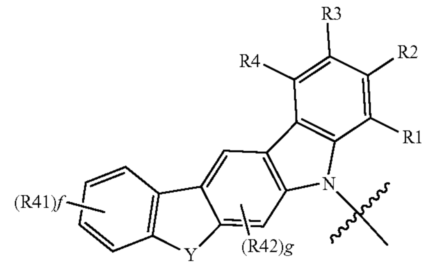

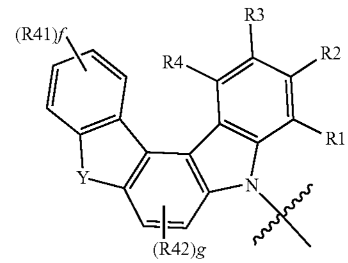

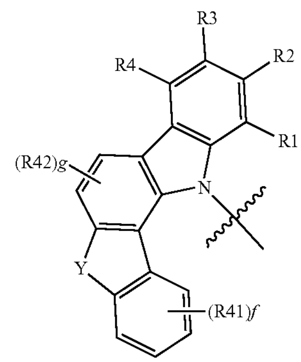

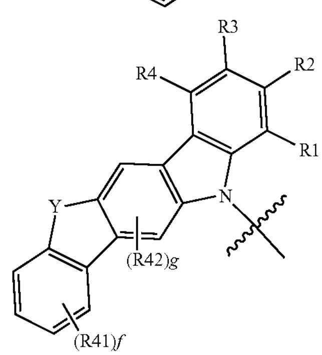

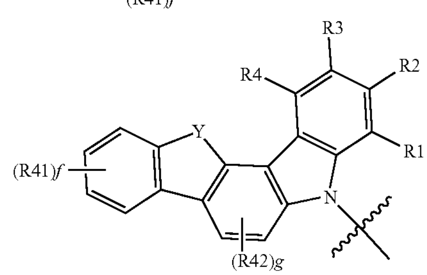

In the structural formulae, each substituent has the same definition as in Chemical Formula 23.

In one embodiment of the present application, R28 to R31 are the same as or different from each other, and each independently hydrogen; deuterium; a C6 to C60 aryl group; or a C2 to C60 heteroaryl group.

In another embodiment, R28 to R31 are the same as or different from each other, and each independently hydrogen; or deuterium.

In another embodiment, R28 to R31 are hydrogen.

In one embodiment of the present application, R27 and R32 are the same as or different from each other, and each independently hydrogen; deuterium; a C6 to C60 aryl group; or a C2 to C60 heteroaryl group.

In another embodiment, R27 and R32 are the same as or different from each other, and each independently a C6 to C60 aryl group; or a C2 to C60 heteroaryl group.

In another embodiment, R27 and R32 are the same as or different from each other, and each independently a C6 to C60 aryl group.

In another embodiment, R27 and R32 are a phenyl group.

In one embodiment of the present application, R21 to R25 are the same as or different from each other, and each independently hydrogen; deuterium; a C6 to C60 aryl group unsubstituted or substituted with a C1 to C60 alkyl group; or a substituted or unsubstituted C2 to C60 heteroaryl group.

In another embodiment, R21 to R25 are the same as or different from each other, and each independently hydrogen; deuterium; a C6 to C60 aryl group unsubstituted or substituted with a C1 to C60 alkyl group; or a C2 to C60 heteroaryl group.

In another embodiment, R21 to R25 are the same as or different from each other, and each independently hydrogen; a C6 to C60 aryl group unsubstituted or substituted with a methyl group; or a C2 to C60 heteroaryl group.

In another embodiment, R21 to R25 are the same as or different from each other, and each independently hydrogen; a phenyl group; a biphenylyl group; a naphthyl group; a dimethylfluorenyl group; a dibenzofuran group; or a dibenzothiophene group.

In another embodiment, R22 and R24 are the same as or different from each other, and each independently a C6 to C60 aryl group unsubstituted or substituted with a C1 to C60 alkyl group; or a C2 to C60 heteroaryl group.

In another embodiment, R22 and R24 are the same as or different from each other, and each independently a phenyl group; a biphenylyl group; a naphthyl group; a dimethylfluorenyl group; a dibenzofuran group; or a dibenzothiophene group.

In one embodiment of the present application, R33 to R36 are the same as or different from each other, and each independently hydrogen; deuterium; a C6 to C60 aryl group; or a C2 to C60 heteroaryl group.

In another embodiment, R33 to R36 are the same as or different from each other, and each independently hydrogen; deuterium; or a C6 to C60 aryl group.

In another embodiment, R33 to R36 are the same as or different from each other, and each independently hydrogen; or a C6 to C60 aryl group.

In another embodiment, R33 to R36 are the same as or different from each other, and each independently hydrogen; a phenyl group; or a biphenylyl group.

In an embodiment of the present application, R37 is hydrogen; deuterium; a C6 to C60 aryl group; or a C2 to C60 heteroaryl group.

In another embodiment, R37 is hydrogen; deuterium; or a C6 to C60 aryl group.

In another embodiment, R37 is hydrogen; or a C6 to C60 aryl group.

In another embodiment, R37 is hydrogen; or a phenyl group.

In one embodiment of the present application, Y is O or S.

In another embodiment, Y is $NR_d$, and $R_d$ is a C6 to C60 aryl group.

In another embodiment, Y is $NR_d$, and $R_d$ is a phenyl group.

In another embodiment, Y is $CR_eR_f$, and $R_e$ and $R_f$ are a C1 to C60 alkyl group.

In another embodiment, Y is $CR_eR_f$, and $R_e$ and $R_f$ are a methyl group.

In one embodiment of the present application, R41 is hydrogen; deuterium; a C6 to C60 aryl group; or a C2 to C60 heteroaryl group.

In another embodiment, R41 is hydrogen; deuterium; or a C6 to C60 aryl group.

In another embodiment, R41 is hydrogen; or a phenyl group.

In one embodiment of the present application, R42 is hydrogen; or deuterium.

In another embodiment, R42 is hydrogen.

In one embodiment of the present application, Chemical Formula 24 may be represented by any one of the following Chemical Formulae 25 to 28.

[Chemical Formula 25]

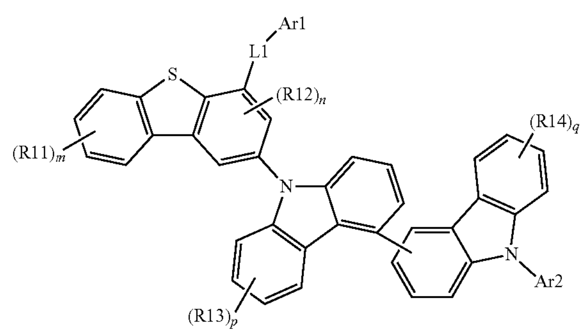

[Chemical Formula 26]

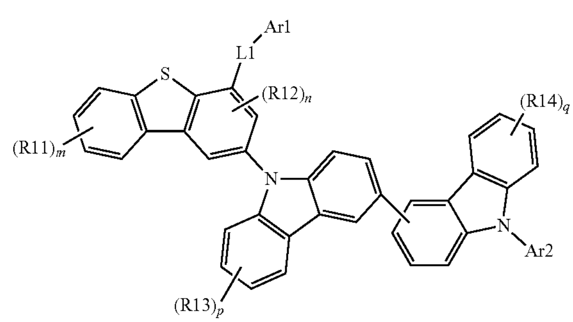

[Chemical Formula 27]

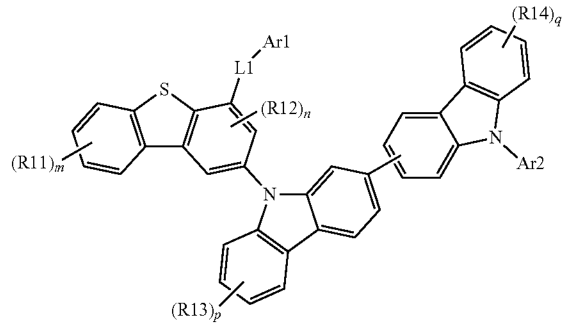

-continued

[Chemical Formula 28]

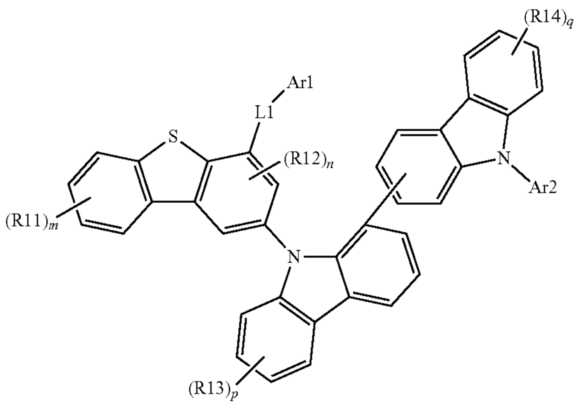

In Chemical Formulae 25 to 28,

R11 to R14, L1, Ar1, Ar2, m, n, p and q have the same definitions as in Chemical Formula 24.

In one embodiment of the present application, L1 may be a direct bond; or a substituted or unsubstituted C6 to C60 arylene group.

In another embodiment, L1 may be a direct bond; or a substituted or unsubstituted C6 to C40 arylene group.

In another embodiment, L1 may be a direct bond; or a substituted or unsubstituted C6 to C20 arylene group.

In another embodiment, L1 may be a direct bond; or a substituted or unsubstituted C6 to C20 monocyclic arylene group.

In another embodiment, L1 may be a direct bond; or a C6 to C20 monocyclic arylene group.

In another embodiment, L1 may be a direct bond; or a phenylene group.

In one embodiment of the present application, An may be a substituted or unsubstituted C6 to C60 aryl group; or a C2 to C60 heteroaryl group substituted or unsubstituted and comprising at least one of S and 0.

In another embodiment, An may be a substituted or unsubstituted C6 to C40 aryl group; or a C2 to C40 heteroaryl group substituted or unsubstituted and comprising at least one of S and 0.

In another embodiment, An may be a C6 to C20 aryl group unsubstituted or substituted with a C1 to C10 alkyl group; or a C2 to C20 heteroaryl group substituted or unsubstituted and comprising at least one of S and 0.

In another embodiment, An may be a C6 to C20 aryl group unsubstituted or substituted with a C1 to C10 alkyl group; or a C2 to C20 heteroaryl group comprising at least one of S and 0.

In another embodiment, An may be a C6 to C20 monocyclic or polycyclic aryl group unsubstituted or substituted with a C1 to C10 alkyl group; or a polycyclic C2 to C20 heteroaryl group comprising at least one of S and 0.

In another embodiment, An may be a phenyl group; a biphenyl group; a naphthyl group; a dimethylfluorene group; a dibenzothiophene group; or a dibenzofuran group.

In one embodiment of the present application, Ar2 is a substituted or unsubstituted C6 to C60 aryl group; or a substituted or unsubstituted C2 to C60 heteroaryl group.

In another embodiment, Ar2 may be a substituted or unsubstituted C6 to C60 aryl group.

In another embodiment, Ar2 may be a substituted or unsubstituted C6 to C40 aryl group.

In another embodiment, Ar2 may be a substituted or unsubstituted C6 to C20 aryl group.

In another embodiment, Ar2 may be a C6 to C20 aryl group.

In another embodiment, Ar2 may be a C6 to C20 monocyclic aryl group.

In another embodiment, Ar2 may be a C10 to C20 monocyclic aryl group.

In another embodiment, Ar2 may be a phenyl group.

In one embodiment of the present application, R11 to R14 are the same as or different from each other, and each independently selected from the group consisting of hydrogen; deuterium; halogen; a cyano group; a substituted or unsubstituted C1 to C60 alkyl group; a substituted or unsubstituted C2 to C60 alkenyl group; a substituted or unsubstituted C2 to C60 alkynyl group; a substituted or unsubstituted C2 to C60 alkoxy group; a substituted or unsubstituted C3 to C60 cycloalkyl group; a substituted or unsubstituted C2 to C60 heterocycloalkyl group; a substituted or unsubstituted C6 to C60 aryl group; a substituted or unsubstituted C2 to C60 heteroaryl group; a substituted or unsubstituted phosphine oxide group; and a substituted or unsubstituted amine group, or two or more groups adjacent to each other may bond to each other to form a substituted or unsubstituted C6 to C60 aromatic hydrocarbon ring or a substituted or unsubstituted C2 to C60 heteroring.

In another embodiment, R11 to R14 may be hydrogen.

In one embodiment of the present application, when comprising the heterocyclic compound represented by Chemical Formula 1 and the heterocyclic compound represented by Chemical Formula 24 in an organic material layer of an organic light emitting device, more superior efficiency and lifetime effects are obtained. Such results may lead to a forecast that an exciplex phenomenon occurs when comprising the two compounds at the same time.

The exciplex phenomenon is a phenomenon of releasing energy having sizes of a donor (p-host) HOMO level and an acceptor (n-host) LUMO level due to electron exchanges between two molecules. When the exciplex phenomenon occurs between two molecules, reverse intersystem crossing (RISC) occurs, and as a result, internal quantum efficiency of fluorescence may increase up to 100%. When a donor (p-host) having a favorable hole transfer ability and an acceptor (n-host) having a favorable electron transfer ability are used as a host of a light emitting layer, holes are injected to the p-host and electrons are injected to the n-host, and therefore, a driving voltage may decrease, which resultantly helps with enhancement in the lifetime.

The heterocyclic compound represented by Chemical Formula introduces a dibenzothiophene group that is a heteroaryl group to a biscarbazole form, and superior properties in terms of efficiency are obtained by expanding the HOMO and thereby enhancing a hole transfer ability. In other words, when having dibenzothiophene as the heterocyclic compound of Chemical Formula 24 of the present application, stronger aromaticity is obtained compared to dibenzofuran, and accordingly, properties of longer lifetime may be obtained due to structural stability.

Particularly, inhibiting reactivity by introducing a substituent to the number 4 carbon, a position having relatively favorable reactivity, in the dibenzothiophene may also be a factor resulting in properties of long lifetime.

According to one embodiment of the present application, Chemical Formula 1 may be represented by any one of compounds of the following Group 1 and Group 2, but is not limited thereto.

[Group 1]
1
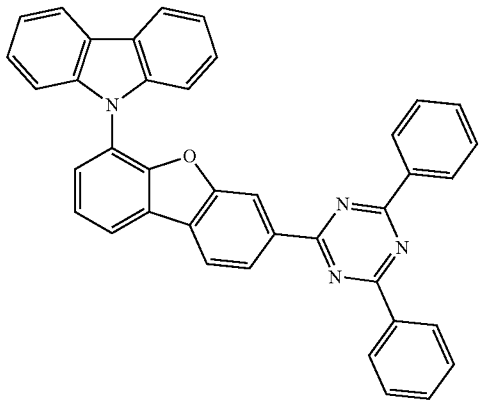
2
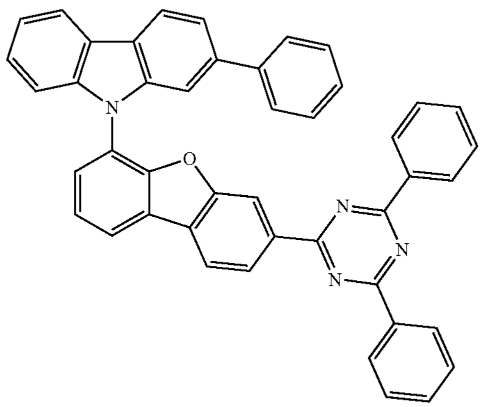
3
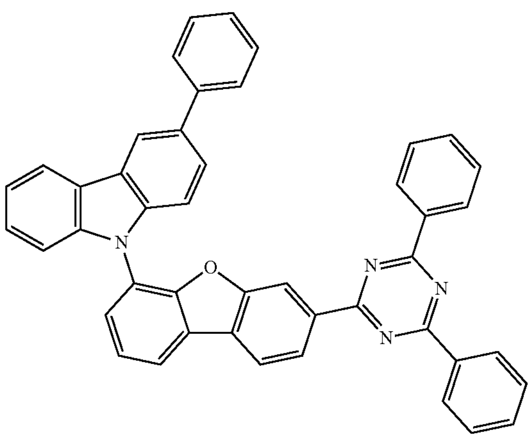
4
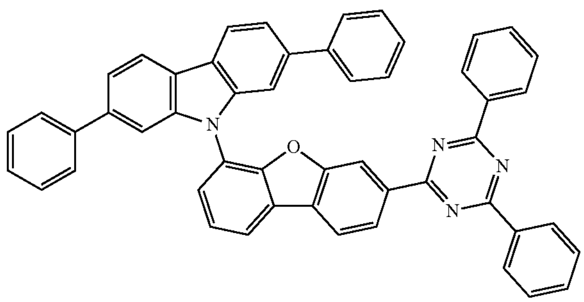
-continued
5
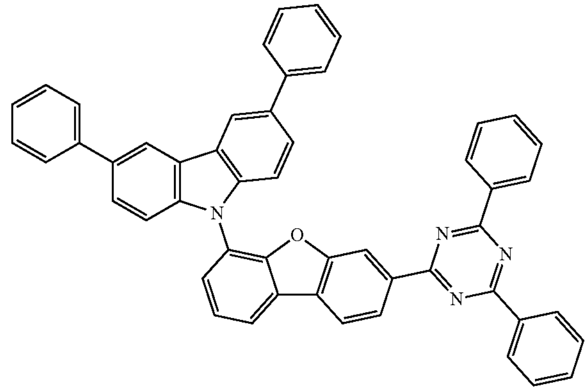
6
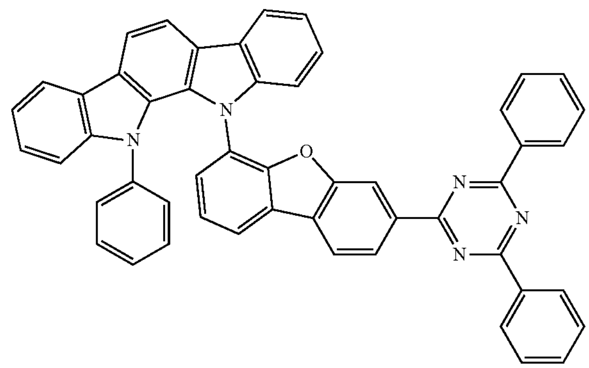
7
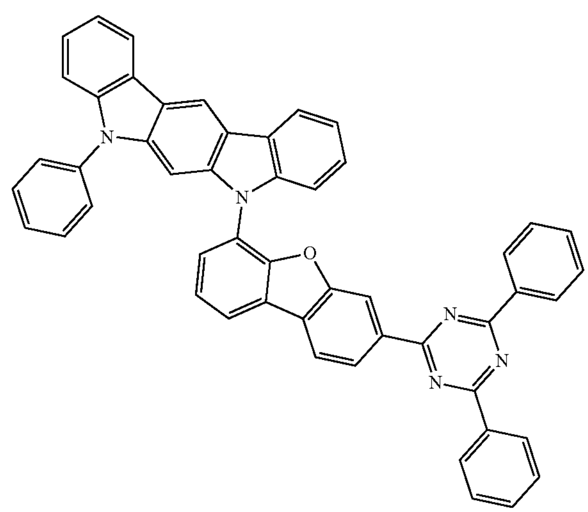

-continued
8
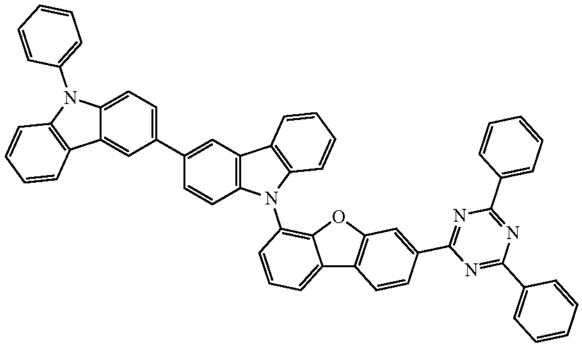
9
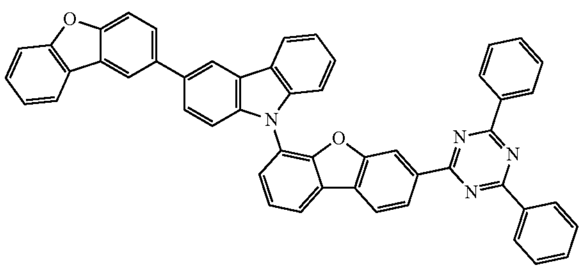
10
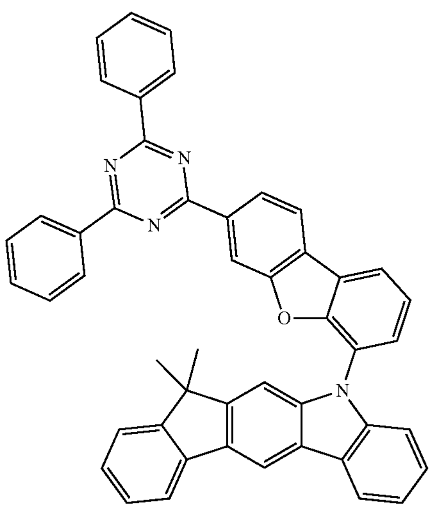
11
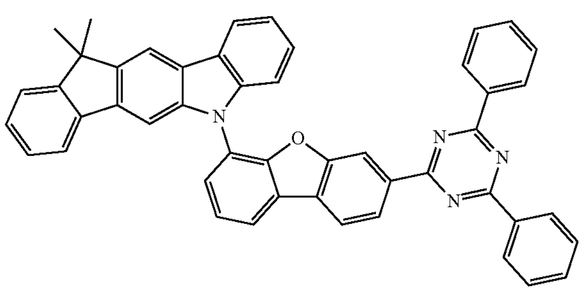
-continued
12
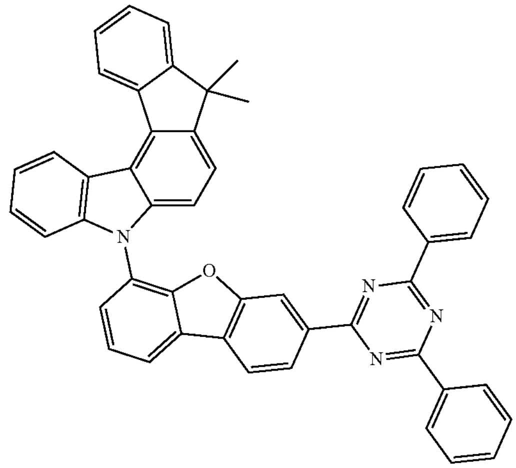
13
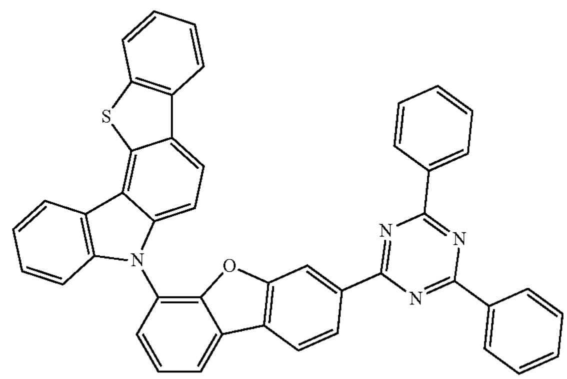
14
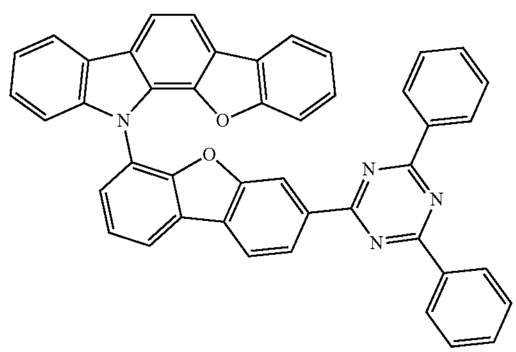
15
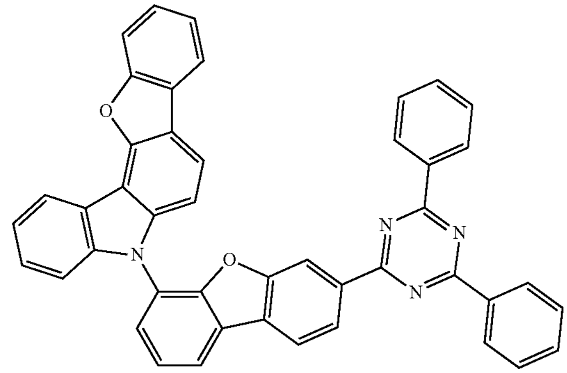

-continued
16
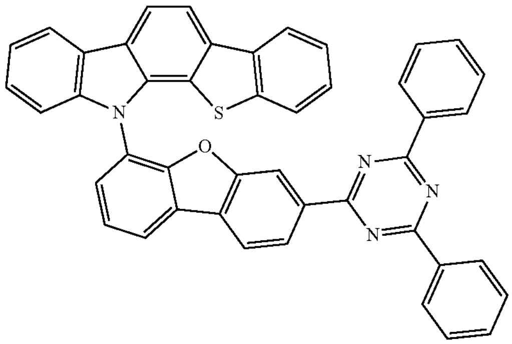
17
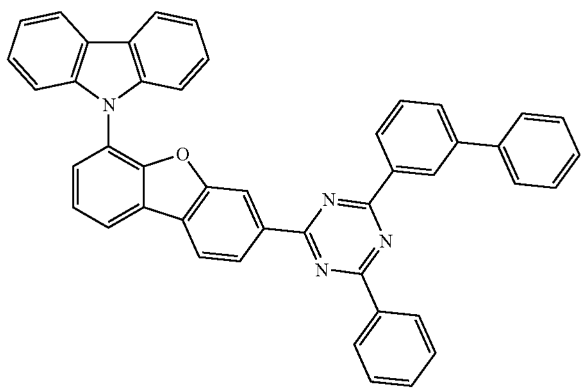
18
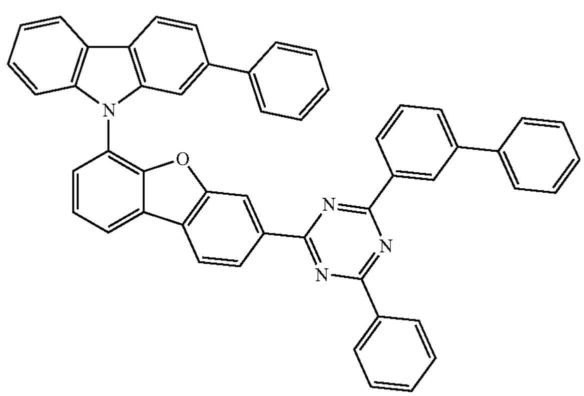
19
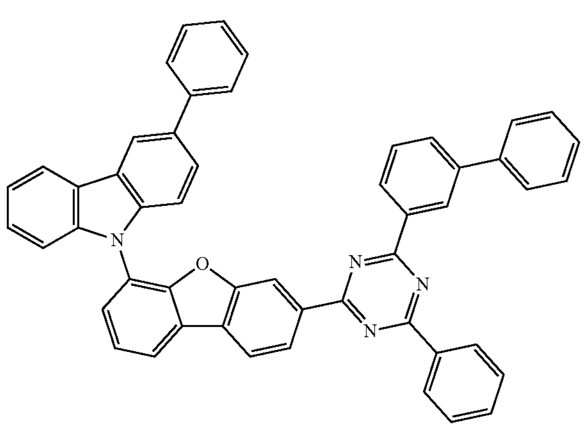
-continued
20
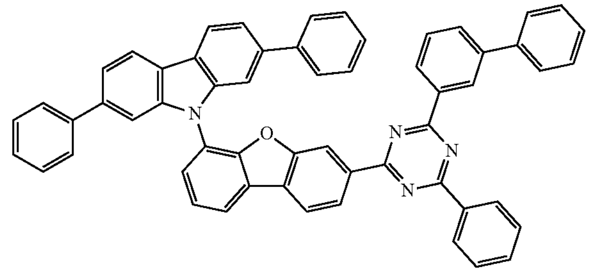
21
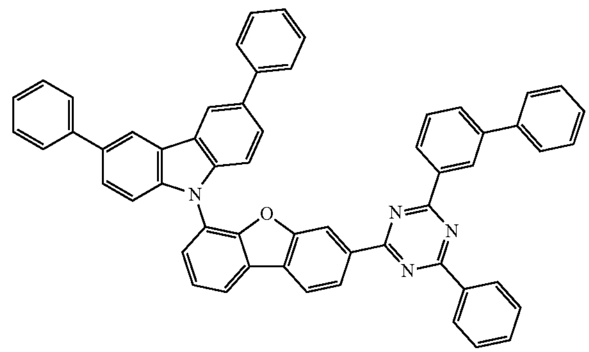
22
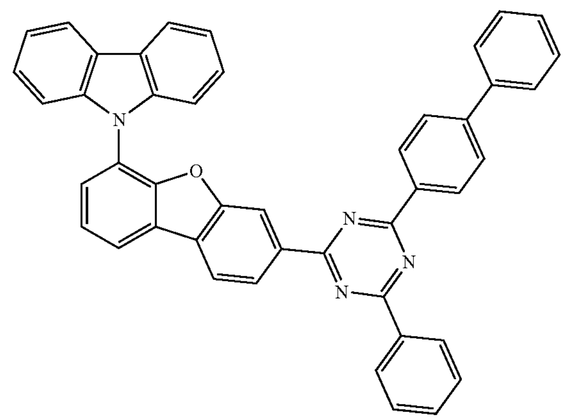
23
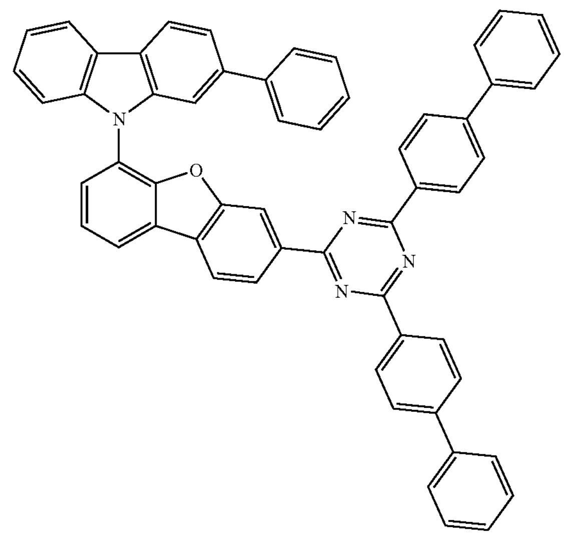

-continued
24
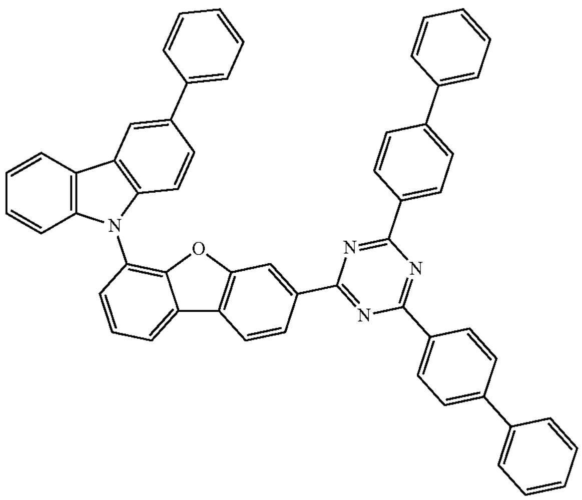
25
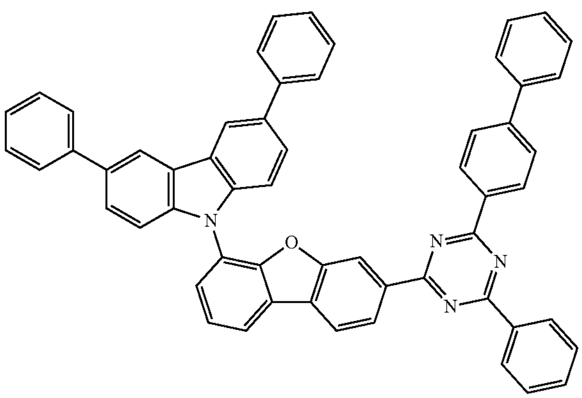
26
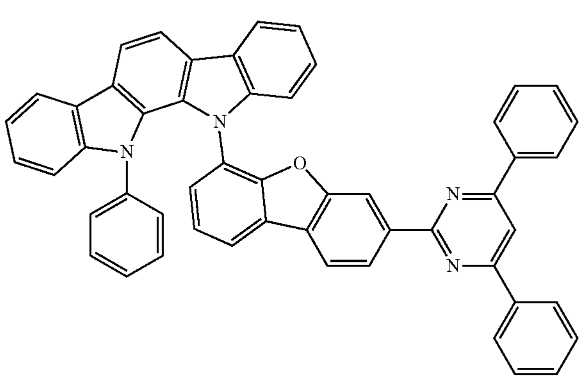
-continued
27
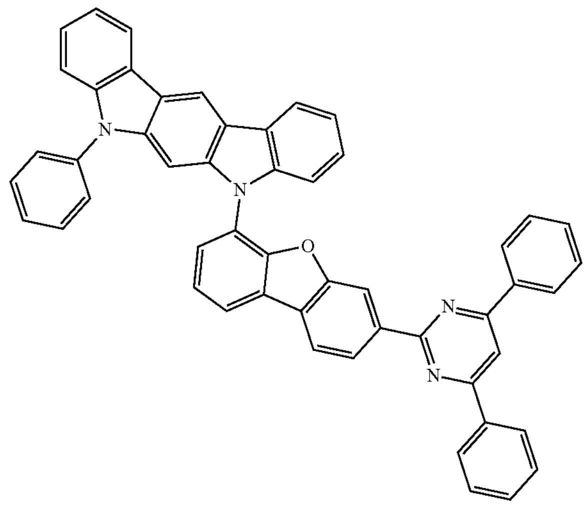
28
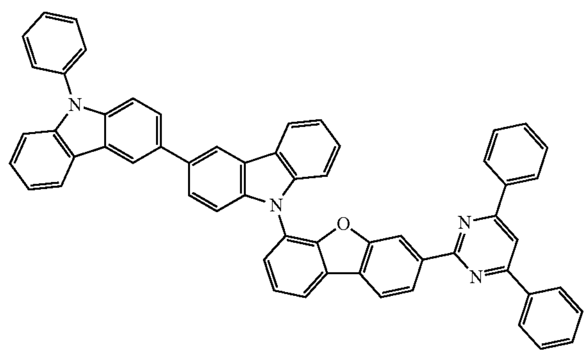
29
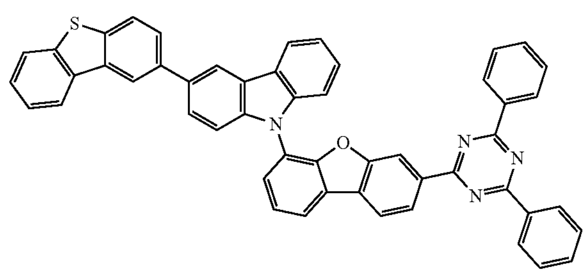
30
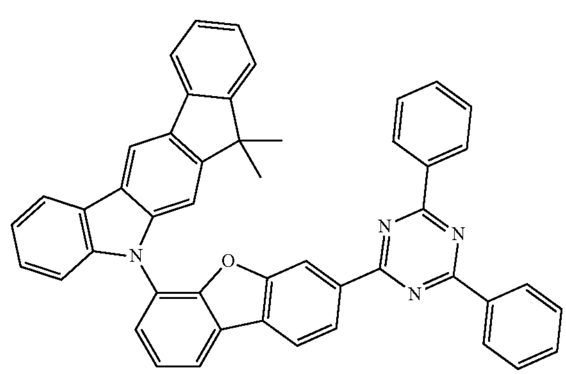

-continued
31
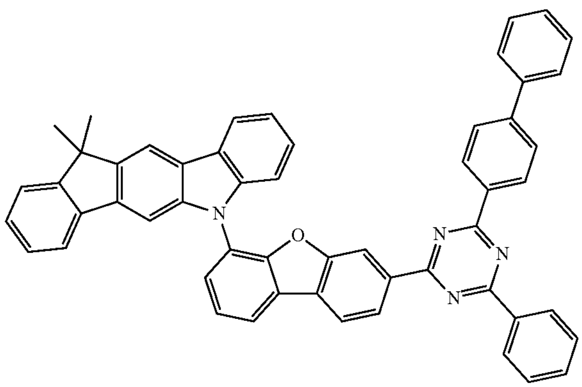
32
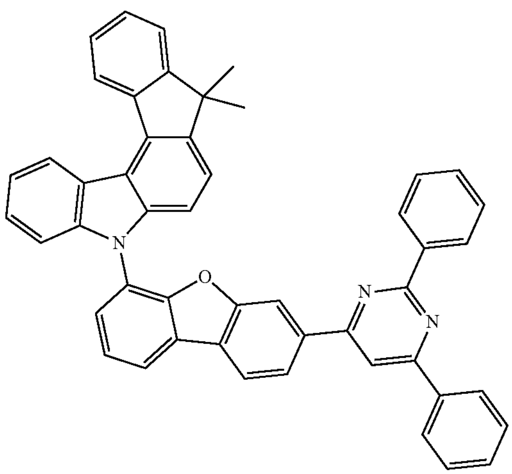
33
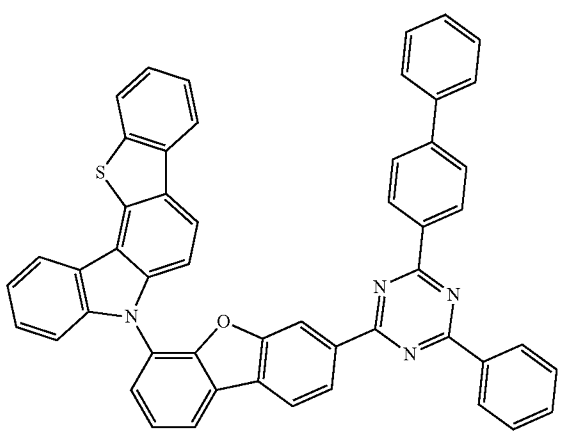
34
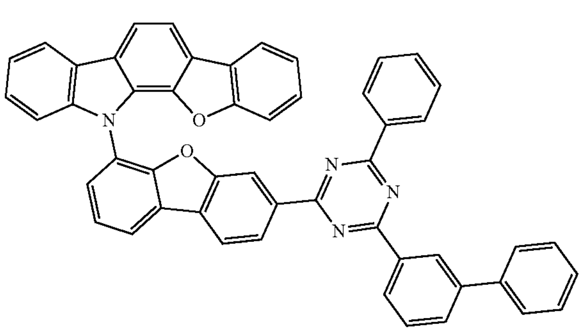
-continued
35
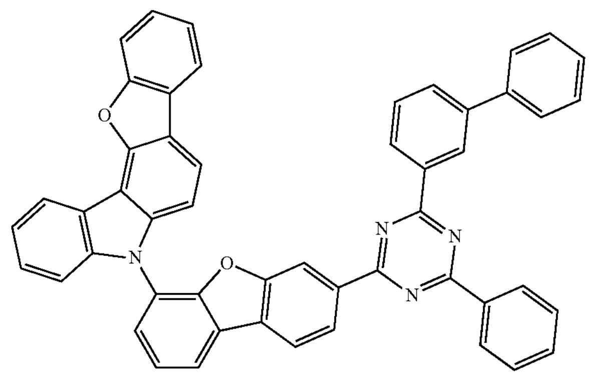
36
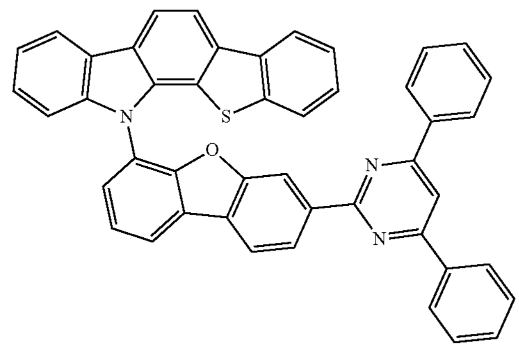
37
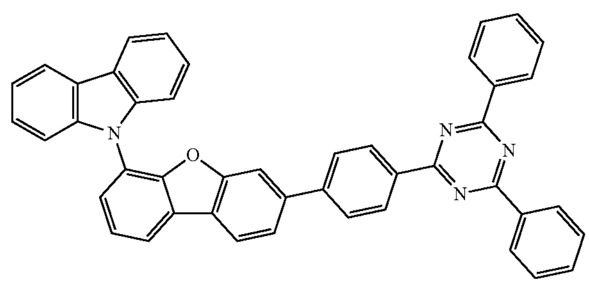
38
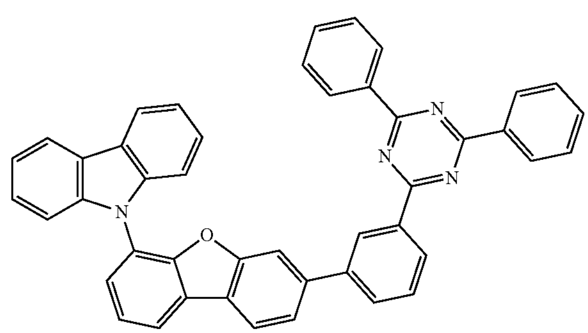

39
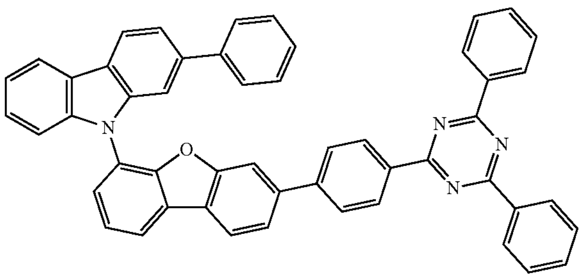
40
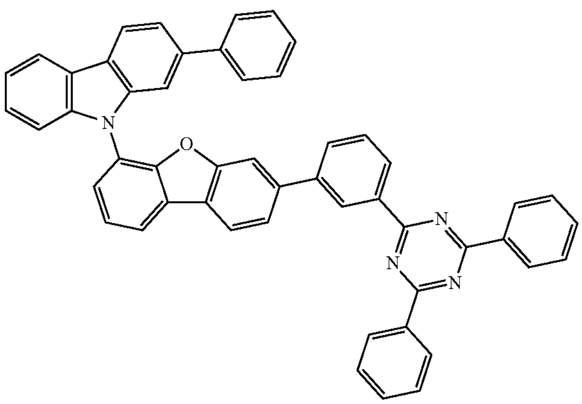
41
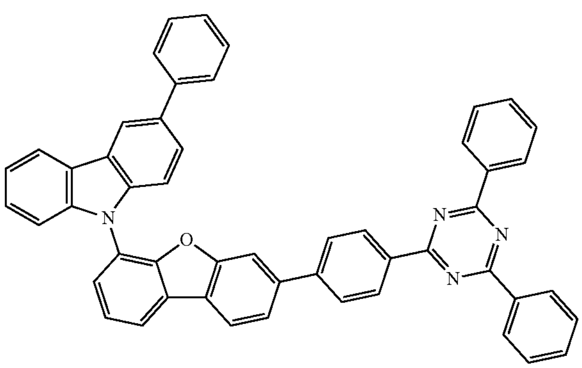
42
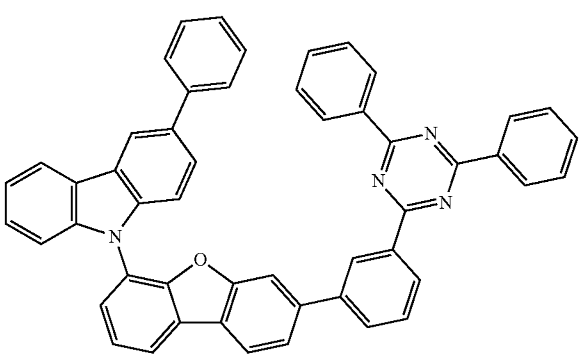
43
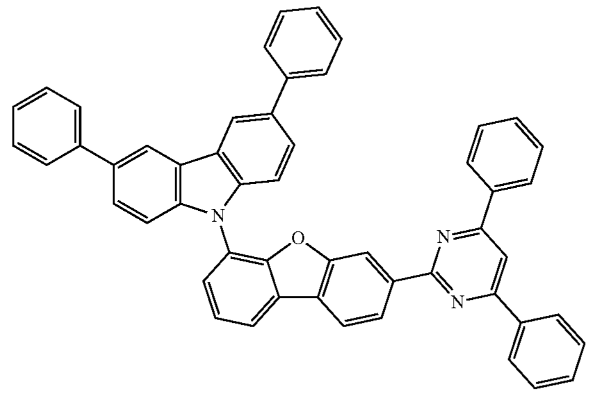
44
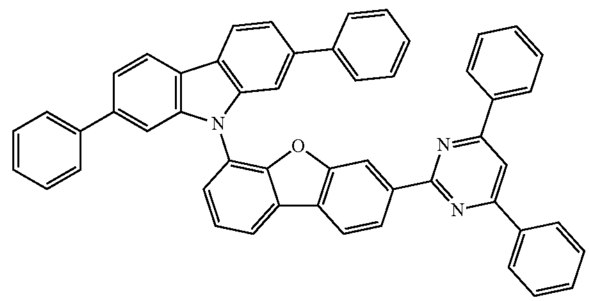
45
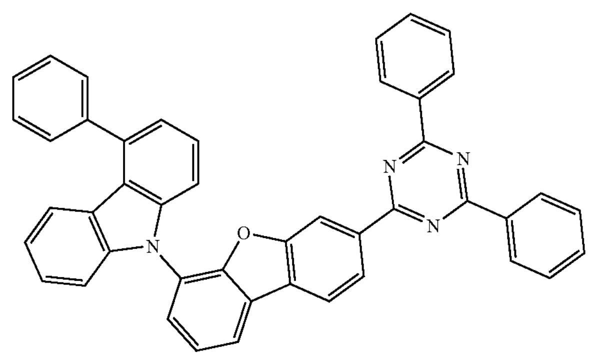
46
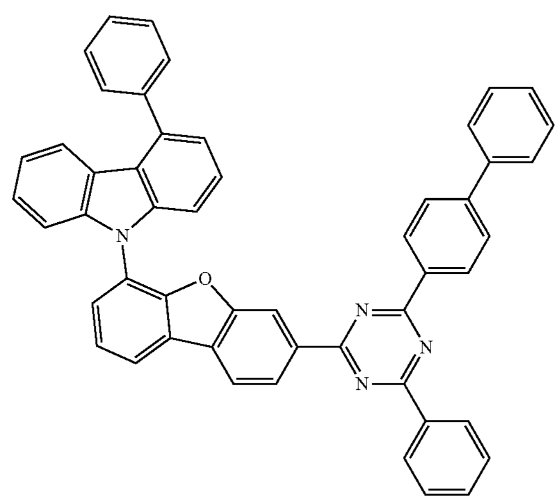

-continued
47
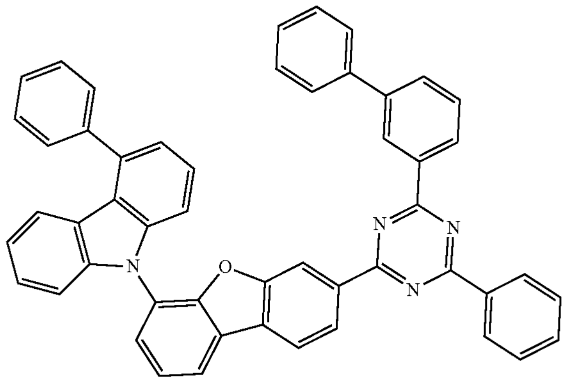
48
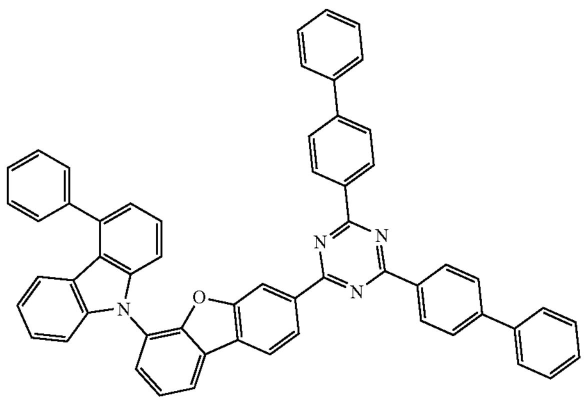
49
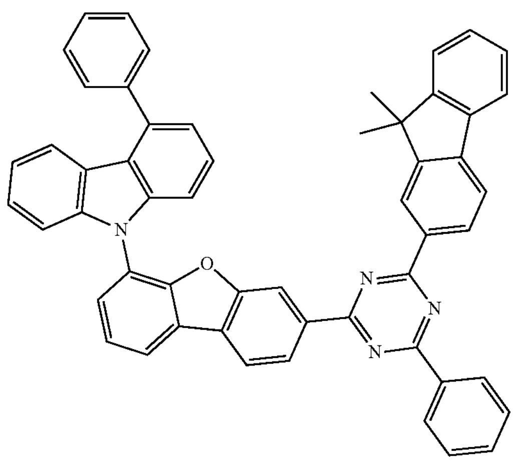
50
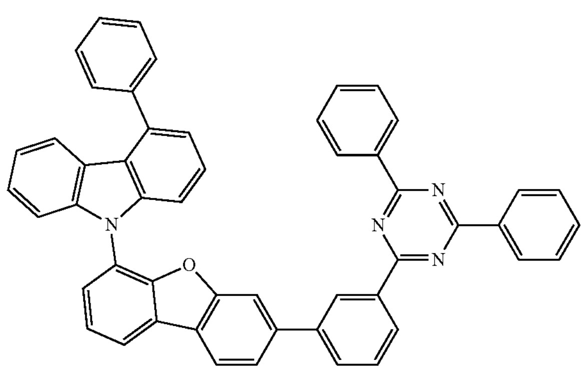
-continued
51
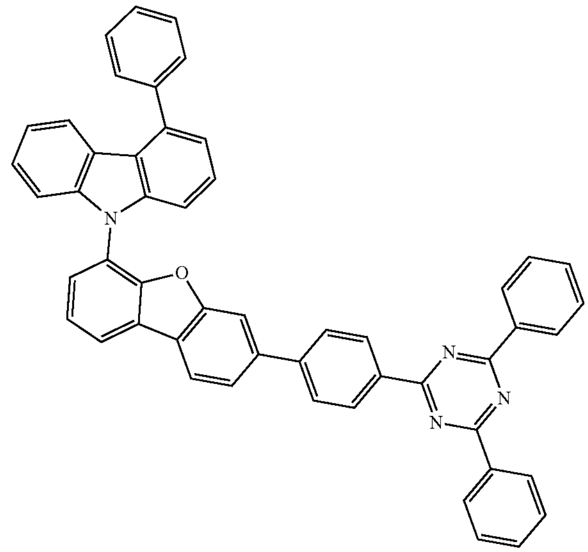
52
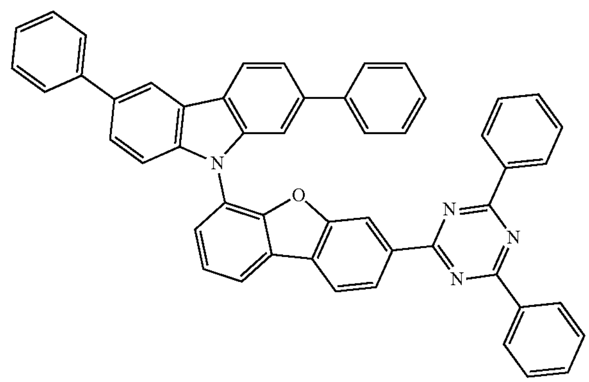
53
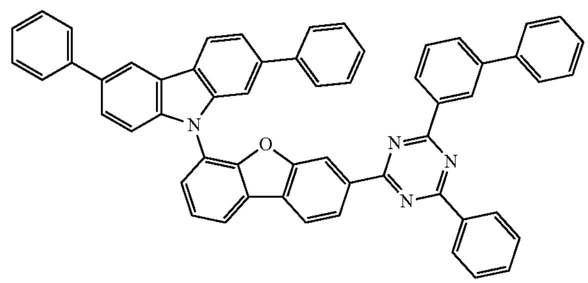
54
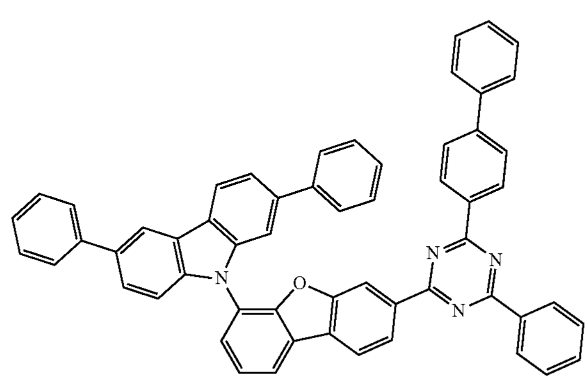

-continued
55
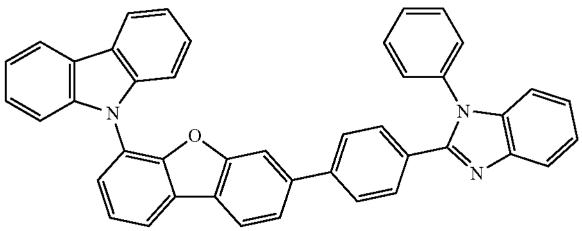
56
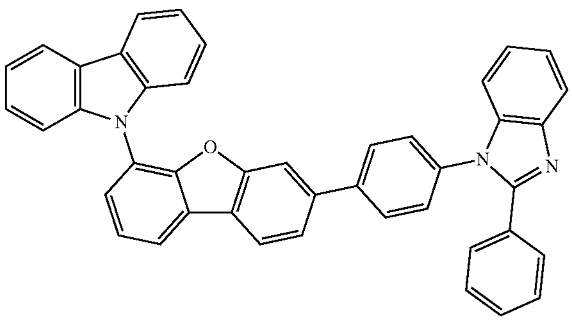
57
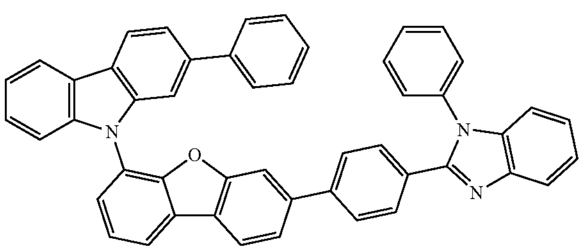
58
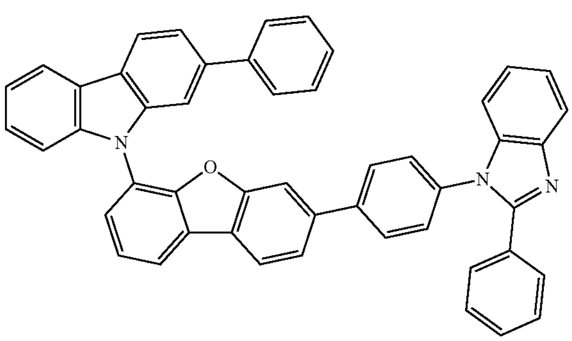
59
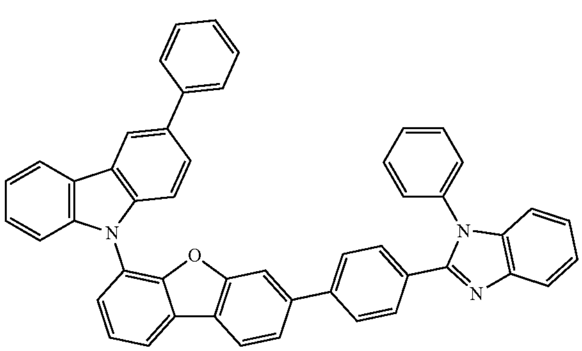
-continued
60
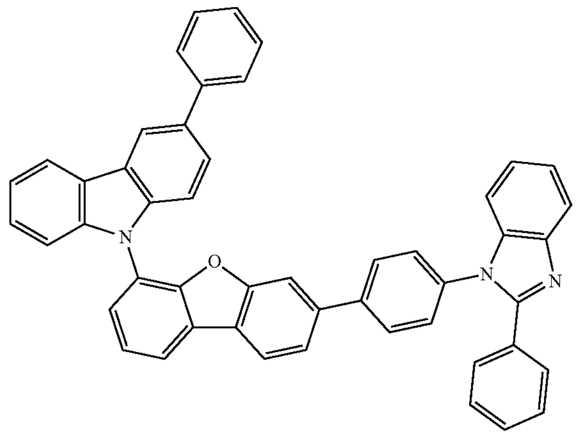
61
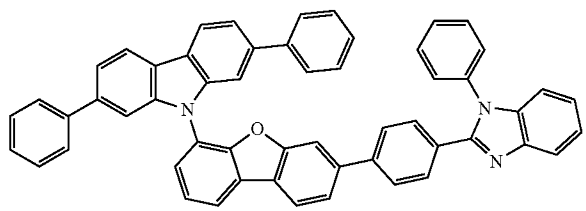
62
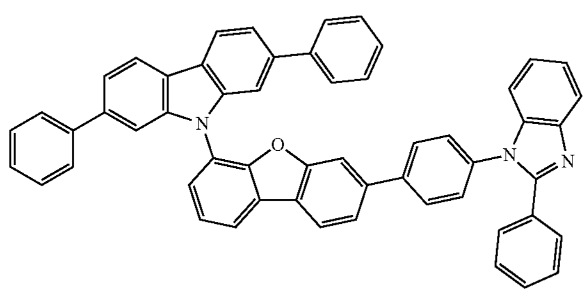
63
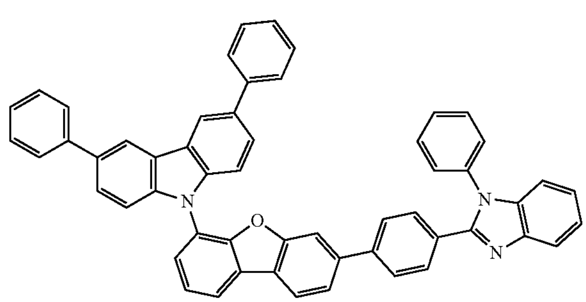

-continued
64
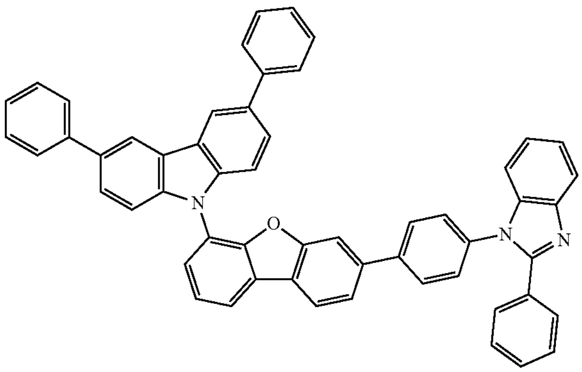
65
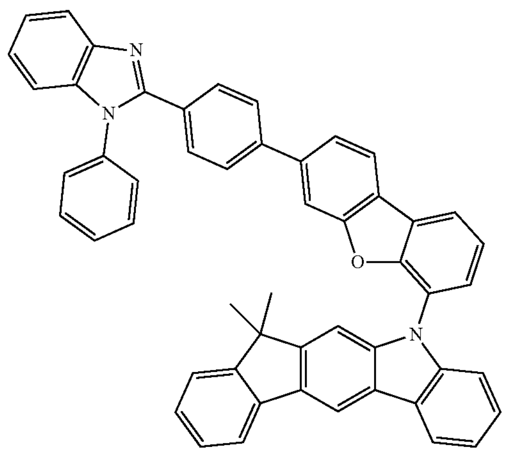
66
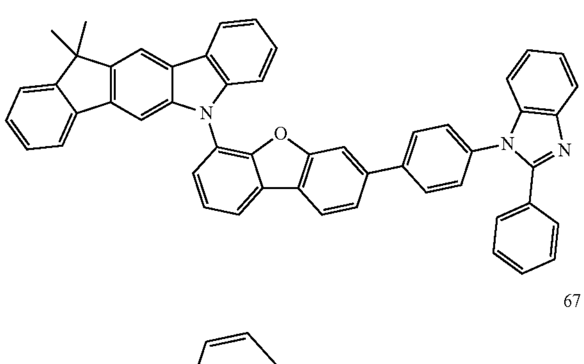
67
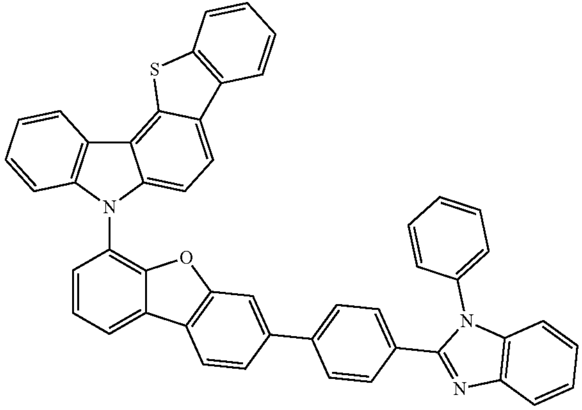
-continued
68
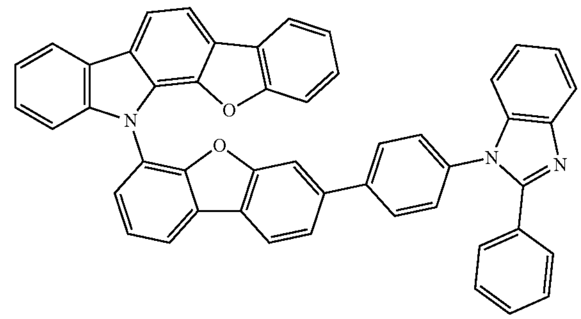
69
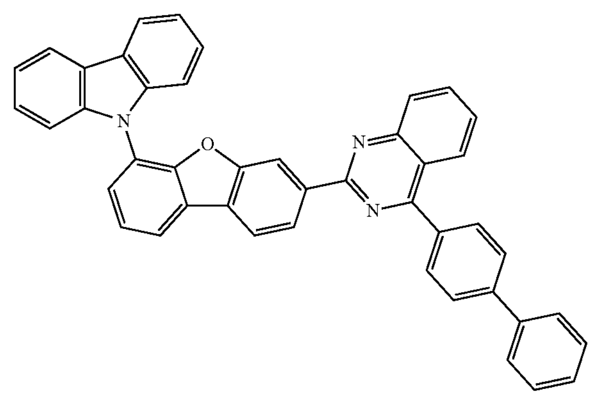
70
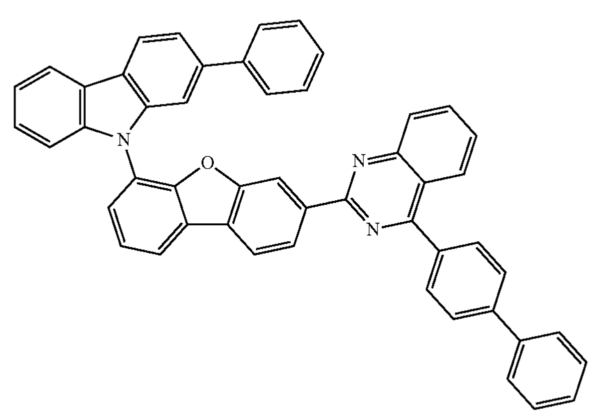

-continued
71
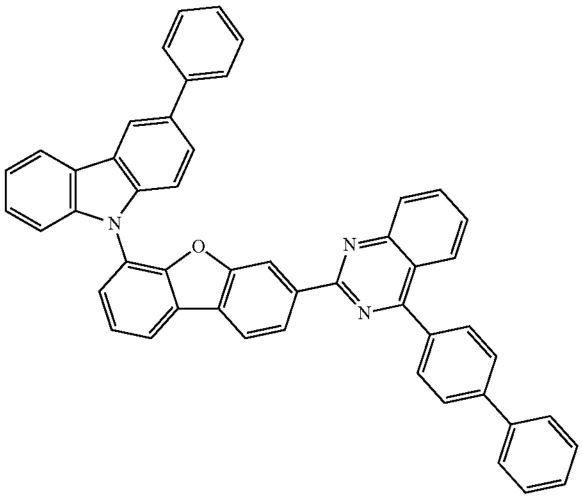
72
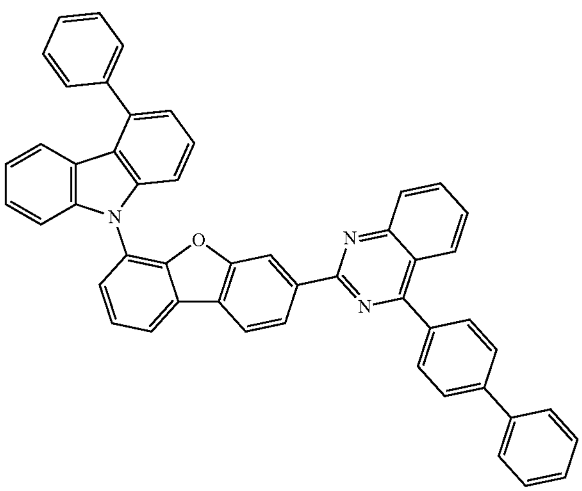
73
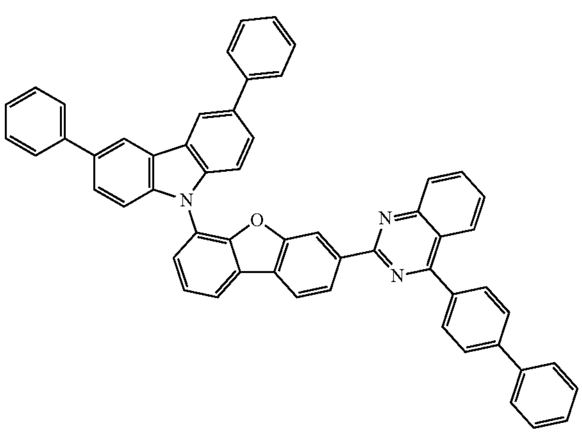
-continued
74
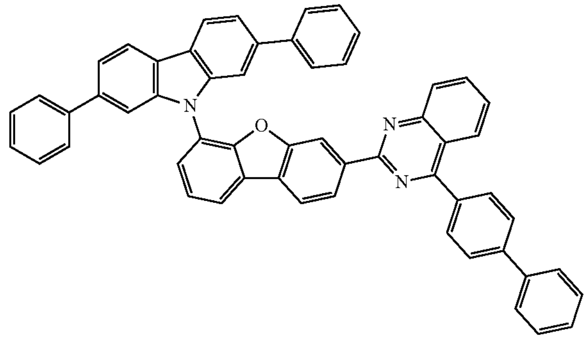
75
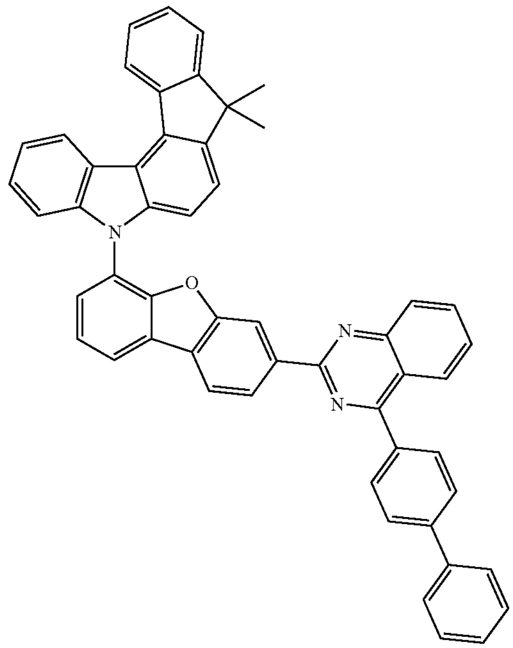
76
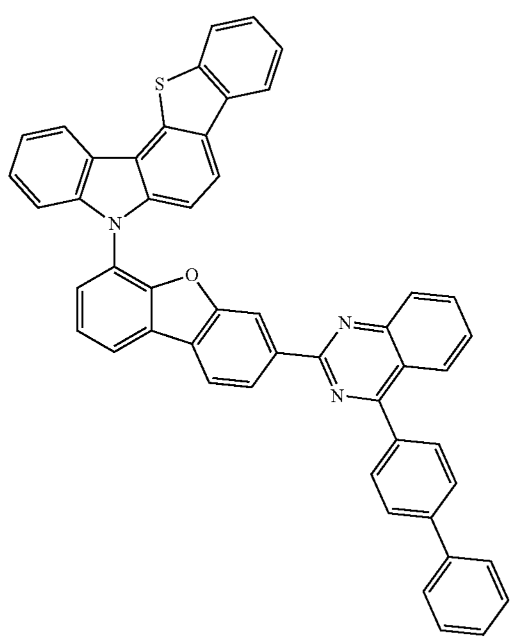

-continued
77
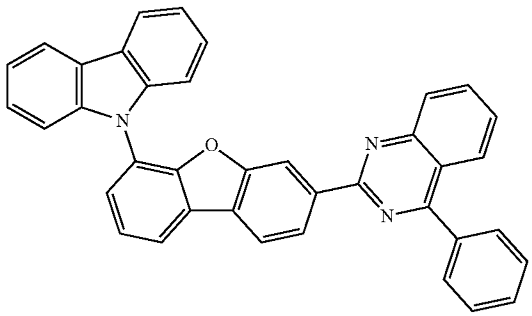
78
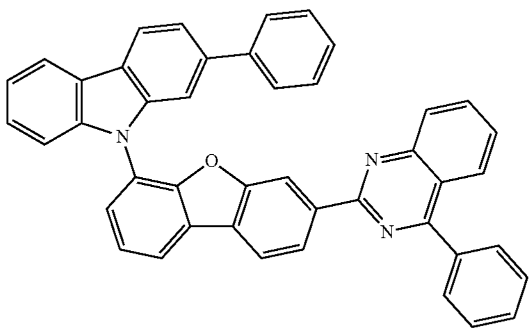
79
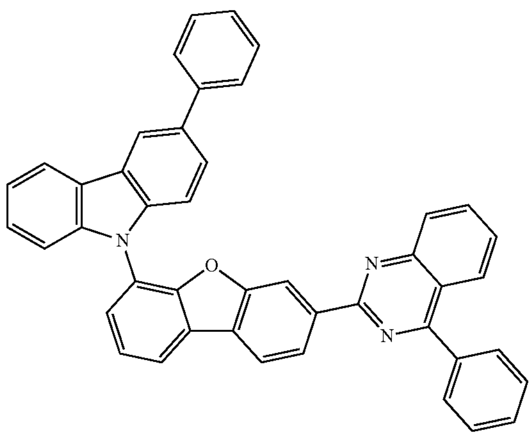
80
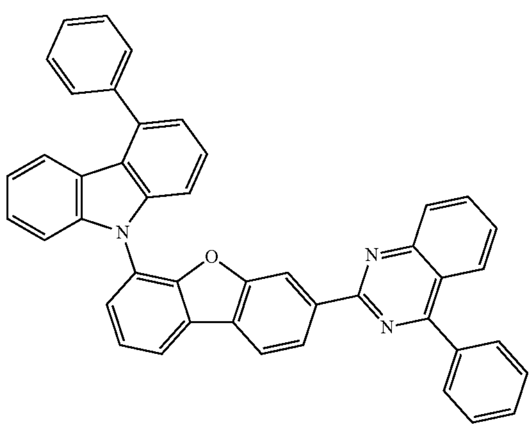
-continued
81
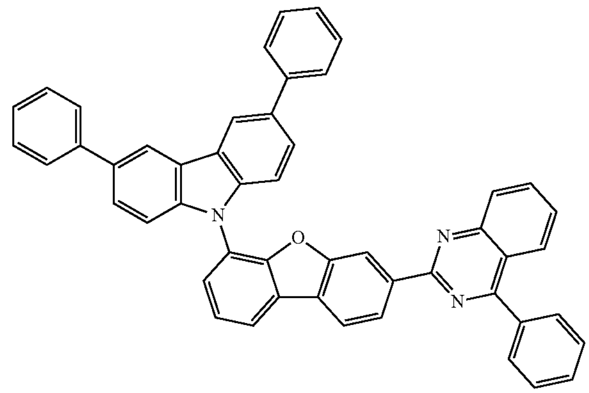
82
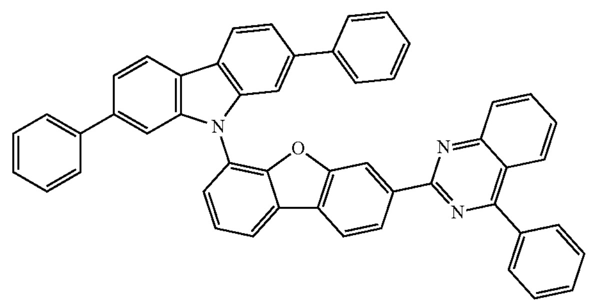
83
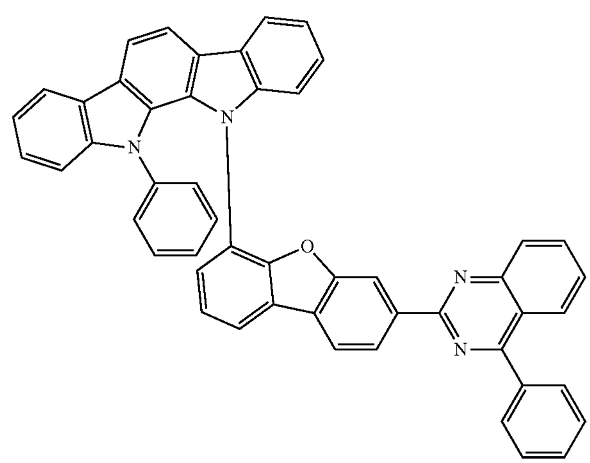

-continued
84
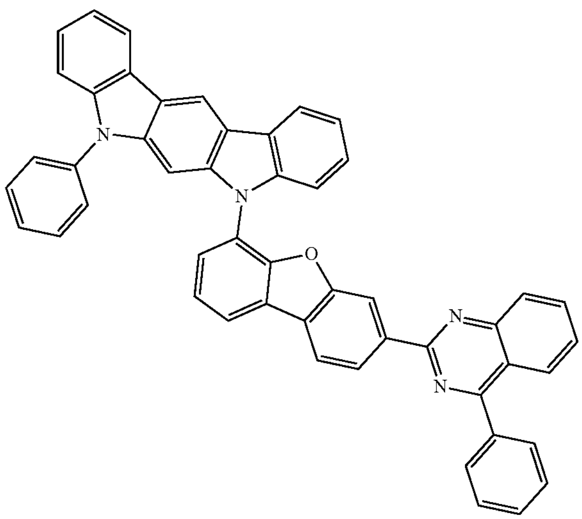
85
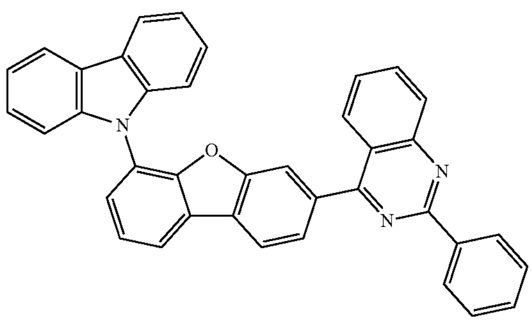
86
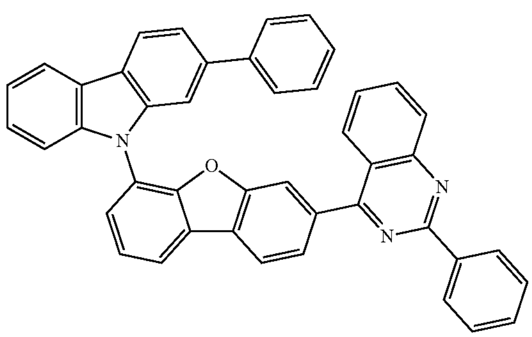
87
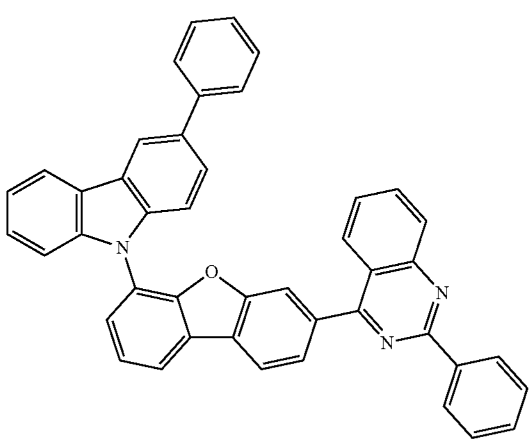
-continued
88
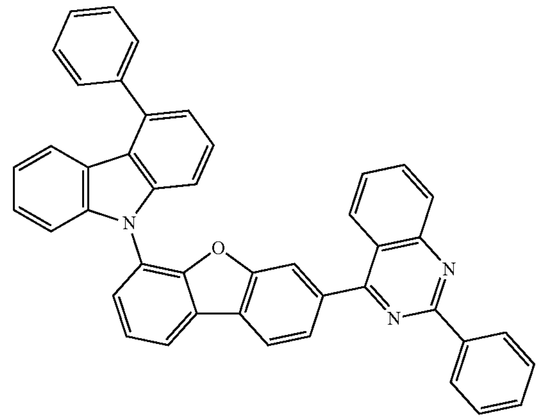
89
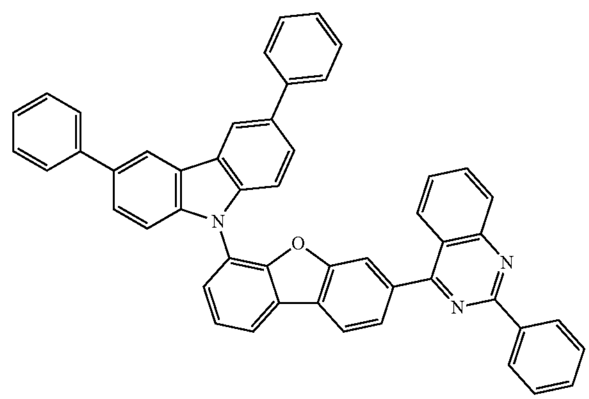
90
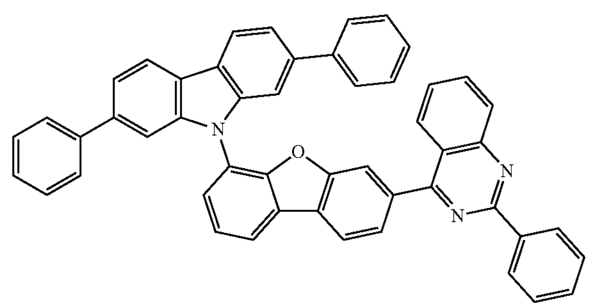
91
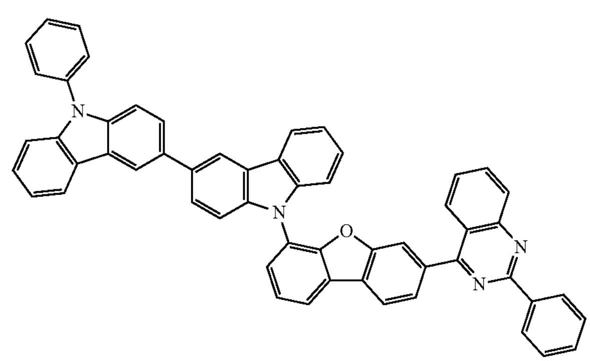

-continued
92
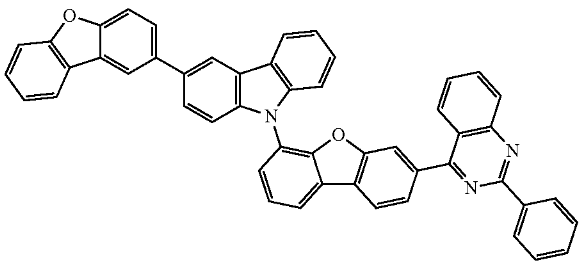
93
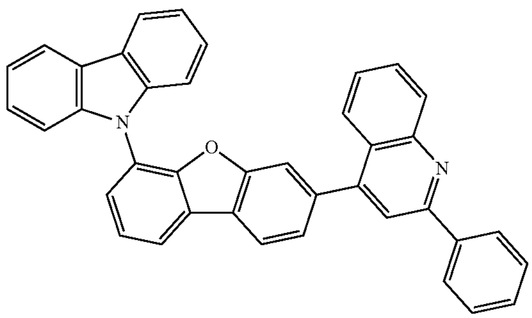
94
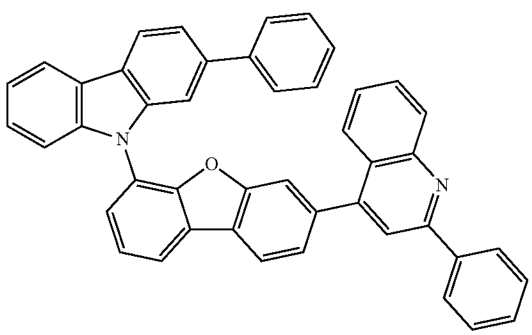
95
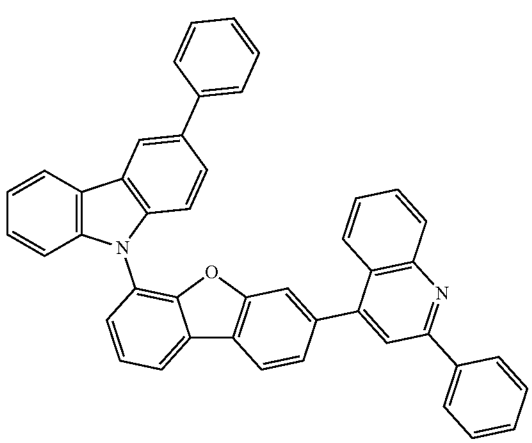
-continued
96
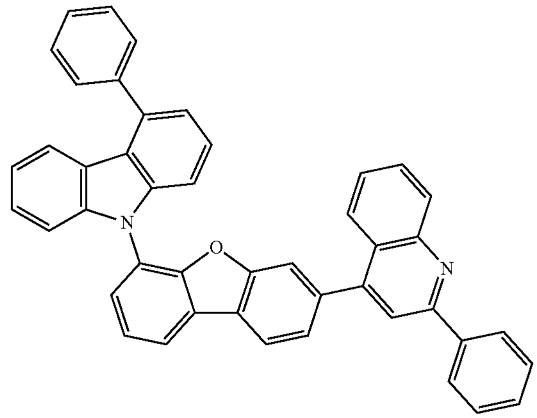
97
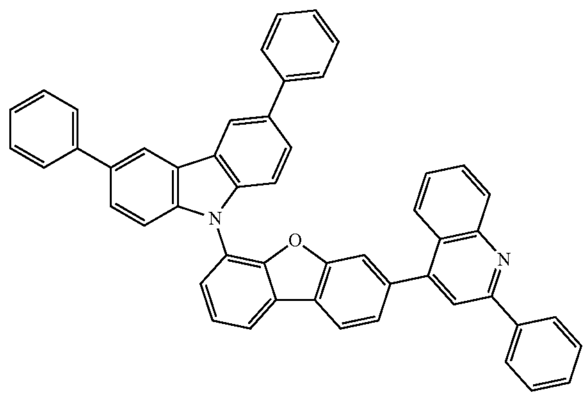
98
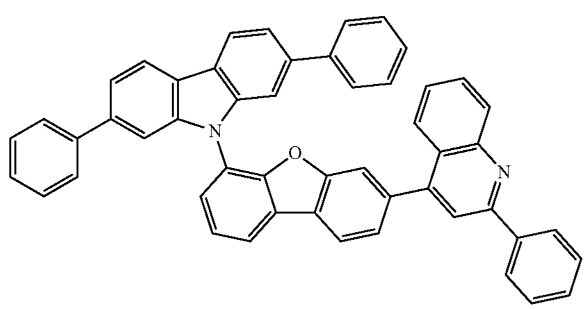
99
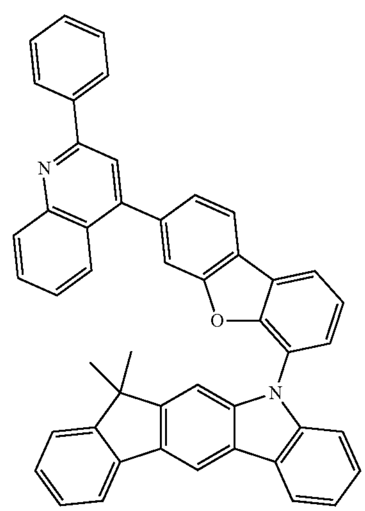

-continued
100
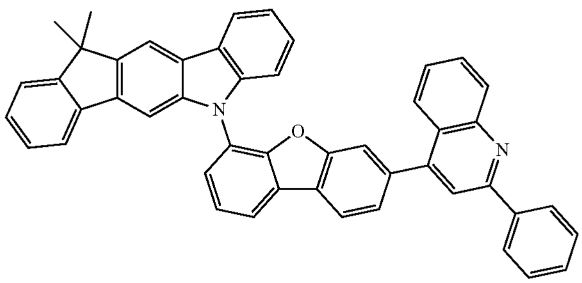
101
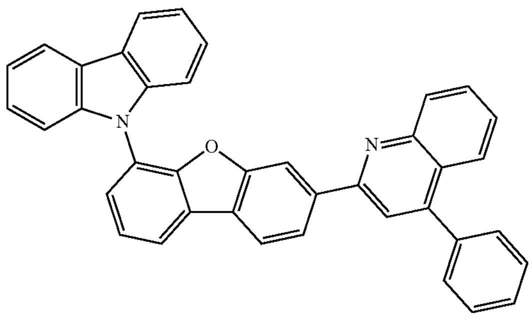
102
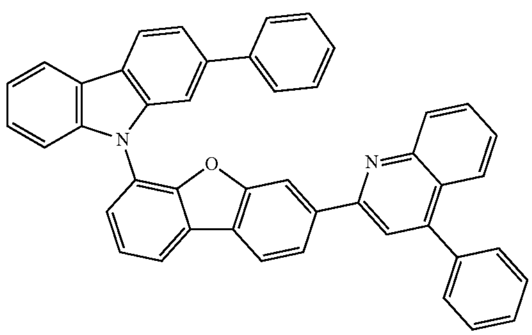
103
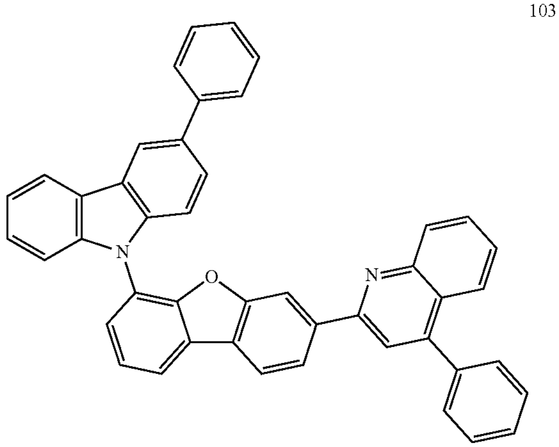
-continued
104
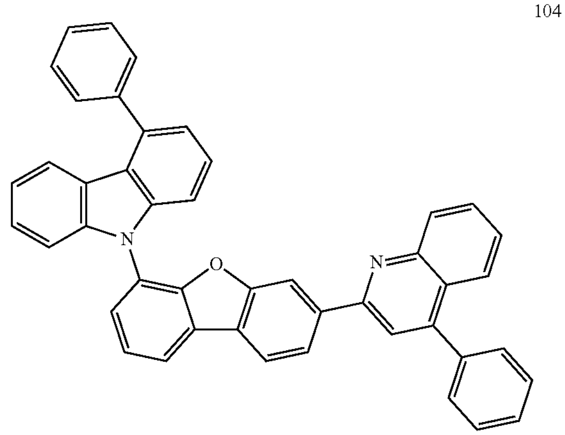
105
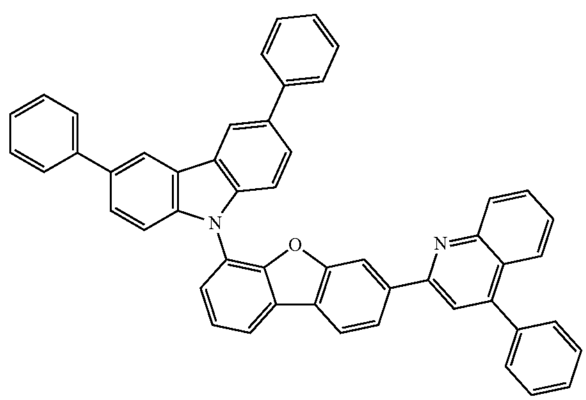
106
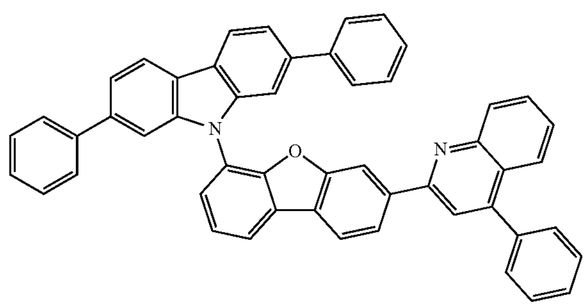

-continued
107
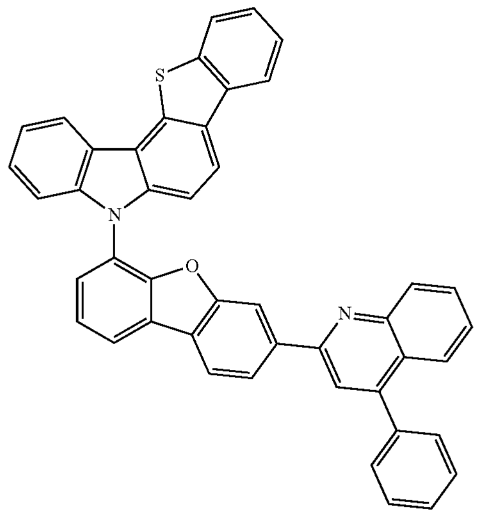
108
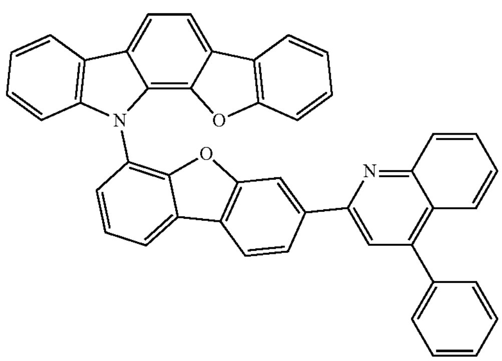
109
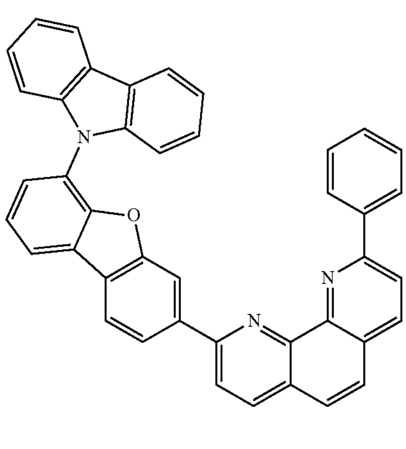
-continued
110
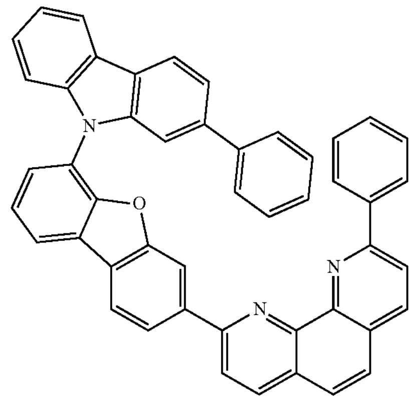
111
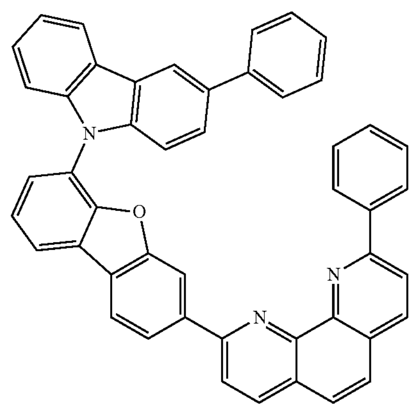
112
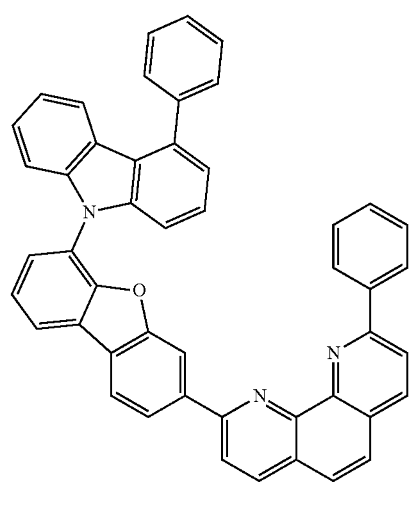

-continued
113
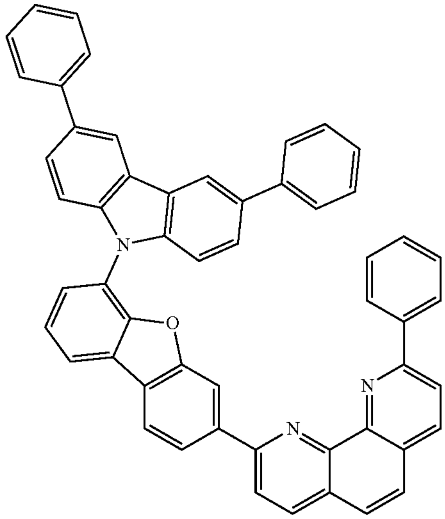
114
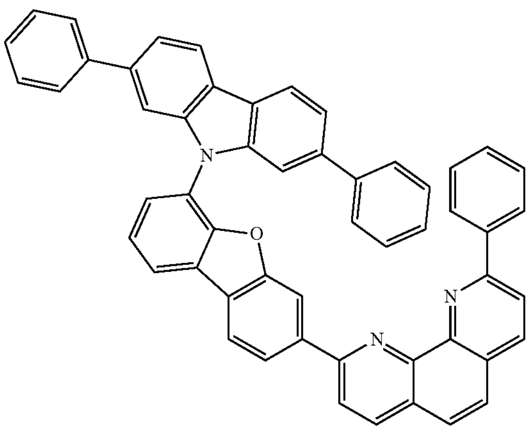
115
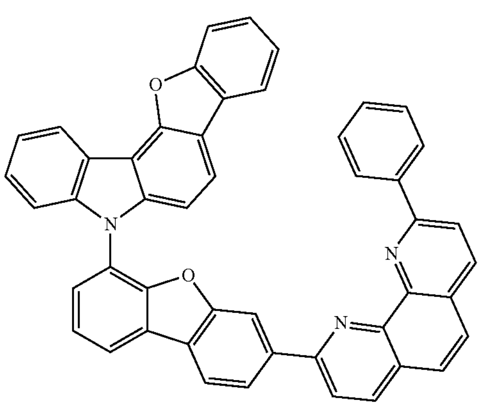
-continued
116
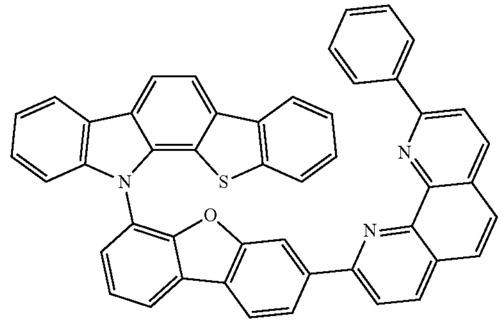
117
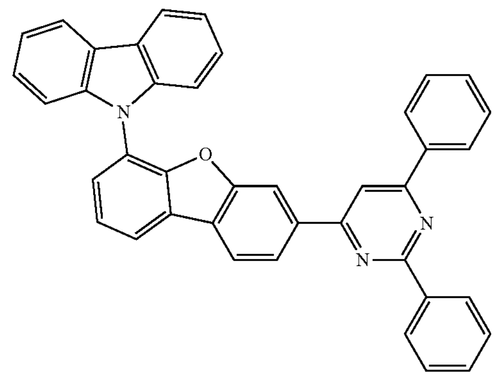
118
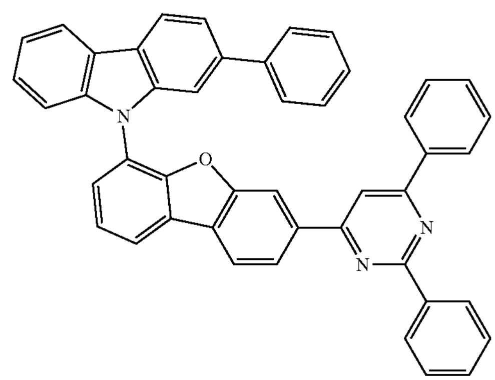
119
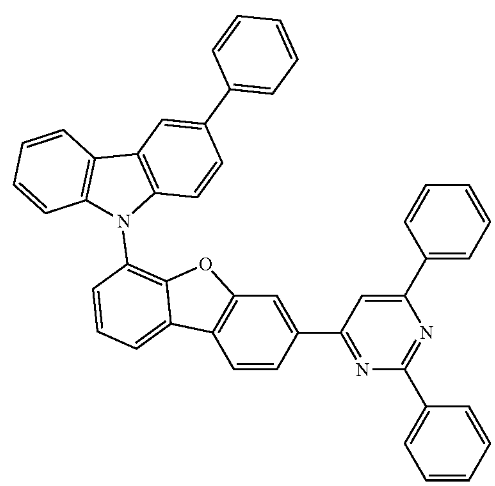

-continued
120
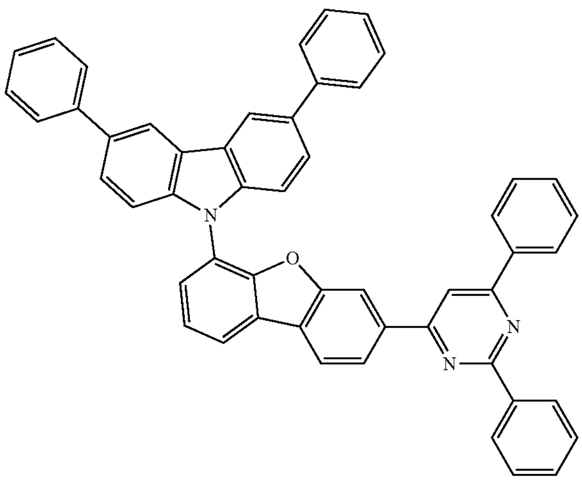
121
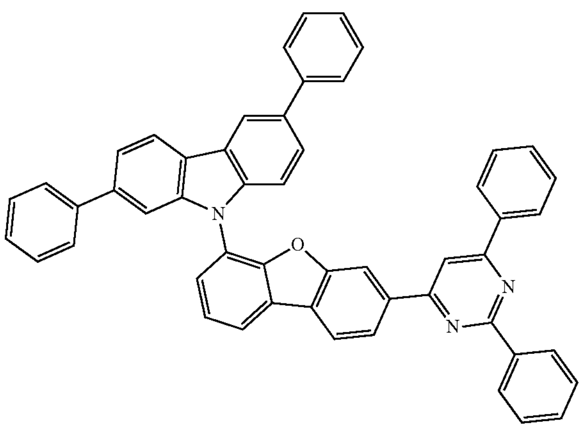
122
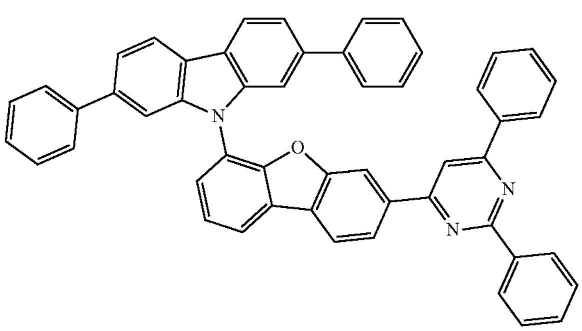
-continued
123
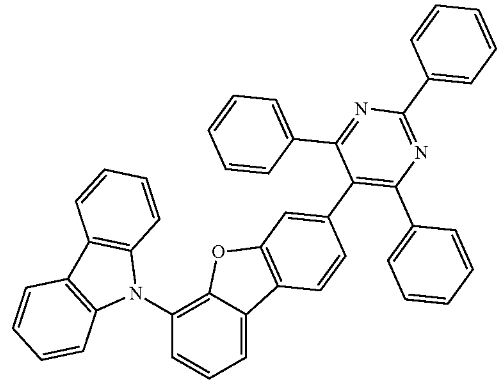
124
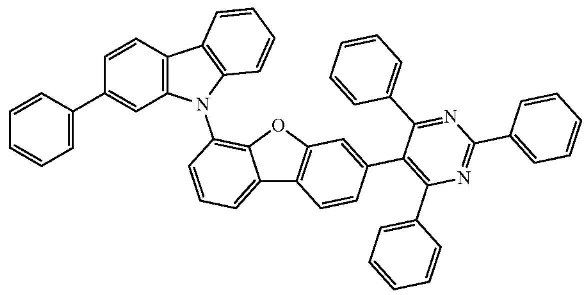
125
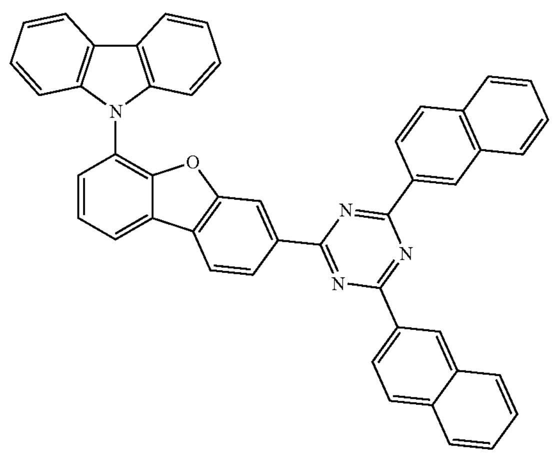
126
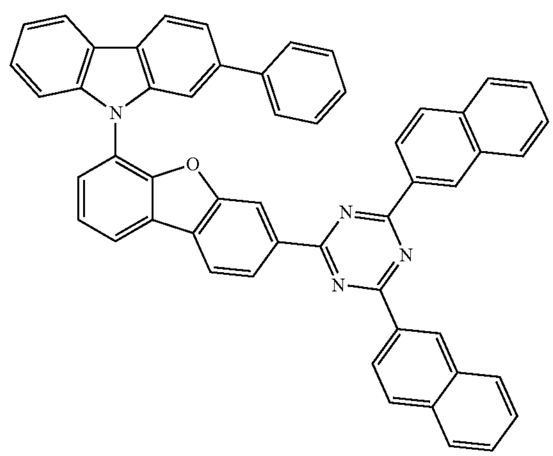

-continued
127
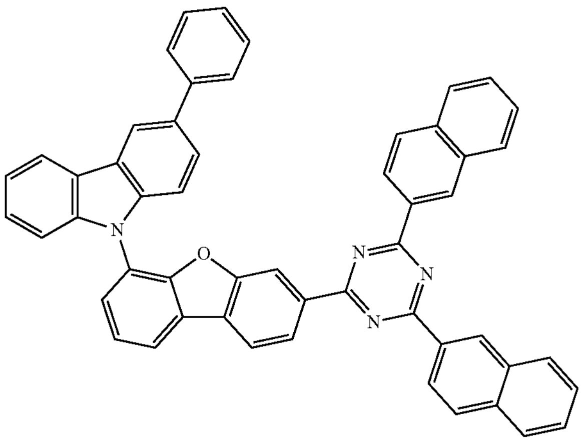
128
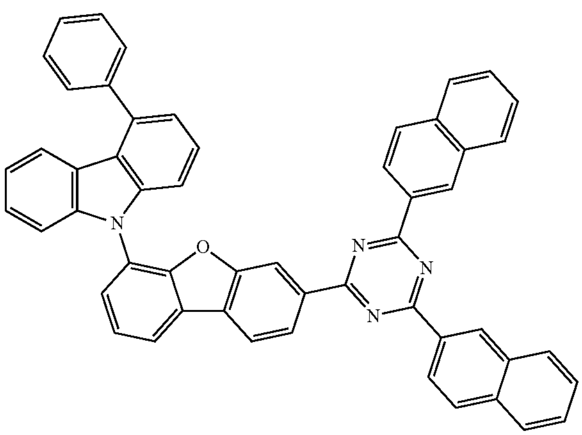
129
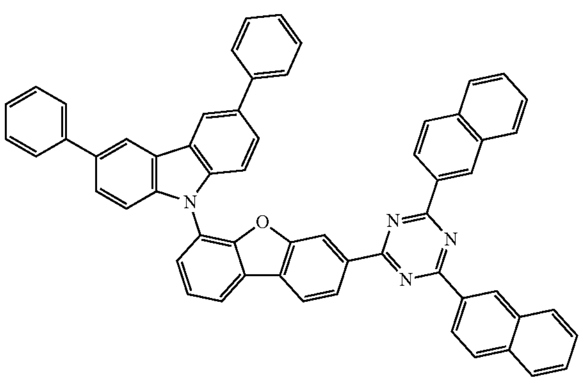
130
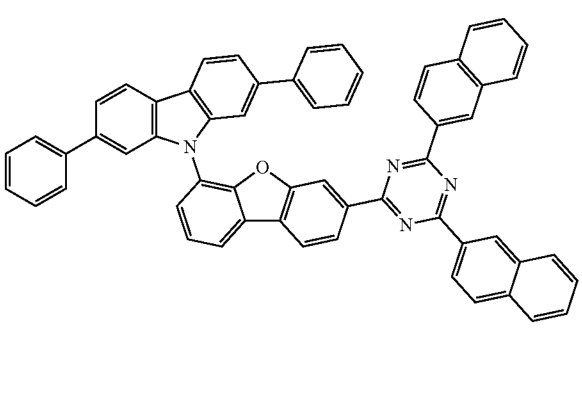
-continued
131
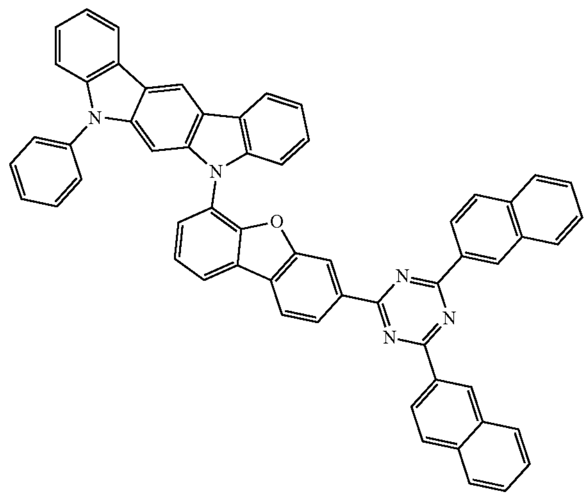
132
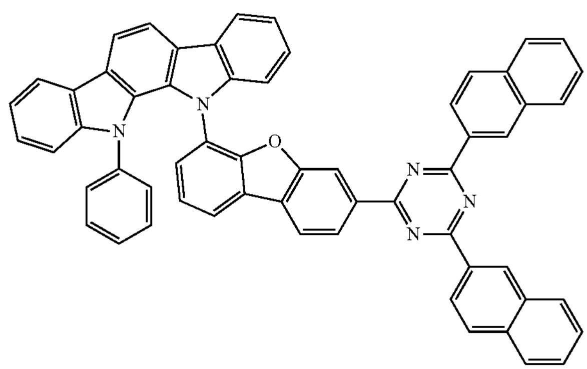
133
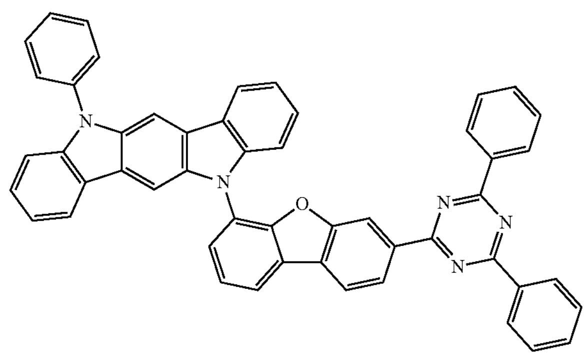
134
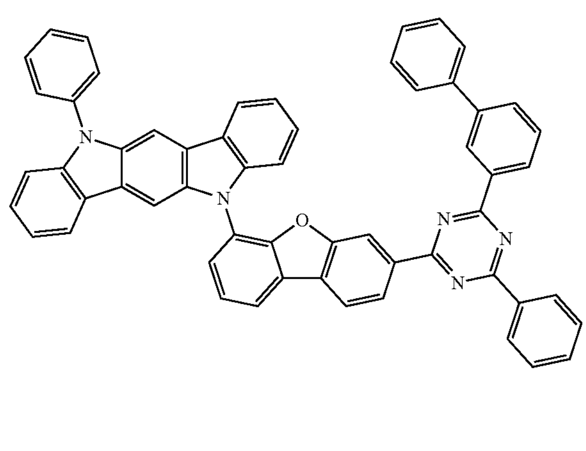

135
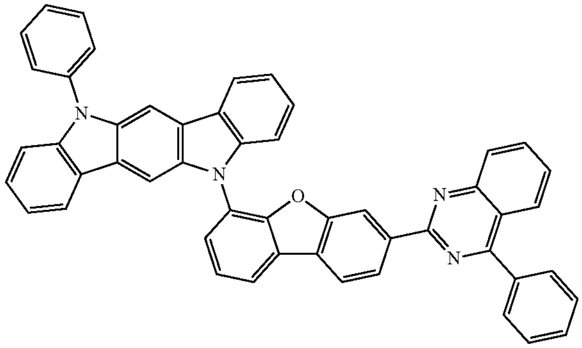
136
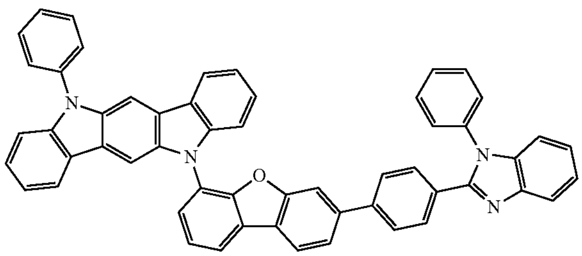
137
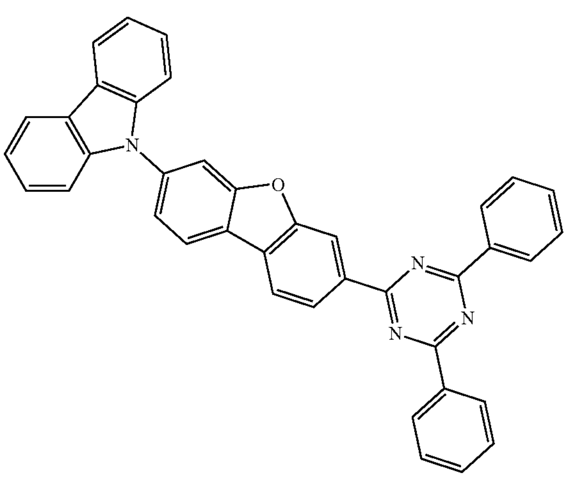
138
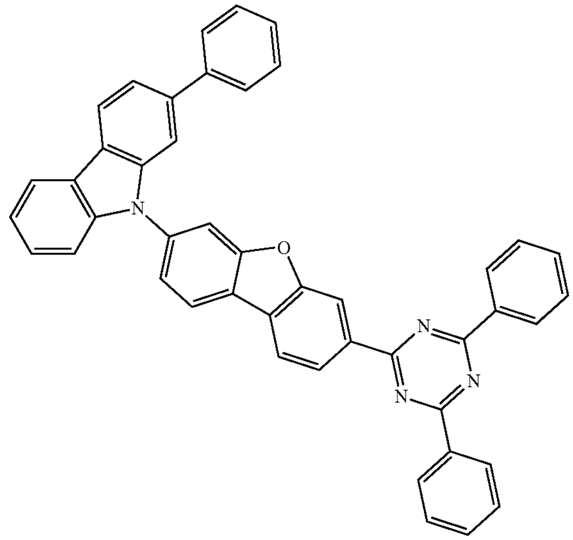
139
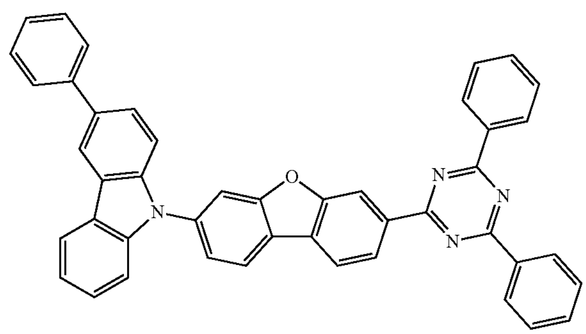
140
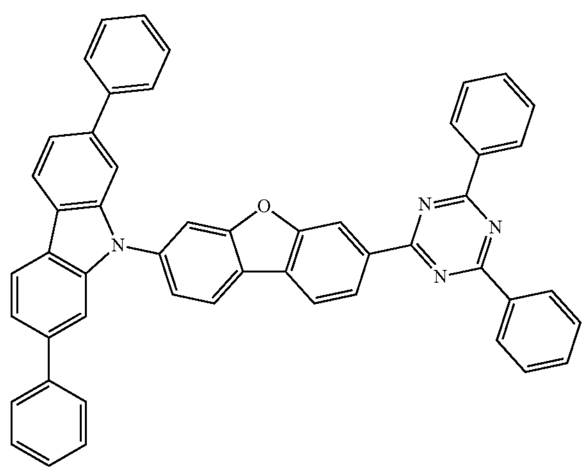

-continued
141
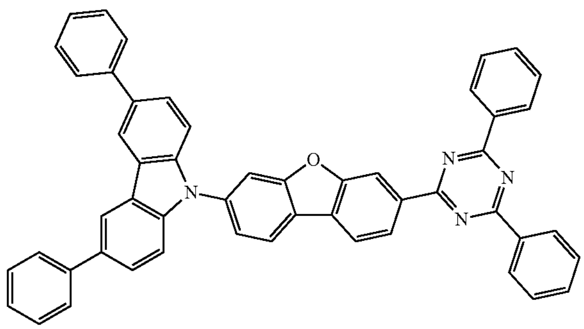
142
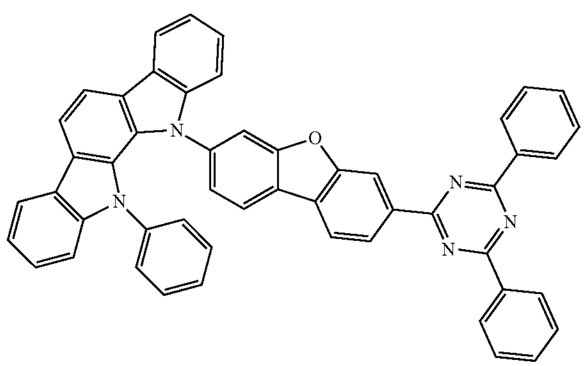
143
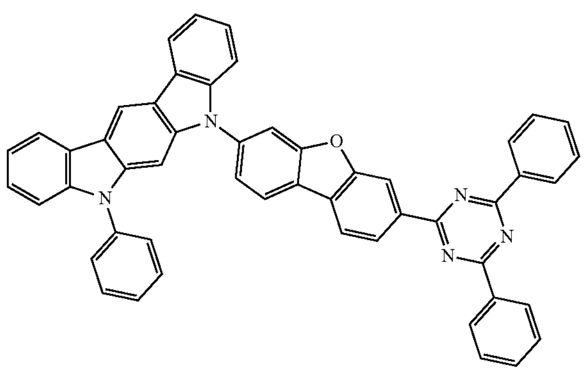
144
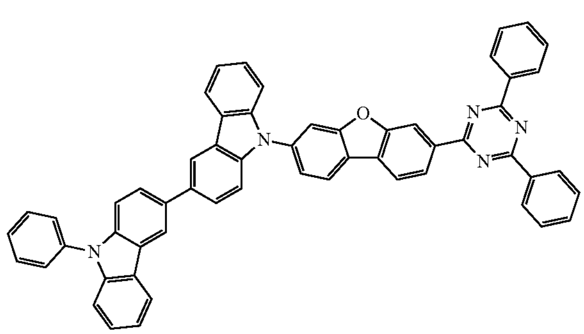
-continued
145
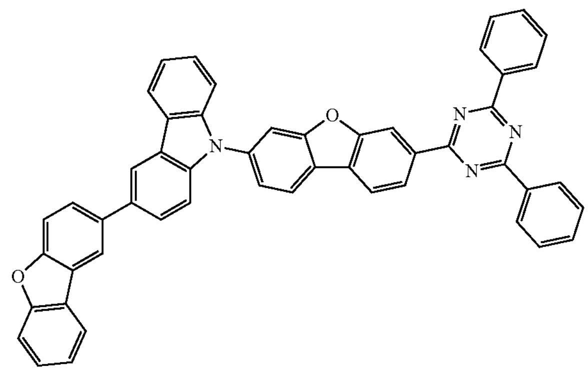
146
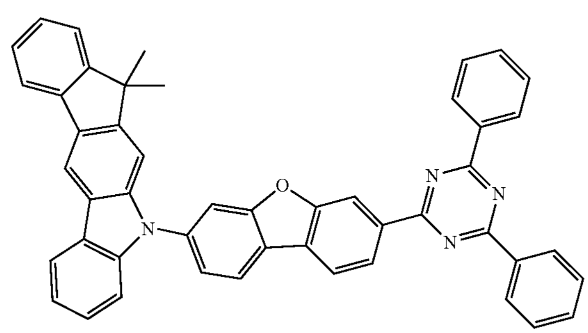
147
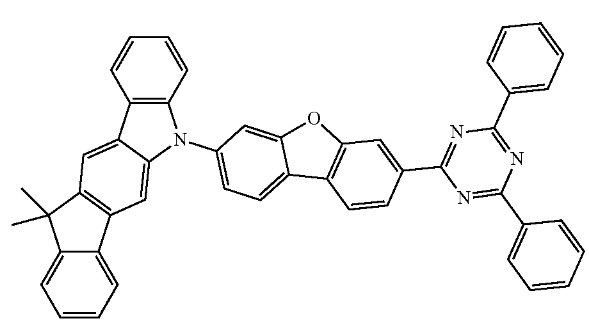
148
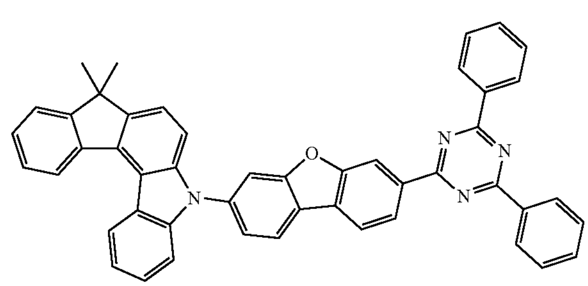

-continued
149
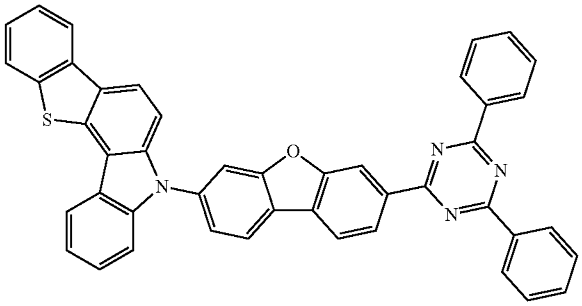
150
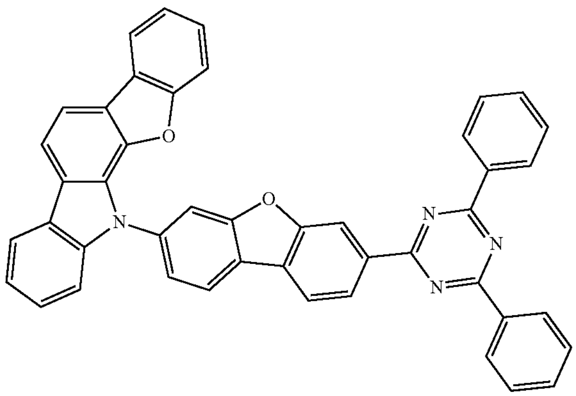
151
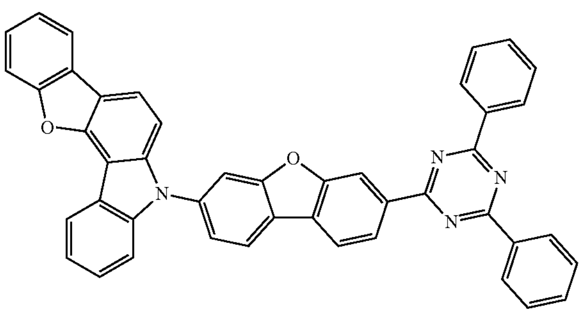
152
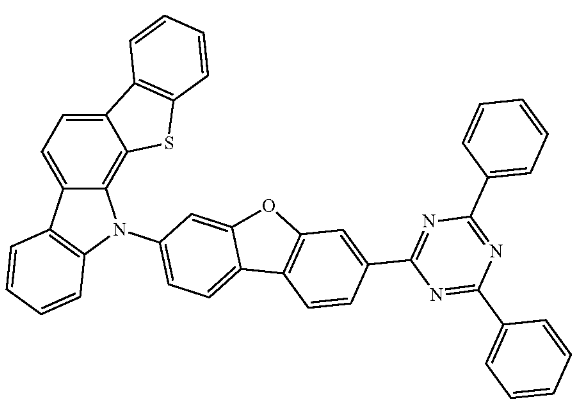
-continued
153
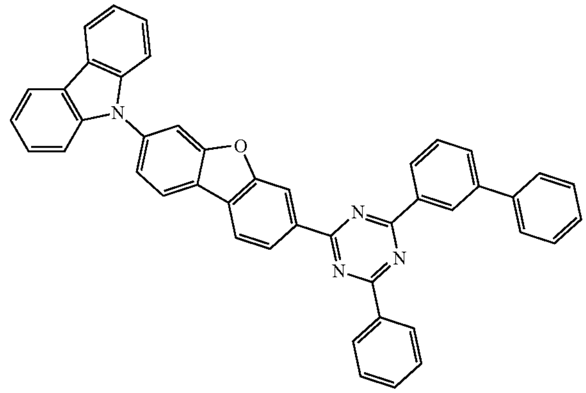
154
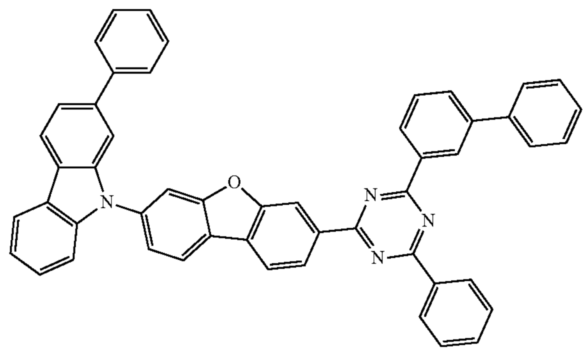
155
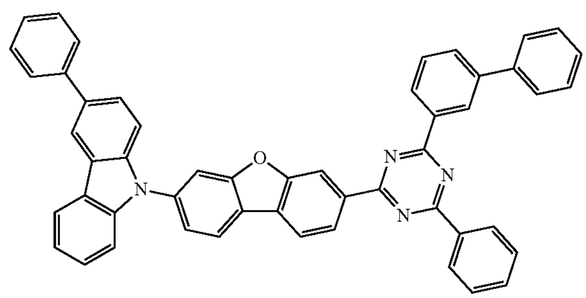
156
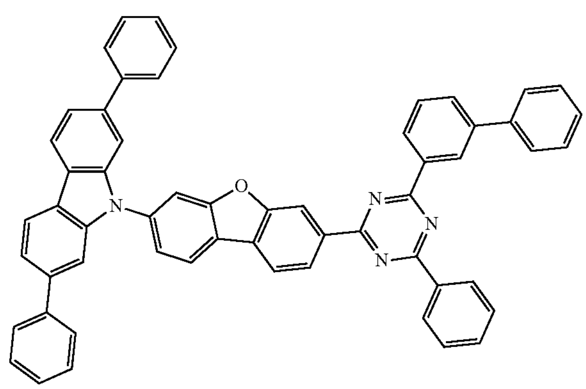

157
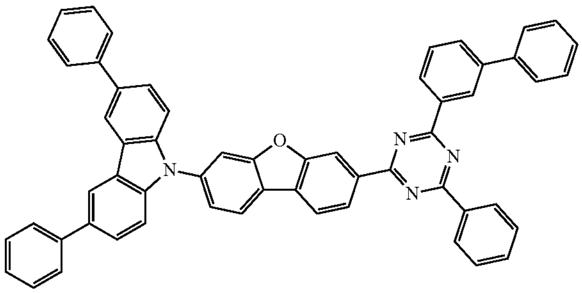
158
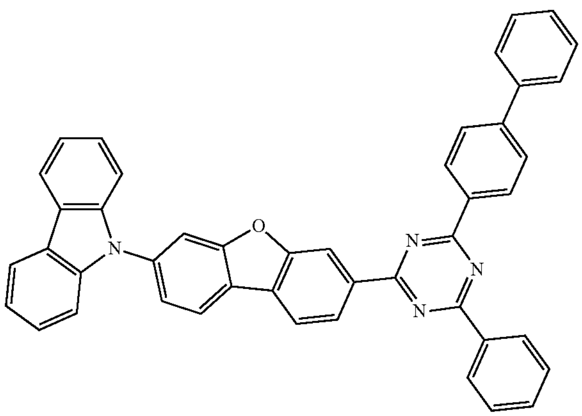
159
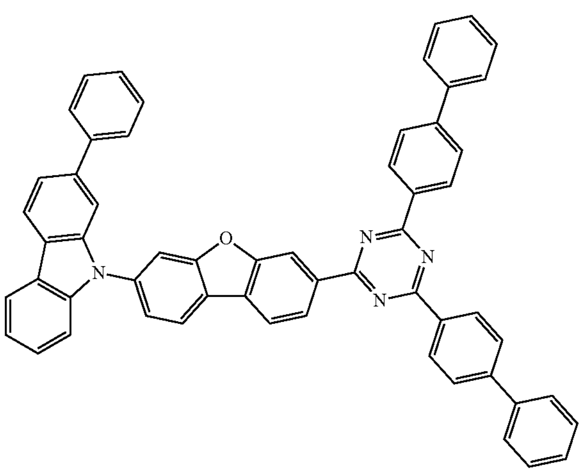
160
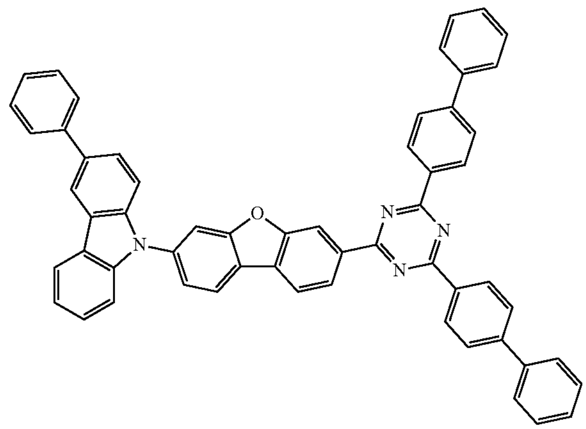
161
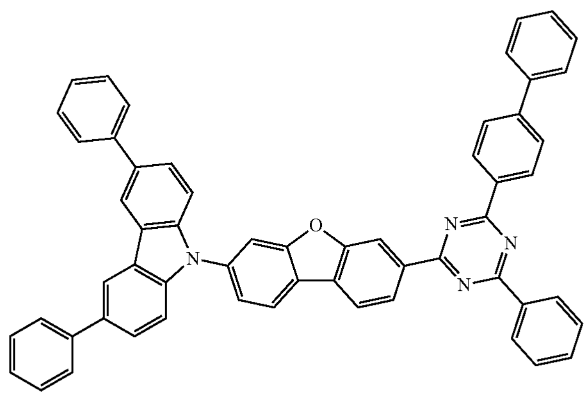
162
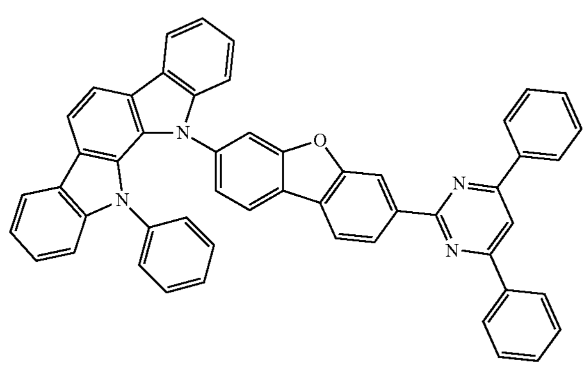

-continued
163
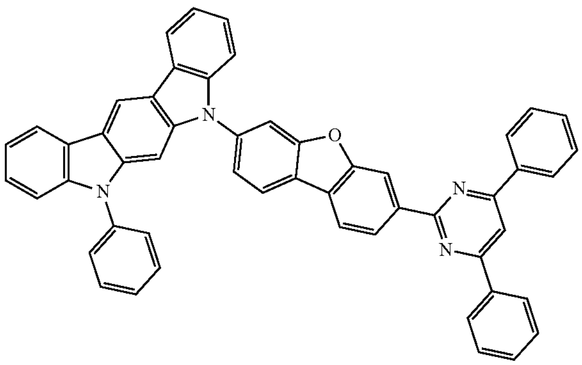
164
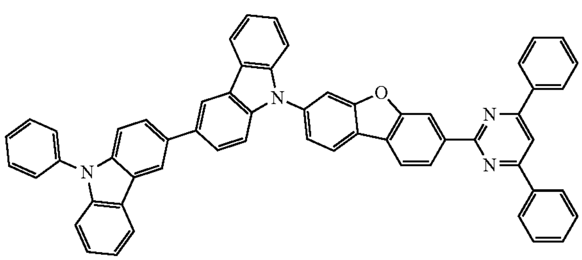
165
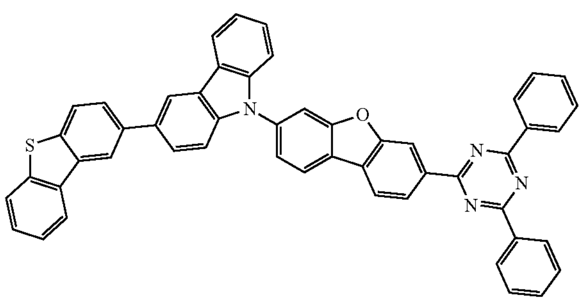
169
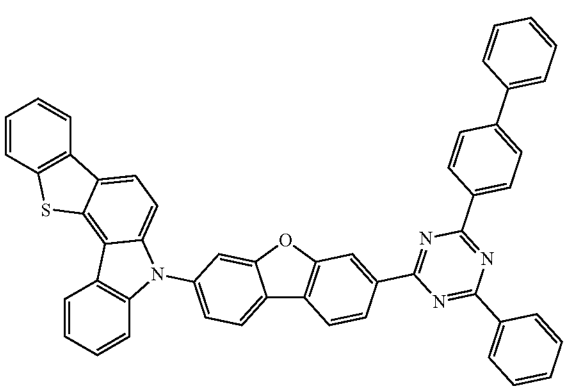
-continued
166
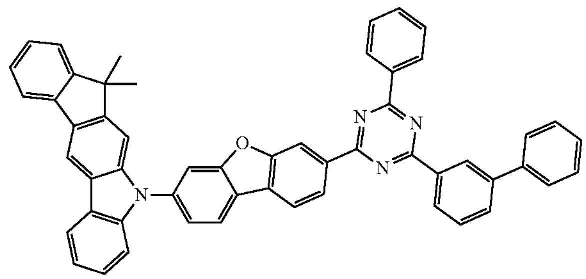
167
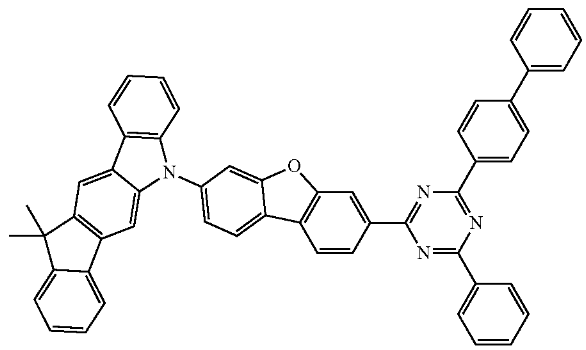
168
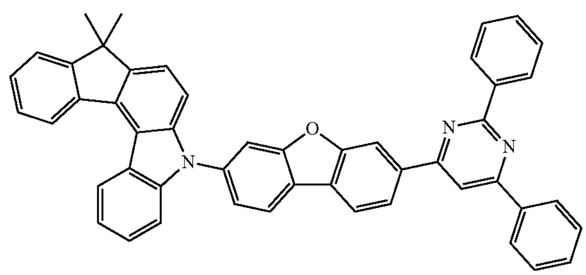
170
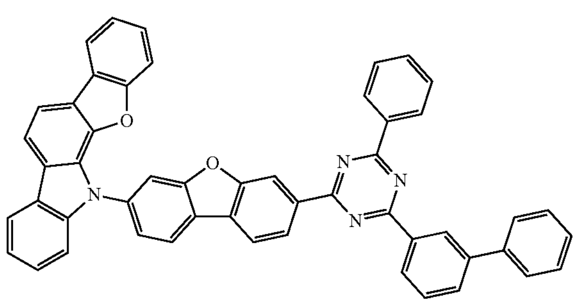

-continued
171
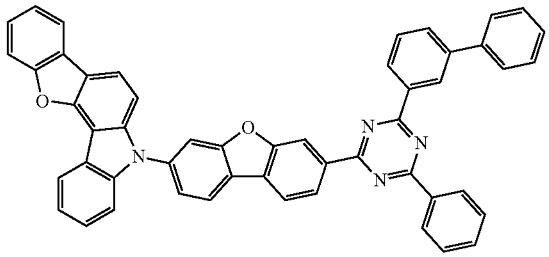
172
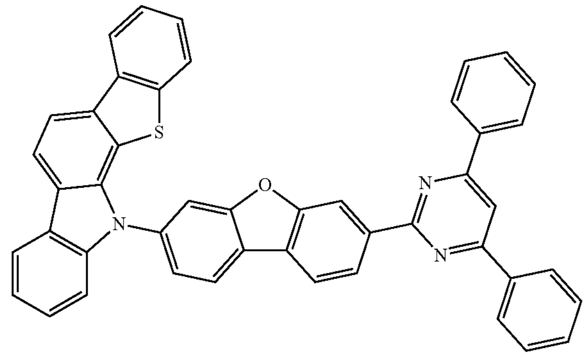
173
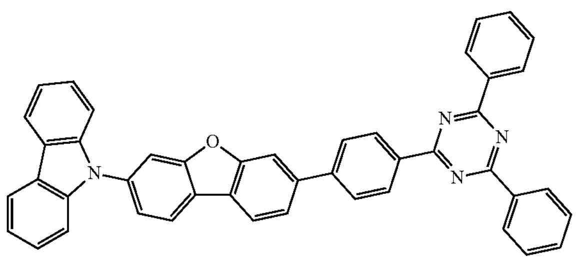
174
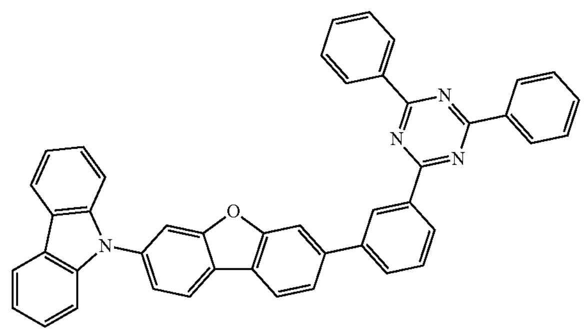
175
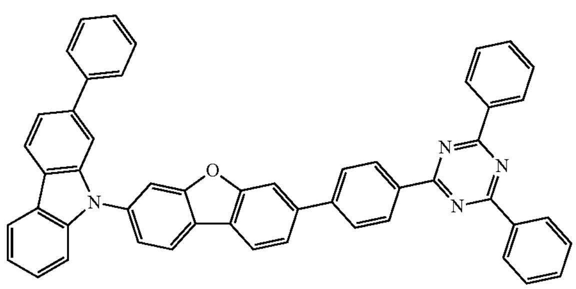
176
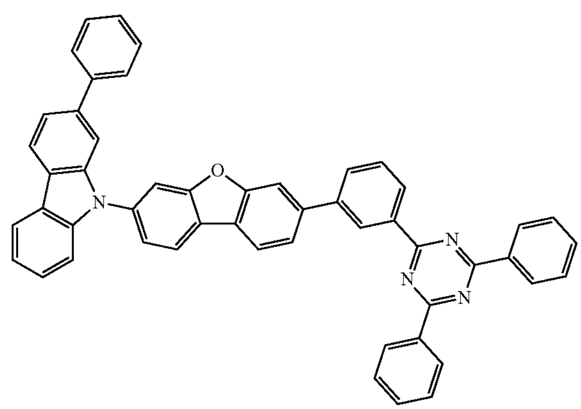
177
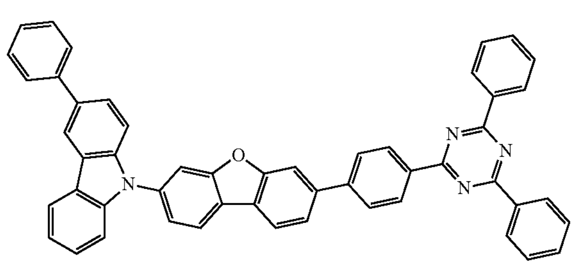
178
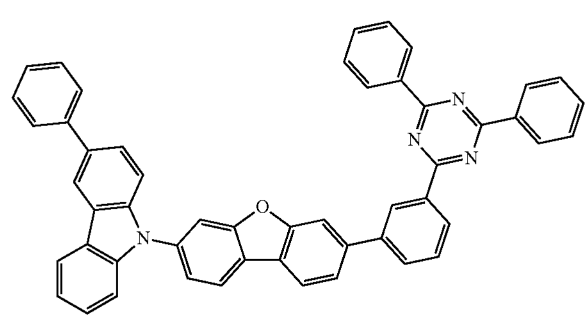

-continued
179
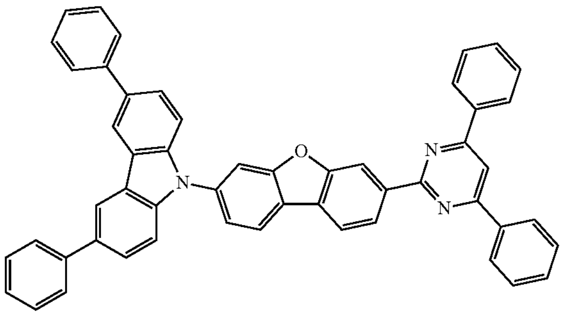
180
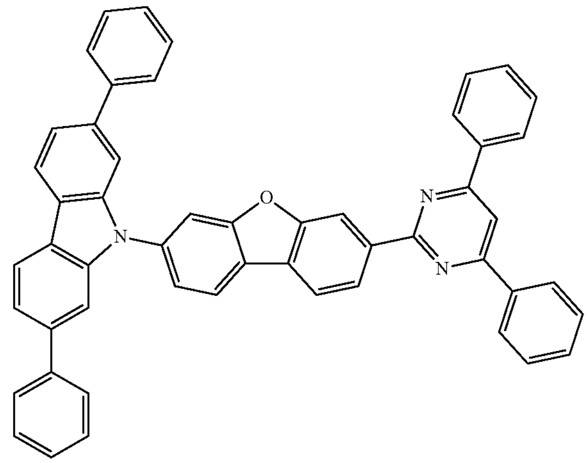
181
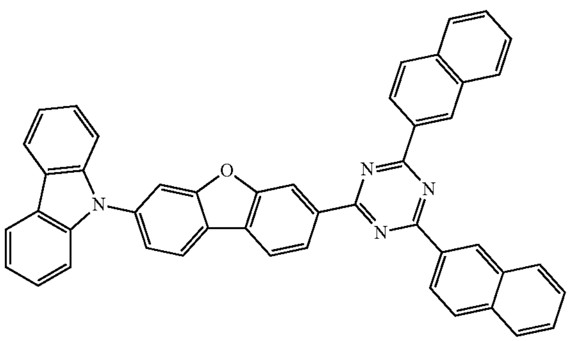
182
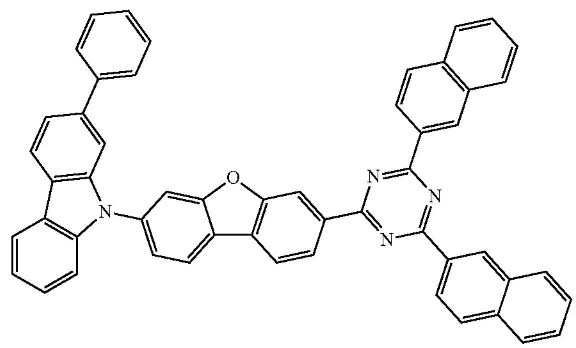
183
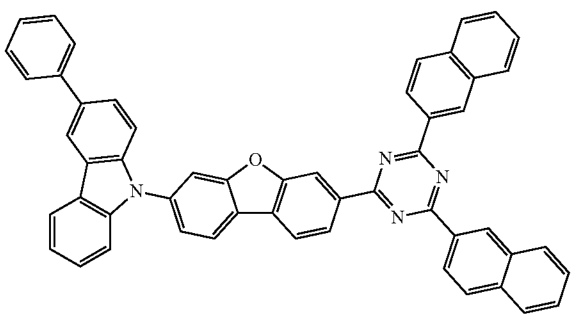
184
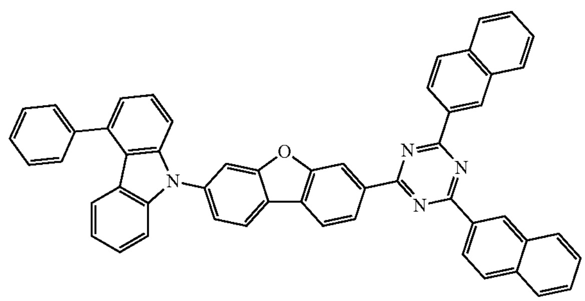
185
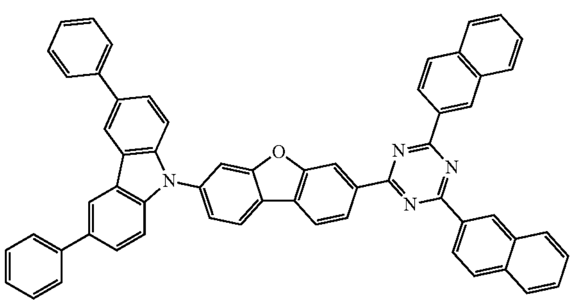
186
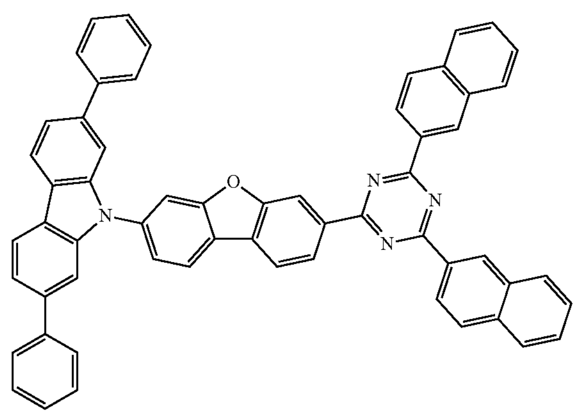

-continued
187
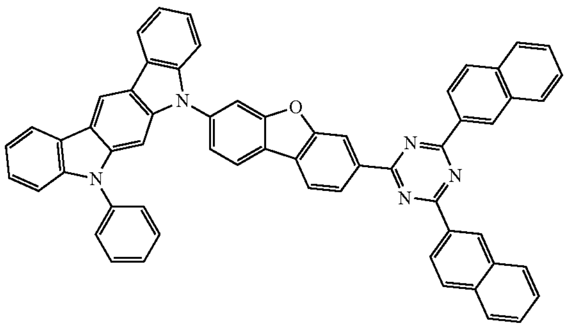
188
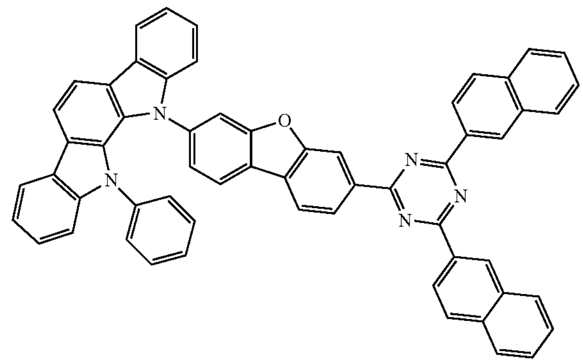
189
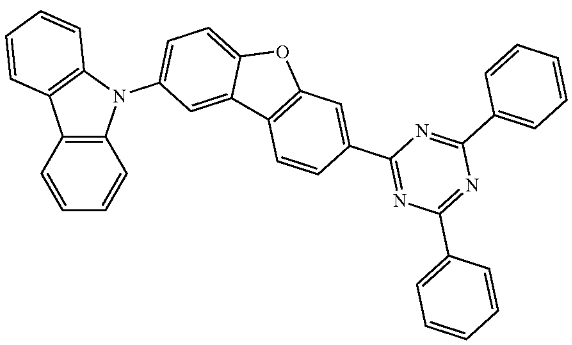
190
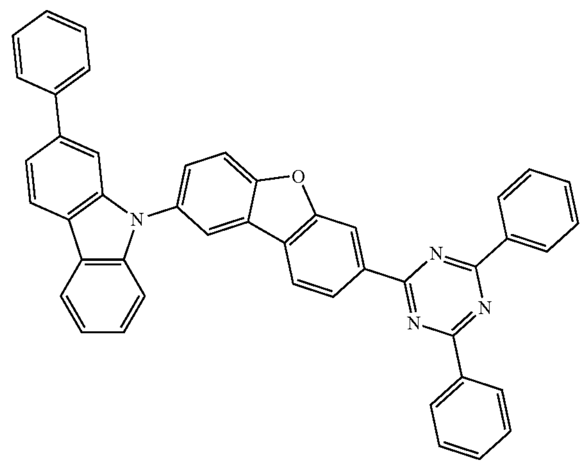
191
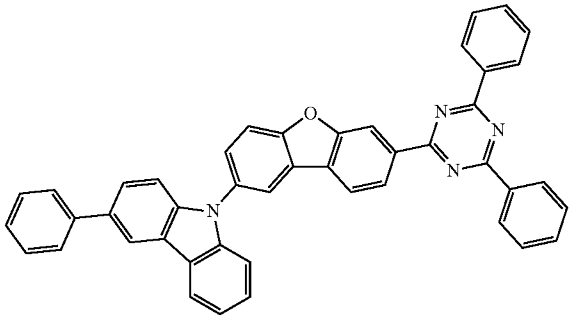
192
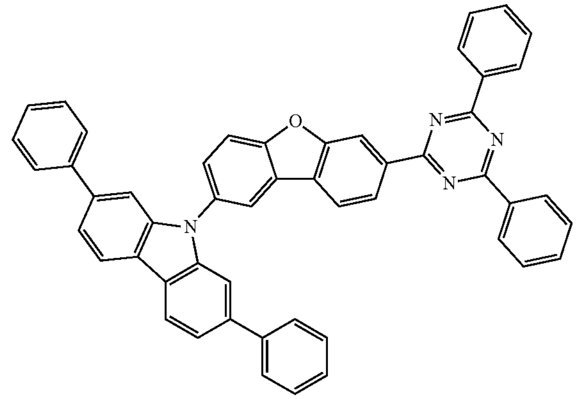

-continued
193
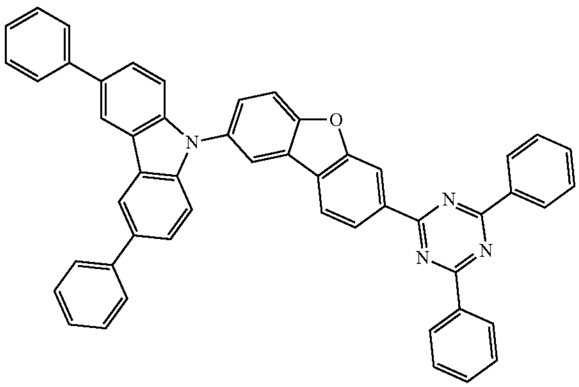
194
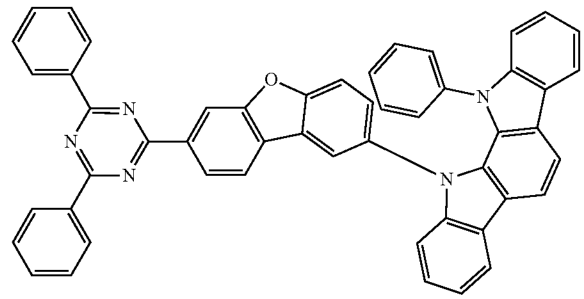
195
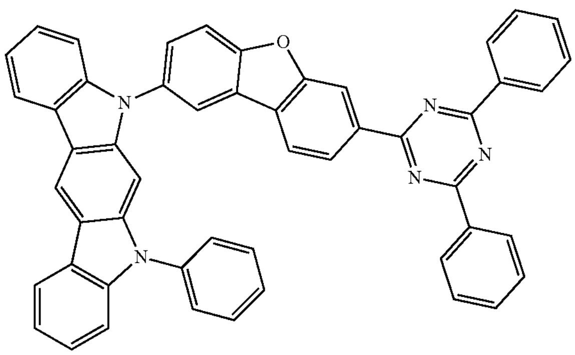
196
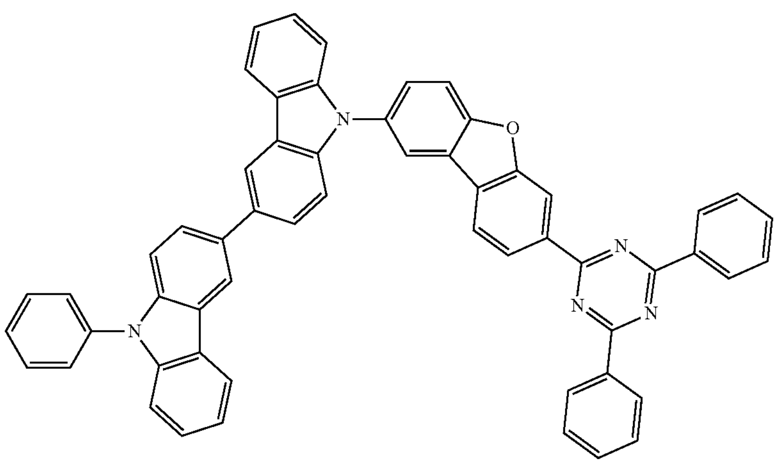
197
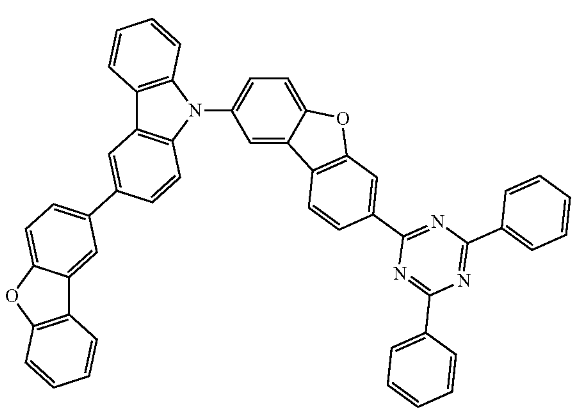
198
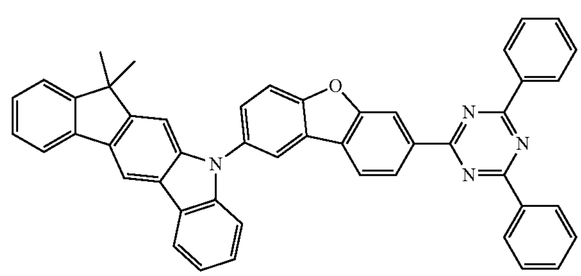

-continued
199
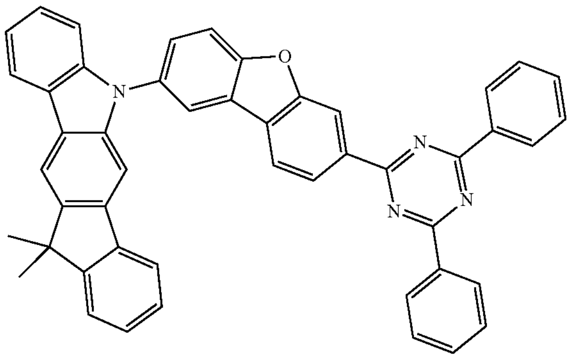
200
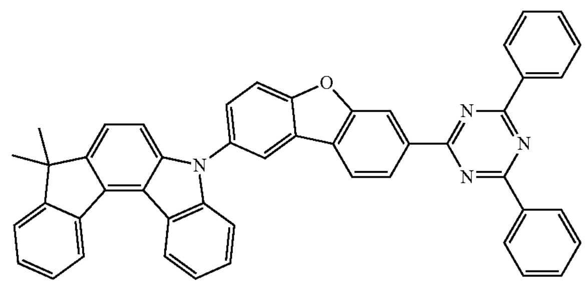
201
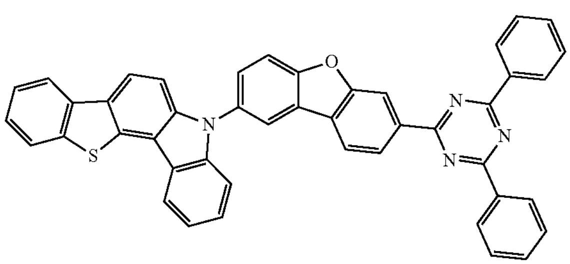
202
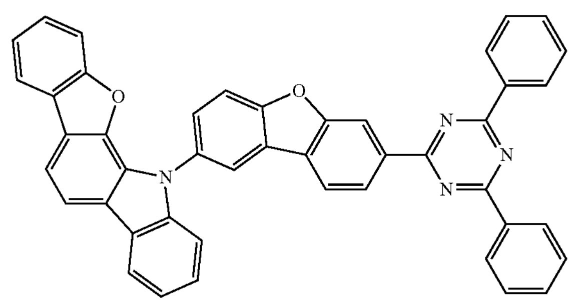
203
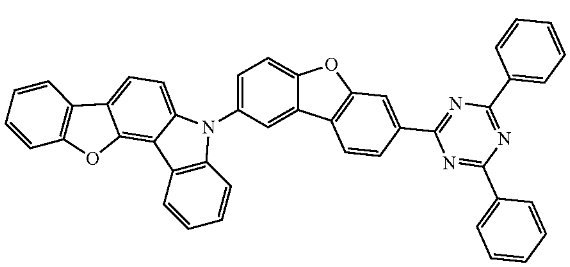
204
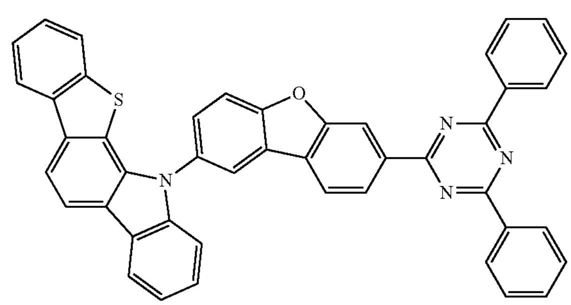
205
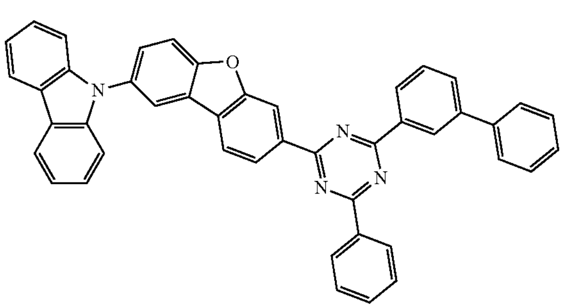
206
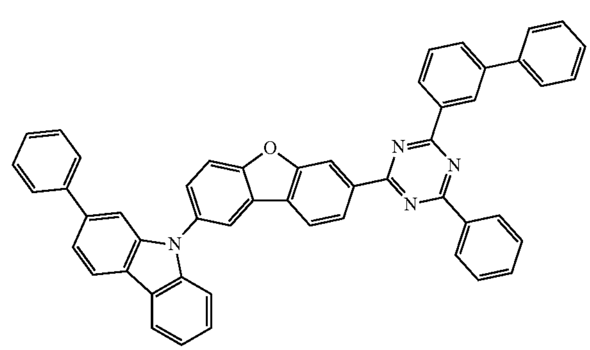

-continued
207
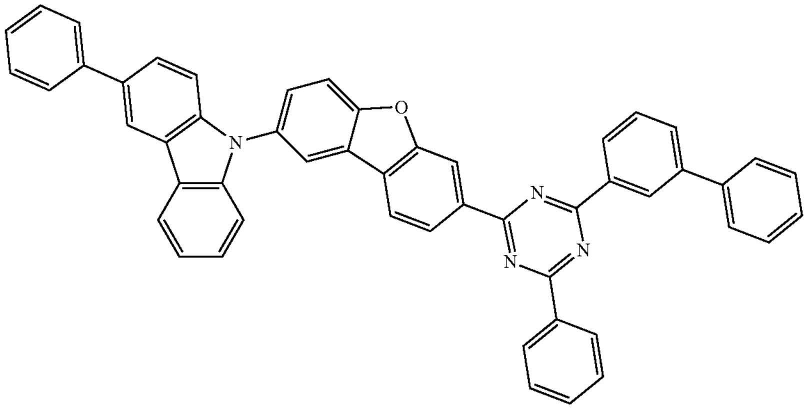
208
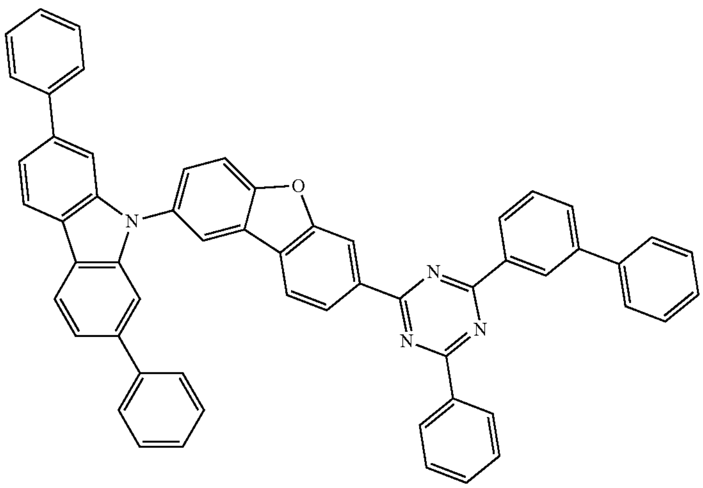
209
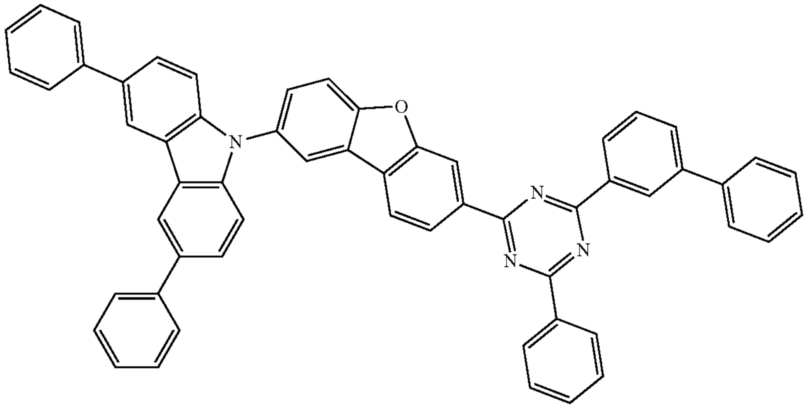

-continued
210
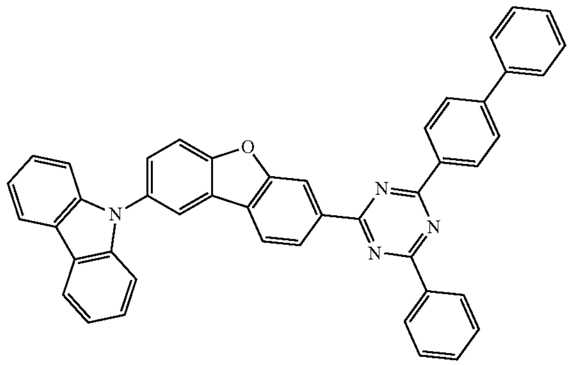
211
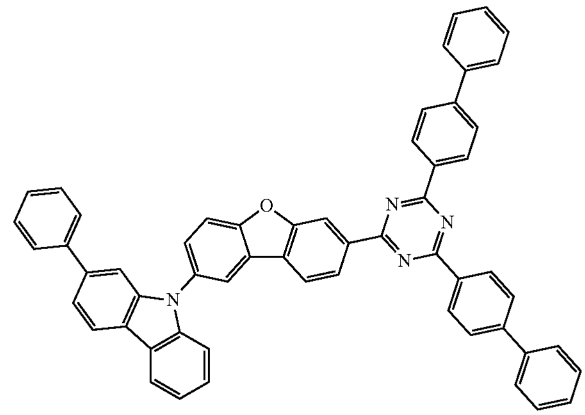
212
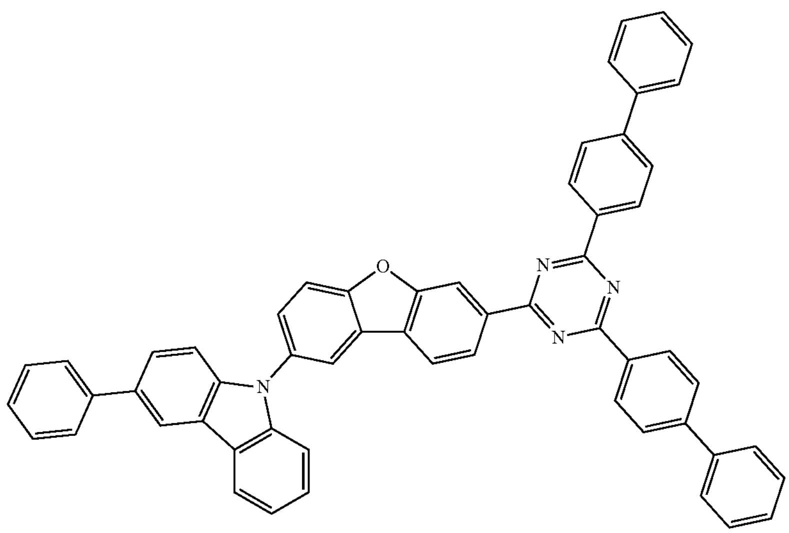
213
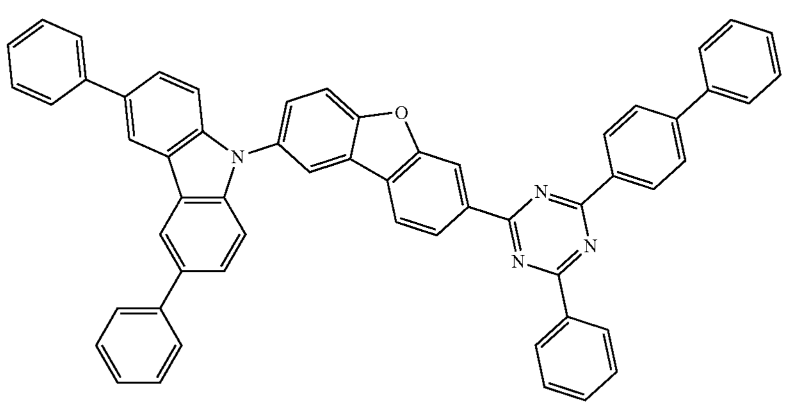

-continued
214
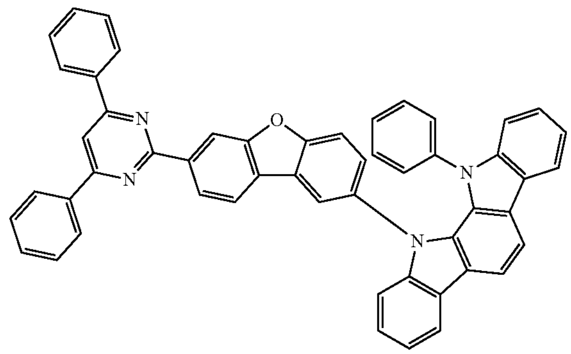
215
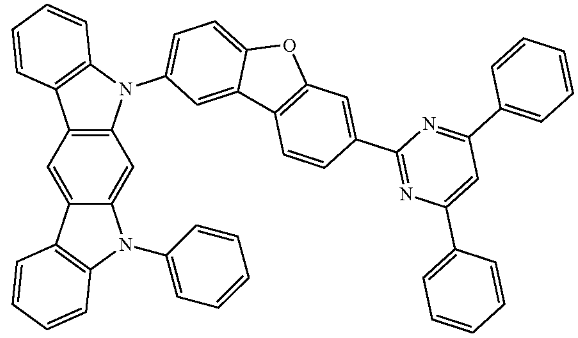
216
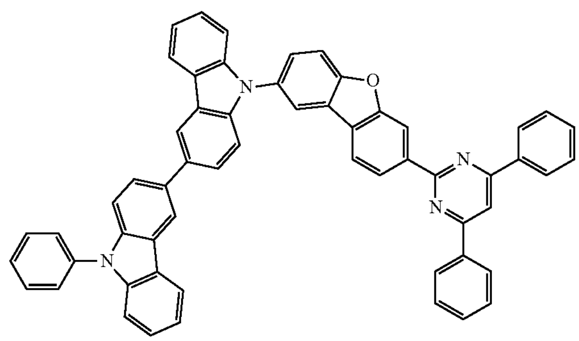
217
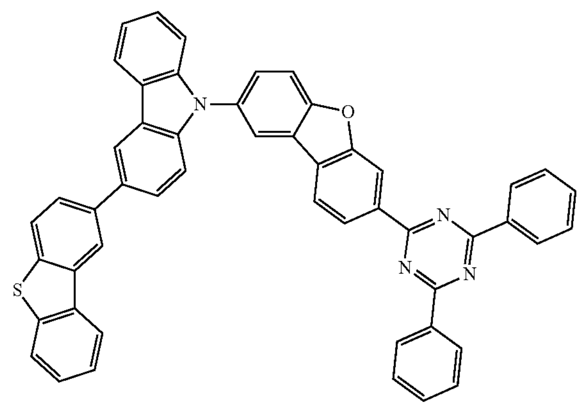
218
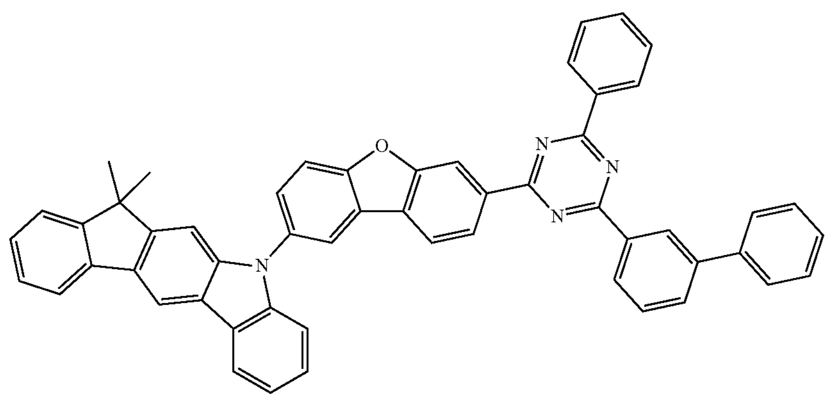
219
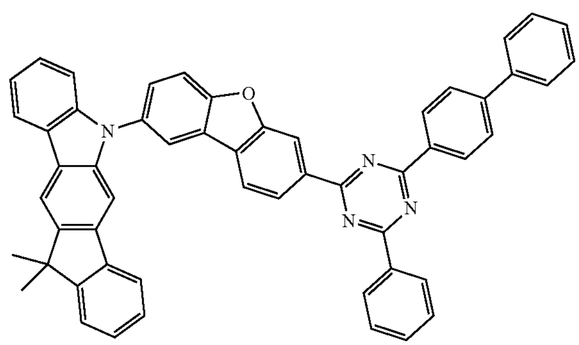
220
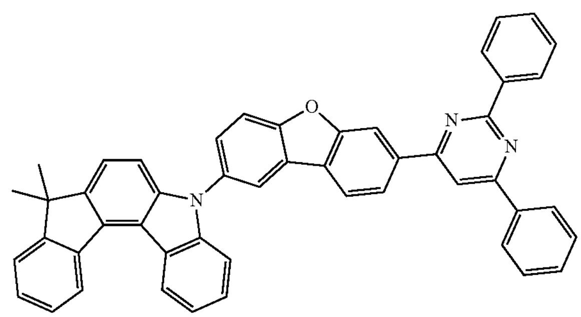

-continued
221
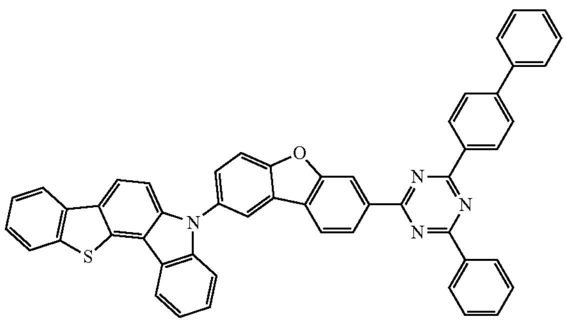
222
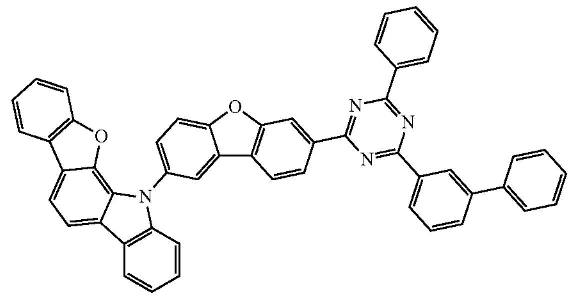
223
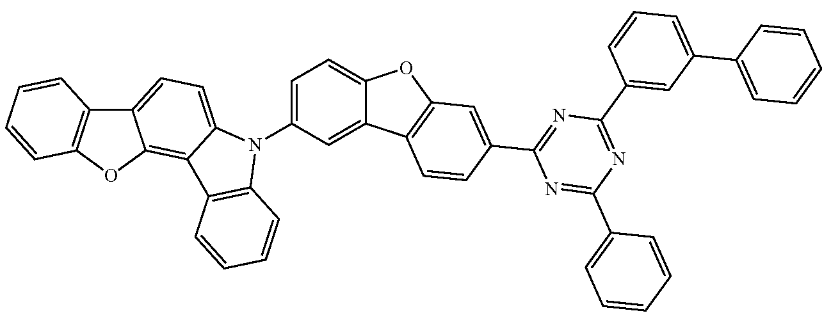
224
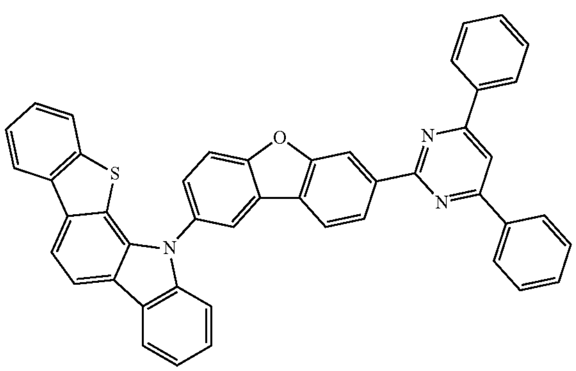
225
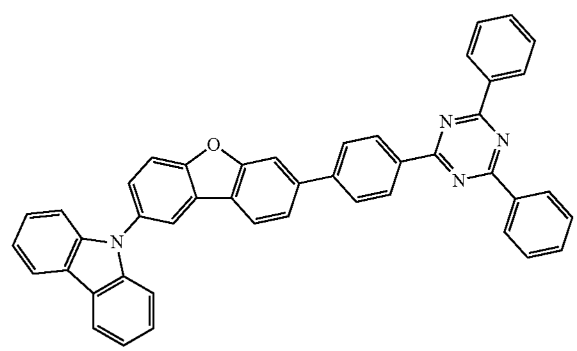
226
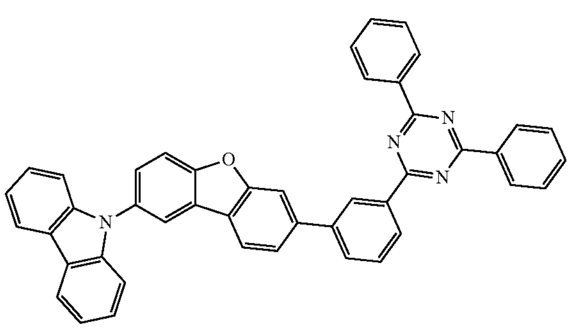
227
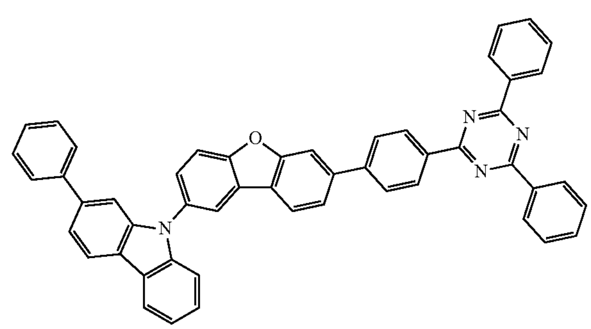

-continued
228
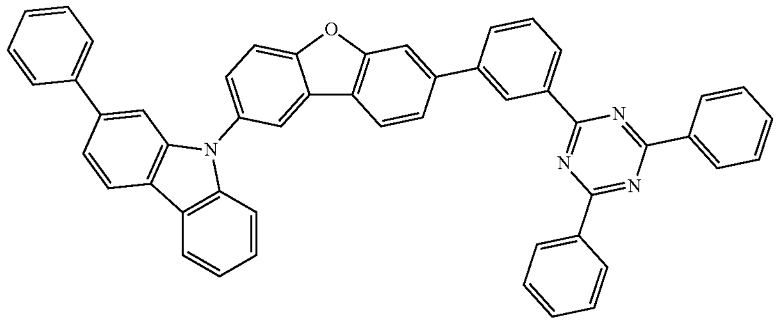
229
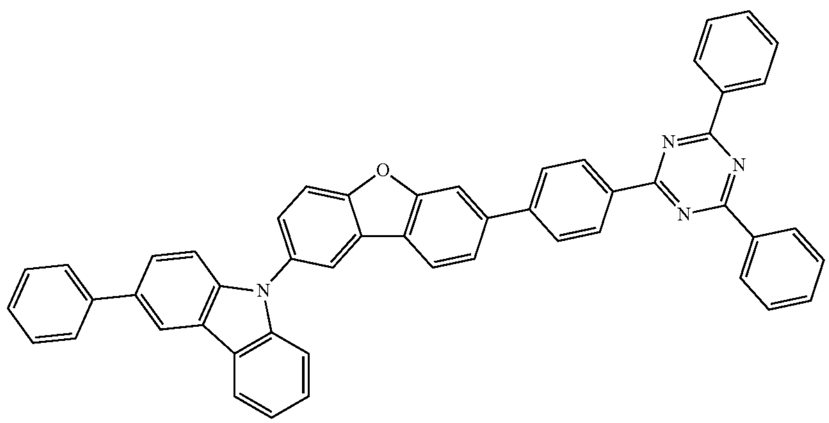
230
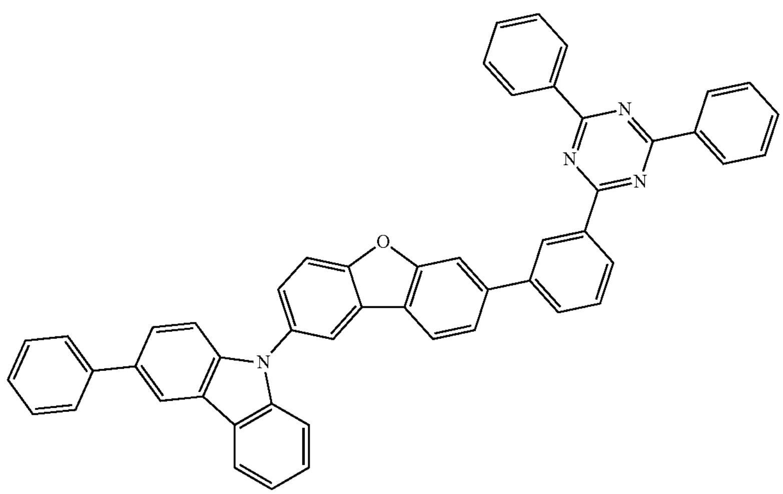
231
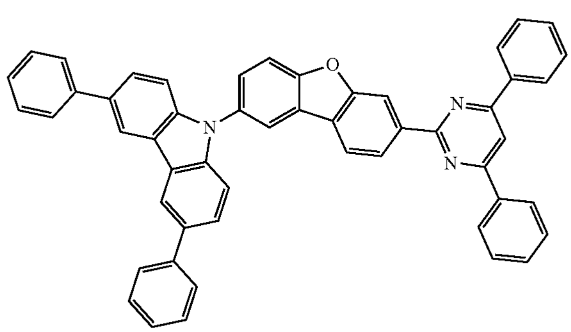
232
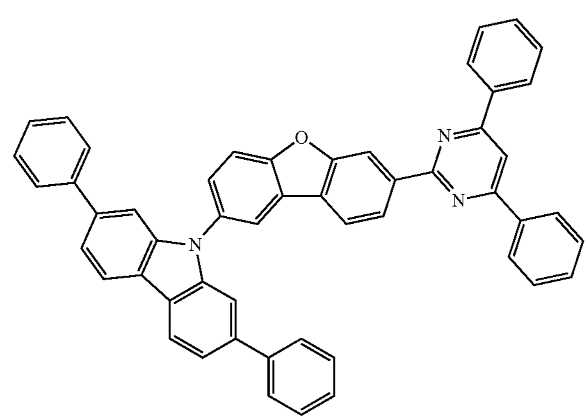

-continued
233
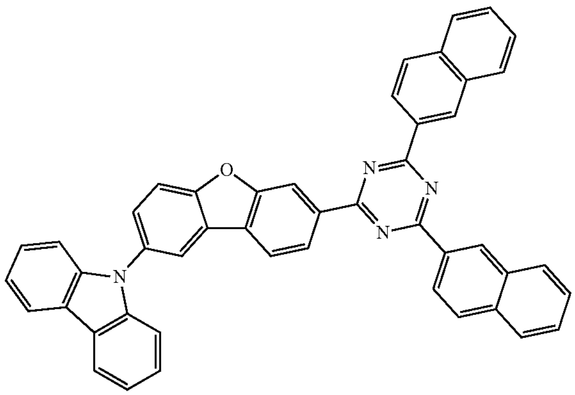
234
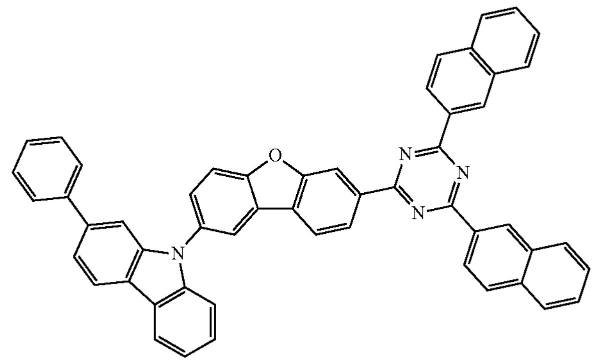
235
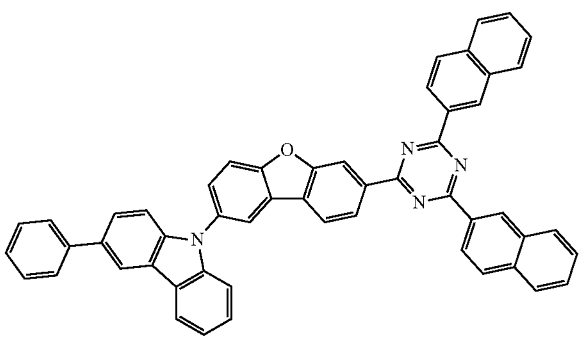
236
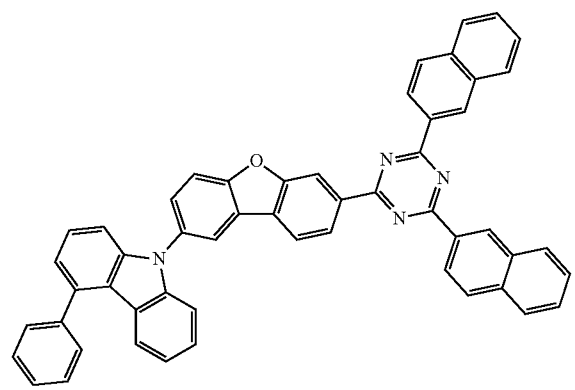
237
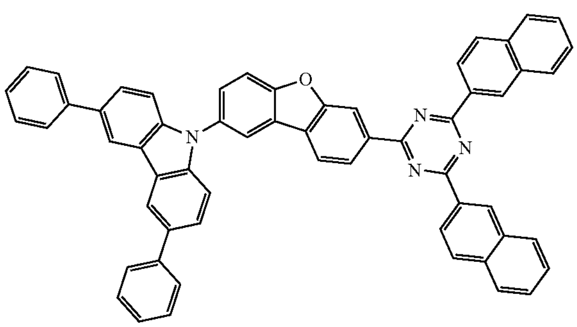
238
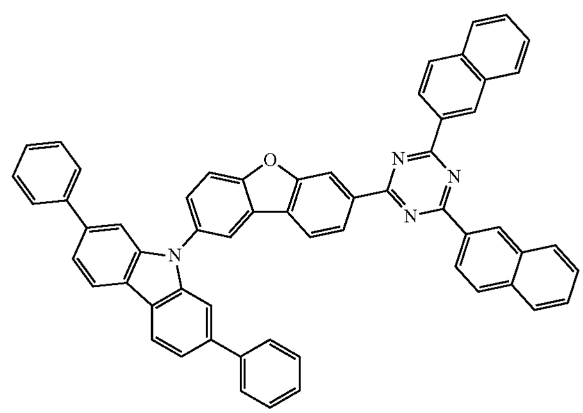
239
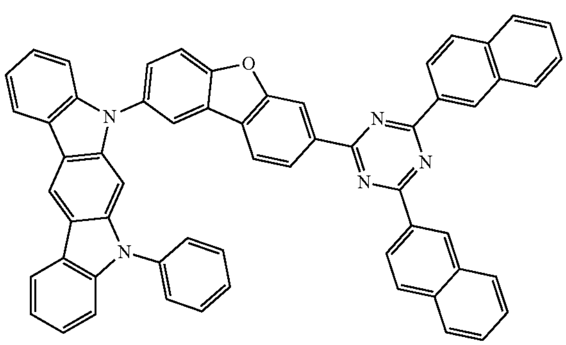
240
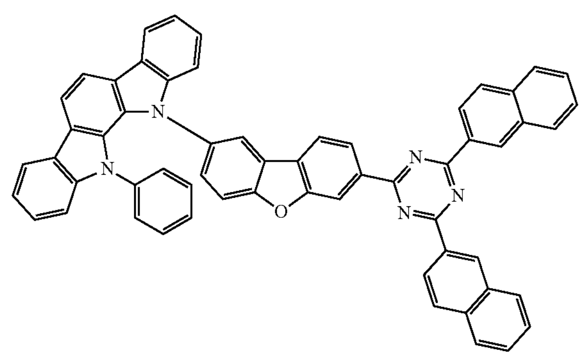

-continued
241
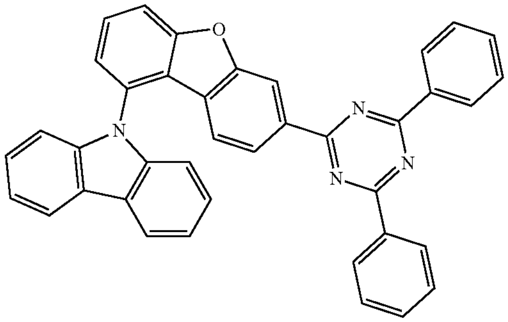
242
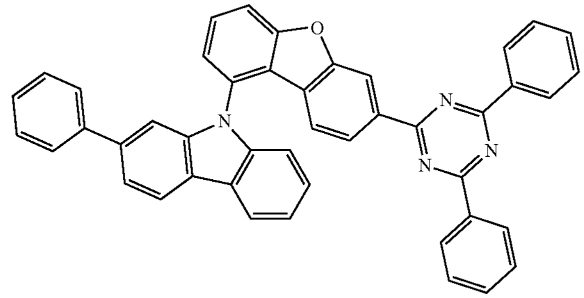
243
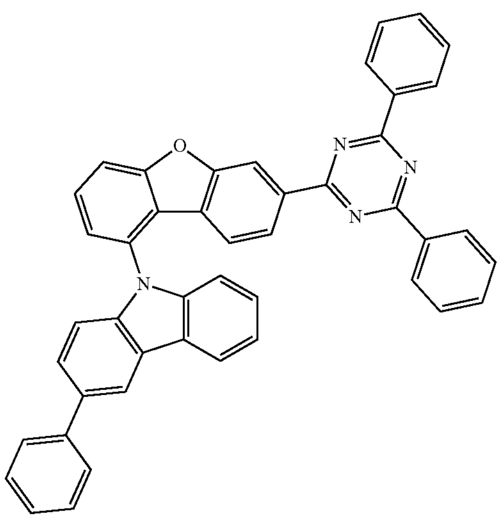
244
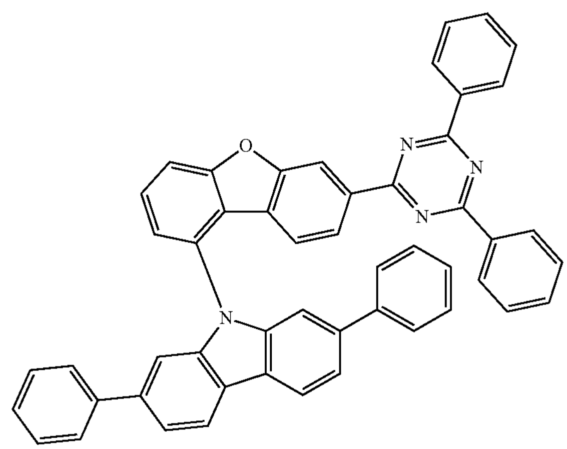
245
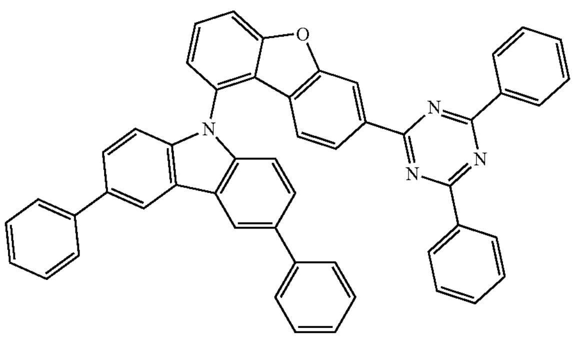
246
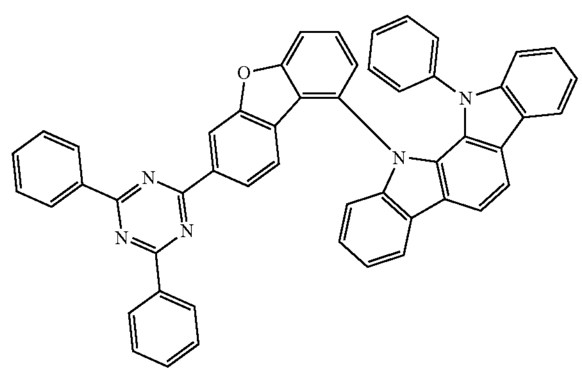

-continued
247
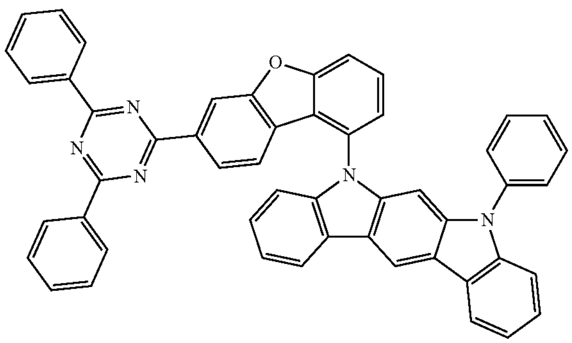
248
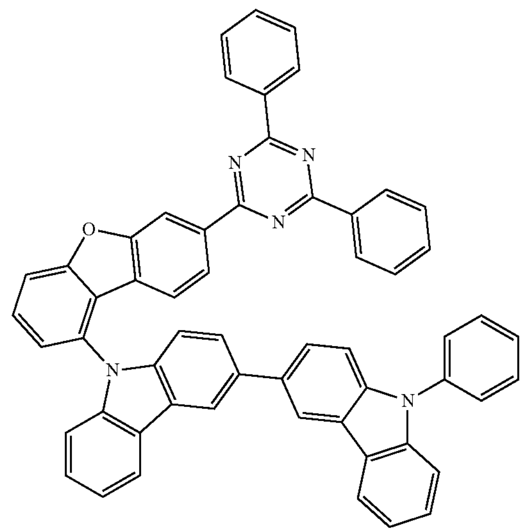
249
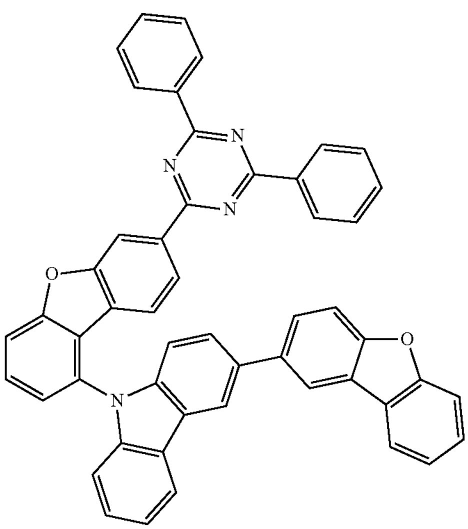
250
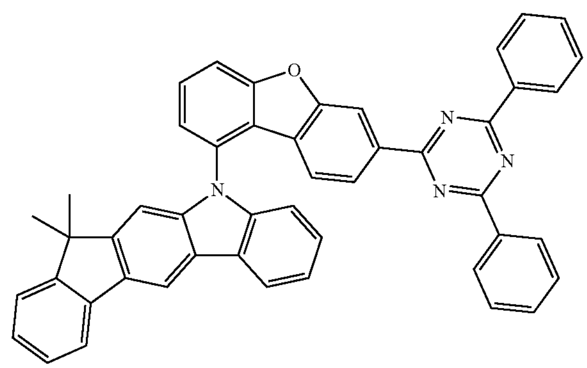
251
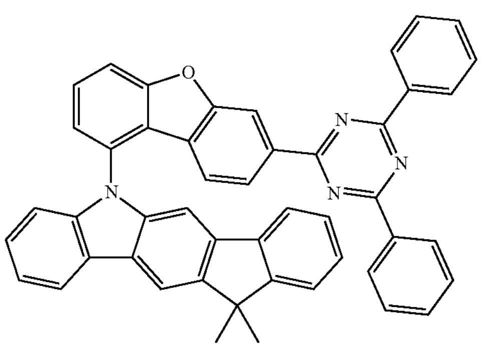
252
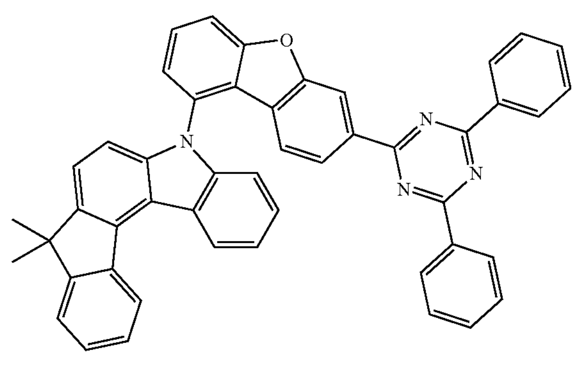

-continued
253
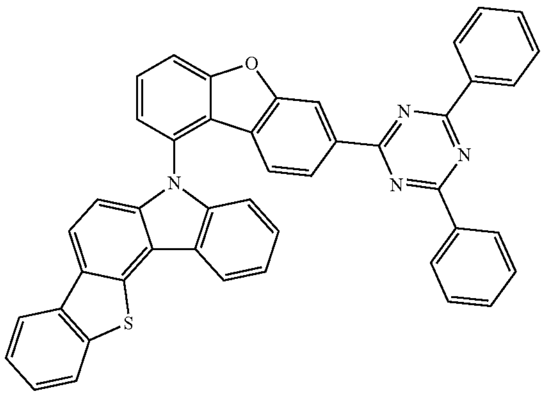
254
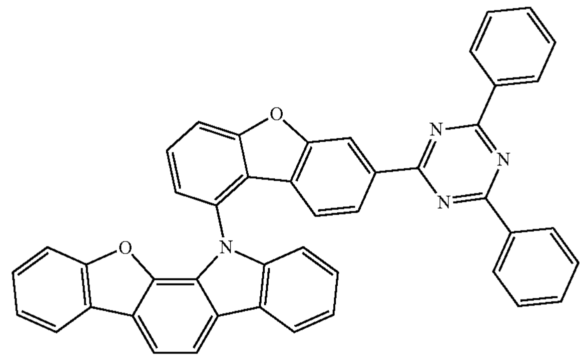
255
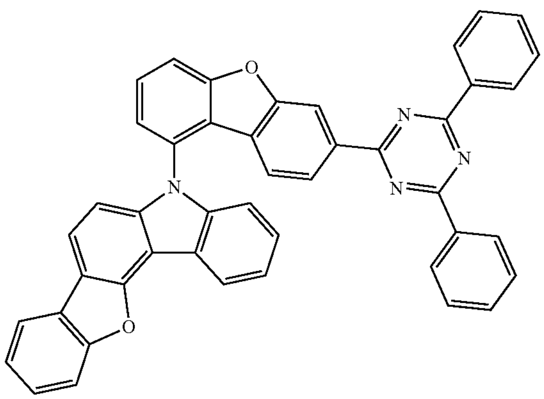
256
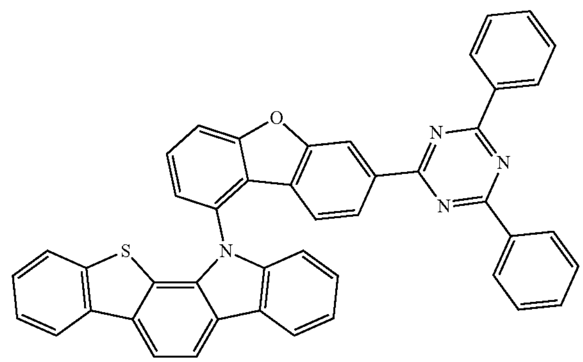
257
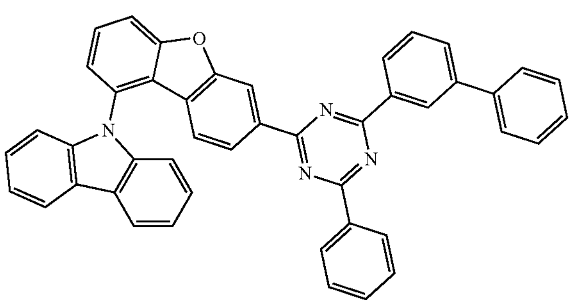
258
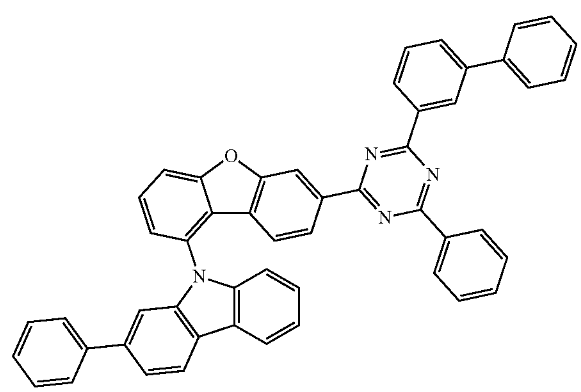
259
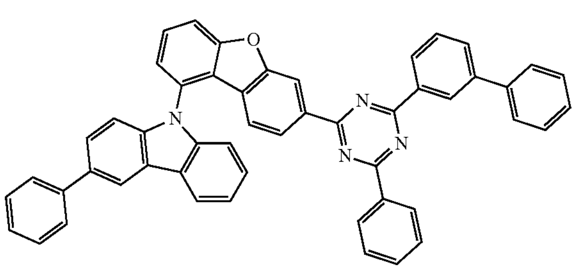
260
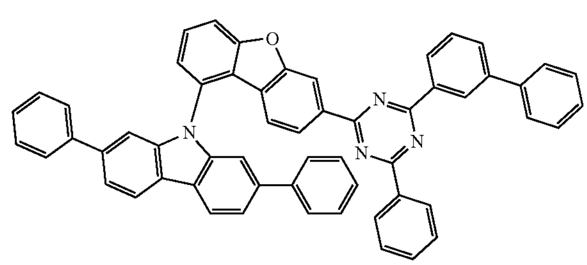

-continued
261
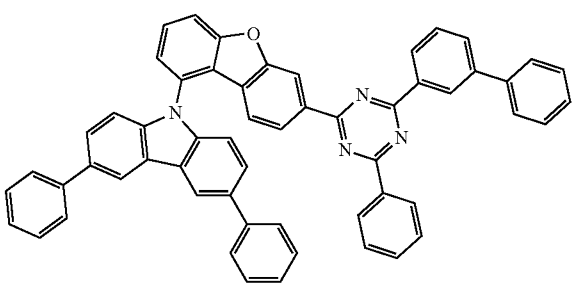
262
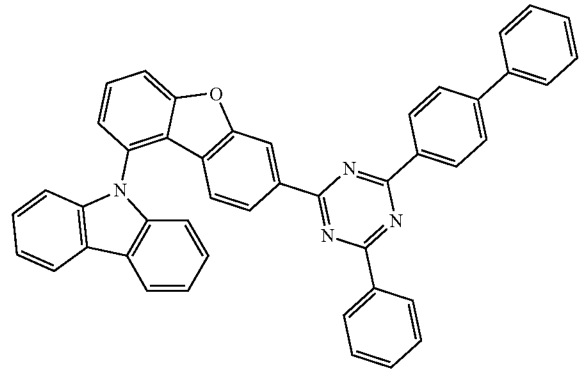
263
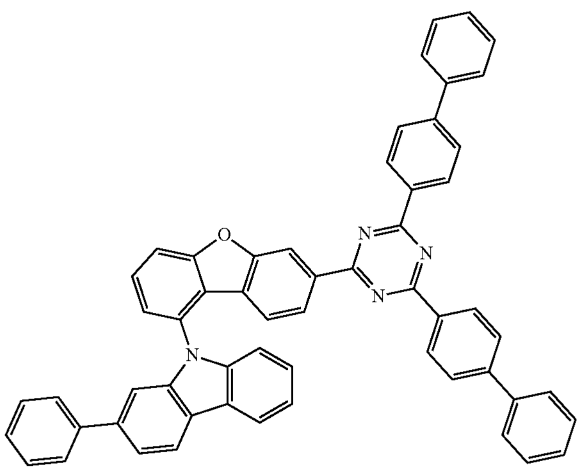
264
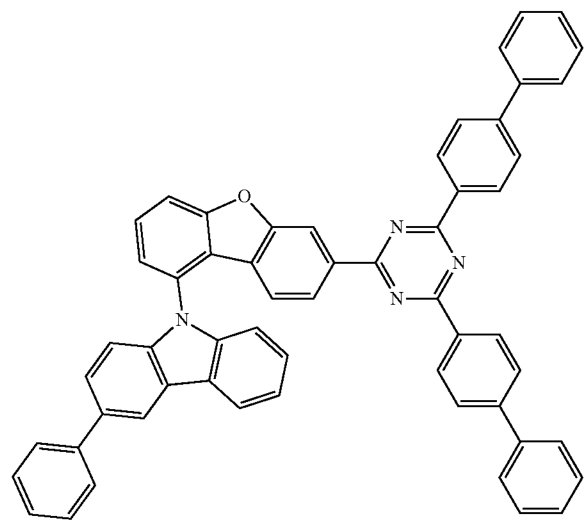
265
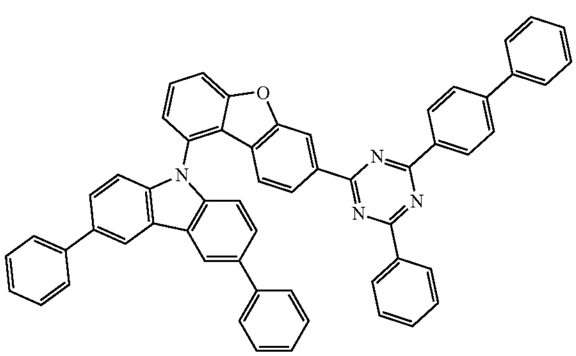
266
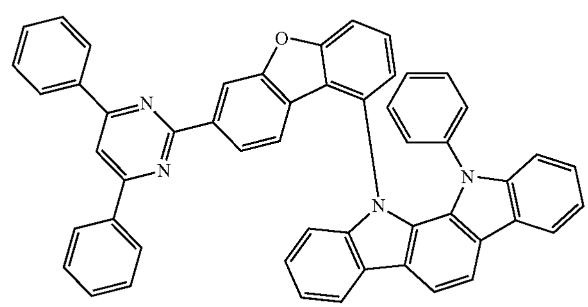

-continued
267
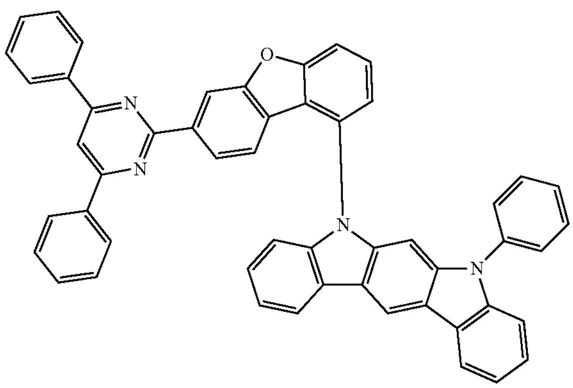
268
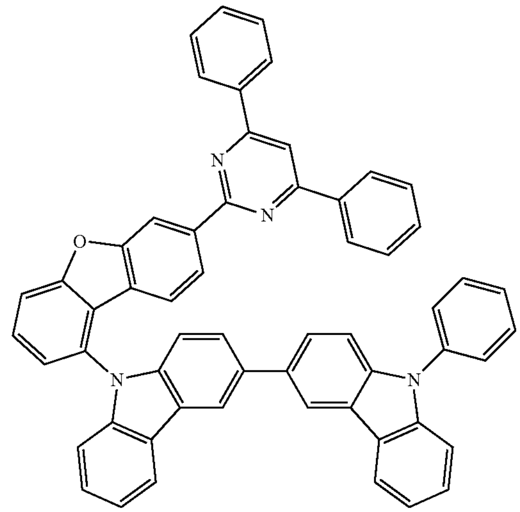
269
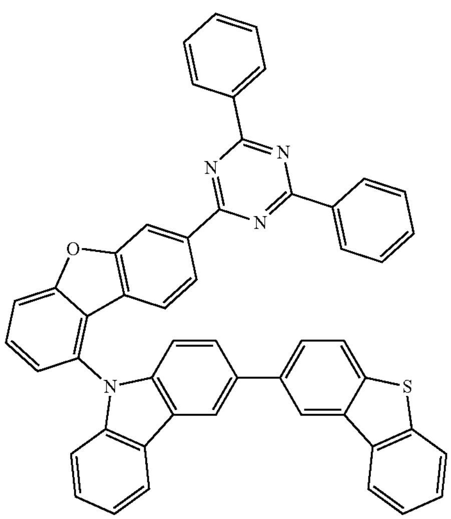
270
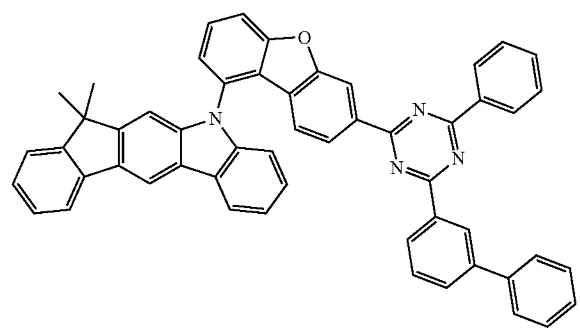
271
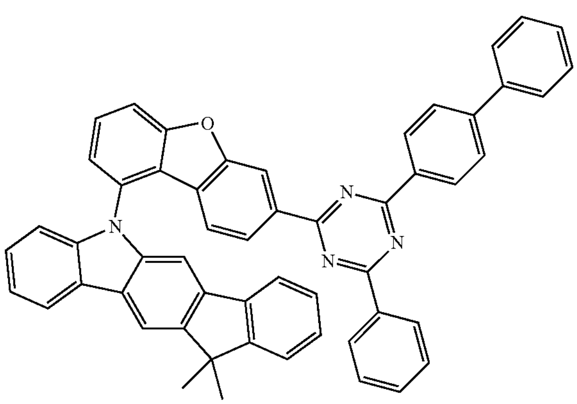
272
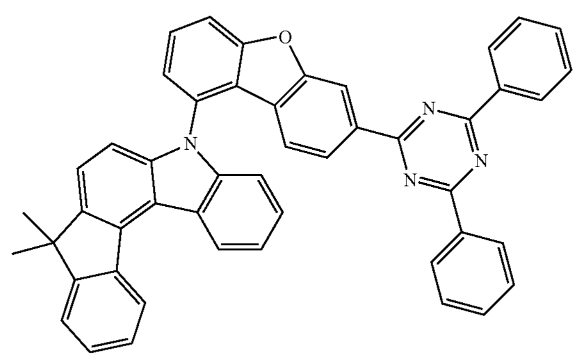

-continued
273
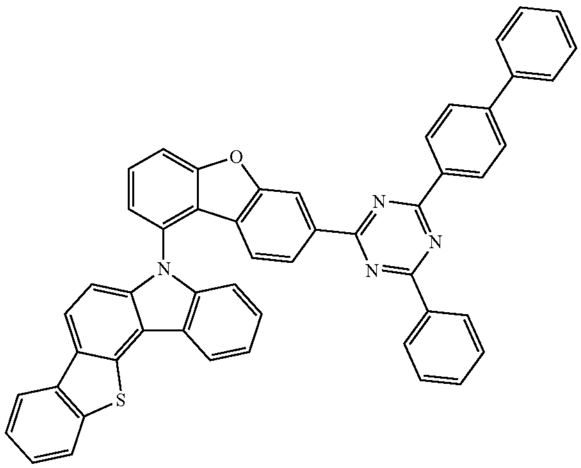
274
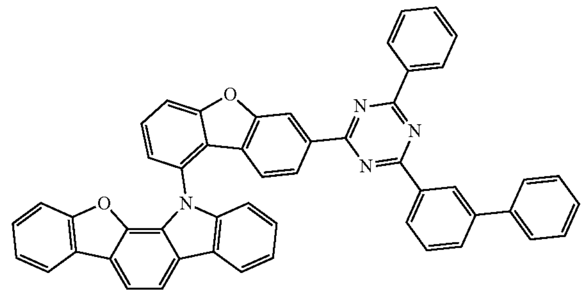
275
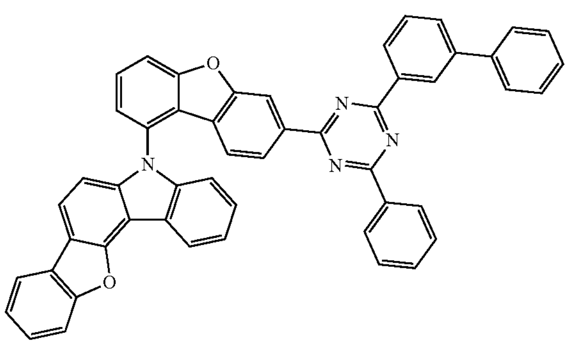
276
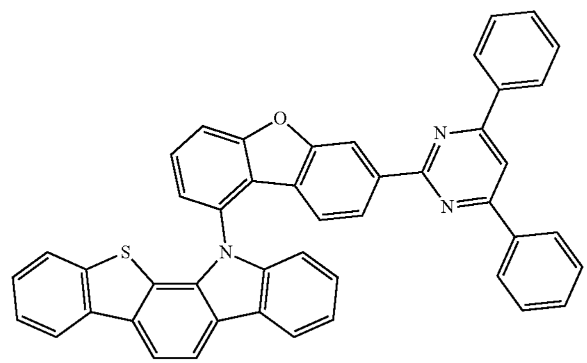
277
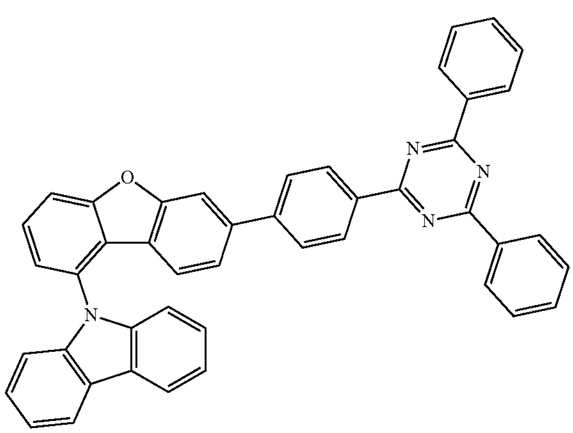
278
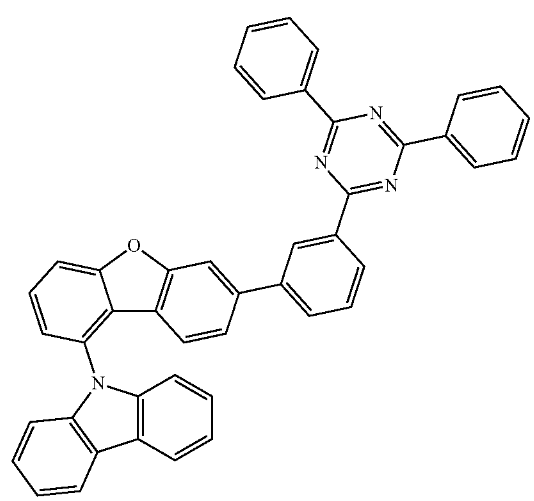

-continued
279
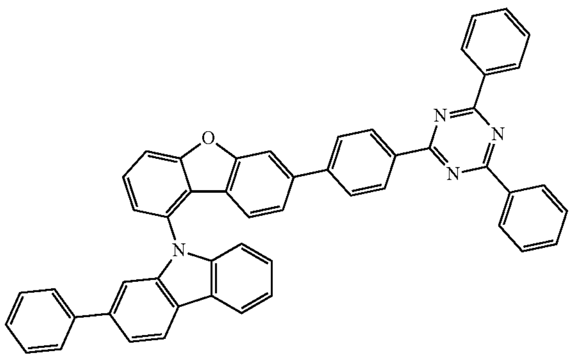
280
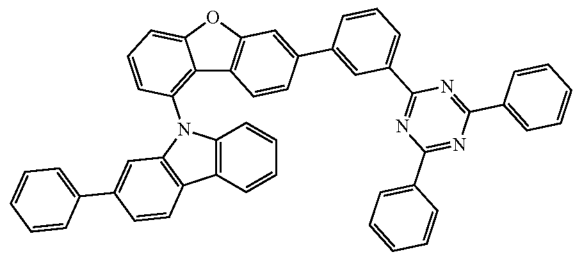
281
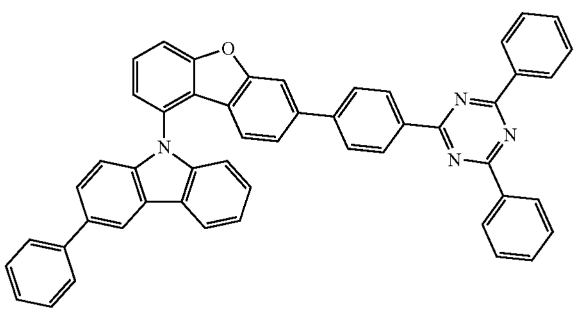
282
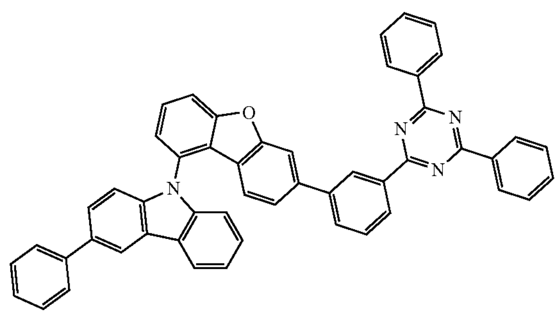
283
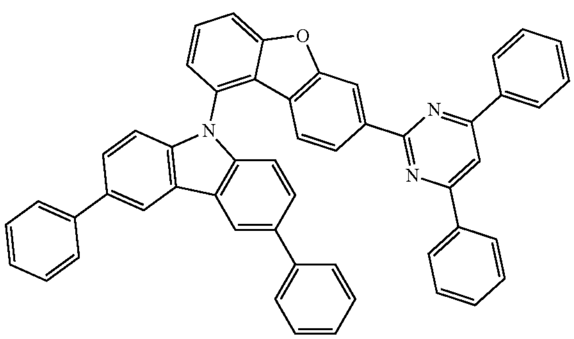
284
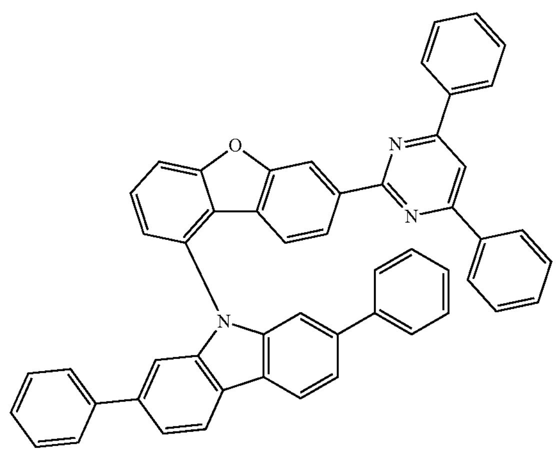
285
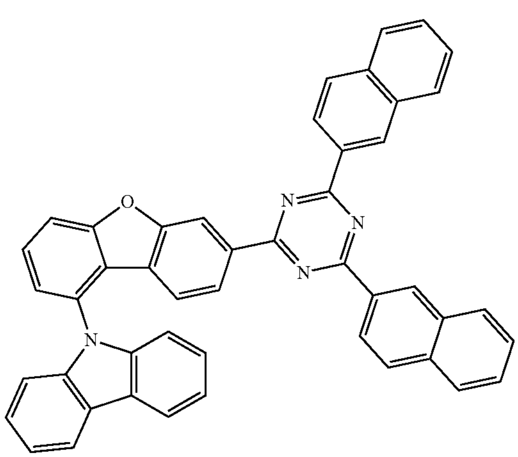
286
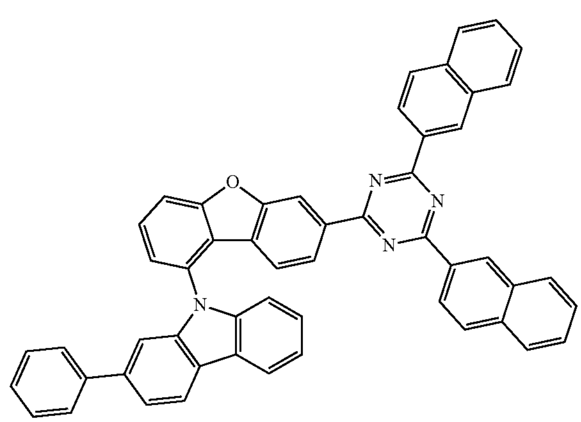

-continued
287
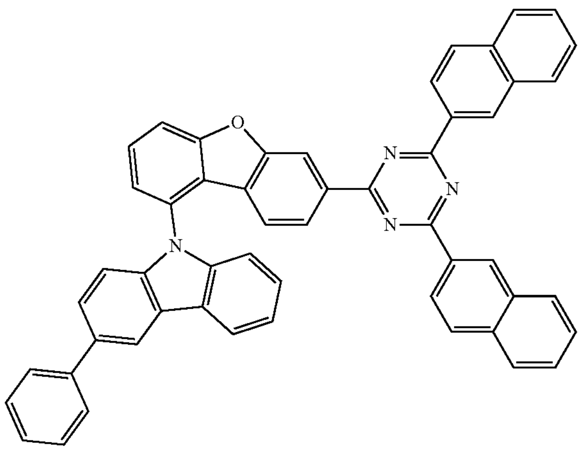
288
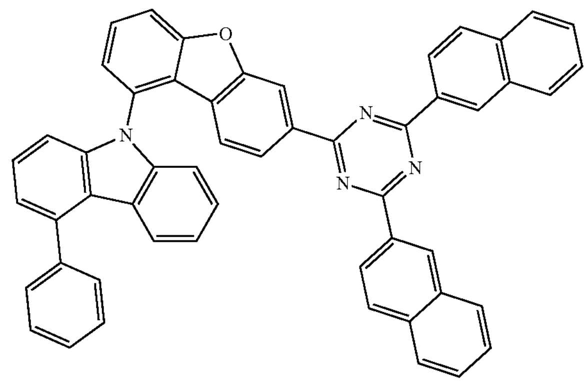
289
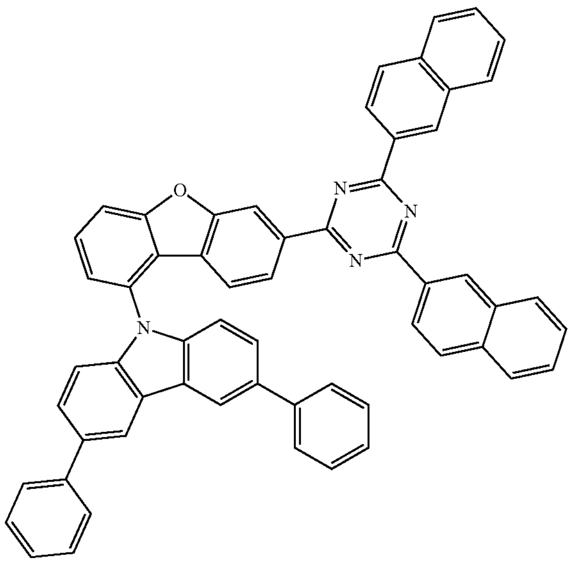
290
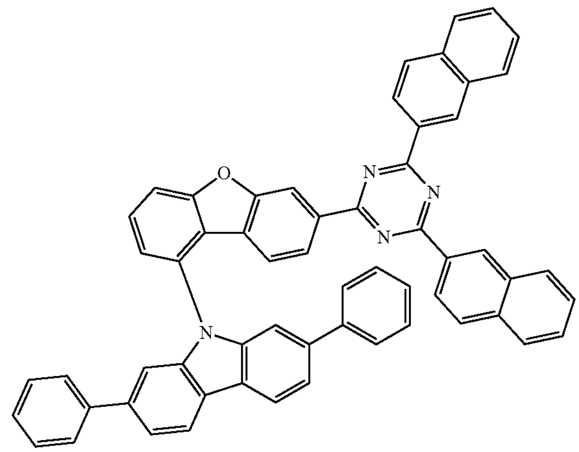
291
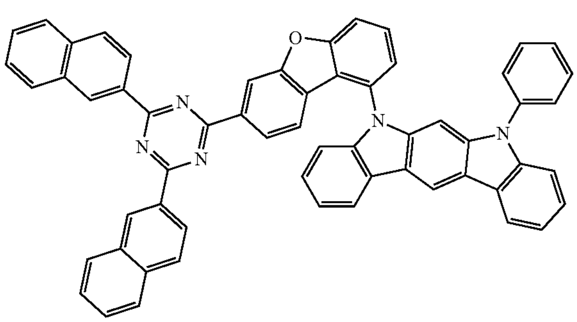
292
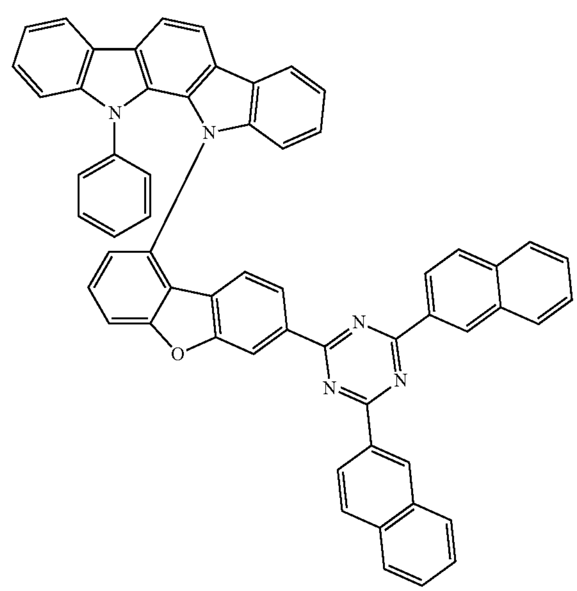

-continued
293
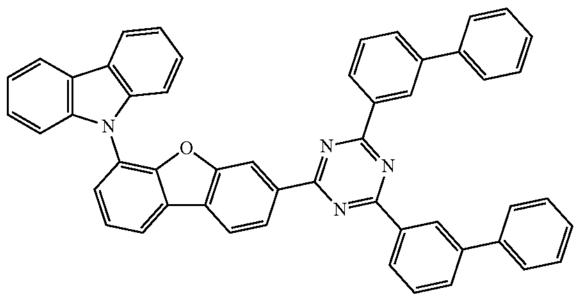
294
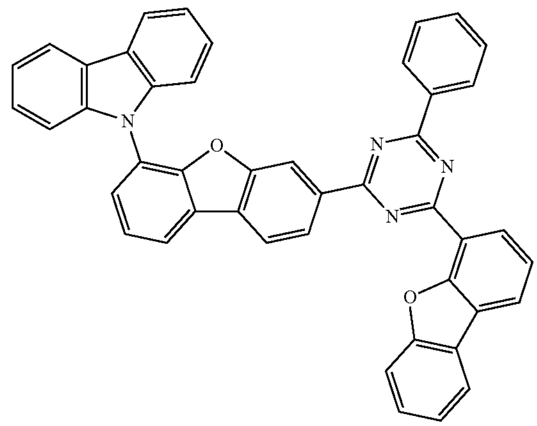
295
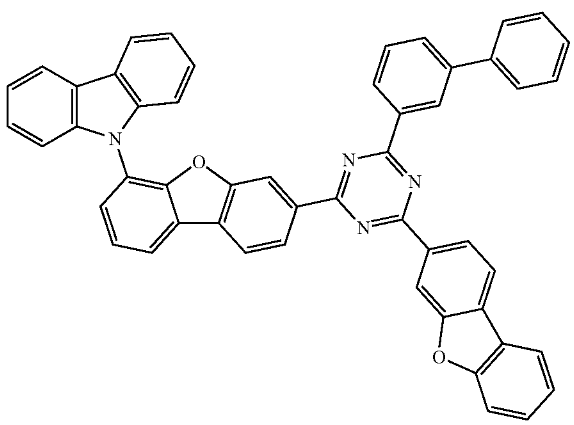
296
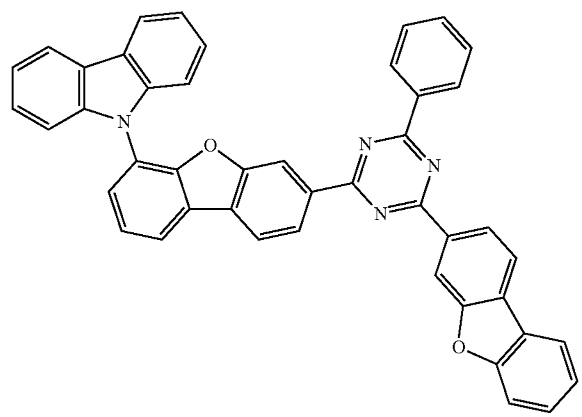
297
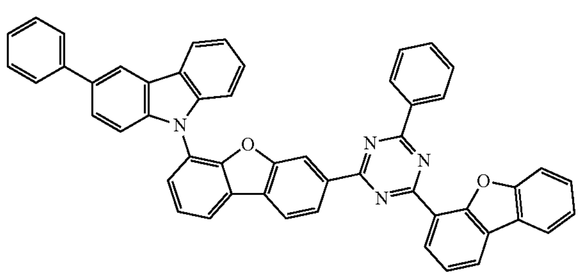
298
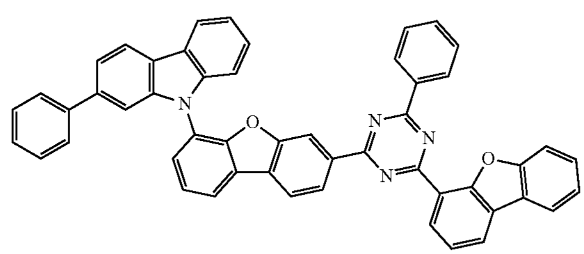
299
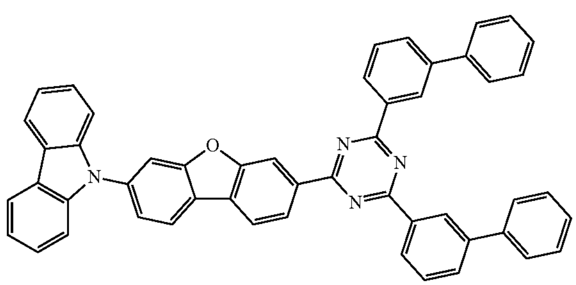
300
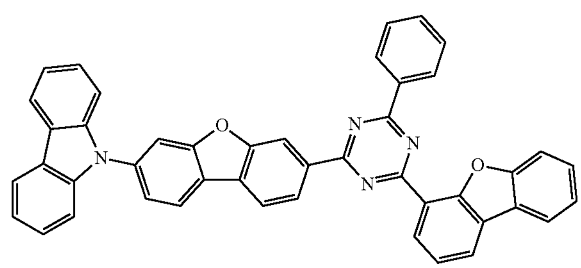

-continued
301
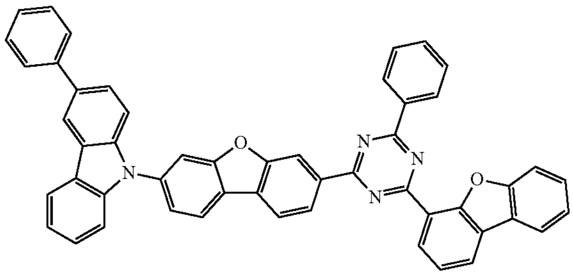
302
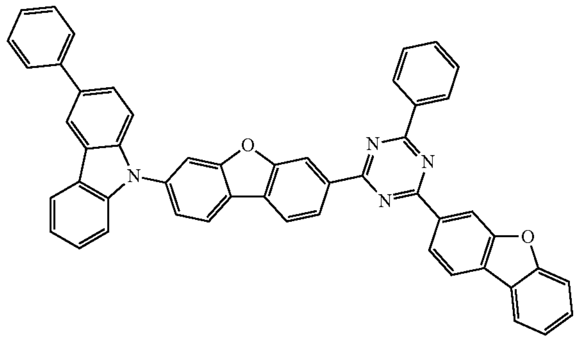
303
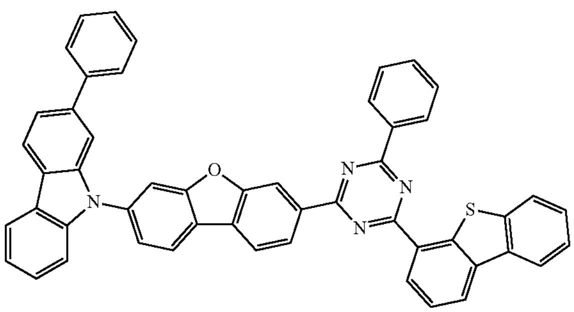
304
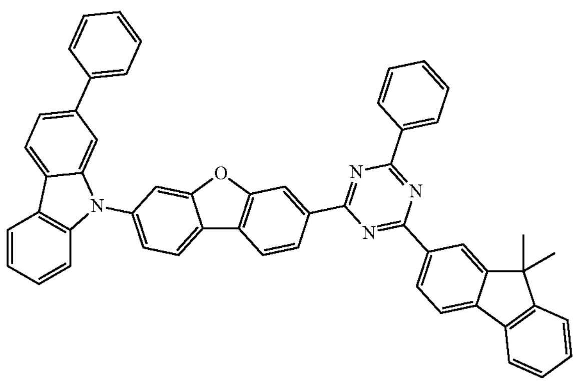
305
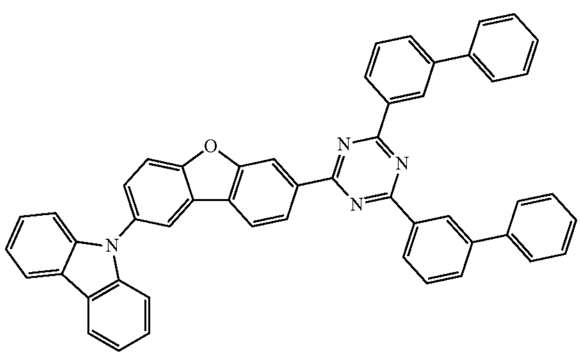
306
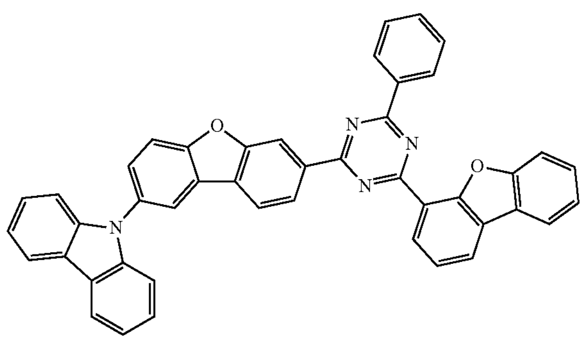
307
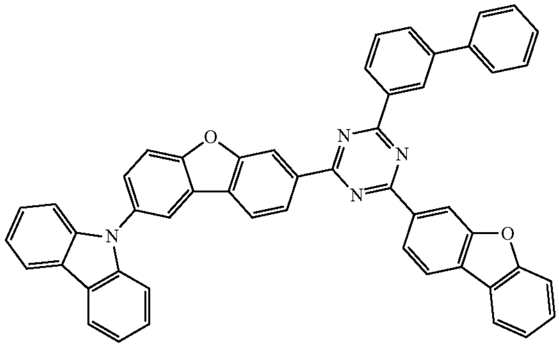
308
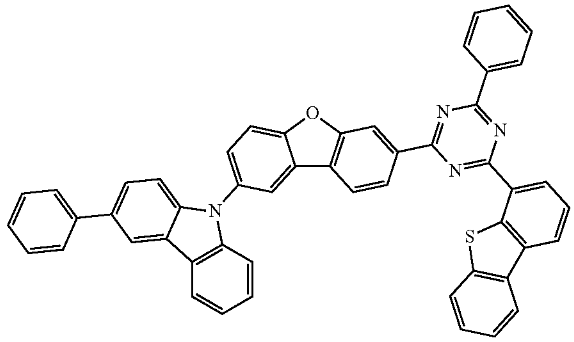

-continued
309
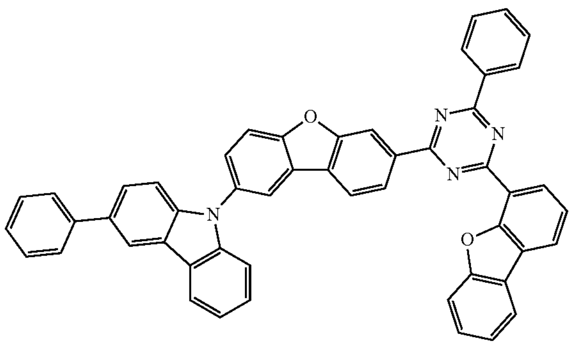
310
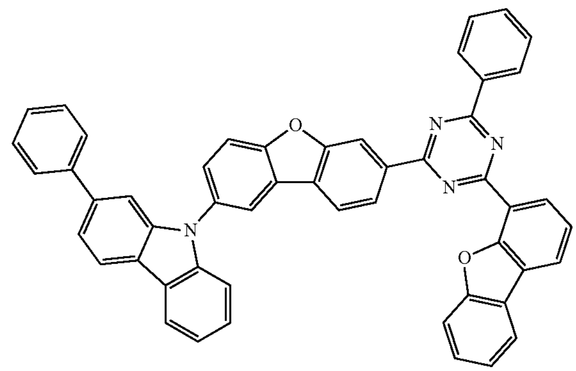
311
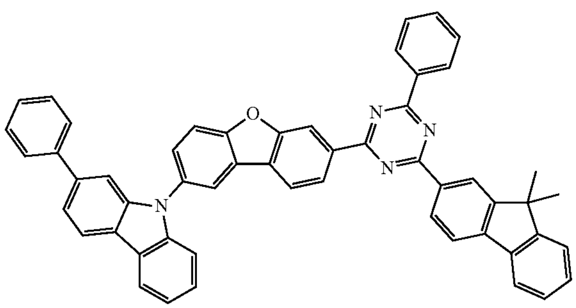
312
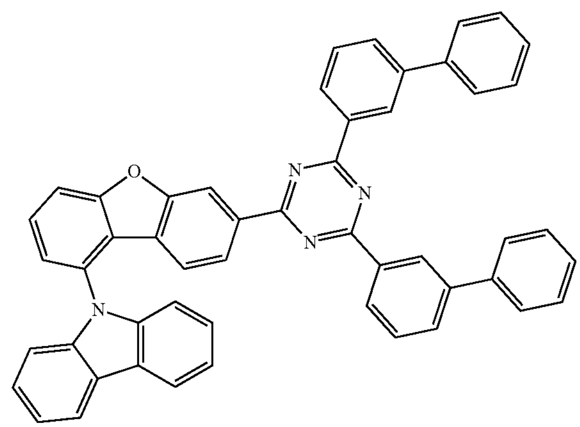
313
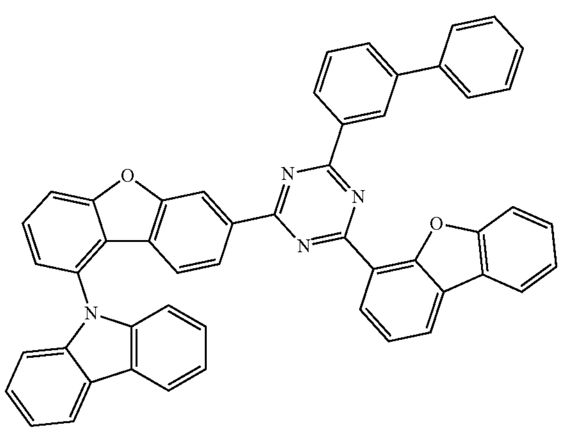
314
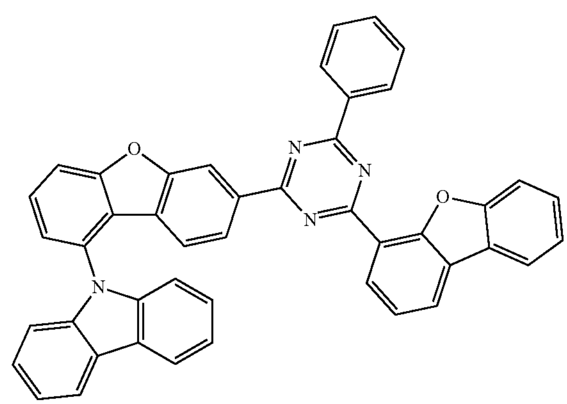

-continued
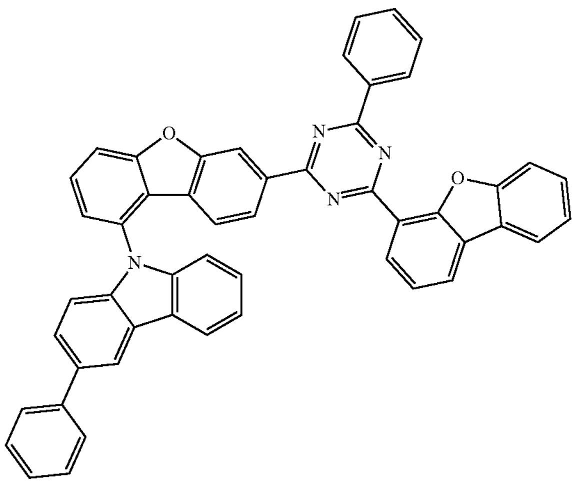
315
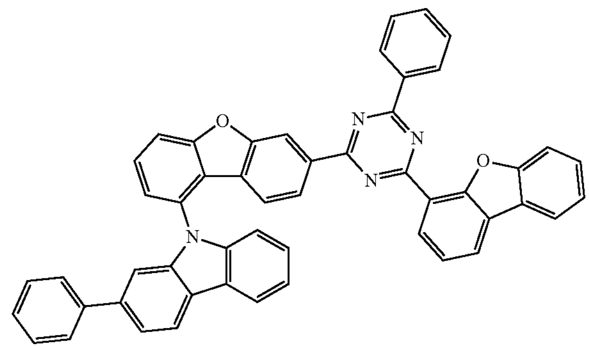
316
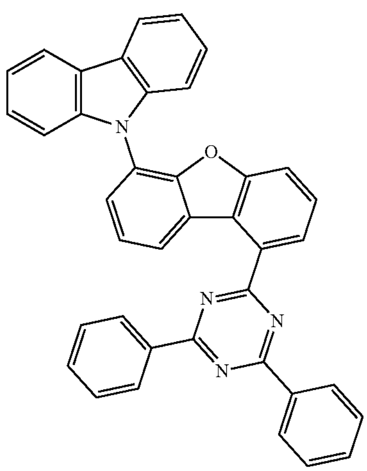
1
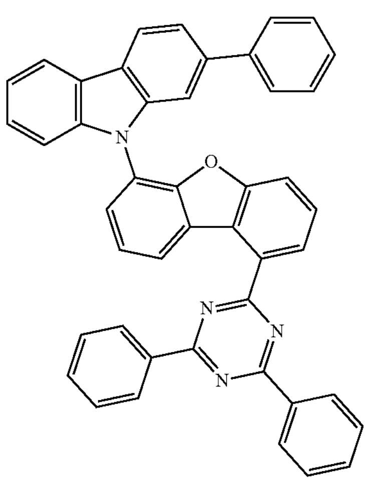
2
-continued
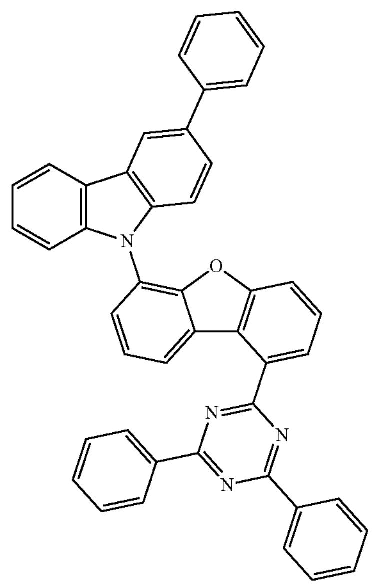
3
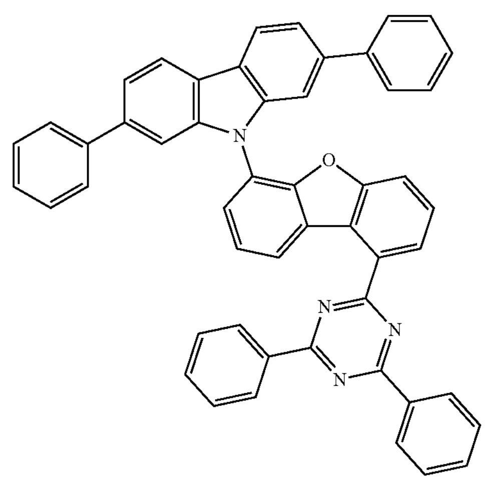
4

-continued
5
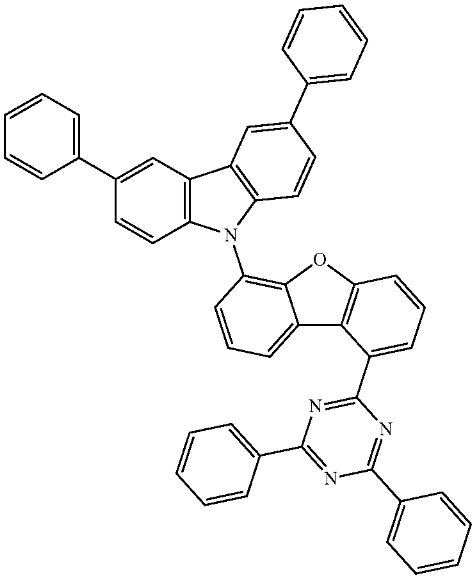
6
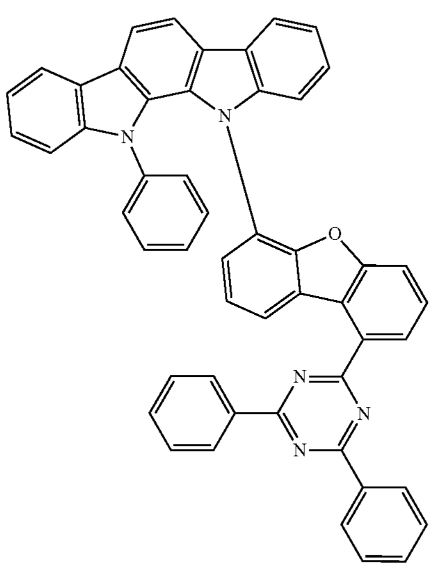
-continued
7
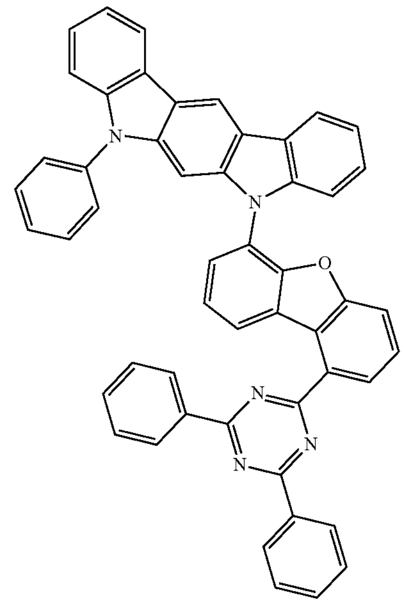
8
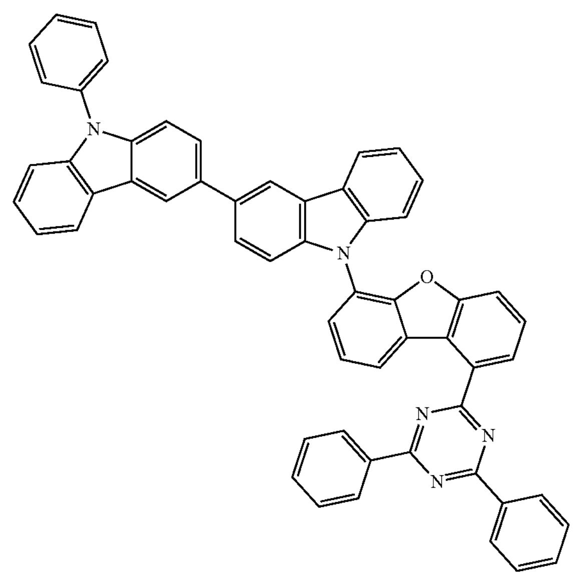
9
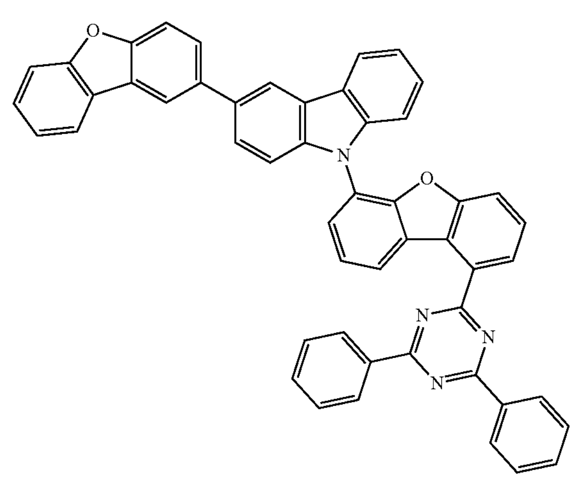

-continued
10
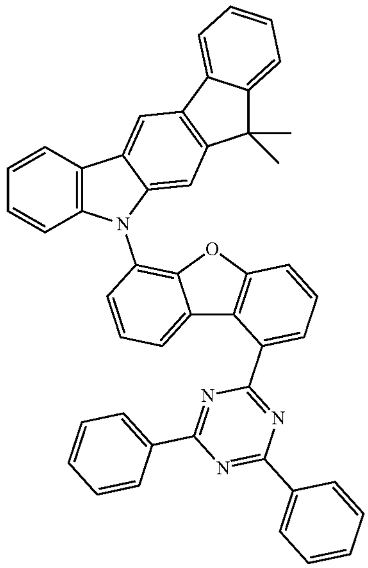
11
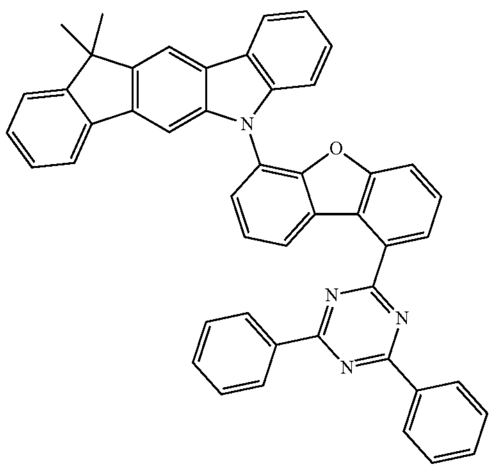
12
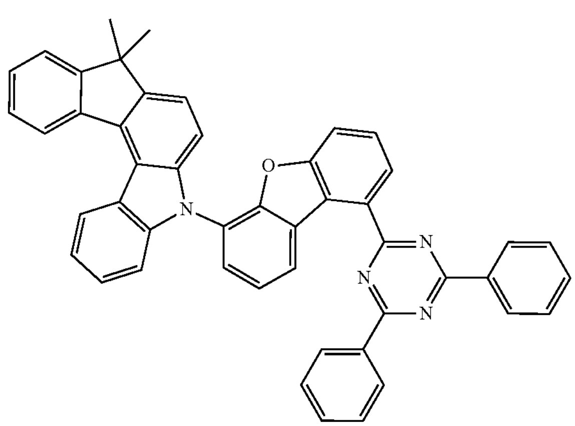
-continued
13
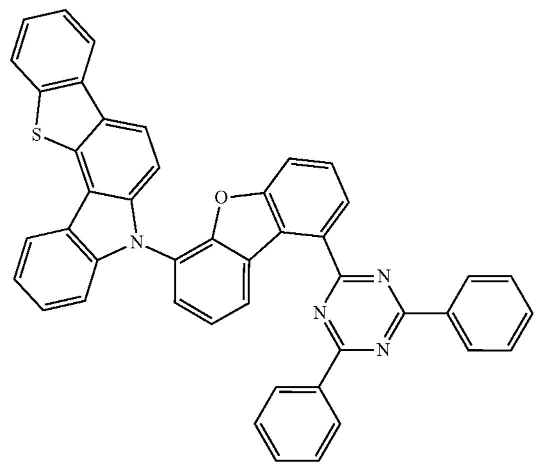
14
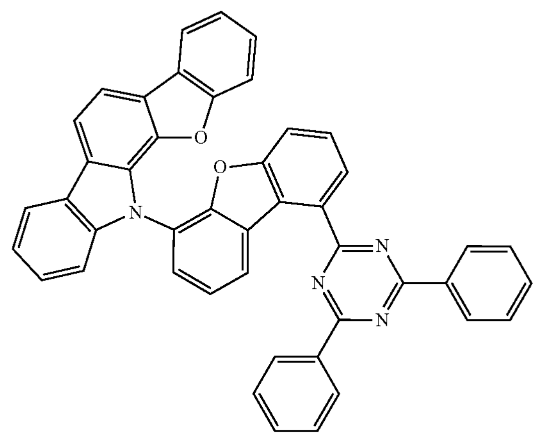
15
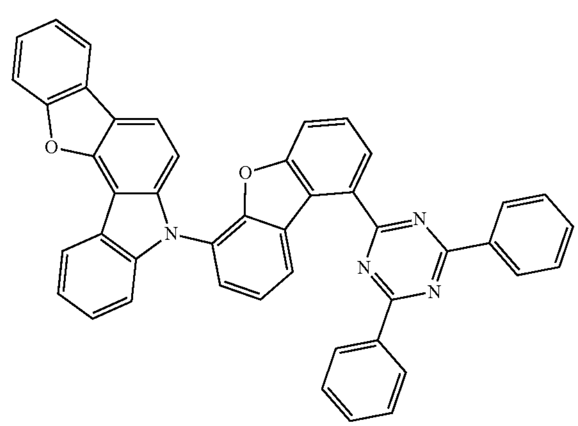

-continued
16
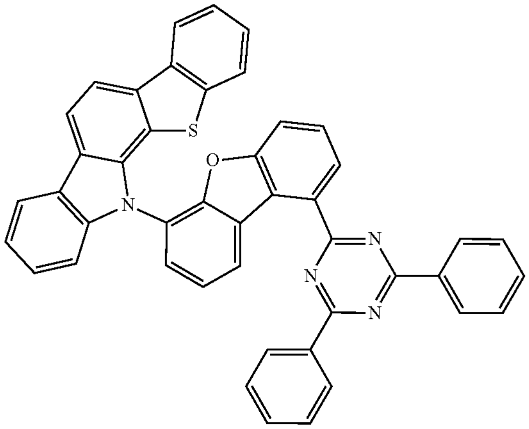
17
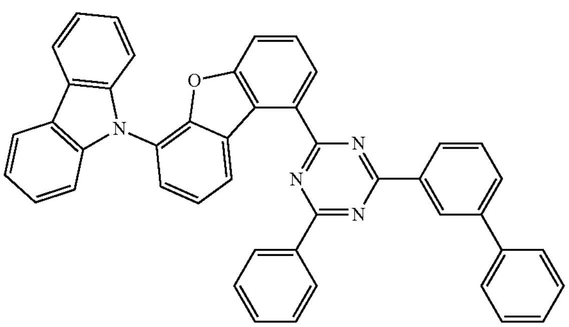
17
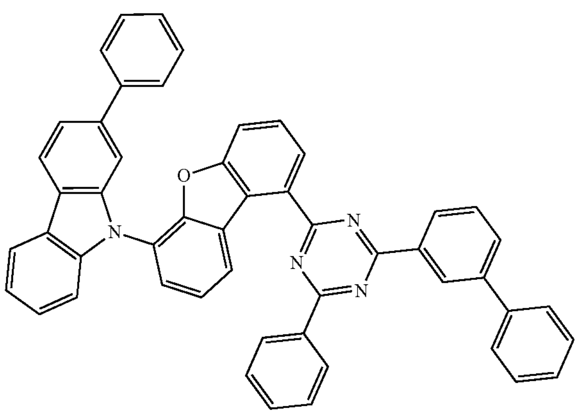
19
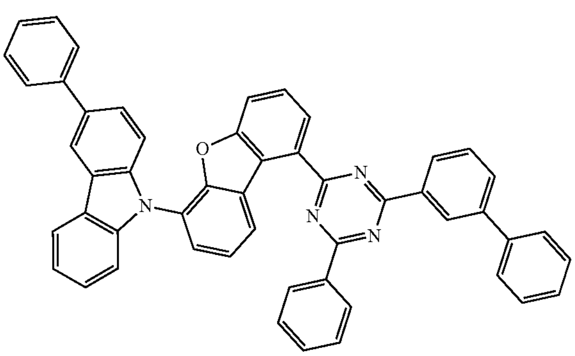
-continued
20
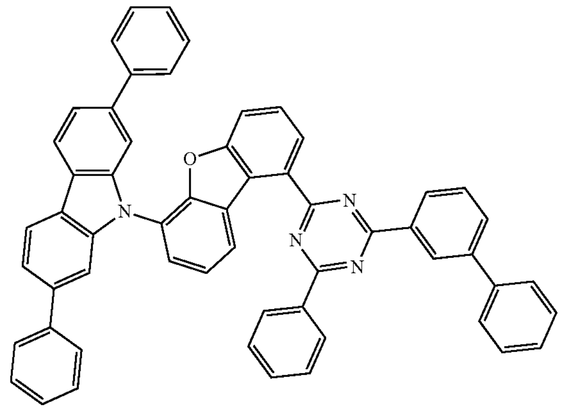
21
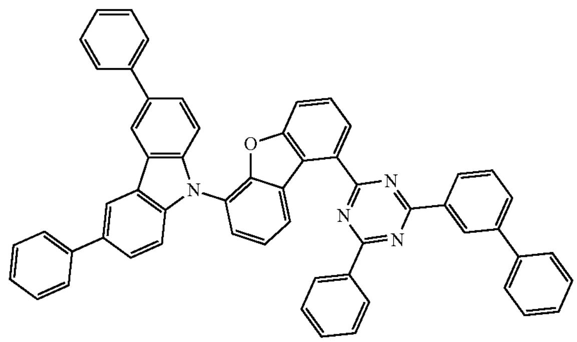
22
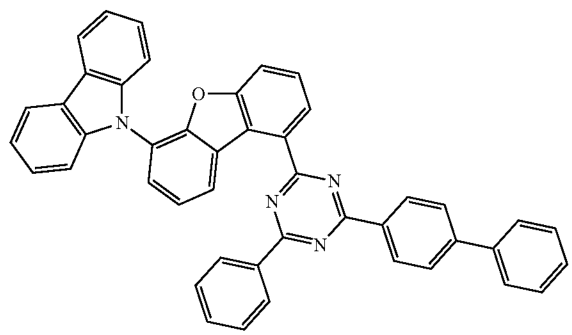
23
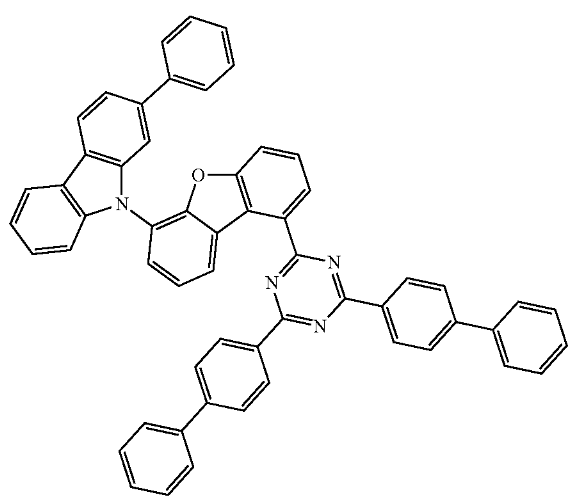

24
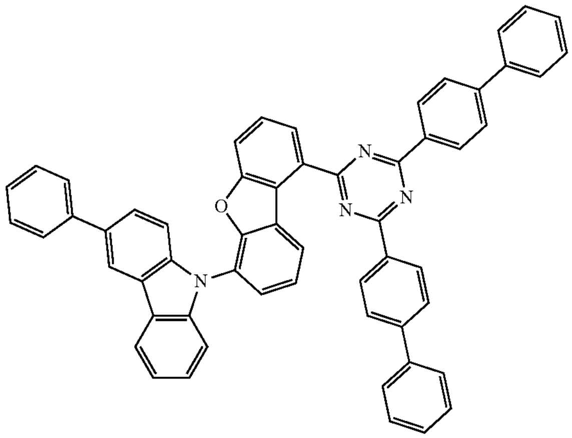
25
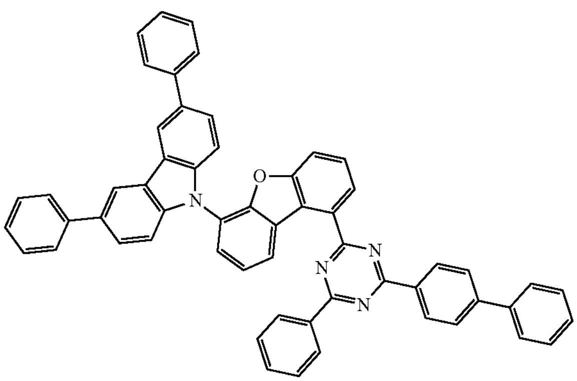
26
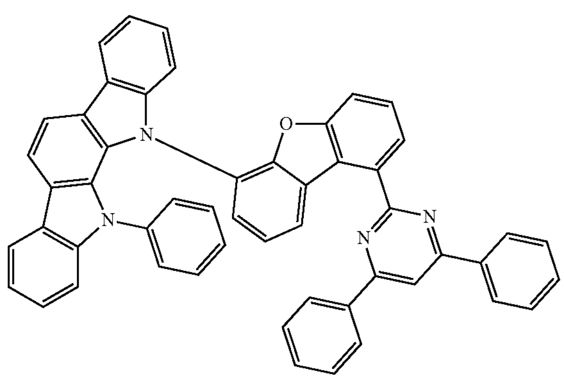
27
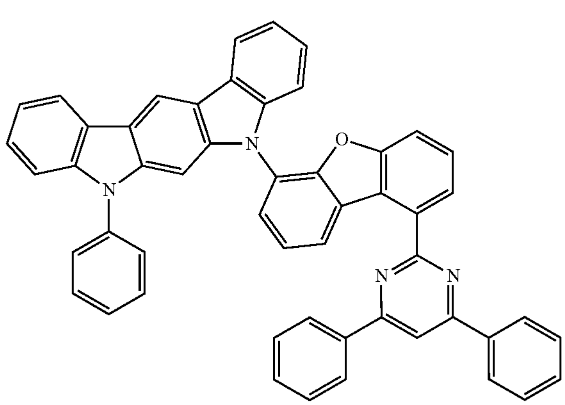
28
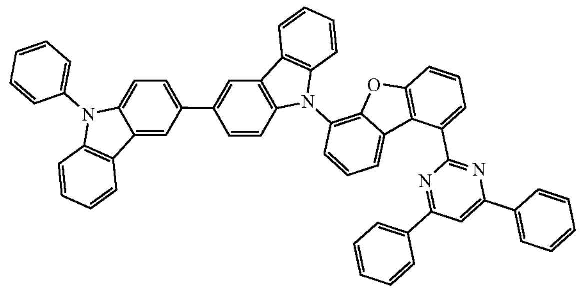
29
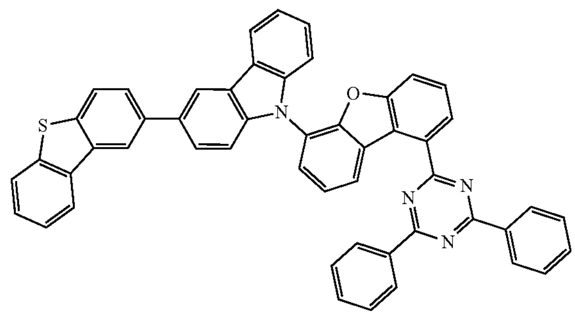
30
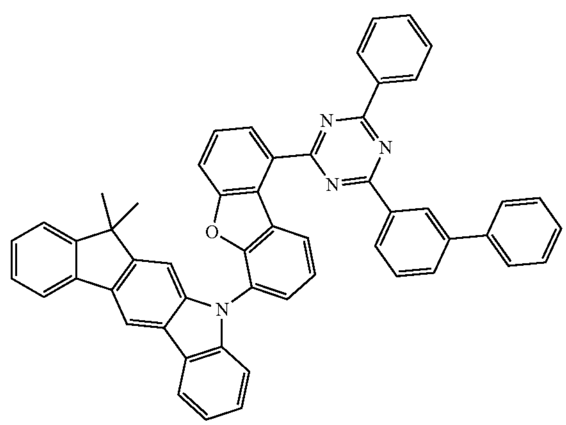
31
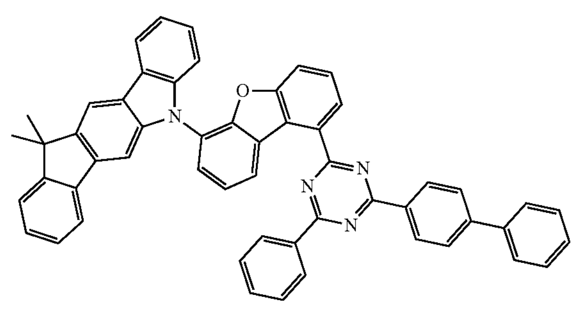

32
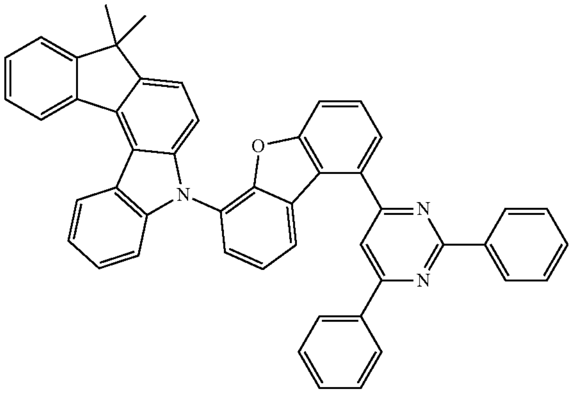
33
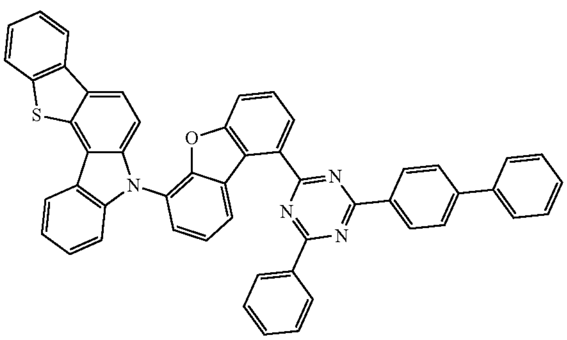
34
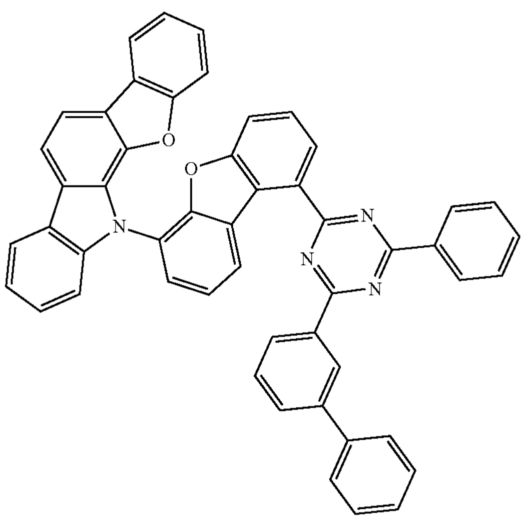
35
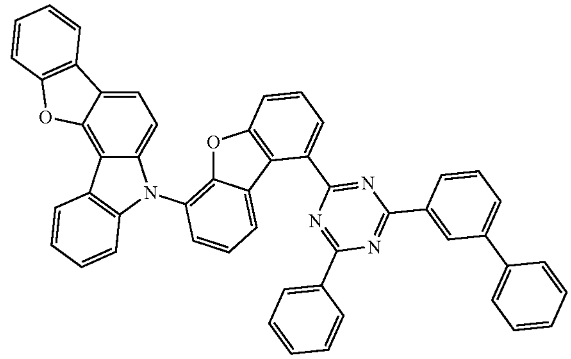
36
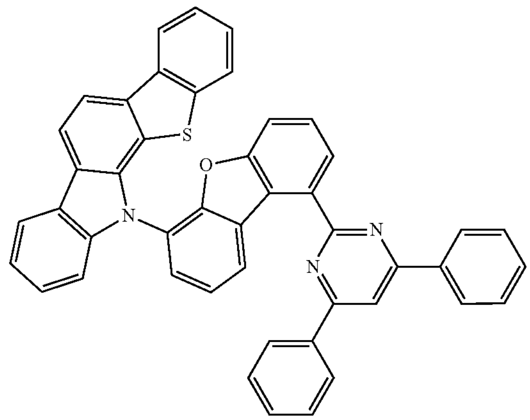
37
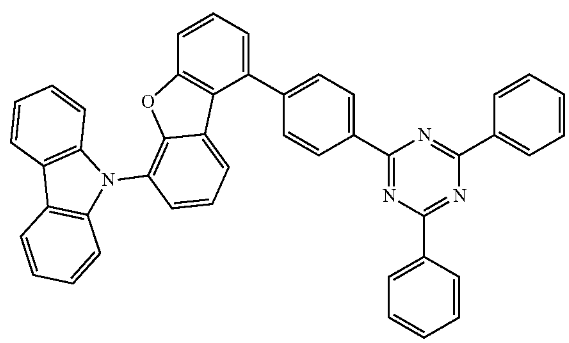
38
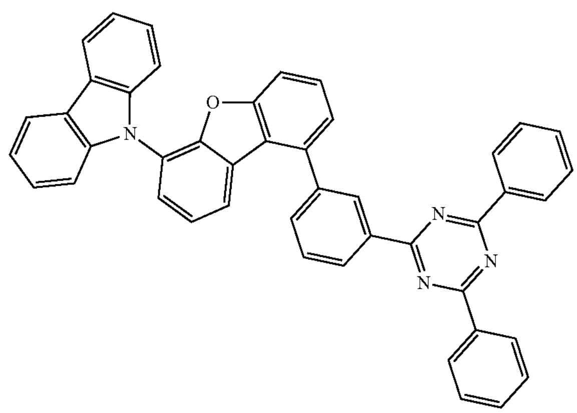

-continued
39
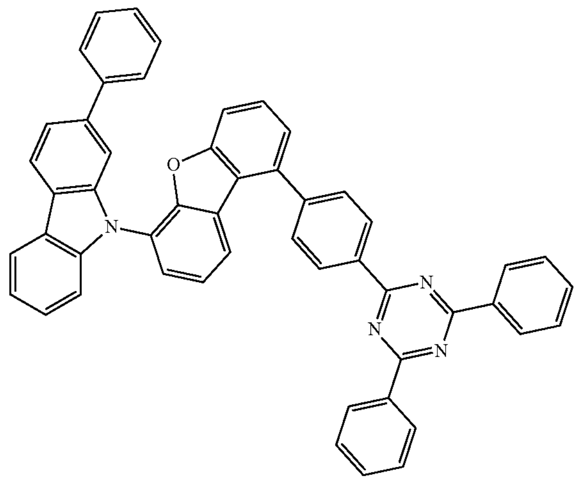
40
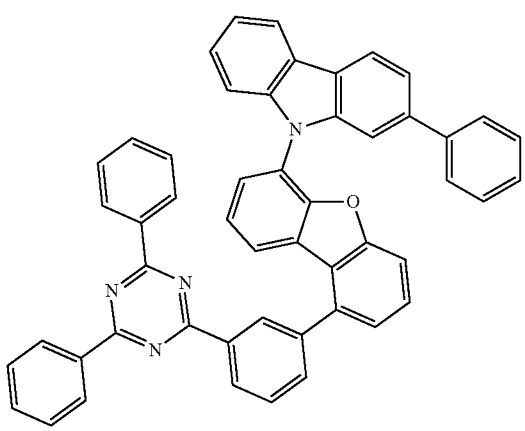
41
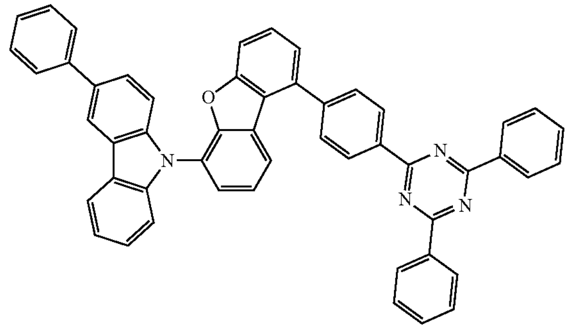
-continued
42
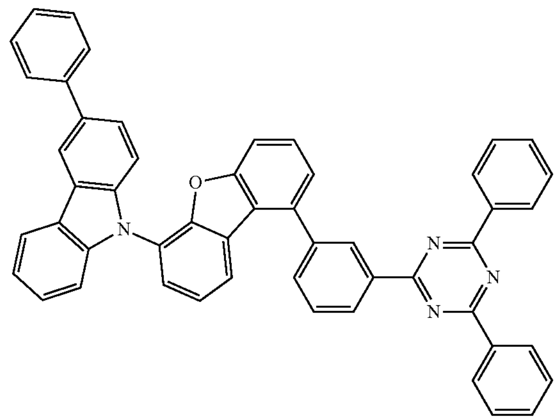
43
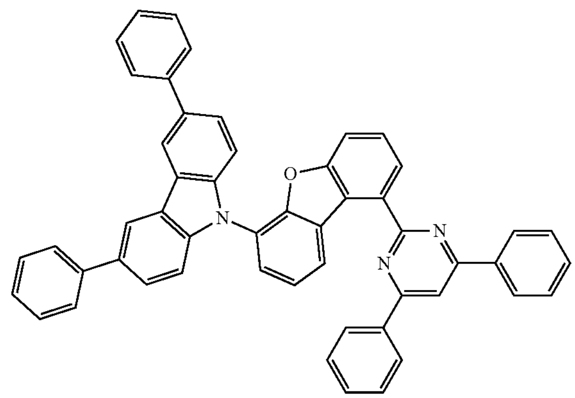
44
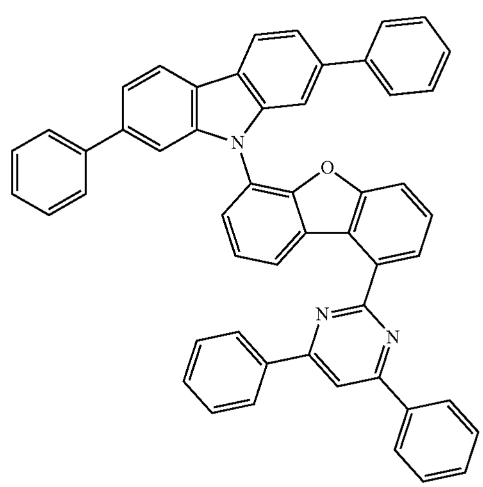
45
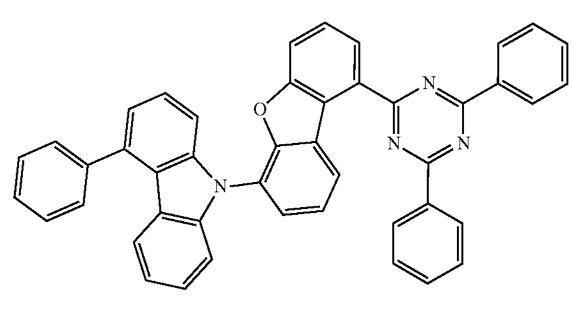

-continued
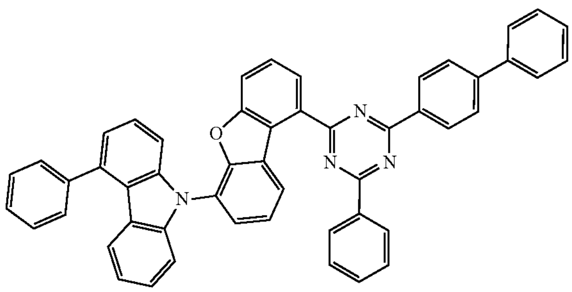
46
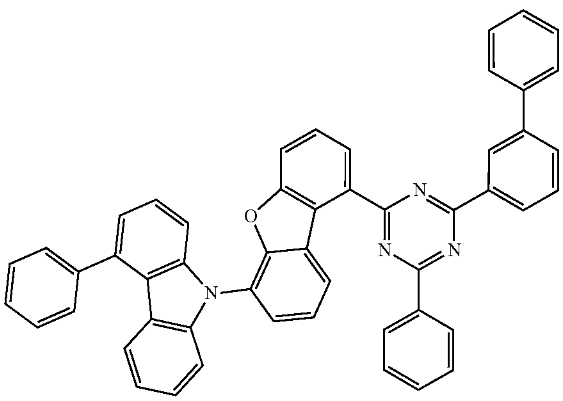
47
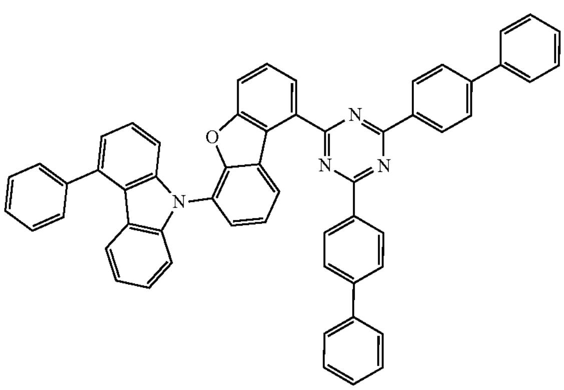
48
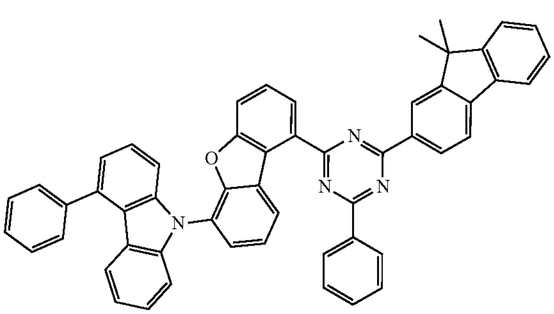
49
-continued
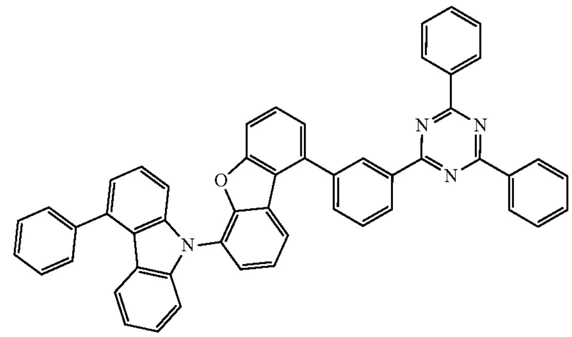
50
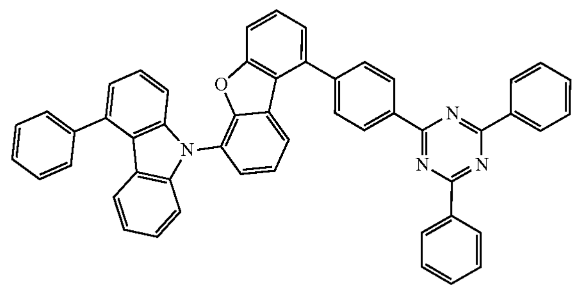
51
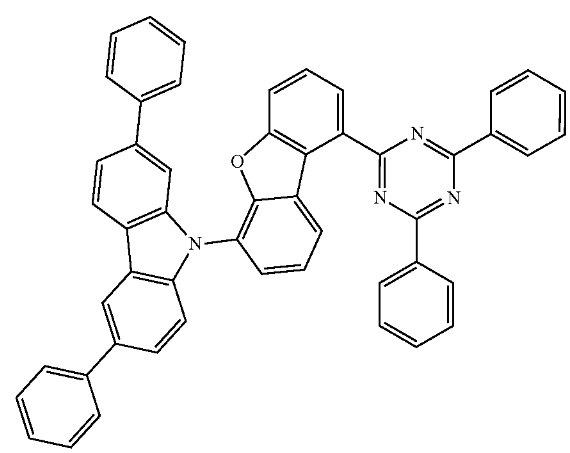
52
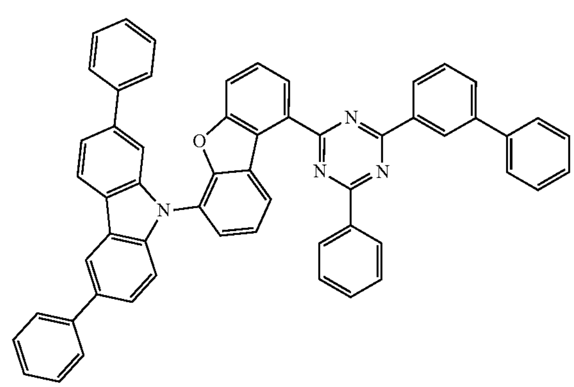
53

54
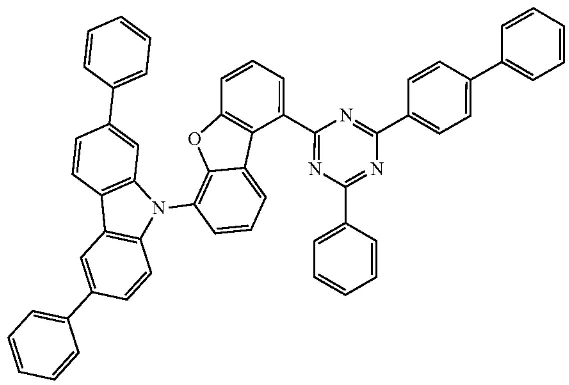
55
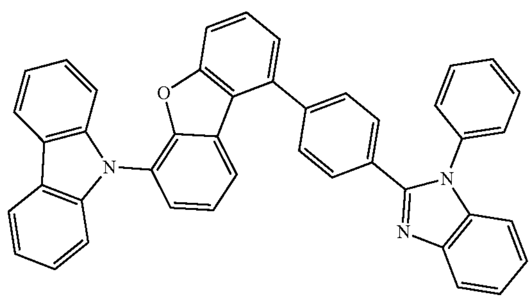
56
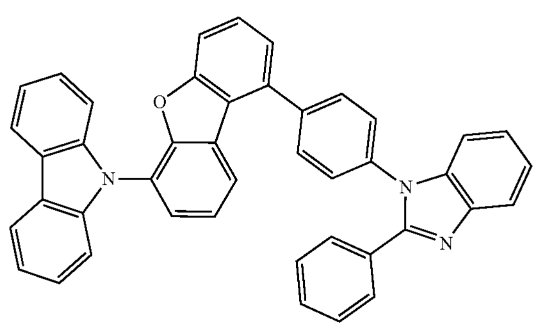
57
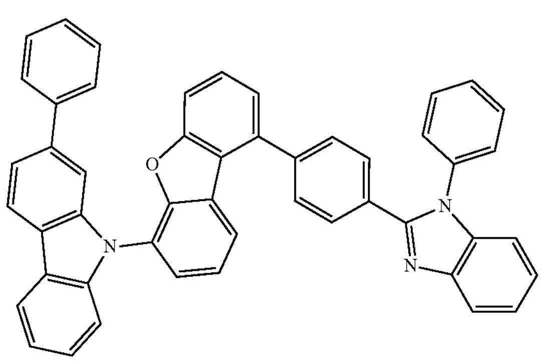
58
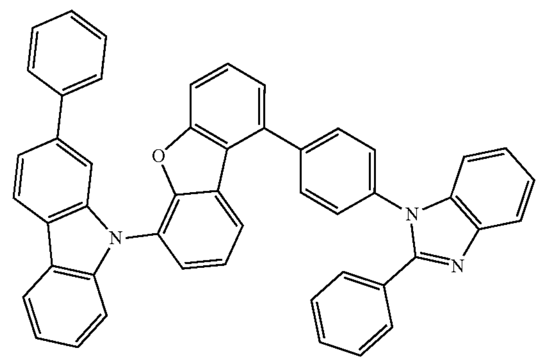
59
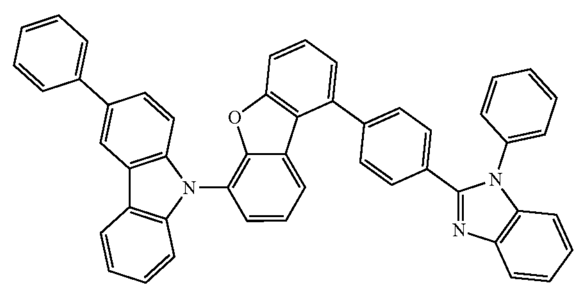
60
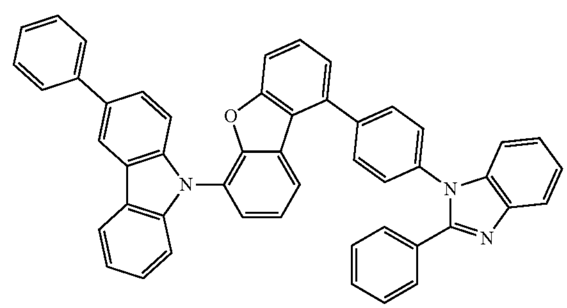
61
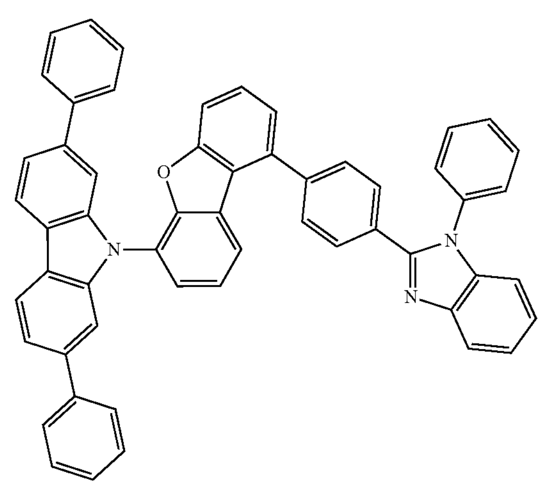

-continued
62
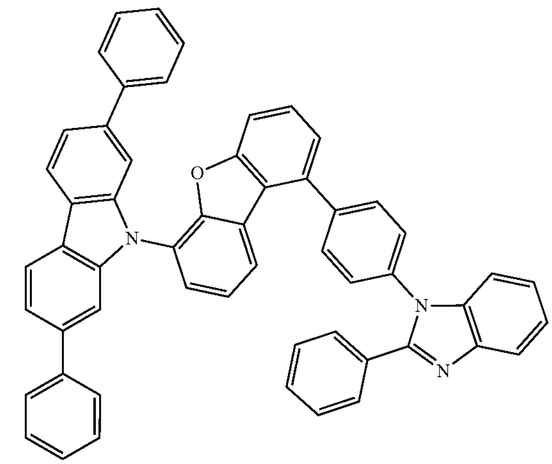
63
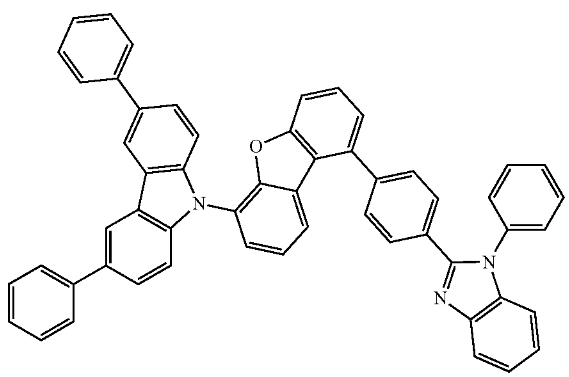
64
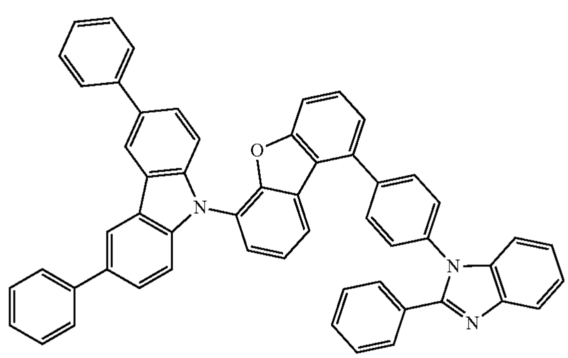
-continued
65
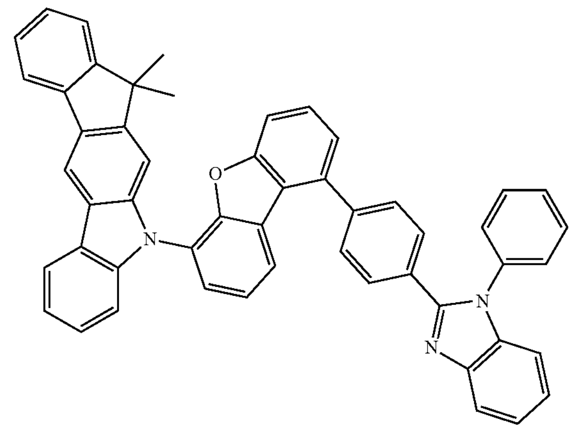
66
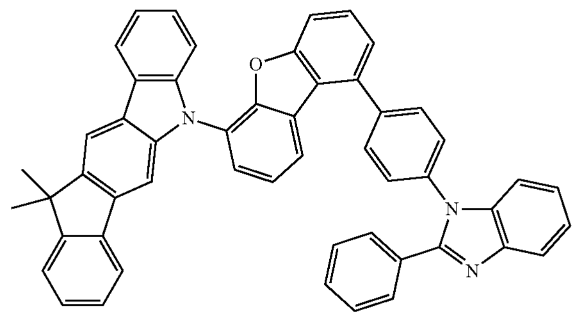
67
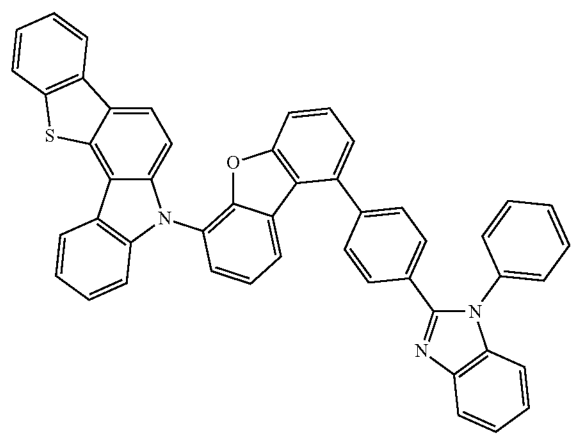
68
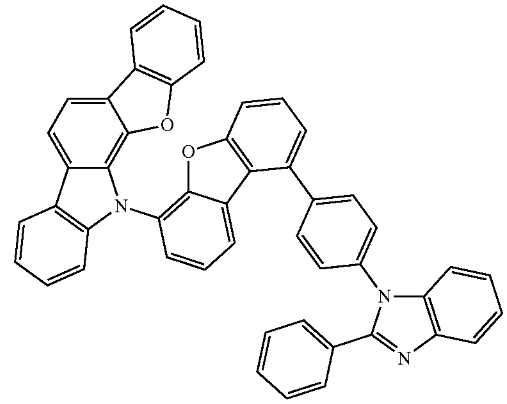

-continued
69
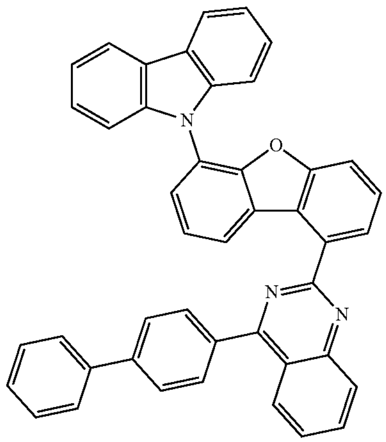
72
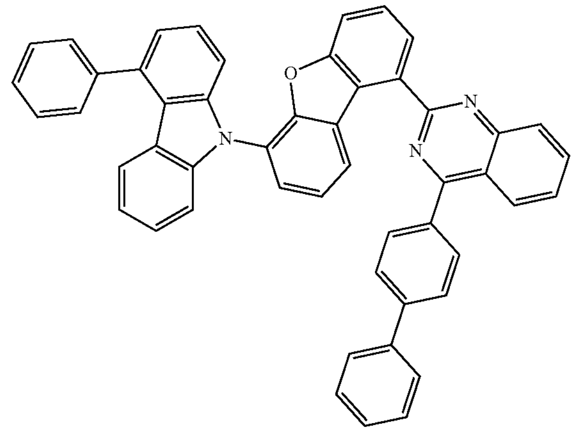
70
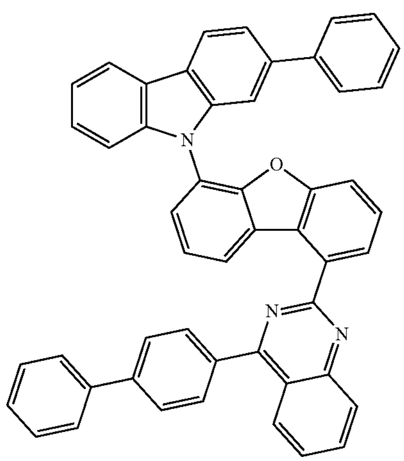
73
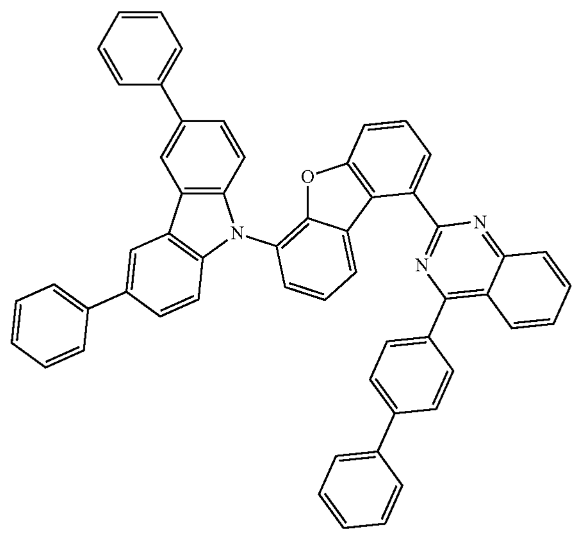
71
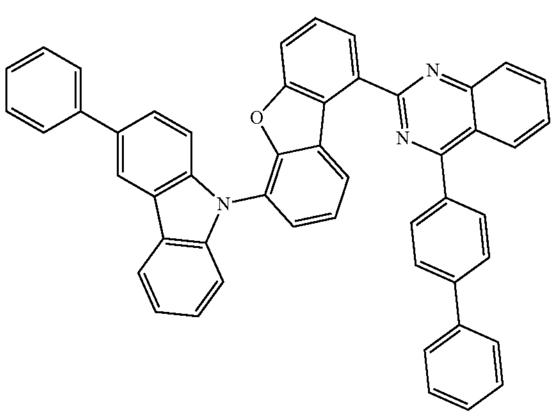
74
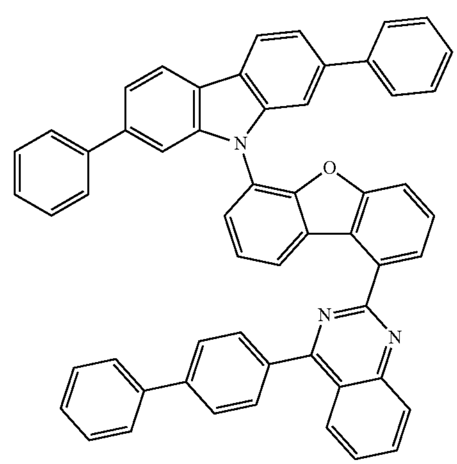

-continued
75
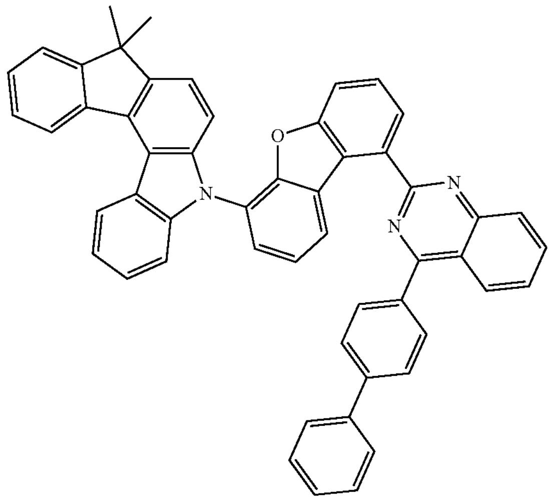
76
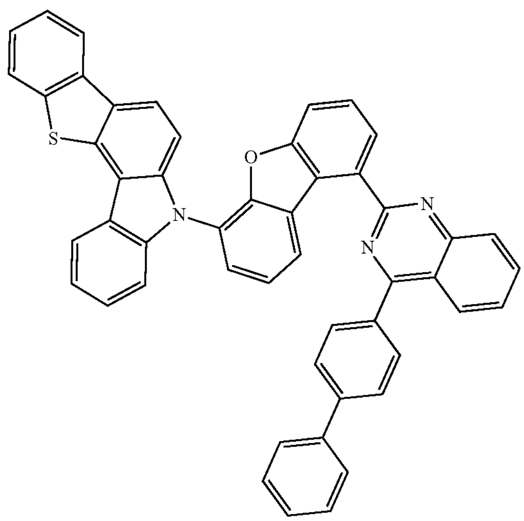
77
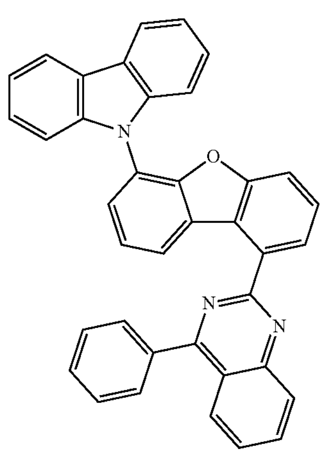
-continued
78
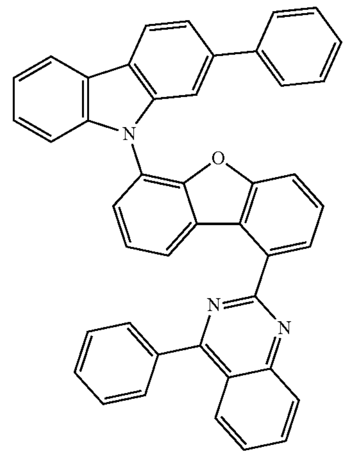
79
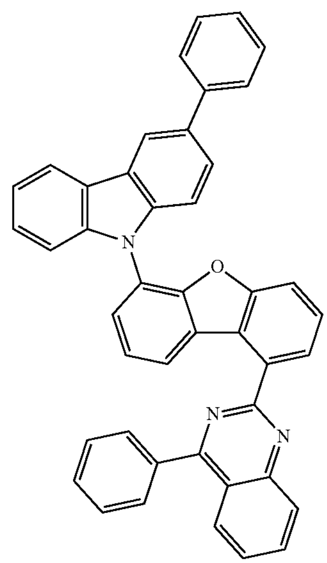
80
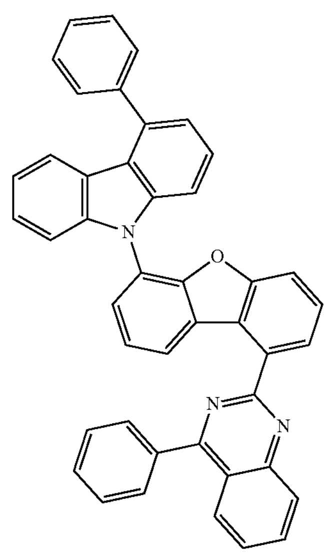

-continued
81
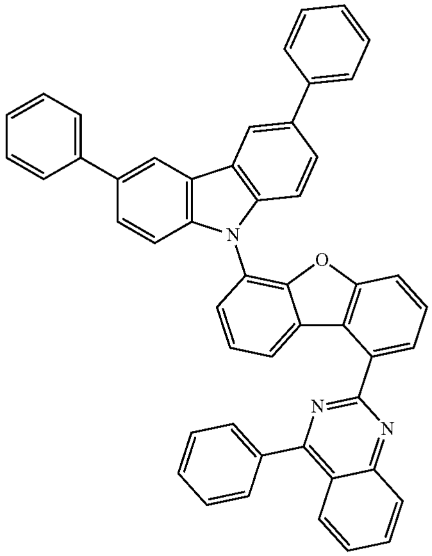
82
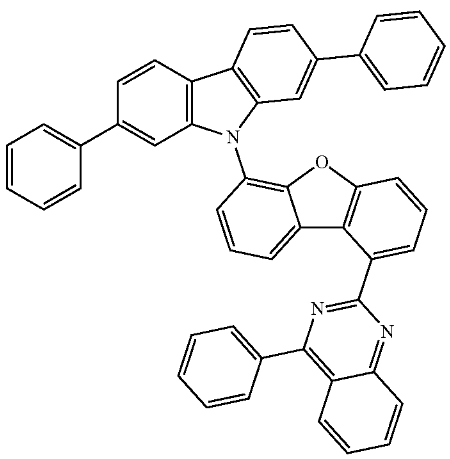
83
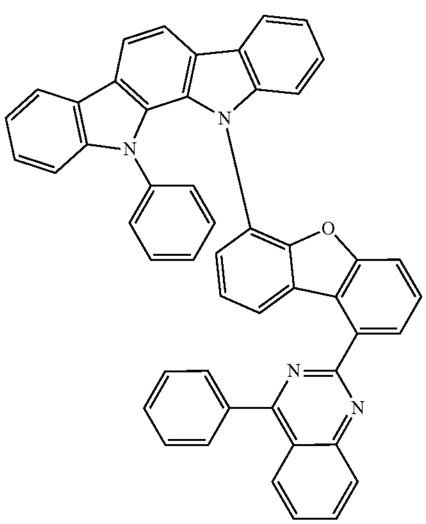
-continued
84
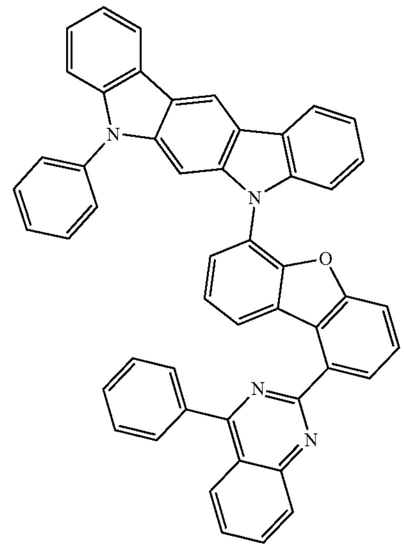
85
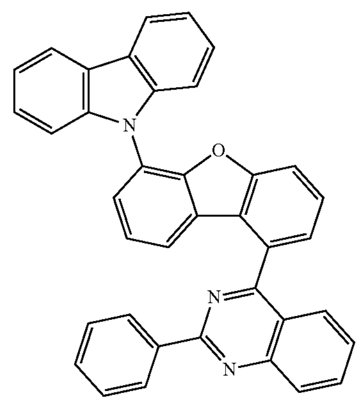
86
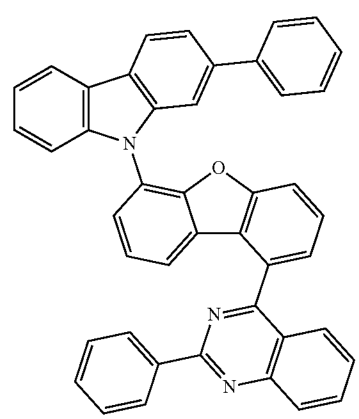

-continued
87
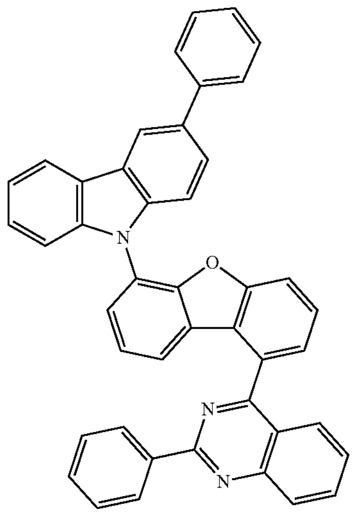
88
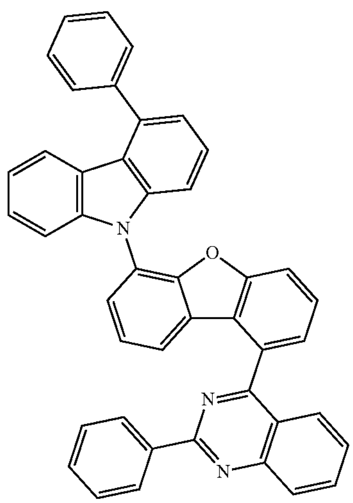
89
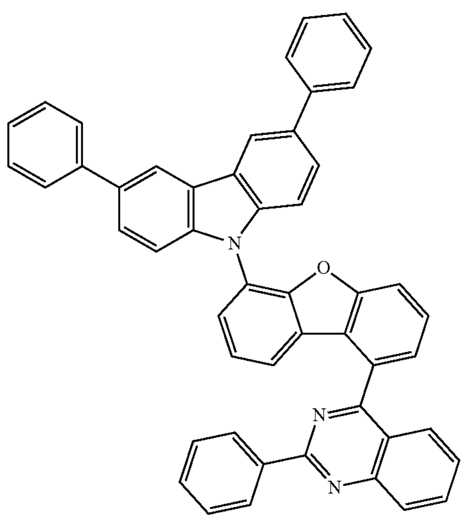
-continued
90
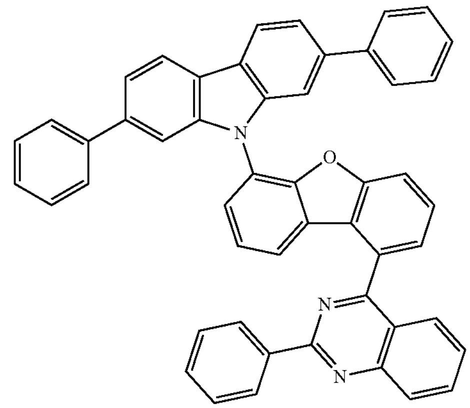
91
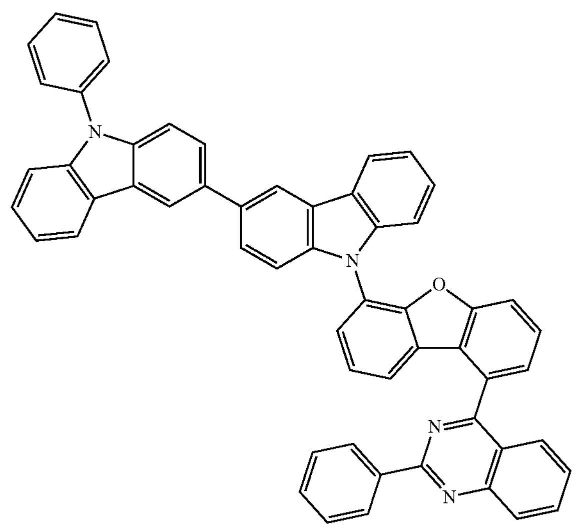
92
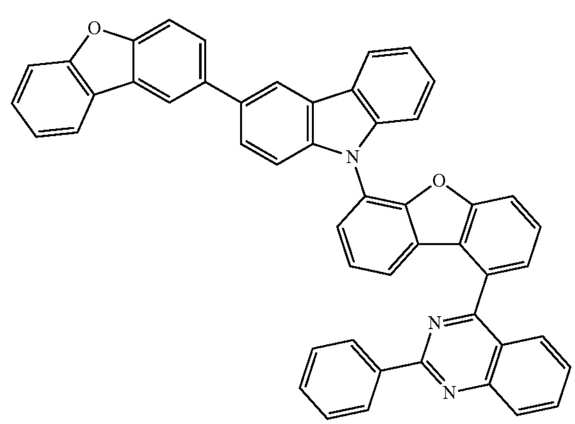

-continued
93
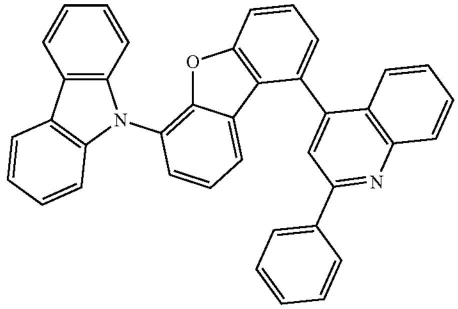
94
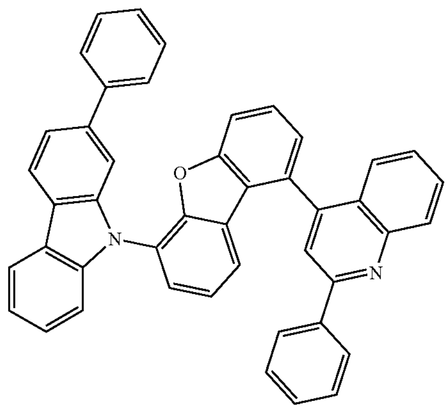
95
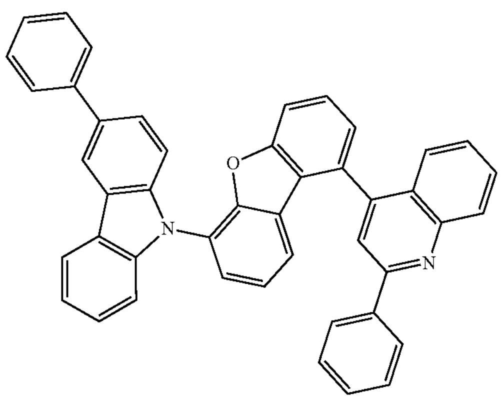
96
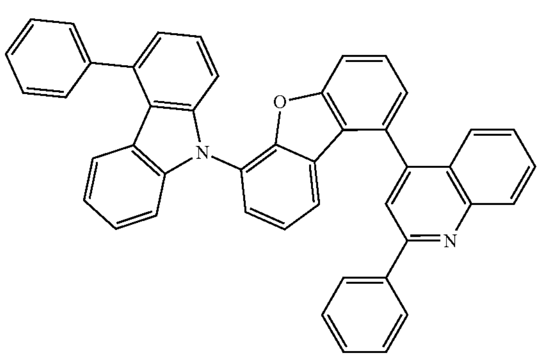
-continued
97
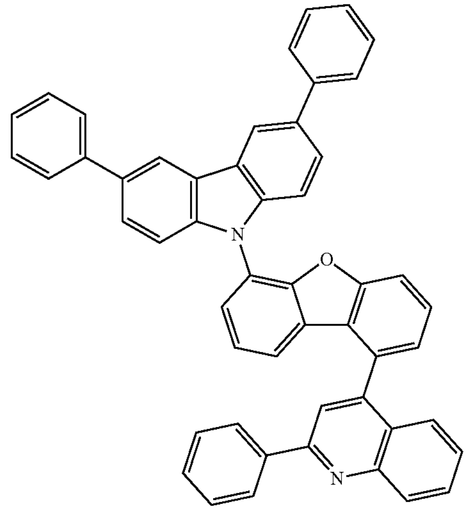
98
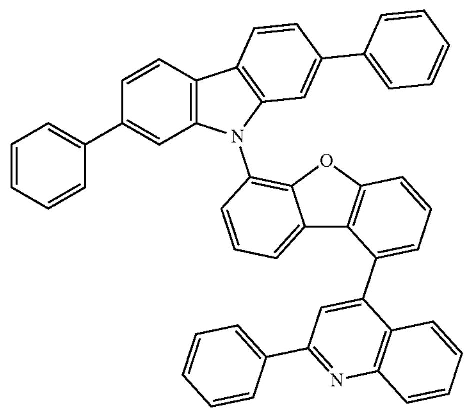
99
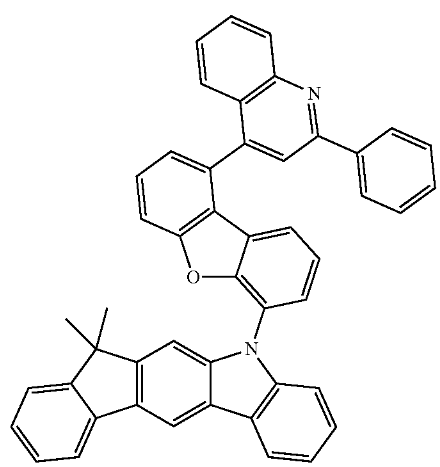

-continued
100
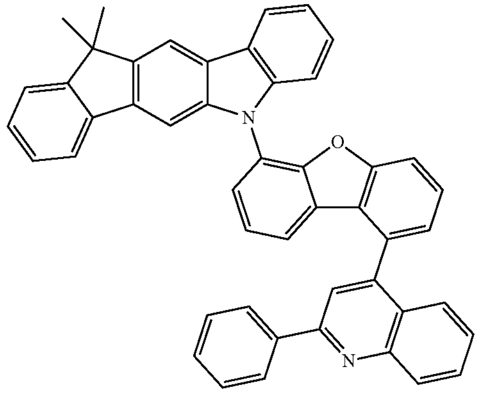
101
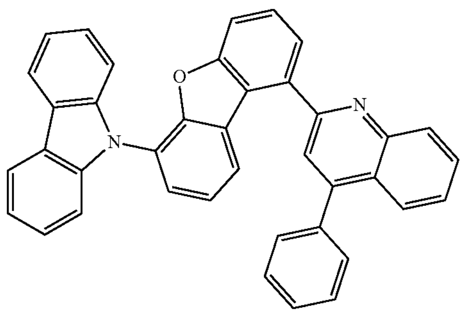
102
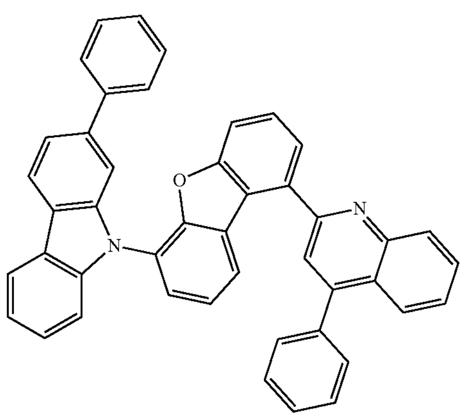
103
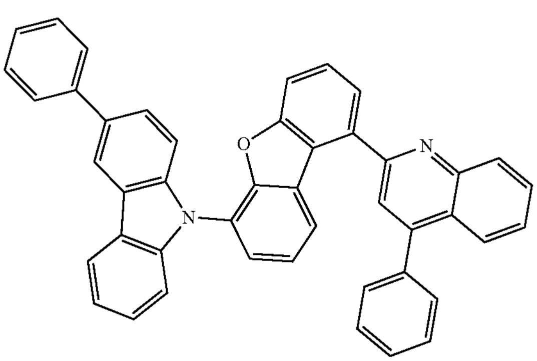
-continued
104
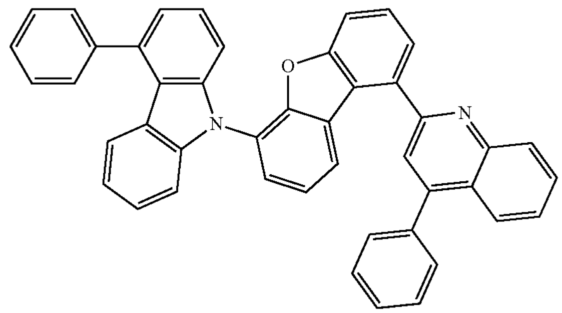
105
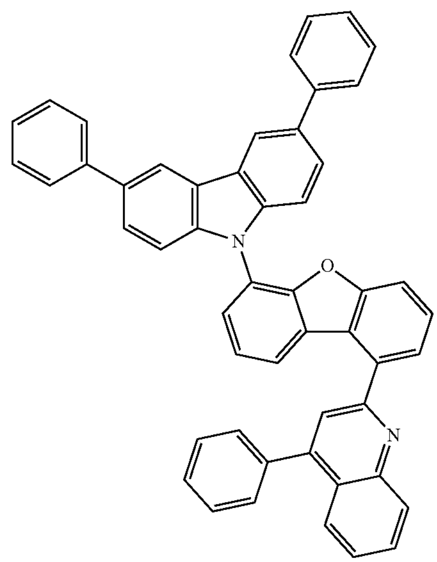
106
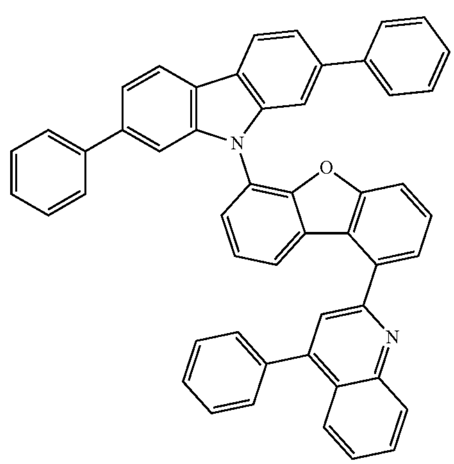

-continued
107
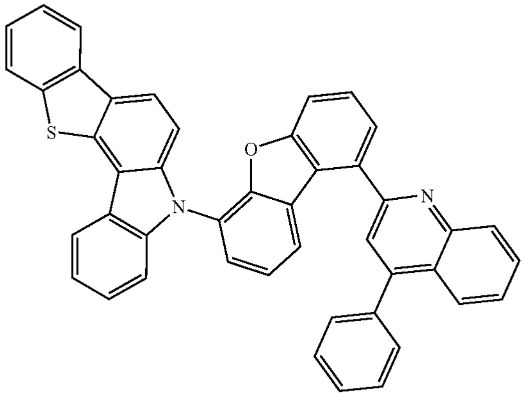
108
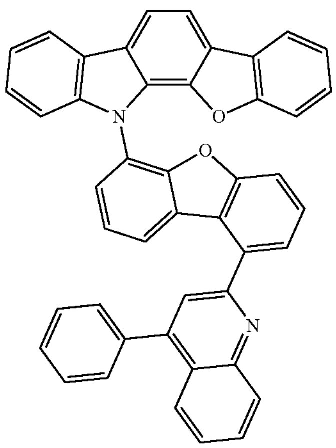
109
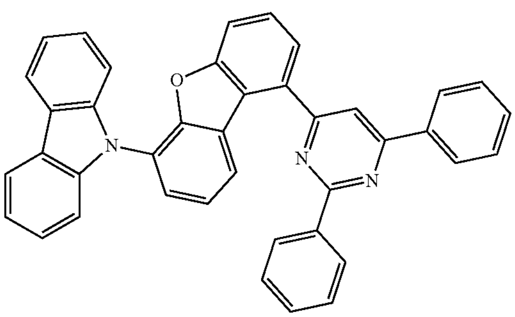
110
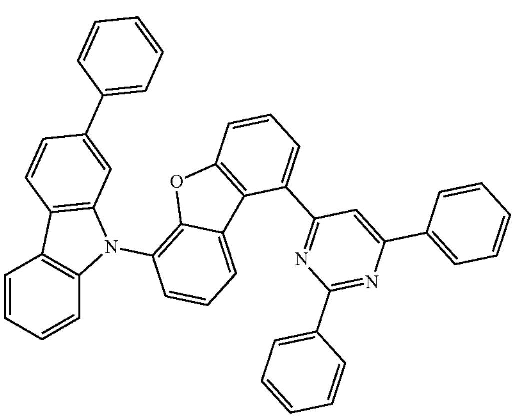
-continued
111
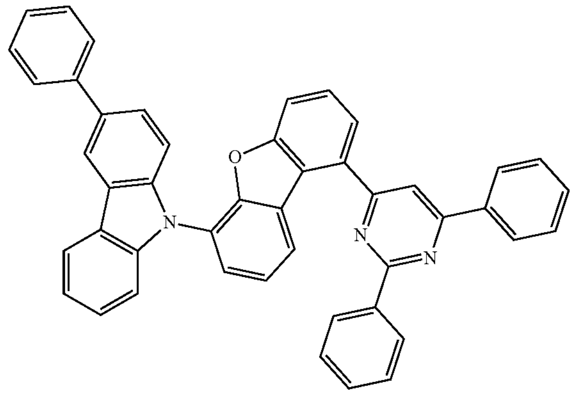
112
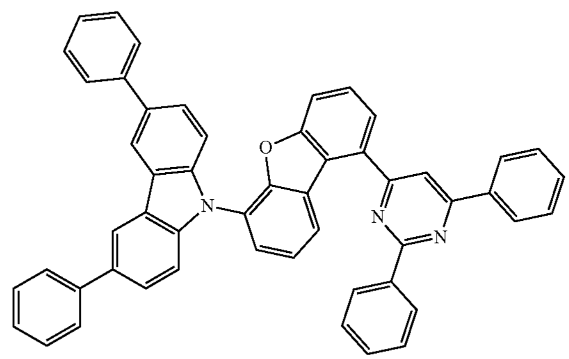
113
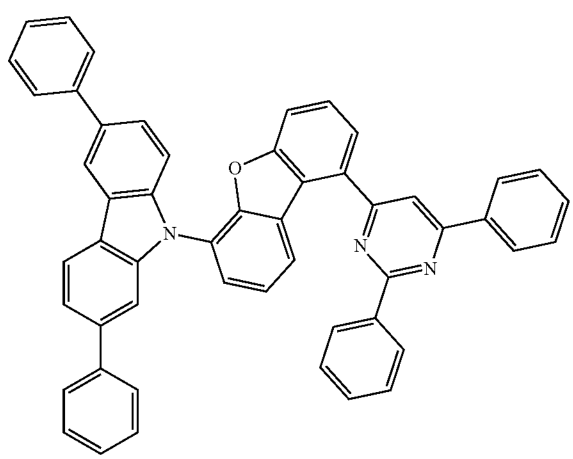

114
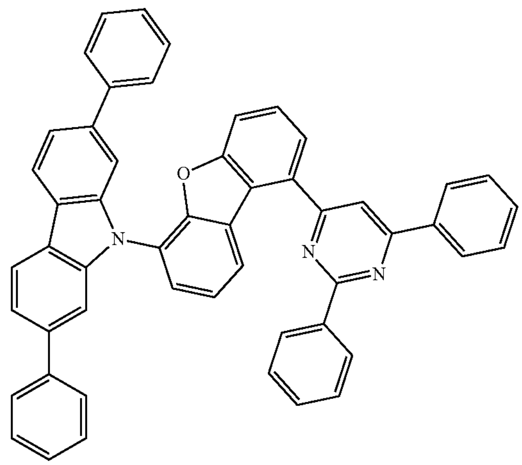
115
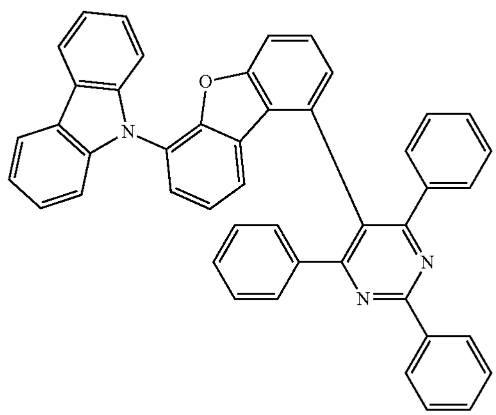
116
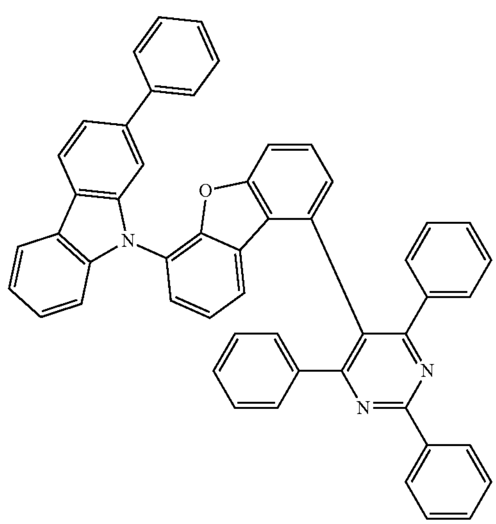
117
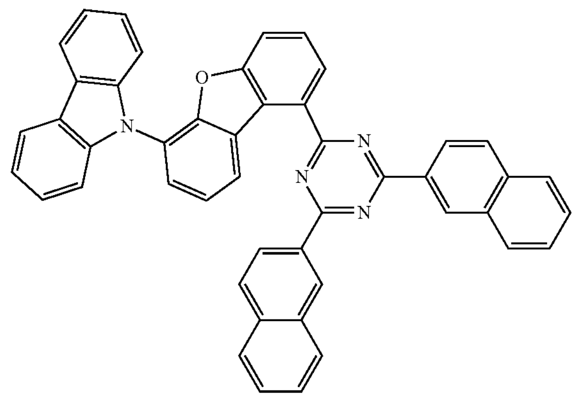
118
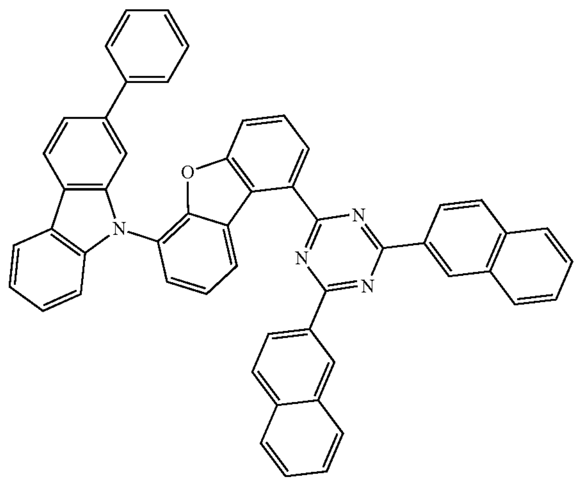
119
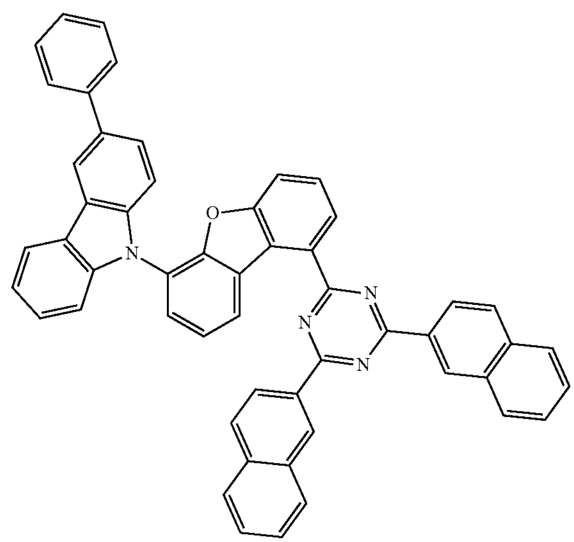

-continued
120
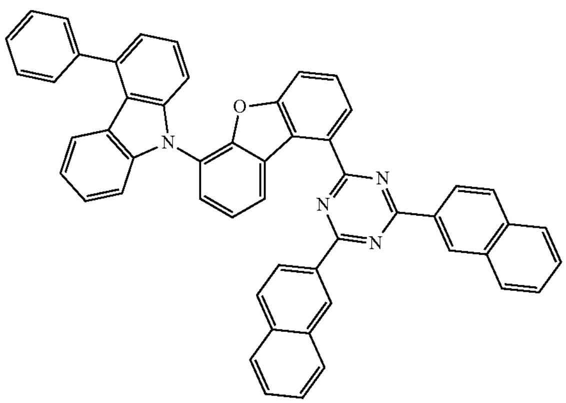
121
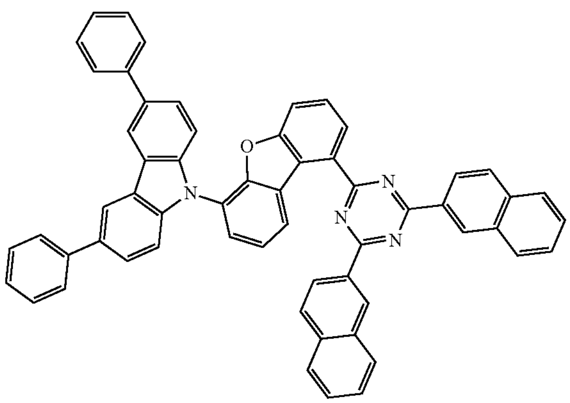
122
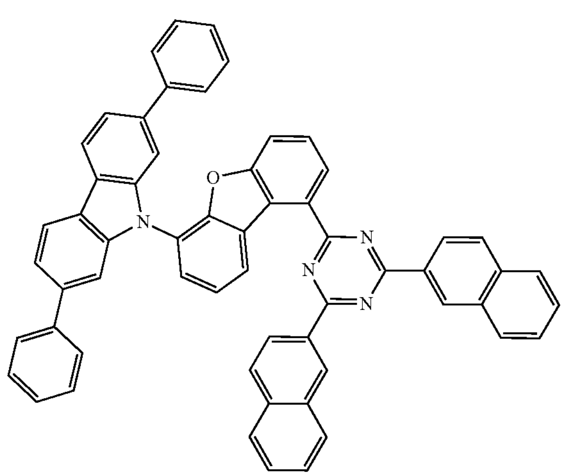
-continued
123
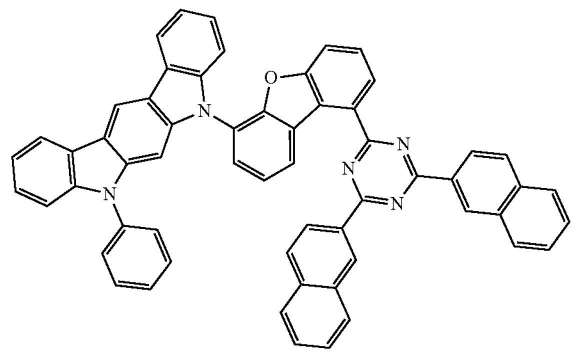
124
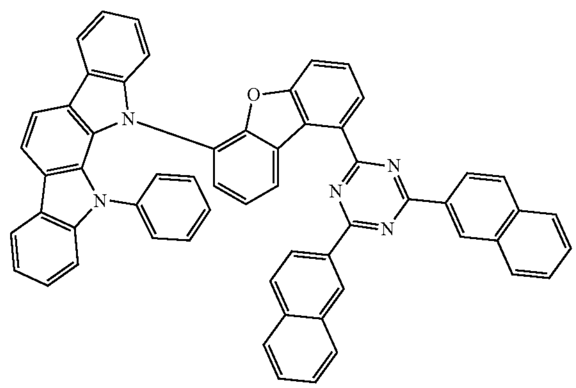
125
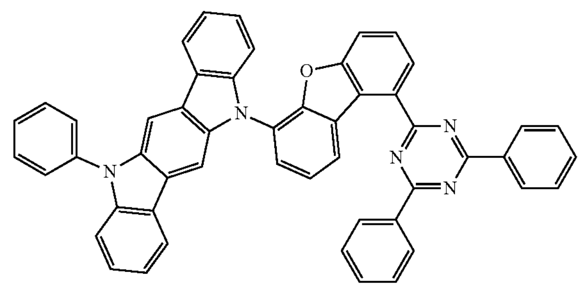
126
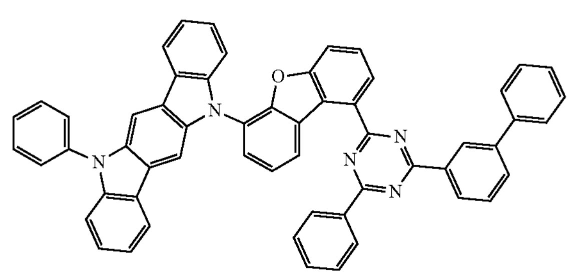

-continued
127
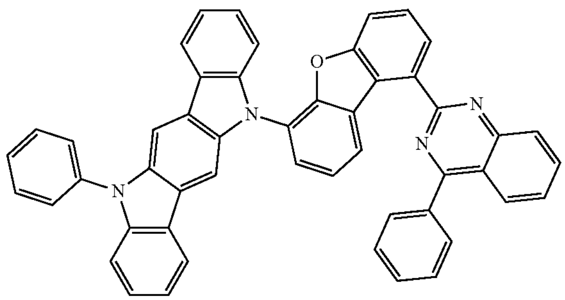
128
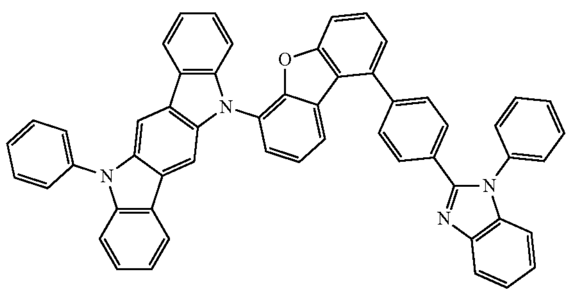
129
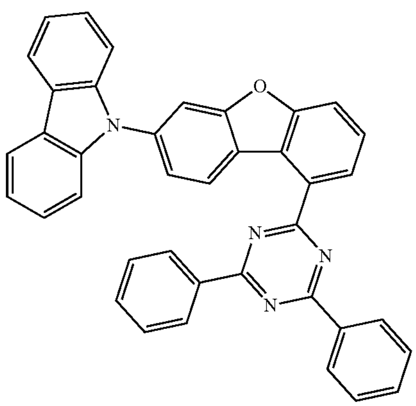
130
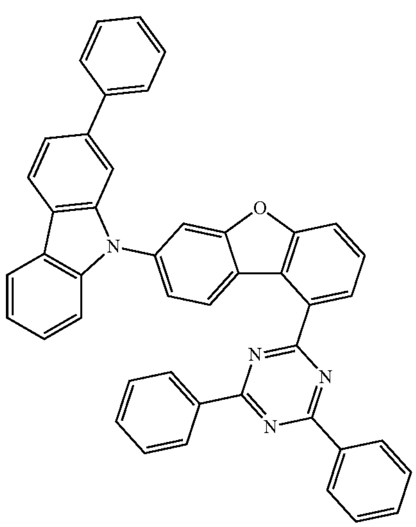
-continued
131
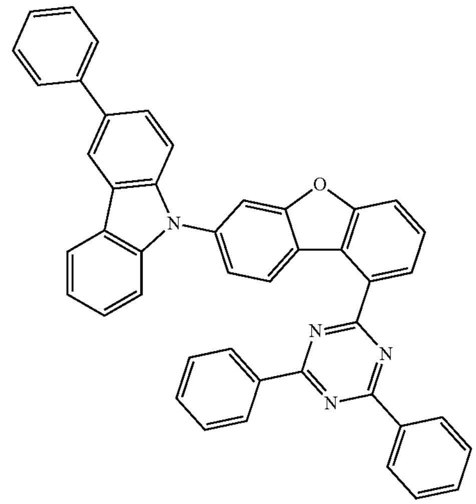
132
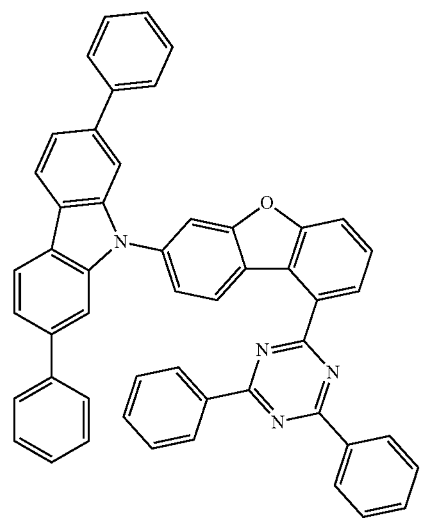
133
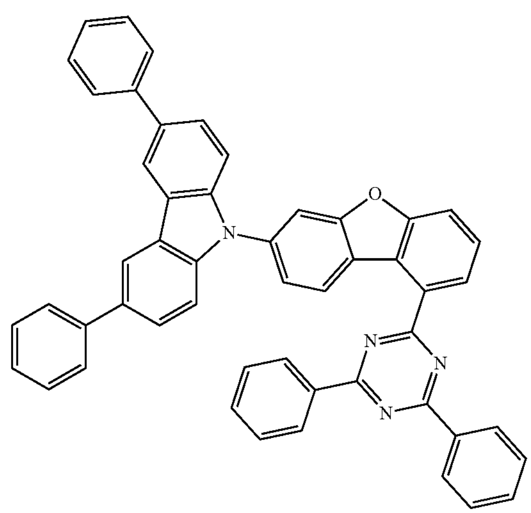

-continued
134
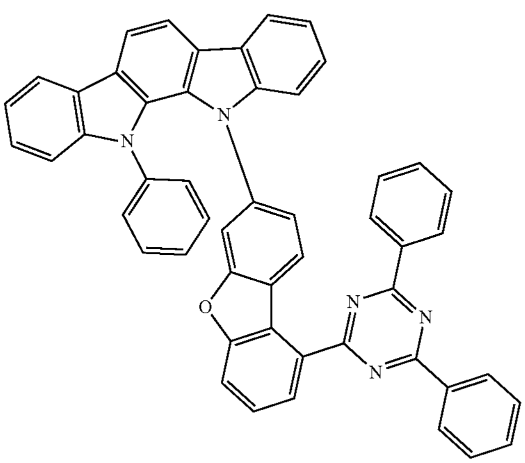
135
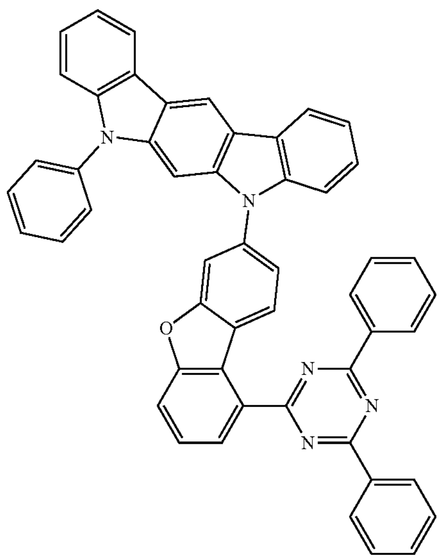
136
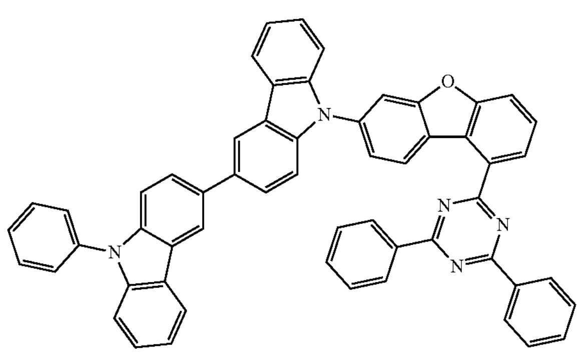
-continued
137
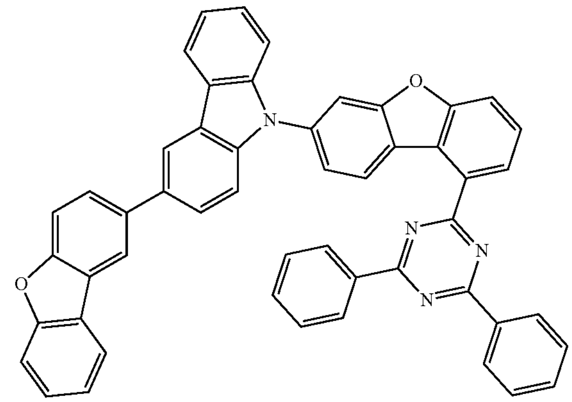
138
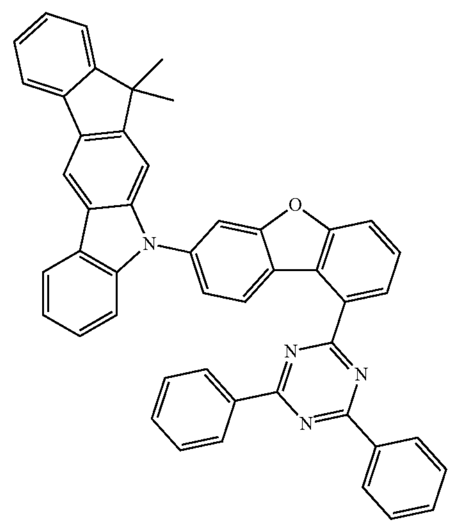
139
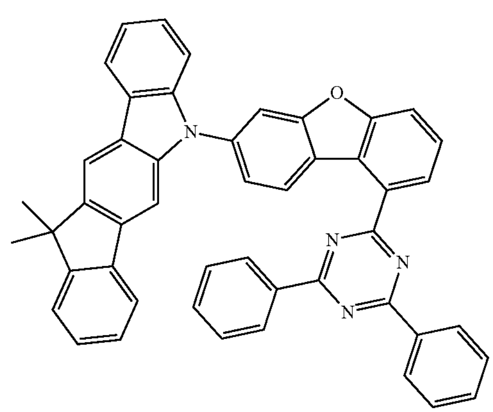

-continued
140
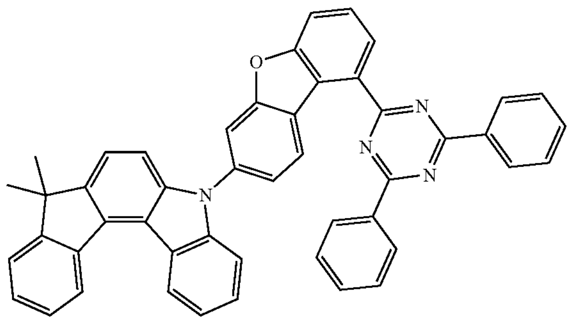
141
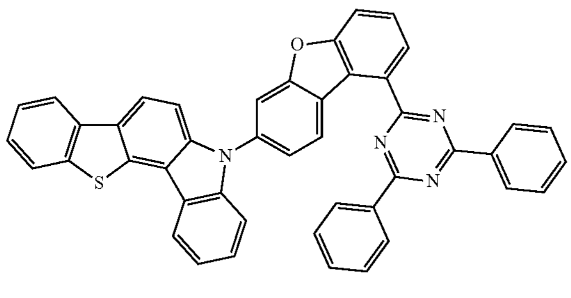
142
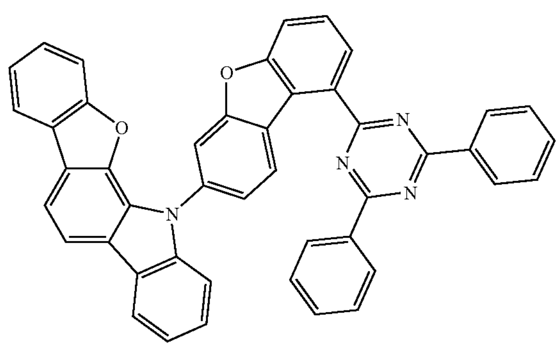
143
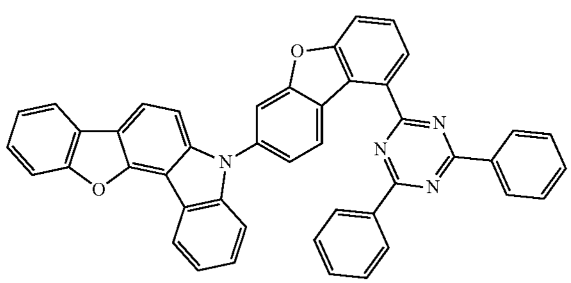
-continued
144
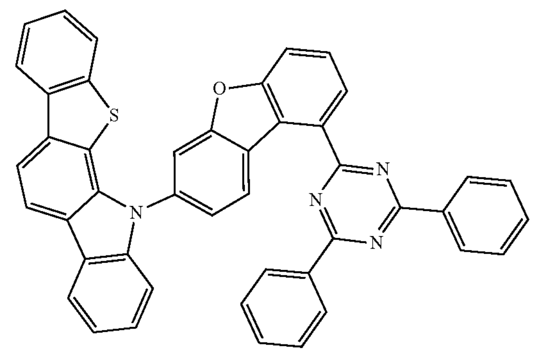
145
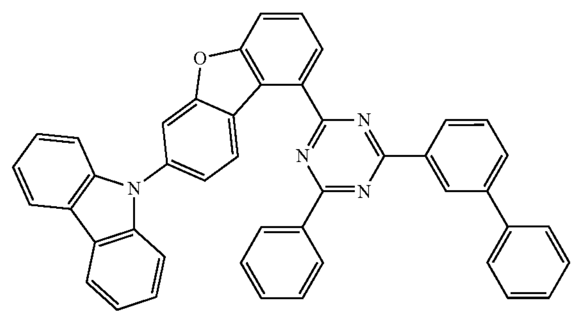
146
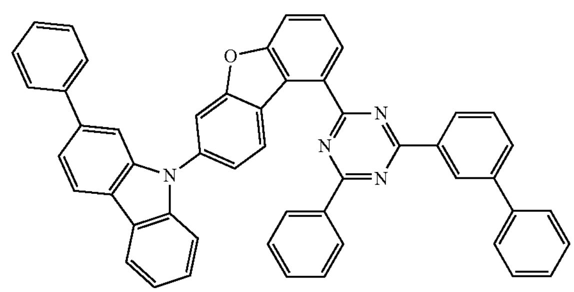
147
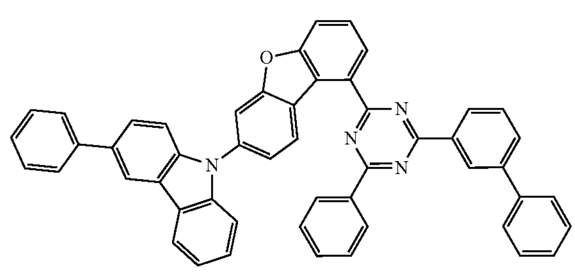

-continued
148
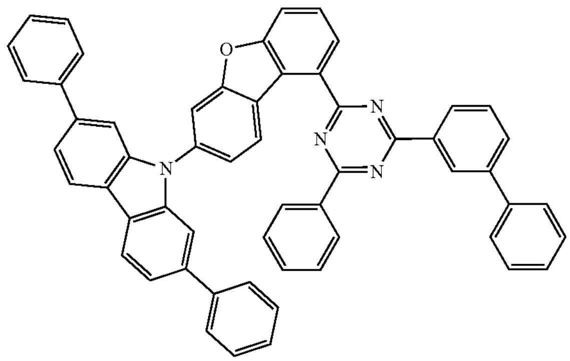
149
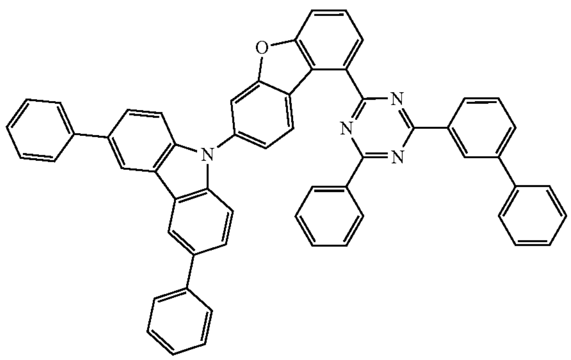
150
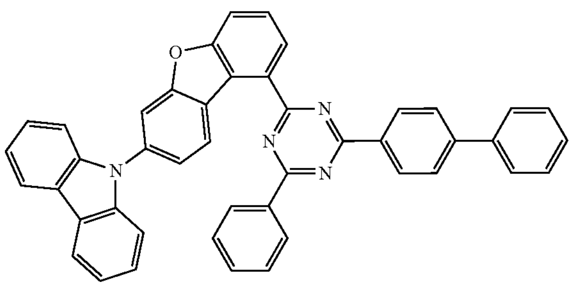
151
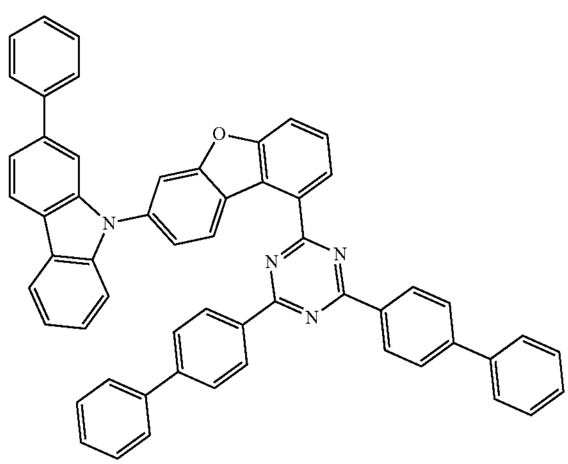
-continued
152
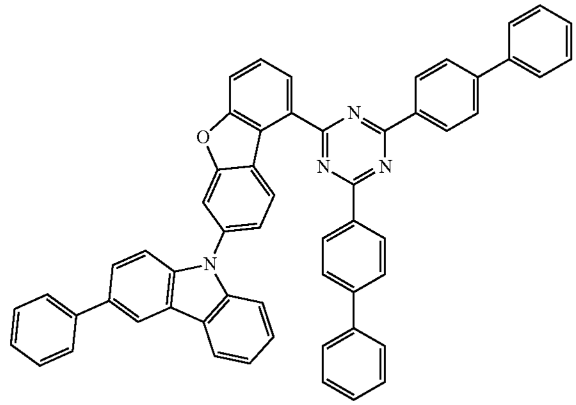
153
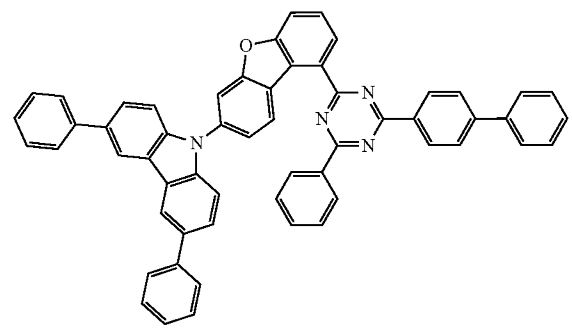
154
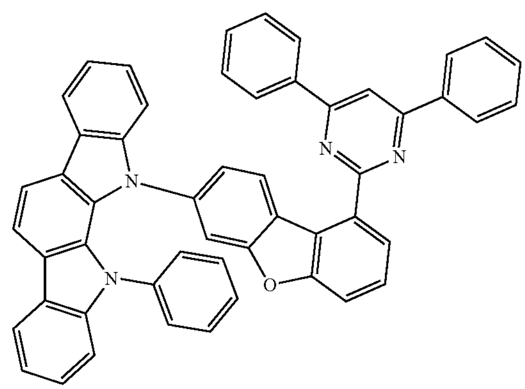
155
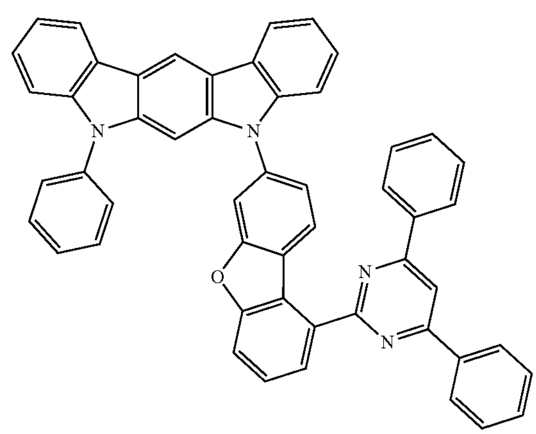

-continued
156
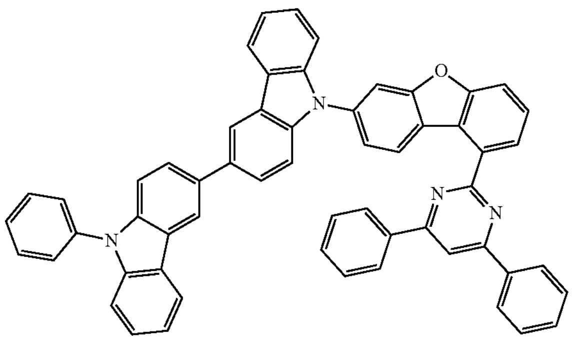
157
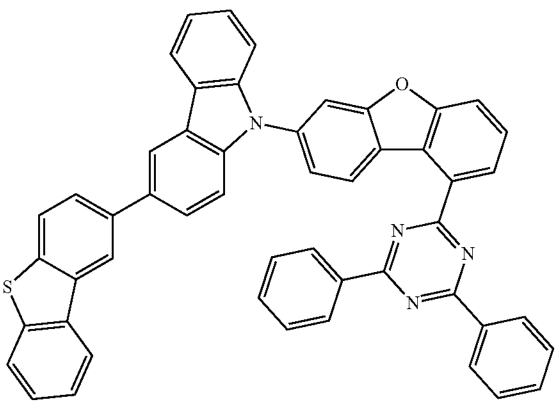
158
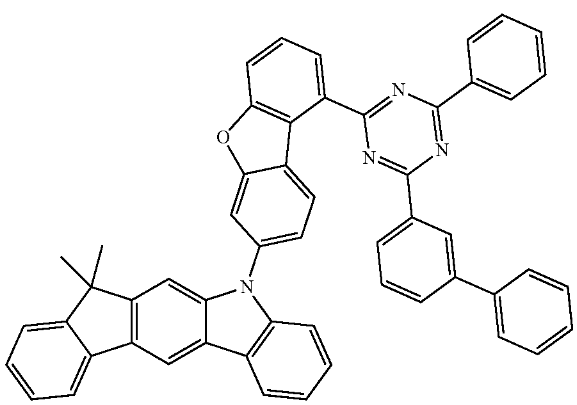
159
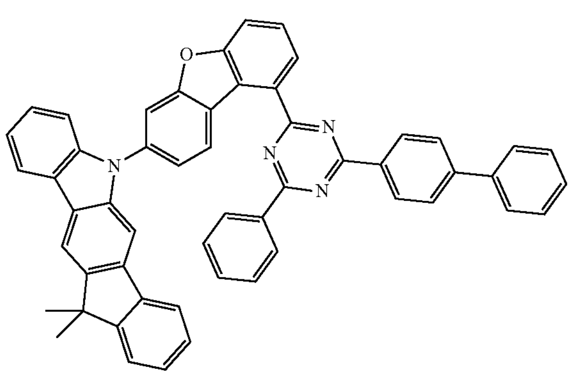
-continued
160
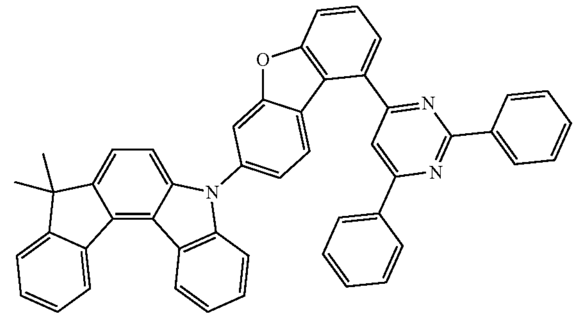
161
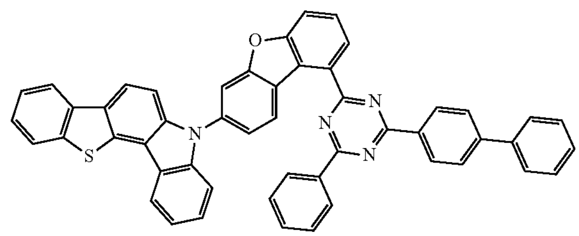
162
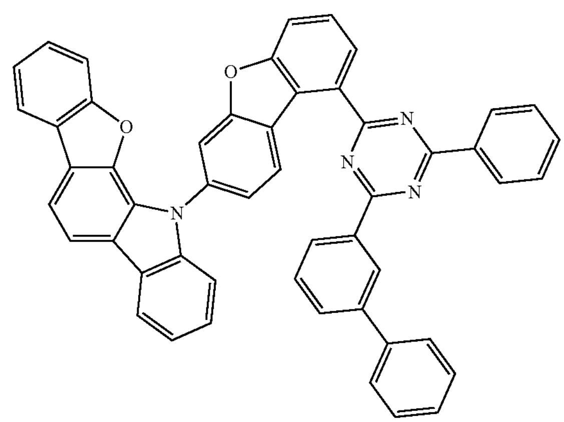
163
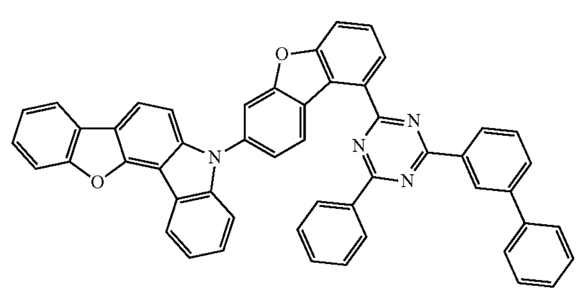

-continued
164
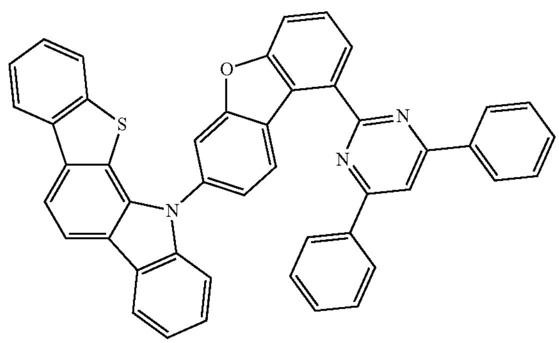
165
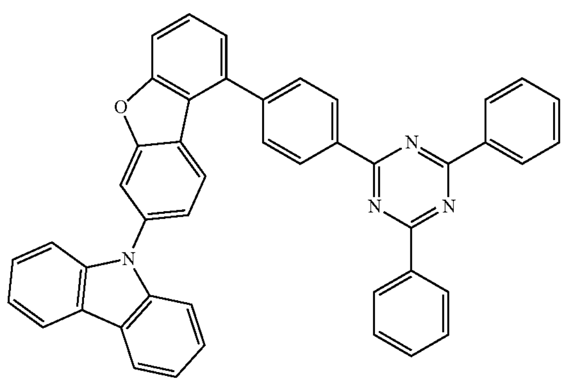
166
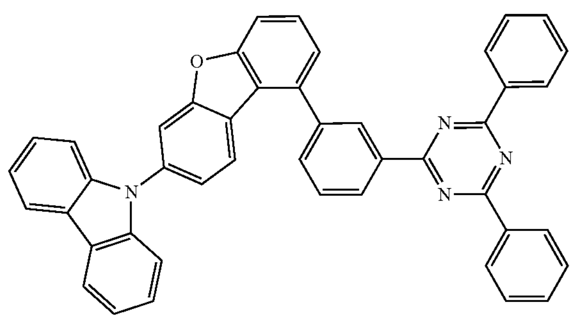
167
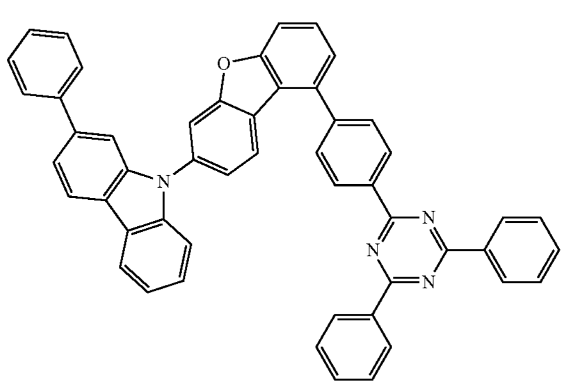
-continued
168
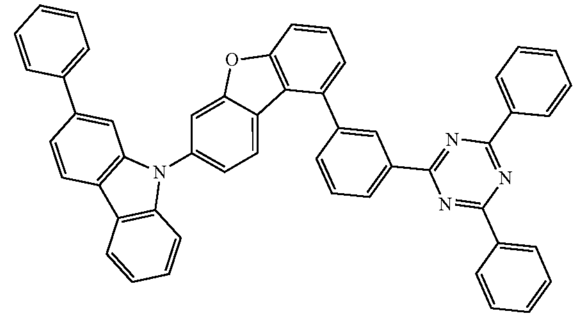
169
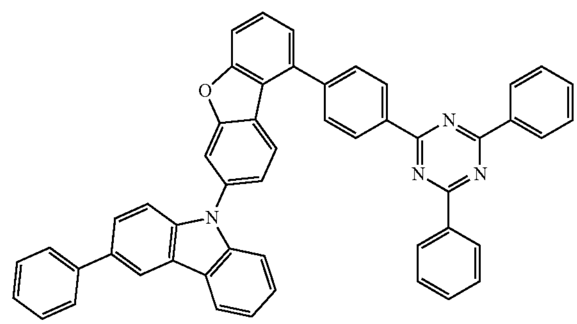
170
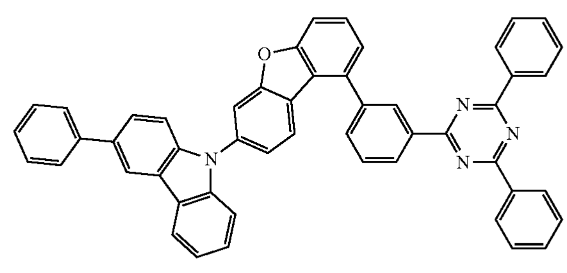
171
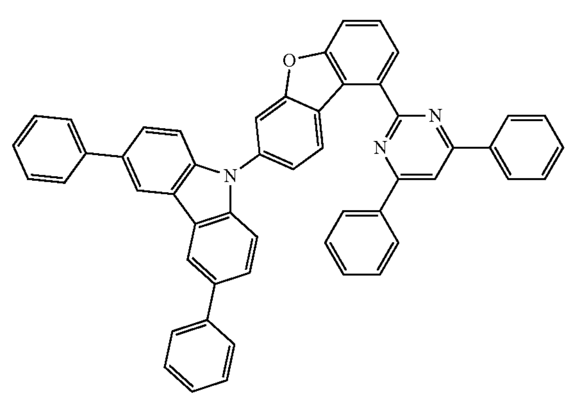

-continued
172
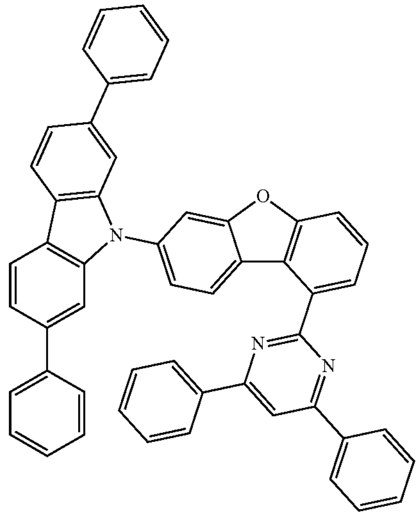
173
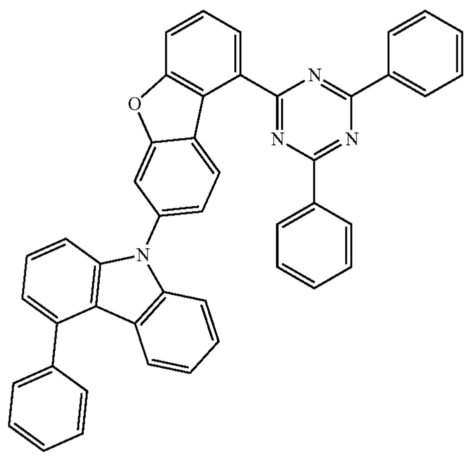
174
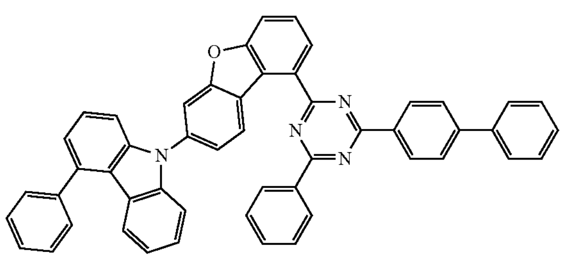
175
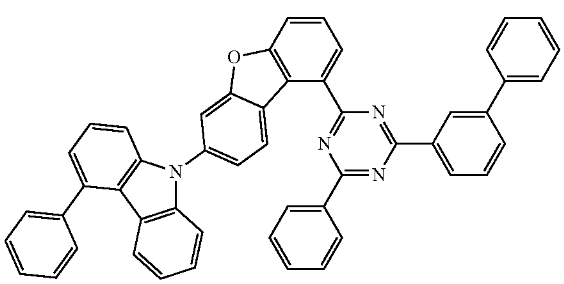
-continued
176
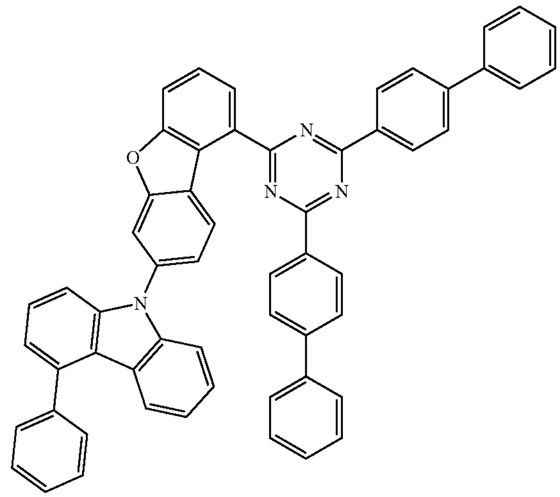
177
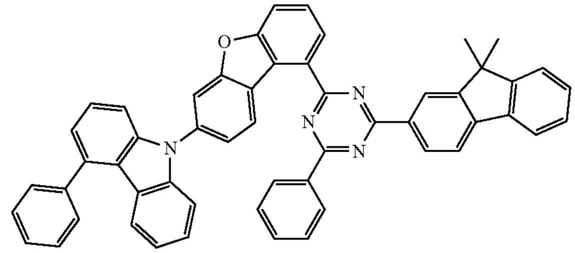
178
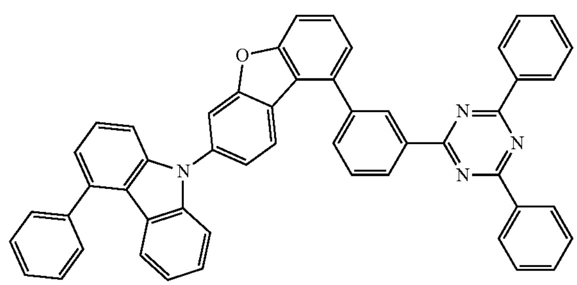
179
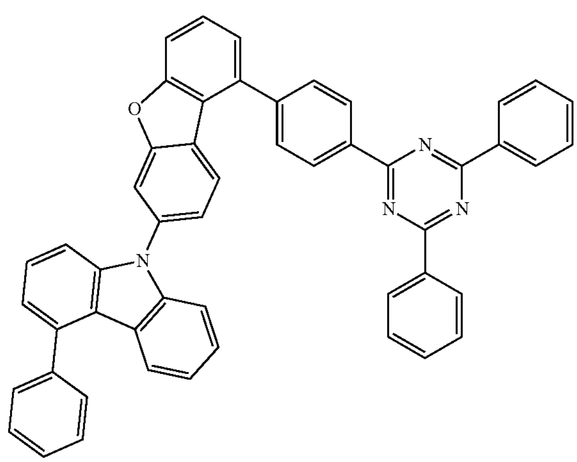

-continued
180
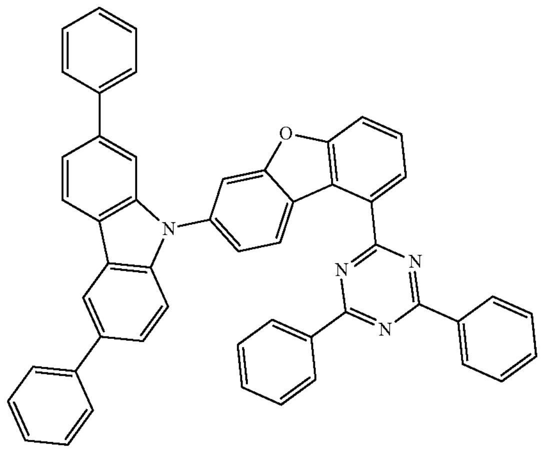
181
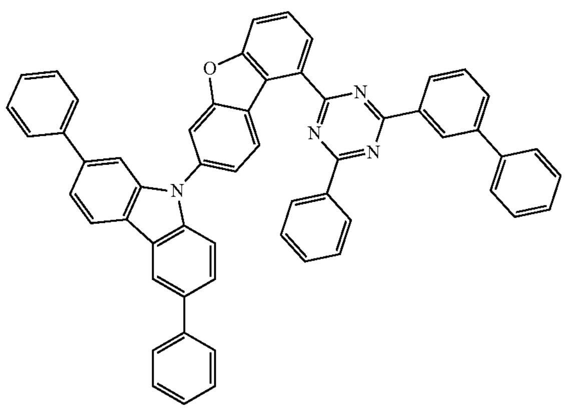
182
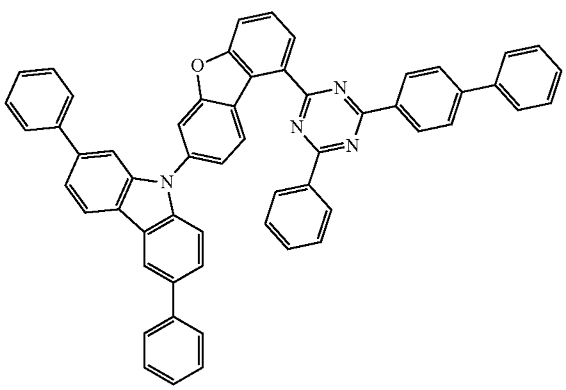
183
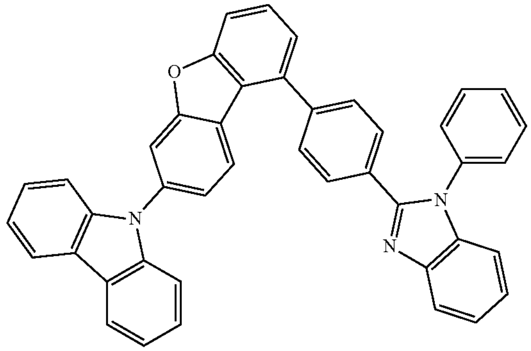
-continued
184
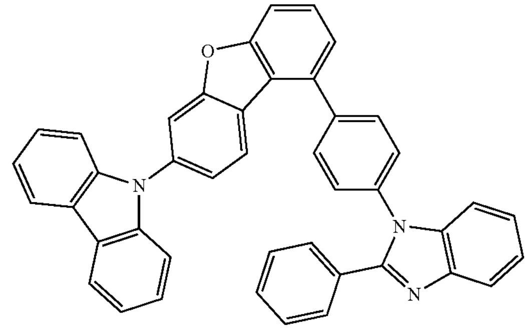
185
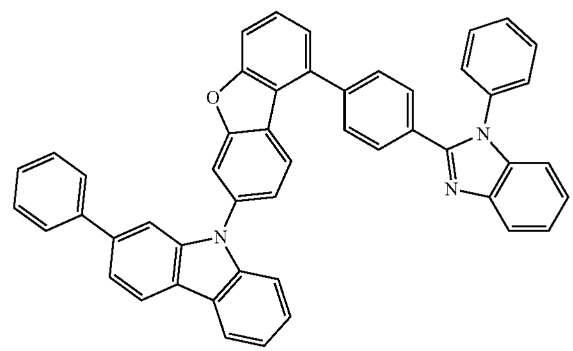
186
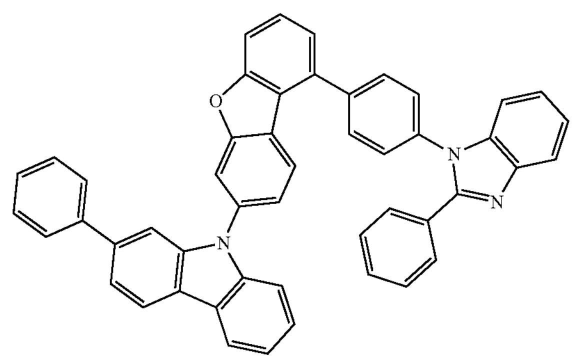
187
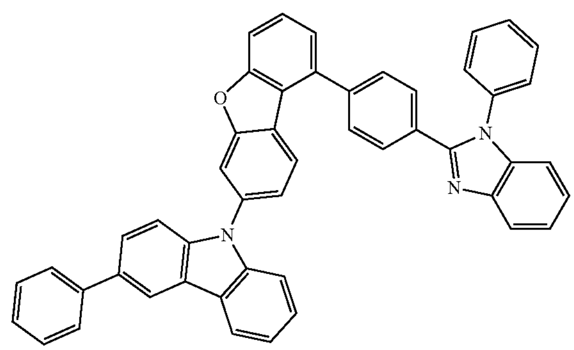

188
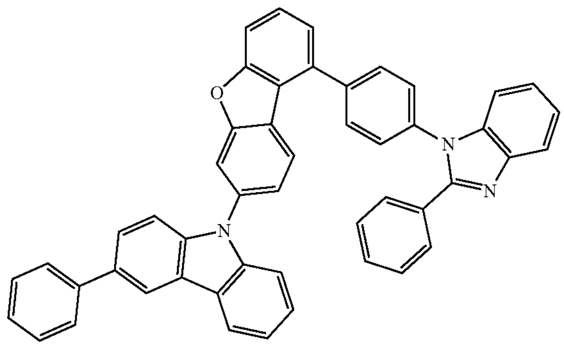
189
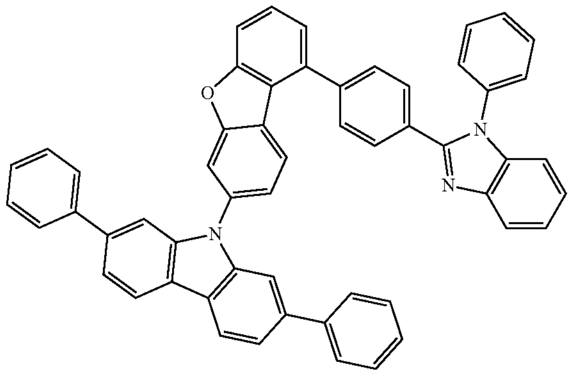
190
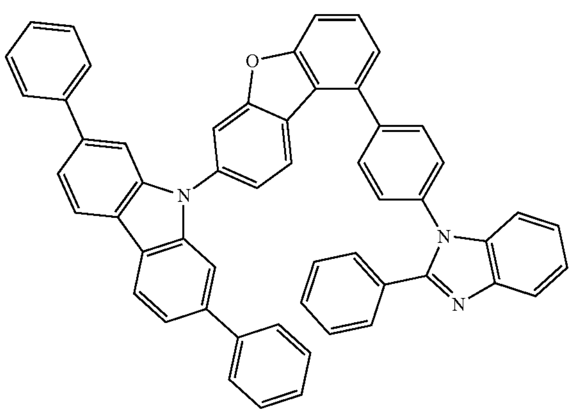
191
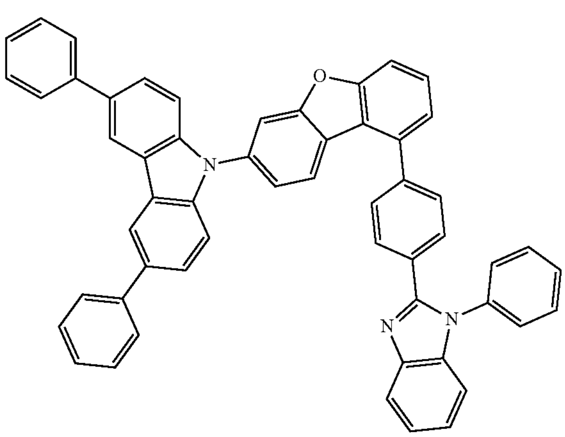
192
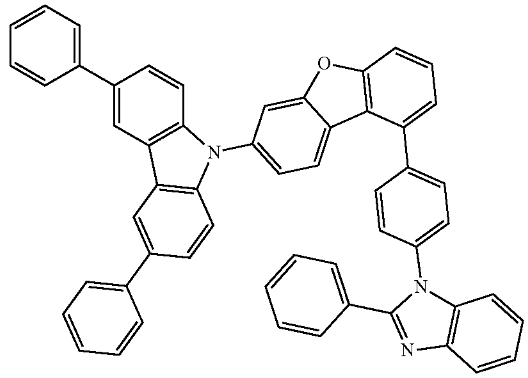
193
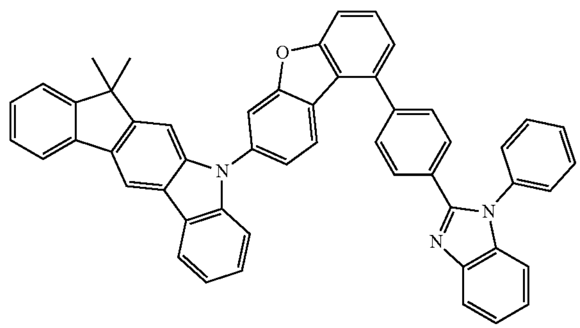
194
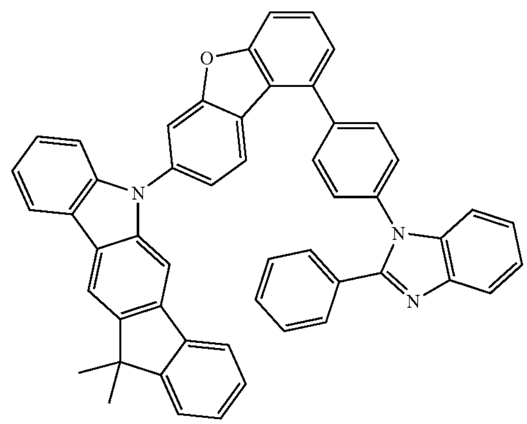
195
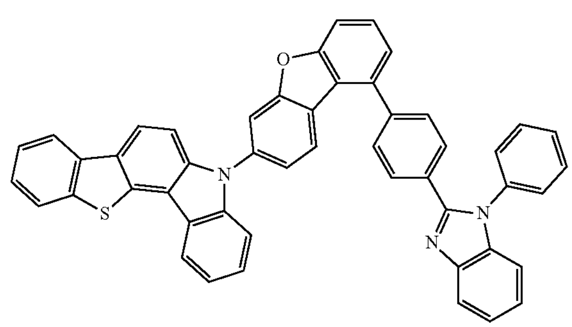

-continued
196
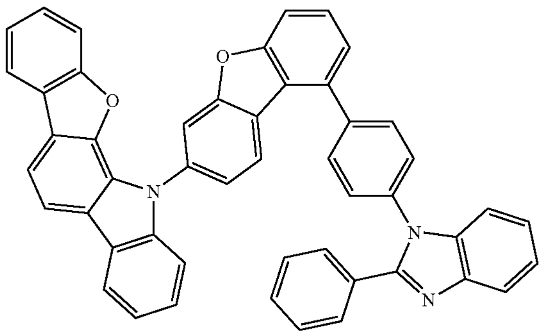
197
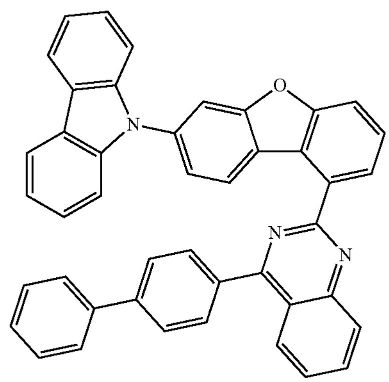
198
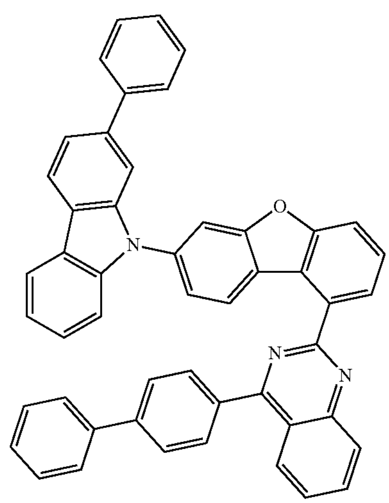
-continued
199
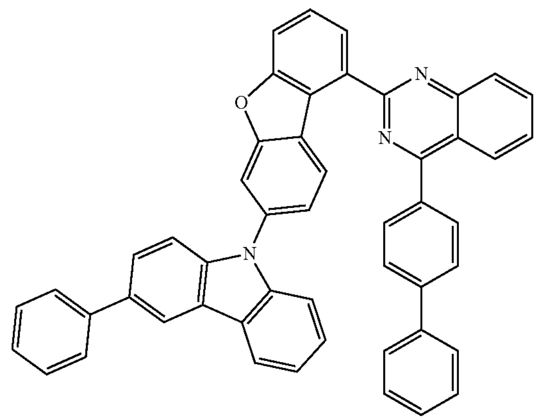
200
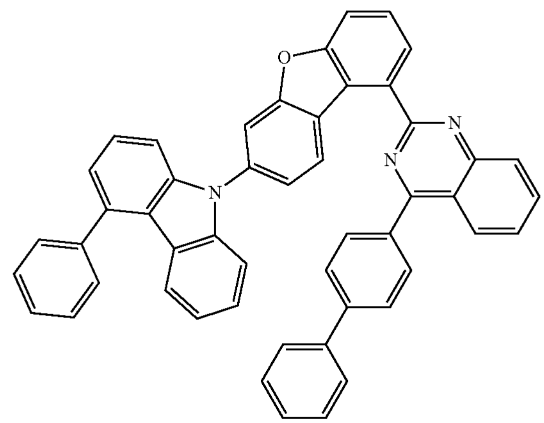
201
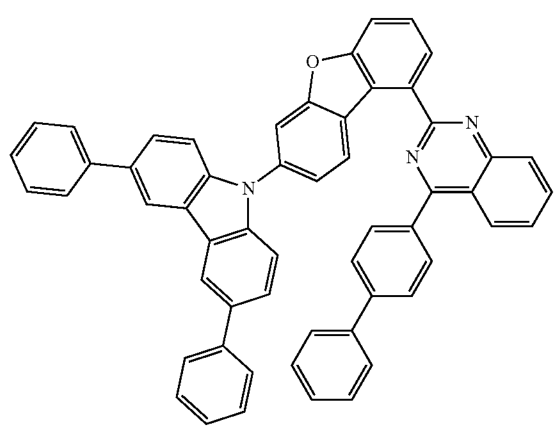

-continued
202
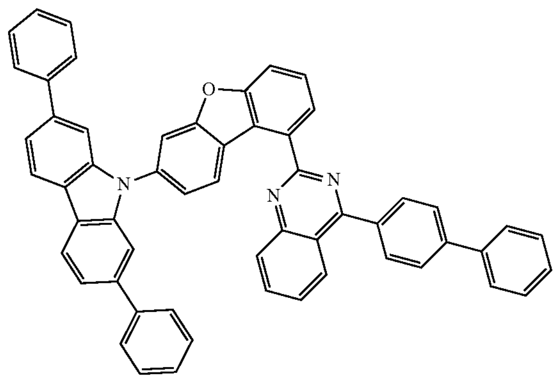
203
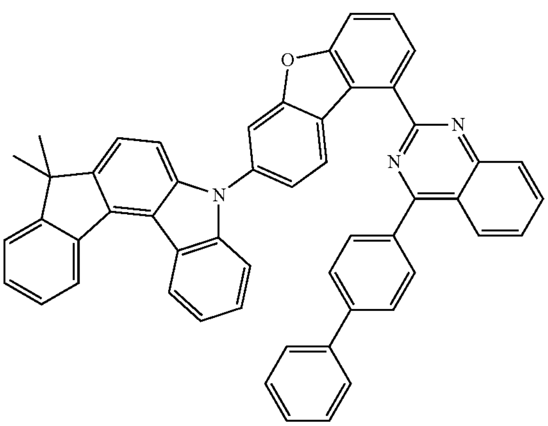
204
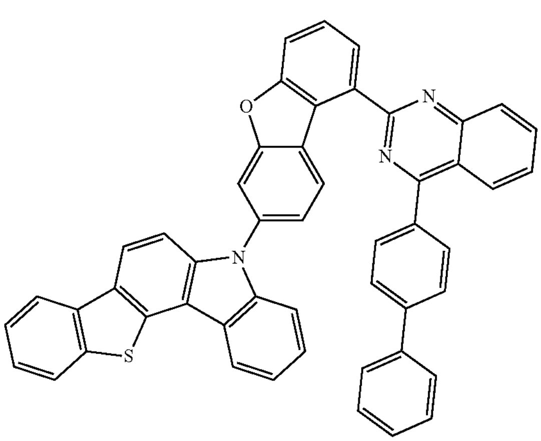
-continued
205
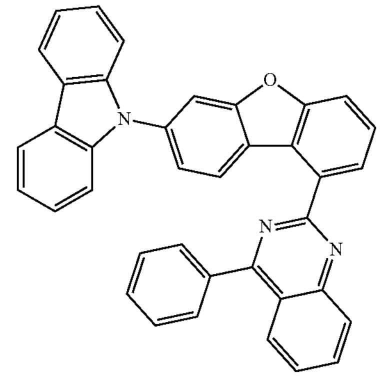
206
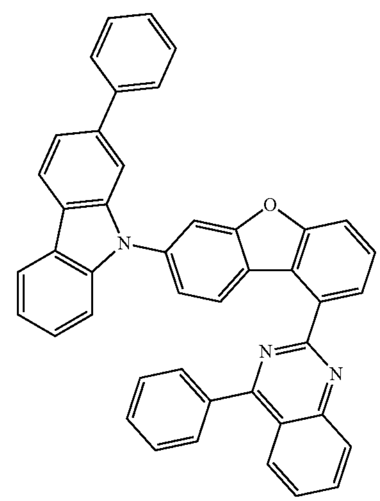
207
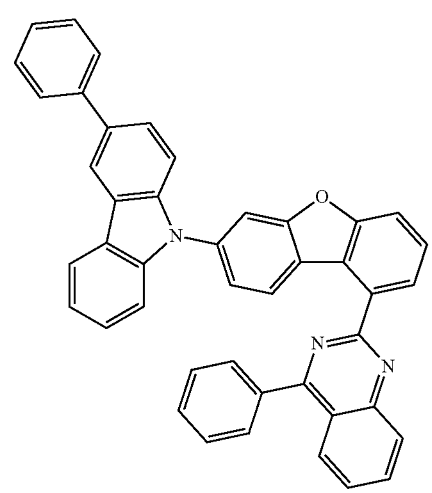

208
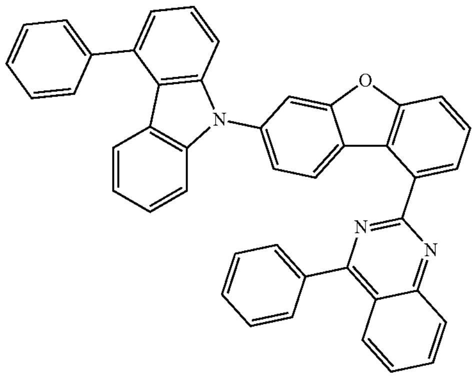
209
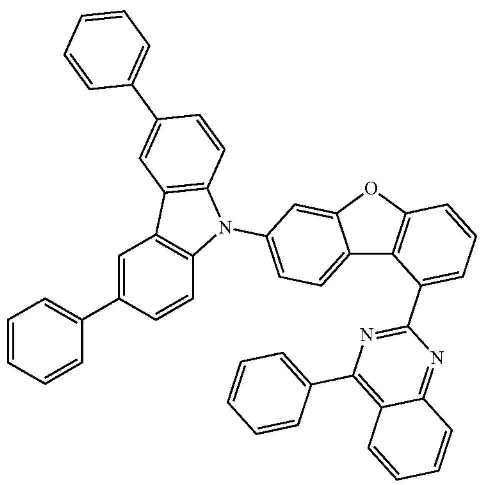
210
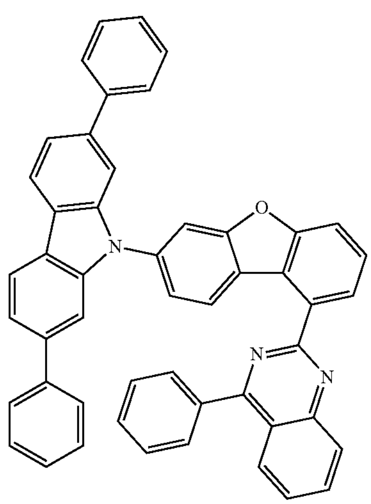
211
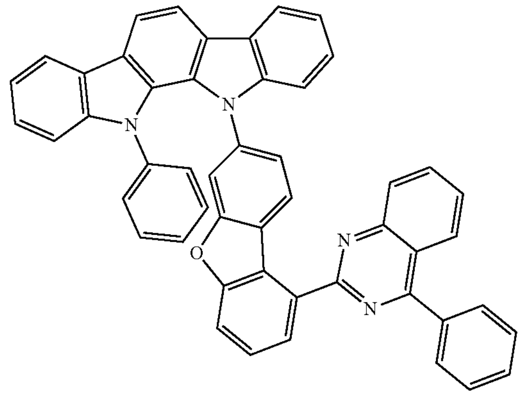
212
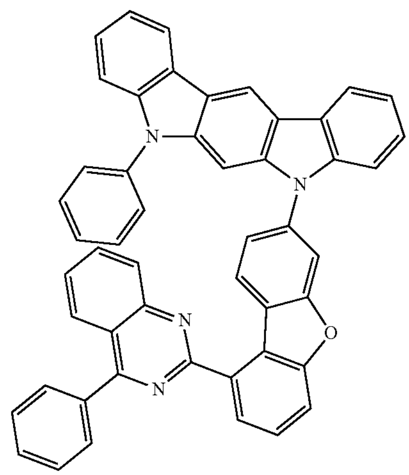
213
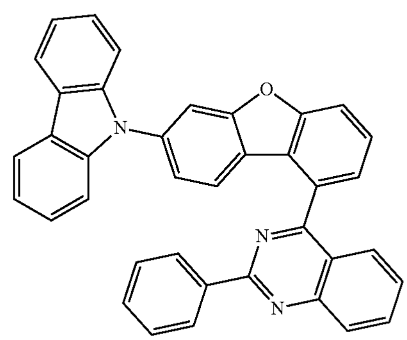
214
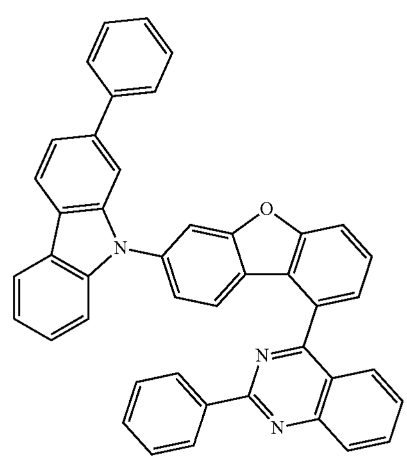

-continued
215
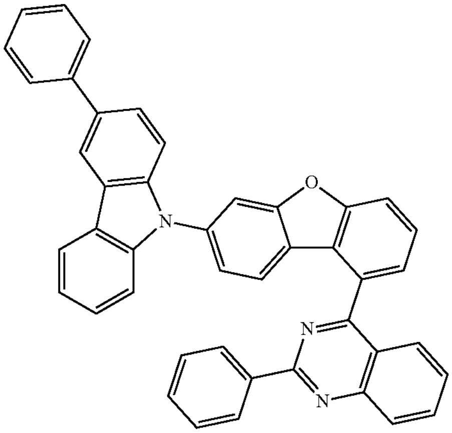
216
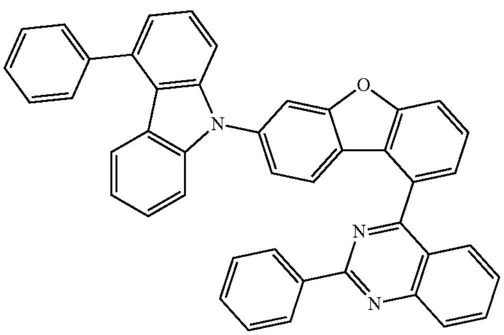
217
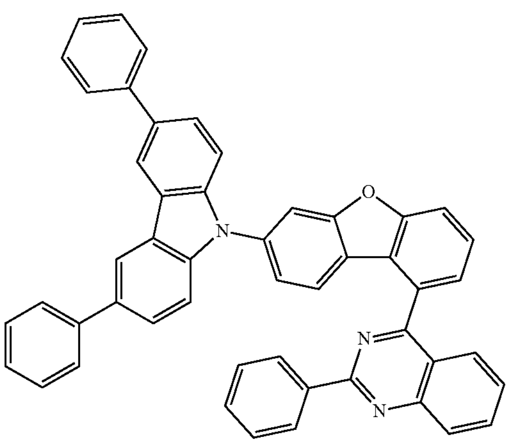
-continued
218
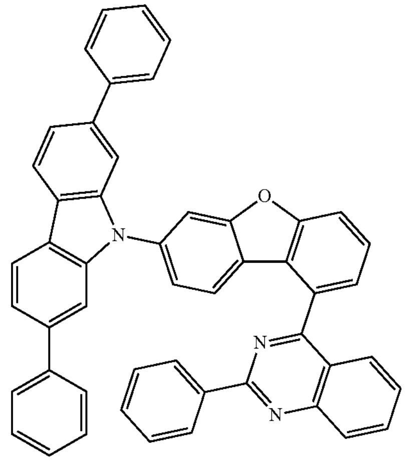
219
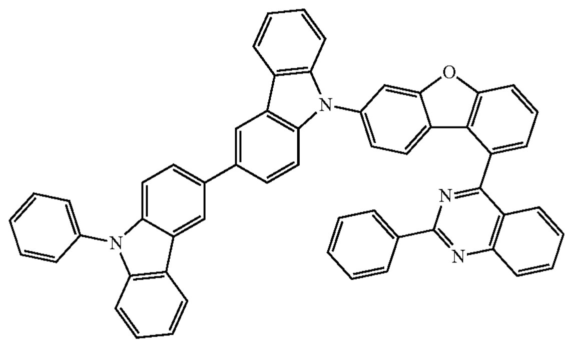
220
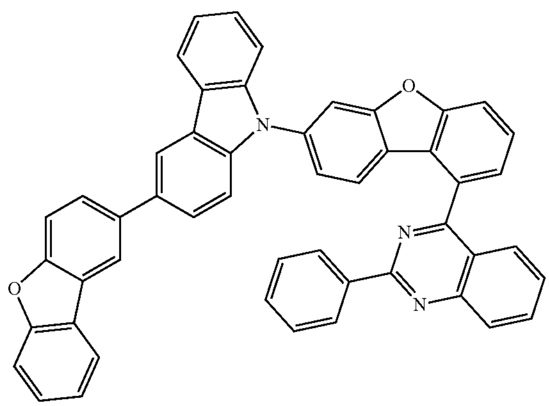
221
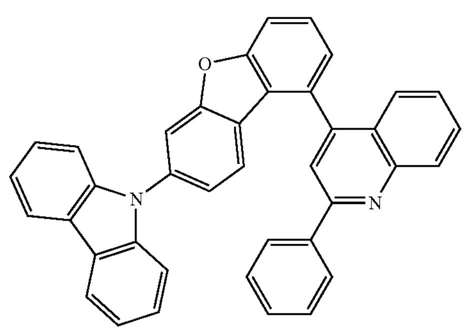

-continued
222
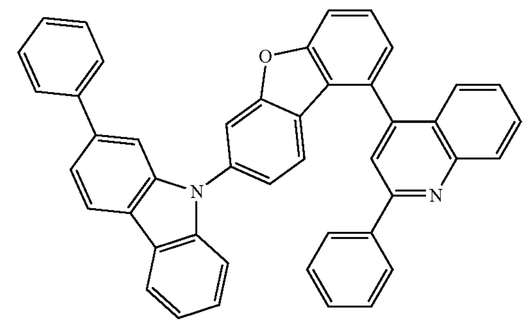
223
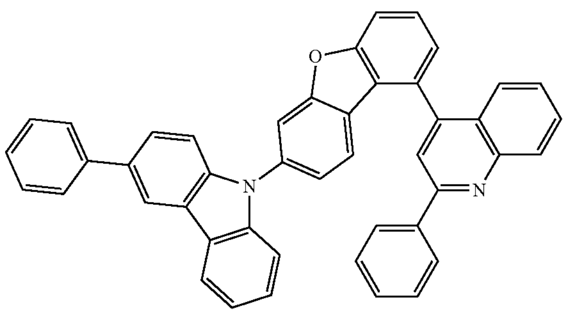
224
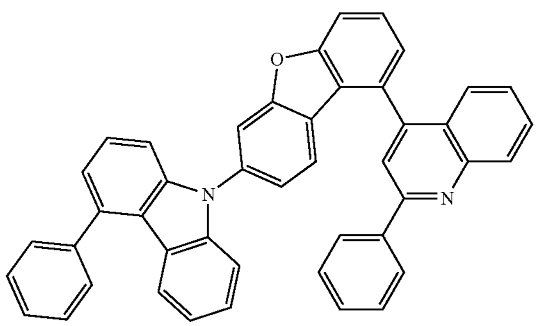
225
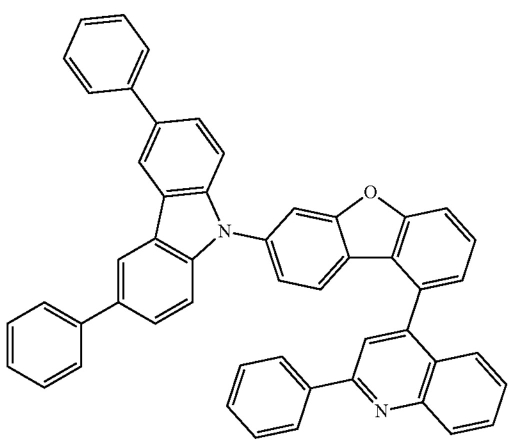
-continued
226
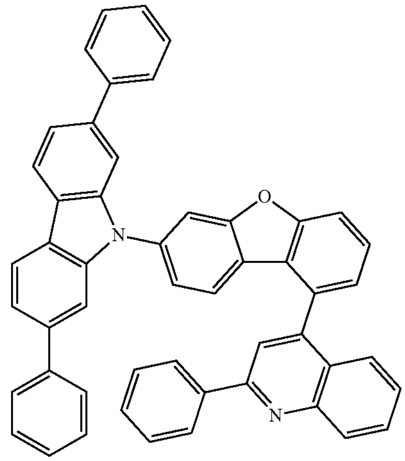
227
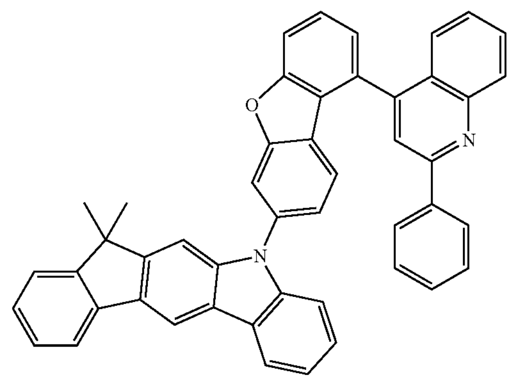
228
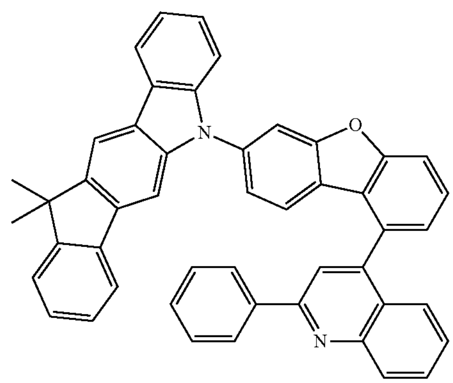
229
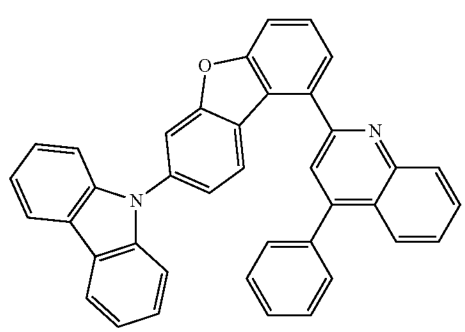

-continued
230
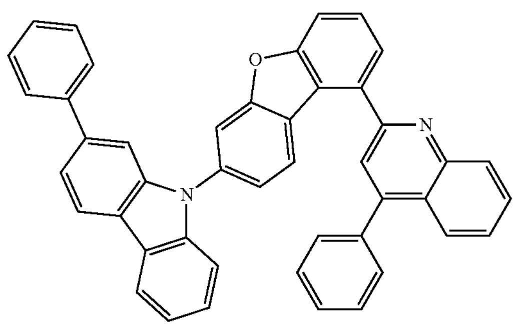
231
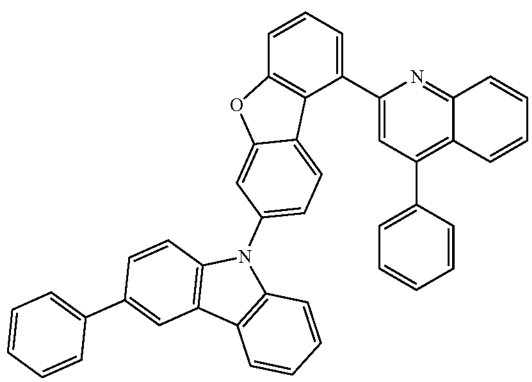
232
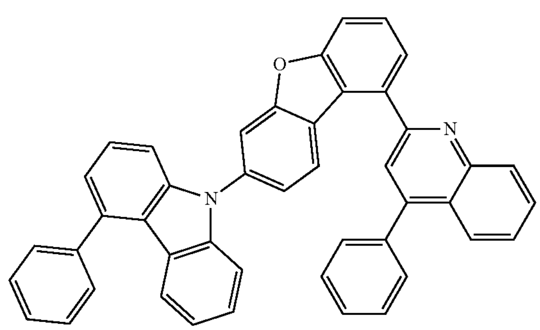
233
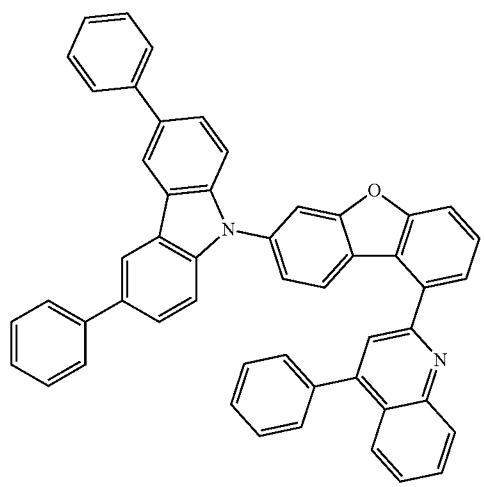
-continued
234
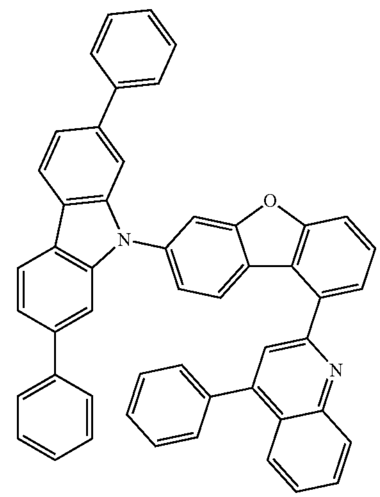
235
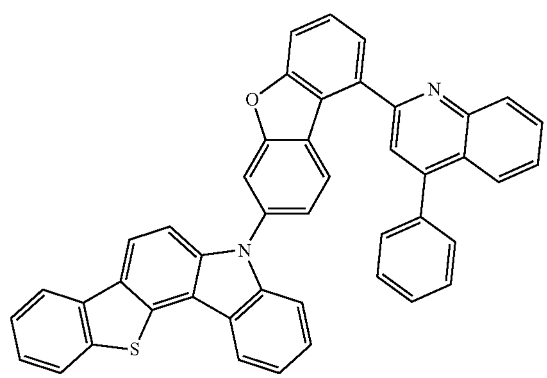
236
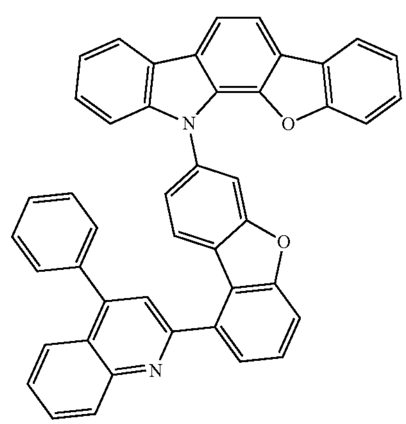
237
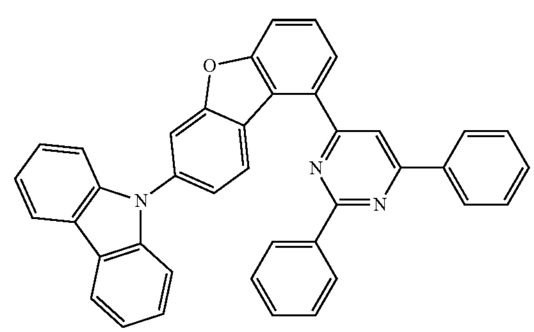

-continued
238
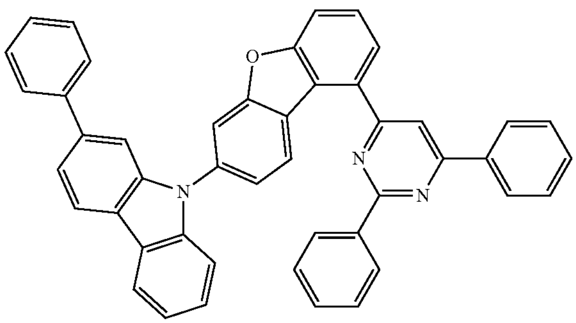
239
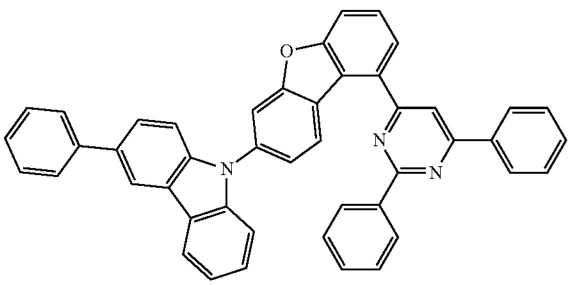
240
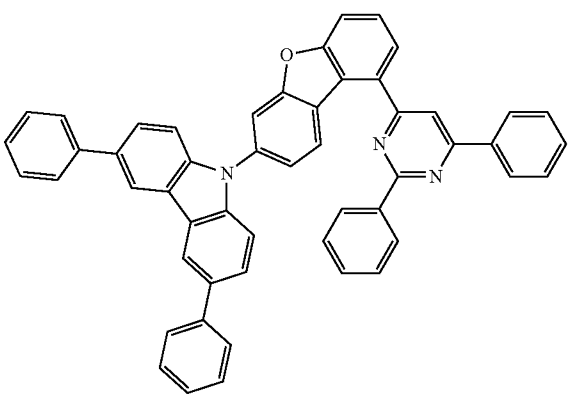
241
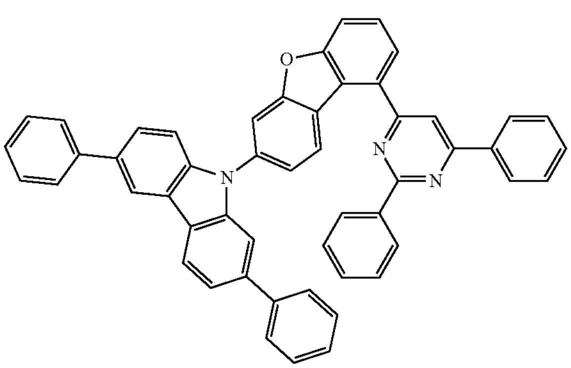
-continued
242
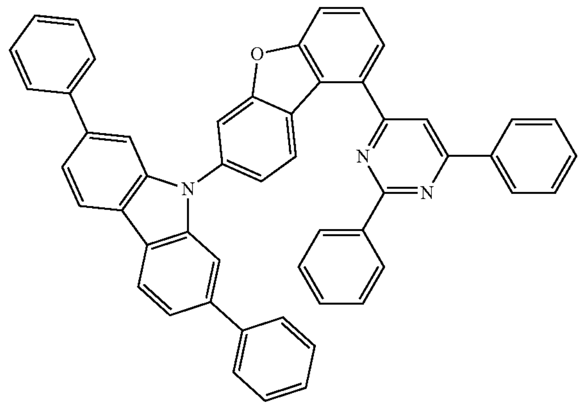
243
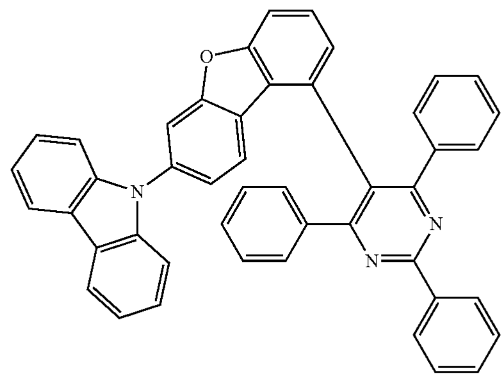
244
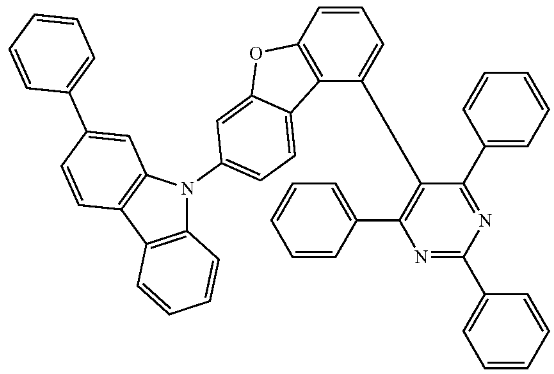
245
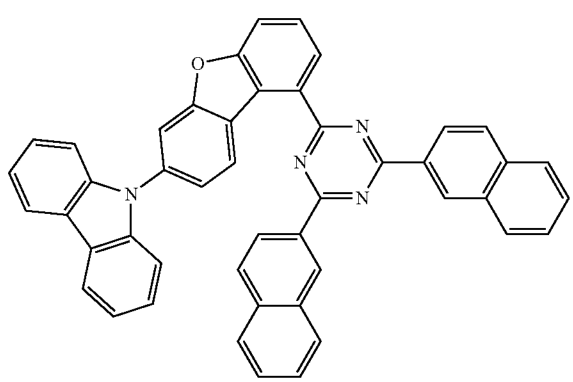

246
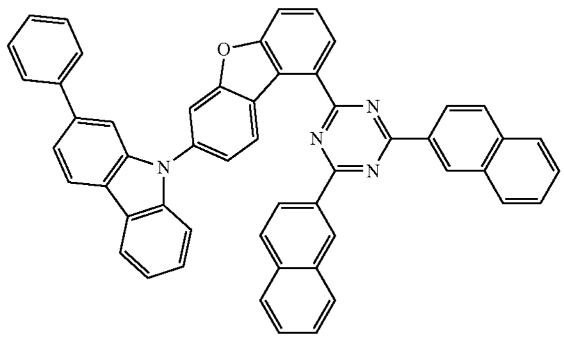
247
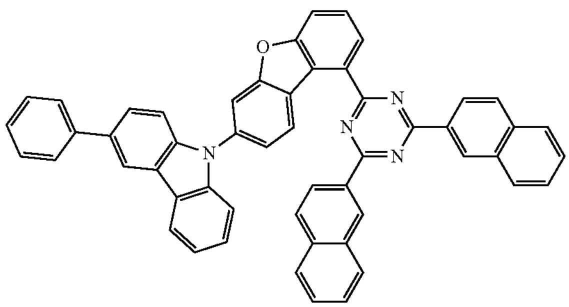
248
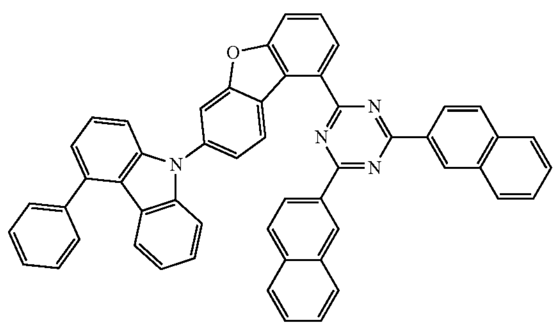
249
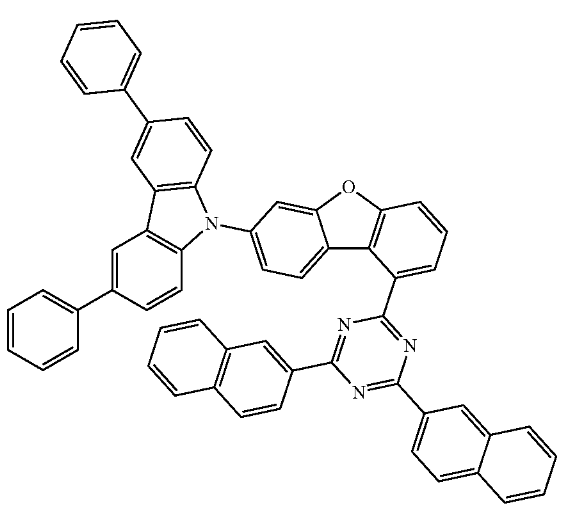
250
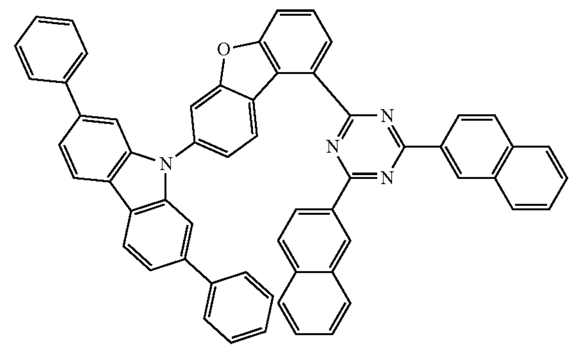
251
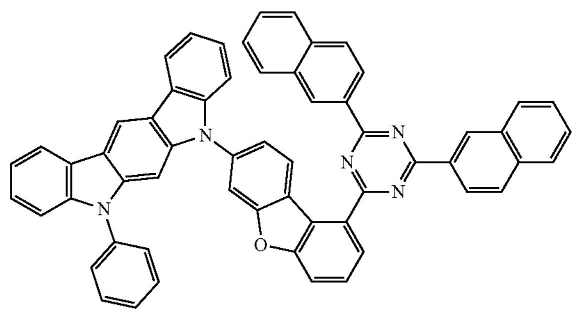
252
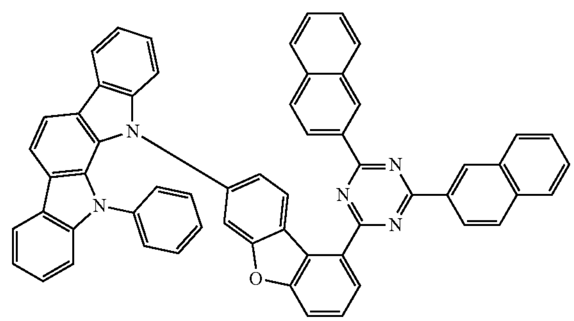
253
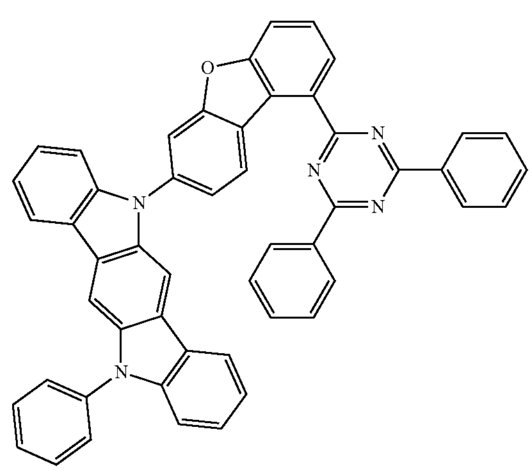

-continued
254
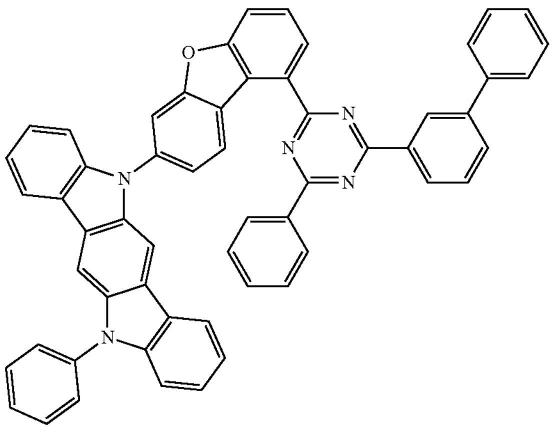
255
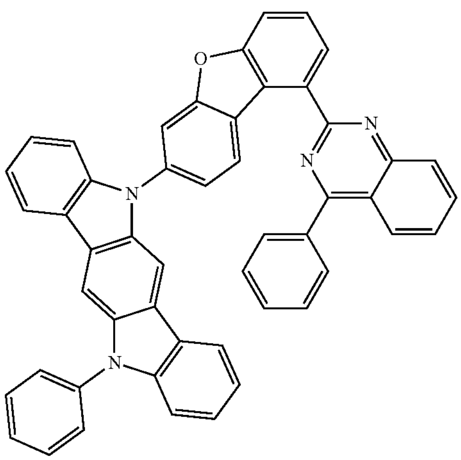
256
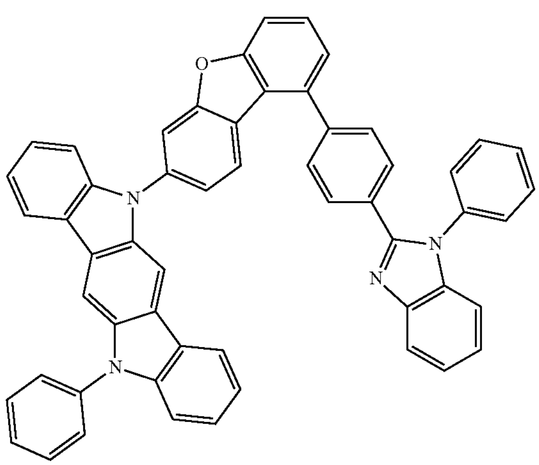
-continued
257
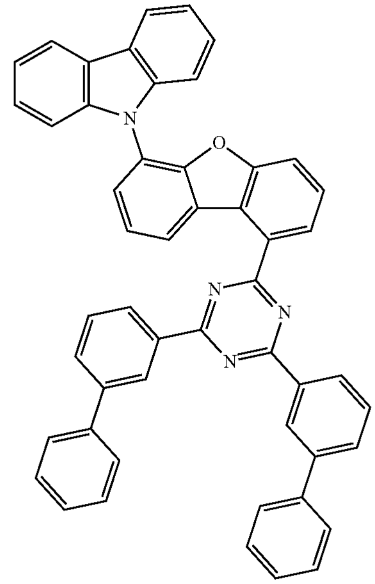
258
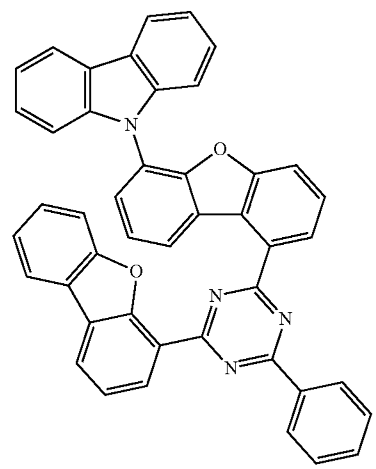
259
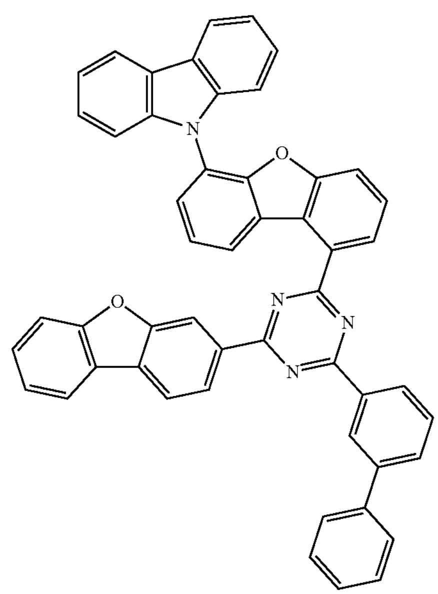

-continued
260
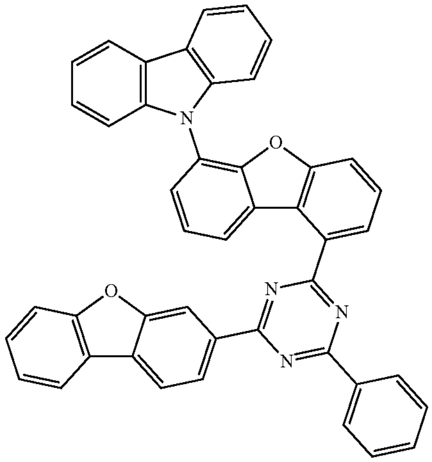
261
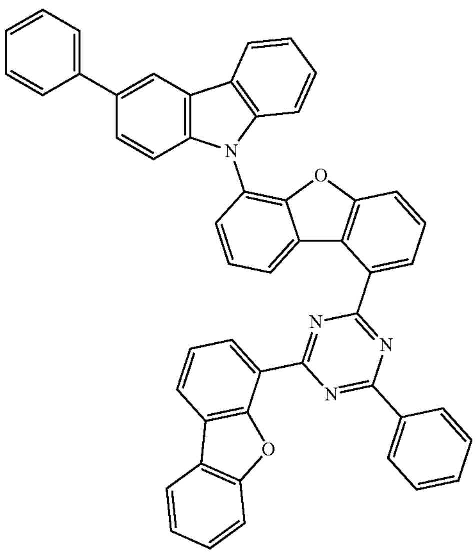
262
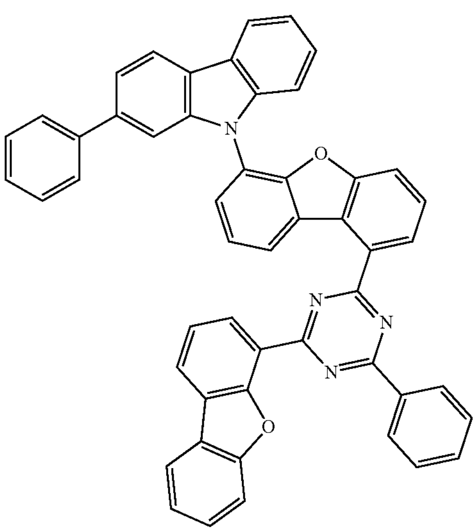
-continued
263
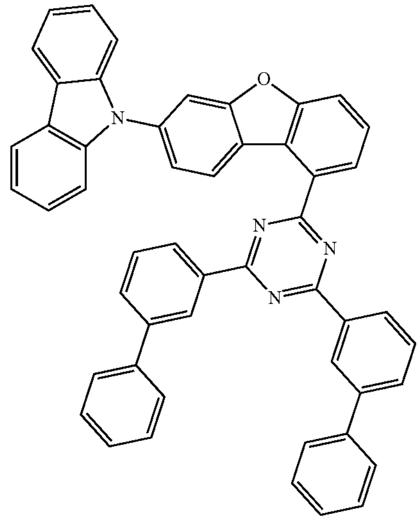
264
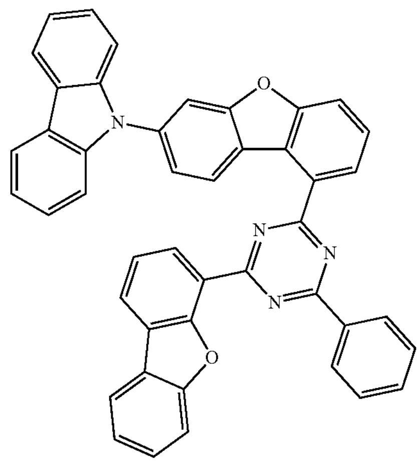
265
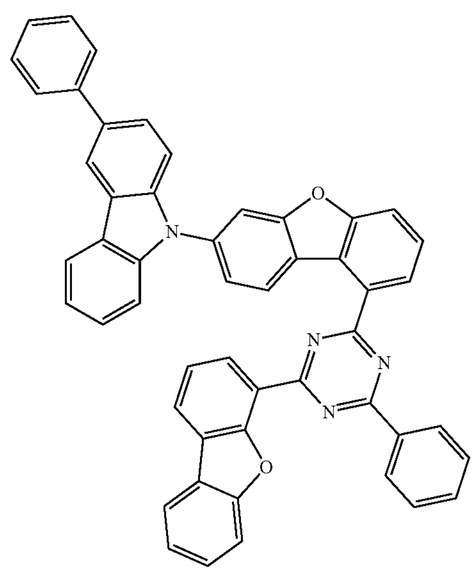

266
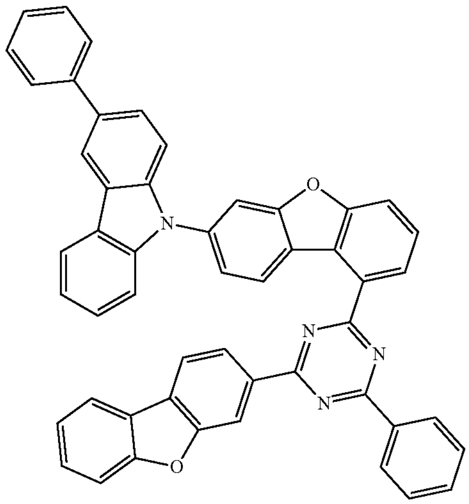
267
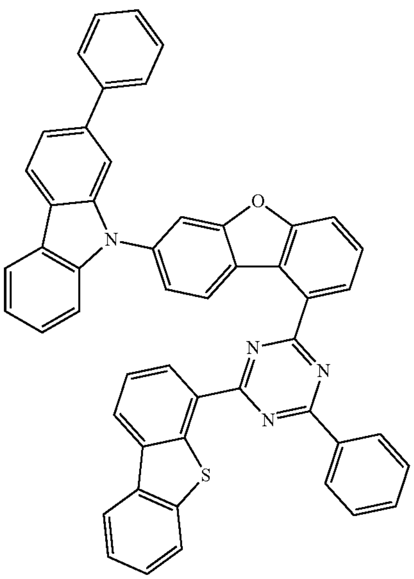
268
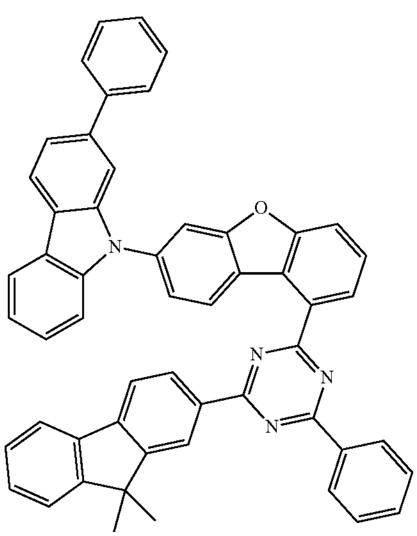
269
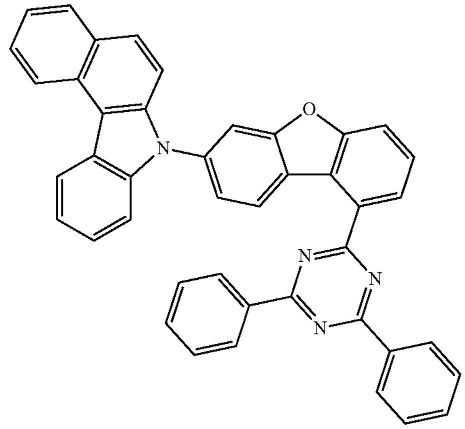
270
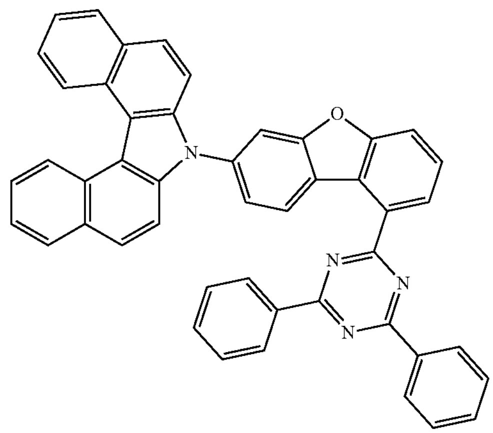
271
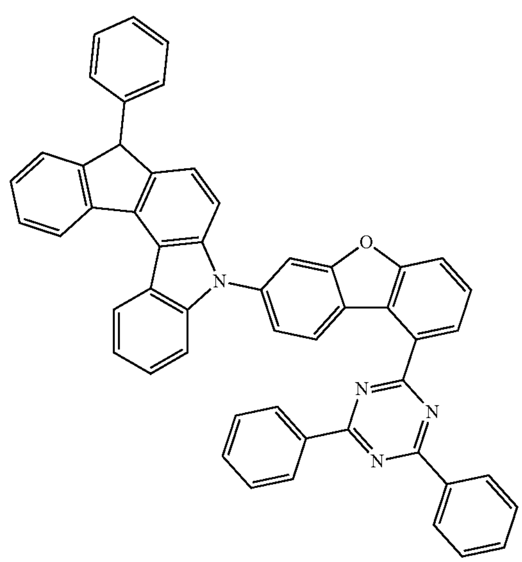

-continued
272
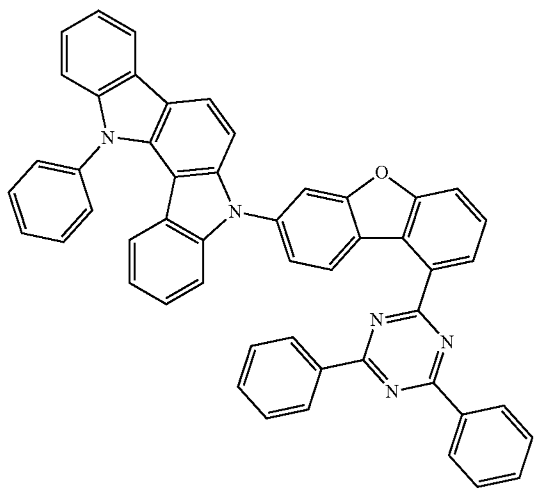
273
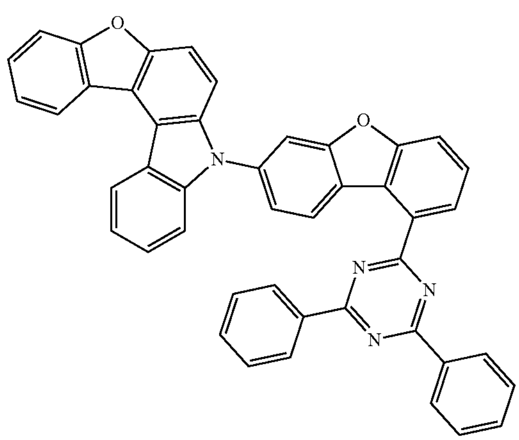
274
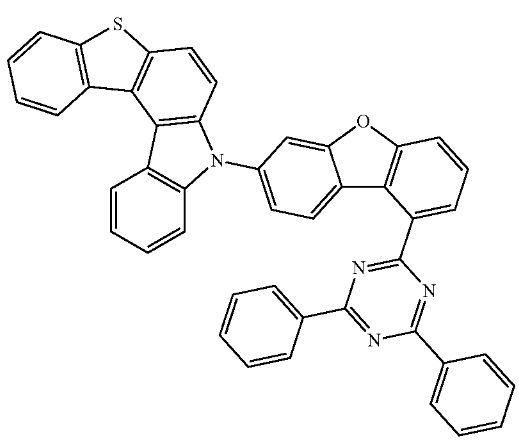
-continued
275
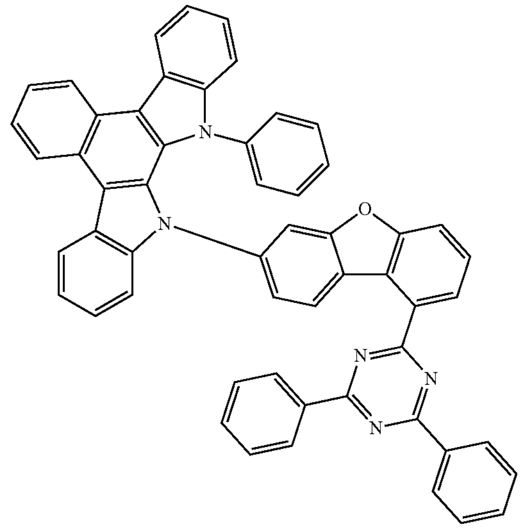
276
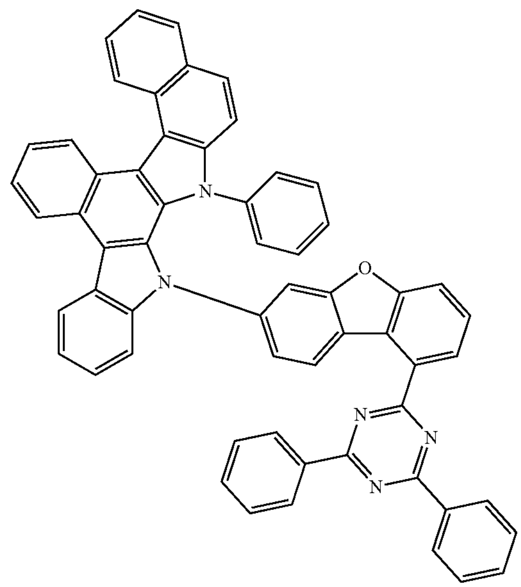
277
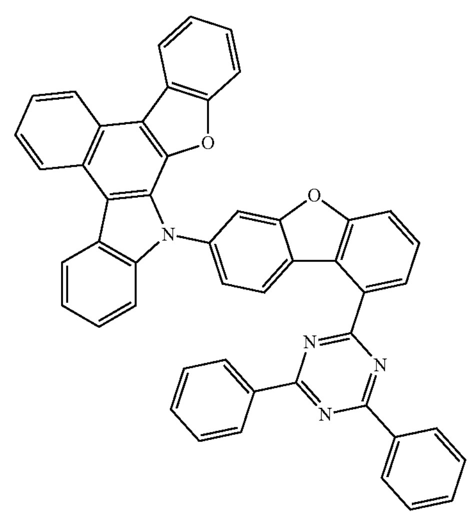

-continued
278
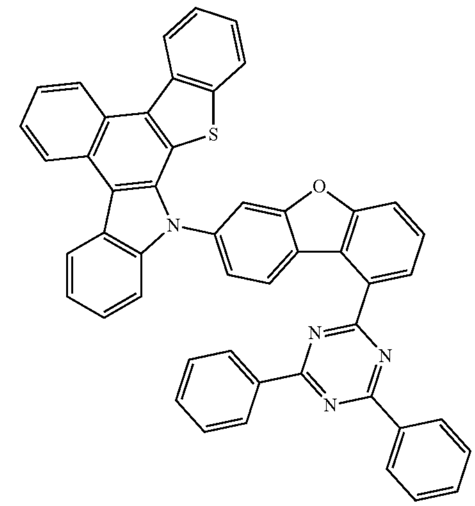
279
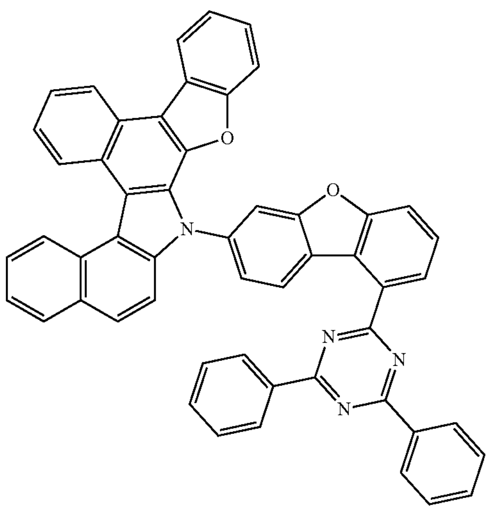
280
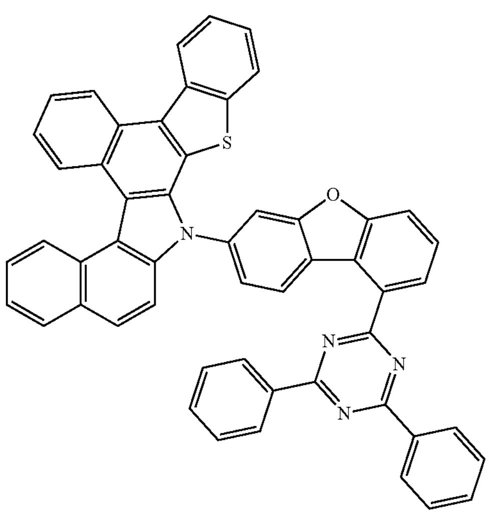
-continued
281
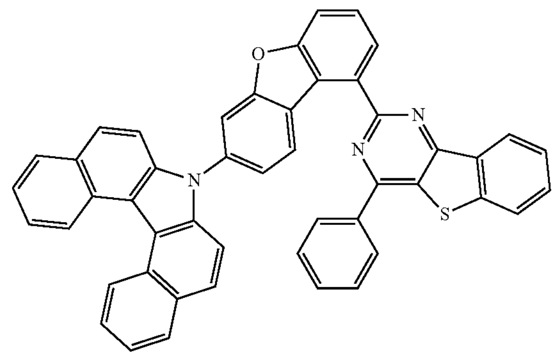
282
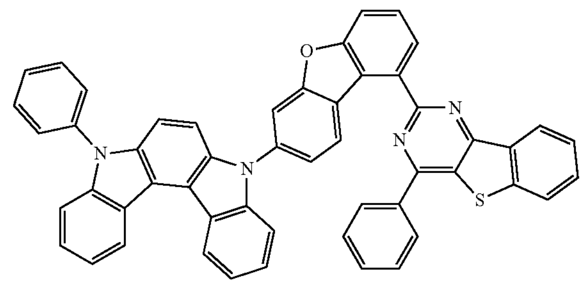
283
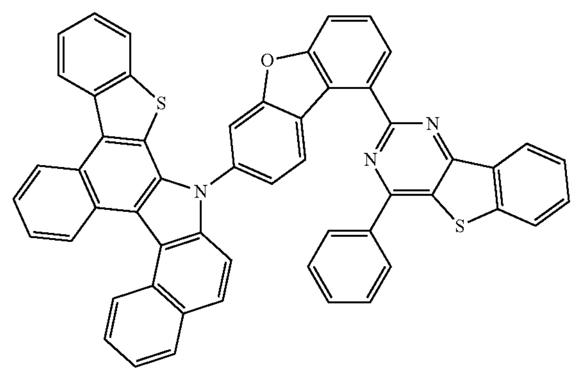
284
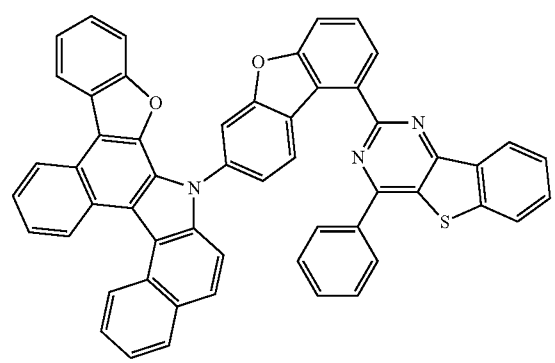

285
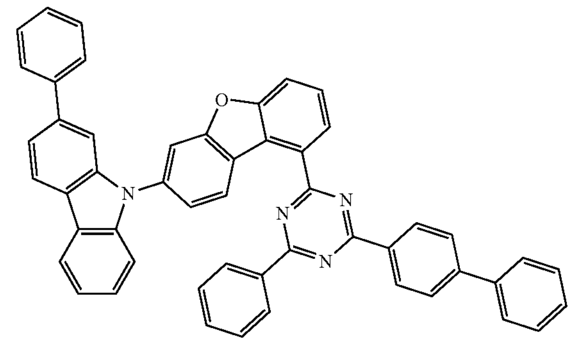
286
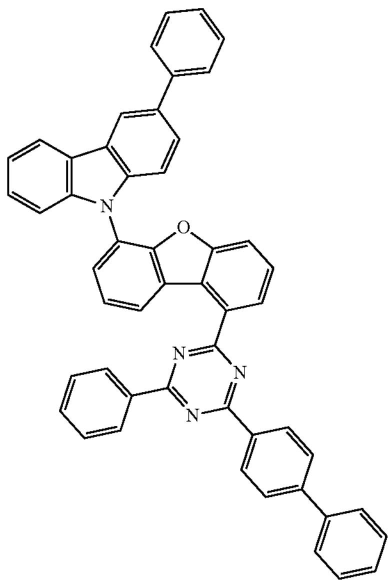
In one embodiment of the present application, Chemical Formula 24 may be represented by any one of the following compounds, but is not limited thereto.
1
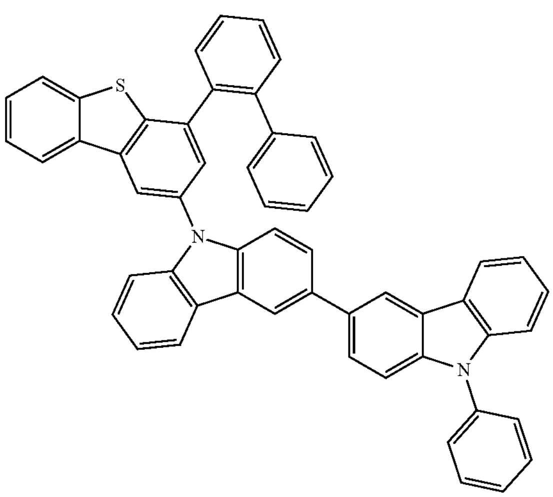
2
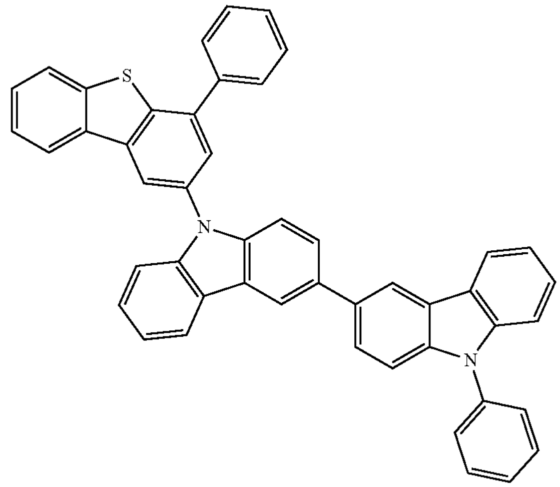
3
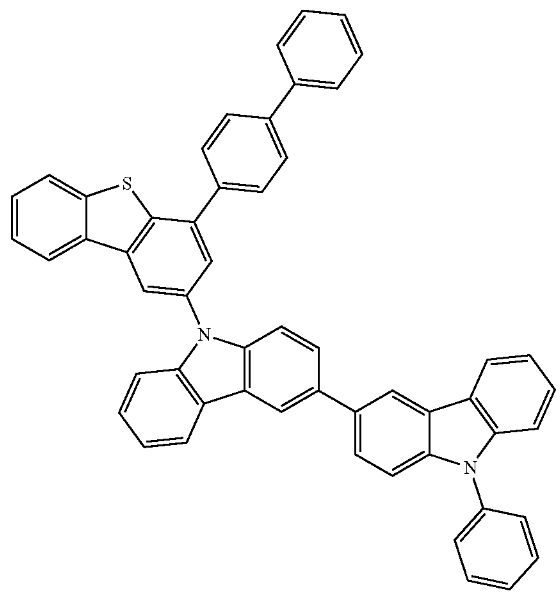
4
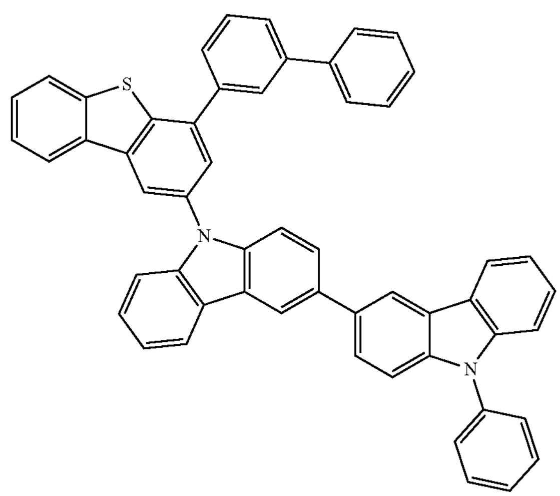

-continued
5
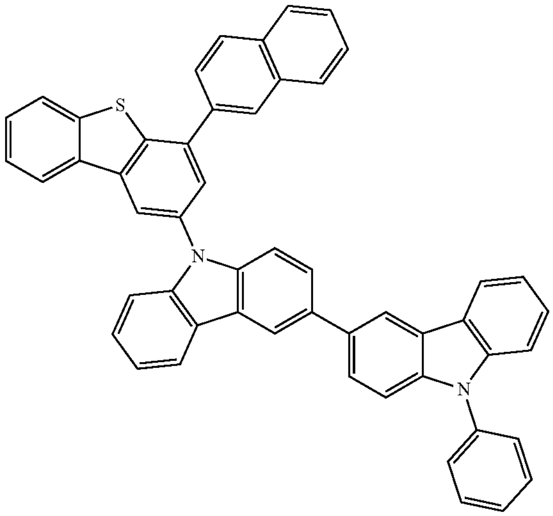
6
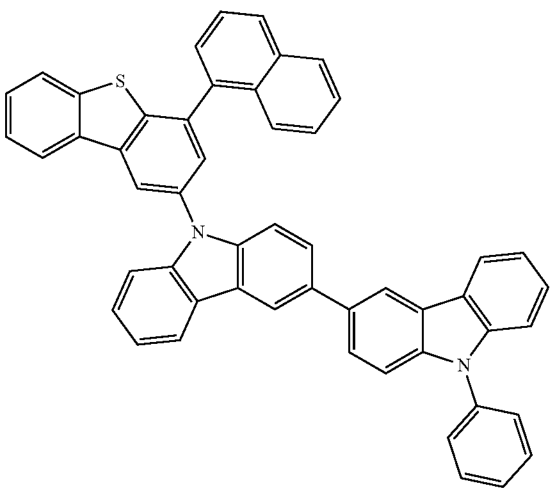
7
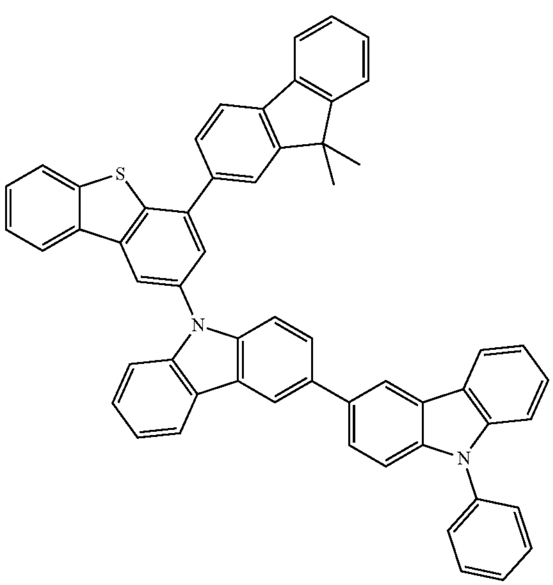
-continued
8
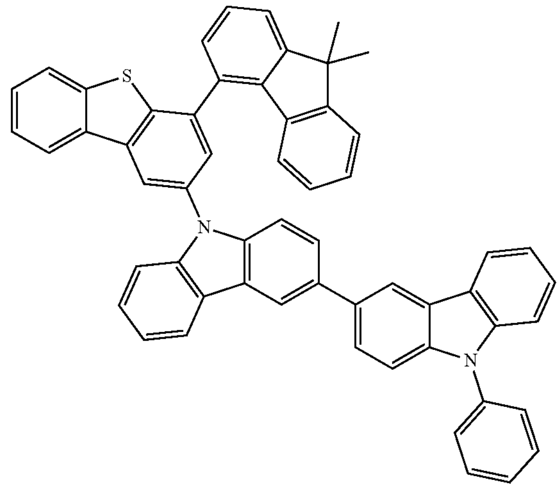
9
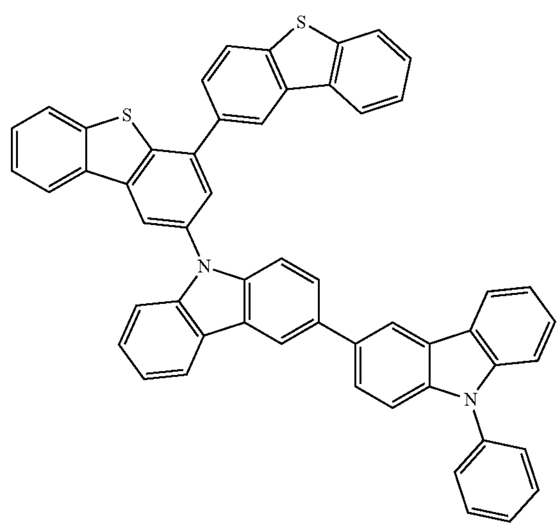
10
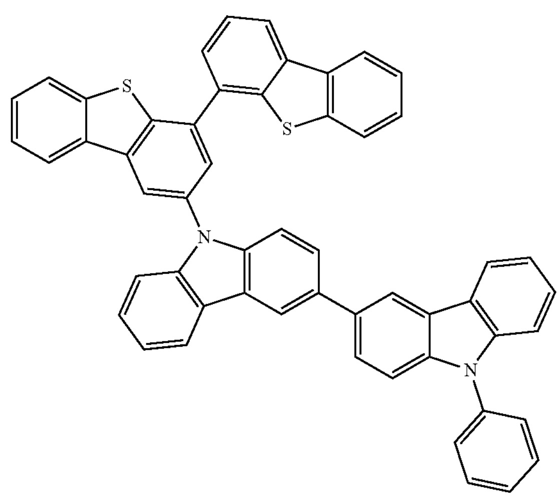

-continued
11
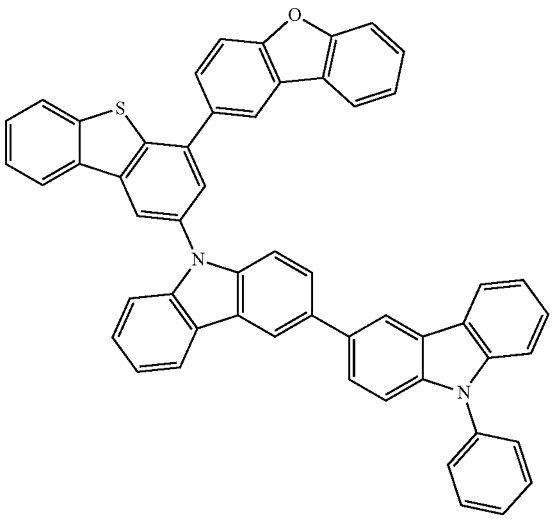
12
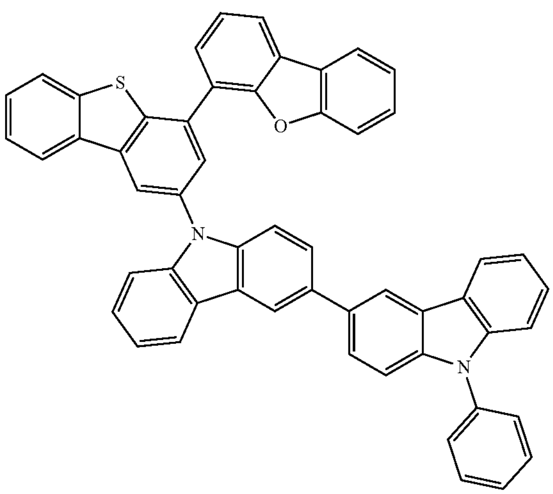
13
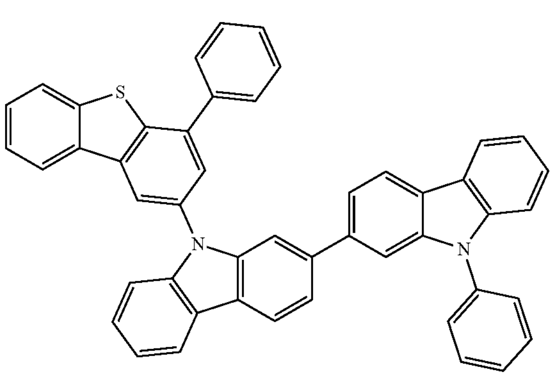
-continued
14
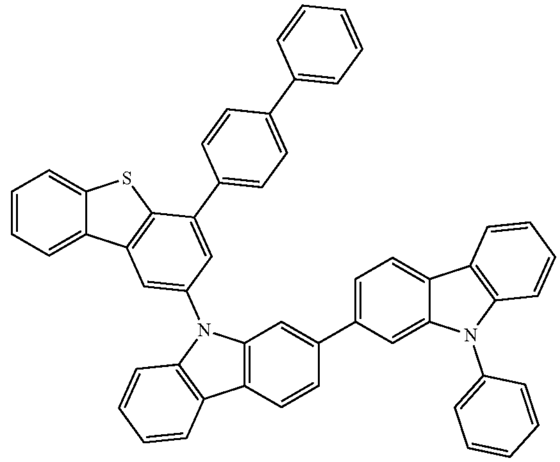
15
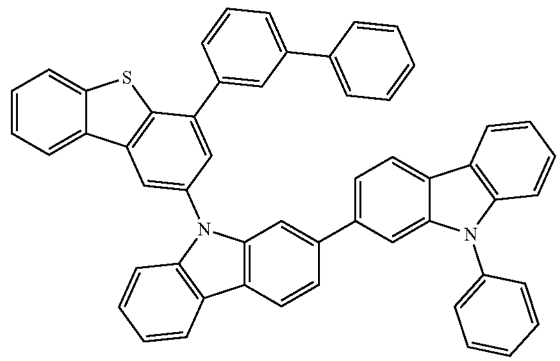
16
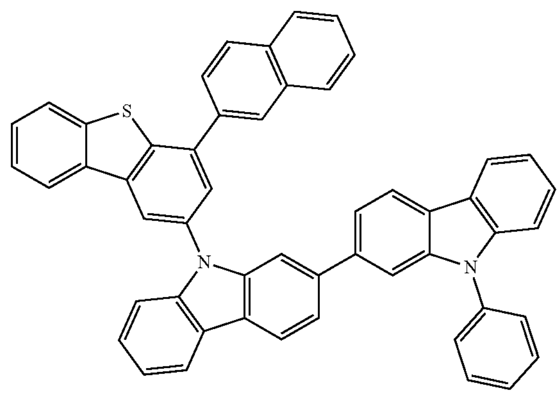
17
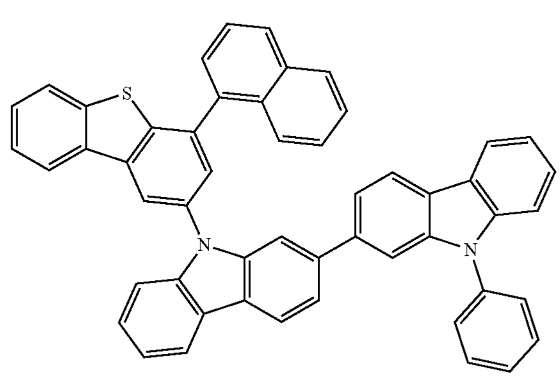

-continued
18
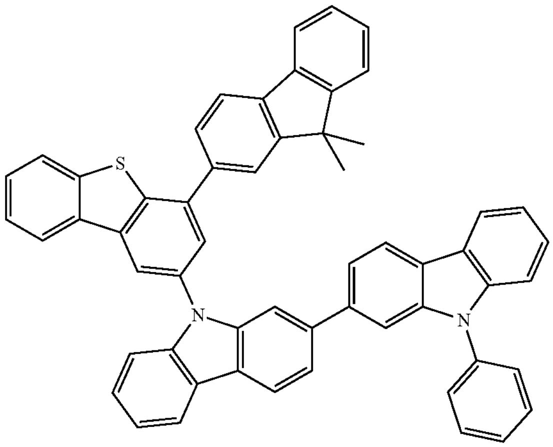
19
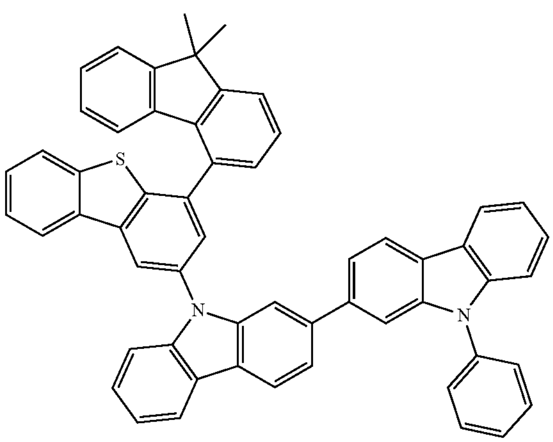
20
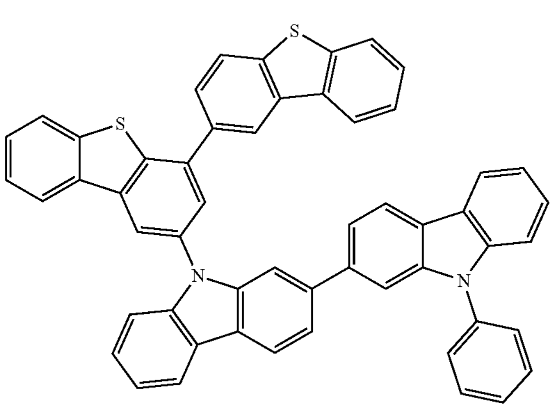
-continued
21
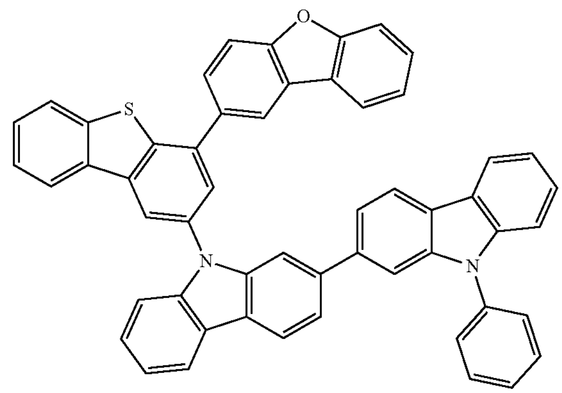
22
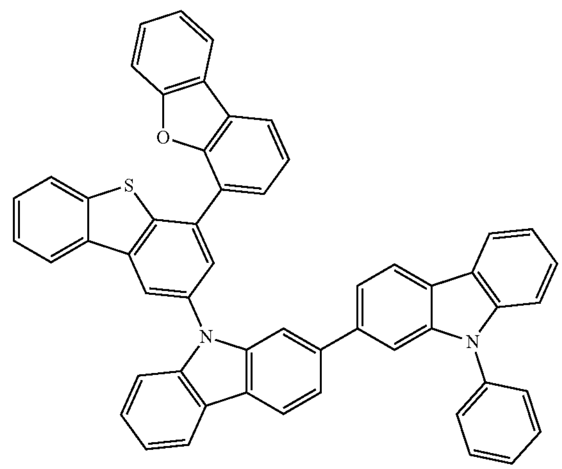
23
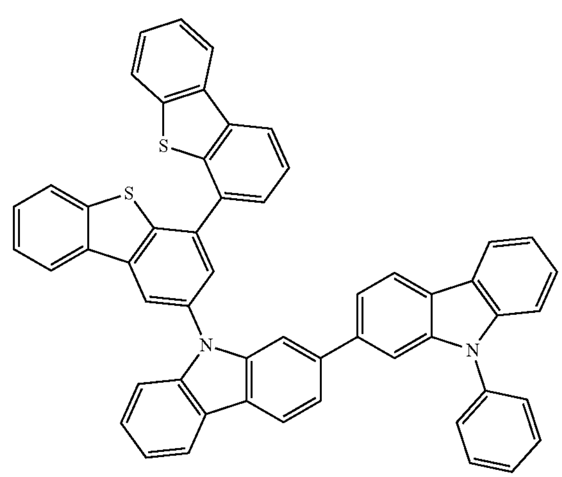

-continued
24
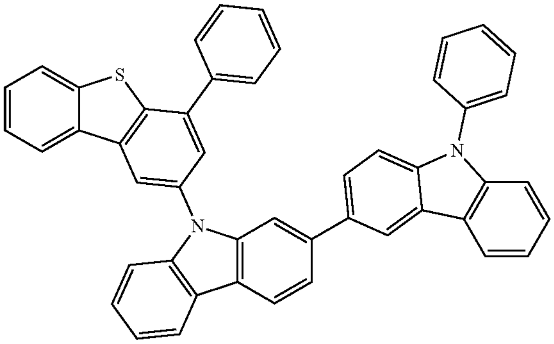
25
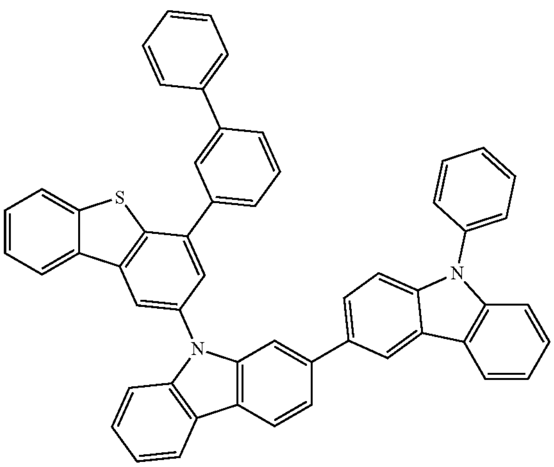
26
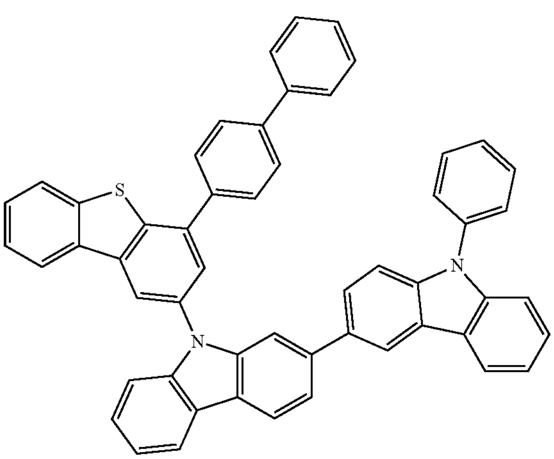
-continued
27
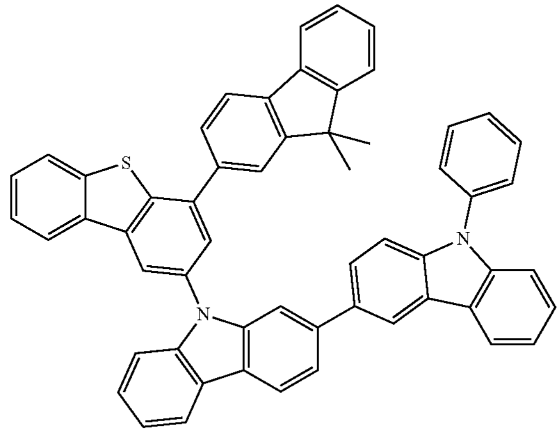
28
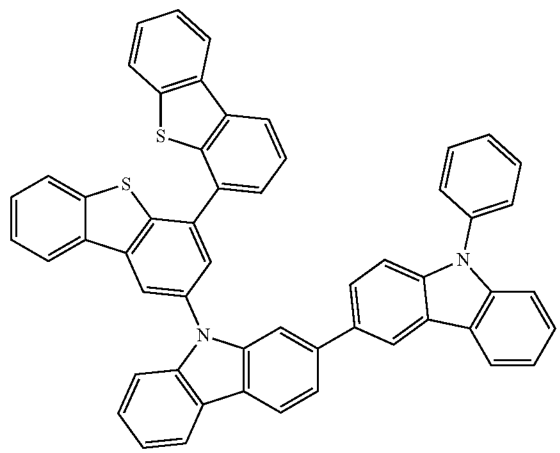
29
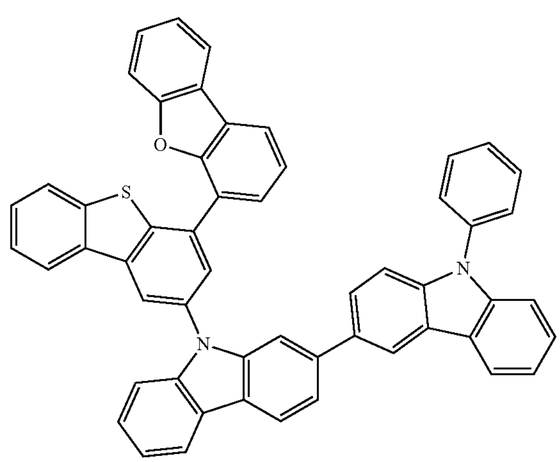

-continued
30
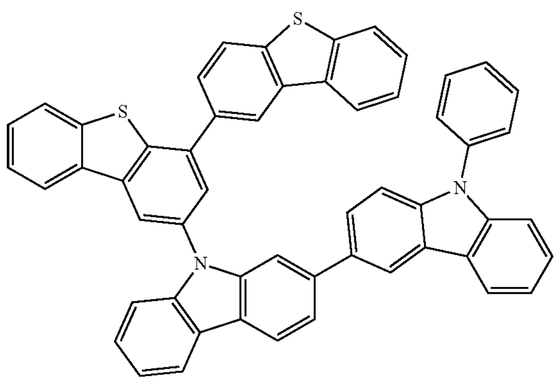
31
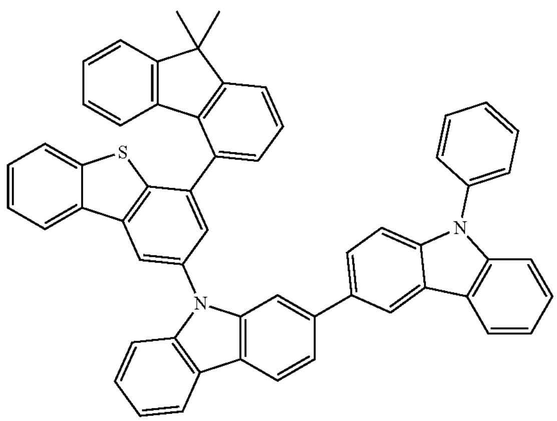
32
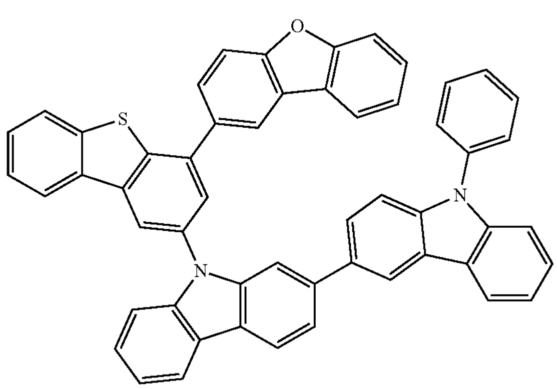
33
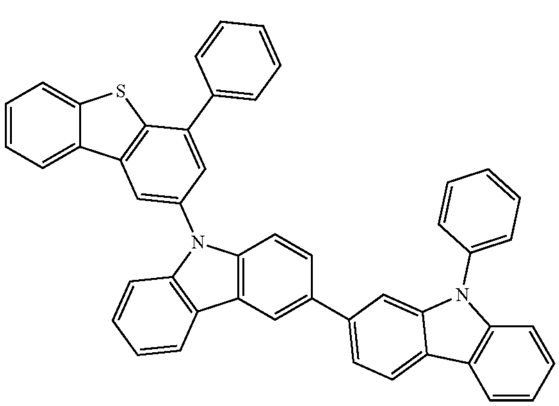
-continued
34
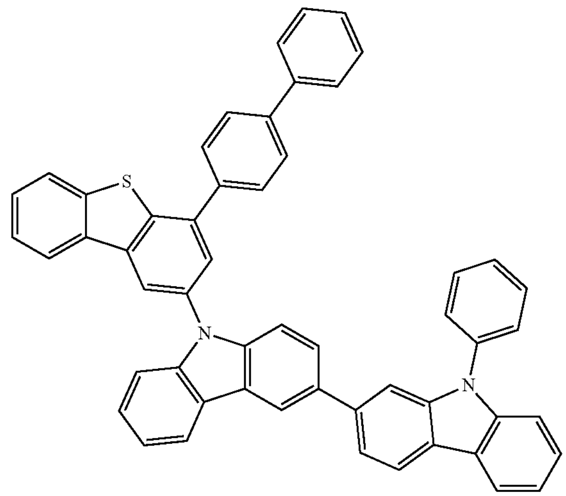
35
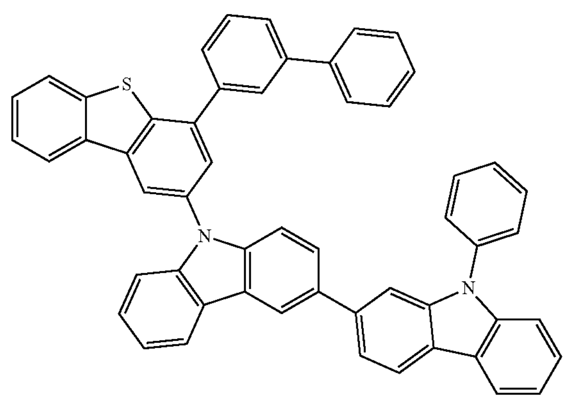
36
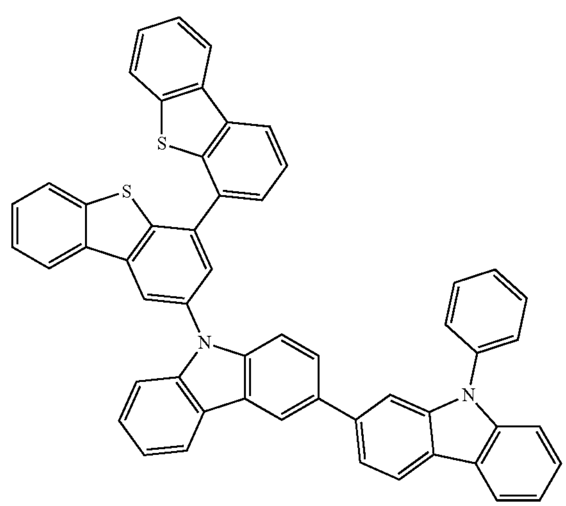

-continued
37
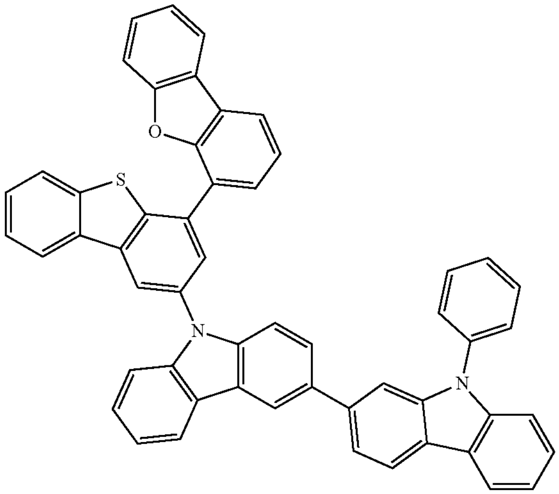
38
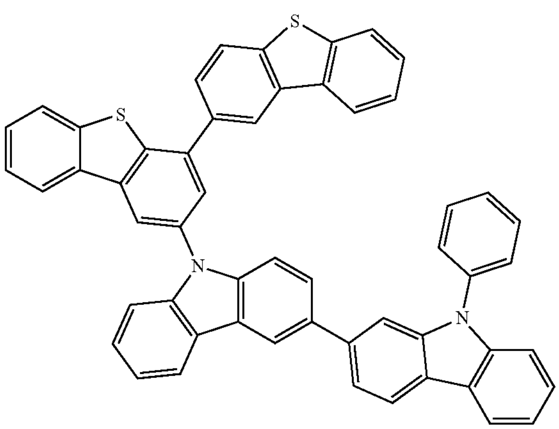
39
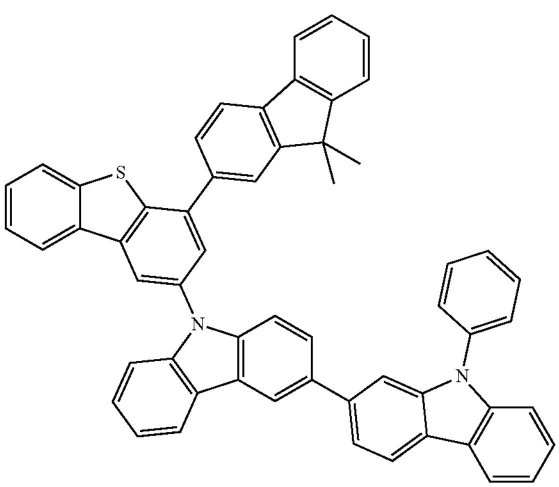
-continued
40
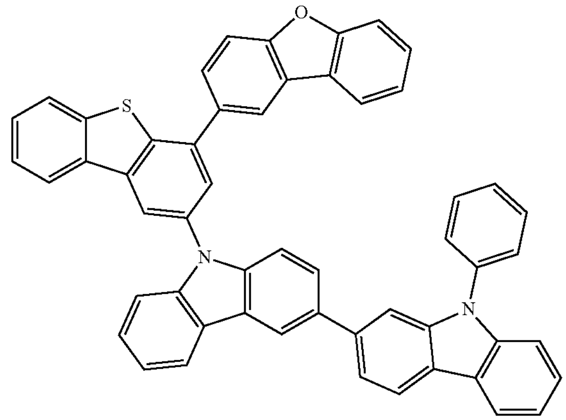
41
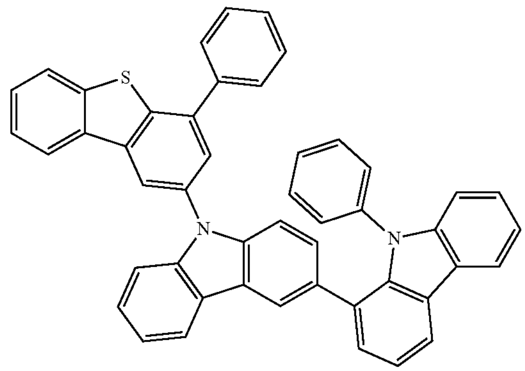
42
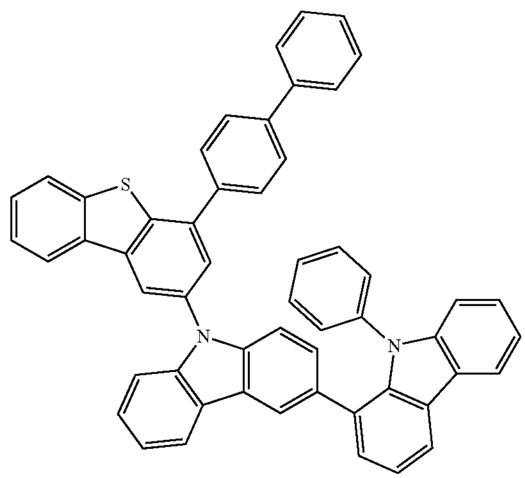
43
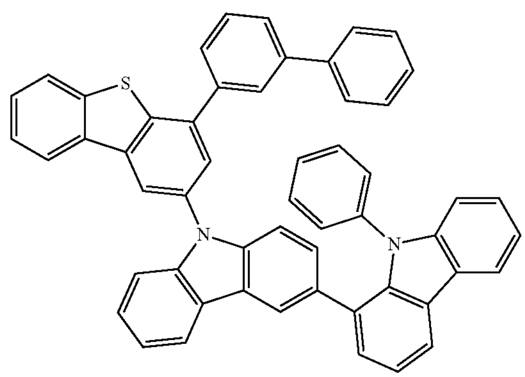

44
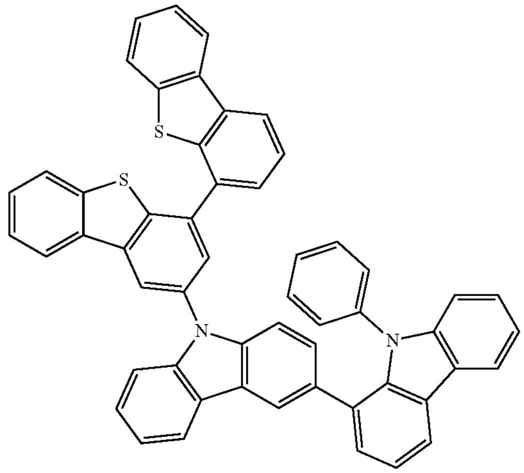
45
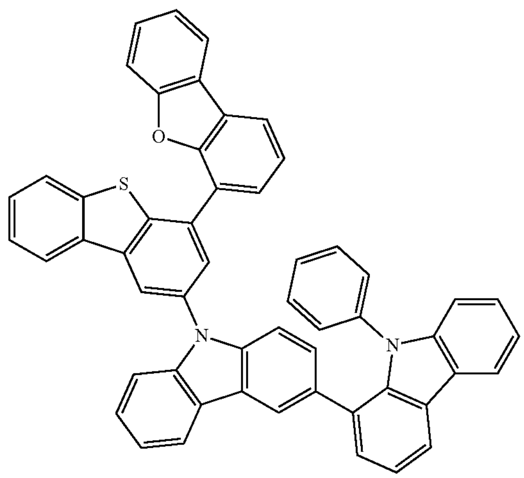
46
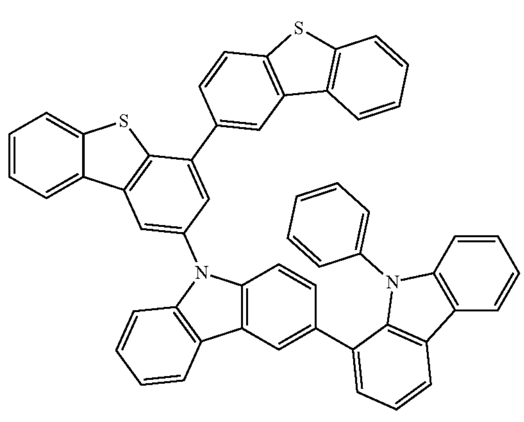
47
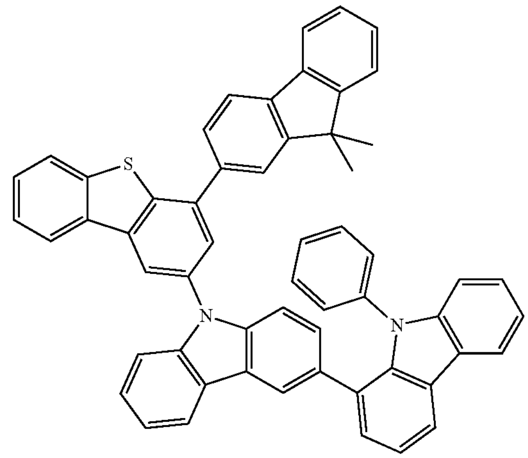
48
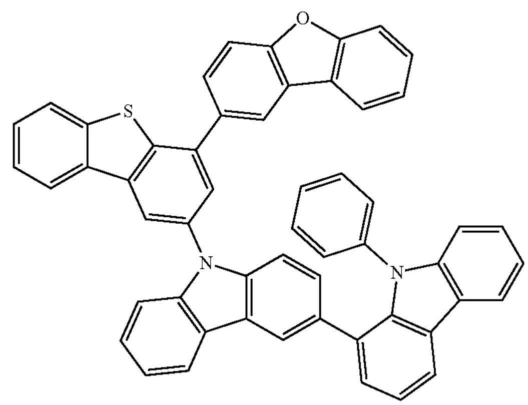
49
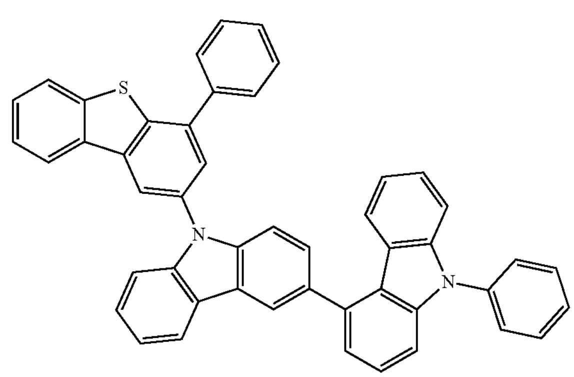

-continued
50
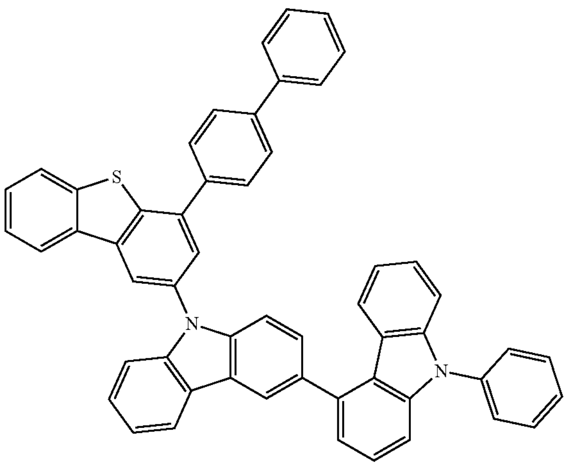
51
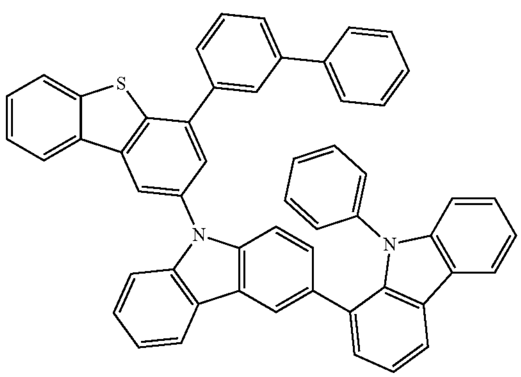
52
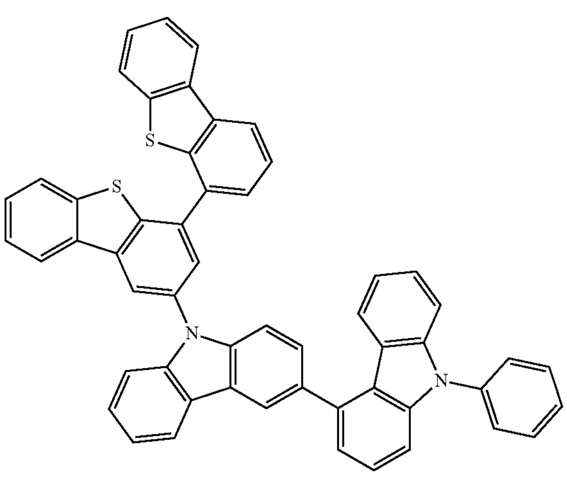
-continued
53
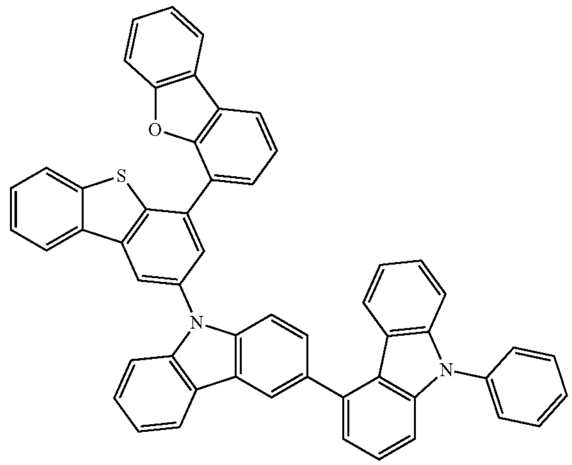
54
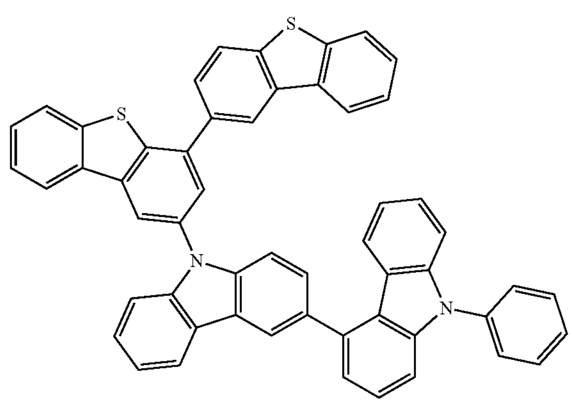
55
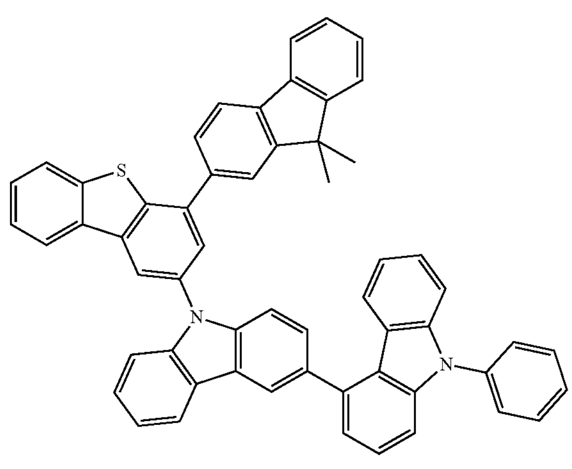

-continued
56
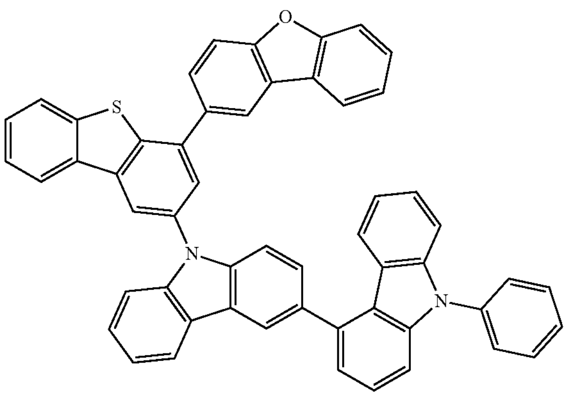
57
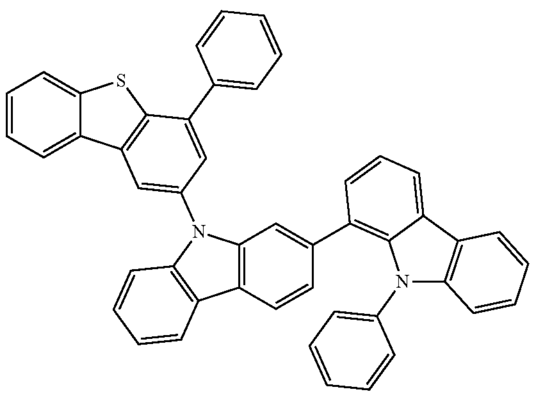
58
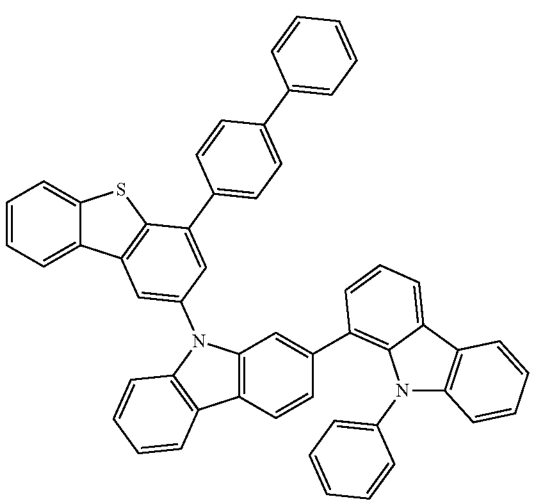
-continued
59
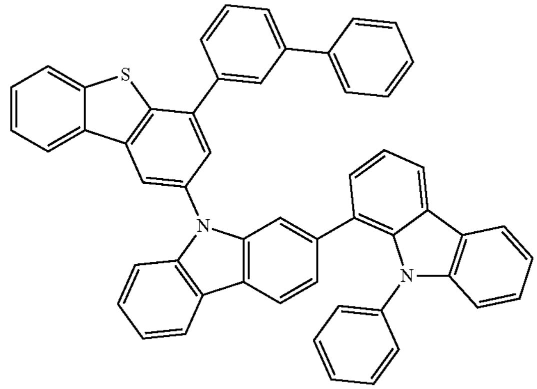
60
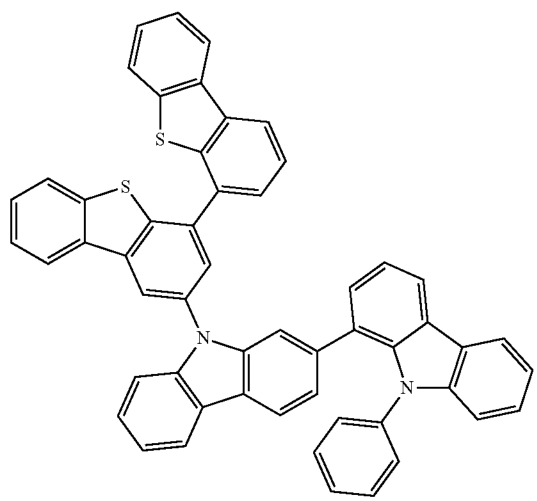
61
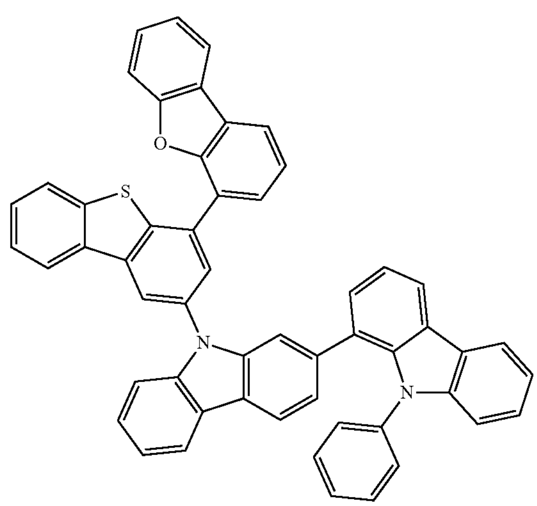

-continued
62
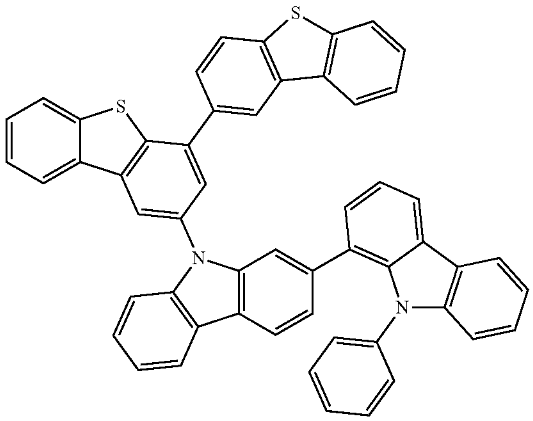
63
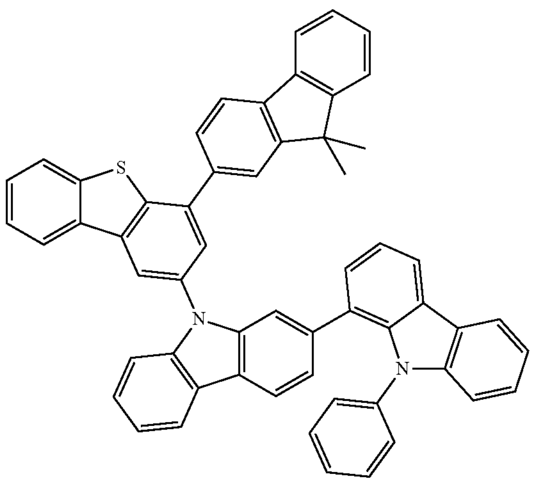
64
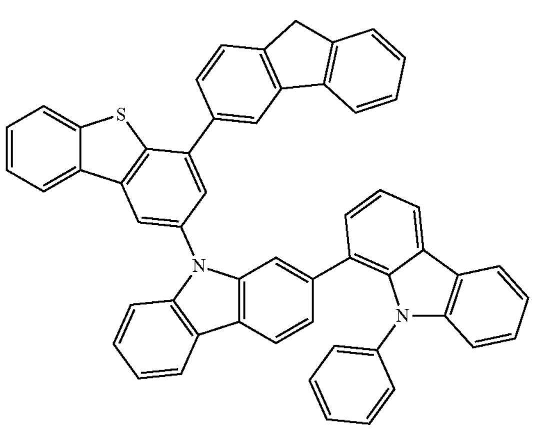
-continued
65
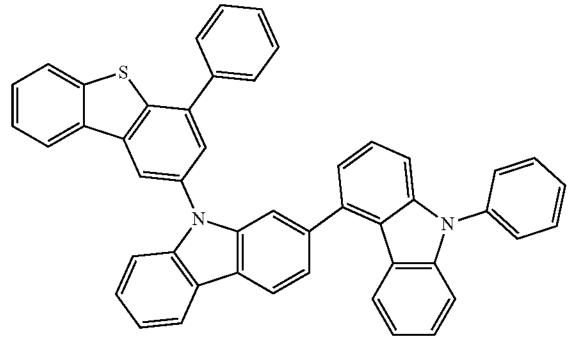
66
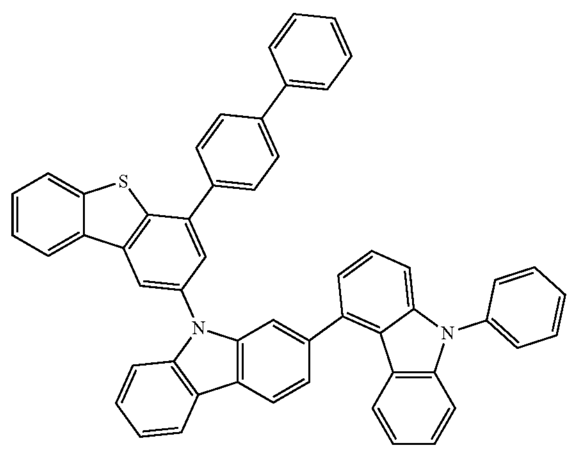
67
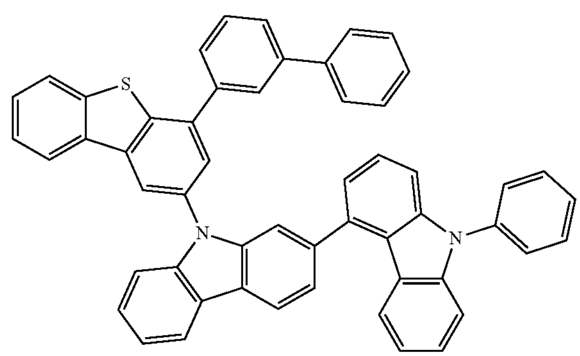

-continued
68
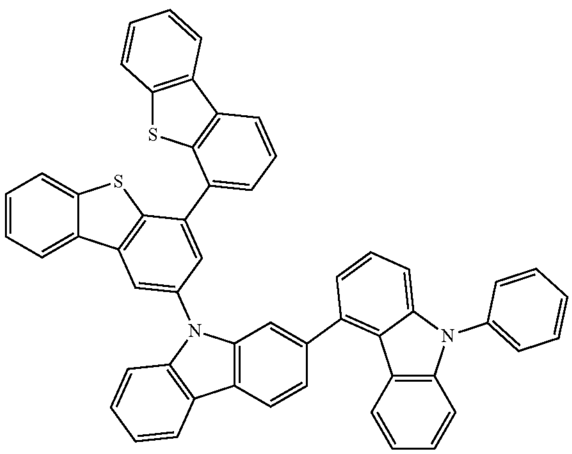
69
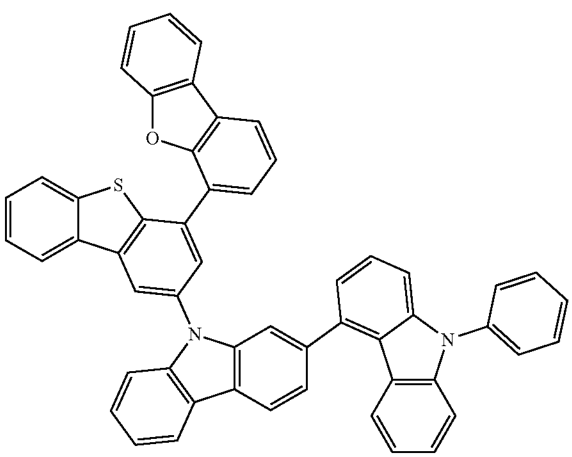
70
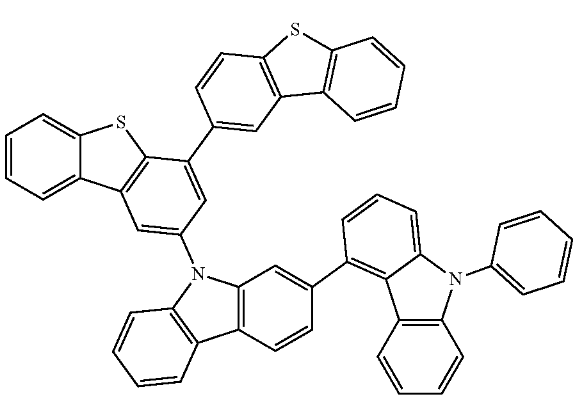
-continued
71
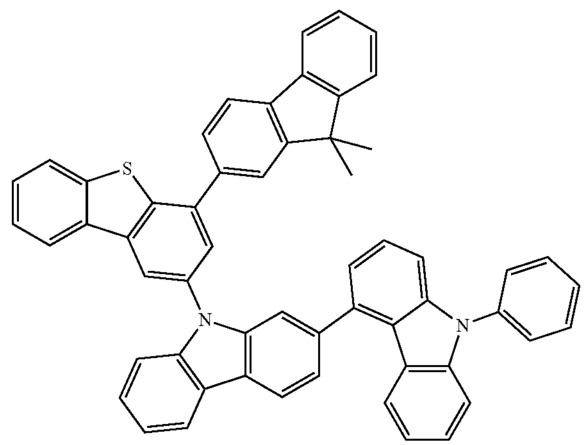
72
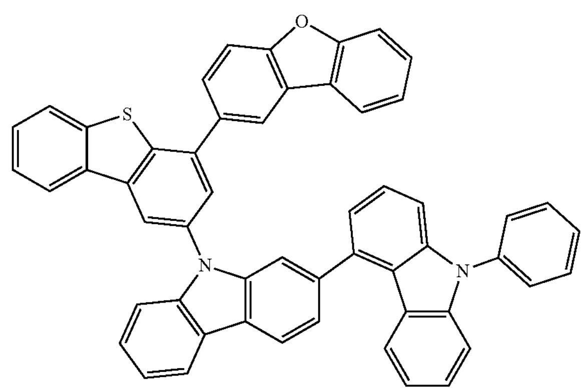
73
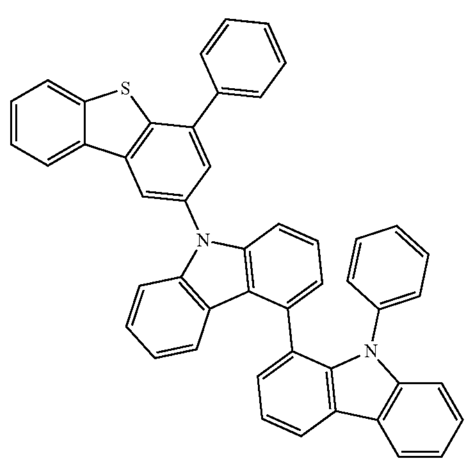

-continued
74
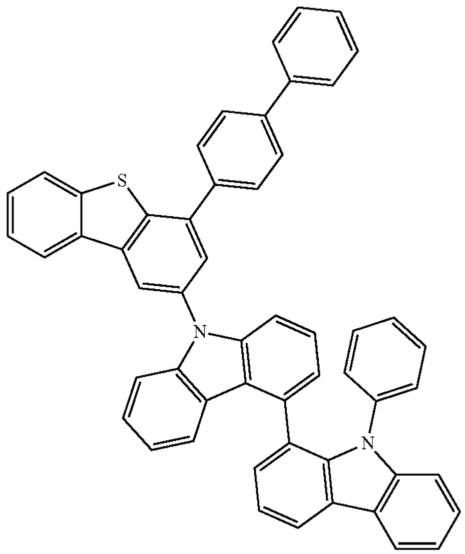
75
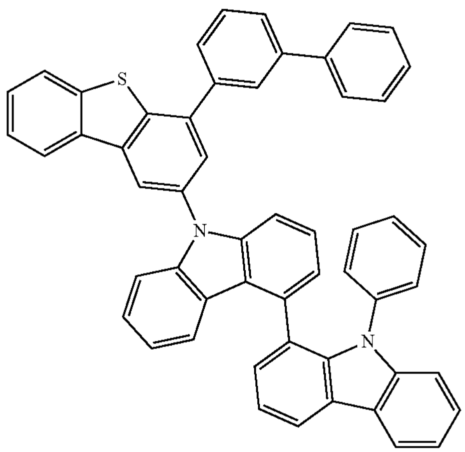
76
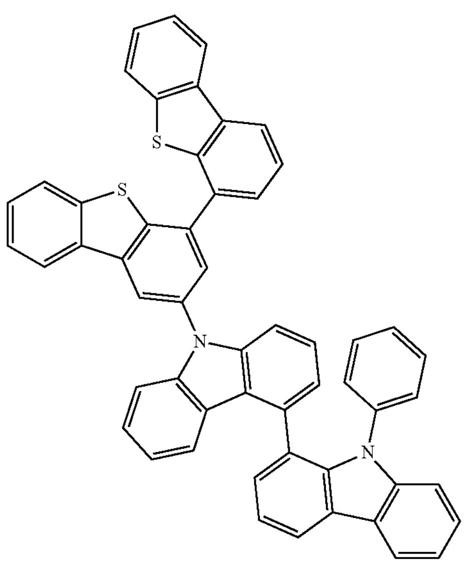
-continued
77
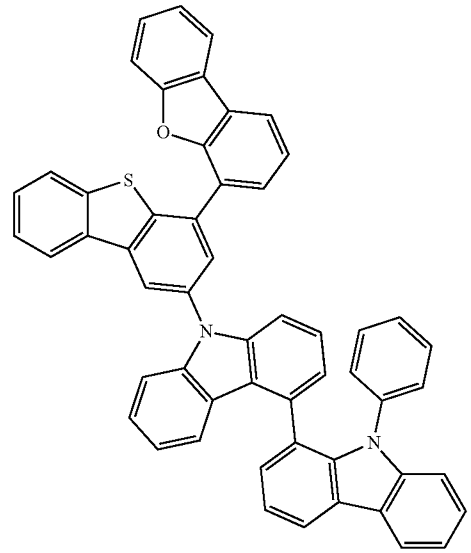
78
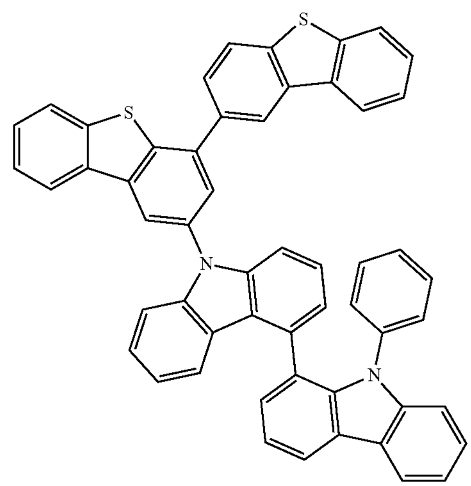
79
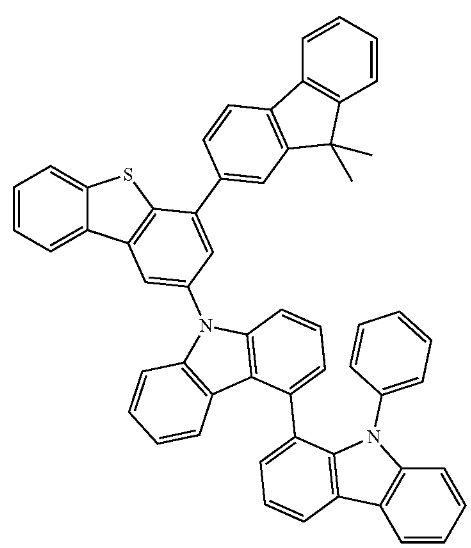

-continued
80
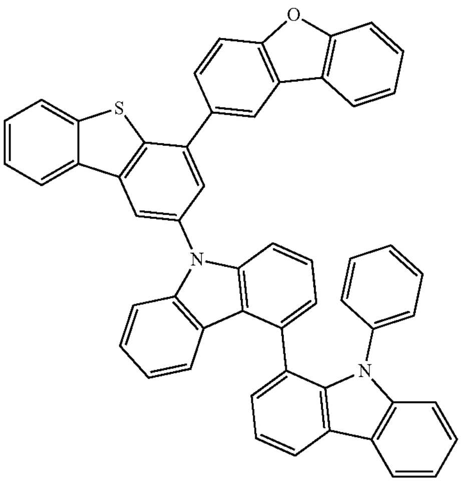
81
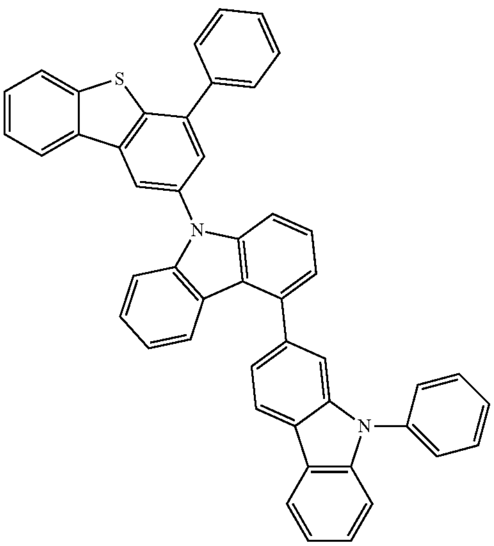
82
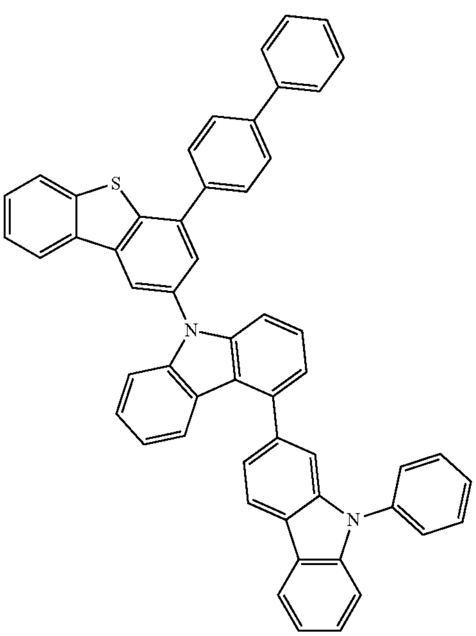
-continued
83
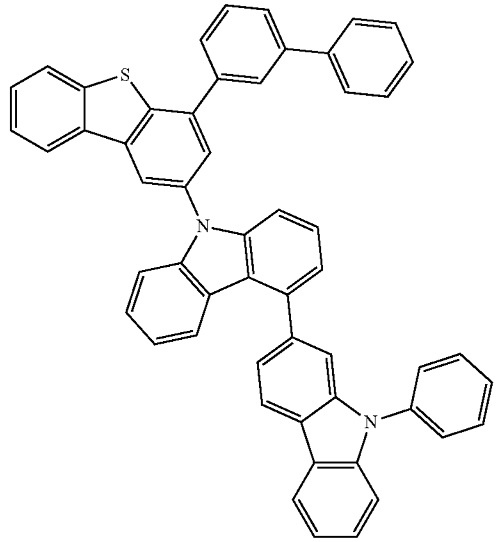
84
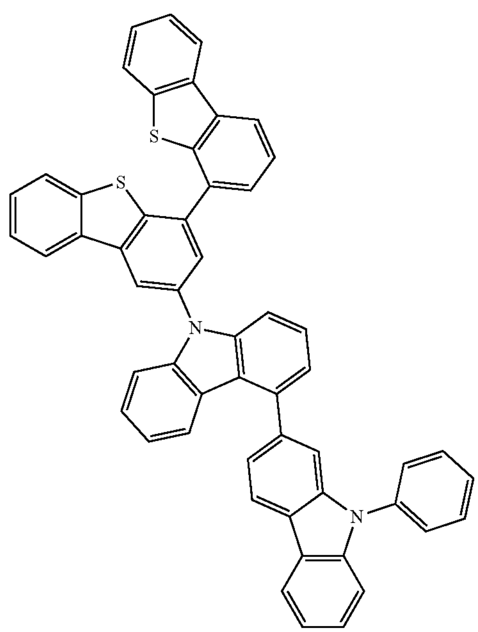

-continued
85
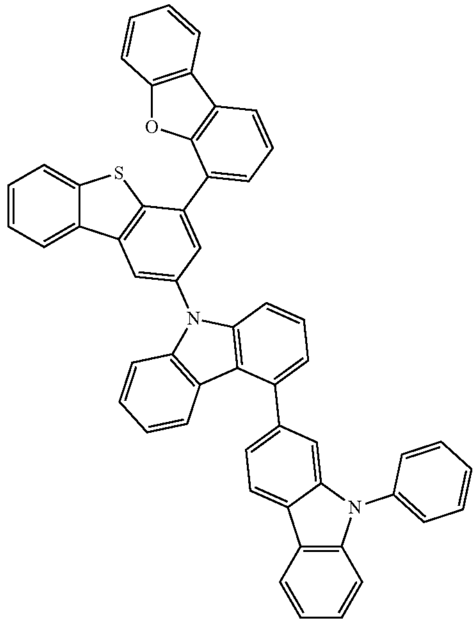
86
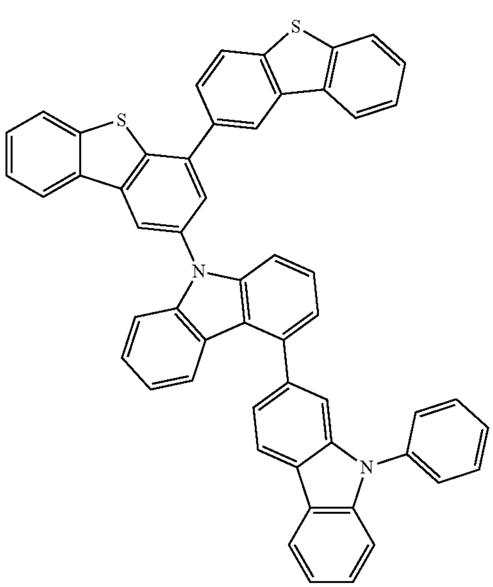
-continued
87
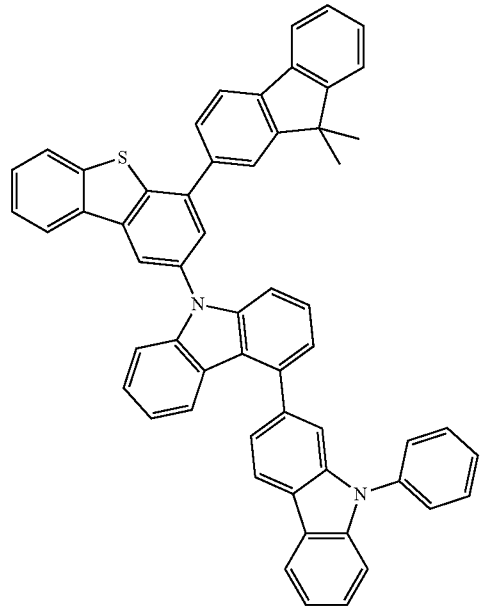
88
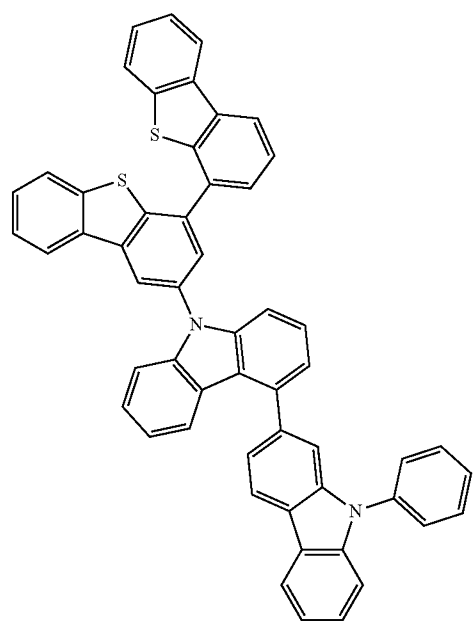

-continued
89
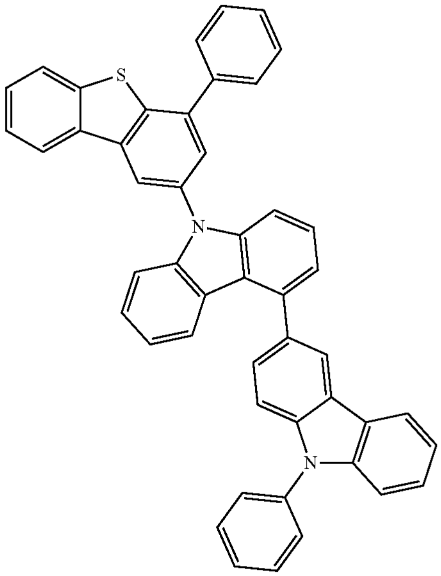
90
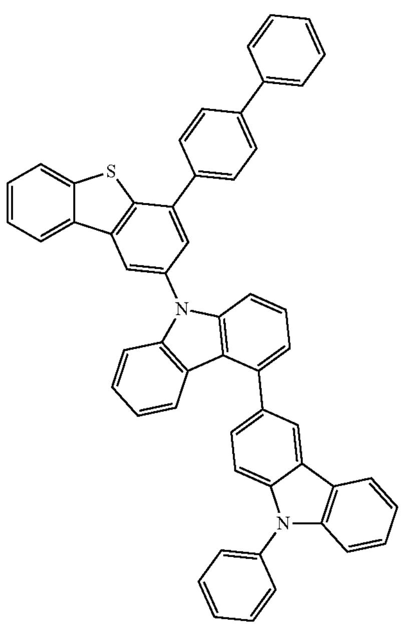
-continued
91
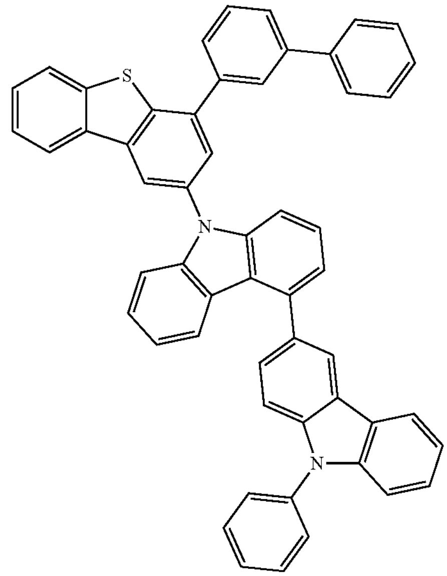
92
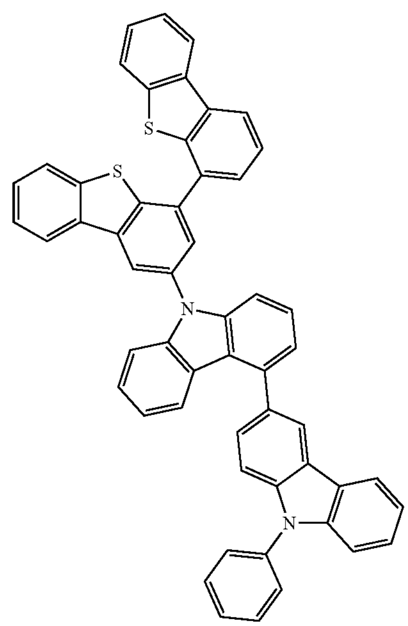

-continued
93
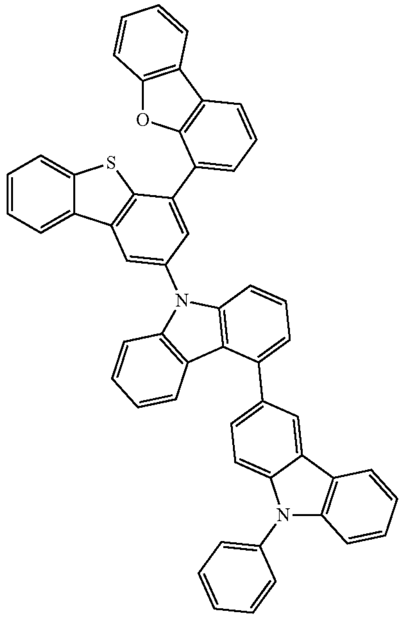
94
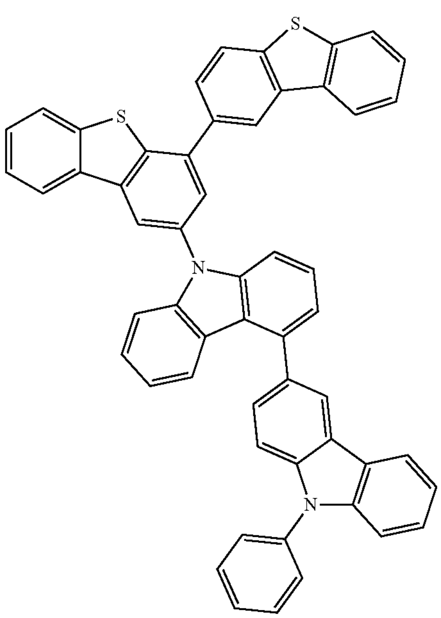
-continued
95
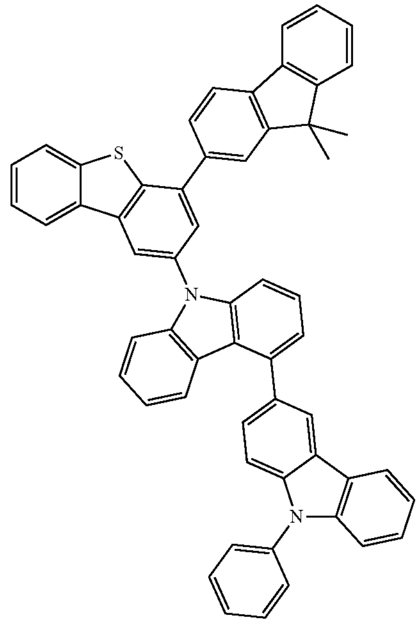
96
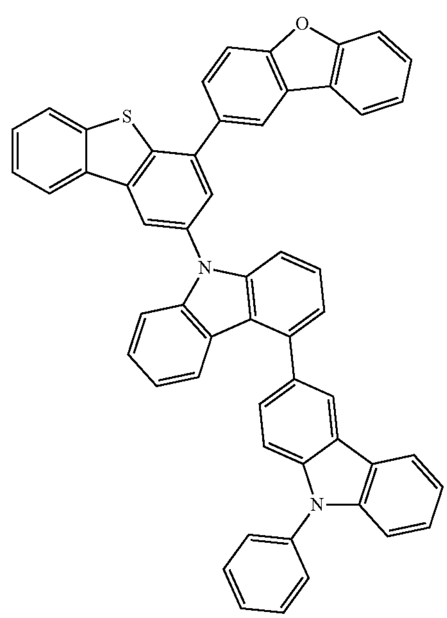

-continued
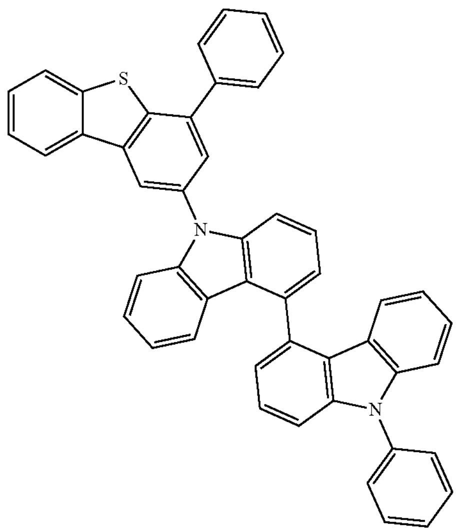
97
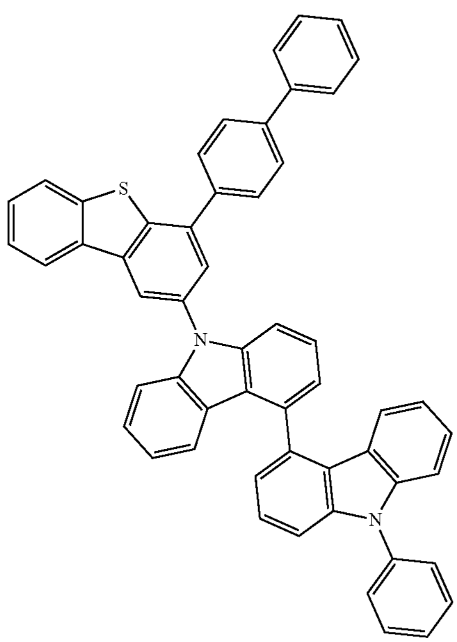
98
-continued
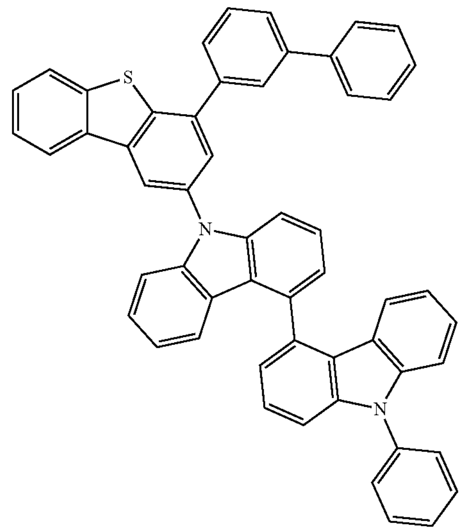
99
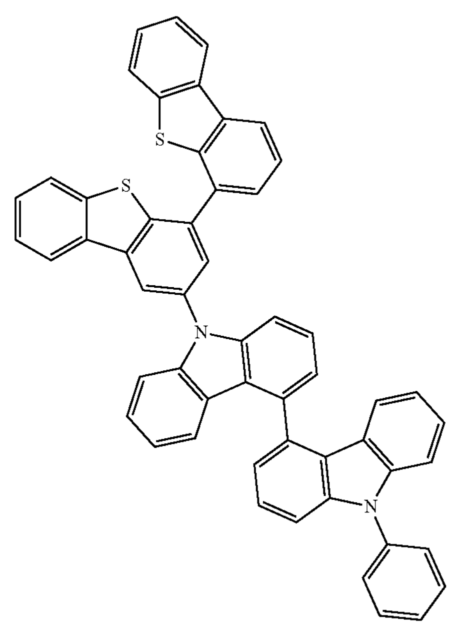
100

-continued

101

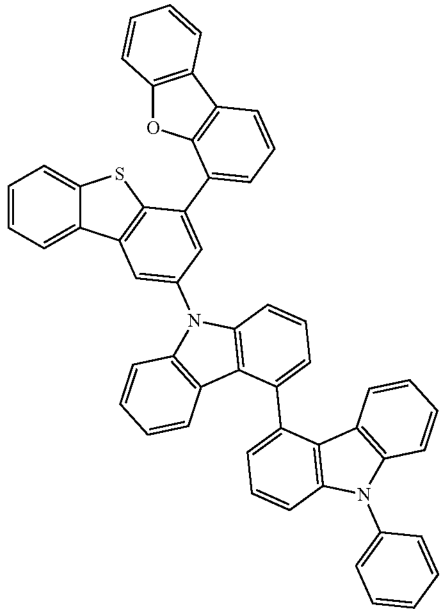

102

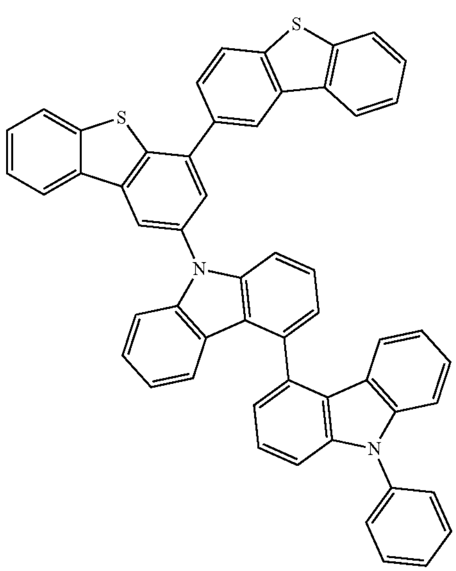

-continued

103

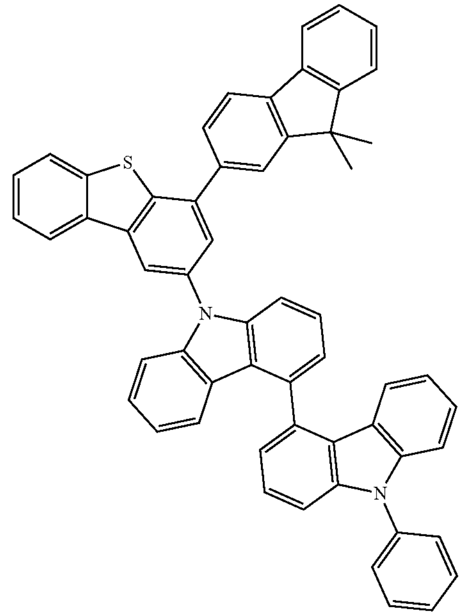

104

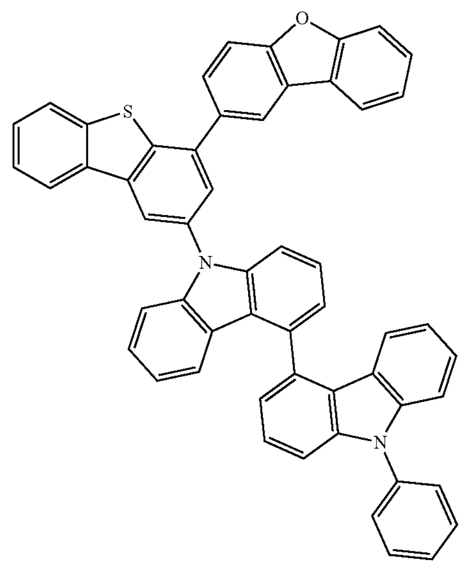

In addition, by introducing various substituents to the structures of Chemical Formulae 1 and 24, compounds having unique properties of the introduced substituents may be synthesized. For example, by introducing substituents normally used as hole injection layer materials, hole transfer layer materials, light emitting layer materials, electron transfer layer materials and charge generation layer materials used for manufacturing an organic light emitting device to the core structure, materials satisfying conditions required for each organic material layer may be synthesized.

In addition, by introducing various substituents to the structures of Chemical Formulae 1 and 24, the energy band gap may be finely controlled, and meanwhile, properties at interfaces between organic materials are enhanced, and material applications may become diverse.

Meanwhile, the heterocyclic compound has a high glass transition temperature (Tg), and has excellent thermal stability. Such an increase in the thermal stability becomes an important factor providing driving stability to a device.

The heterocyclic compound according to one embodiment of the present application may be prepared using a multi-step chemical reaction. Some intermediate compounds are prepared first, and from the intermediate compounds, the compound of Chemical Formula 1 or 24 may be prepared. More specifically, the heterocyclic compound according to one embodiment of the present application may be prepared based on preparation examples to describe later.

In addition, another embodiment of the present application provides a composition for an organic material layer of an organic light emitting device, the composition comprising the heterocyclic compound represented by Chemical Formula 1 and the heterocyclic compound represented by Chemical Formula 24.

Specific details on the heterocyclic compound represented by Chemical Formula 1 and the heterocyclic compound represented by Chemical Formula 24 are the same as the descriptions provided above.

In the composition, the heterocyclic compound represented by Chemical Formula 1: the heterocyclic compound represented by Chemical Formula 24 may have a weight ratio of 1:10 to 10:1, 1:8 to 8:1, 1:5 to 5:1, or 1:2 to 2:1, however, the weight ratio is not limited thereto.

The composition may be used when forming an organic material of an organic light emitting device, and particularly, may be more preferably used when forming a host of a light emitting layer.

The composition has a form of simply mixing two or more of the compounds, and materials in a powder form may be mixed before forming an organic material layer of an organic light emitting device, or compounds in a liquid state may be mixed at a temperature above a proper temperature. The composition is in a solid state below a melting point of each of the materials, and may be maintained in a liquid state by adjusting a temperature.

The composition may further comprise materials known in the art such as a solvent and an additive.

The organic light emitting device according to one embodiment of the present application may be manufactured using common organic light emitting device manufacturing methods and materials except that one or more organic material layers are formed using the heterocyclic compound represented by Chemical Formula 1 and the heterocyclic compound represented by Chemical Formula 24 described above.

The compound represented by Chemical Formula 1 and the heterocyclic compound represented by Chemical Formula 24 may be formed into an organic material layer through a solution coating method as well as a vacuum deposition method when manufacturing the organic light emitting device. Herein, the solution coating method means spin coating, dip coating, inkjet printing, screen printing, a spray method, roll coating and the like, but is not limited thereto.

The organic material layer of the organic light emitting device of the present disclosure may be formed in a single layer structure, or may also be formed in a multilayer structure in which two or more organic material layers are laminated. For example, the organic light emitting device according to one embodiment of the present disclosure may have a structure comprising a hole injection layer, a hole transfer layer, a light emitting layer, an electron transfer layer, an electron injection layer and the like as the organic material layer. However, the structure of the organic light emitting device is not limited thereto, and may comprise a smaller number of organic material layers.

Specifically, the organic light emitting device according to one embodiment of the present application comprises a first electrode, a second electrode, and one or more organic material layers provided between the first electrode and the second electrode, and one or more layers of the organic material layers comprise the heterocyclic compound represented by Chemical Formula 1 and the heterocyclic compound represented by Chemical Formula 24.

In one embodiment of the present application, the first electrode may be an anode, and the second electrode may be a cathode.

In another embodiment, the first electrode may be a cathode, and the second electrode may be an anode.

In one embodiment of the present application, the organic light emitting device may be a blue organic light emitting device, and the heterocyclic compound according to Chemical Formula 1 and the heterocyclic compound according to Chemical Formula 24 may be used as a material of the blue organic light emitting device.

In one embodiment of the present application, the organic light emitting device may be a green organic light emitting device, and the heterocyclic compound represented by Chemical Formula 1 and the heterocyclic compound represented by Chemical Formula 24 may be used as a material of the green organic light emitting device.

In one embodiment of the present application, the organic light emitting device may be a red organic light emitting device, and the heterocyclic compound represented by Chemical Formula 1 and the heterocyclic compound represented by Chemical Formula 24 may be used as a material of the red organic light emitting device.

The organic light emitting device of the present disclosure may further comprise one, two or more layers selected from the group consisting of a light emitting layer, a hole injection layer, a hole transfer layer, an electron injection layer, an electron transfer layer, an electron blocking layer and a hole blocking layer.

In the organic light emitting device provided in one embodiment of the present application, the organic material layer comprises at least one of a hole blocking layer, an electron injection layer and an electron transfer layer, and at least one of the hole blocking layer, the electron injection layer and the electron transfer layer comprises the heterocyclic compound represented by Chemical Formula 1 and the heterocyclic compound represented by Chemical Formula 24.

In the organic light emitting device provided in one embodiment of the present application, the organic material layer comprises a light emitting layer, and the light emitting layer comprises the heterocyclic compound represented by Chemical Formula 1 and the heterocyclic compound represented by Chemical Formula 24 at the same time.

In the organic light emitting device provided in one embodiment of the present application, the organic material layer comprises a light emitting layer, the light emitting layer comprises a host material, and the host material comprises the heterocyclic compound represented by Chemical Formula 1 and the heterocyclic compound represented by Chemical Formula 24.

In the organic light emitting device provided in one embodiment of the present application, the organic material layer comprises a light emitting layer, the light emitting layer comprises a host material and a dopant material, the host material comprises the heterocyclic compound represented by Chemical Formula 1 and the heterocyclic compound represented by Chemical Formula 24, and the dopant material is included in greater than or equal to 1 parts by weight and less than or equal to 15 parts by weight with respect to 100 parts by weight of the host material.

In one embodiment of the present application, the dopant material may be included in greater than or equal to 1 parts by weight and less than or equal to 15 parts by weight, preferably in greater than or equal to 2 parts by weight and less than or equal to 13 parts by weight, and more preferably in greater than or equal to 3 parts by weight and less than or equal to 7 parts by weight with respect to 100 parts by weight of the host material.

In a general light emitting device, driving voltage and efficiency decrease and a lifetime increases as a dopant concentration decreases, and as a dopant concentration increases, an effect of increasing efficiency may be expected due to increased probability of energy transfer from a host to the dopant, however, this is known to have disadvantages of inhibiting a lifetime of a device itself due to the occurrence of charge trapping, and increasing a driving voltage.

However, efficiency in low dopant doping has a similar or enhanced effect compared to in high doping in the present disclosure, and this is considered to be due to the fact that the host used in the present disclosure (mix of Chemical Formula 1 and Chemical Formula 24 of the present application) has a favorable charge transfer ability, which facilitates energy transfer from the host to the dopant even in low doping contributing to an increase in the efficiency and the lifetime, and accordingly, there is an advantage of using a small dopant amount when using the dopant together with the host used in the present disclosure.

FIGS. 1 to 3 illustrate a lamination order of electrodes and organic material layers of an organic light emitting device according to one embodiment of the present application. However, the scope of the present application is not limited to these diagrams, and structures of organic light emitting devices known in the art may also be used in the present application.

FIG. 1 illustrates an organic light emitting device in which an anode (200), an organic material layer (300) and a cathode (400) are consecutively laminated on a substrate (100). However, the structure is not limited to such a structure, and as illustrated in FIG. 2, an organic light emitting device in which a cathode, an organic material layer and an anode are consecutively laminated on a substrate may also be obtained.

FIG. 3 illustrates a case of the organic material layer being a multilayer. The organic light emitting device according to FIG. 3 comprises a hole injection layer (301), a hole transfer layer (302), a light emitting layer (303), a hole blocking layer (304), an electron transfer layer (305) and an electron injection layer (306). However, the scope of the present application is not limited to such a lamination structure, and as necessary, other layers except the light emitting layer may not be included, and other necessary functional layers may be further included.

One embodiment of the present application provides a method for manufacturing an organic light emitting device, the method comprising preparing a substrate; forming a first electrode on the substrate; forming one or more organic material layers on the first electrode; and forming a second electrode on the organic material layer, wherein the forming of organic material layers comprises forming one or more organic material layers using the composition for an organic material layer according to one embodiment of the present application.

In the method for manufacturing an organic light emitting device provided in one embodiment of the present application, the forming of organic material layers is forming using a method of thermal vacuum deposition after pre-mixing the heterocyclic compound of Chemical Formula 1 and the heterocyclic compound of Chemical Formula 24.

The pre-mixing means mixing materials of the heterocyclic compound of Chemical Formula 1 and the heterocyclic compound of Chemical Formula 24 in advance in one source of supply before depositing on an organic material layer. The pre-mixing has an advantage of making the process simpler since one source of supply is used instead of using 2 to 3 sources of supply.

The pre-mixed material may be referred to as the composition for an organic material layer according to one embodiment of the present application.

When pre-mixing as above, unique thermal properties of each material need to be identified in the mixing. Herein, when depositing the pre-mixed host material from one source of supply, unique thermal properties of the material may significantly affect a deposition condition comprising a deposition rate. When thermal properties between two or more types of pre-mixed materials are not similar and very different, repeatability and reproducibility may not be maintained in the deposition process, which means that an OLED that is all uniform may not be manufactured in one deposition process.

In view of the above, thermal properties of the materials may also be controlled depending the shape of the molecular structure while tuning electrical properties thereof by using a proper combination of the base structure and the substituent of each of the materials. Accordingly, device performance may be enhanced by using, as well as C—C bonding of the biscarbazole as in Chemical Formula 24, various substituents in Chemical Formula 24 in addition to the base structure, and diversity of various pre-mixed deposition processes between host-host may be secured by controlling thermal properties of each of the materials. This has an advantage of securing diversity of pre-mixed deposition processes using three, four or more host materials as well as two compounds as a host.

In the organic light emitting device according to one embodiment of the present application, materials other than the heterocyclic compound of Chemical Formula 1 and the heterocyclic compound of Chemical Formula 24 are illustrated below, however, these are for illustrative purposes only and not for limiting the scope of the present application, and may be replaced by materials known in the art.

As the anode material, materials having relatively large work function may be used, and transparent conductive oxides, metals, conductive polymers or the like may be used. Specific examples of the anode material comprise metals such as vanadium, chromium, copper, zinc and gold, or alloys thereof; metal oxides such as zinc oxide, indium oxide, indium tin oxide (ITO) and indium zinc oxide (IZO); combinations of metals and oxides such as ZnO:Al or $SnO_2$:Sb; conductive polymers such as poly(3-methylthiophene), poly[3,4-(ethylene-1,2-dioxy)thiophene] (PEDOT), polypyrrole and polyaniline, and the like, but are not limited thereto.

As the cathode material, materials having relatively small work function may be used, and metals, metal oxides, conductive polymers or the like may be used. Specific examples of the cathode material comprise metals such as magnesium, calcium, sodium, potassium, titanium, indium, yttrium, lithium, gadolinium, aluminum, silver, tin and lead, or alloys thereof; multilayer structure materials such as LiF/Al or $LiO_2$/Al, and the like, but are not limited thereto.

As the hole injection material, known hole injection materials may be used, and for example, phthalocyanine compounds such as copper phthalocyanine disclosed in U.S. Pat. No. 4,356,429, or starburst-type amine derivatives such as tris(4-carbazoyl-9-ylphenyl)amine (TCTA), 4,4',4"-tri[phenyl(m-tolyl)amino]triphenylamine (m-MTDATA) or 1,3,5-tris[4-(3-methylphenylphenylamino)phenyl]benzene (m-MTDAPB) described in the literature [Advanced Material, 6, p. 677 (1994)], polyaniline/dodecylbenzene sulfonic acid, poly(3,4-ethylenedioxythiophene)/poly(4-styrene-sulfonate), polyaniline/camphor sulfonic acid or polyaniline/poly(4-styrene-sulfonate) that are conductive polymers having solubility, and the like, may be used.

As the hole transfer material, pyrazoline derivatives, arylamine-based derivatives, stilbene derivatives, triphenyldiamine derivatives and the like may be used, and low molecular or high molecular materials may also be used.

As the electron transfer material, metal complexes of oxadiazole derivatives, anthraquinodimethane and derivatives thereof, benzoquinone and derivatives thereof, naphthoquinone and derivatives thereof, anthraquinone and derivatives thereof, tetracyanoanthraquinodimethane and derivatives thereof, fluorenone derivatives, diphenyldicyanoethylene and derivatives thereof, diphenoquinone derivatives, 8-hydroxyquinoline and derivatives thereof, and the like, may be used, and high molecular materials may also be used as well as low molecular materials.

As examples of the electron injection material, LiF is typically used in the art, however, the present application is not limited thereto.

As the light emitting material, red, green or blue light emitting materials may be used, and as necessary, two or more light emitting materials may be mixed and used. Herein, two or more light emitting materials may be used by being deposited as individual sources of supply or by being premixed and deposited as one source of supply. In addition, fluorescent materials may also be used as the light emitting material, however, phosphorescent materials may also be used. As the light emitting material, materials emitting light by bonding electrons and holes injected from an anode and a cathode, respectively, may be used alone, however, materials having a host material and a dopant material involving in light emission together may also be used.

When mixing light emitting material hosts, same series hosts may be mixed, or different series hosts may be mixed. For example, any two or more types of materials among n-type host materials or p-type host materials may be selected, and used as a host material of a light emitting layer.

The organic light emitting device according to one embodiment of the present application may be a top-emission type, a bottom-emission type or a dual-emission type depending on the materials used.

The heterocyclic compound according to one embodiment of the present application may also be used in an organic electronic device comprising an organic solar cell, an organic photo conductor, an organic transistor and the like under a similar principle used in the organic light emitting device.

Hereinafter, the present specification will be described in more detail with reference to examples, however, these are for illustrative purposes only, and the scope of the present application is not limited thereto.

PREPARATION EXAMPLE

Preparation of Compound of Chemical Formula 24

[Preparation Example 1] Preparation of Compound 2

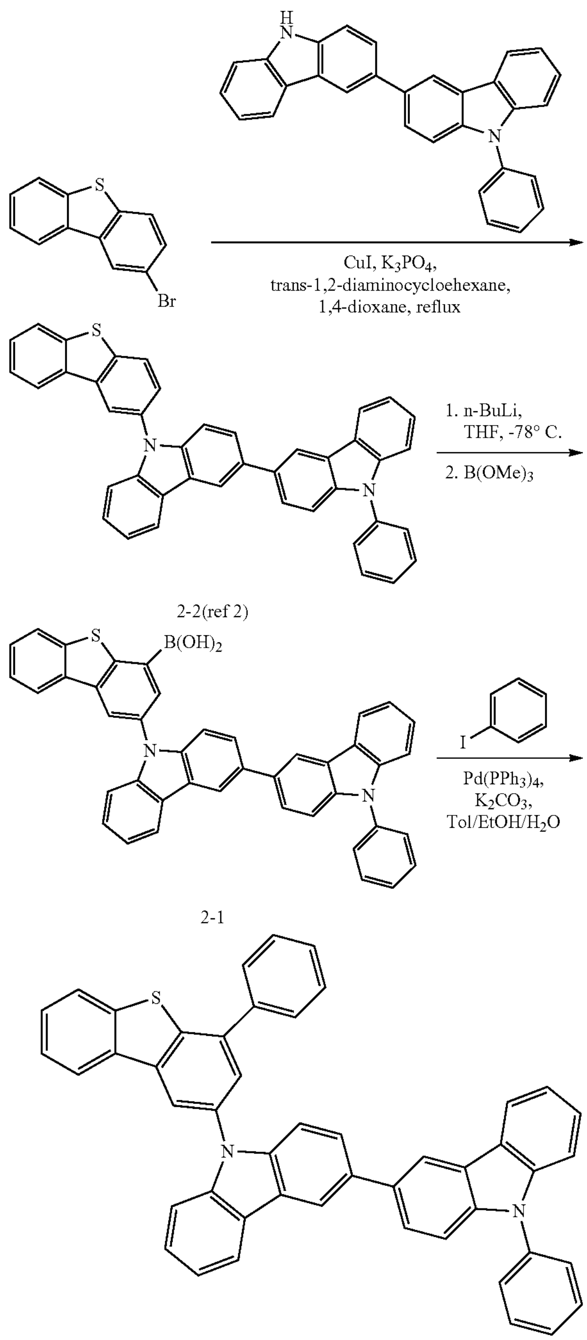

2

Preparation of Compound 2-2 (ref 2)

After dissolving 2-bromodibenzo[b,d]thiophene (4.2 g, 15.8 mM), 9-phenyl-9H,9'H-3,3'-bicarbazole (6.5 g, 15.8 mM), CuI (3.0 g, 15.8 mM), trans-1,2-diaminocyclohexane (1.9 mL, 15.8 mM) and $K_3PO_4$ (3.3 g, 31.6 mM) in 1,4- oxane (100 mL), the result was refluxed for 24 hours. After the reaction was completed, the result was extracted by introducing distilled water and dichloromethane (DCM) thereto, and after drying the organic layer with $MgSO_4$, the solvent was removed using a rotary evaporator. The reaction material was purified using column chromatography (DCM:Hex=1:3) and recrystallized with methanol to obtain target Compound 2-2 (7.9 g, 85%).

Preparation of Compound 2-1

To a mixture solution in which Compound 2-2 (8.4 g, 14.3 mmol) and tetrahydrofuran (THF) (100 mL) were introduced, 2.5 M n-BuLi (7.4 mL, 18.6 mmol) was added dropwise at −78° C., and the result was stirred for 1 hour at room temperature. To the reaction mixture, trimethyl borate (4.8 mL, 42.9 mmol) was added dropwise, and the result was stirred for 2 hours at room temperature. After the reaction was completed, the result was extracted by introducing distilled water and DCM thereto, and after drying the organic layer with $MgSO_4$, the solvent was removed using a rotary evaporator. The reaction material was purified using column chromatography (DCM:MeOH=100:3) and recrystallized with DCM to obtain target Compound 2-1 (3.9 g, 70%).

Preparation of Compound 2

After dissolving Compound 2-1 (6.7 g, 10.5 mM), iodobenzene (2.1 g, 10.5 mM), $Pd(PPh_3)_4$ (606 mg, 0.52 mM) and $K_2CO_3$ (2.9 g, 21.0 mM) in toluene/EtOH/$H_2O$ (100/20/20 mL), the result was refluxed for 12 hours. After the reaction was completed, the result was extracted by introducing distilled water and DCM thereto, and after drying the organic layer with $MgSO_4$, the solvent was removed using a rotary evaporator. The reaction material was purified using column chromatography (DCM:Hex=1:3) and recrystallized with methanol to obtain target Compound 2 (4.9 g, 70%).

Target Compound A was synthesized in the same manner as in Preparation of Compound 2 except that Intermediate A of the following Table 1 was used instead of iodobenzene.

TABLE 1

| Compound number | Intermediate A | Target compound A | Yield |
|---|---|---|---|
| 1 | 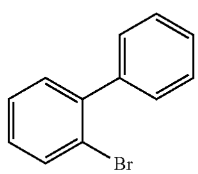 [SMILES: Brc1ccccc1-c1ccccc1] | 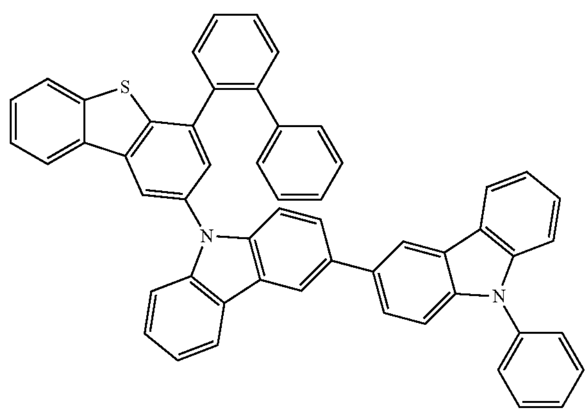 [SMILES: c1ccc(-c2ccccc2-c2cc(-n3c4ccccc4c4cc(-c5ccc6c(c5)c5ccccc5n6-c5ccccc5)ccc43)cc3c2sc2ccccc23)cc1] | 79% |
| 3 | 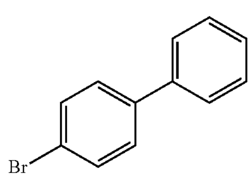 [SMILES: Brc1ccc(-c2ccccc2)cc1] | 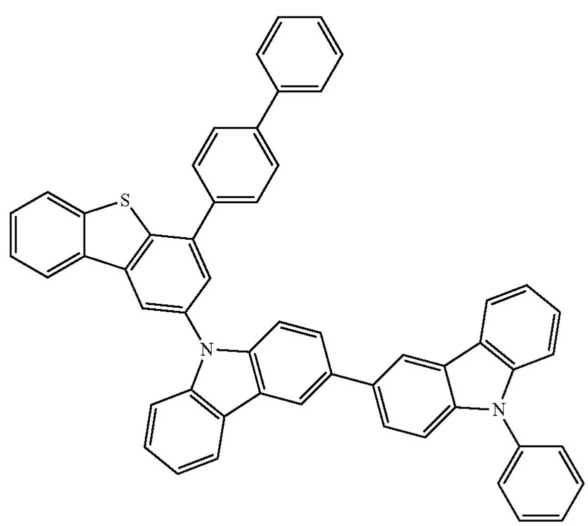 [SMILES: c1ccc(-c2ccc(-c3cc(-n4c5ccccc5c5cc(-c6ccc7c(c6)c6ccccc6n7-c6ccccc6)ccc54)cc4c3sc3ccccc34)cc2)cc1] | 83% |

TABLE 1-continued
| Compound number | Intermediate A | Target compound A | Yield |
|---|---|---|---|
| 4 | 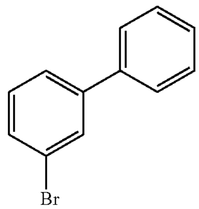 [SMILES: Brc1cccc(-c2ccccc2)c1] | 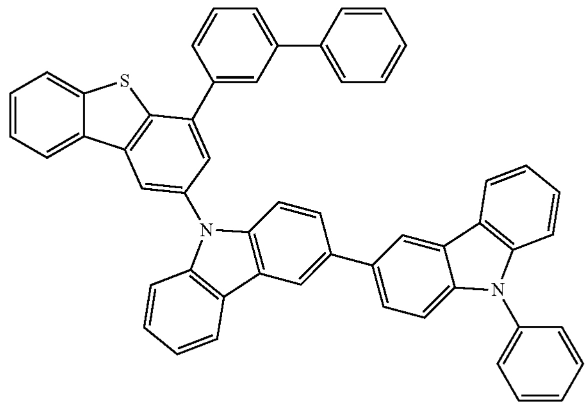 [SMILES: c1ccc(-c2cccc(-c3cc(-n4c5ccccc5c5cc(-c6ccc7c(c6)c6ccccc6n7-c6ccccc6)ccc54)cc4c3sc3ccccc34)c2)cc1] | 81% |
| 5 | 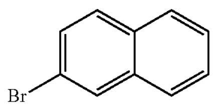 [SMILES: Brc1ccc2ccccc2c1] | 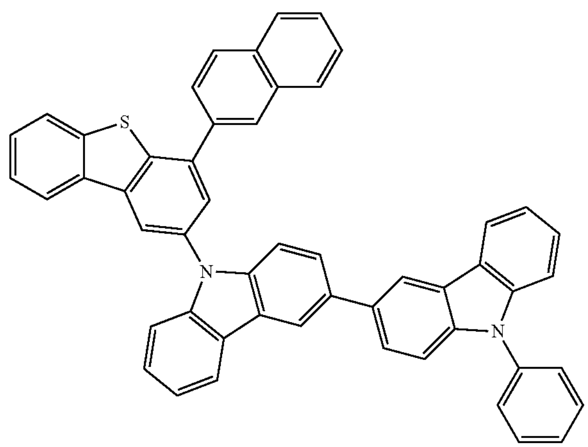 [SMILES: c1ccc(-n2c3ccccc3c3cc(-c4ccc5c(c4)c4ccccc4n5-c4cc(-c5ccc6ccccc6c5)c5sc6ccccc6c5c4)ccc32)cc1] | 72% |
| 6 | 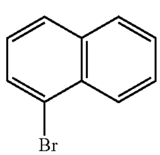 [SMILES: Brc1cccc2ccccc12] | 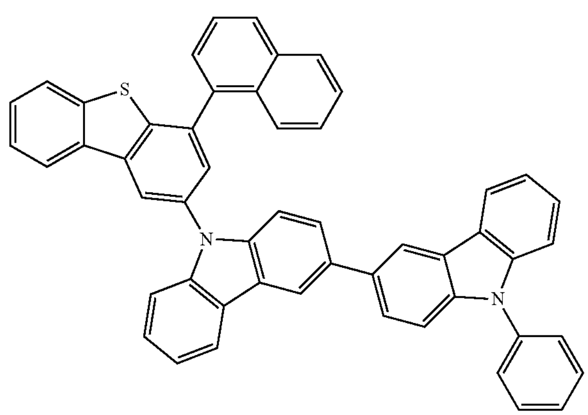 [SMILES: c1ccc(-n2c3ccccc3c3cc(-c4ccc5c(c4)c4ccccc4n5-c4cc(-c5cccc6ccccc56)c5sc6ccccc6c5c4)ccc32)cc1] | 75% |

TABLE 1-continued
| Compound number | Intermediate A | Target compound A | Yield |
|---|---|---|---|
| 7 | 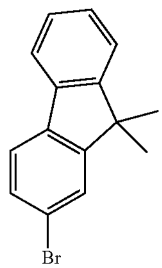 [SMILES: CC1(C)c2ccccc2-c2ccc(Br)cc21] | 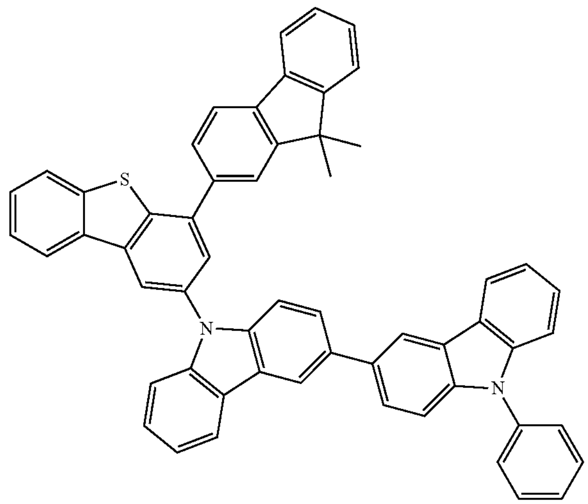 [SMILES: CC1(C)c2ccccc2-c2ccc(-c3cc(-n4c5ccccc5c5cc(-c6ccc7c(c6)c6ccccc6n7-c6ccccc6)ccc54)cc4c3sc3ccccc34)cc21] | 86% |
| 8 | 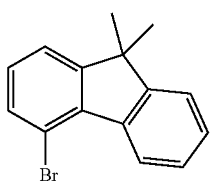 [SMILES: CC1(C)c2ccccc2-c2c(Br)cccc21] | 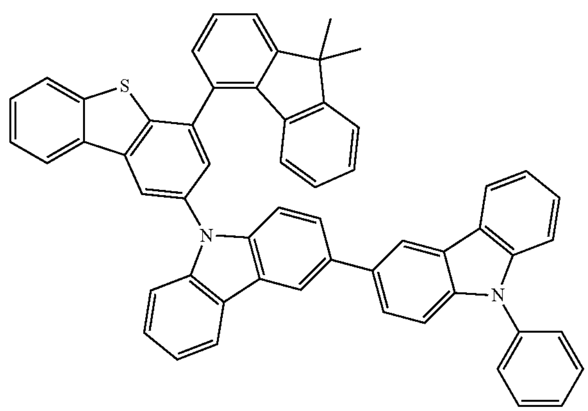 [SMILES: CC1(C)c2ccccc2-c2c(-c3cc(-n4c5ccccc5c5cc(-c6ccc7c(c6)c6ccccc6n7-c6ccccc6)ccc54)cc4c3sc3ccccc34)cccc21] | 87% |
| 9 | 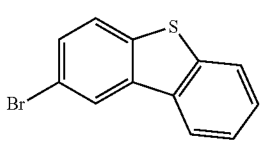 [SMILES: Brc1ccc2sc3ccccc3c2c1] | 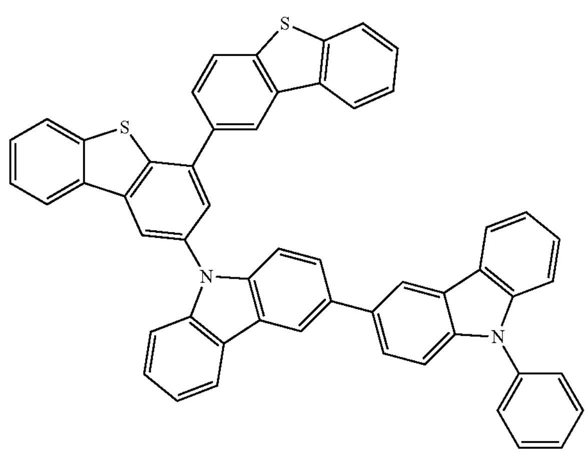 [SMILES: c1ccc(-n2c3ccccc3c3cc(-c4ccc5c(c4)c4ccccc4n5-c4cc(-c5ccc6sc7ccccc7c6c5)c5sc6ccccc6c5c4)ccc32)cc1] | 78% |

TABLE 1-continued
| Compound number | Intermediate A | Target compound A | Yield |
|---|---|---|---|
| 10 | 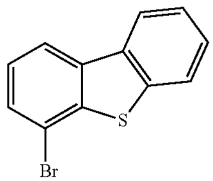 [SMILES: Brc1cccc2c1sc1ccccc12] | 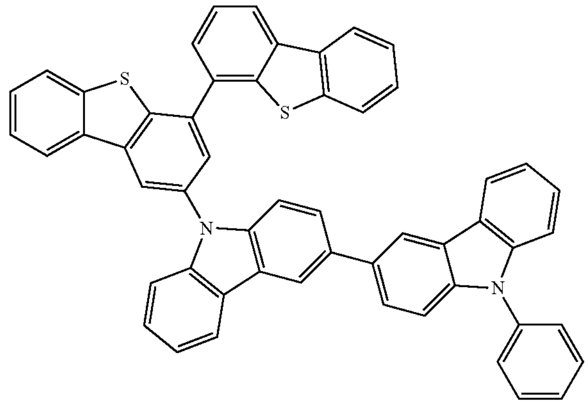 [SMILES: c1ccc(-n2c3ccccc3c3cc(-c4ccc5c(c4)c4ccccc4n5-c4cc(-c5cccc6c5sc5ccccc56)c5sc6ccccc6c5c4)ccc32)cc1] | 82% |
| 11 | 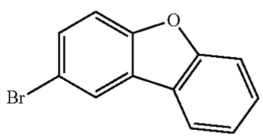 [SMILES: Brc1ccc2oc3ccccc3c2c1] | 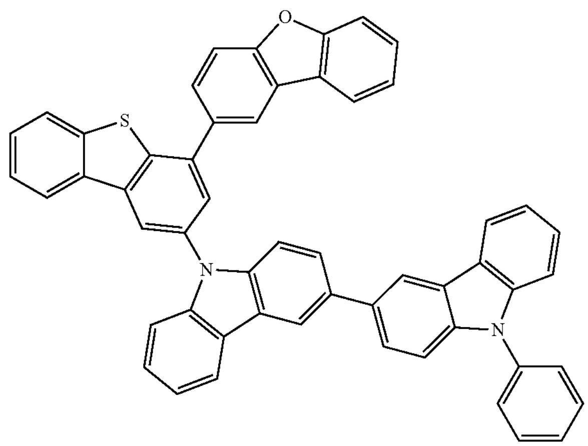 [SMILES: c1ccc(-n2c3ccccc3c3cc(-c4ccc5c(c4)c4ccccc4n5-c4cc(-c5ccc6oc7ccccc7c6c5)c5sc6ccccc6c5c4)ccc32)cc1] | 89% |
| 12 | 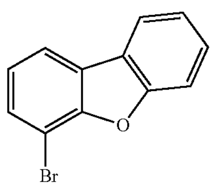 [SMILES: Brc1cccc2c1oc1ccccc12] | 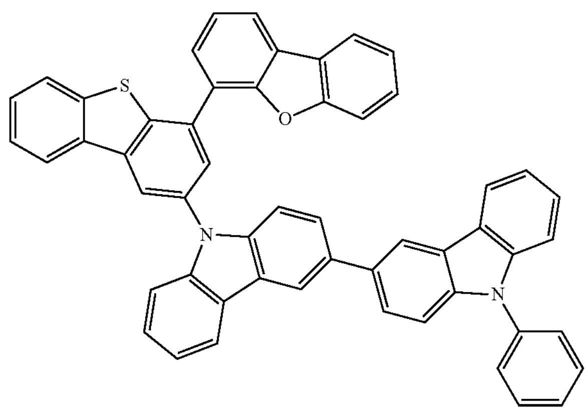 | 73% |
Target Compound B was synthesized in the same manner as in Preparation of Compound 2 except that Intermediate B and Intermediate C of the following Table 2 were used.

TABLE 2
| Compound Number | Intermediate B | Intermediate C | Target compound B | Yield |
|---|---|---|---|---|
| 13 | 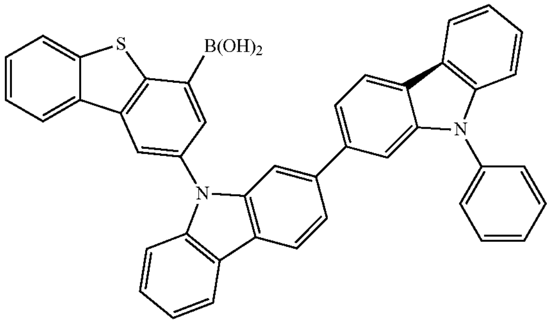 | 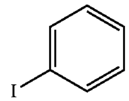 | 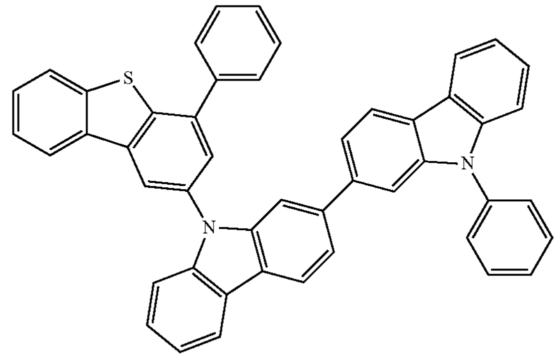 [SMILES: c1ccc(-c2cc(-n3c4ccccc4c4ccc(-c5ccc6c7ccccc7n(-c7ccccc7)c6c5)cc43)cc3c2sc2ccccc23)cc1] | 78% |
| 14 | 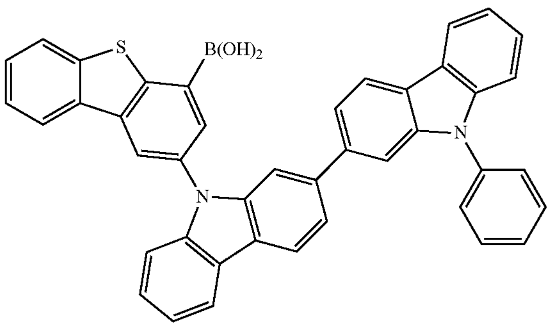 [SMILES: OB(O)c1cc(-n2c3ccccc3c3ccc(-c4ccc5c6ccccc6n(-c6ccccc6)c5c4)cc32)cc2c1sc1ccccc12] | 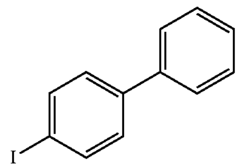 [SMILES: Ic1ccc(-c2ccccc2)cc1] | 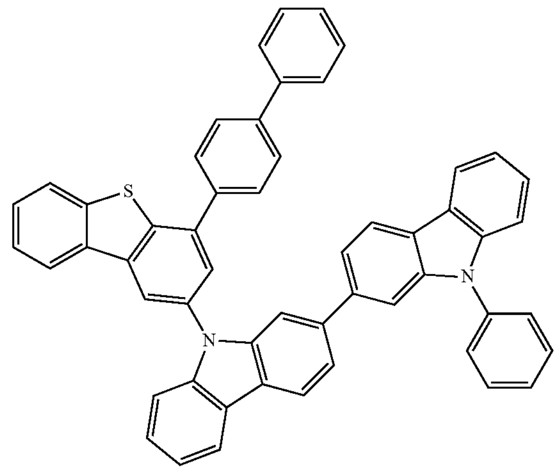 [SMILES: c1ccc(-c2ccc(-c3cc(-n4c5ccccc5c5ccc(-c6ccc7c8ccccc8n(-c8ccccc8)c7c6)cc54)cc4c3sc3ccccc34)cc2)cc1] | 81% |

TABLE 2-continued
| Compound Number | Intermediate B | Intermediate C | Target compound B | Yield |
|---|---|---|---|---|
| 24 | 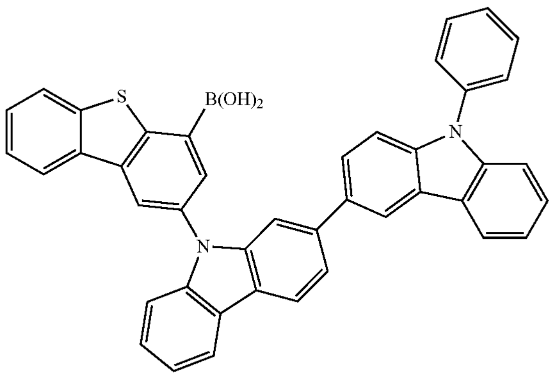 [SMILES: OB(O)c1cc(-n2c3ccccc3c3ccc(-c4ccc5c(c4)c4ccccc4n5-c4ccccc4)cc32)cc2c1sc1ccccc12] | 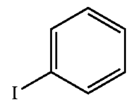 | 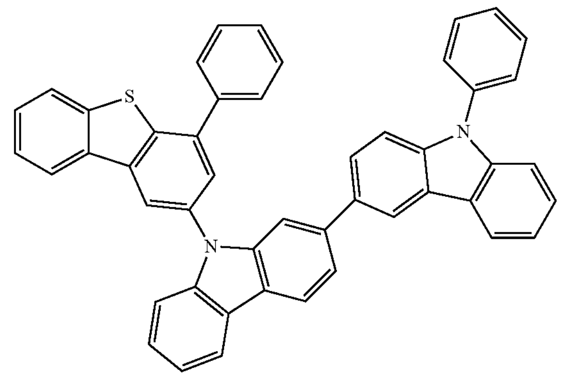 [SMILES: c1ccc(-c2cc(-n3c4ccccc4c4ccc(-c5ccc6c(c5)c5ccccc5n6-c5ccccc5)cc43)cc3c2sc2ccccc23)cc1] | 83% |
| 26 | 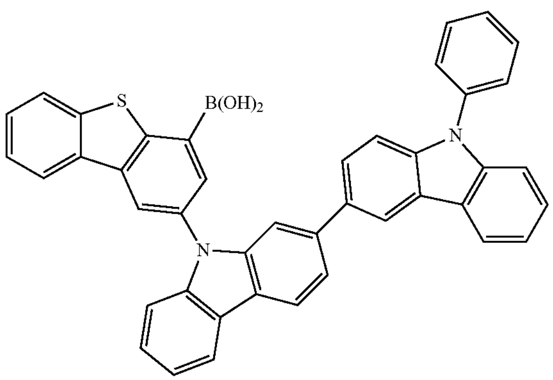 [SMILES: OB(O)c1cc(-n2c3ccccc3c3ccc(-c4ccc5c(c4)c4ccccc4n5-c4ccccc4)cc32)cc2c1sc1ccccc12] | 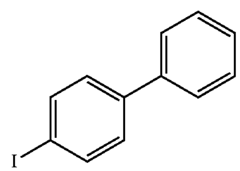 [SMILES: Ic1ccc(-c2ccccc2)cc1] | 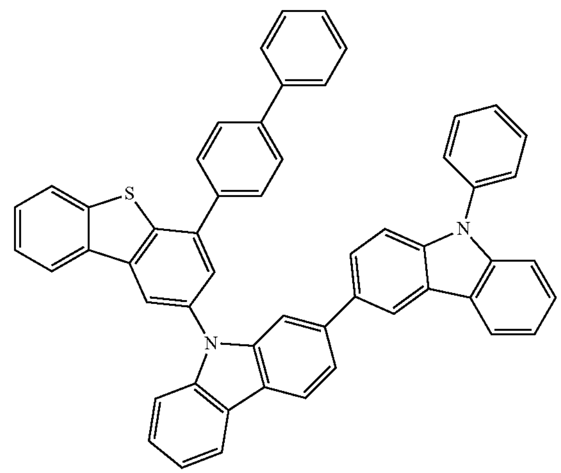 [SMILES: c1ccc(-c2ccc(-c3cc(-n4c5ccccc5c5ccc(-c6ccc7c(c6)c6ccccc6n7-c6ccccc6)cc54)cc4c3sc3ccccc34)cc2)cc1] | 85% |

TABLE 2-continued
| Compound Number | Intermediate B | Intermediate C | Target compound B | Yield |
|---|---|---|---|---|
| 33 | 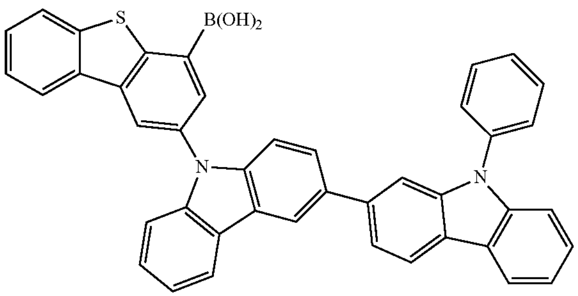 [SMILES: OB(O)c1cc(-n2c3ccccc3c3cc(-c4ccc5c6ccccc6n(-c6ccccc6)c5c4)ccc32)cc2c1sc1ccccc12] | 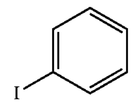 | 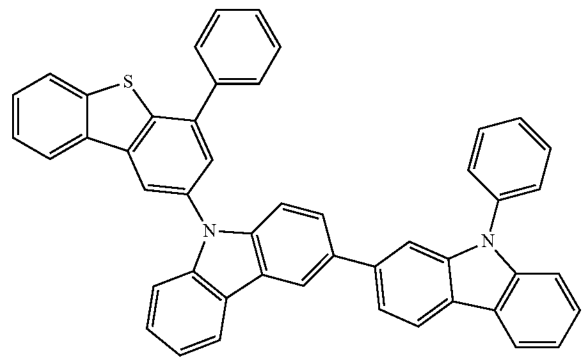 [SMILES: c1ccc(-c2cc(-n3c4ccccc4c4cc(-c5ccc6c7ccccc7n(-c7ccccc7)c6c5)ccc43)cc3c2sc2ccccc23)cc1] | 79% |
| 34 | 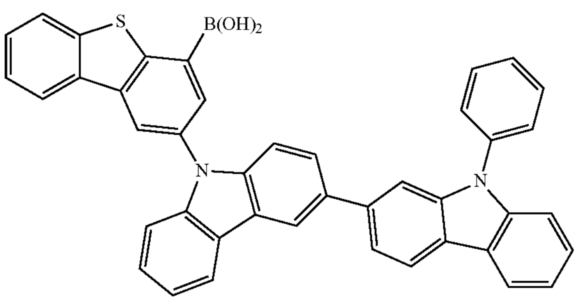 [SMILES: OB(O)c1cc(-n2c3ccccc3c3cc(-c4ccc5c6ccccc6n(-c6ccccc6)c5c4)ccc32)cc2c1sc1ccccc12] | 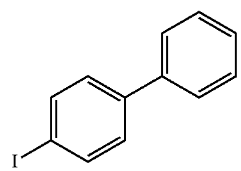 [SMILES: Ic1ccc(-c2ccccc2)cc1] | 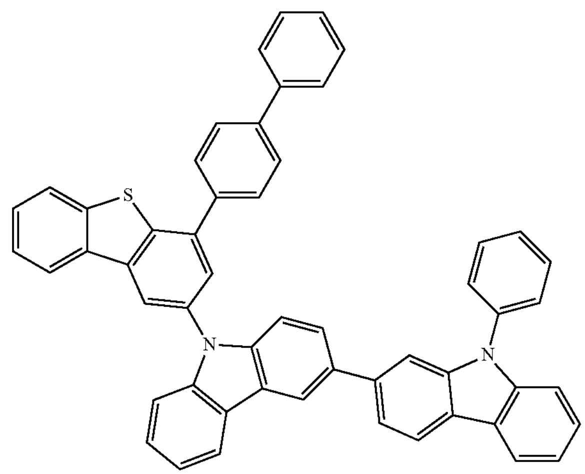 [SMILES: c1ccc(-c2ccc(-c3cc(-n4c5ccccc5c5cc(-c6ccc7c8ccccc8n(-c8ccccc8)c7c6)ccc54)cc4c3sc3ccccc34)cc2)cc1] | 83% |

TABLE 2-continued
| Compound Number | Intermediate B | Intermediate C | Target compound B | Yield |
|---|---|---|---|---|
| 41 | 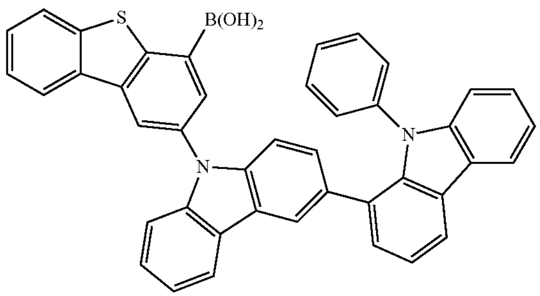 [SMILES: OB(O)c1cc(-n2c3ccccc3c3cc(-c4cccc5c6ccccc6n(-c6ccccc6)c45)ccc32)cc2c1sc1ccccc12] | 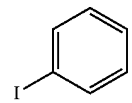 | 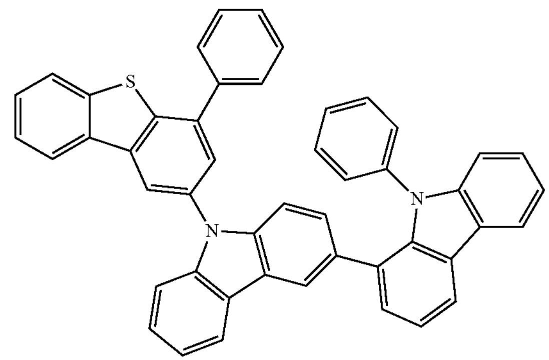 [SMILES: c1ccc(-c2cc(-n3c4ccccc4c4cc(-c5cccc6c7ccccc7n(-c7ccccc7)c56)ccc43)cc3c2sc2ccccc23)cc1] | 72% |
| 42 | 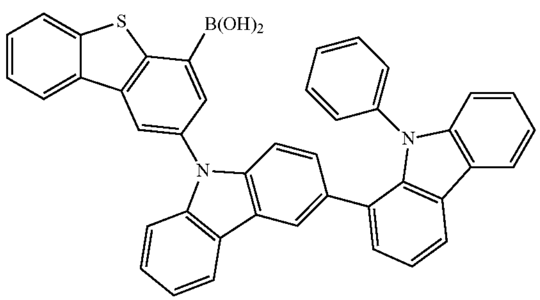 [SMILES: OB(O)c1cc(-n2c3ccccc3c3cc(-c4cccc5c6ccccc6n(-c6ccccc6)c45)ccc32)cc2c1sc1ccccc12] | 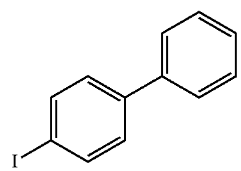 [SMILES: Ic1ccc(-c2ccccc2)cc1] | 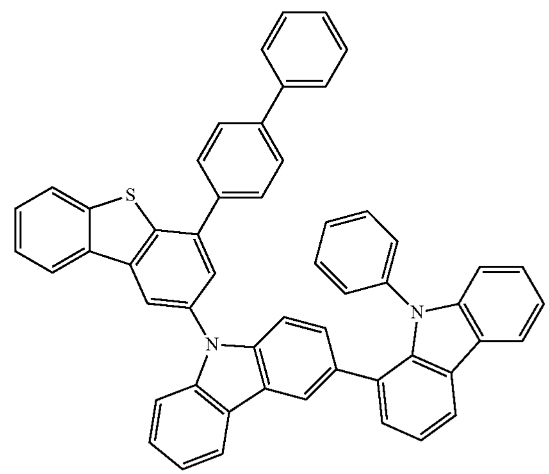 [SMILES: c1ccc(-c2ccc(-c3cc(-n4c5ccccc5c5cc(-c6cccc7c8ccccc8n(-c8ccccc8)c67)ccc54)cc4c3sc3ccccc34)cc2)cc1] | 79% |

TABLE 2-continued
| Compound Number | Intermediate B | Intermediate C | Target compound B | Yield |
| --- | --- | --- | --- | --- |
| 49 | 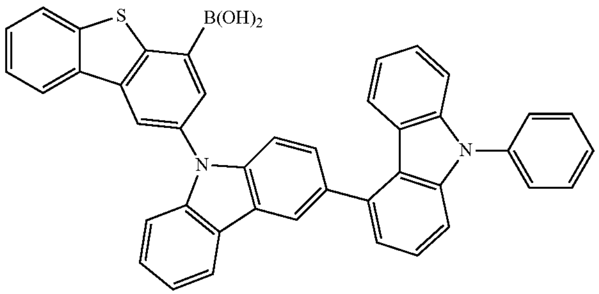 [SMILES: OB(O)c1cc(-n2c3ccccc3c3cc(-c4cccc5c4c4ccccc4n5-c4ccccc4)ccc32)cc2c1sc1ccccc12] | 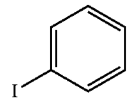 | 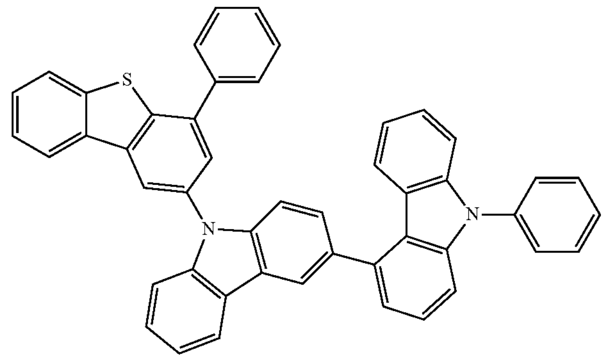 [SMILES: c1ccc(-c2cc(-n3c4ccccc4c4cc(-c5cccc6c5c5ccccc5n6-c5ccccc5)ccc43)cc3c2sc2ccccc23)cc1] | 75% |
| 50 | 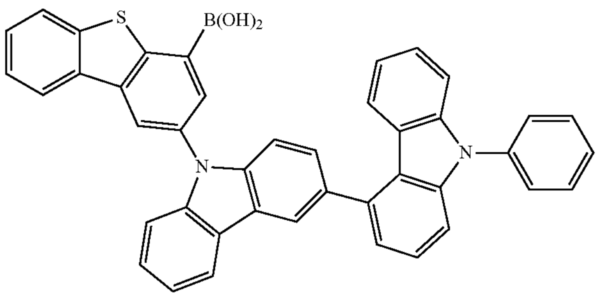 [SMILES: OB(O)c1cc(-n2c3ccccc3c3cc(-c4cccc5c4c4ccccc4n5-c4ccccc4)ccc32)cc2c1sc1ccccc12] | 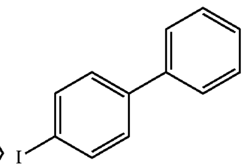 | 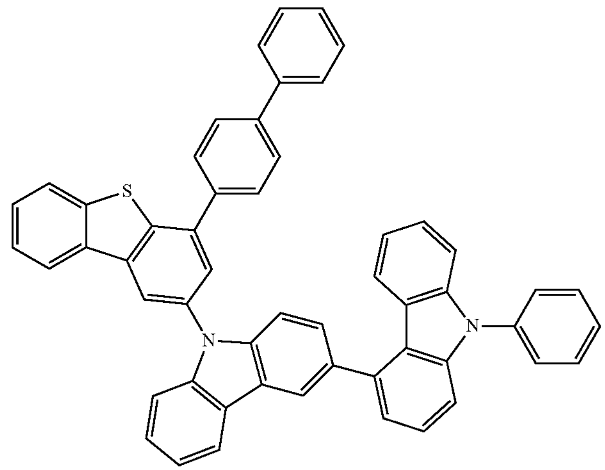 [SMILES: c1ccc(-c2ccc(-c3cc(-n4c5ccccc5c5cc(-c6cccc7c6c6ccccc6n7-c6ccccc6)ccc54)cc4c3sc3ccccc34)cc2)cc1] | 78% |

TABLE 2-continued
| Compound Number | Intermediate B | Intermediate C | Target compound B | Yield |
|---|---|---|---|---|
| 57 | 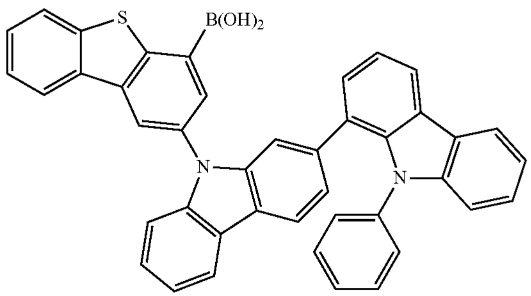 [SMILES: OB(O)c1cc(-n2c3ccccc3c3ccc(-c4cccc5c6ccccc6n(-c6ccccc6)c45)cc32)cc2c1sc1ccccc12] | 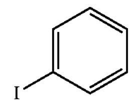 | 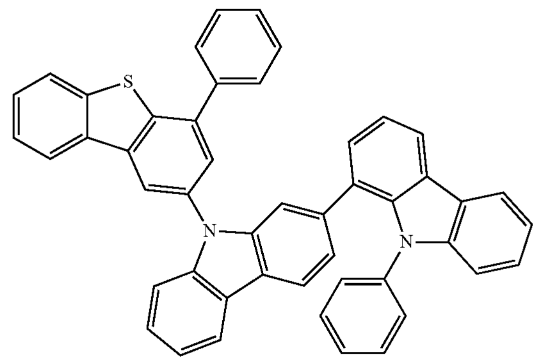 [SMILES: c1ccc(-c2cc(-n3c4ccccc4c4ccc(-c5cccc6c7ccccc7n(-c7ccccc7)c56)cc43)cc3c2sc2ccccc23)cc1] | 81% |
| 58 | 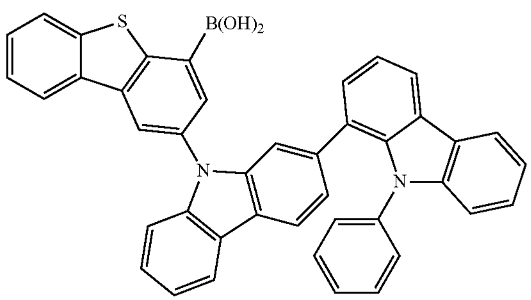 [SMILES: OB(O)c1cc(-n2c3ccccc3c3ccc(-c4cccc5c6ccccc6n(-c6ccccc6)c45)cc32)cc2c1sc1ccccc12] | 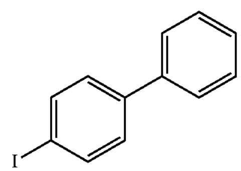 [SMILES: Ic1ccc(-c2ccccc2)cc1] | 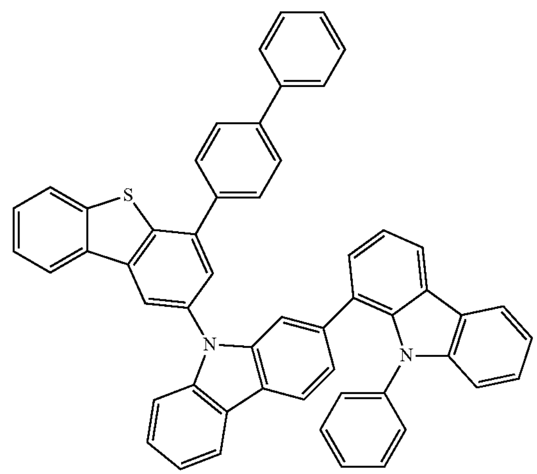 [SMILES: c1ccc(-c2ccc(-c3cc(-n4c5ccccc5c5ccc(-c6cccc7c8ccccc8n(-c8ccccc8)c67)cc54)cc4c3sc3ccccc34)cc2)cc1] | 82% |

TABLE 2-continued
| Compound Number | Intermediate B | Intermediate C | Target compound B | Yield |
| --- | --- | --- | --- | --- |
| 65 | 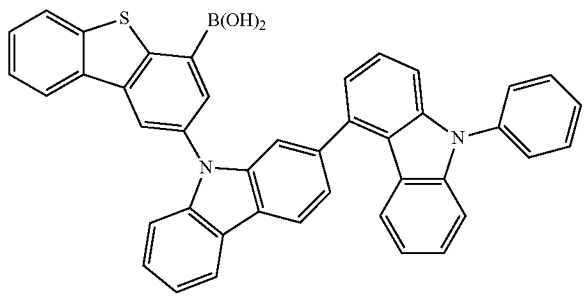 [SMILES: OB(O)c1cc(-n2c3ccccc3c3ccc(-c4cccc5c4c4ccccc4n5-c4ccccc4)cc32)cc2c1sc1ccccc12] | 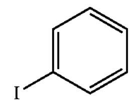 | 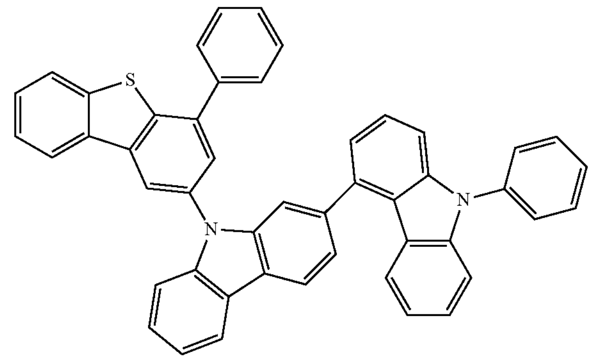 [SMILES: c1ccc(-c2cc(-n3c4ccccc4c4ccc(-c5cccc6c5c5ccccc5n6-c5ccccc5)cc43)cc3c2sc2ccccc23)cc1] | 87% |
| 66 | 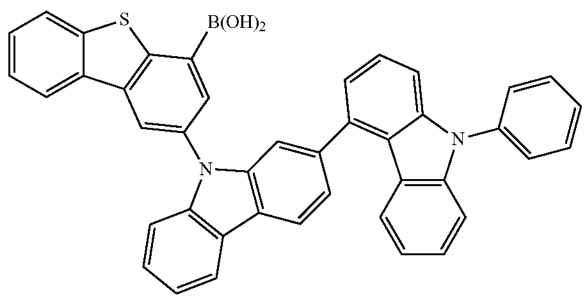 [SMILES: OB(O)c1cc(-n2c3ccccc3c3ccc(-c4cccc5c4c4ccccc4n5-c4ccccc4)cc32)cc2c1sc1ccccc12] | 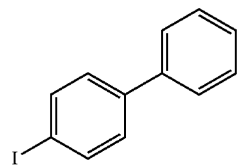 [SMILES: Ic1ccc(-c2ccccc2)cc1] | 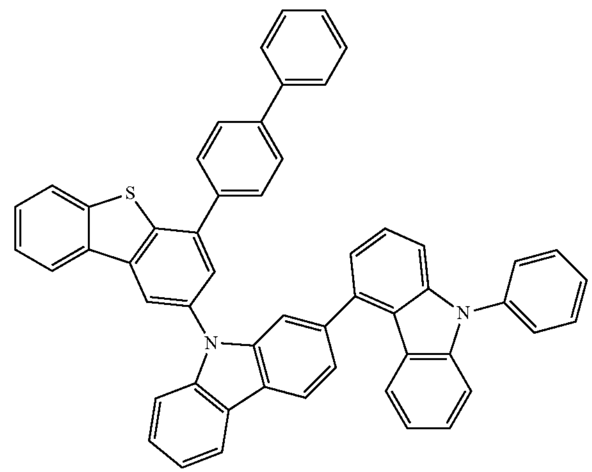 [SMILES: c1ccc(-c2ccc(-c3cc(-n4c5ccccc5c5ccc(-c6cccc7c6c6ccccc6n7-c6ccccc6)cc54)cc4c3sc3ccccc34)cc2)cc1] | 81% |

TABLE 2-continued
| Compound Number | Intermediate B | Intermediate C | Target compound B | Yield |
|---|---|---|---|---|
| 73 | 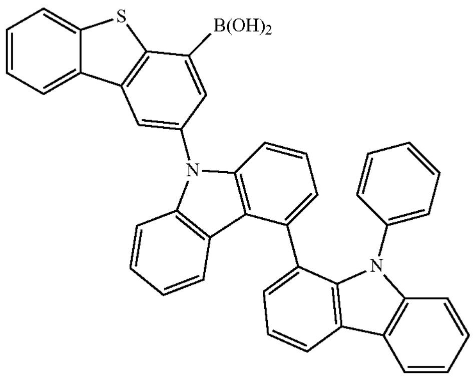 [SMILES: OB(O)c1cc(-n2c3ccccc3c3c(-c4cccc5c6ccccc6n(-c6ccccc6)c45)cccc32)cc2c1sc1ccccc12] | 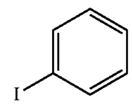 | 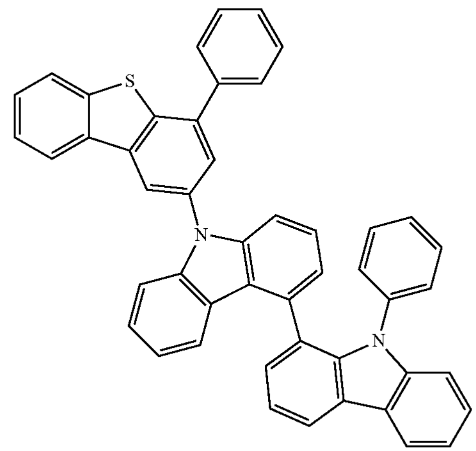 [SMILES: c1ccc(-c2cc(-n3c4ccccc4c4c(-c5cccc6c7ccccc7n(-c7ccccc7)c56)cccc43)cc3c2sc2ccccc23)cc1] | 78% |
| 74 | 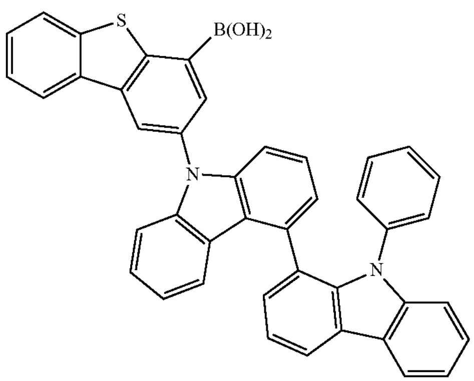 [SMILES: OB(O)c1cc(-n2c3ccccc3c3c(-c4cccc5c6ccccc6n(-c6ccccc6)c45)cccc32)cc2c1sc1ccccc12] | 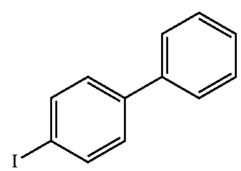 [SMILES: Ic1ccc(-c2ccccc2)cc1] | 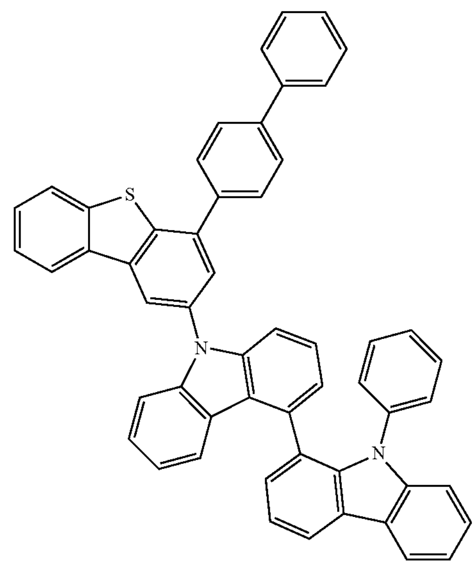 [SMILES: c1ccc(-c2ccc(-c3cc(-n4c5ccccc5c5c(-c6cccc7c8ccccc8n(-c8ccccc8)c67)cccc54)cc4c3sc3ccccc34)cc2)cc1] | 79% |

TABLE 2-continued
| Compound Number | Intermediate B | Intermediate C | Target compound B | Yield |
|---|---|---|---|---|
| 81 | 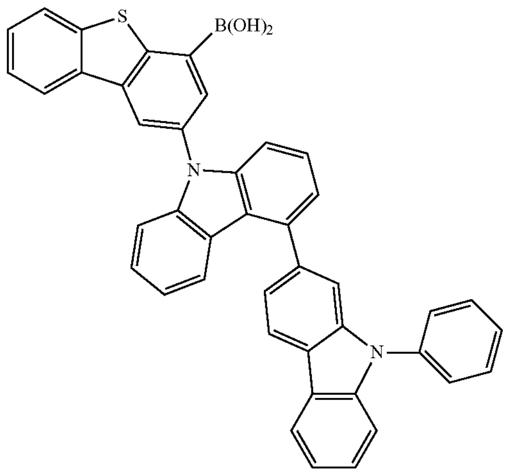 [SMILES: OB(O)c1cc(-n2c3ccccc3c3c(-c4ccc5c6ccccc6n(-c6ccccc6)c5c4)cccc32)cc2c1sc1ccccc12] | 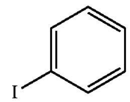 | 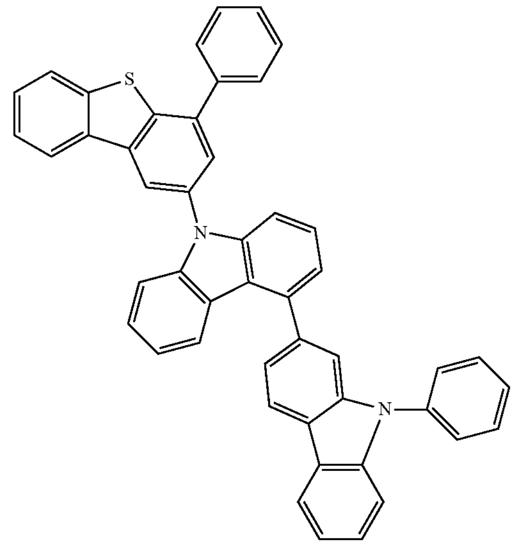 [SMILES: c1ccc(-c2cc(-n3c4ccccc4c4c(-c5ccc6c7ccccc7n(-c7ccccc7)c6c5)cccc43)cc3c2sc2ccccc23)cc1] | 82% |

TABLE 2-continued
| Compound Number | Intermediate B | Intermediate C | Target compound B | Yield |
| --- | --- | --- | --- | --- |
| 82 | 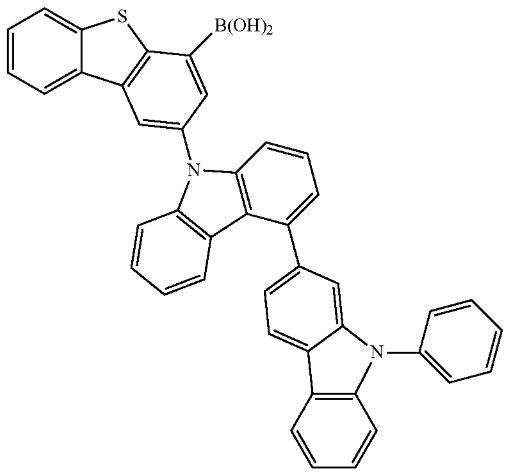 [SMILES: OB(O)c1cc(-n2c3ccccc3c3c(-c4ccc5c6ccccc6n(-c6ccccc6)c5c4)cccc32)cc2c1sc1ccccc12] | 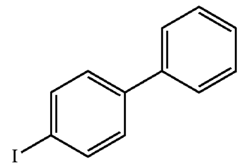 [SMILES: Ic1ccc(-c2ccccc2)cc1] | 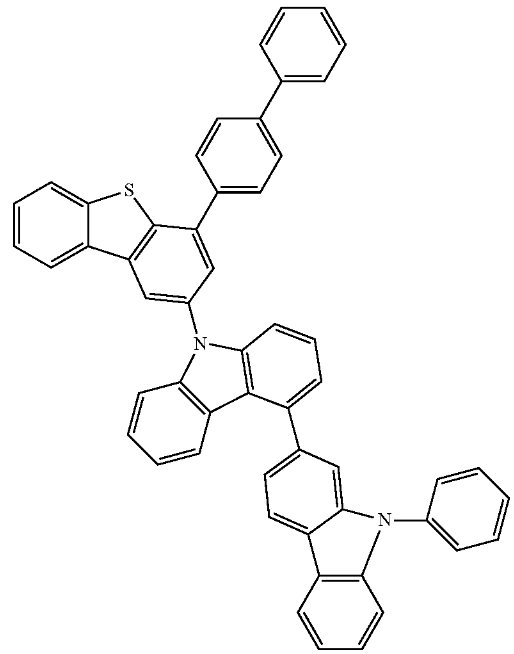 [SMILES: c1ccc(-c2ccc(-c3cc(-n4c5ccccc5c5c(-c6ccc7c8ccccc8n(-c8ccccc8)c7c6)cccc54)cc4c3sc3ccccc34)cc2)cc1] | 86% |

TABLE 2-continued
| Compound Number | Intermediate B | Intermediate C | Target compound B | Yield |
|---|---|---|---|---|
| 89 | 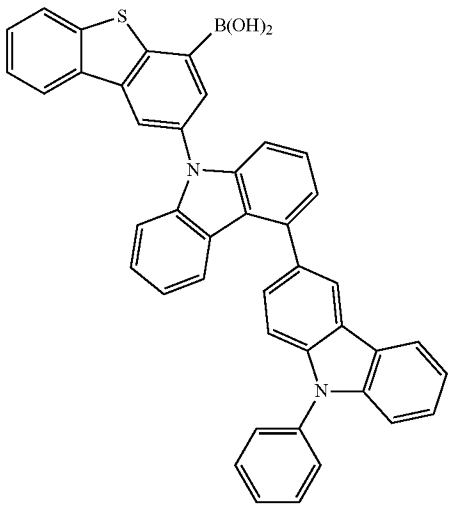 [SMILES: OB(O)c1cc(-n2c3ccccc3c3c(-c4ccc5c(c4)c4ccccc4n5-c4ccccc4)cccc32)cc2c1sc1ccccc12] | 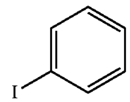 | 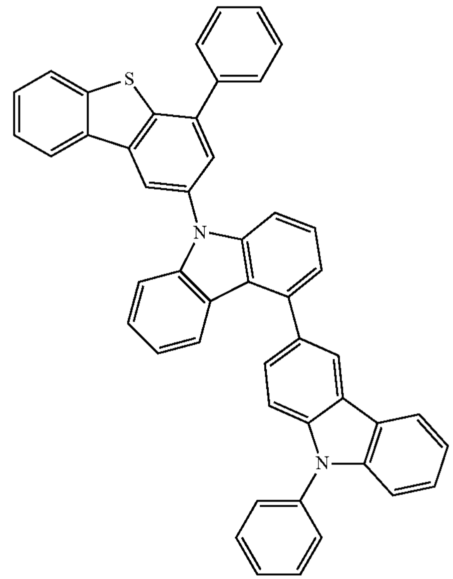 [SMILES: c1ccc(-c2cc(-n3c4ccccc4c4c(-c5ccc6c(c5)c5ccccc5n6-c5ccccc5)cccc43)cc3c2sc2ccccc23)cc1] | 89% |

TABLE 2-continued
| Compound Number | Intermediate B | Intermediate C | Target compound B | Yield |
|---|---|---|---|---|
| 90 | 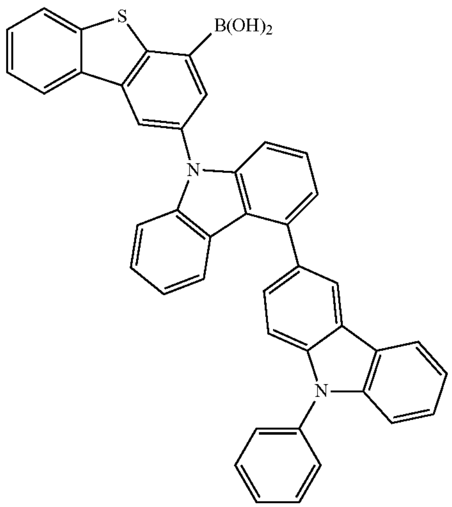 [SMILES: OB(O)c1cc(-n2c3ccccc3c3c(-c4ccc5c(c4)c4ccccc4n5-c4ccccc4)cccc32)cc2c1sc1ccccc12] | 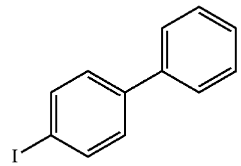 [SMILES: Ic1ccc(-c2ccccc2)cc1] | 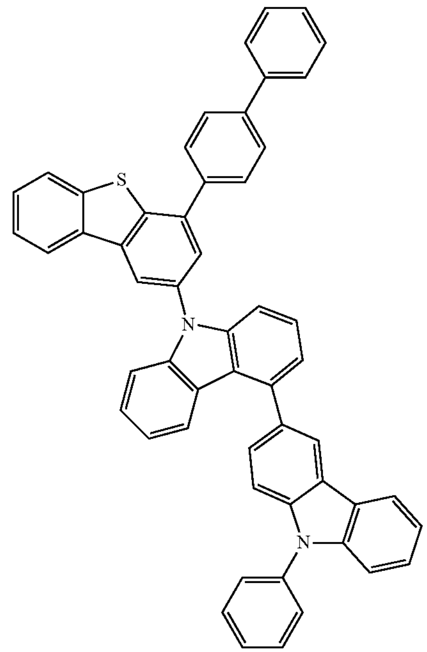 [SMILES: c1ccc(-c2ccc(-c3cc(-n4c5ccccc5c5c(-c6ccc7c(c6)c6ccccc6n7-c6ccccc6)cccc54)cc4c3sc3ccccc34)cc2)cc1] | 85% |

TABLE 2-continued
| Compound Number | Intermediate B | Intermediate C | Target compound B | Yield |
| --- | --- | --- | --- | --- |
| 97 | 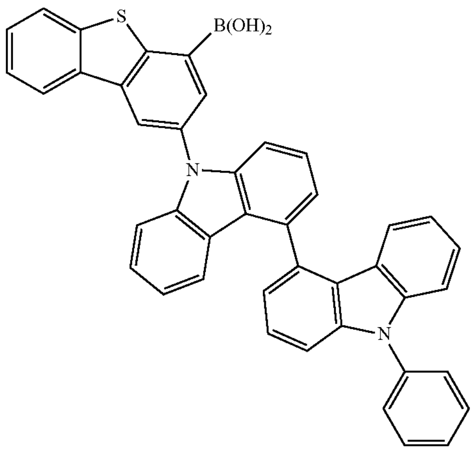 [SMILES: OB(O)c1cc(-n2c3ccccc3c3c(-c4cccc5c4c4ccccc4n5-c4ccccc4)cccc32)cc2c1sc1ccccc12] | 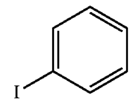 | 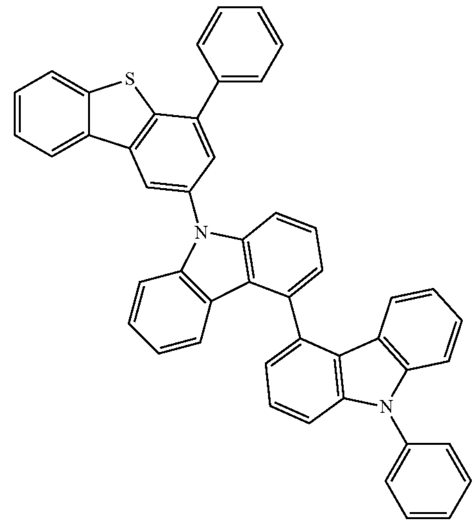 [SMILES: c1ccc(-c2cc(-n3c4ccccc4c4c(-c5cccc6c5c5ccccc5n6-c5ccccc5)cccc43)cc3c2sc2ccccc23)cc1] | 73% |

TABLE 2-continued
| Compound Number | Intermediate B | Intermediate C | Target compound B | Yield |
|---|---|---|---|---|
| 98 | 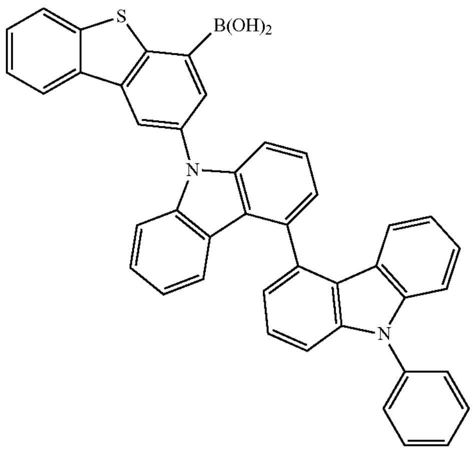 [SMILES: OB(O)c1cc(-n2c3ccccc3c3c(-c4cccc5c4c4ccccc4n5-c4ccccc4)cccc32)cc2c1sc1ccccc12] | 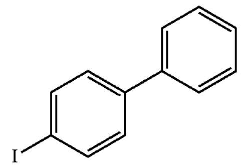 [SMILES: Ic1ccc(-c2ccccc2)cc1] | 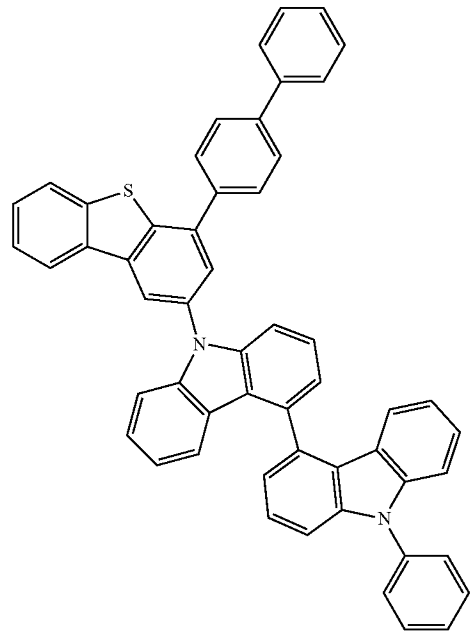 [SMILES: c1ccc(-c2ccc(-c3cc(-n4c5ccccc5c5c(-c6cccc7c6c6ccccc6n7-c6ccccc6)cccc54)cc4c3sc3ccccc34)cc2)cc1] | 77% |

Preparation of Comparative Example Not Corresponding to Chemical Formula 24

[Preparation Example 2] Preparation of Compound Ref 3

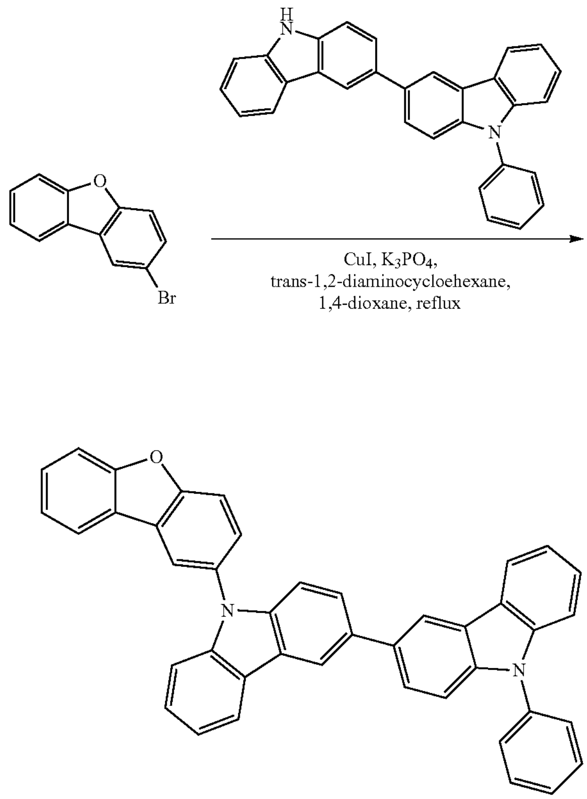

ref 3

After dissolving 2-bromodibenzo[b,d]furan (3.9 g, 15.8 mM), 9-phenyl-9H,9'H-3,3'-bicarbazole (6.5 g, 15.8 mM), CuI (3.0 g, 15.8 mM), trans-1,2-diaminocyclohexane (1.9 mL, 15.8 mM) and $K_3PO_4$ (3.3 g, 31.6 mM) in 1,4-oxane (100 mL), the result was refluxed for 24 hours. After the reaction was completed, the result was extracted by introducing distilled water and DCM thereto, and after drying the organic layer with $MgSO_4$, the solvent was removed using a rotary evaporator. The reaction material was purified using column chromatography (DCM:Hex=1:3) and recrystallized with methanol to obtain target Compound ref 3 (7.7 g, 85%).

[Preparation Example 3] Preparation of Compound Ref 4

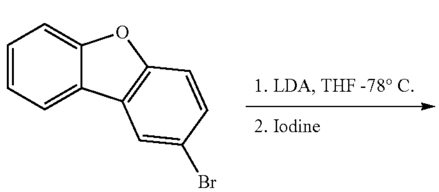

-continued

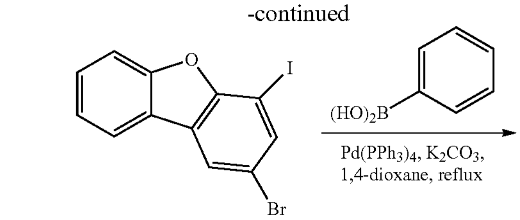

ref 4-2

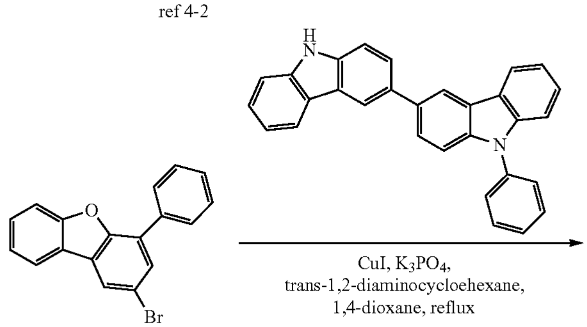

ref 4-1

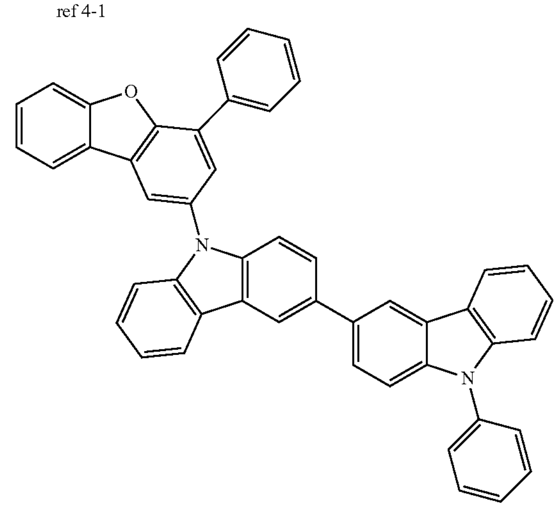

ref 4

Preparation of Compound Ref 4-2

To a mixture solution in which 2-bromodibenzofuran (30.0 g, 121.4 mM) and THF (300 mL) were introduced, 1.8 M LDA (88.0 mL, 157.8 mM) was added dropwise at −78° C., and the result was stirred for 1 hour. To the reaction mixture, iodine (11.0 g, 42.9 mmol) was introduced, and the result was stirred for 2 hours at room temperature. After the reaction was completed, the result was extracted by introducing distilled water and DCM thereto, and after drying the organic layer with $MgSO_4$, the solvent was removed using a rotary evaporator. The reaction material was purified using column chromatography (DCM) and recrystallized with MeOH to obtain target Compound ref 4-2 (23.1 g, 51%).

Preparation of Compound Ref 4-1

After dissolving Compound ref 4-2 (3.9 g, 10.5 mM), phenylboronic acid (1.3 g, 10.5 mM), $Pd(PPh_3)_4$ (606 mg, 0.52 mM) and $K_2CO_3$ (2.9 g, 21.0 mM) in toluene/EtOH/$H_2O$ (100/20/20 mL), the result was refluxed for 12 hours. After the reaction was completed, the result was extracted by introducing distilled water and DCM thereto, and after drying the organic layer with $MgSO_4$, the solvent was removed using a rotary evaporator. The reaction material was purified using column chromatography (DCM:Hex=1:3) and recrystallized with methanol to obtain target Compound ref 4-1 (2.4 g, 70%).

Preparation of Compound Ref 4

After dissolving Compound ref 4-1 (5.1 g, 15.8 mM), 9-phenyl-9H,9'H-3,3'-bicarbazole (6.5 g, 15.8 mM), CuI (3.0 g, 15.8 mM), trans-1,2-diaminocyclohexane (1.9 mL, 15.8 mM) and $K_3PO_4$ (3.3 g, 31.6 mM) in 1,4-oxane (100 mL), the result was refluxed for 24 hours. After the reaction was completed, the result was extracted by introducing distilled water and DCM thereto, and after drying the organic layer with $MgSO_4$, the solvent was removed using a rotary evaporator. The reaction material was purified using column chromatography (DCM:Hex=1:3) and recrystallized with methanol to obtain target Compound ref 4 (8.7 g, 85%).

[Preparation Example 4] Preparation of Compound Ref 5

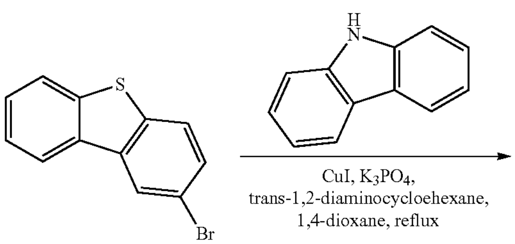

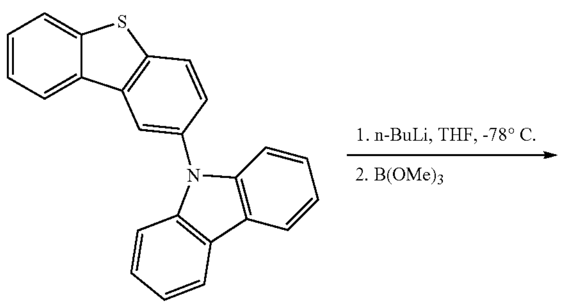

ref 5-2

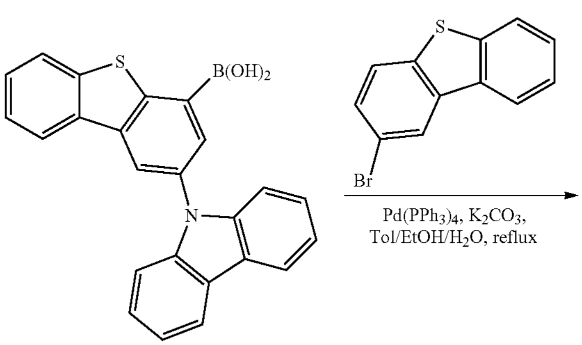

ref 5-1

-continued

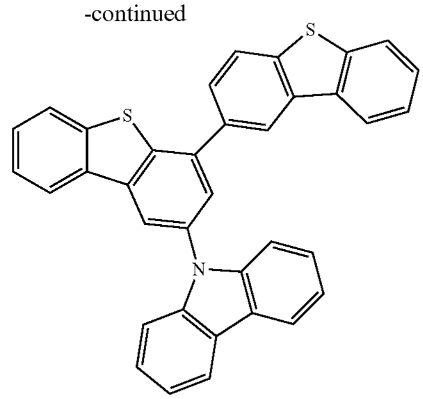

ref 5

Preparation of Compound Ref 5-2

After dissolving 2-bromodibenzo[b,d]thiophene (5.0 g, 19.0 mM), 9H-carbazole (2.6 g, 15.8 mM), CuI (3.0 g, 15.8 mM), trans-1,2-diaminocyclohexane (1.9 mL, 15.8 mM) and $K_3PO_4$ (3.3 g, 31.6 mM) in 1,4-oxane (100 mL), the result was refluxed for 24 hours. After the reaction was completed, the result was extracted by introducing distilled water and DCM thereto, and after drying the organic layer with $MgSO_4$, the solvent was removed using a rotary evaporator. The reaction material was purified using column chromatography (DCM:Hex=1:3) and recrystallized with methanol to obtain target Compound ref 5-2 (4.7 g, 85%).

Preparation of Compound Ref 5-1

To a mixture solution in which Compound ref 5-2 (5 g, 14.3 mM) and THF (100 mL) were introduced, 2.5 M n-BuLi (7.4 mL, 18.6 mM) was added dropwise at −78° C., and the result was stirred for 1 hour at room temperature. To the reaction mixture, trimethyl borate ($B(OMe)_3$) (4.8 mL, 42.9 mM) was added dropwise, and the result was stirred for 2 hours at room temperature. After the reaction was completed, the result was extracted by introducing distilled water and DCM thereto, and after drying the organic layer with $MgSO_4$, the solvent was removed using a rotary evaporator. The reaction material was purified using column chromatography (DCM:MeOH=100:3) and recrystallized with DCM to obtain target Compound ref 5-1 (3.9 g, 70%).

Preparation of Compound Ref 5

After dissolving ref 5-1 (7.5 g, 19.0 mM), 2-bromodibenzo[b,d]thiophene (5.0 g, 19.0 mM), $Pd(PPh_3)_4$ (1.1 g, 0.95 mM) and $K_2CO_3$ (5.2 g, 38.0 mM) in toluene/EtOH/$H_2O$ (100/20/20 mL), the result was refluxed for 12 hours. After the reaction was completed, the result was extracted by introducing distilled water and DCM thereto, and after drying the organic layer with $MgSO_4$, the solvent was removed using a rotary evaporator. The reaction material was purified using column chromatography (DCM:Hex=1:3) and recrystallized with methanol to obtain target Compound ref 5 (7.1 g, 70%).

[Preparation Example 5] Preparation of Compound Ref 6

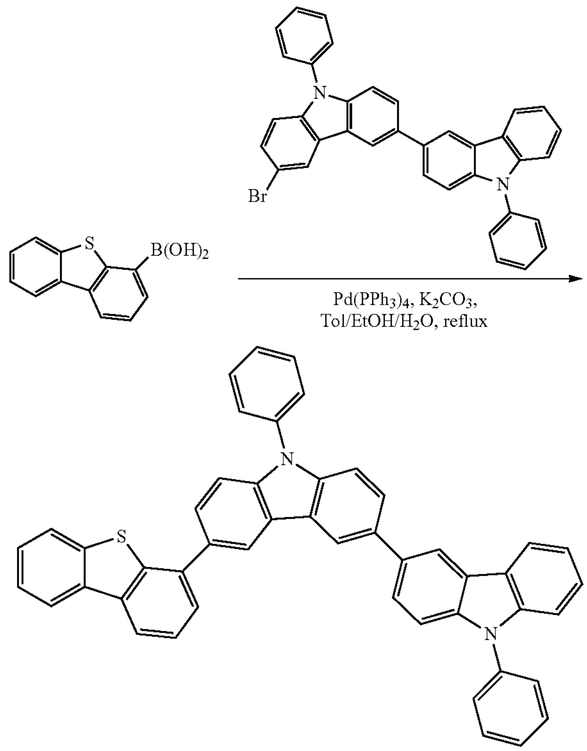

ref 6

After dissolving dibenzo[b,d]thiophen-4-ylboronic acid (4.3 g, 19.0 mM), 6-bromo-9,9'-diphenyl-9H,9'H-3,3'-bicarbazole (10.7 g, 19.0 mM), $Pd(PPh_3)_4$ (1.1 g, 0.95 mM) and $K_2CO_3$ (5.2 g, 38.0 mM) in toluene/EtOH/$H_2O$ (100/20/20 mL), the result was refluxed for 12 hours. After the reaction was completed, the result was extracted by introducing distilled water and DCM thereto, and after drying the organic layer with $MgSO_4$, the solvent was removed using a rotary evaporator. The reaction material was purified using column chromatography (DCM:Hex=1:3) and recrystallized with methanol to obtain target Compound ref 6 (8.9 g, 70%).

Preparation of Compound of Group 1

[Preparation Example 6] Preparation of Compound 1(C) of Group 1

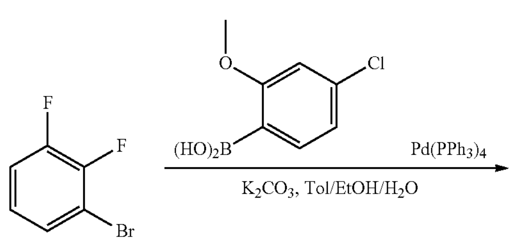

-continued

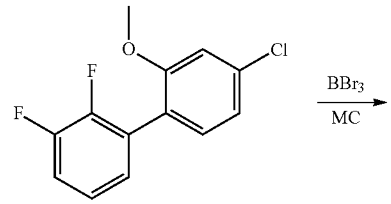

1-5

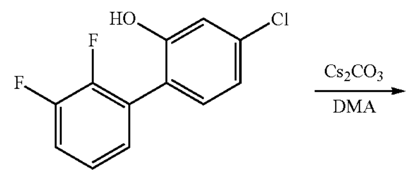

1-4

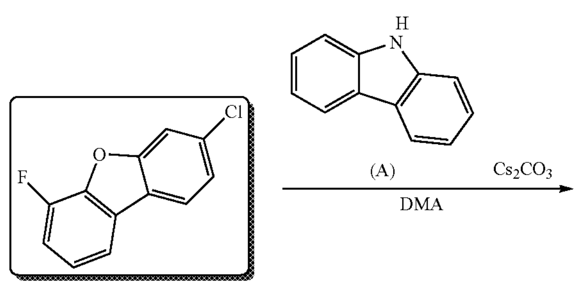

1-3

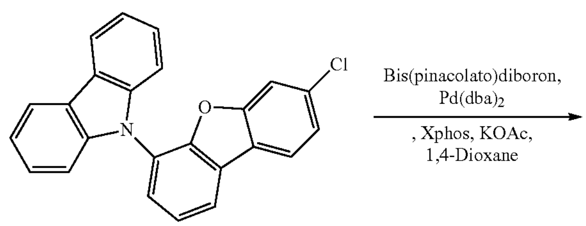

1-2

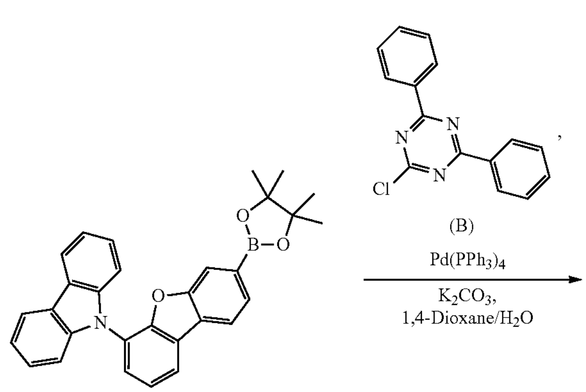

1-1

-continued

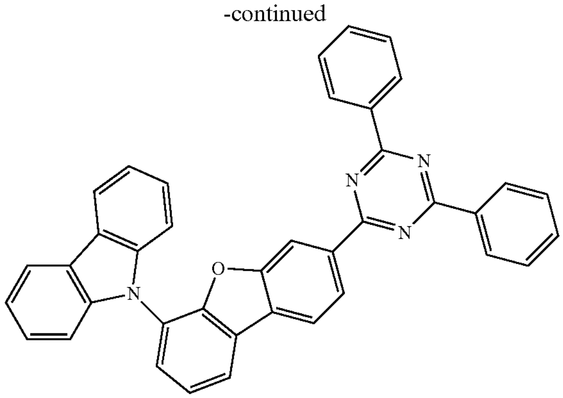

1(C)

Preparation of Compound 1-5

In a one neck round bottom flask (r.b.f), a mixture of 1-bromo-2,3-difluorobenzene (50 g, 259 mmol), (4-chloro-2-methoxyphenyl)boronic acid (57.7 g, 310 mmol), tetrakis (triphenylphosphine)palladium(0) (29 g, 25.9 mmol), potassium carbonate (71.5 g, 51.8 mmol) and toluene/ethanol/water (800 mL/160 mL/160 mL) was refluxed at 110° C.

The result was extracted with dichloromethane and dried with $MgSO_4$. The result was silica gel filtered and then concentrated to obtain Compound 1-5 (65 g, 99%).

Preparation of Compound 1-4

In a one neck round bottom flask (r.b.f), a mixture of 4'-chloro-2,3-difluoro-2'-methoxy-1,1'-biphenyl(65 g, 255 mmol) and MC (1000 mL) was cooled to 0° C., $BBr_3$ (48 mL, 500 mmol) was added dropwise thereto, and, after raising the temperature to room temperature, the result was stirred for 2 hours.

The reaction was terminated with distilled water, and the result was extracted with dichloromethane and dried with $MgSO_4$. The result was column purified (MC:HX=1:2) to obtain Compound 1-4 (49 g, 80%).

Preparation of Compound 1-3

In a one neck round bottom flask (r.b.f), a dimethylacetamide (500 ml) mixture of 4-chloro-2',3'-difluoro-[1,1'-biphenyl]-2-ol (49 g, 203 mmol) and $Cs_2CO_3$ (331 g, 1018 mmol) was stirred at 120° C. The result was cooled and then filtered, and, after removing the solvent of the filtrate, column purified (HX:MC=5:1) to obtain Compound 1-3 (10.1 g, 88%).

Preparation of Compound 1-2

In a one neck round bottom flask (r.b.f), a dimethylacetamide (100 ml) mixture of 3-chloro-6-fluorodibenzo[b,d]furan (9 g, 40.7 mmol), 9H-carbazole (8.1 g, 48.9 mmol) and $Cs_2CO_3$ (66.3 g, 203.5 mmol) was refluxed for 12 hours at 170° C.

The result was cooled and then filtered, and, after removing the solvent of the filtrate, column purified (HX:MC=4:1) to obtain Compound 1-2 (10.1 g, 67%).

Preparation of Compound 1-1

In a one neck round bottom flask (r.b.f), a 1,4-dioxane (100 ml) mixture of 9-(7-chlorodibenzo[b,d]furan-4-yl)-9H-carbazole (10.1 g, 27.4 mmol), bis(pinacolato)diboron (13.9 g, 54.9 mmol), XPhos (2.6 g, 5.48 mmol), potassium acetate (8 g, 82 mmol) and $Pd(dba)_2$ (1.57 g, 2.74 mmol) was refluxed at 140° C.

The result was extracted with dichloromethane, concentrated, and then treated with dichloromethane/MeOH to obtain Compound 1-1 (13.4 g, over yield).

Preparation of Compound 1

In a one neck round bottom flask (r.b.f), a mixture of 9-(7-(4,4,5,5-tetramethyl-1,3,2-dioxaborolan-2-yl)dibenzo[b,d]furan-4-yl)-9H-carbazole (12.5 g, 27.2 mmol), 2-chloro-4,6-diphenyl-1,3,5-triazine (8.74 g, 32.6 mmol), tetrakis(triphenylphosphine)palladium(0) (3.1 g, 2.72 mmol), potassium carbonate (7.5 g, 54.5 mmol) and 1,4-dioxane/water (150 mL/30 mL) was refluxed for 3 hours at 120° C. The result was filtered at 120° C., and then washed with 120° C. 1,4-dioxane, distilled water and MeOH to obtain Compound 1(C) (11.2 g, over two step 71%)

The following Compound C was synthesized in the same manner as in Preparation of Compound 1(C) of Preparation Example 6 except that A and B of the following [Table 3] were used as intermediates.

TABLE 3

| Compound | A | B |
|---|---|---|
| 2 | 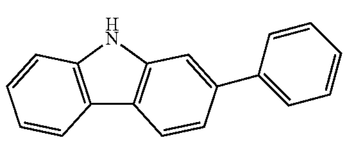 | 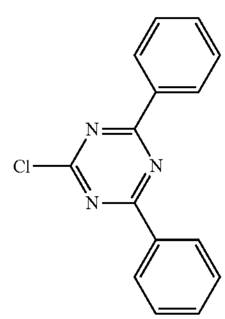 |

TABLE 3-continued
| | | |
|---|---|---|
| 3 | 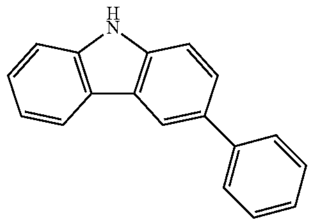 | 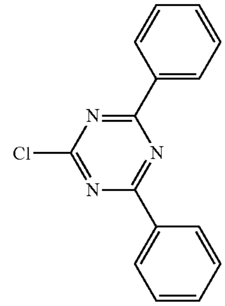 |
| 5 | 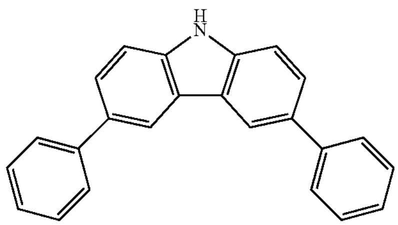 | 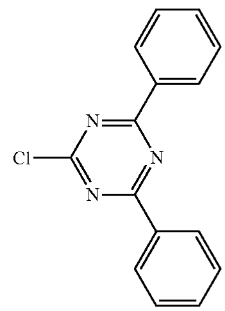 |
| 7 | 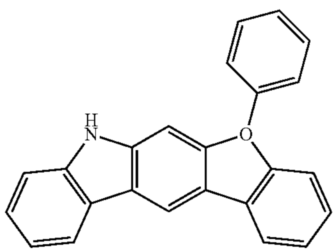 | 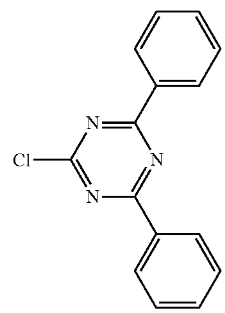 |
| 10 | 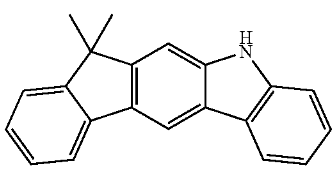 | 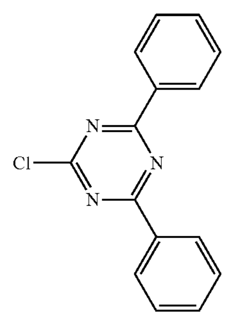 |
| 17 | 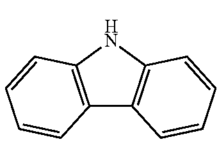 | 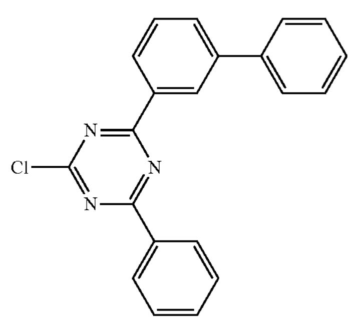 |

TABLE 3-continued
| | | |
|---|---|---|
| 18 | 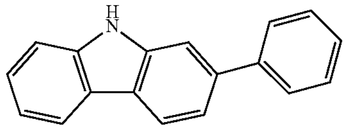 | 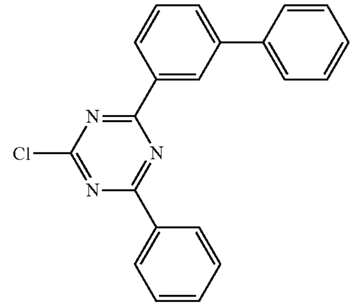 |
| 19 | 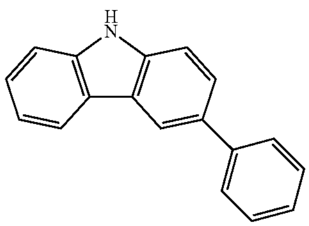 | 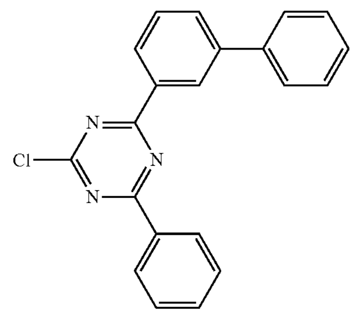 |
| 22 | 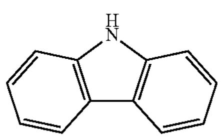 | 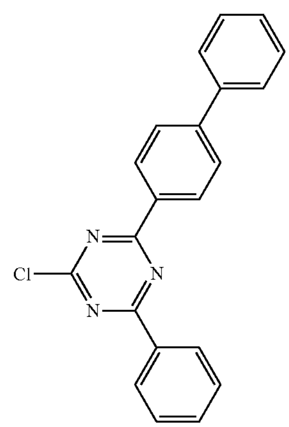 |
| 28 | 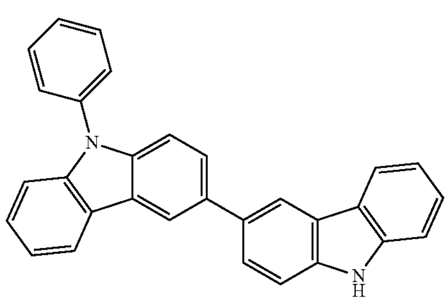 | 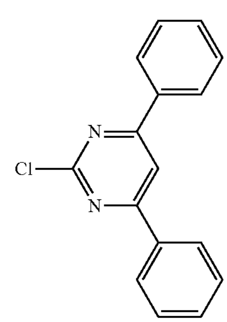 |

TABLE 3-continued
| | | |
|---|---|---|
| 29 | 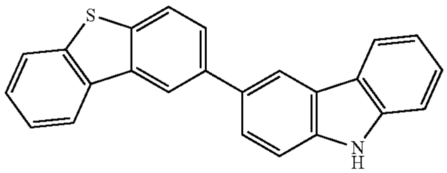 | 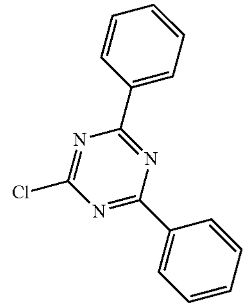 |
| 34 | 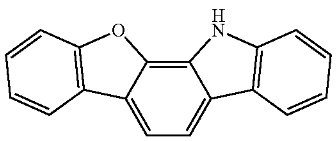 | 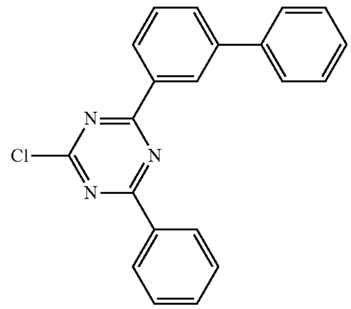 |
| 38 | 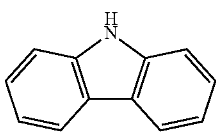 | 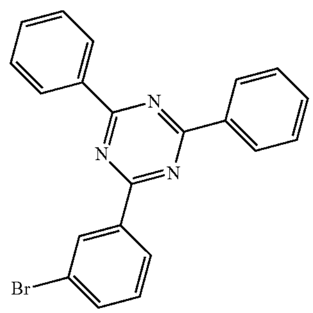 |
| 39 | 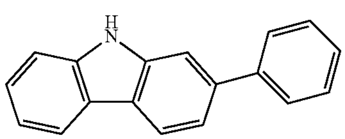 | 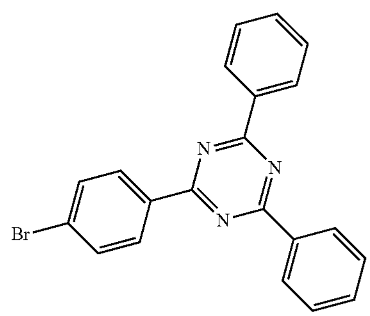 |
| 43 | 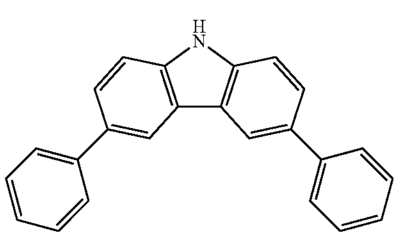 | 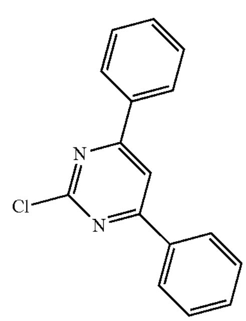 |

TABLE 3-continued
| | | |
|---|---|---|
| 45 | 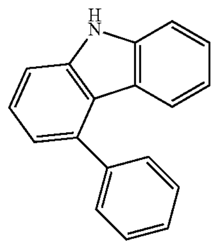 | 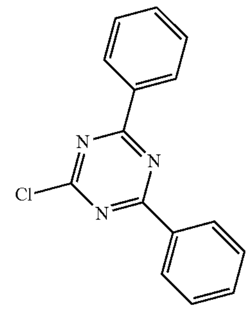 |
| 48 | 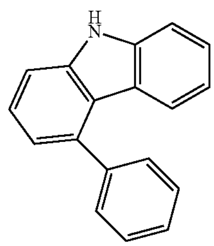 | 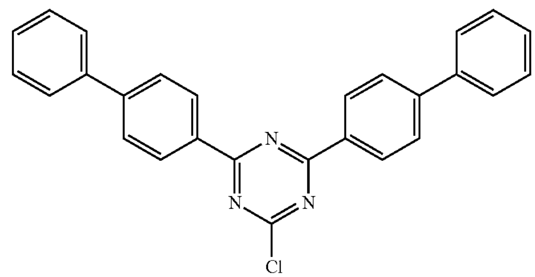 |
| 51 | 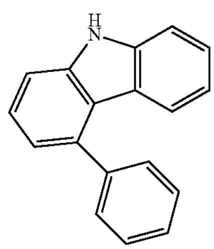 | 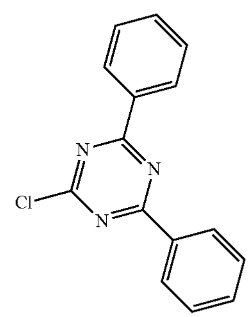 |
| 53 | 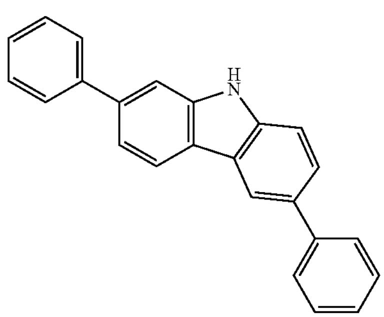 | 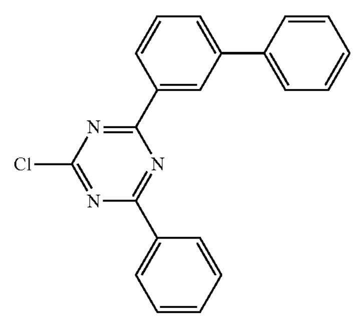 |
| 59 | 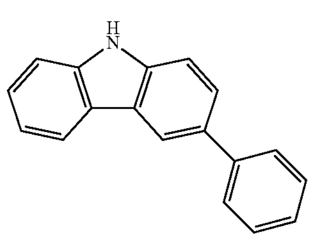 | 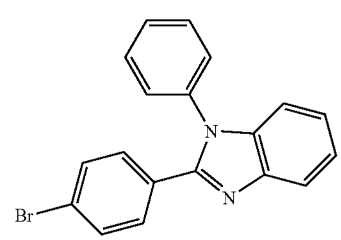 |

TABLE 3-continued
| | | |
|---|---|---|
| 62 | 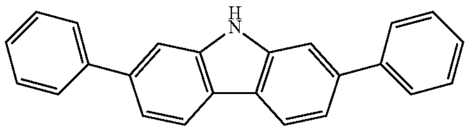 [SMILES: c1ccc(-c2ccc3c(c2)[nH]c2cc(-c4ccccc4)ccc23)cc1] | 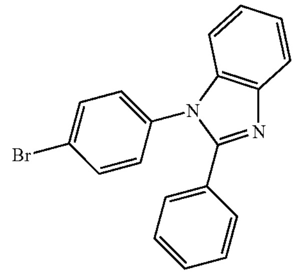 [SMILES: Brc1ccc(-n2c(-c3ccccc3)nc3ccccc32)cc1] |
| 65 | 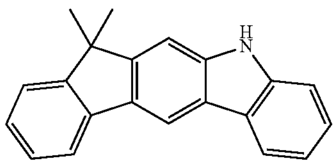 [SMILES: CC1(C)c2ccccc2-c2cc3c(cc21)[nH]c1ccccc13] | 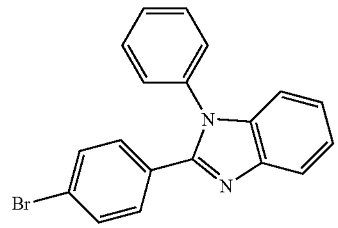 [SMILES: Brc1ccc(-c2nc3ccccc3n2-c2ccccc2)cc1] |
| 67 | 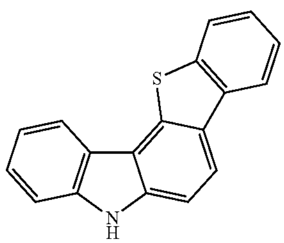 [SMILES: c1ccc2c(c1)[nH]c1ccc3c4ccccc4sc3c12] | 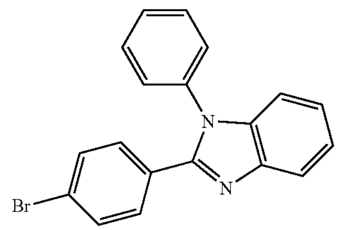 [SMILES: Brc1ccc(-c2nc3ccccc3n2-c2ccccc2)cc1] |
| 70 | 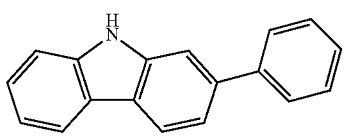 [SMILES: c1ccc(-c2ccc3c(c2)[nH]c2ccccc23)cc1] | 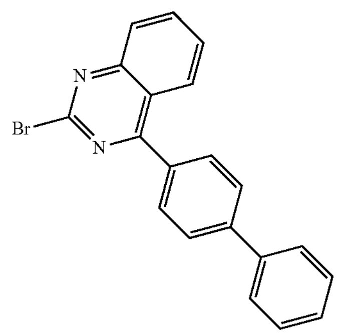 [SMILES: Brc1nc(-c2ccc(-c3ccccc3)cc2)c2ccccc2n1] |
| 71 | 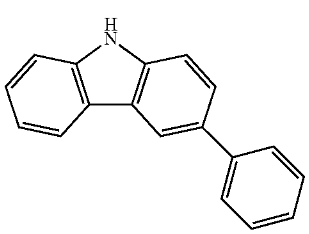 [SMILES: c1ccc(-c2ccc3[nH]c4ccccc4c3c2)cc1] | 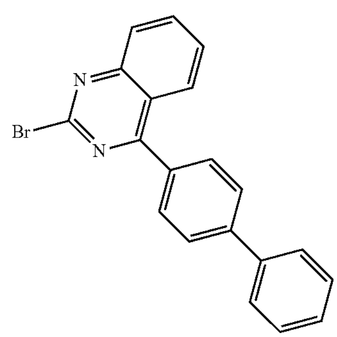 [SMILES: Brc1nc(-c2ccc(-c3ccccc3)cc2)c2ccccc2n1] |

TABLE 3-continued
| | | |
|---|---|---|
| 75 | 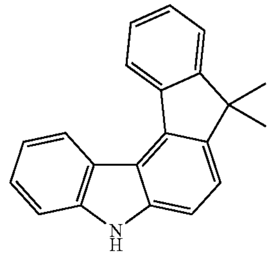 [SMILES: CC1(C)c2ccccc2-c2c1ccc1[nH]c3ccccc3c21] | 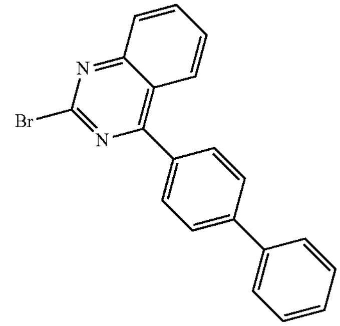 [SMILES: Brc1nc(-c2ccc(-c3ccccc3)cc2)c2ccccc2n1] |
| 77 | 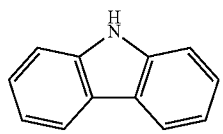 [SMILES: c1ccc2c(c1)[nH]c1ccccc12] | 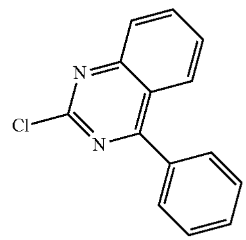 [SMILES: Clc1nc(-c2ccccc2)c2ccccc2n1] |
| 80 | 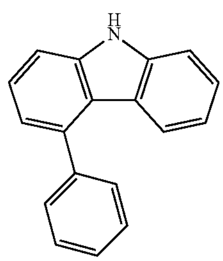 [SMILES: c1ccc(-c2cccc3[nH]c4ccccc4c23)cc1] | 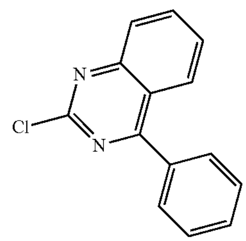 [SMILES: Clc1nc(-c2ccccc2)c2ccccc2n1] |
| 83 | 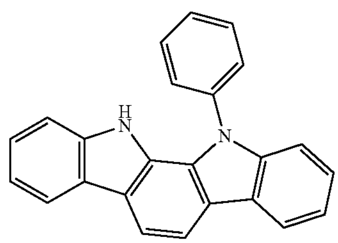 [SMILES: c1ccc(-n2c3ccccc3c3ccc4c5ccccc5[nH]c4c32)cc1] | 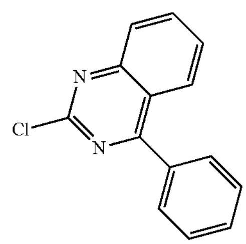 [SMILES: Clc1nc(-c2ccccc2)c2ccccc2n1] |
| 86 | 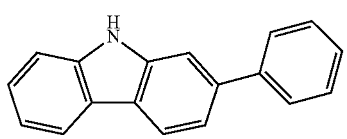 [SMILES: c1ccc(-c2ccc3c(c2)[nH]c2ccccc23)cc1] | 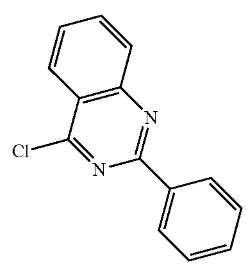 [SMILES: Clc1nc(-c2ccccc2)nc2ccccc12] |
| 90 | 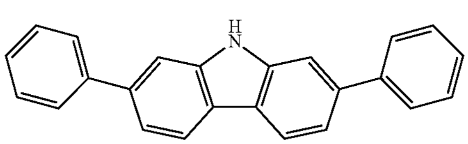 [SMILES: c1ccc(-c2ccc3c(c2)[nH]c2cc(-c4ccccc4)ccc23)cc1] | 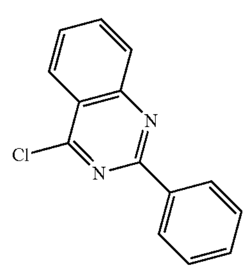 [SMILES: Clc1nc(-c2ccccc2)nc2ccccc12] |

TABLE 3-continued
| | | |
|---|---|---|
| 92 | 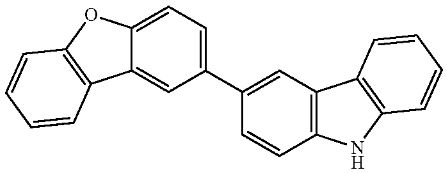 [SMILES: c1ccc2c(c1)[nH]c1ccc(-c3ccc4oc5ccccc5c4c3)cc12] | 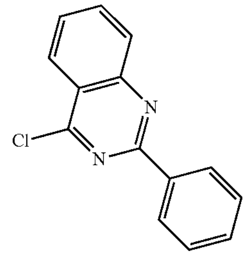 [SMILES: Clc1nc(-c2ccccc2)nc2ccccc12] |
| 95 | 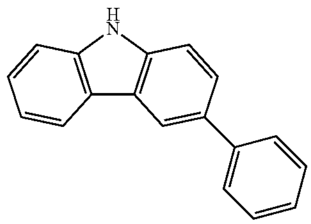 [SMILES: c1ccc(-c2ccc3[nH]c4ccccc4c3c2)cc1] | 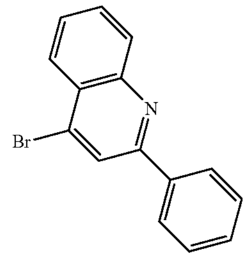 [SMILES: Brc1cc(-c2ccccc2)nc2ccccc12] |
| 100 | 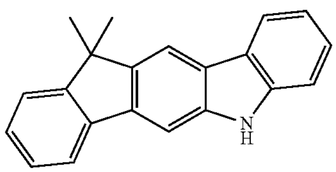 [SMILES: CC1(C)c2ccccc2-c2cc3[nH]c4ccccc4c3cc21] | 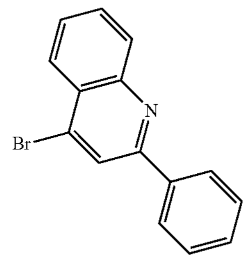 [SMILES: Brc1cc(-c2ccccc2)nc2ccccc12] |
| 101 | 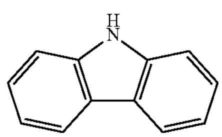 [SMILES: c1ccc2c(c1)[nH]c1ccccc12] | 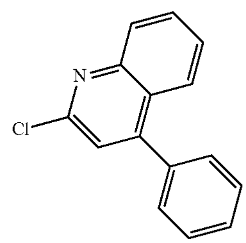 [SMILES: Clc1cc(-c2ccccc2)c2ccccc2n1] |
| 109 | 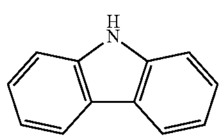 [SMILES: c1ccc2c(c1)[nH]c1ccccc12] | 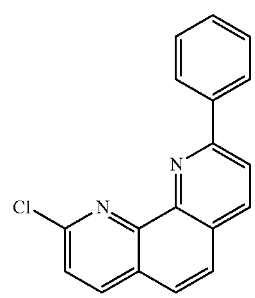 [SMILES: Clc1ccc2ccc3ccc(-c4ccccc4)nc3c2n1] |
| 115 | 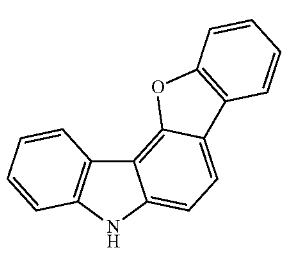 [SMILES: c1ccc2c(c1)[nH]c1ccc3c4ccccc4oc3c12] | 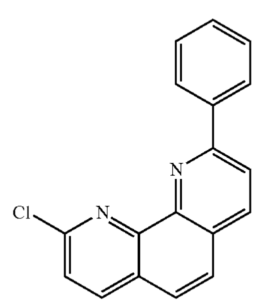 [SMILES: Clc1ccc2ccc3ccc(-c4ccccc4)nc3c2n1] |

TABLE 3-continued
| | | |
|---|---|---|
| 118 | 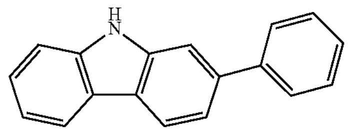 [SMILES: c1ccc(-c2ccc3c(c2)[nH]c2ccccc23)cc1] | 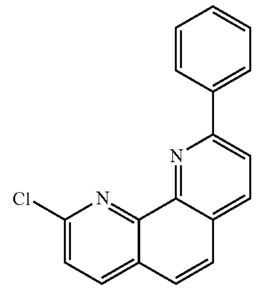 [SMILES: Clc1ccc2ccc3ccc(-c4ccccc4)nc3c2n1] |
| 121 | 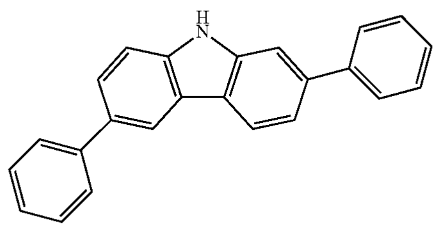 [SMILES: c1ccc(-c2ccc3c(c2)[nH]c2ccc(-c4ccccc4)cc23)cc1] | 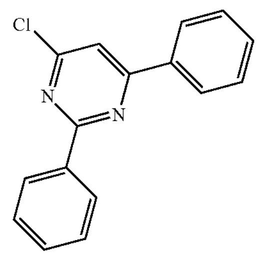 [SMILES: Clc1cc(-c2ccccc2)nc(-c2ccccc2)n1] |
| 126 | 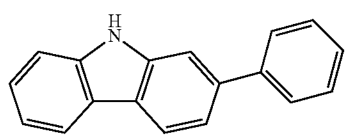 [SMILES: c1ccc(-c2ccc3c(c2)[nH]c2ccccc23)cc1] | 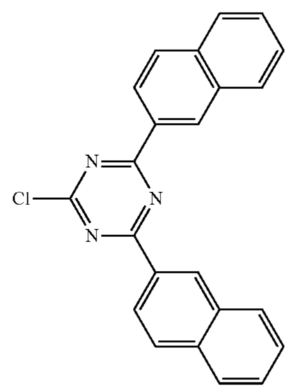 [SMILES: Clc1nc(-c2ccc3ccccc3c2)nc(-c2ccc3ccccc3c2)n1] |
| 127 | 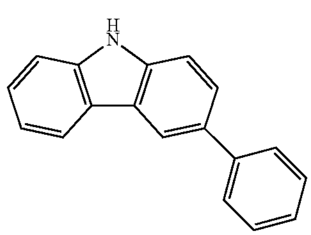 [SMILES: c1ccc(-c2ccc3[nH]c4ccccc4c3c2)cc1] | 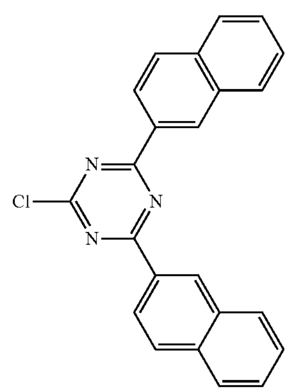 [SMILES: Clc1nc(-c2ccc3ccccc3c2)nc(-c2ccc3ccccc3c2)n1] |

TABLE 3-continued
129
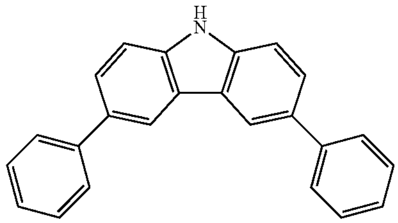 [SMILES: c1ccc(-c2ccc3[nH]c4ccc(-c5ccccc5)cc4c3c2)cc1]
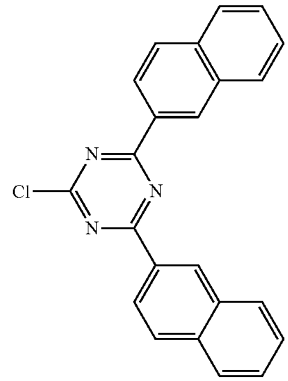 [SMILES: Clc1nc(-c2ccc3ccccc3c2)nc(-c2ccc3ccccc3c2)n1]
133
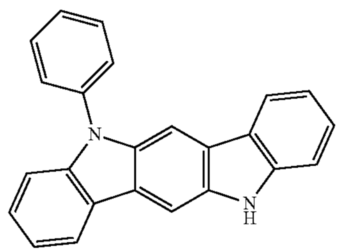 [SMILES: c1ccc(-n2c3ccccc3c3cc4[nH]c5ccccc5c4cc32)cc1]
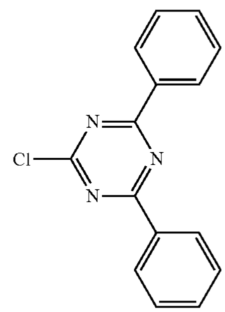 [SMILES: Clc1nc(-c2ccccc2)nc(-c2ccccc2)n1]
135
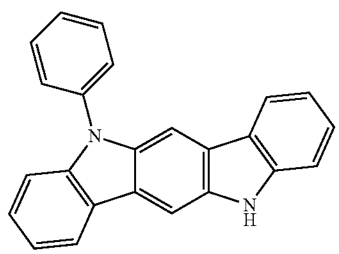 [SMILES: c1ccc(-n2c3ccccc3c3cc4[nH]c5ccccc5c4cc32)cc1]
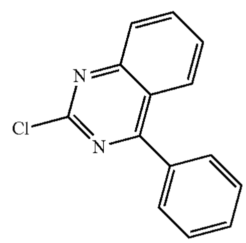 [SMILES: Clc1nc(-c2ccccc2)c2ccccc2n1]
293
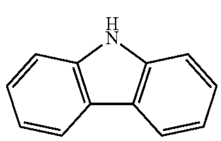 [SMILES: c1ccc2c(c1)[nH]c1ccccc12]
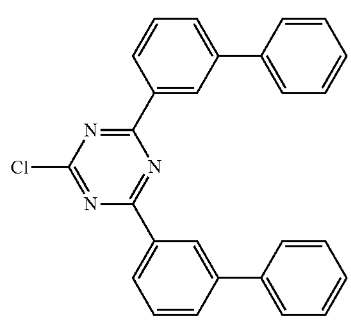 [SMILES: Clc1nc(-c2cccc(-c3ccccc3)c2)nc(-c2cccc(-c3ccccc3)c2)n1]

TABLE 3-continued
| | | |
|---|---|---|
| 294 | 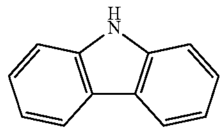 [SMILES: c1ccc2c(c1)[nH]c1ccccc12] | 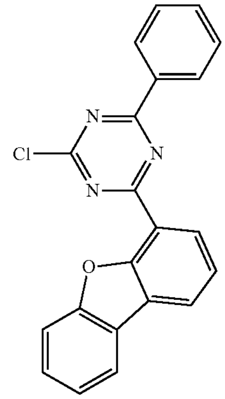 [SMILES: Clc1nc(-c2ccccc2)nc(-c2cccc3c2oc2ccccc23)n1] |
| 297 | 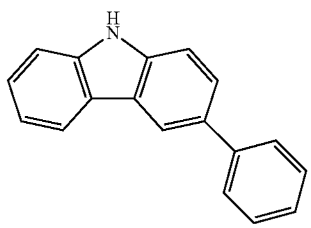 [SMILES: c1ccc(-c2ccc3[nH]c4ccccc4c3c2)cc1] | 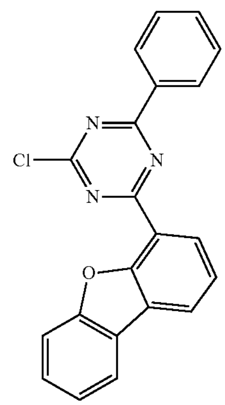 [SMILES: Clc1nc(-c2ccccc2)nc(-c2cccc3c2oc2ccccc23)n1] |
| Compound | C | Yield (1-3 to C) |
|---|---|---|
| 2 | 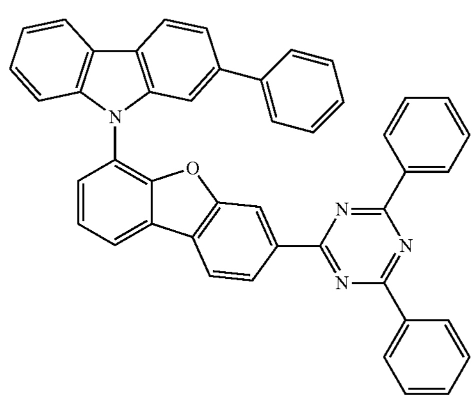 | 71% |

TABLE 3-continued
| | | |
|---|---|---|
| 3 | 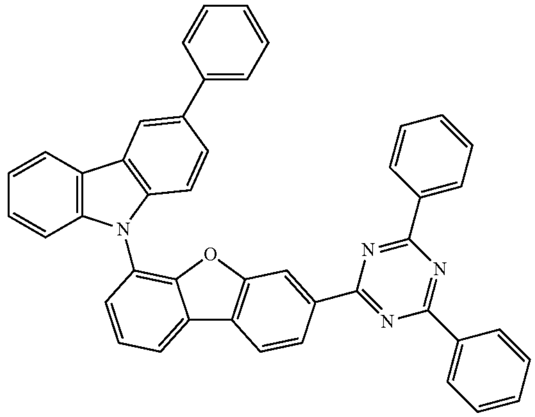 | 74% |
| 5 | 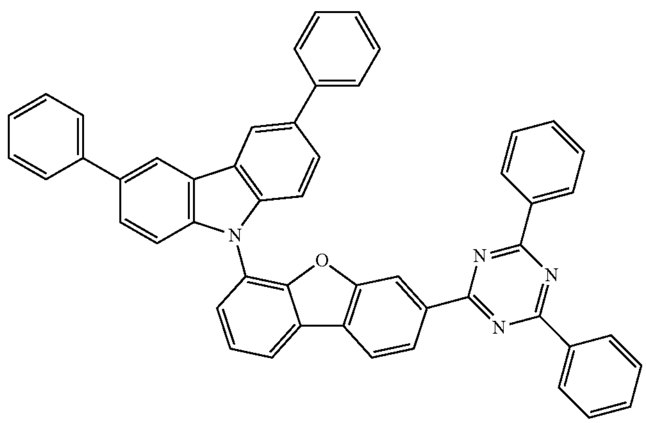 | 67% |
| 7 | 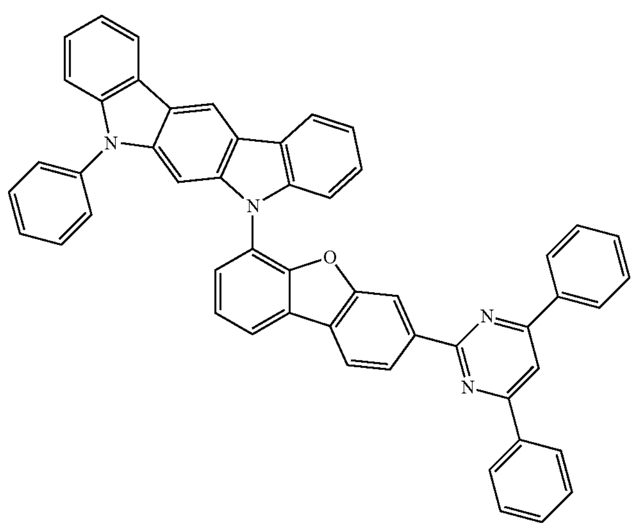 | 66% |

TABLE 3-continued
10 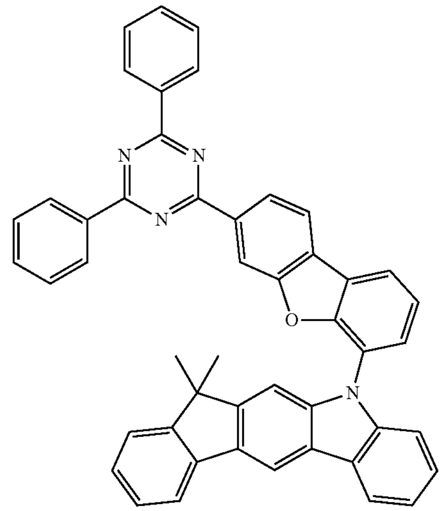 [SMILES: CC1(C)c2ccccc2-c2cc3c4ccccc4n(-c4cccc5c4oc4cc(-c6nc(-c7ccccc7)nc(-c7ccccc7)n6)ccc45)c3cc21] 70%
17 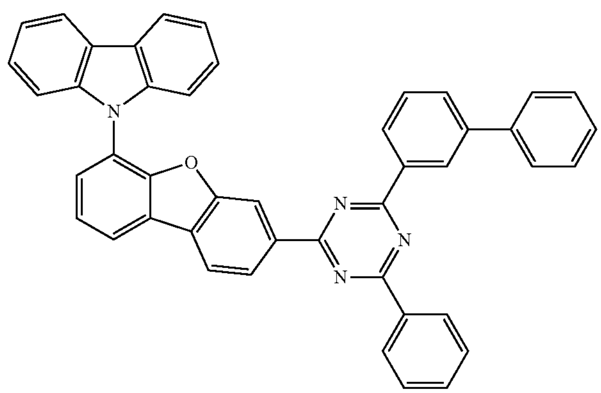 [SMILES: c1ccc(-c2cccc(-c3nc(-c4ccccc4)nc(-c4ccc5c(c4)oc4c(-n6c7ccccc7c7ccccc76)cccc45)n3)c2)cc1] 66%
18 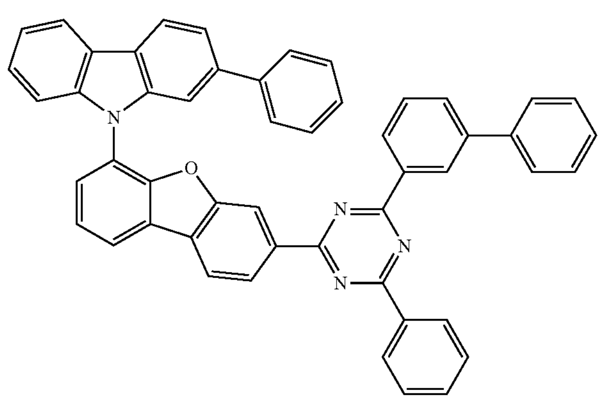 [SMILES: c1ccc(-c2cccc(-c3nc(-c4ccccc4)nc(-c4ccc5c(c4)oc4c(-n6c7ccccc7c7ccc(-c8ccccc8)cc76)cccc45)n3)c2)cc1] 71%

TABLE 3-continued
| | | |
|---|---|---|
| 19 | 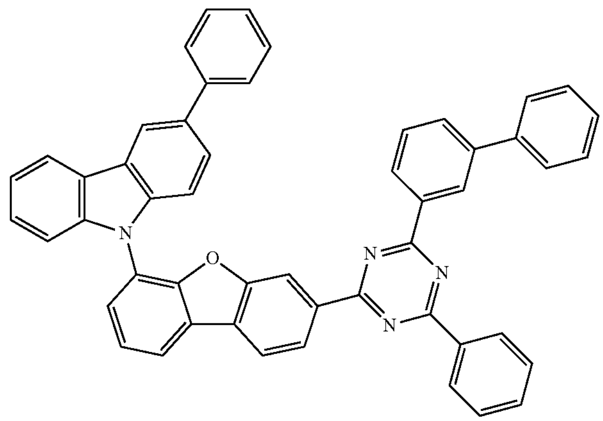 | 74% |
| 22 | 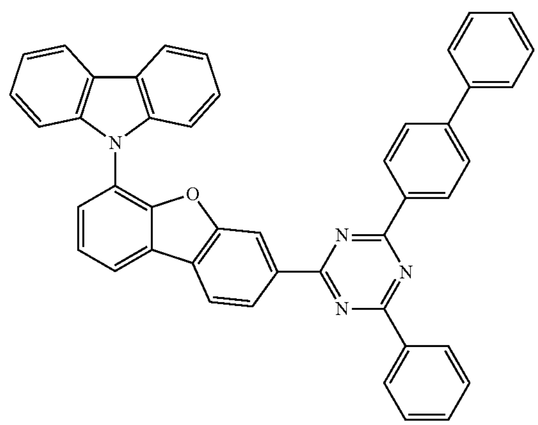 | 78% |
| 28 | 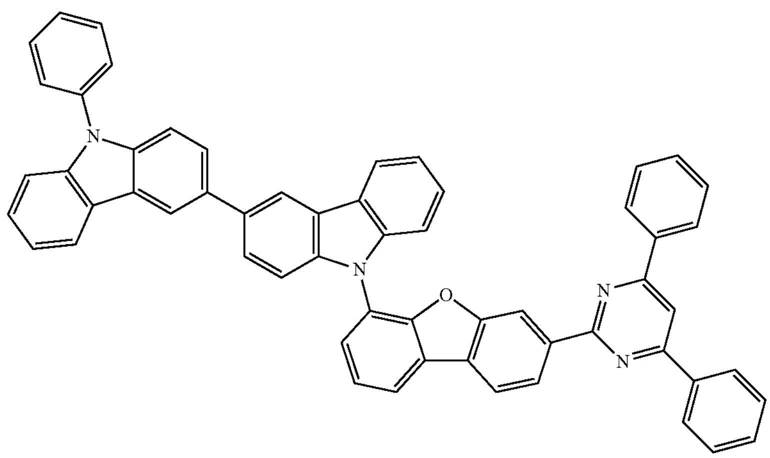 | 61% |

TABLE 3-continued
| | | |
|---|---|---|
| 29 | 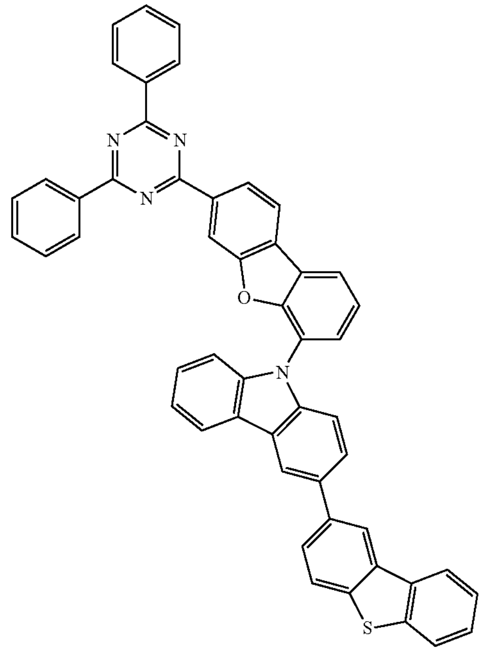 | 67% |
| 34 | 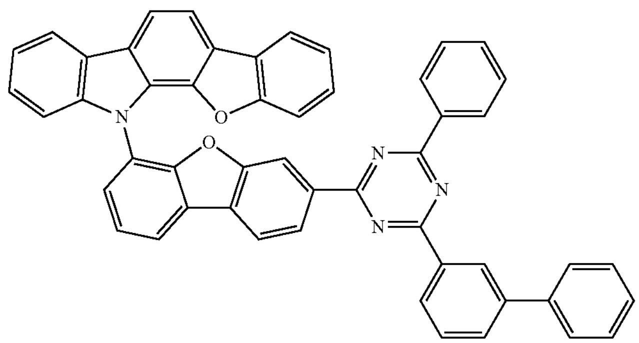 | 71% |
| 38 | 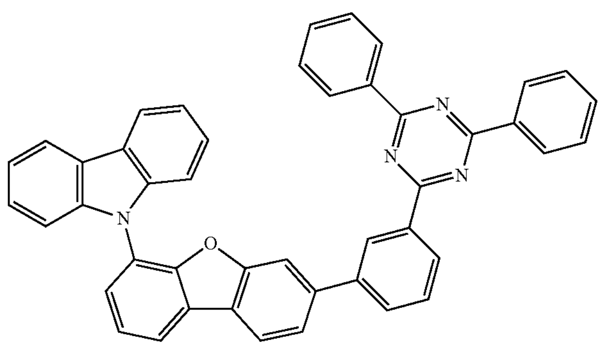 | 77% |
| 39 | 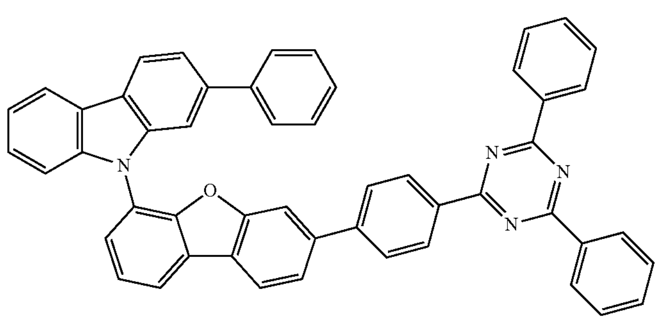 | 74% |

TABLE 3-continued
43 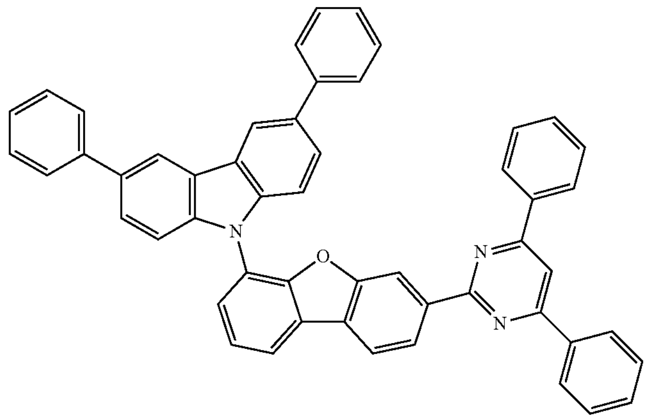 [SMILES: c1ccc(-c2ccc3c(c2)c2cc(-c4ccccc4)ccc2n3-c2cccc3c2oc2cc(-c4nc(-c5ccccc5)cc(-c5ccccc5)n4)ccc23)cc1] 62%
45 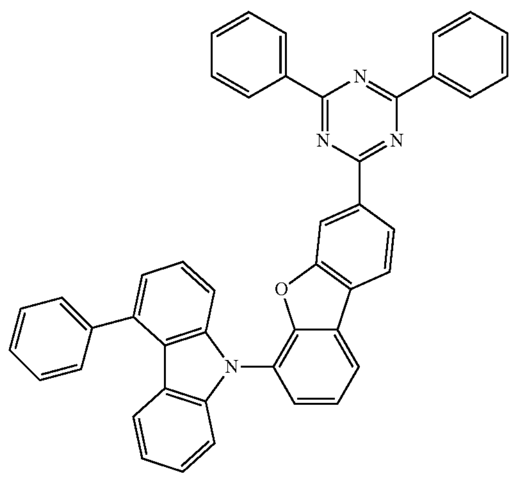 [SMILES: c1ccc(-c2nc(-c3ccccc3)nc(-c3ccc4c(c3)oc3c(-n5c6ccccc6c6c(-c7ccccc7)cccc65)cccc34)n2)cc1] 49%
48 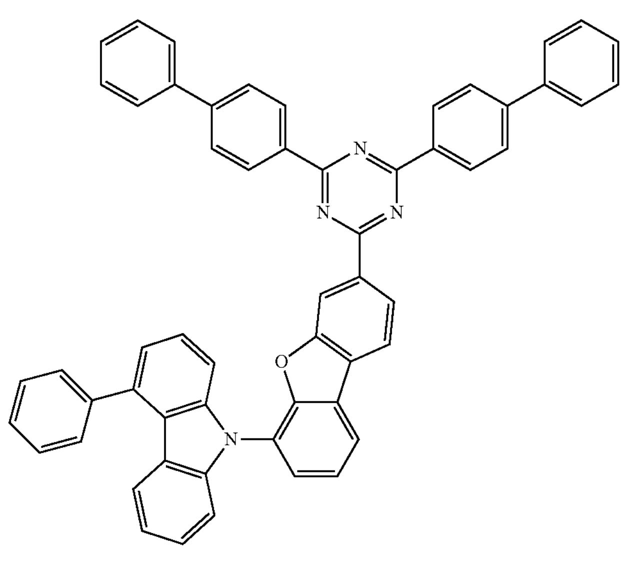 [SMILES: c1ccc(-c2ccc(-c3nc(-c4ccc(-c5ccccc5)cc4)nc(-c4ccc5c(c4)oc4c(-n6c7ccccc7c7c(-c8ccccc8)cccc76)cccc45)n3)cc2)cc1] 53%

TABLE 3-continued
| | | |
|---|---|---|
| 51 | 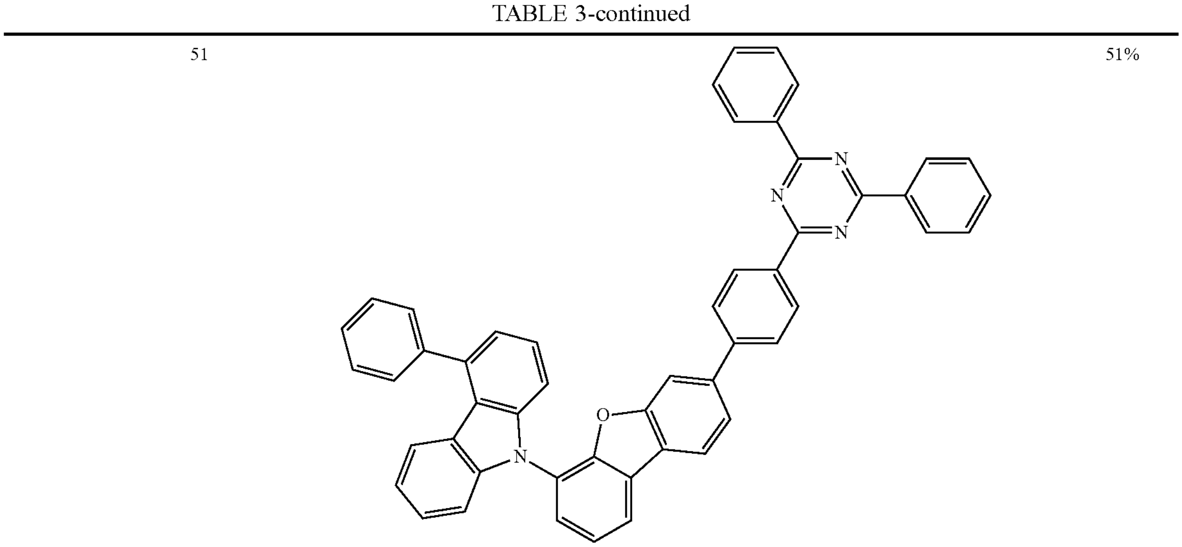 | 51% |
| 53 | 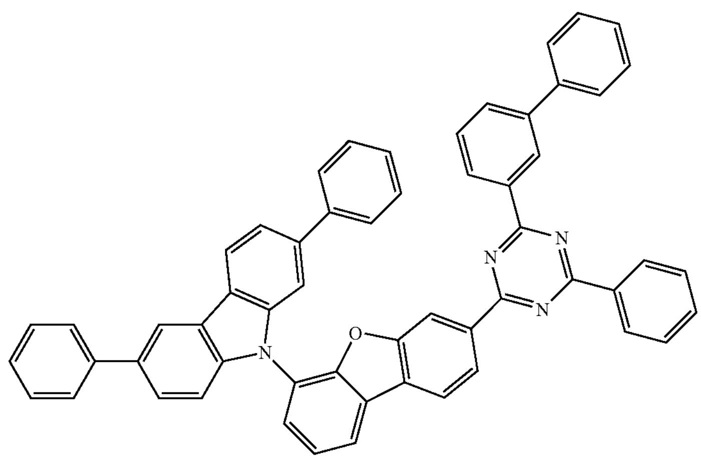 | 46% |
| 59 | 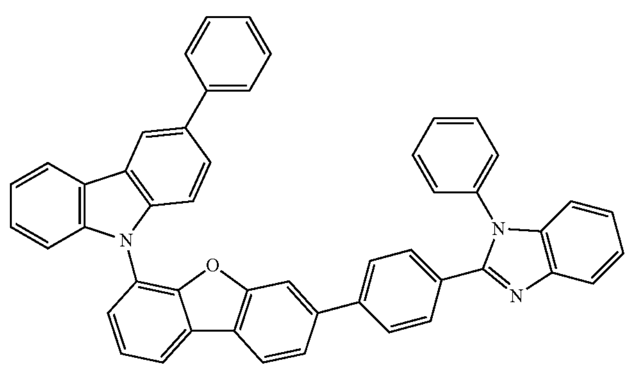 | 68% |
| 62 | 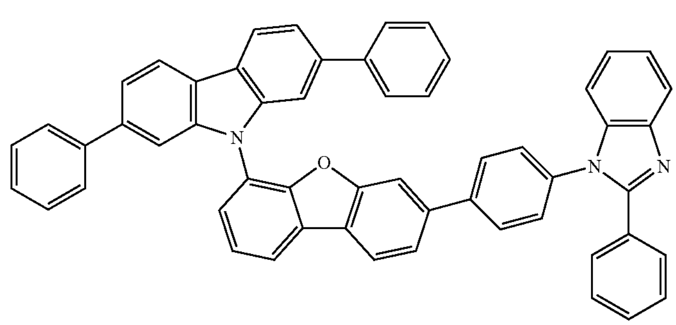 | 67% |

TABLE 3-continued
| | | |
|---|---|---|
| 65 | 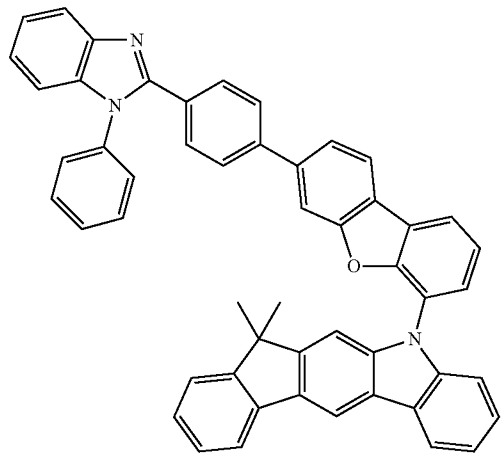 [SMILES: CC1(C)c2ccccc2-c2cc3c4ccccc4n(-c4cccc5c4oc4cc(-c6ccc(-c7nc8ccccc8n7-c7ccccc7)cc6)ccc45)c3cc21] | 63% |
| 67 | 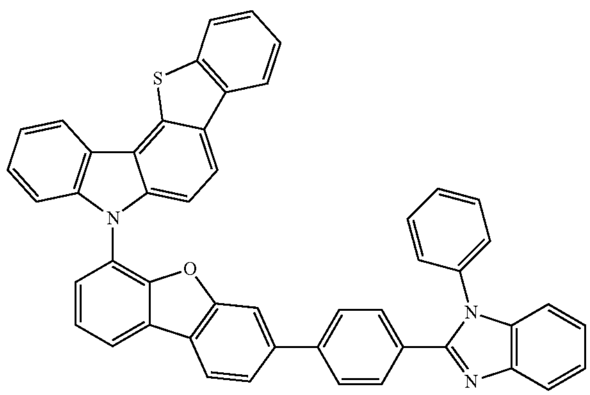 [SMILES: c1ccc(-n2c(-c3ccc(-c4ccc5c(c4)oc4c(-n6c7ccccc7c7c8sc9ccccc9c8ccc76)cccc45)cc3)nc3ccccc32)cc1] | 71% |
| 70 | 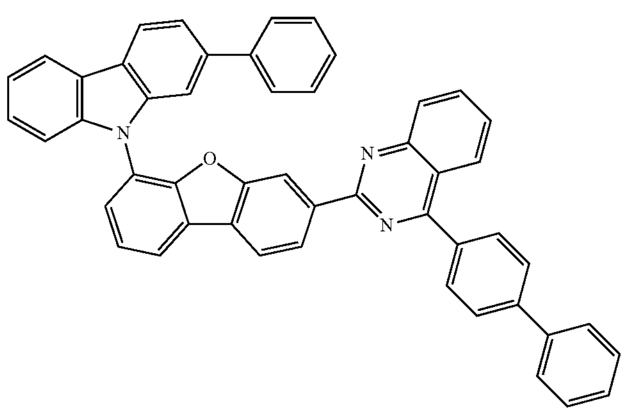 [SMILES: c1ccc(-c2ccc(-c3nc(-c4ccc5c(c4)oc4c(-n6c7ccccc7c7ccc(-c8ccccc8)cc76)cccc45)nc4ccccc34)cc2)cc1] | 70% |

TABLE 3-continued
| | | |
|---|---|---|
| 71 | 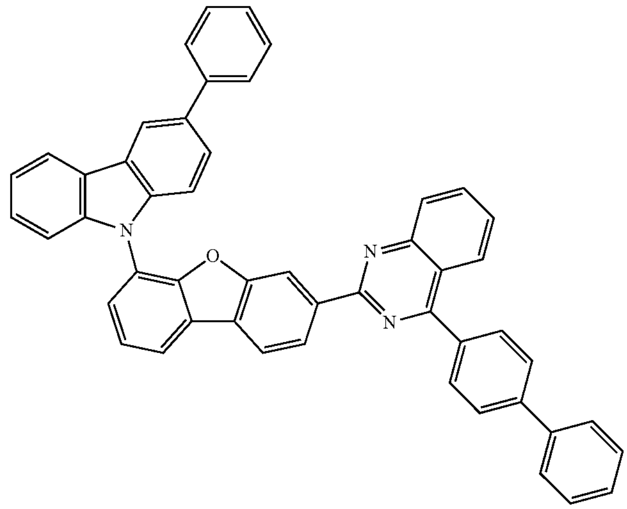 [SMILES: c1ccc(-c2ccc(-c3nc(-c4ccc5c(c4)oc4c(-n6c7ccccc7c7cc(-c8ccccc8)ccc76)cccc45)nc4ccccc34)cc2)cc1] | 69% |
| 75 | 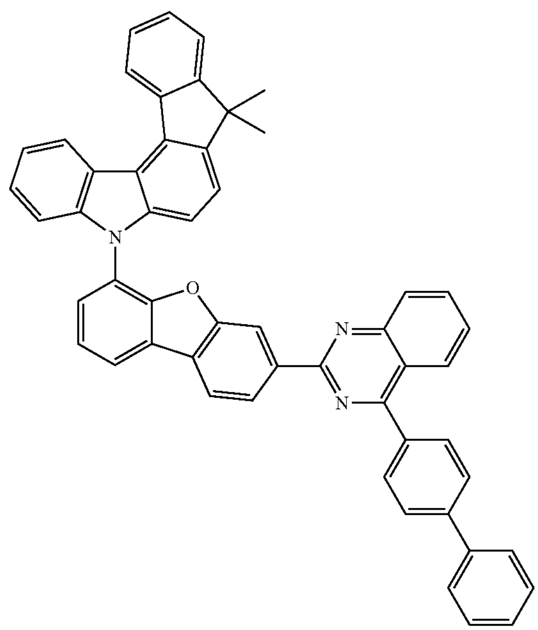 [SMILES: CC1(C)c2ccccc2-c2c1ccc1c2c2ccccc2n1-c1cccc2c1oc1cc(-c3nc(-c4ccc(-c5ccccc5)cc4)c4ccccc4n3)ccc12] | 68% |
| 77 | 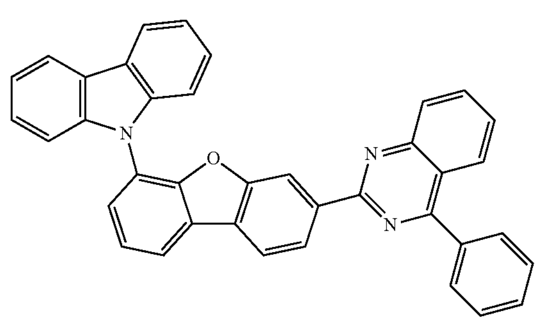 [SMILES: c1ccc(-c2nc(-c3ccc4c(c3)oc3c(-n5c6ccccc6c6ccccc65)cccc34)nc3ccccc23)cc1] | 70% |

TABLE 3-continued
| | | |
|---|---|---|
| 80 | 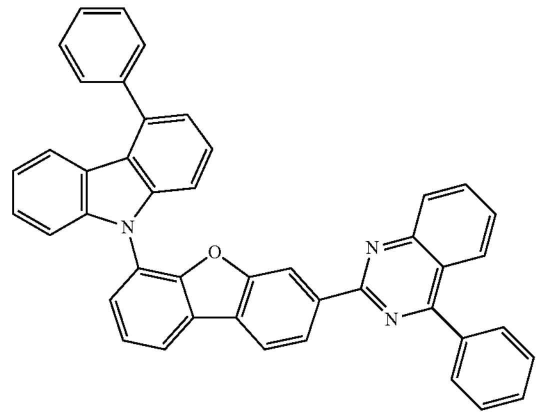 [SMILES: c1ccc(-c2nc(-c3ccc4c(c3)oc3c(-n5c6ccccc6c6c(-c7ccccc7)cccc65)cccc34)nc3ccccc23)cc1] | 63% |
| 83 | 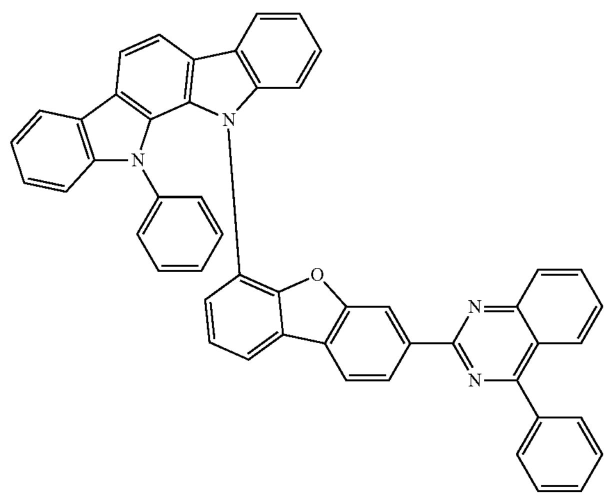 [SMILES: c1ccc(-c2nc(-c3ccc4c(c3)oc3c(-n5c6ccccc6c6ccc7c8ccccc8n(-c8ccccc8)c7c65)cccc34)nc3ccccc23)cc1] | 65% |
| 86 | 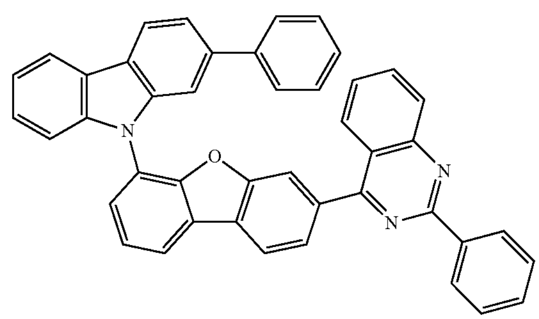 [SMILES: c1ccc(-c2ccc3c4ccccc4n(-c4cccc5c4oc4cc(-c6nc(-c7ccccc7)nc7ccccc67)ccc45)c3c2)cc1] | 67% |
| 90 | 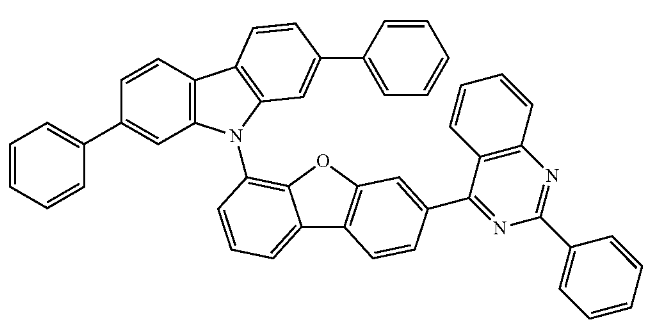 [SMILES: c1ccc(-c2ccc3c4ccc(-c5ccccc5)cc4n(-c4cccc5c4oc4cc(-c6nc(-c7ccccc7)nc7ccccc67)ccc45)c3c2)cc1] | 66% |

TABLE 3-continued
| | | |
|---|---|---|
| 92 | 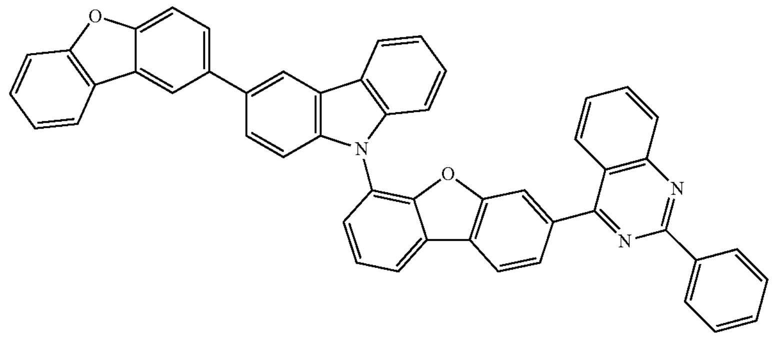 [SMILES: c1ccc(-c2nc(-c3ccc4c(c3)oc3c(-n5c6ccccc6c6cc(-c7ccc8oc9ccccc9c8c7)ccc65)cccc34)c3ccccc3n2)cc1] | 61% |
| 95 | 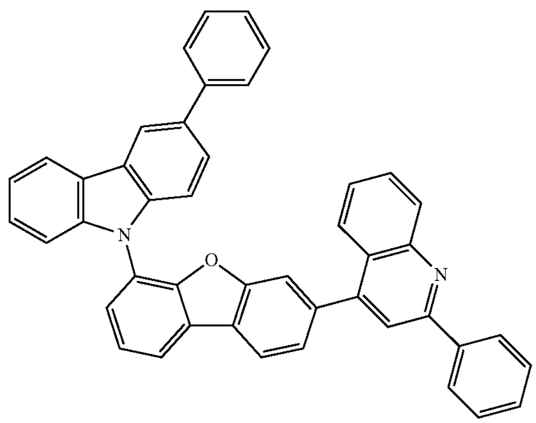 [SMILES: c1ccc(-c2ccc3c(c2)c2ccccc2n3-c2cccc3c2oc2cc(-c4cc(-c5ccccc5)nc5ccccc45)ccc23)cc1] | 51% |
| 100 | 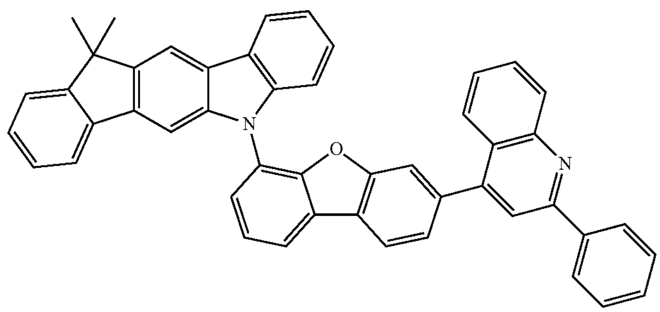 [SMILES: CC1(C)c2ccccc2-c2cc3c(cc21)c1ccccc1n3-c1cccc2c1oc1cc(-c3cc(-c4ccccc4)nc4ccccc34)ccc12] | 54% |
| 101 | 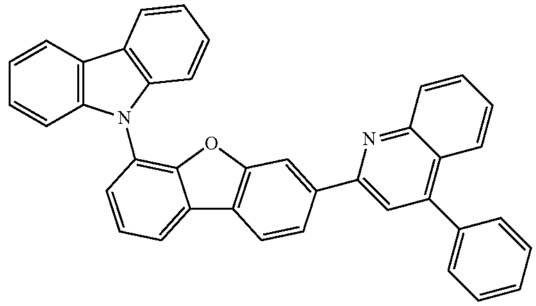 [SMILES: c1ccc(-c2cc(-c3ccc4c(c3)oc3c(-n5c6ccccc6c6ccccc65)cccc34)nc3ccccc23)cc1] | 49% |

TABLE 3-continued
109 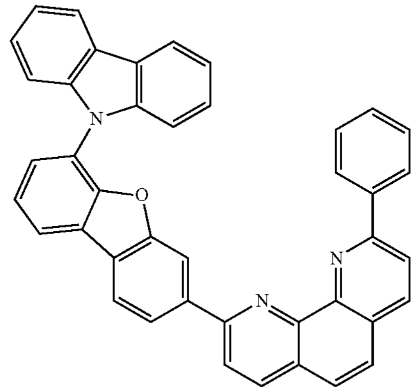 [SMILES: c1ccc(-c2ccc3ccc4ccc(-c5ccc6c(c5)oc5c(-n7c8ccccc8c8ccccc87)cccc56)nc4c3n2)cc1] 61%
115 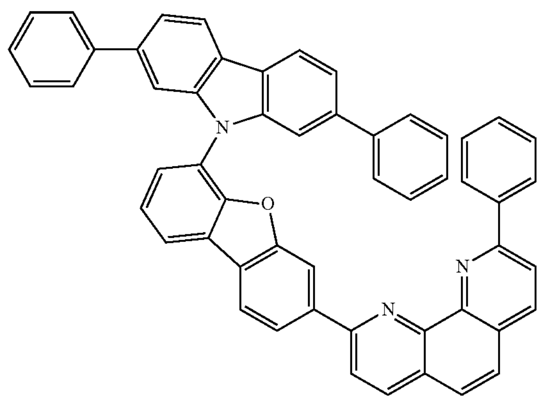 [SMILES: c1ccc(-c2ccc3c4ccc(-c5ccccc5)cc4n(-c4cccc5c4oc4cc(-c6ccc7ccc8ccc(-c9ccccc9)nc8c7n6)ccc45)c3c2)cc1] 60%
118 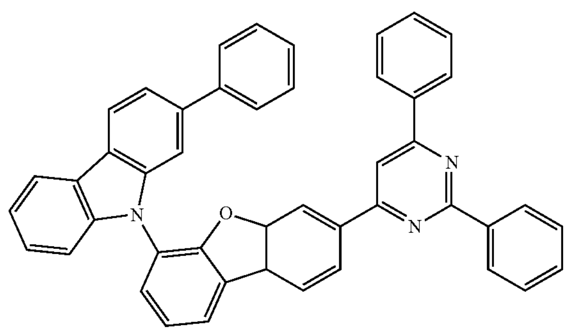 [SMILES: C1=CC2c3cccc(-n4c5ccccc5c5ccc(-c6ccccc6)cc54)c3OC2C=C1c1cc(-c2ccccc2)nc(-c2ccccc2)n1] 59%
121 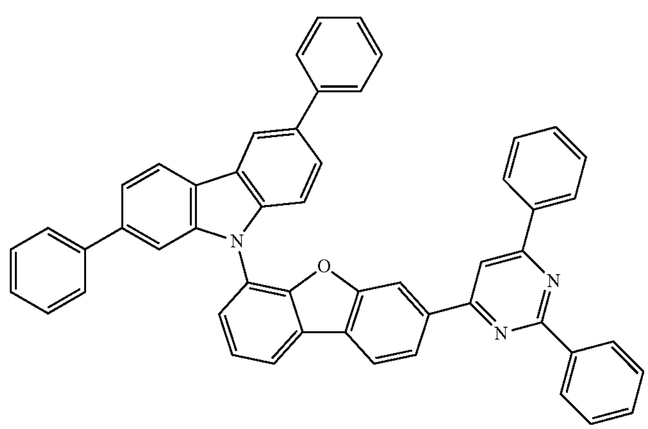 [SMILES: c1ccc(-c2ccc3c(c2)c2ccc(-c4ccccc4)cc2n3-c2cccc3c2oc2cc(-c4cc(-c5ccccc5)nc(-c5ccccc5)n4)ccc23)cc1] 68%

TABLE 3-continued
| | | |
|---|---|---|
| 126 | 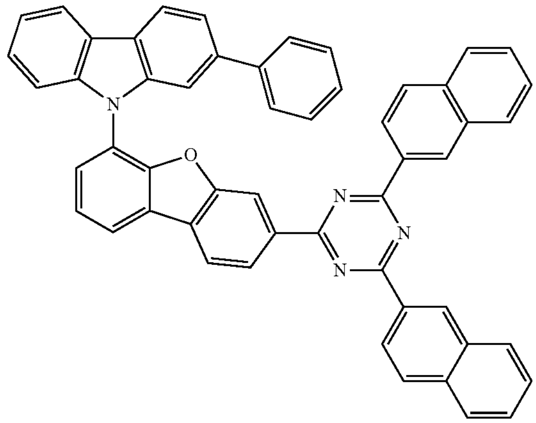 [SMILES: c1ccc(-c2ccc3c4ccccc4n(-c4cccc5c4oc4cc(-c6nc(-c7ccc8ccccc8c7)nc(-c7ccc8ccccc8c7)n6)ccc45)c3c2)cc1] | 64% |
| 127 | 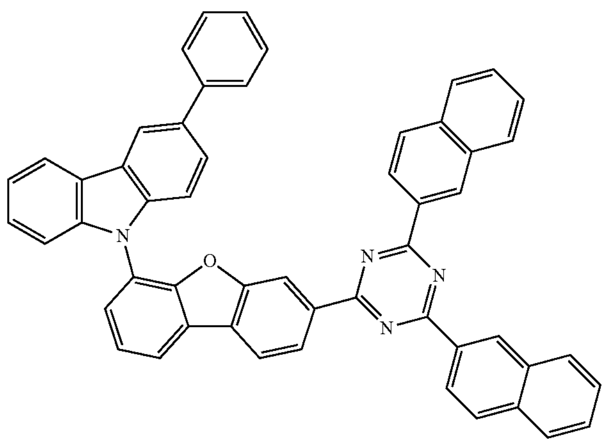 [SMILES: c1ccc(-c2ccc3c(c2)c2ccccc2n3-c2cccc3c2oc2cc(-c4nc(-c5ccc6ccccc6c5)nc(-c5ccc6ccccc6c5)n4)ccc23)cc1] | 66% |
| 129 | 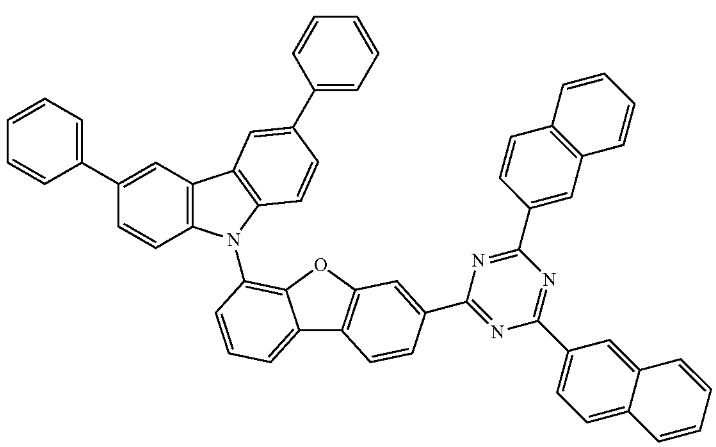 [SMILES: c1ccc(-c2ccc3c(c2)c2cc(-c4ccccc4)ccc2n3-c2cccc3c2oc2cc(-c4nc(-c5ccc6ccccc6c5)nc(-c5ccc6ccccc6c5)n4)ccc23)cc1] | 69% |

TABLE 3-continued
| | | |
|---|---|---|
| 133 | 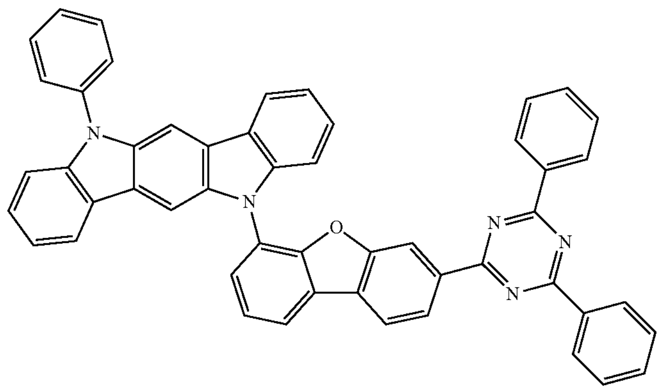 [SMILES: c1ccc(-c2nc(-c3ccccc3)nc(-c3ccc4c(c3)oc3c(-n5c6ccccc6c6cc7c(cc65)c5ccccc5n7-c5ccccc5)cccc34)n2)cc1] | 72% |
| 135 | 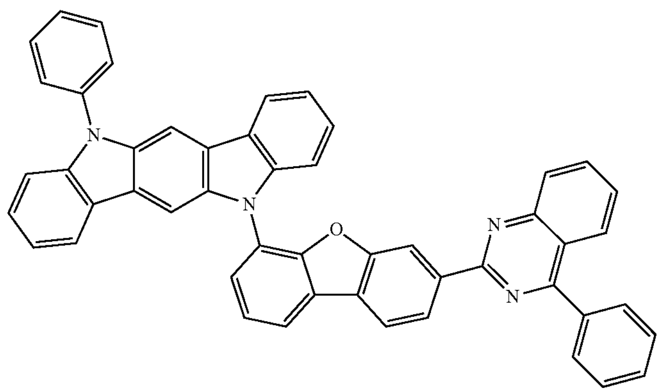 [SMILES: c1ccc(-c2nc(-c3ccc4c(c3)oc3c(-n5c6ccccc6c6cc7c(cc65)c5ccccc5n7-c5ccccc5)cccc34)nc3ccccc23)cc1] | 70% |
| 293 | 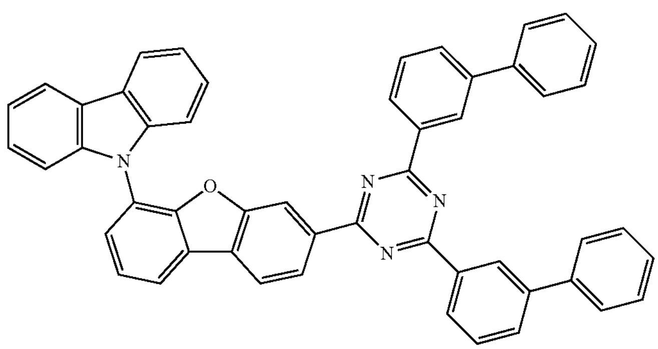 [SMILES: c1ccc(-c2cccc(-c3nc(-c4cccc(-c5ccccc5)c4)nc(-c4ccc5c(c4)oc4c(-n6c7ccccc7c7ccccc76)cccc45)n3)c2)cc1] | 69% |
| 294 | 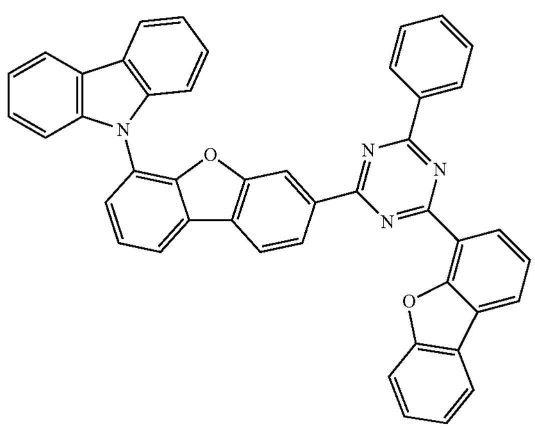 [SMILES: c1ccc(-c2nc(-c3ccc4c(c3)oc3c(-n5c6ccccc6c6ccccc65)cccc34)nc(-c3cccc4c3oc3ccccc34)n2)cc1] | 73% |

TABLE 3-continued

| | | |
|---|---|---|
| 297 | 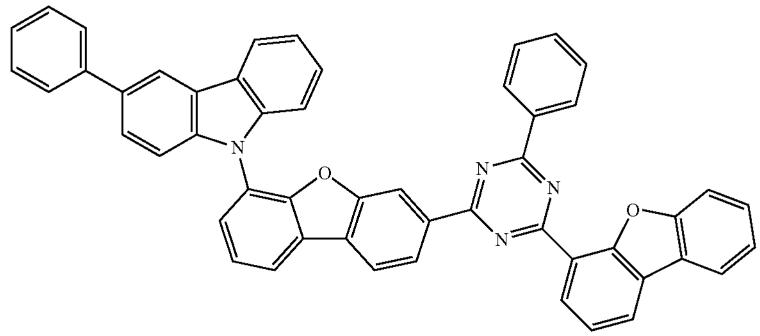 [SMILES: c1ccc(-c2ccc3c(c2)c2ccccc2n3-c2cccc3c2oc2cc(-c4nc(-c5ccccc5)nc(-c5cccc6c5oc5ccccc56)n4)ccc23)cc1] | 62% |

[Preparation Example 7] Preparation of Compound 137(D) of Group 1

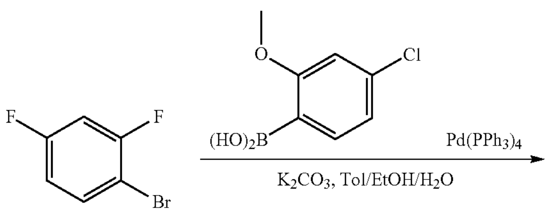

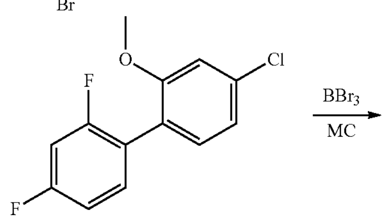

137-5

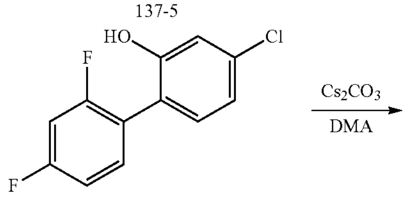

137-4

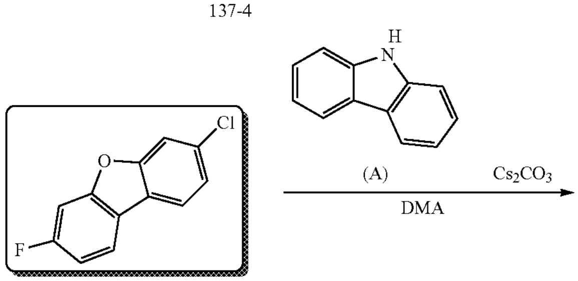

137-3

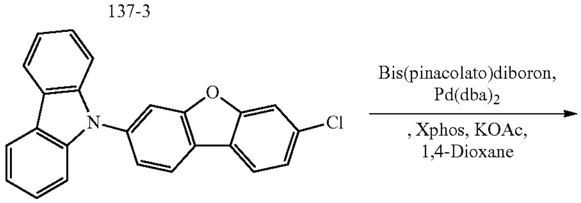

137-2

-continued

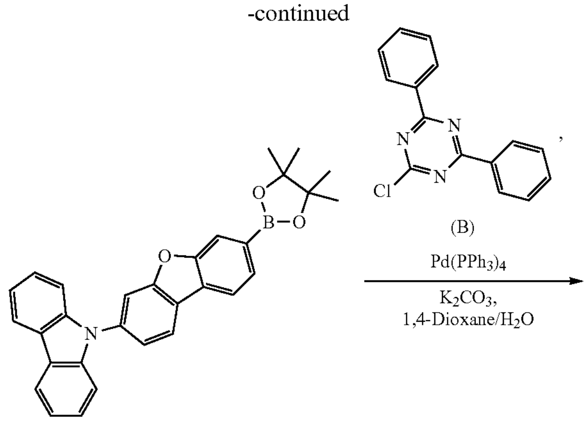

137-1

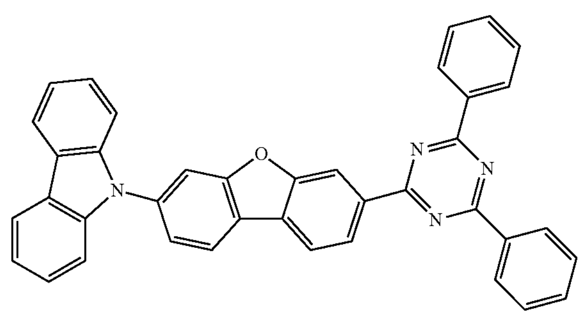

137(D)

Target Compound 137(D) (7.3 g, 45%) was obtained in the same manner as in Preparation of Compound 1(C) of Preparation Example 6 except that 1-bromo-2,4-difluorobenzene was used instead of 1-bromo-2,3-difluorobenzene.

The following Compound D was synthesized in the same manner as in Preparation of Compound 137 of Preparation Example 7 except that A and B of the following [Table 4] were used as intermediates.

TABLE 4
| Compound | A | B | D | Yield (137-3 to D) |
|---|---|---|---|---|
| 138 | 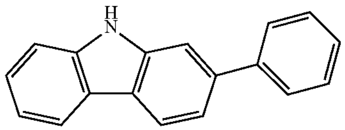 | 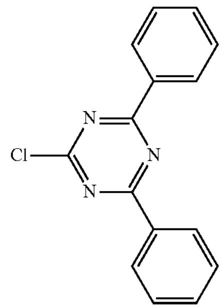 | 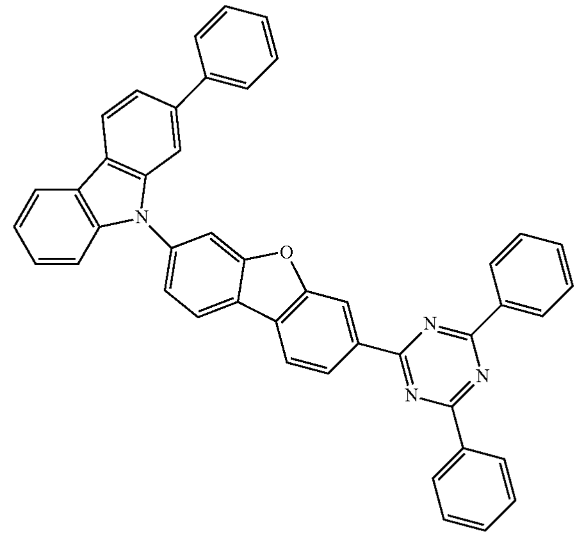 | 73% |
| 139 | 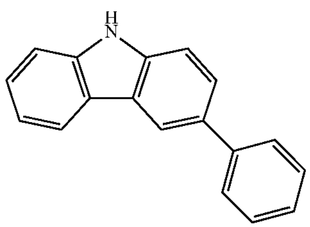 | 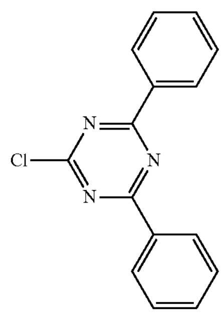 | 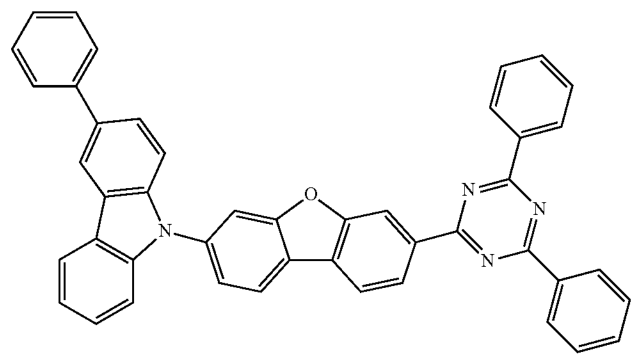 | 72% |

TABLE 4-continued
| Compound | A | B | D | Yield (137-3 to D) |
| --- | --- | --- | --- | --- |
| 140 | 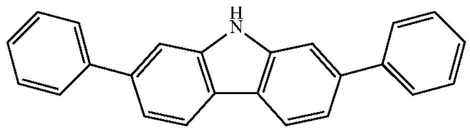 | 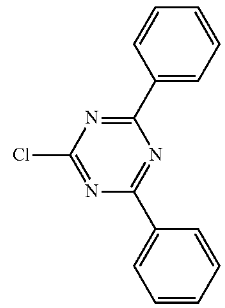 | 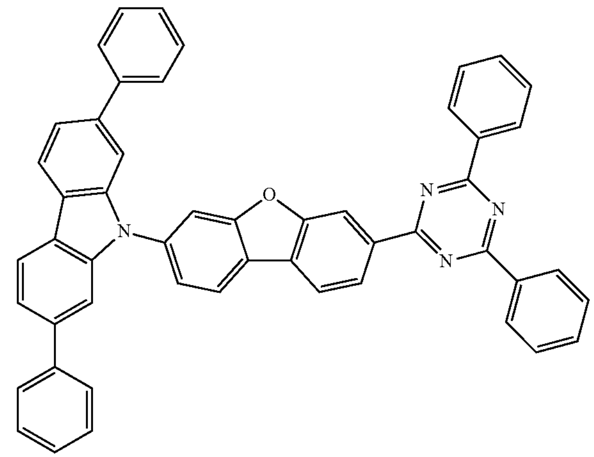 | 70% |
| 141 | 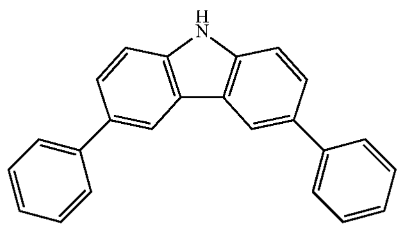 | 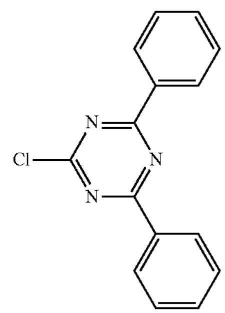 | 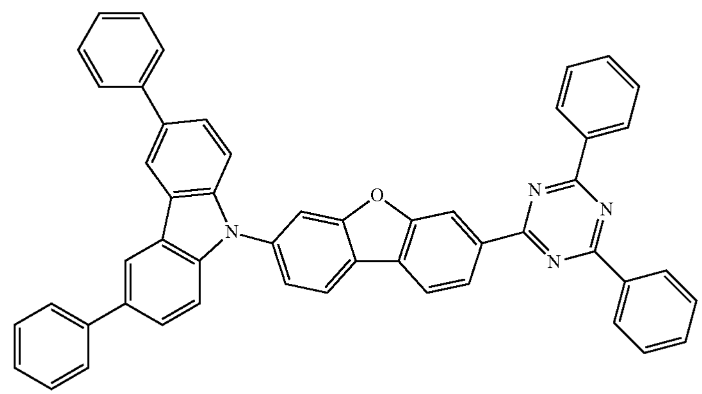 | 67% |

TABLE 4-continued
| Compound | A | B | D | Yield (137-3 to D) |
|---|---|---|---|---|
| 146 | 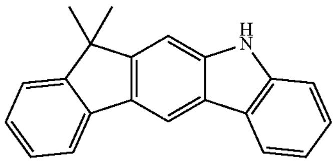 | 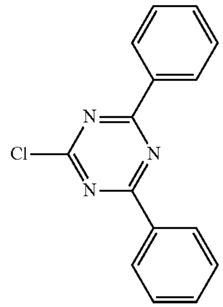 | 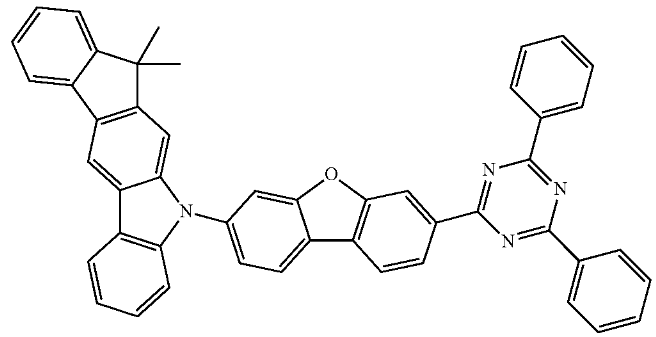 | 69% |
| 152 | 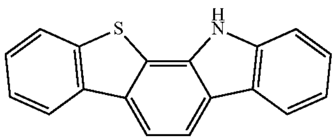 | 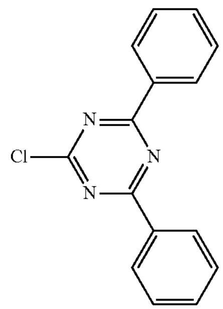 | 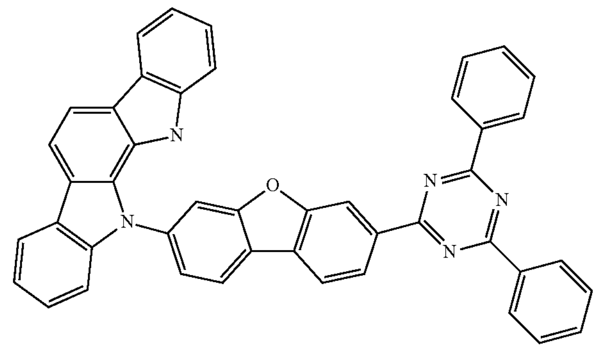 | 63% |

TABLE 4-continued
| Compound | A | B | D | Yield (137-3 to D) |
| --- | --- | --- | --- | --- |
| 153 | 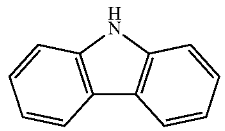 | 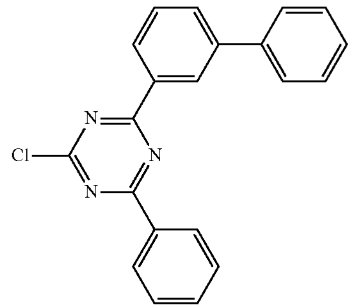 | 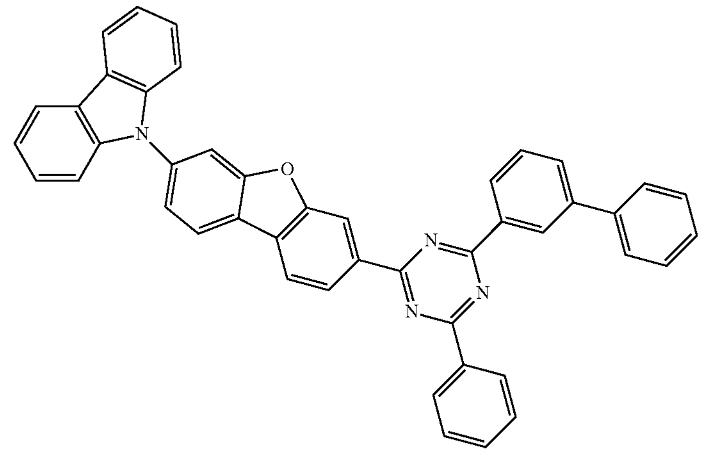 | 68% |
| 154 | 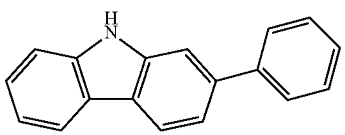 | 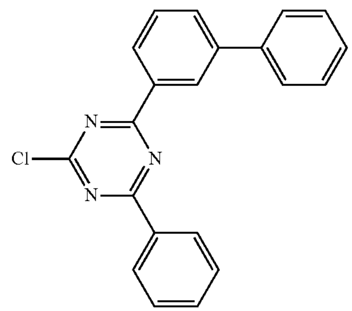 | 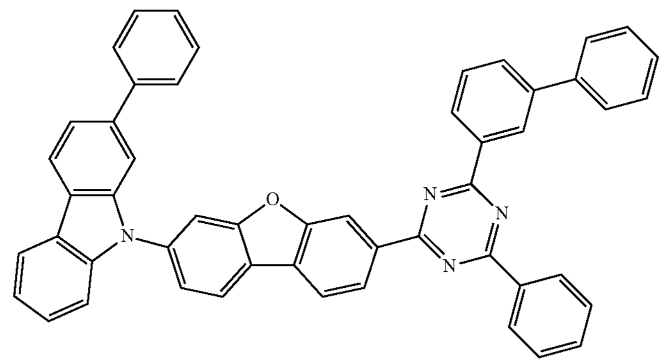 | 71% |

TABLE 4-continued
| Compound | A | B | D | Yield (137-3 to D) |
|---|---|---|---|---|
| 155 | 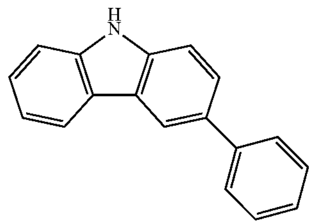 | 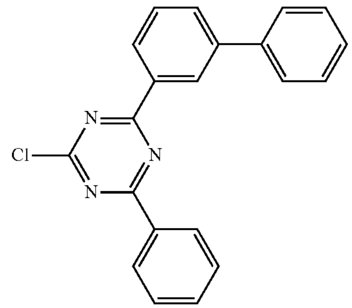 | 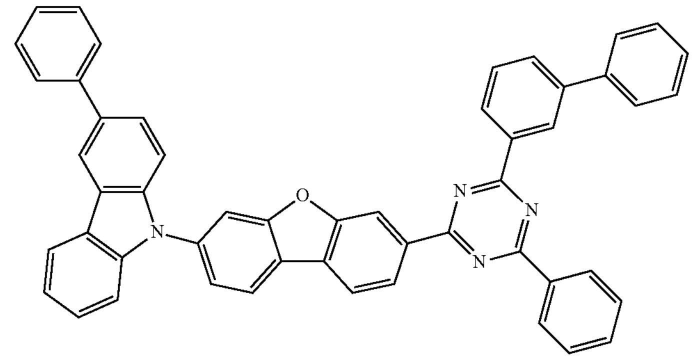 | 76% |
| 173 | 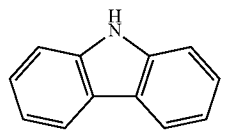 | 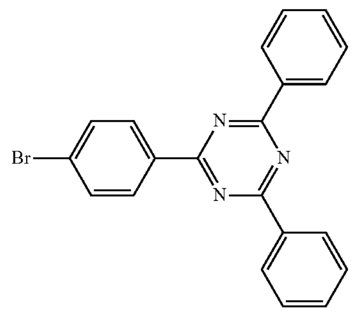 | 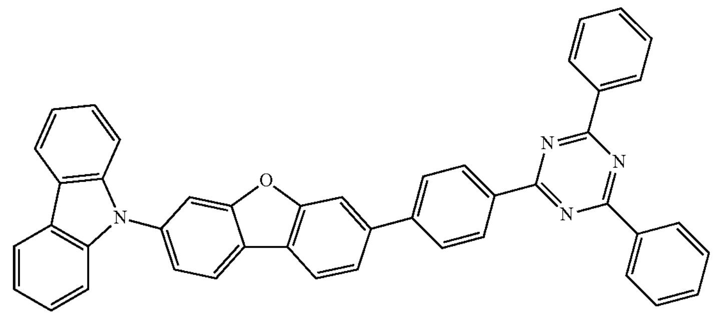 | 67% |

TABLE 4-continued
| Compound | A | B | D | Yield (137-3 to D) |
|---|---|---|---|---|
| 176 | 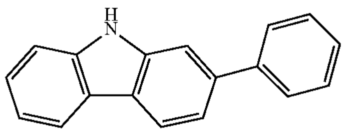 | 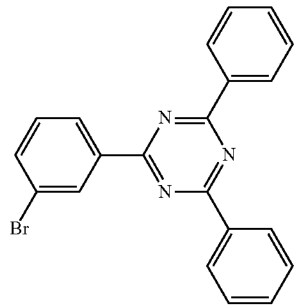 | 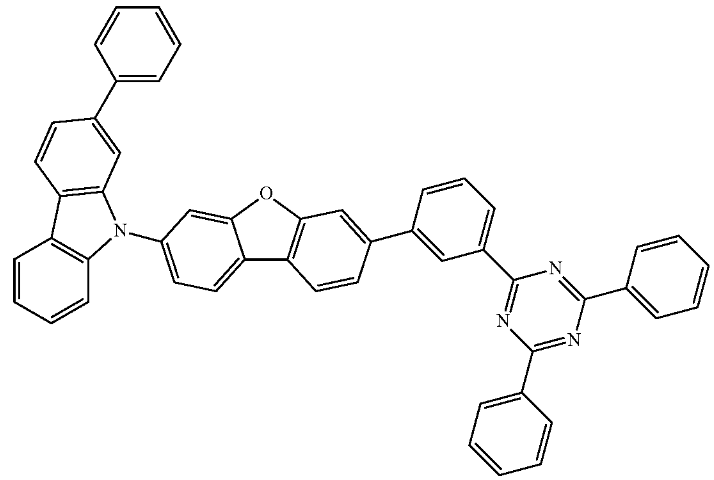 | 66% |
| 179 | 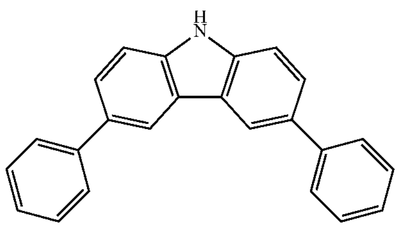 | 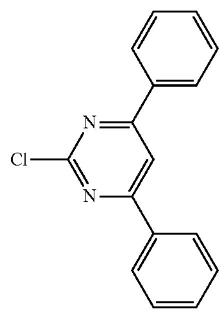 | 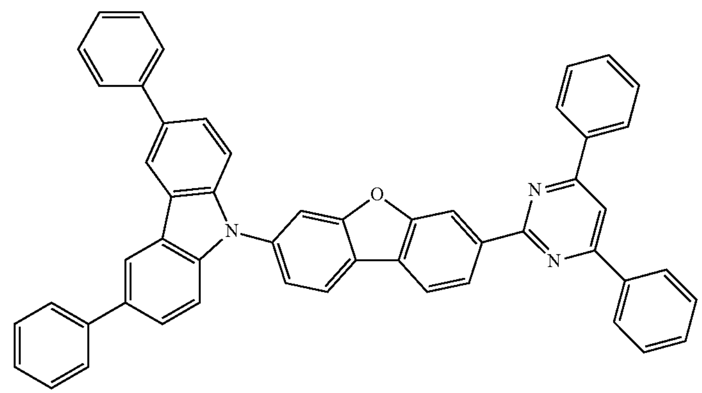 | 72% |

TABLE 4-continued
| Compound | A | B | D | Yield (137-3 to D) |
|---|---|---|---|---|
| 299 | 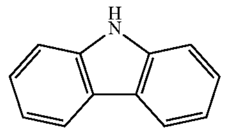 | 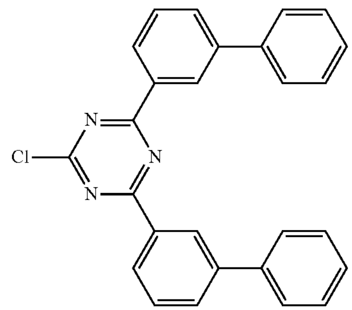 | 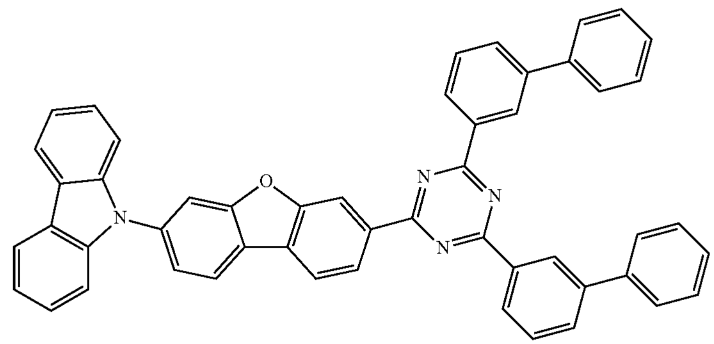 | 71% |
| 301 | 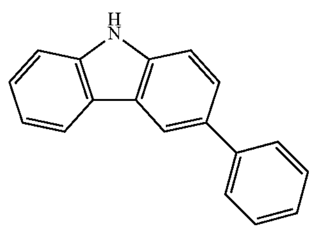 | 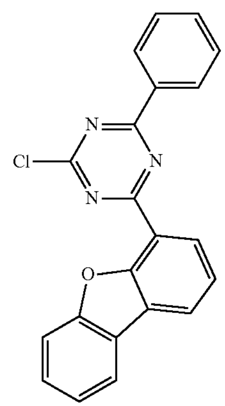 | 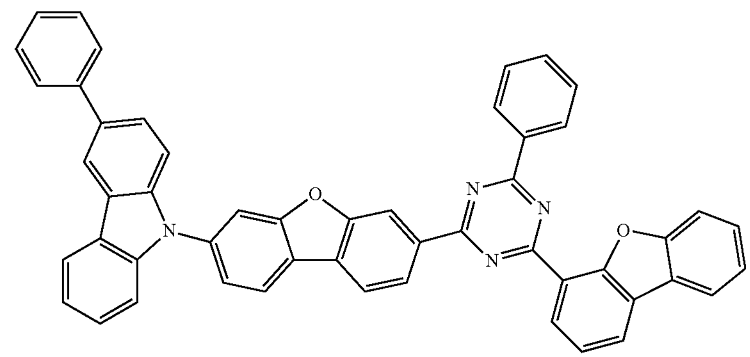 | 67% |

TABLE 4-continued
| Compound | A | B | D | Yield (137-3 to D) |
|---|---|---|---|---|
| 303 | 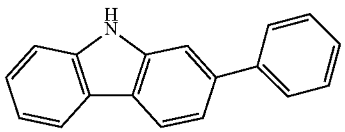 | 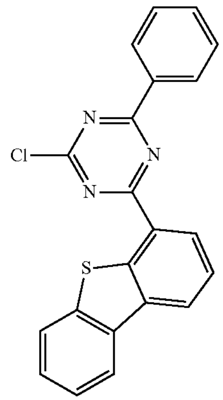 | 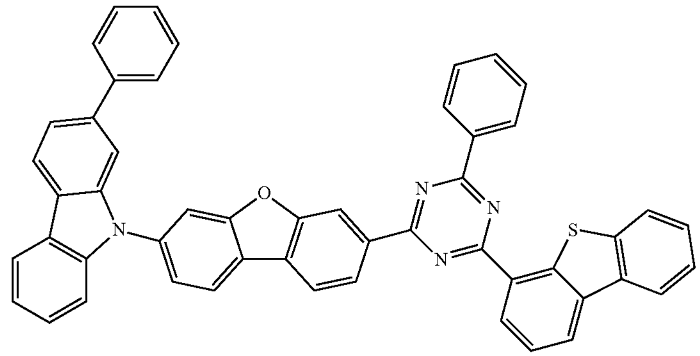 | 63% |

[Preparation Example 8] Preparation of Compound 189(E) of Group 1

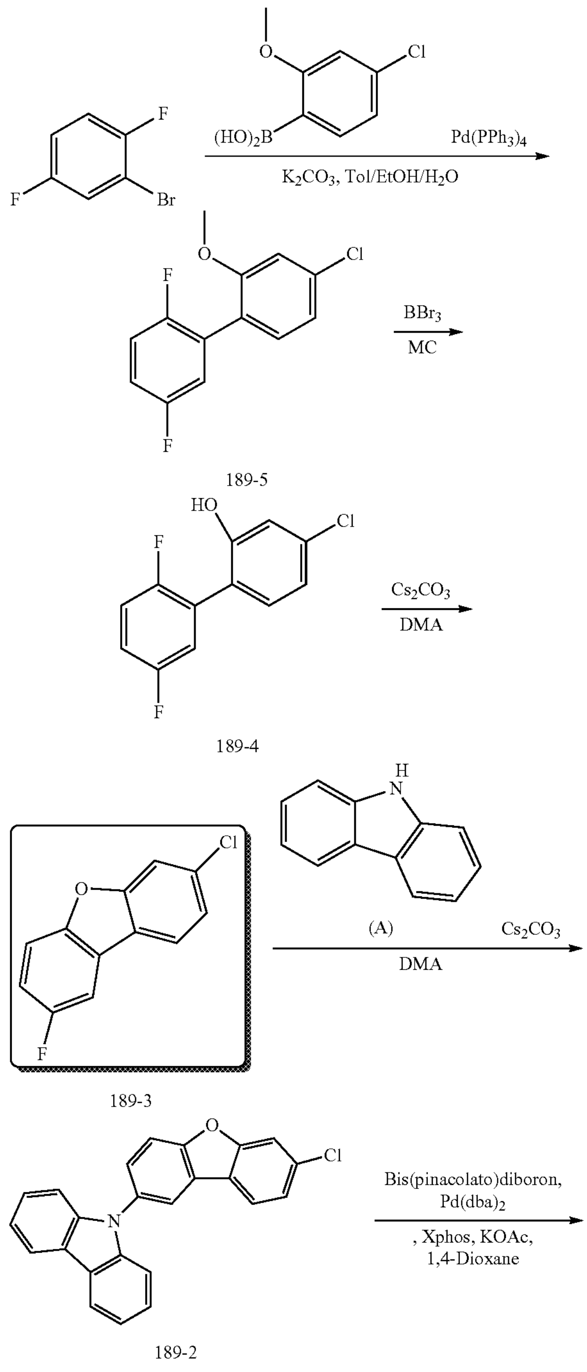

-continued

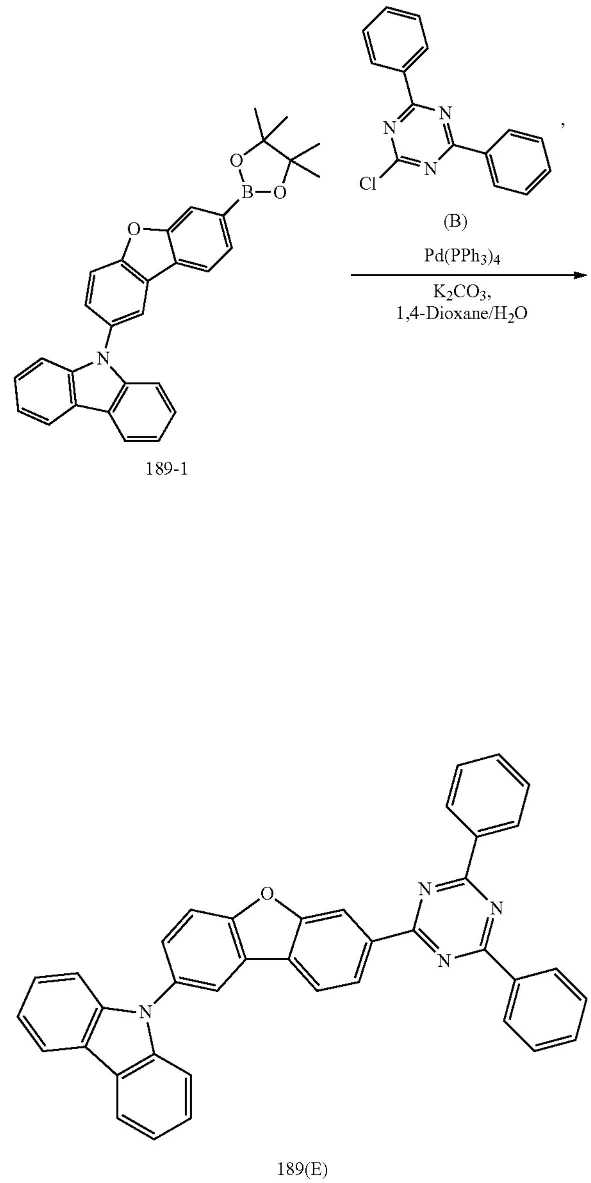

Target Compound 189(E) (8.4 g, 47%) was obtained in the same manner as in Preparation of Compound 1(C) of Preparation Example 6 except that 2-bromo-1,4-difluorobenzene was used instead of 1-bromo-2,3-difluorobenzene.

The following Compound E was synthesized in the same manner as in Preparation of Compound 189 of Preparation Example 8 except that A and B of the following [Table 5] were used as intermediates.

TABLE 5
| Compound | A | B | E | Yield (189-3 to E) |
|---|---|---|---|---|
| 190 | 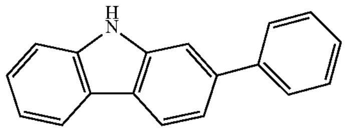 | 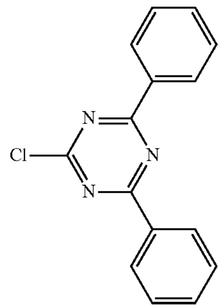 | 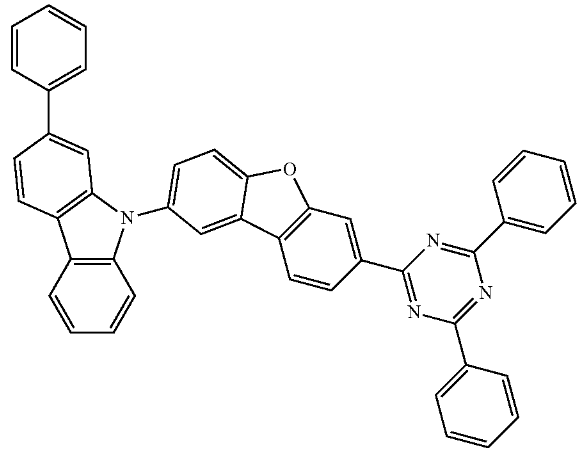 | 69% |
| 191 | 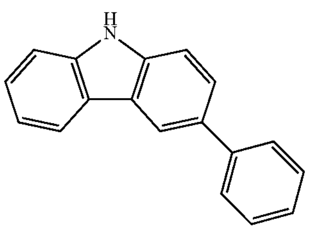 | 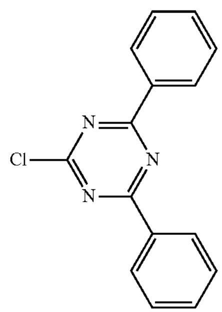 | 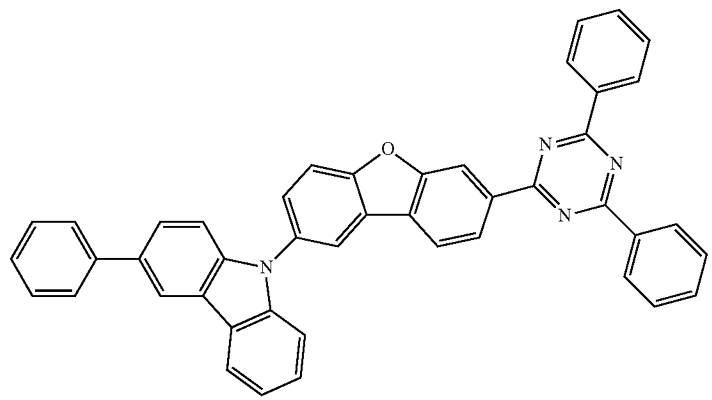 | 73% |

TABLE 5-continued
| Compound | A | B | E | Yield (189-3 to E) |
|---|---|---|---|---|
| 192 | 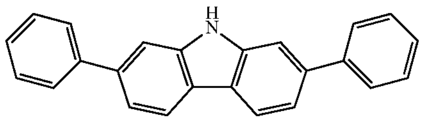 | 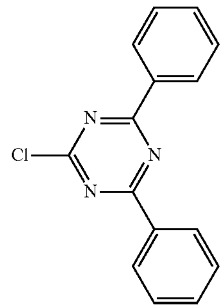 | 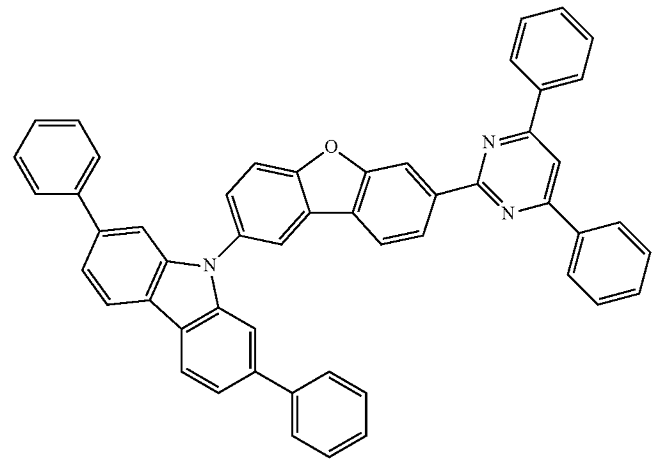 | 68% |
| 193 | 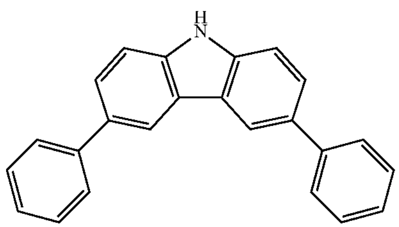 | 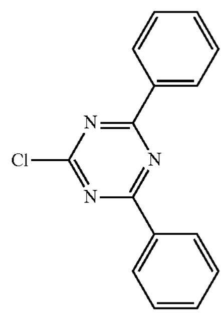 | 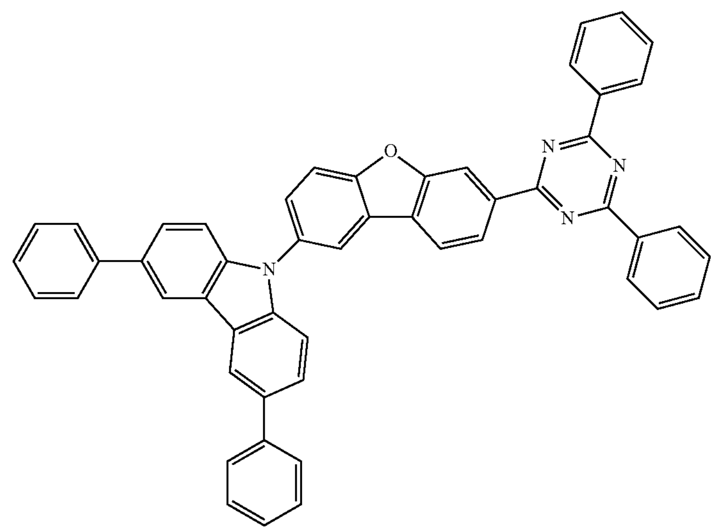 | 66% |

TABLE 5-continued
| Compound | A | B | E | Yield (189-3 to E) |
|---|---|---|---|---|
| 198 | 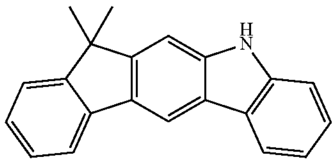 | 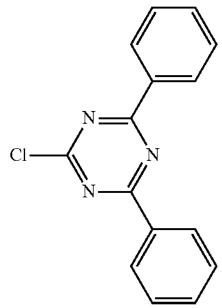 | 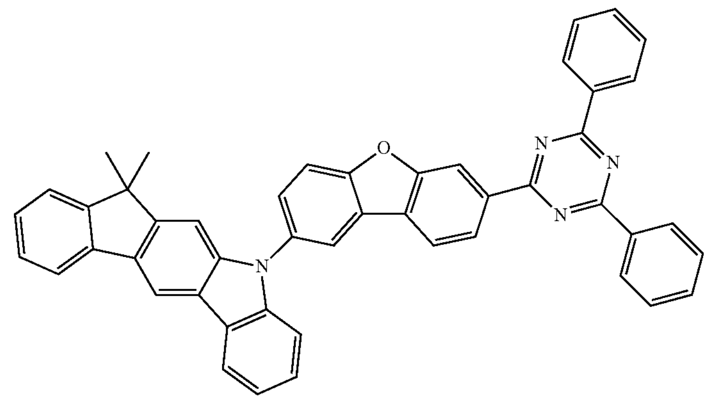 | 72% |
| 204 | 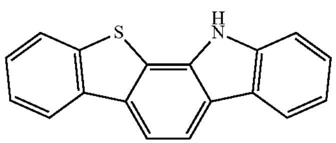 | 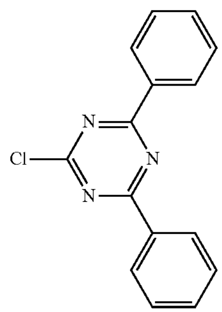 | 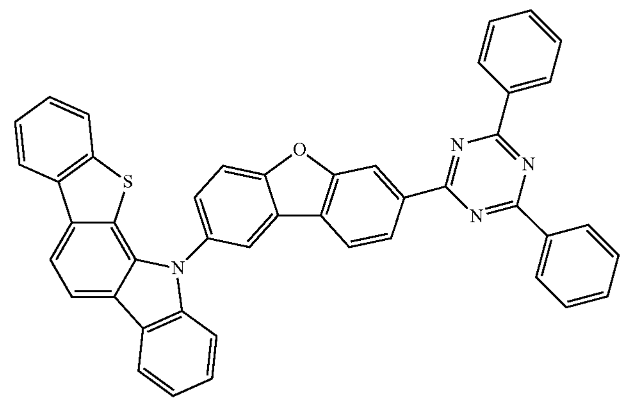 | 68% |

TABLE 5-continued
| Compound | A | B | E | Yield (189-3 to E) |
|---|---|---|---|---|
| 205 | 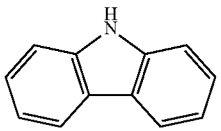 | 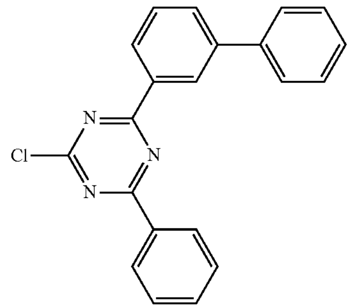 | 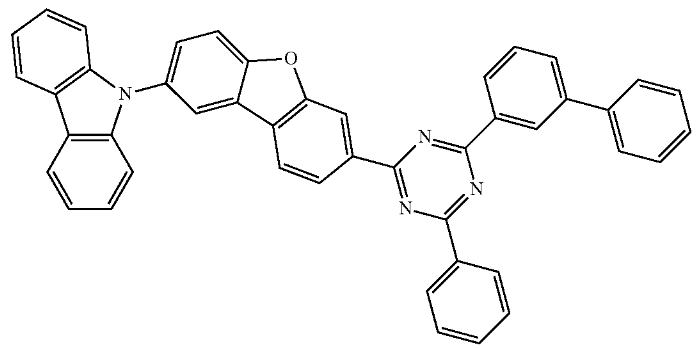 | 67% |
| 206 | 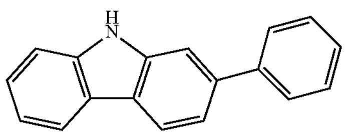 | 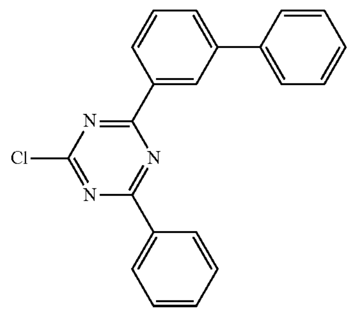 | 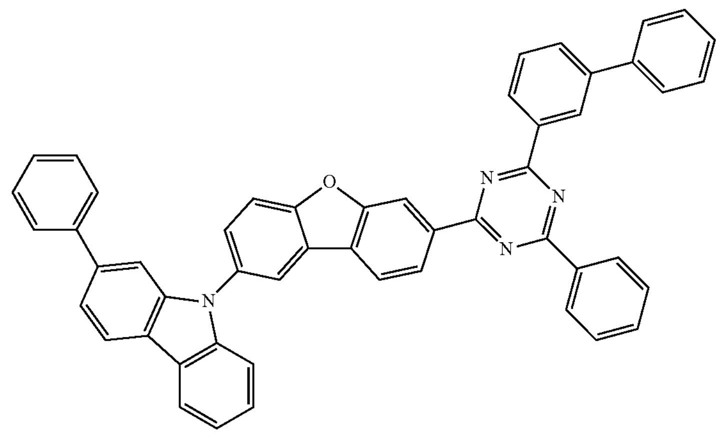 | 74% |

TABLE 5-continued
| Compound | A | B | E | Yield (189-3 to E) |
|---|---|---|---|---|
| 207 | 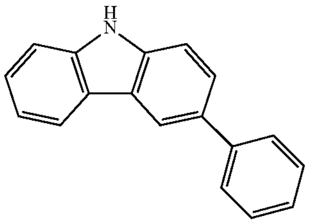 | 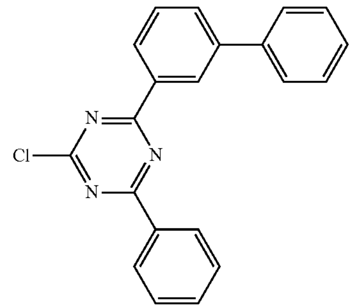 | 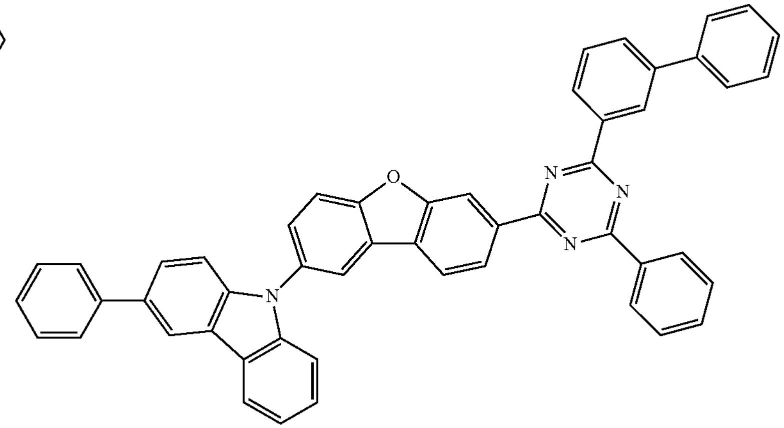 | 72% |
| 255 | 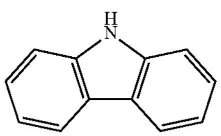 | 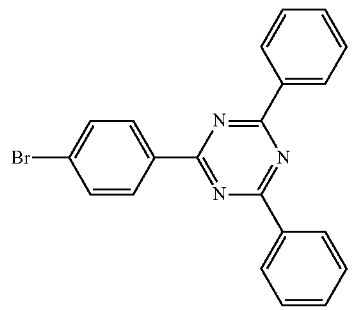 | 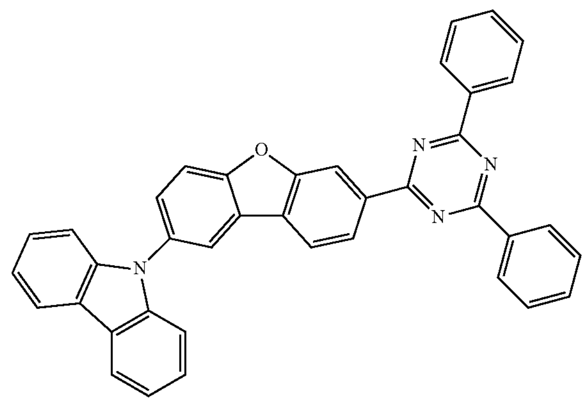 | 69% |

TABLE 5-continued
| Compound | A | B | E | Yield (189-3 to E) |
|---|---|---|---|---|
| 228 | 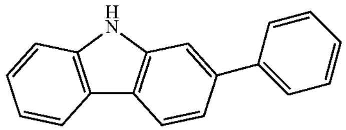 | 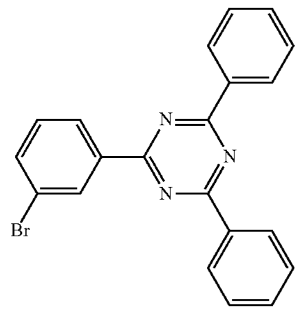 | 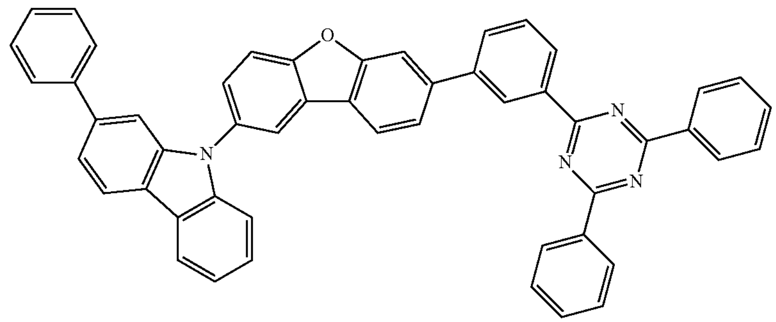 | 69% |
| 231 | 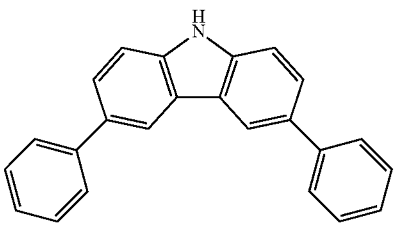 | 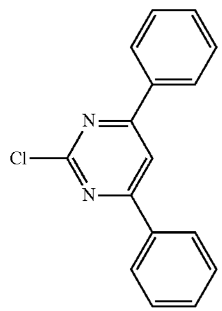 | 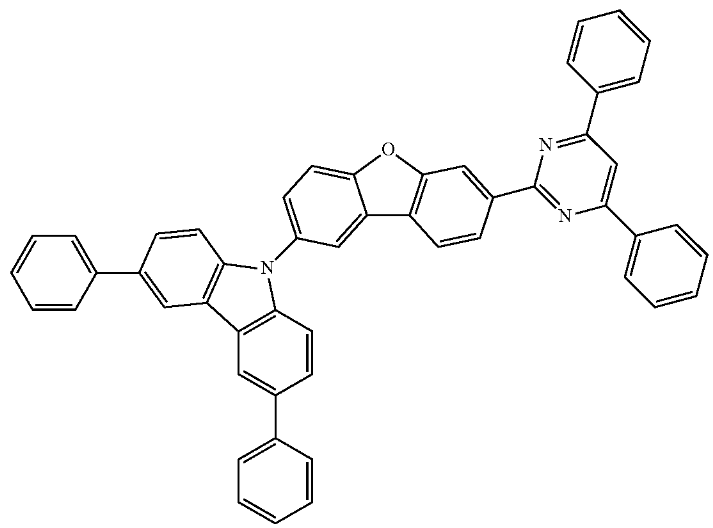 | 76% |

TABLE 5-continued
| Compound | A | B | E | Yield (189-3 to E) |
|---|---|---|---|---|
| 305 | 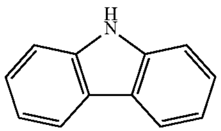 | 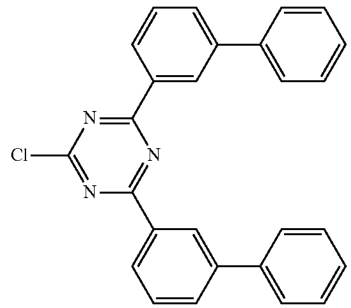 | 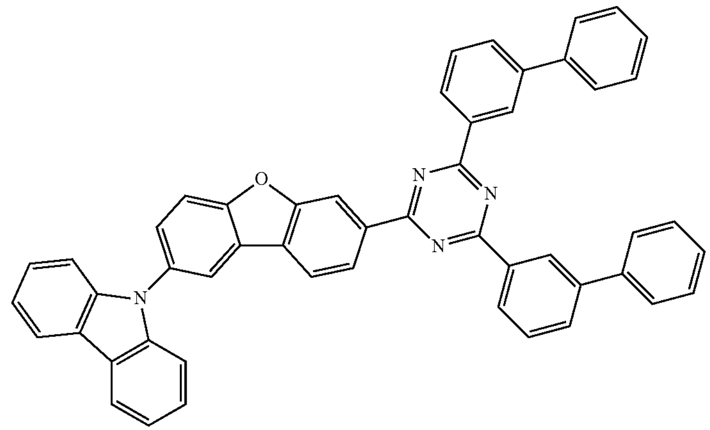 | 59% |
| 306 | 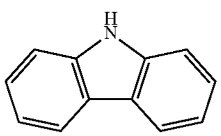 | 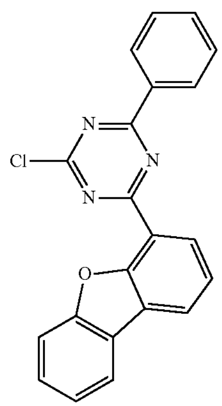 | 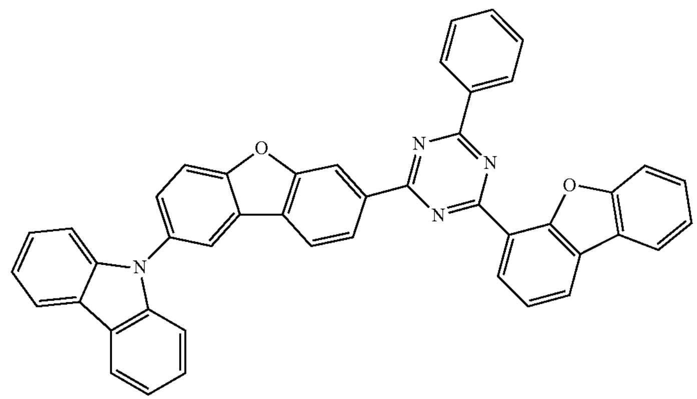 | 62% |

TABLE 5-continued
| Compound | A | B | E | Yield (189-3 to E) |
|---|---|---|---|---|
| 308 | 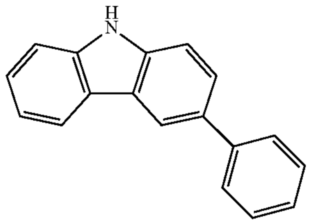 | 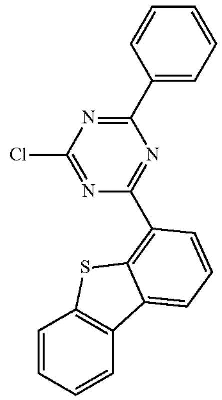 | 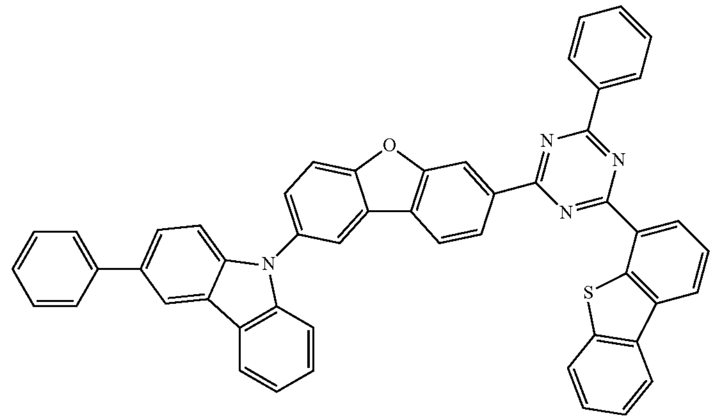 | 64% |

[Preparation Example 9] Preparation of Compound 241(F) of Group 1

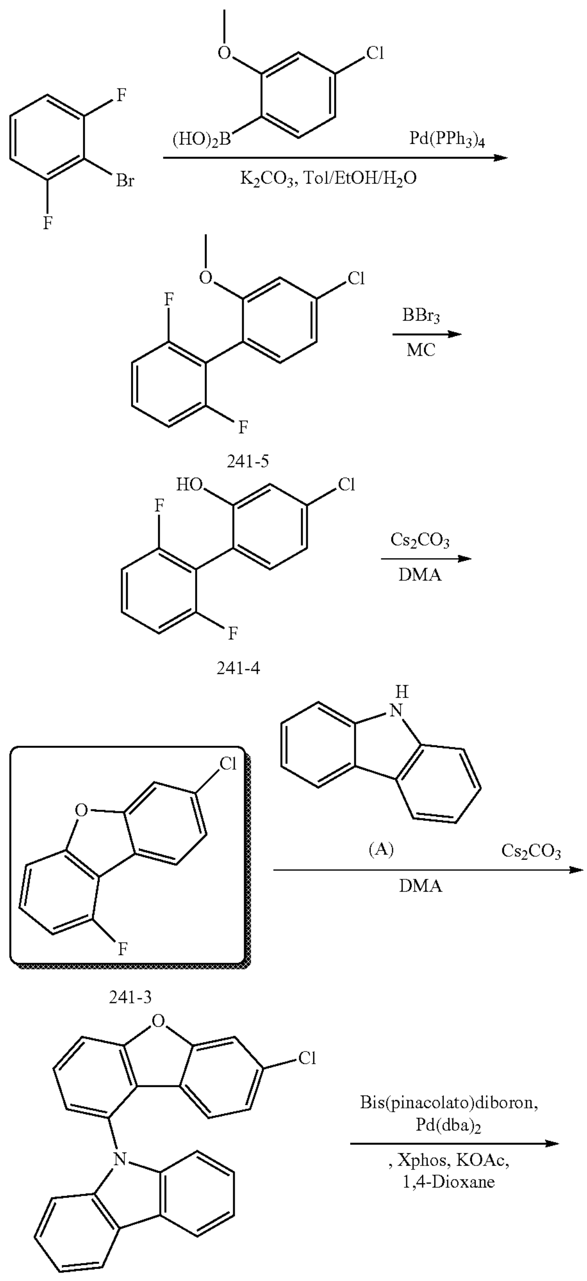

-continued

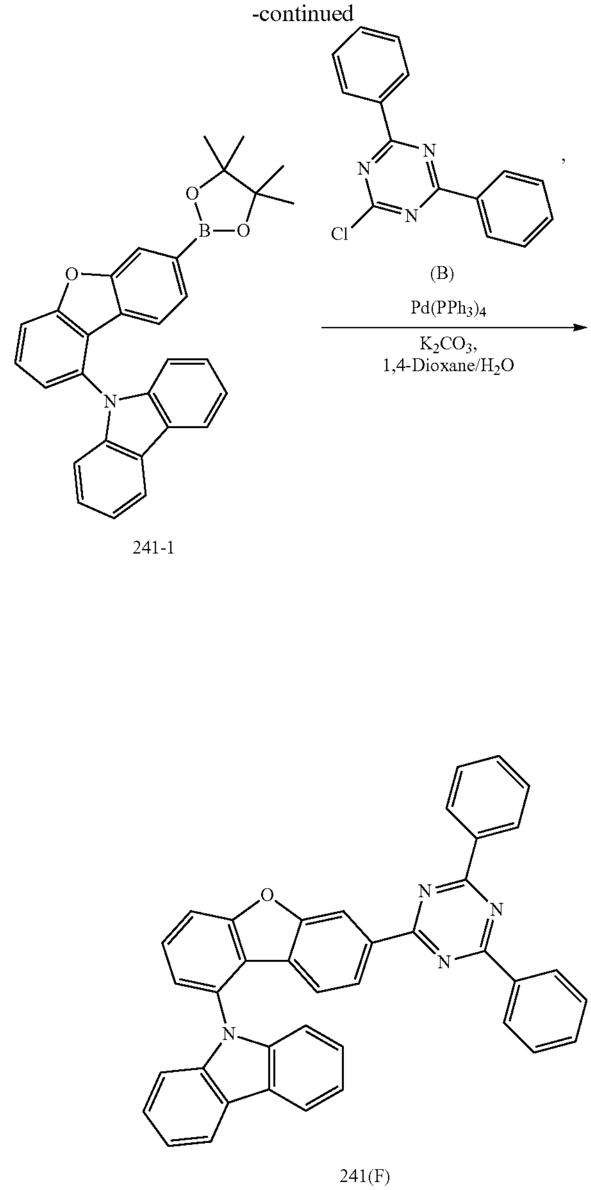

Target Compound 241(F) (6.4 g, 37%) was obtained in the same manner as in Preparation of Compound 1(C) of Preparation Example 6 except that 2-bromo-1,3-difluorobenzene was used instead of 1-bromo-2,3-difluorobenzene.

The following Compound F was synthesized in the same manner as in Preparation of Compound 241 of Preparation Example 9 except that A and B of the following [Table 6] were used as intermediates.

TABLE 6
| Compound | A | B | F | Yield (241-3 to F) |
|---|---|---|---|---|
| 242 | 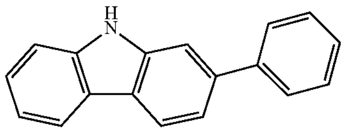 | 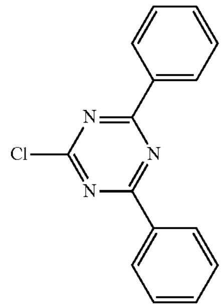 | 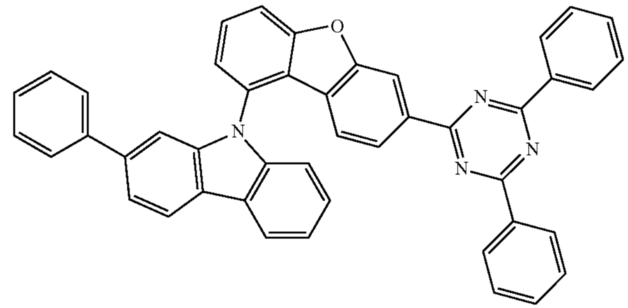 | 66% |
| 243 | 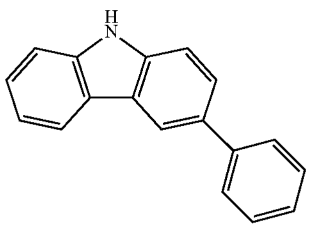 | 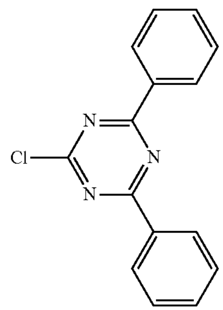 | 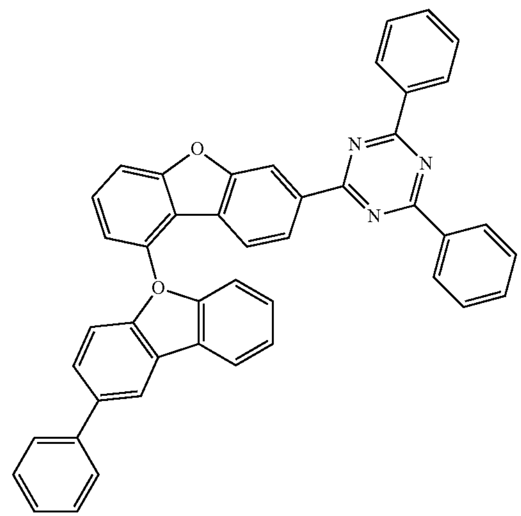 | 68% |

TABLE 6-continued
| Compound | A | B | F | Yield (241-3 to F) |
|---|---|---|---|---|
| 244 | 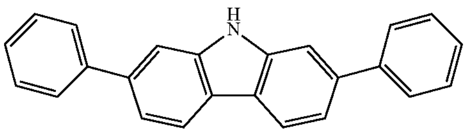 | 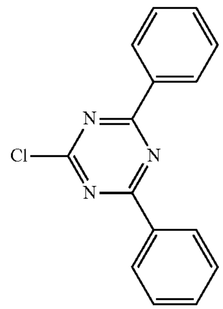 | 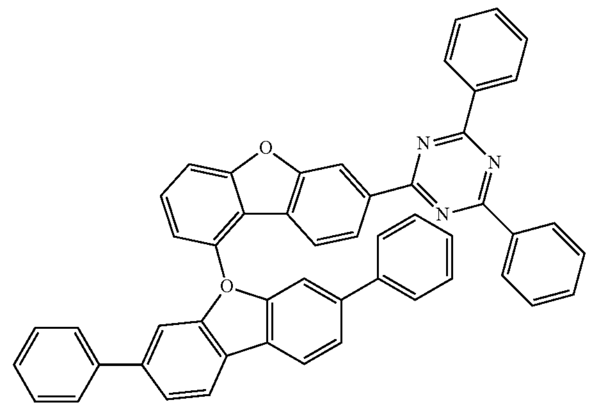 | 63% |
| 245 | 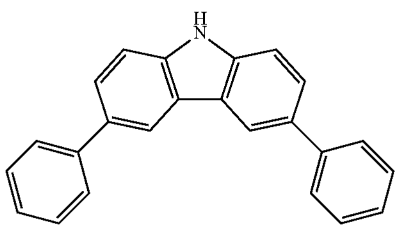 | 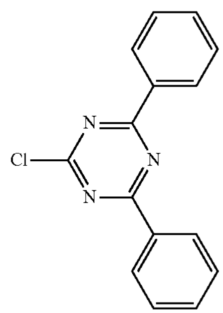 | 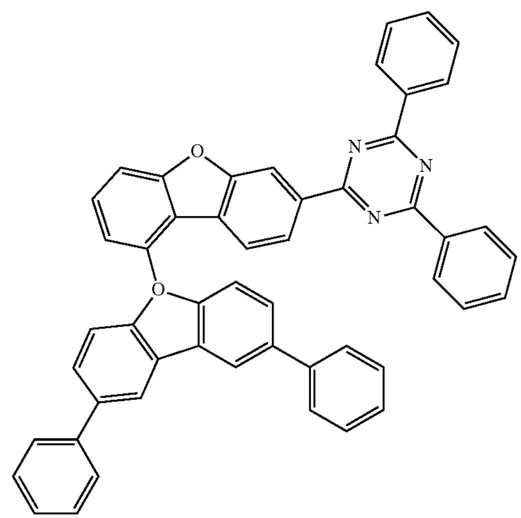 | 59% |

TABLE 6-continued
| Compound | A | B | F | Yield (241-3 to F) |
| --- | --- | --- | --- | --- |
| 250 | 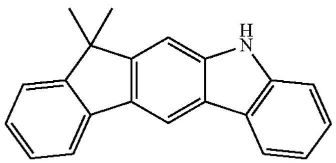 | 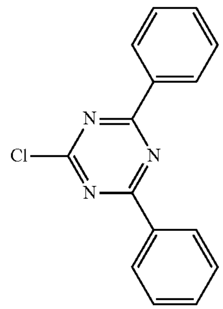 | 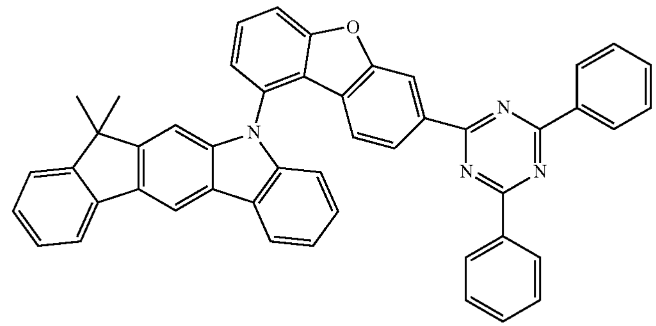 | 70% |
| 256 | 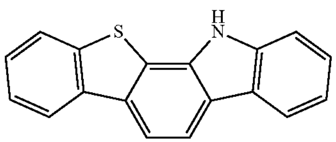 | 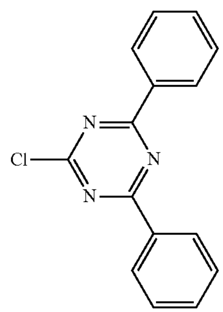 | 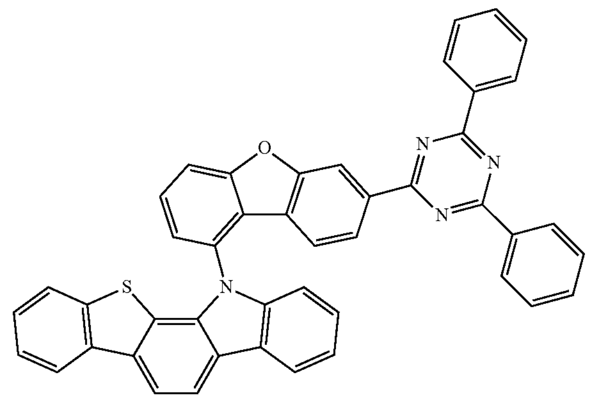 | 65% |
| 257 | 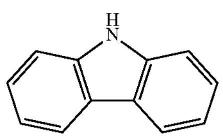 | 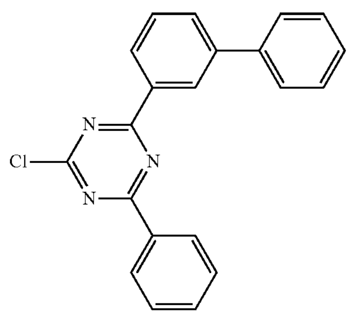 | 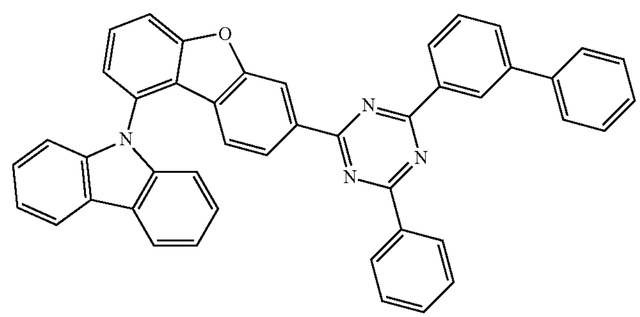 | 61% |

TABLE 6-continued
| Compound | A | B | F | Yield (241-3 to F) |
| --- | --- | --- | --- | --- |
| 258 | 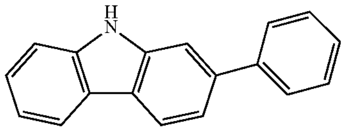 | 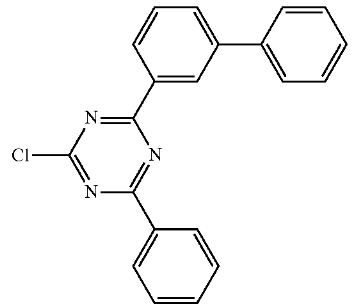 | 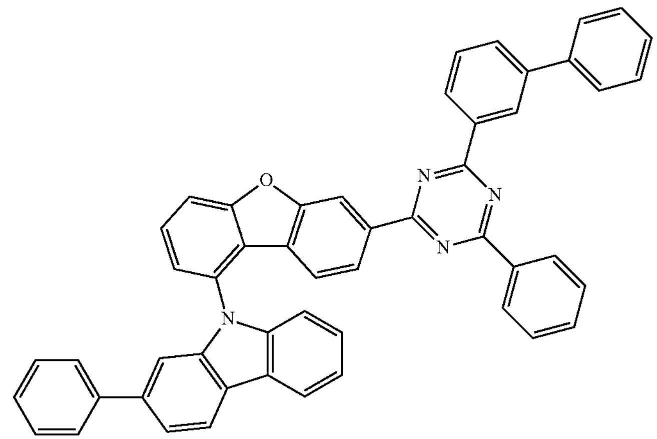 | 62% |
| 259 | 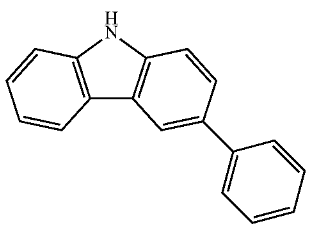 | 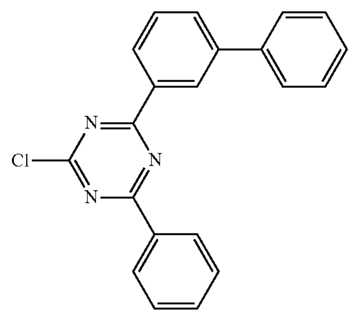 | 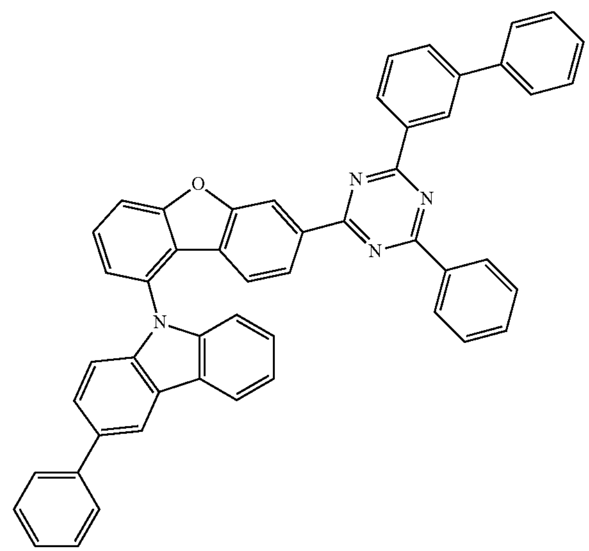 | 57% |

TABLE 6-continued
| Compound | A | B | F | Yield (241-3 to F) |
|---|---|---|---|---|
| 277 | 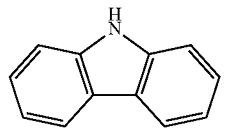 | 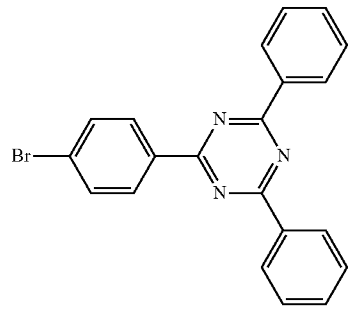 | 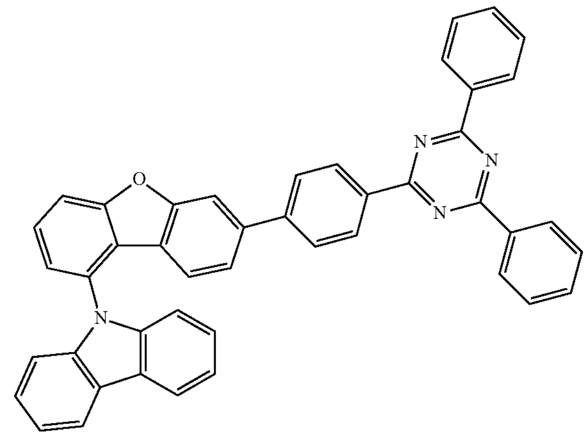 | 64% |
| 280 | 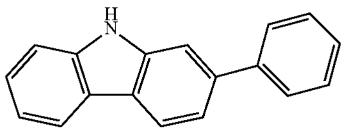 | 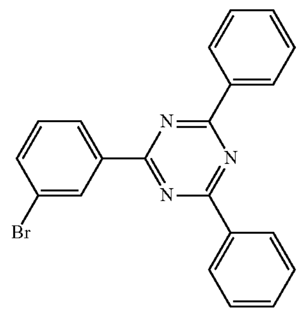 | 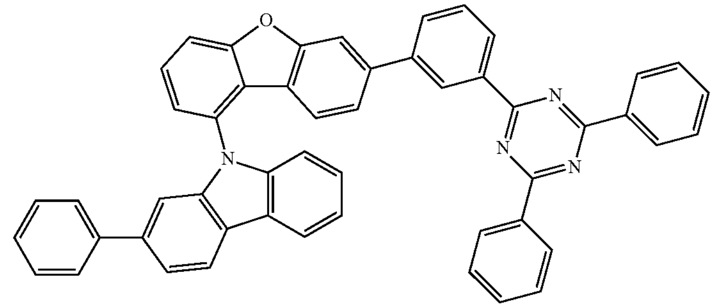 | 66% |

TABLE 6-continued
| Com-pound | A | B | F | Yield (241-3 to F) |
| --- | --- | --- | --- | --- |
| 283 | 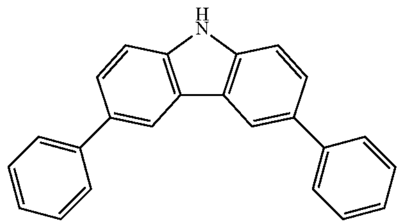 | 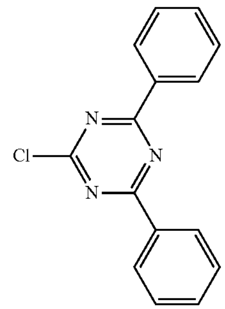 | 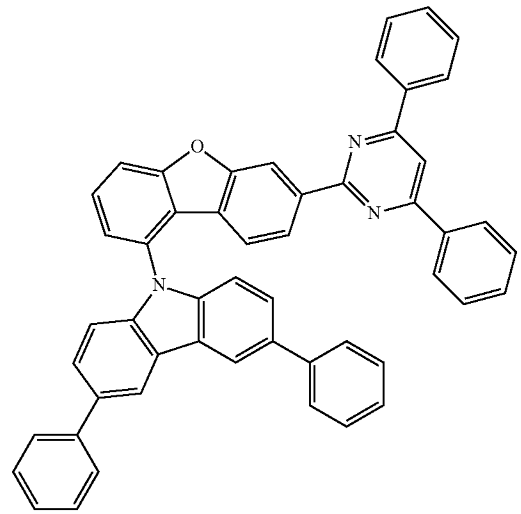 | 70% |
| 312 | 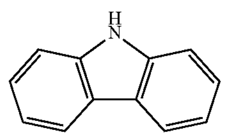 | 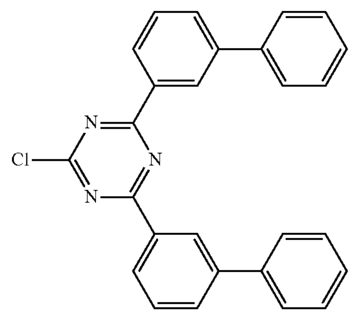 | 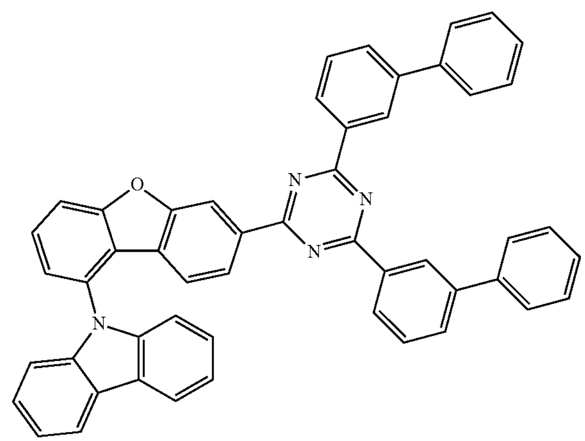 | 63% |

TABLE 6-continued
| Compound | A | B | F | Yield (241-3 to F) |
|---|---|---|---|---|
| 314 | 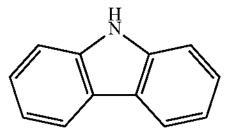 | 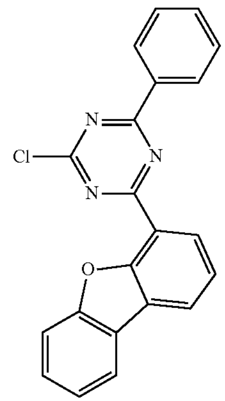 | 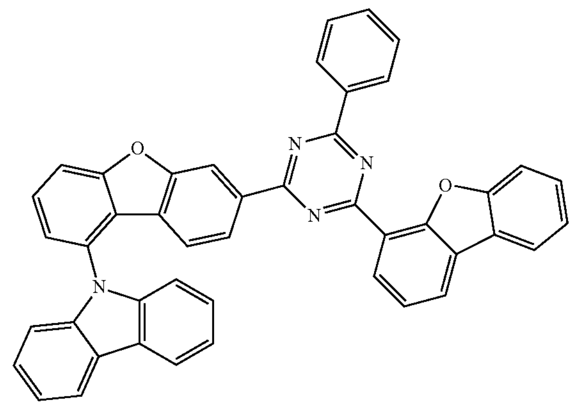 | 65% |
| 315 | 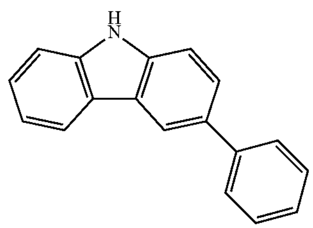 | 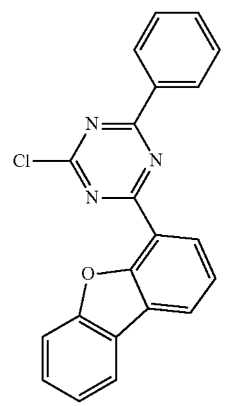 | 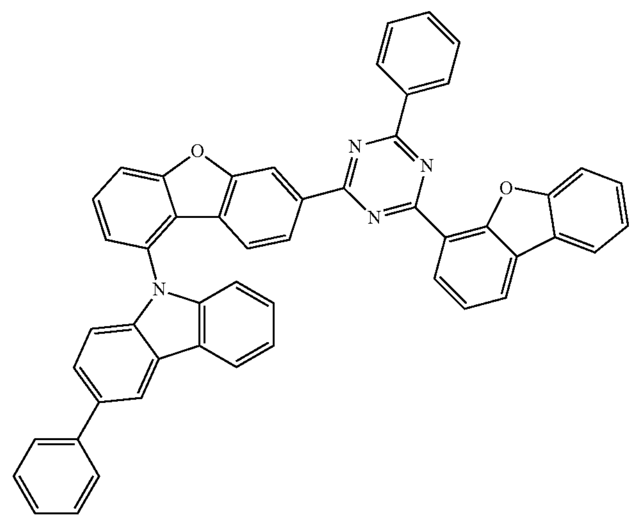 | 60% |

Compounds of Group 1 other than the compounds described in Tables 3 to 6 were also prepared in the same manner as in the preparation examples described above.

Preparation of Compound of Group 2

[Preparation Example 10] Preparation of Compound 1(G) of Group 2

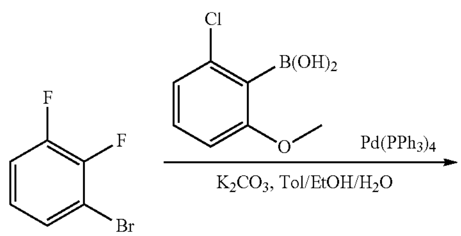

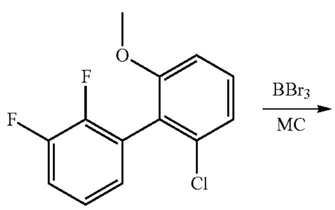

1-5

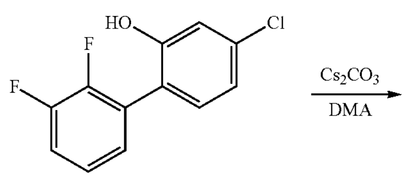

1-4

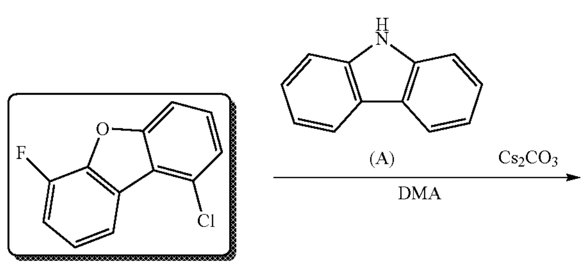

1-3

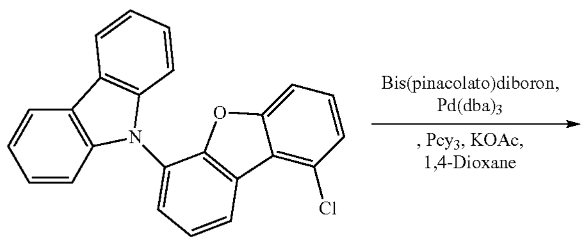

1-2

-continued

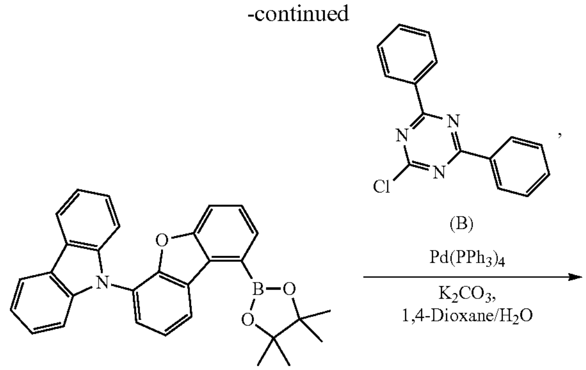

1-1

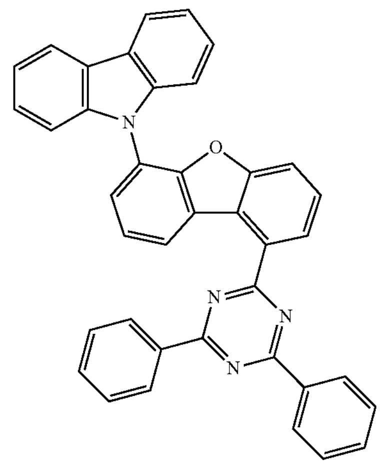

1(G)

Preparation of Compound 1-5

In a one neck round bottom flask (r.b.f), a mixture of 1-bromo-2,3-difluorobenzene (40.5 g, 209 mmol), (2-chloro-6-methoxyphenyl)boronic acid (43 g, 230 mmol), tetrakis(triphenylphosphine)palladium(0) (24 g, 20.9 mmol), potassium carbonate (57.9 g, 419 mmol) and toluene/ethanol/water (500 ml/100 ml/100 ml) was refluxed at 110° C. The result was extracted with dichloromethane and dried with $MgSO_4$. The result was silica gel filtered and then concentrated to obtain Compound 1-5 (40.8 g, 76%).

Preparation of Compound 1-4

In a one neck round bottom flask (r.b.f), a mixture of 2'-chloro-2,3-difluoro-6'-methoxy-1,1'-biphenyl (40.8 g, 160 mmol) and MC (600 mL) was cooled to 0° C., $BBr_3$ (30 mL, 320 mmol) was added dropwise thereto, and, after raising the temperature to room temperature, the result was stirred for 1 hour. The reaction was terminated with distilled water, and the result was extracted with dichloromethane and dried with $MgSO_4$. The result was column purified (MC:HX=1:1) to obtain Compound 1-4 (21 g, 54%).

Preparation of Compound 1-3

In a one neck round bottom flask (r.b.f), a dimethylacetamide (200 ml) mixture of 4-chloro-2',3'-difluoro-[1,1'-biphenyl]-2-ol (21 g, 87.2 mmol) and $Cs_2CO_3$ (71 g, 218 mmol) was stirred at 120° C. The result was cooled and then filtered, and, after removing the solvent of the filtrate, column purified (HX:MC=4:1) to obtain Compound 1-3 (17 g, 88%).

Preparation of Compound 1-2

In a one neck round bottom flask (r.b.f), a dimethylacetamide (60 ml) mixture of 1-chloro-6-fluorodibenzo[b,d]

furan (6 g, 27.19 mmol), 9H-carbazole (5 g, 29.9 mmol) and $Cs_2CO_3$ (22 g, 101.7 mmol) was refluxed for 12 hours at 170° C. The result was cooled and then filtered, and, after removing the solvent of the filtrate, column purified (HX: MC=3:1) to obtain Compound 1-2 (9 g, 90%).

Preparation of Compound 1-1

In a one neck round bottom flask (r.b.f), a 1,4-dioxane (100 ml) mixture of 9-(9-chlorodibenzo[b,d]furan-4-yl)-9H-carbazole (9 g, 24.4 mmol), bis(pinacolato)diboron (12.4 g, 48.9 mmol), $Pcy_3$ (1.37 g, 4.89 mmol), potassium acetate (7.1 g, 73 mmol) and $Pd_2(dba)_3$ (2.2 g, 2.44 mmol) was refluxed at 140° C. The result was cooled, and the filtered filtrate was concentrated and column purified (HX:MC=3:1) to obtain Compound 1-1 (7.2 g, 64%).

Preparation of Compound 1

In a one neck round bottom flask (r.b.f), a mixture of 9-(9-(4,4,5,5-tetramethyl-1,3,2-dioxaborolan-2-yl)dibenzo[b,d]furan-4-yl)-9H-carbazole (7.2 g, 15.6 mmol), 2-chloro-4,6-diphenyl-1,3,5-triazine (5 g, 18.8 mmol), tetrakis(triphenylphosphine)palladium(0) (1.8 g, 1.56 mmol), potassium carbonate (4.3 g, 31.2 mmol) and 1,4-dioxane/water (100 ml/25 ml) was refluxed for 4 hours at 120° C. The result was filtered at 120° C., and then washed with 1,4-dioxane, distilled water and MeOH to obtain Compound 1(G) (6.6 g, 75%).

The following Compound G was synthesized in the same manner as in Preparation of Compound 1(G) of Preparation Example 10 except that A and B of the following [Table 7] were used as intermediates.

TABLE 7

| Compound | A | B |
|---|---|---|
| 2 | 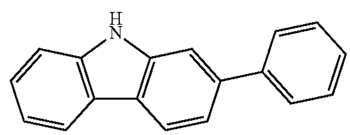 | 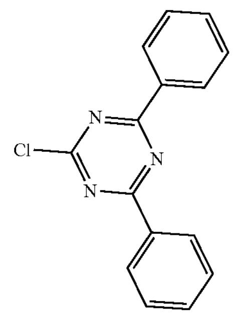 |
| 3 | 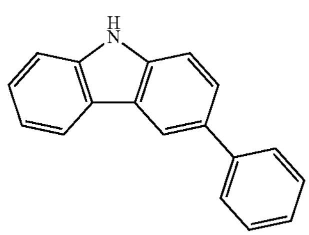 | 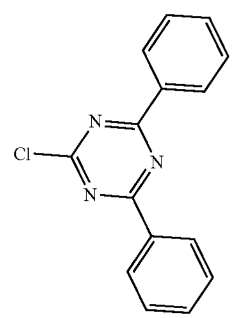 |
| 5 | 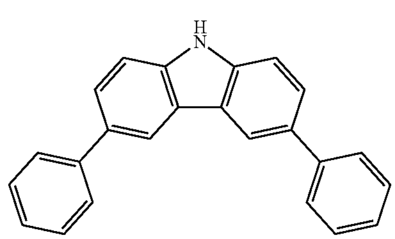 | 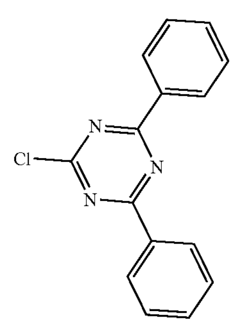 |

TABLE 7-continued
| | | |
|---|---|---|
| 7 | 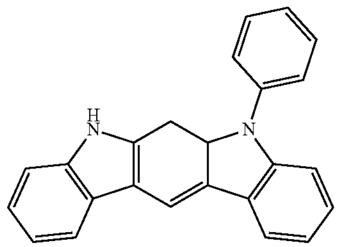 | 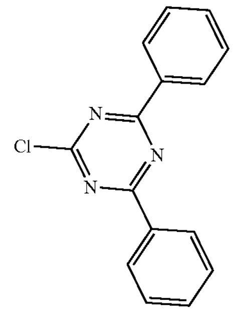 |
| 10 | 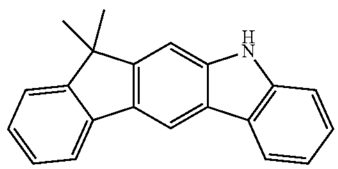 | 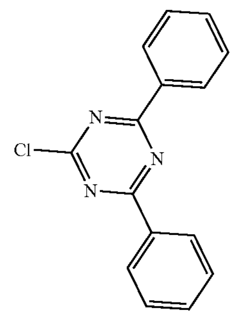 |
| 17 | 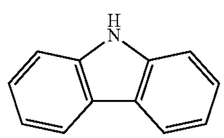 | 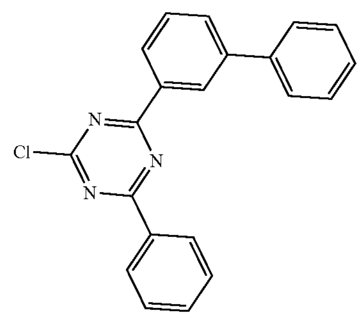 |
| 18 | 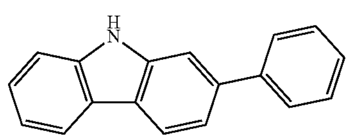 | 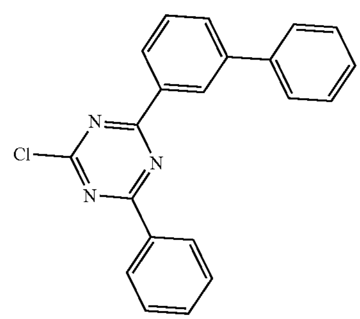 |
| 19 | 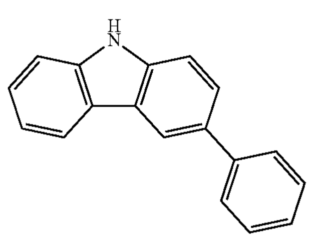 | 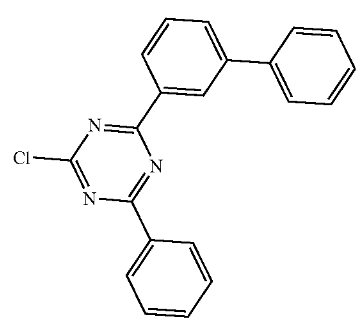 |

TABLE 7-continued
22
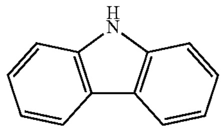 [SMILES: c1ccc2c(c1)[nH]c1ccccc12]
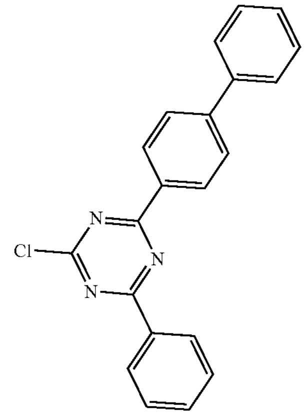 [SMILES: Clc1nc(-c2ccccc2)nc(-c2ccc(-c3ccccc3)cc2)n1]
28
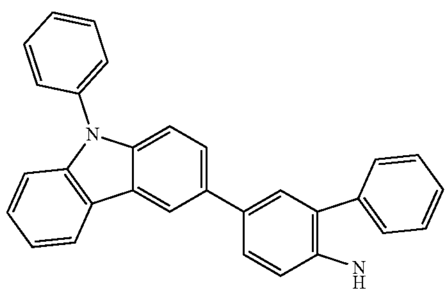 [SMILES: Nc1ccc(-c2ccc3c(c2)c2ccccc2n3-c2ccccc2)cc1-c1ccccc1]
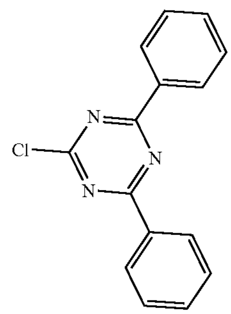 [SMILES: Clc1nc(-c2ccccc2)nc(-c2ccccc2)n1]
29
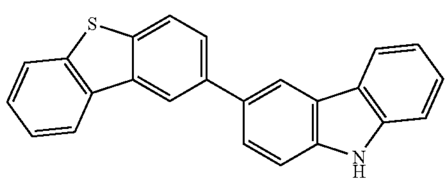
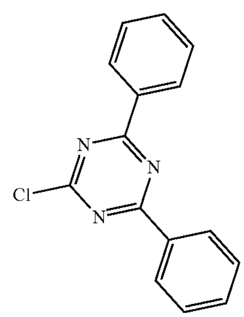 [SMILES: Clc1nc(-c2ccccc2)nc(-c2ccccc2)n1]
34
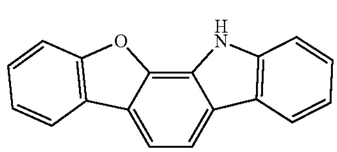 [SMILES: c1ccc2c(c1)[nH]c1c2ccc2c3ccccc3oc21]
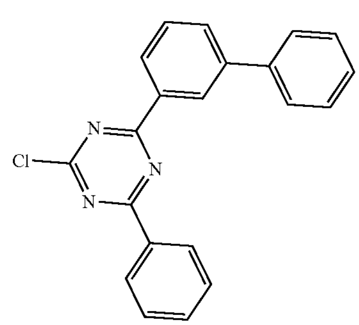 [SMILES: Clc1nc(-c2ccccc2)nc(-c2cccc(-c3ccccc3)c2)n1]

TABLE 7-continued
| | | |
|---|---|---|
| 38 | 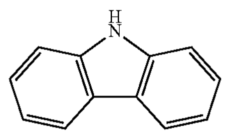 | 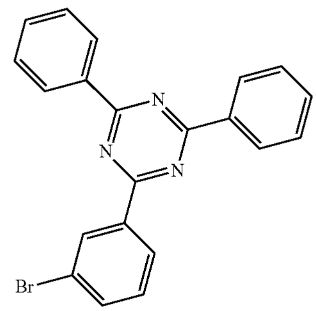 |
| 39 | 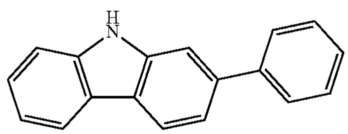 | 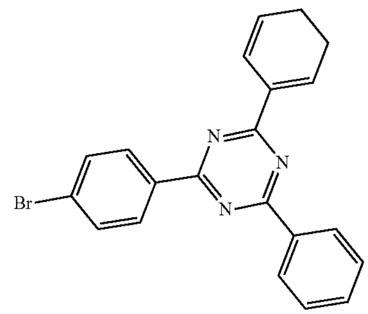 |
| 43 | 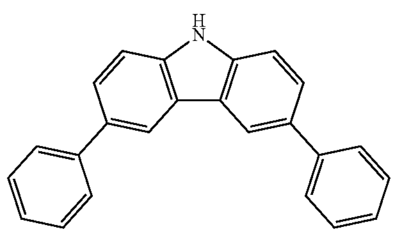 | 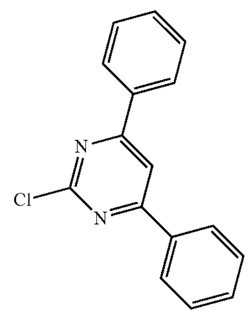 |
| 45 | 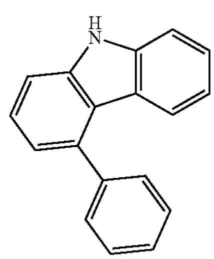 | 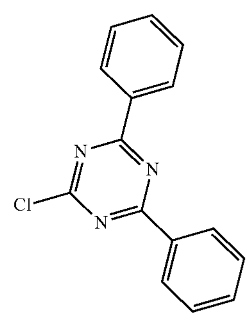 |
| 48 | 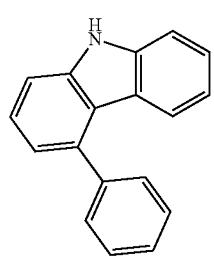 | 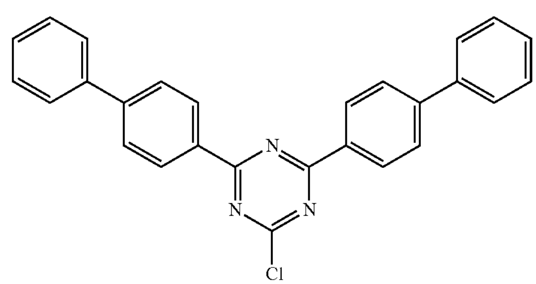 |

TABLE 7-continued
| | | |
|---|---|---|
| 51 | 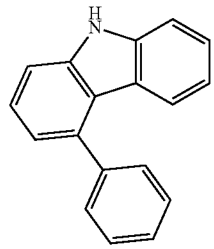 | 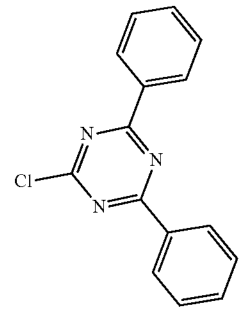 |
| 53 | 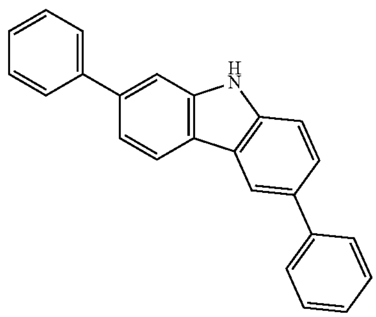 | 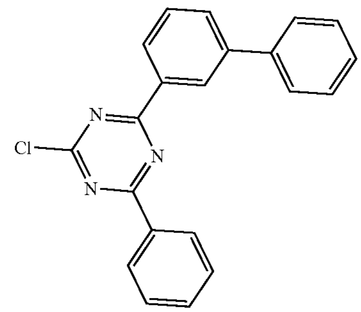 |
| 59 | 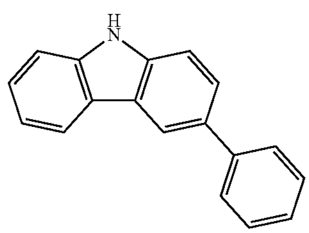 | 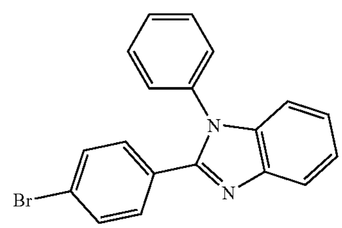 |
| 62 | 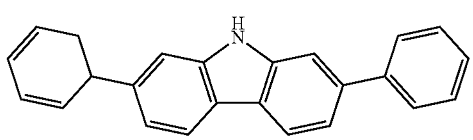 | 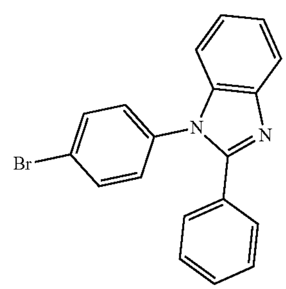 |
| 65 | 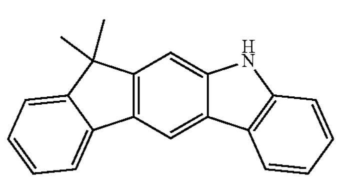 | 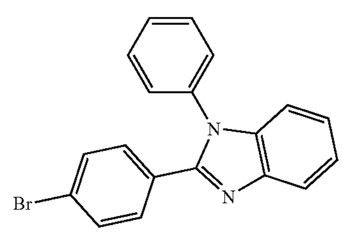 |
| 67 | 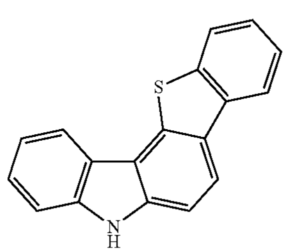 | 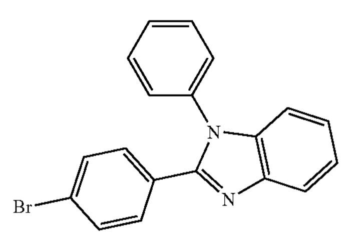 |

TABLE 7-continued
| | | |
|---|---|---|
| 70 | 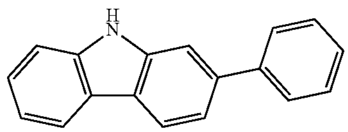 | 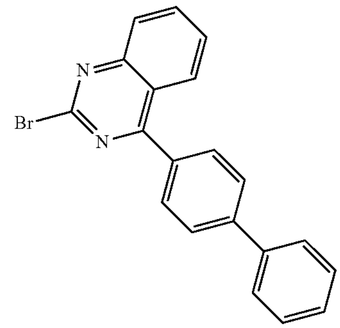 |
| 71 | 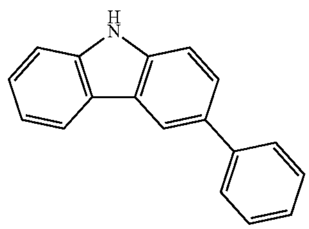 | 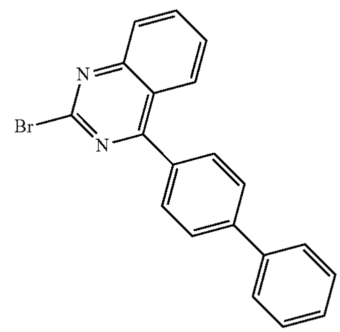 |
| 75 | 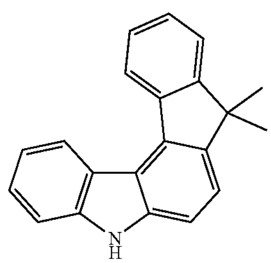 | 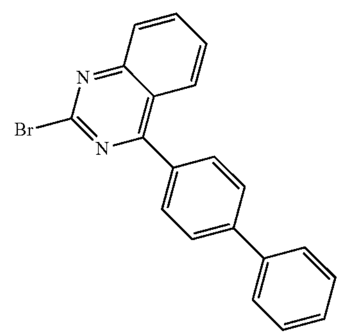 |
| 77 | 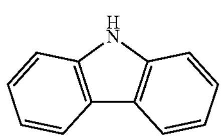 | 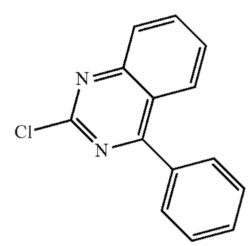 |
| 80 | 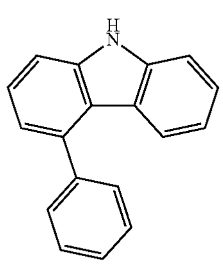 | 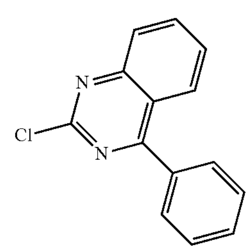 |

TABLE 7-continued
| | | |
|---|---|---|
| 83 | 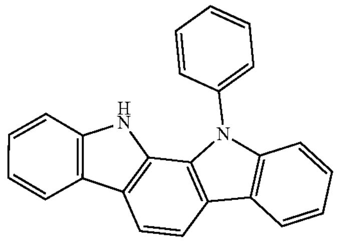 [SMILES: c1ccc(-n2c3ccccc3c3ccc4c5ccccc5[nH]c4c32)cc1] | 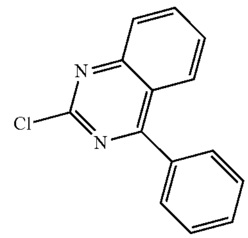 [SMILES: Clc1nc(-c2ccccc2)c2ccccc2n1] |
| 86 | 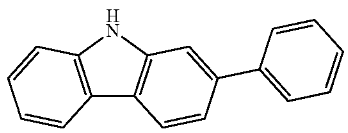 [SMILES: c1ccc(-c2ccc3c(c2)[nH]c2ccccc23)cc1] | 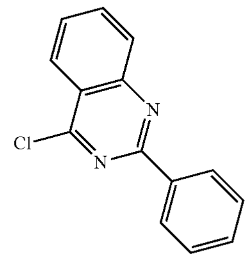 [SMILES: Clc1nc(-c2ccccc2)nc2ccccc12] |
| 90 | 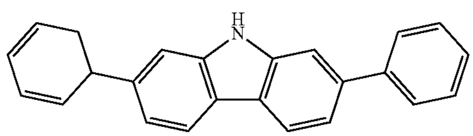 [SMILES: C1=CCC(c2ccc3c(c2)[nH]c2cc(-c4ccccc4)ccc23)C=C1] | 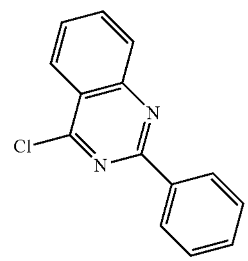 [SMILES: Clc1nc(-c2ccccc2)nc2ccccc12] |
| 92 | 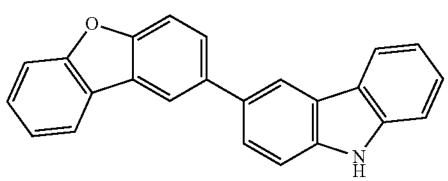 | 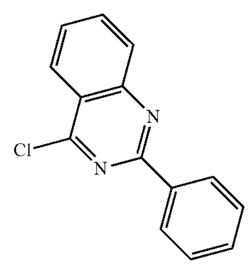 [SMILES: Clc1nc(-c2ccccc2)nc2ccccc12] |
| 95 | 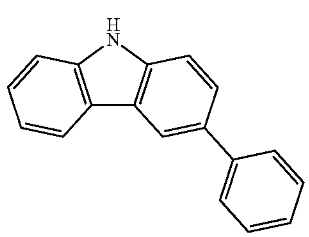 [SMILES: c1ccc(-c2ccc3[nH]c4ccccc4c3c2)cc1] | 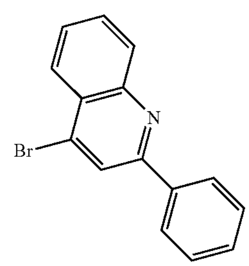 [SMILES: Brc1cc(-c2ccccc2)nc2ccccc12] |
| 100 | 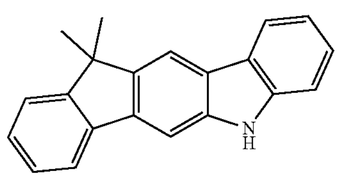 [SMILES: CC1(C)c2ccccc2-c2cc3[nH]c4ccccc4c3cc21] | 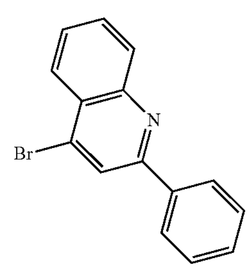 |

TABLE 7-continued
| | | |
|---|---|---|
| 101 | 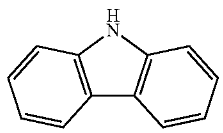 | 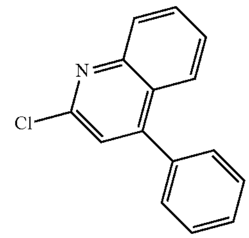 [SMILES: Clc1cc(-c2ccccc2)c2ccccc2n1] |
| 110 | 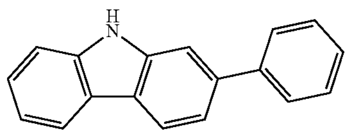 [SMILES: c1ccc(-c2ccc3c(c2)[nH]c2ccccc23)cc1] | 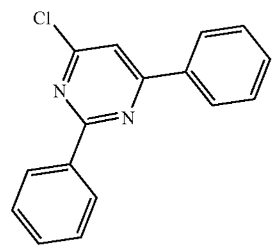 [SMILES: Clc1cc(-c2ccccc2)nc(-c2ccccc2)n1] |
| 113 | 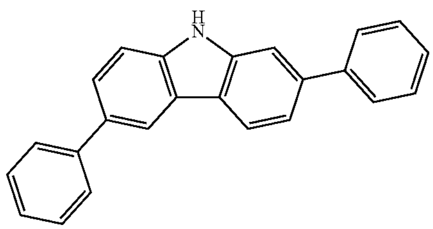 [SMILES: c1ccc(-c2ccc3c(c2)[nH]c2ccc(-c4ccccc4)cc23)cc1] | 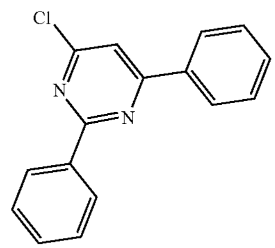 [SMILES: Clc1cc(-c2ccccc2)nc(-c2ccccc2)n1] |
| 118 | 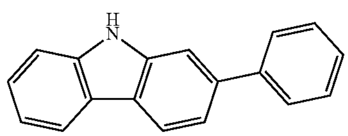 [SMILES: c1ccc(-c2ccc3c(c2)[nH]c2ccccc23)cc1] | 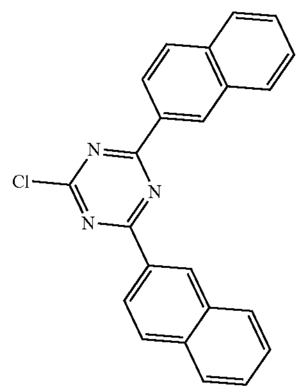 [SMILES: Clc1nc(-c2ccc3ccccc3c2)nc(-c2ccc3ccccc3c2)n1] |
| 119 | 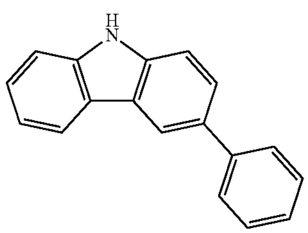 [SMILES: c1ccc(-c2ccc3[nH]c4ccccc4c3c2)cc1] | 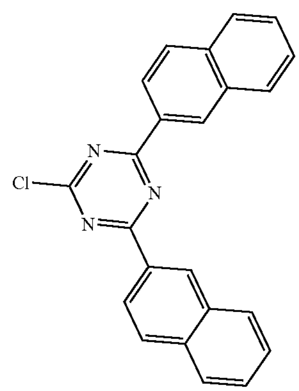 [SMILES: Clc1nc(-c2ccc3ccccc3c2)nc(-c2ccc3ccccc3c2)n1] |

TABLE 7-continued
121 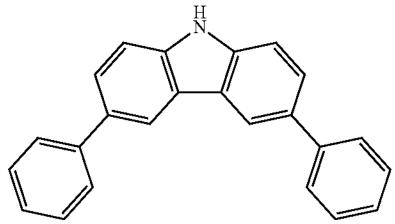 [SMILES: c1ccc(-c2ccc3[nH]c4ccc(-c5ccccc5)cc4c3c2)cc1] 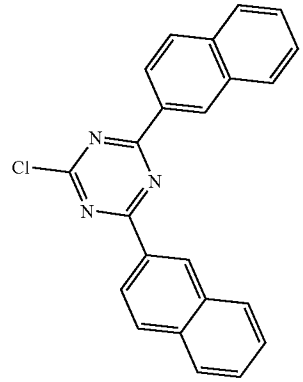 [SMILES: Clc1nc(-c2ccc3ccccc3c2)nc(-c2ccc3ccccc3c2)n1]
125 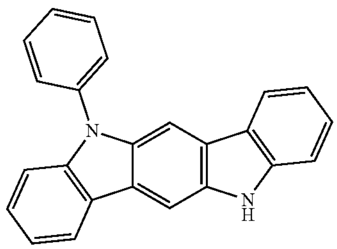 [SMILES: c1ccc(-n2c3ccccc3c3cc4[nH]c5ccccc5c4cc32)cc1] 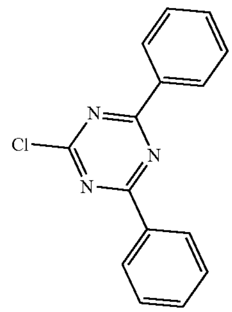 [SMILES: Clc1nc(-c2ccccc2)nc(-c2ccccc2)n1]
127 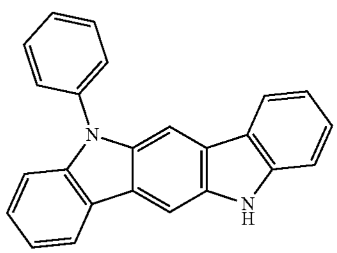 [SMILES: c1ccc(-n2c3ccccc3c3cc4[nH]c5ccccc5c4cc32)cc1] 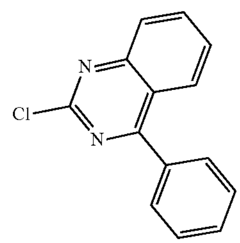 [SMILES: Clc1nc(-c2ccccc2)c2ccccc2n1]
257 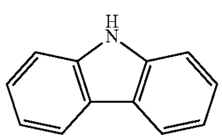 [SMILES: c1ccc2c(c1)[nH]c1ccccc12] 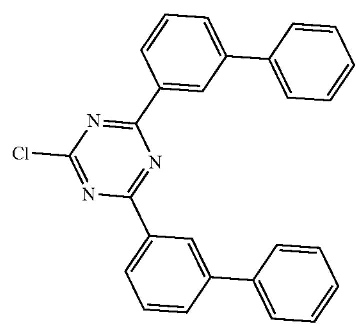 [SMILES: Clc1nc(-c2cccc(-c3ccccc3)c2)nc(-c2cccc(-c3ccccc3)c2)n1]
258 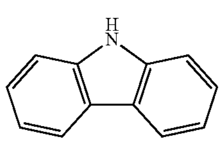 [SMILES: c1ccc2c(c1)[nH]c1ccccc12] 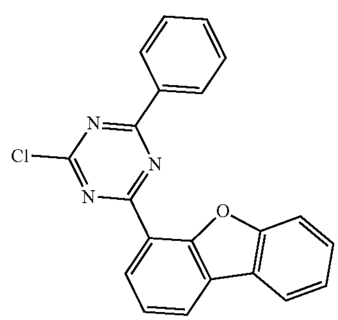 [SMILES: Clc1nc(-c2ccccc2)nc(-c2cccc3c2oc2ccccc23)n1]

TABLE 7-continued
| | | |
|---|---|---|
| 261 | 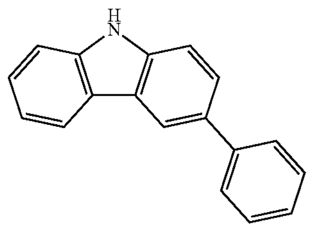 [SMILES: c1ccc(-c2ccc3[nH]c4ccccc4c3c2)cc1] | 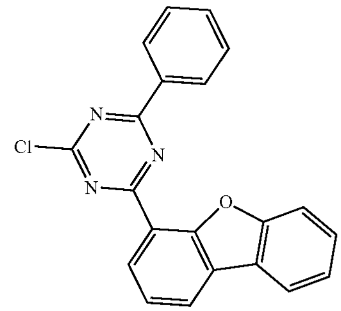 [SMILES: Clc1nc(-c2ccccc2)nc(-c2cccc3c2oc2ccccc23)n1] |
| 286 | 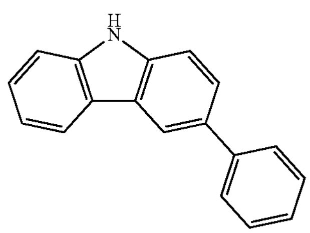 [SMILES: c1ccc(-c2ccc3[nH]c4ccccc4c3c2)cc1] | 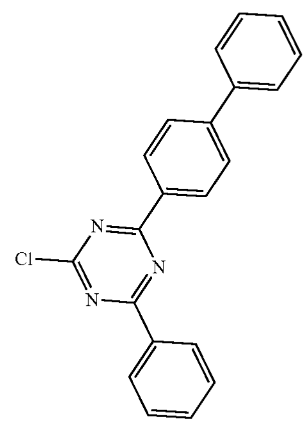 [SMILES: Clc1nc(-c2ccccc2)nc(-c2ccc(-c3ccccc3)cc2)n1] |
| Compound | G | Yield (1-3 to G) |
|---|---|---|
| 2 | 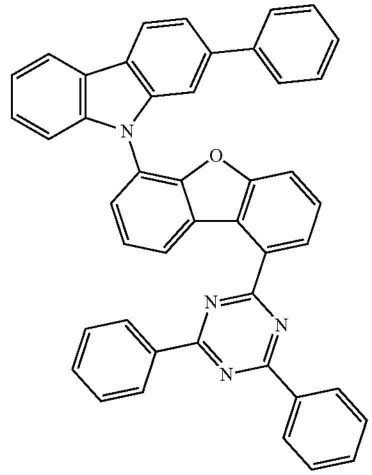 | 69% |

TABLE 7-continued
| | | |
|---|---|---|
| 3 | 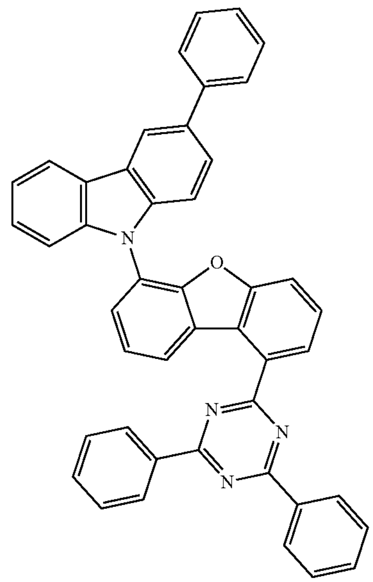 | 72% |
| 5 | 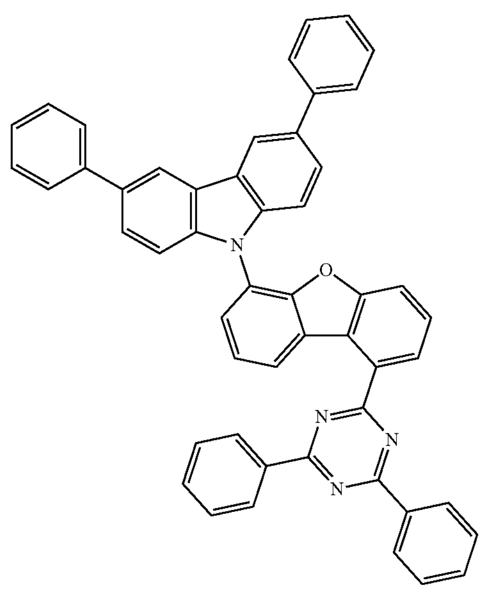 | 70% |

TABLE 7-continued
| | | |
|---|---|---|
| 7 | 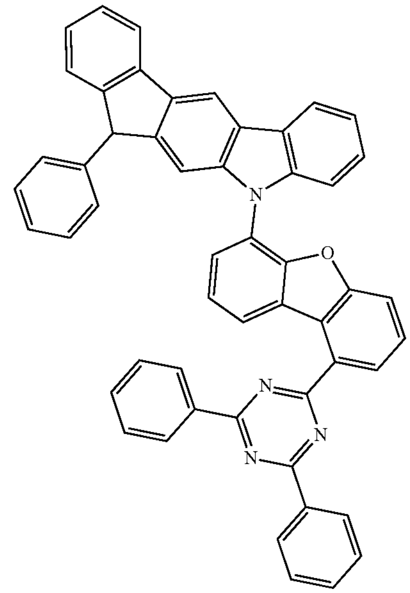 | 61% |
| 10 | 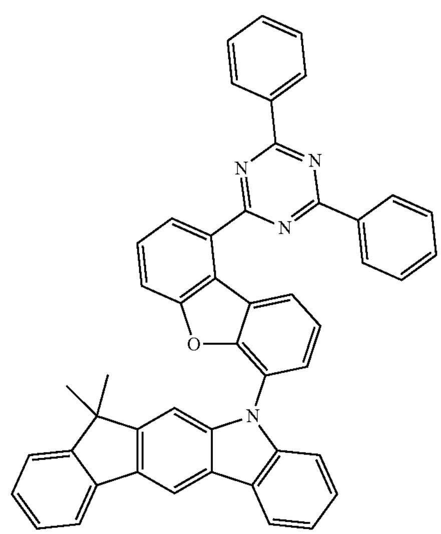 | 63% |

TABLE 7-continued
| | | |
|---|---|---|
| 17 | 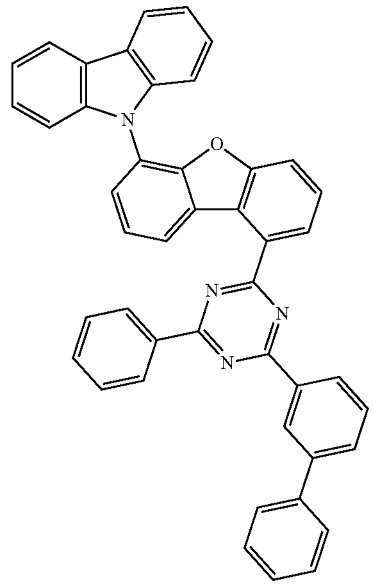 | 64% |
| 18 | 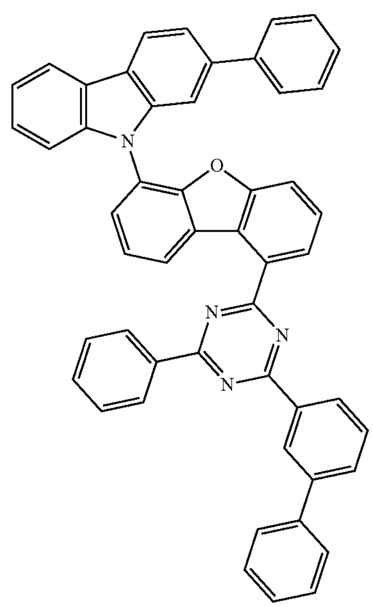 | 66% |

TABLE 7-continued
| | | |
|---|---|---|
| 19 | 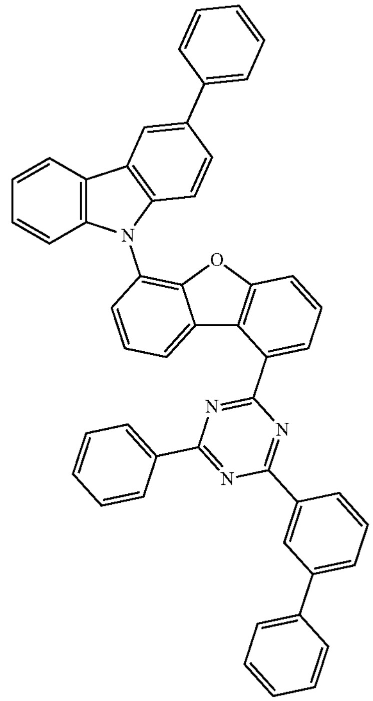 | 69% |
| 22 | 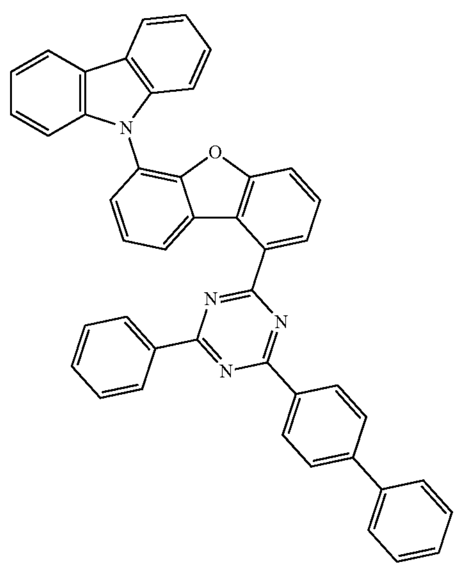 | 66% |

TABLE 7-continued
| | | |
|---|---|---|
| 28 | 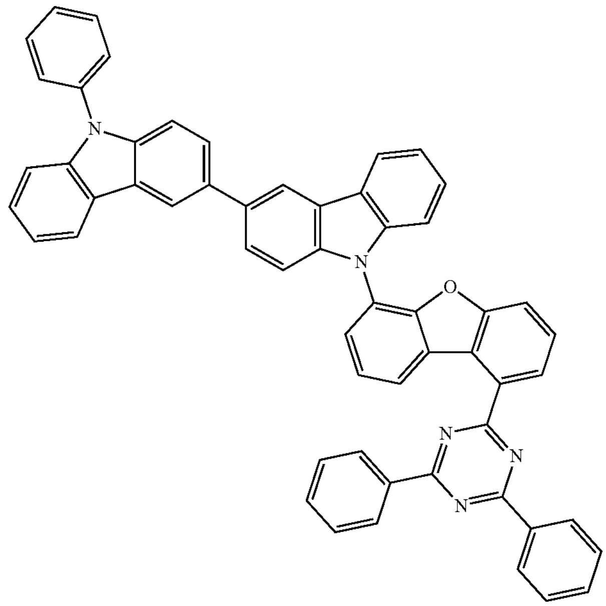 [SMILES: c1ccc(-c2nc(-c3ccccc3)nc(-c3cccc4oc5c(-n6c7ccccc7c7cc(-c8ccc9c(c8)c8ccccc8n9-c8ccccc8)ccc76)cccc5c34)n2)cc1] | 69% |
| 29 | 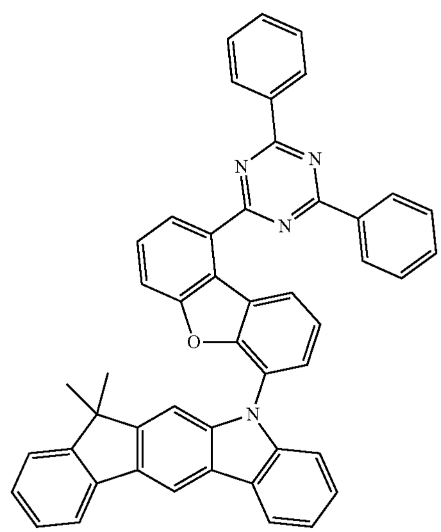 [SMILES: CC1(C)c2ccccc2-c2cc3c4ccccc4n(-c4cccc5c4oc4cccc(-c6nc(-c7ccccc7)nc(-c7ccccc7)n6)c45)c3cc21] | 58% |
| 34 | 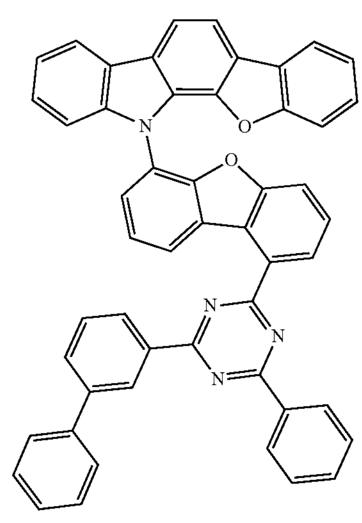 [SMILES: c1ccc(-c2cccc(-c3nc(-c4ccccc4)nc(-c4cccc5oc6c(-n7c8ccccc8c8ccc9c%10ccccc%10oc9c87)cccc6c45)n3)c2)cc1] | 62% |

TABLE 7-continued
| | | |
|---|---|---|
| 38 | 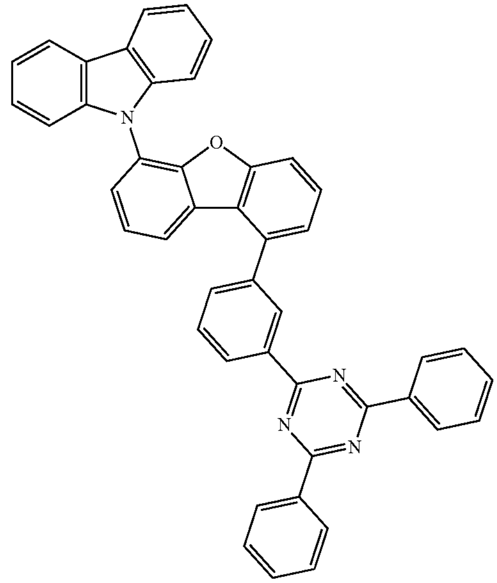 [SMILES: c1ccc(-c2nc(-c3ccccc3)nc(-c3cccc(-c4cccc5oc6c(-n7c8ccccc8c8ccccc87)cccc6c45)c3)n2)cc1] | 70% |
| 39 | 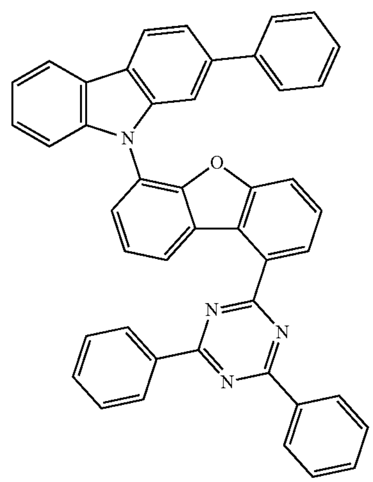 [SMILES: c1ccc(-c2ccc3c4ccccc4n(-c4cccc5c4oc4cccc(-c6nc(-c7ccccc7)nc(-c7ccccc7)n6)c45)c3c2)cc1] | 71% |
| 43 | 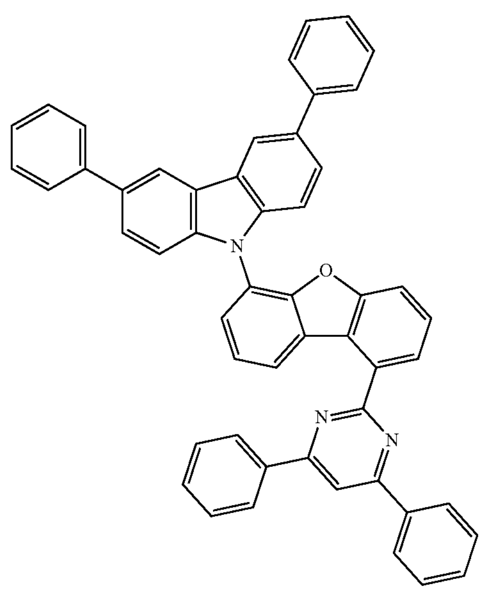 [SMILES: c1ccc(-c2ccc3c(c2)c2cc(-c4ccccc4)ccc2n3-c2cccc3c2oc2cccc(-c4nc(-c5ccccc5)cc(-c5ccccc5)n4)c23)cc1] | 68% |

TABLE 7-continued
| | | |
|---|---|---|
| 45 | 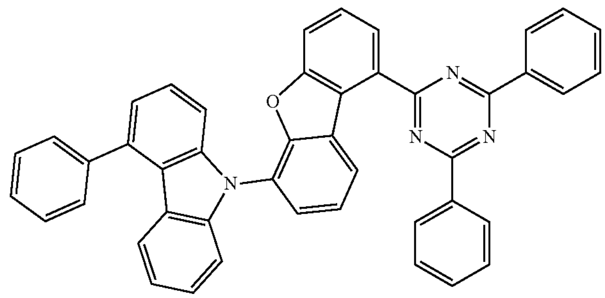 [SMILES: c1ccc(-c2nc(-c3ccccc3)nc(-c3cccc4oc5c(-n6c7ccccc7c7c(-c8ccccc8)cccc76)cccc5c34)n2)cc1] | 42% |
| 48 | 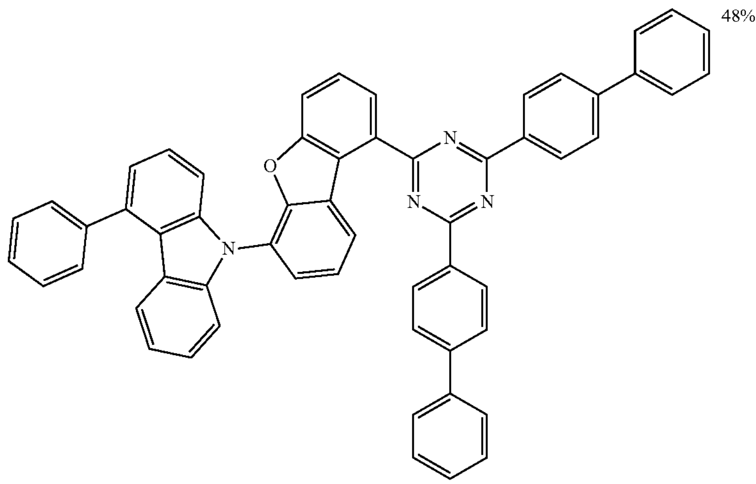 | 48% |
| 51 | 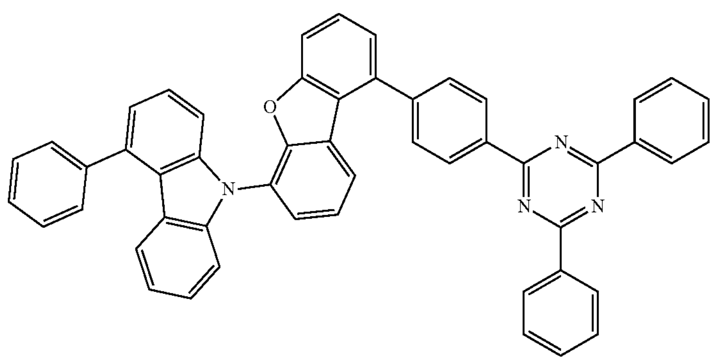 [SMILES: c1ccc(-c2nc(-c3ccccc3)nc(-c3ccc(-c4cccc5oc6c(-n7c8ccccc8c8c(-c9ccccc9)cccc87)cccc6c45)cc3)n2)cc1] | 53% |
| 53 | 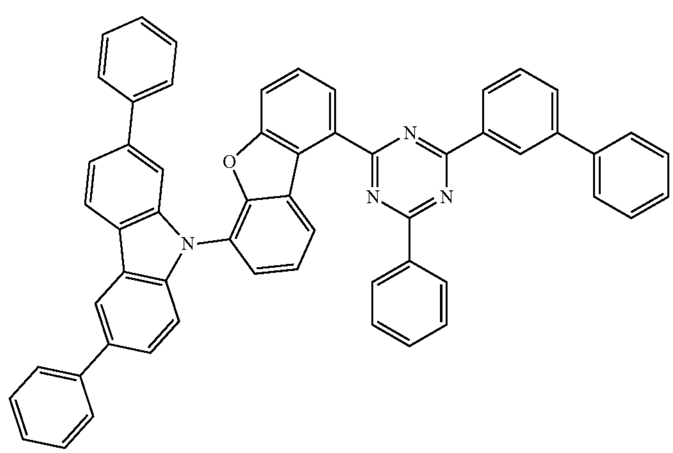 [SMILES: c1ccc(-c2cccc(-c3nc(-c4ccccc4)nc(-c4cccc5oc6c(-n7c8ccc(-c9ccccc9)cc8c8ccc(-c9ccccc9)cc87)cccc6c45)n3)c2)cc1] | 51% |

TABLE 7-continued
| | | |
|---|---|---|
| 59 | 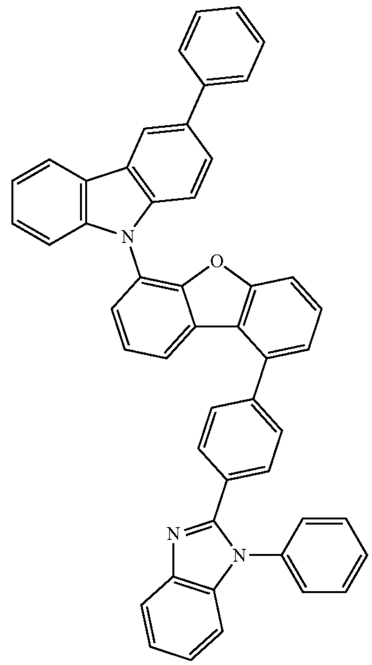 [SMILES: c1ccc(-c2ccc3c(c2)c2ccccc2n3-c2cccc3c2oc2cccc(-c4ccc(-c5nc6ccccc6n5-c5ccccc5)cc4)c23)cc1] | 66% |
| 62 | 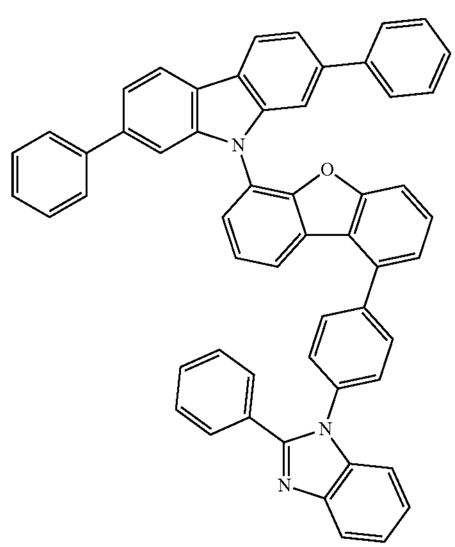 [SMILES: c1ccc(-c2ccc3c4ccc(-c5ccccc5)cc4n(-c4cccc5c4oc4cccc(-c6ccc(-n7c(-c8ccccc8)nc8ccccc87)cc6)c45)c3c2)cc1] | 65% |

TABLE 7-continued
| | | |
|---|---|---|
| 65 | 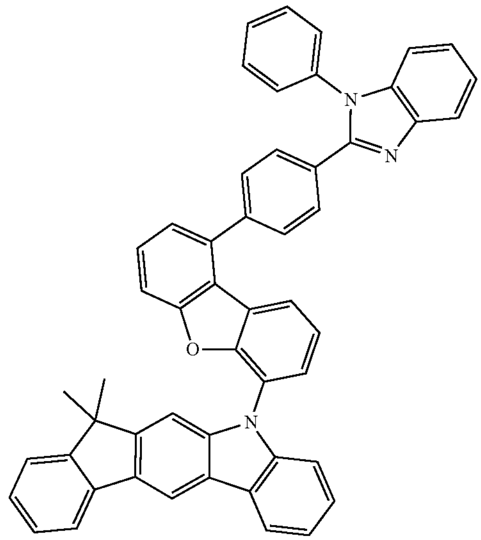 [SMILES: CC1(C)c2ccccc2-c2cc3c4ccccc4n(-c4cccc5c4oc4cccc(-c6ccc(-c7nc8ccccc8n7-c7ccccc7)cc6)c45)c3cc21] | 67% |
| 67 | 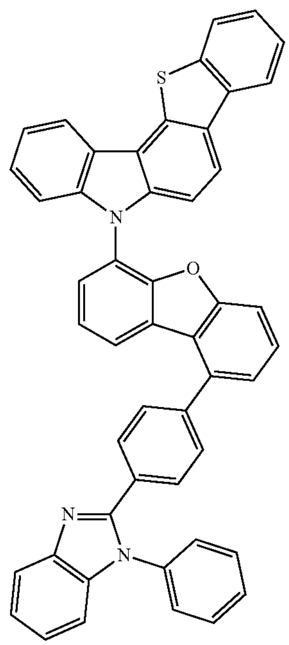 [SMILES: c1ccc(-n2c(-c3ccc(-c4cccc5oc6c(-n7c8ccccc8c8c9sc%10ccccc%10c9ccc87)cccc6c45)cc3)nc3ccccc32)cc1] | 61% |
| 70 | 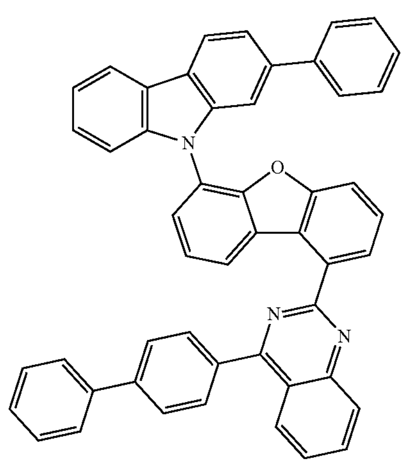 [SMILES: c1ccc(-c2ccc(-c3nc(-c4cccc5oc6c(-n7c8ccccc8c8ccc(-c9ccccc9)cc87)cccc6c45)nc4ccccc34)cc2)cc1] | 69% |

TABLE 7-continued
| | | |
|---|---|---|
| 71 | 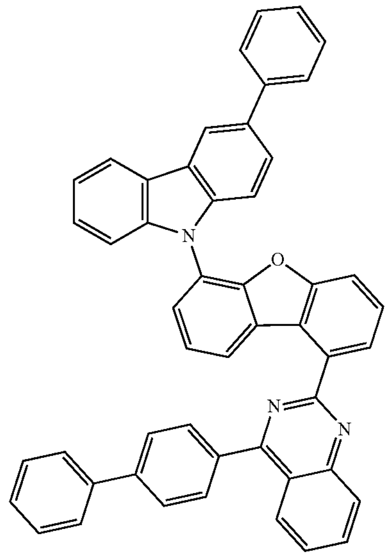 [SMILES: c1ccc(-c2ccc(-c3nc(-c4cccc5oc6c(-n7c8ccccc8c8cc(-c9ccccc9)ccc87)cccc6c45)nc4ccccc34)cc2)cc1] | 63% |
| 75 | 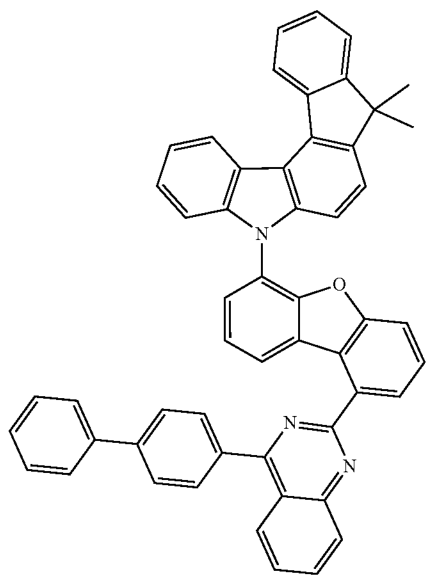 [SMILES: CC1(C)c2ccccc2-c2c1ccc1c2c2ccccc2n1-c1cccc2c1oc1cccc(-c3nc(-c4ccc(-c5ccccc5)cc4)c4ccccc4n3)c12] | 64% |
| 77 | 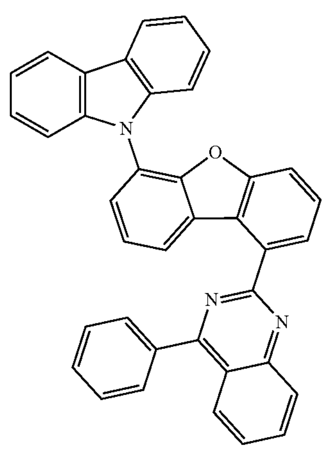 [SMILES: c1ccc(-c2nc(-c3cccc4oc5c(-n6c7ccccc7c7ccccc76)cccc5c34)nc3ccccc23)cc1] | 64% |

TABLE 7-continued
| | | |
|---|---|---|
| 80 | 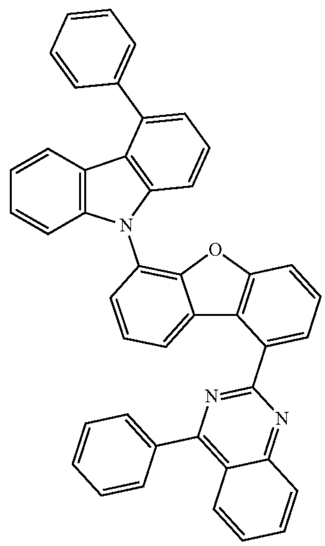 [SMILES: c1ccc(-c2nc(-c3cccc4oc5c(-n6c7ccccc7c7c(-c8ccccc8)cccc76)cccc5c34)nc3ccccc23)cc1] | 70% |
| 83 | 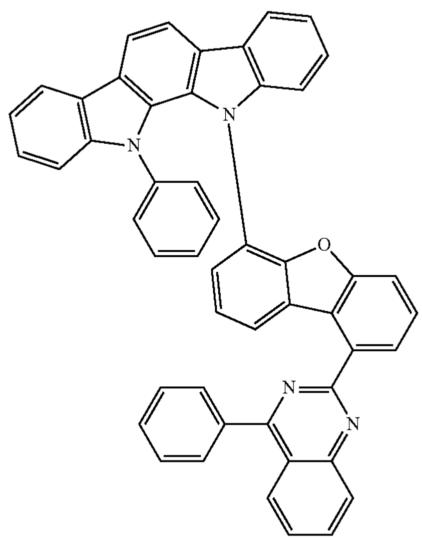 [SMILES: c1ccc(-c2nc(-c3cccc4oc5c(-n6c7ccccc7c7ccc8c9ccccc9n(-c9ccccc9)c8c76)cccc5c34)nc3ccccc23)cc1] | 68% |
| 86 | 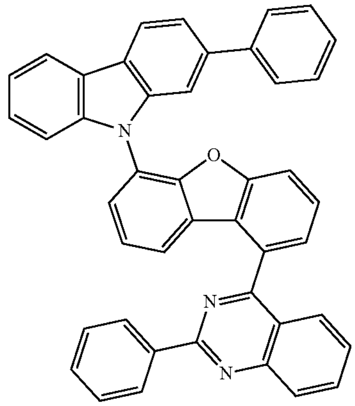 [SMILES: c1ccc(-c2ccc3c4ccccc4n(-c4cccc5c4oc4cccc(-c6nc(-c7ccccc7)nc7ccccc67)c45)c3c2)cc1] | 60% |

TABLE 7-continued
| | | |
|---|---|---|
| 90 | 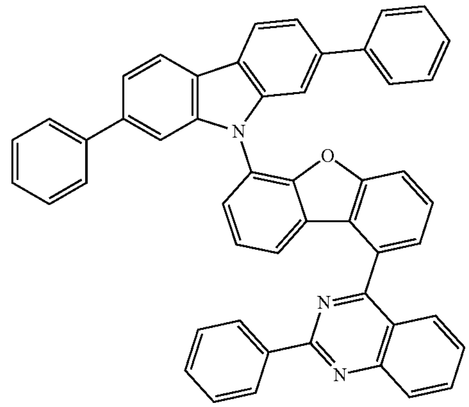 [SMILES: c1ccc(-c2ccc3c4ccc(-c5ccccc5)cc4n(-c4cccc5c4oc4cccc(-c6nc(-c7ccccc7)nc7ccccc67)c45)c3c2)cc1] | 66% |
| 92 | 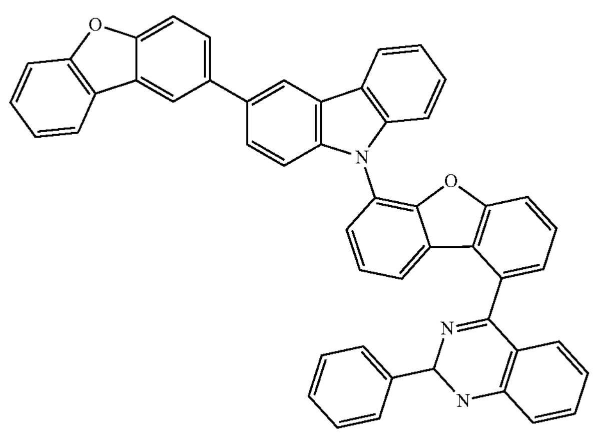 [SMILES: c1ccc(C2N=C(c3cccc4oc5c(-n6c7ccccc7c7cc(-c8ccc9oc%10ccccc%10c9c8)ccc76)cccc5c34)c3ccccc3N2)cc1] | 61% |
| 95 | 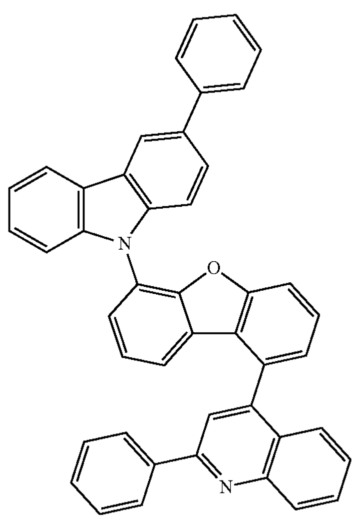 [SMILES: c1ccc(-c2ccc3c(c2)c2ccccc2n3-c2cccc3c2oc2cccc(-c4cc(-c5ccccc5)nc5ccccc45)c23)cc1] | 51% |

TABLE 7-continued
| | | |
|---|---|---|
| 100 | 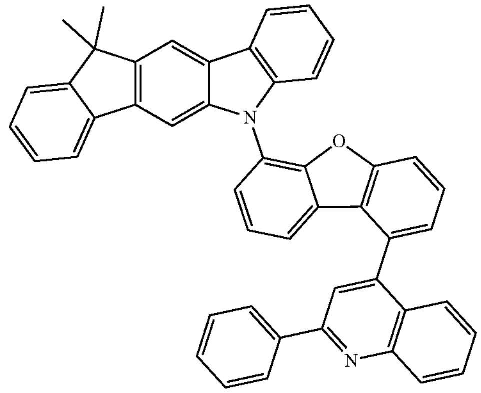 [SMILES: CC1(C)c2ccccc2-c2cc3c(cc21)c1ccccc1n3-c1cccc2c1oc1cccc(-c3cc(-c4ccccc4)nc4ccccc34)c12] | 54% |
| 101 | 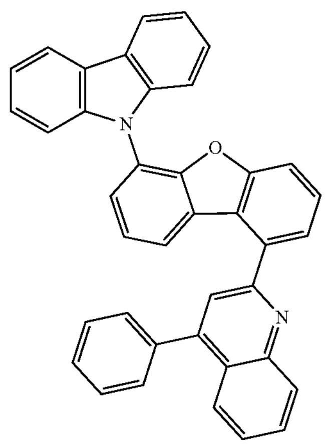 [SMILES: c1ccc(-c2cc(-c3cccc4oc5c(-n6c7ccccc7c7ccccc76)cccc5c34)nc3ccccc23)cc1] | 49% |
| 110 | 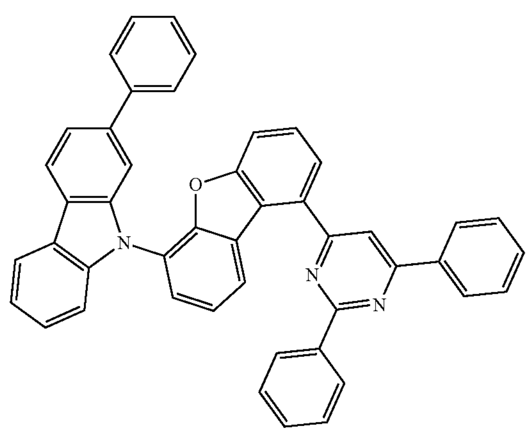 [SMILES: c1ccc(-c2ccc3c4ccccc4n(-c4cccc5c4oc4cccc(-c6cc(-c7ccccc7)nc(-c7ccccc7)n6)c45)c3c2)cc1] | 54% |

TABLE 7-continued
| | | |
|---|---|---|
| 113 | 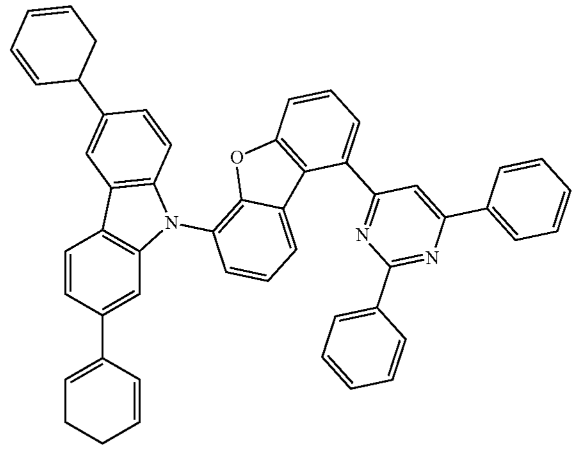 [SMILES: C1=CCC(c2ccc3c(c2)c2ccc(C4=CCCC=C4)cc2n3-c2cccc3c2oc2cccc(-c4cc(-c5ccccc5)nc(-c5ccccc5)n4)c23)C=C1] | 69% |
| 118 | 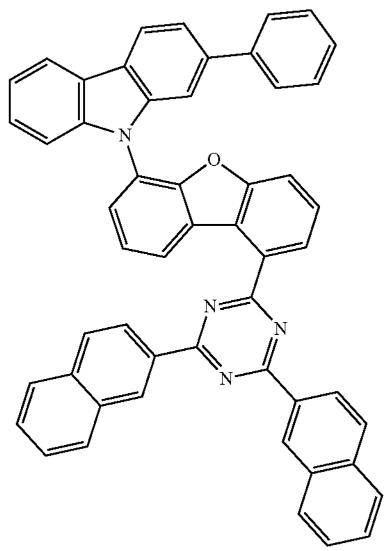 [SMILES: c1ccc(-c2ccc3c4ccccc4n(-c4cccc5c4oc4cccc(-c6nc(-c7ccc8ccccc8c7)nc(-c7ccc8ccccc8c7)n6)c45)c3c2)cc1] | 60% |
| 119 | 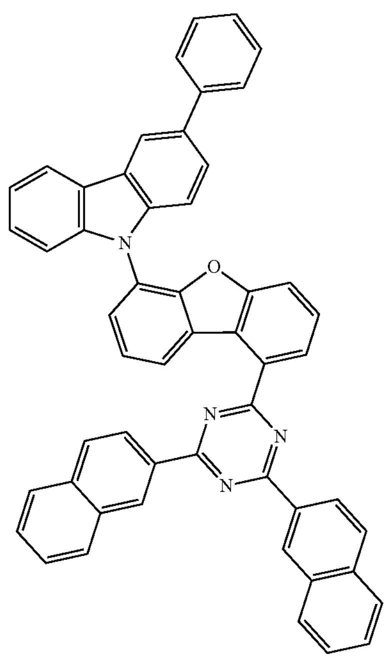 [SMILES: c1ccc(-c2ccc3c(c2)c2ccccc2n3-c2cccc3c2oc2cccc(-c4nc(-c5ccc6ccccc6c5)nc(-c5ccc6ccccc6c5)n4)c23)cc1] | 62% |

TABLE 7-continued
121
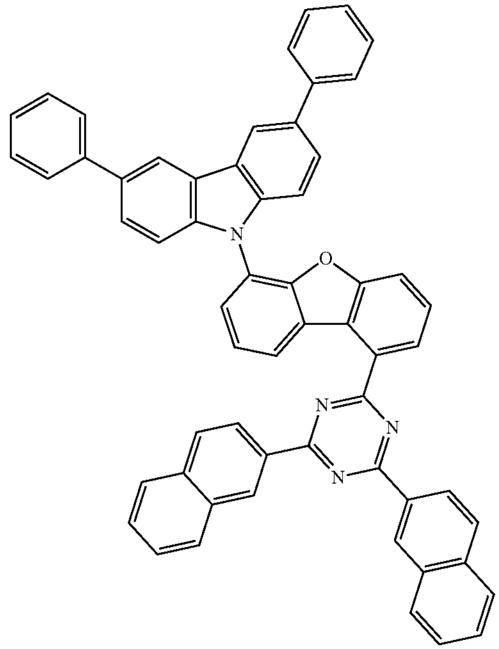 [SMILES: c1ccc(-c2ccc3c(c2)c2cc(-c4ccccc4)ccc2n3-c2cccc3c2oc2cccc(-c4nc(-c5ccc6ccccc6c5)nc(-c5ccc6ccccc6c5)n4)c23)cc1]
63%
125
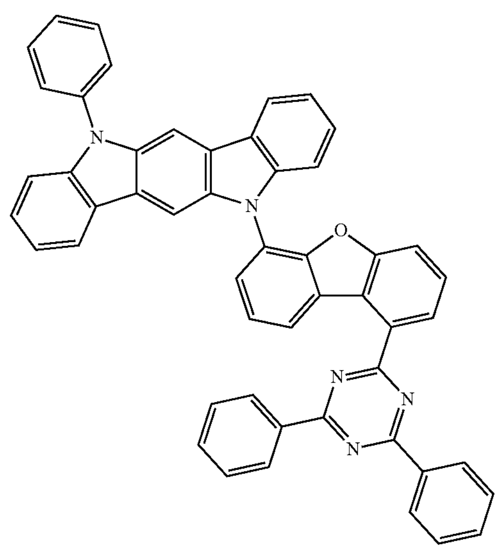 [SMILES: c1ccc(-c2nc(-c3ccccc3)nc(-c3cccc4oc5c(-n6c7ccccc7c7cc8c(cc76)c6ccccc6n8-c6ccccc6)cccc5c34)n2)cc1]
70%

TABLE 7-continued
| | | |
|---|---|---|
| 127 | 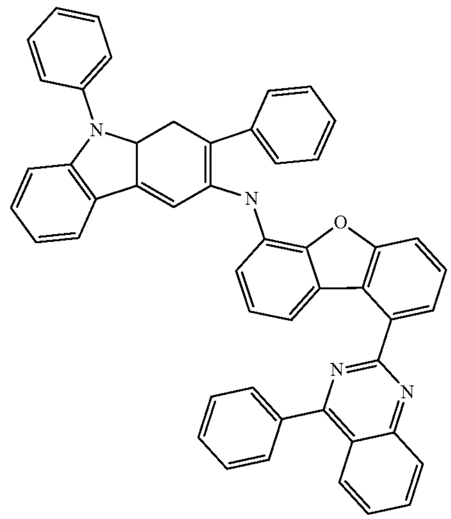 [SMILES: C1=C2c3ccccc3N(c3ccccc3)C2CC(c2ccccc2)=C1Nc1cccc2c1oc1cccc(-c3nc(-c4ccccc4)c4ccccc4n3)c12] | 64% |
| 257 | 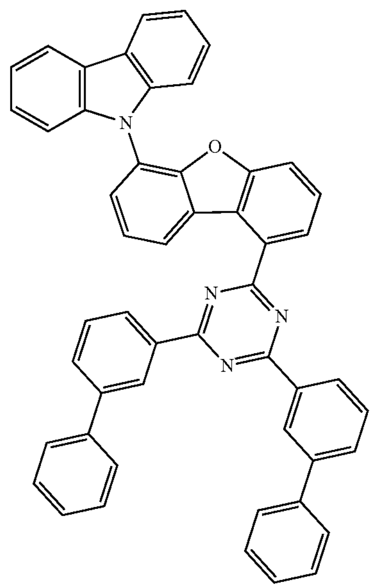 [SMILES: c1ccc(-c2cccc(-c3nc(-c4cccc(-c5ccccc5)c4)nc(-c4cccc5oc6c(-n7c8ccccc8c8ccccc87)cccc6c45)n3)c2)cc1] | 63% |
| 258 | 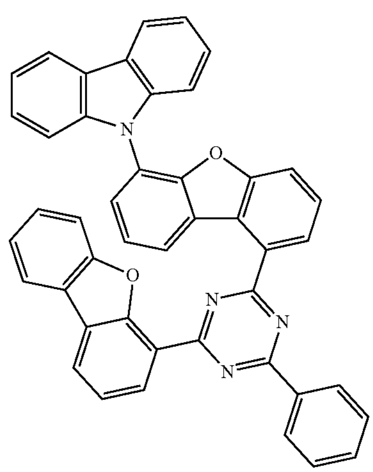 [SMILES: c1ccc(-c2nc(-c3cccc4c3oc3ccccc34)nc(-c3cccc4oc5c(-n6c7ccccc7c7ccccc76)cccc5c34)n2)cc1] | 69% |

TABLE 7-continued
| | | |
|---|---|---|
| 261 | 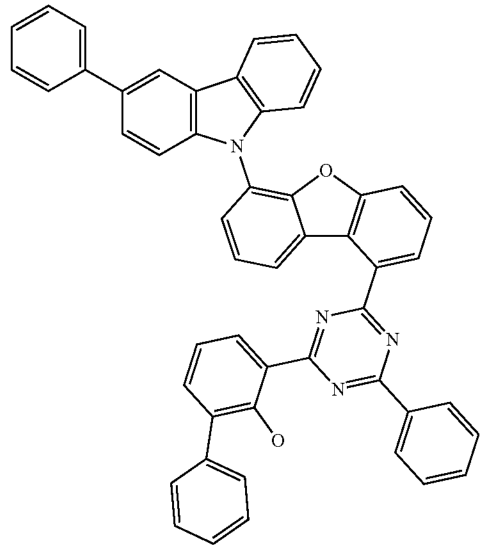 [SMILES: Oc1c(-c2ccccc2)cccc1-c1nc(-c2ccccc2)nc(-c2cccc3oc4c(-n5c6ccccc6c6cc(-c7ccccc7)ccc65)cccc4c23)n1] | 68% |
| 286 | 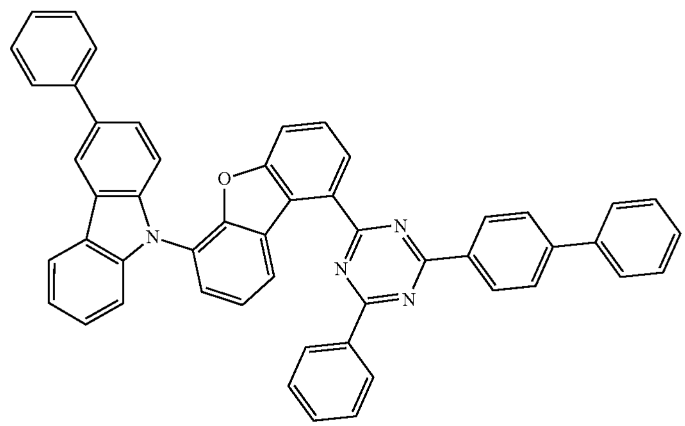 [SMILES: c1ccc(-c2ccc(-c3nc(-c4ccccc4)nc(-c4cccc5oc6c(-n7c8ccccc8c8cc(-c9ccccc9)ccc87)cccc6c45)n3)cc2)cc1] | 71% |
[Preparation Example 11] Preparation of Compound 129(H) of Group 2
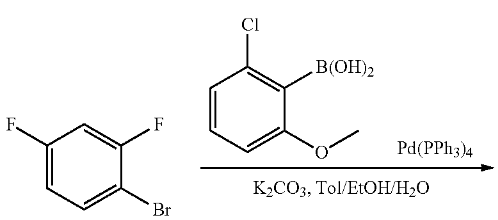
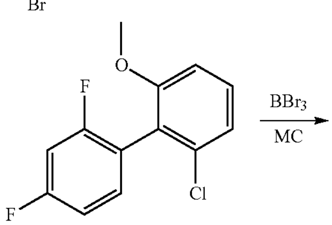
129-5
-continued
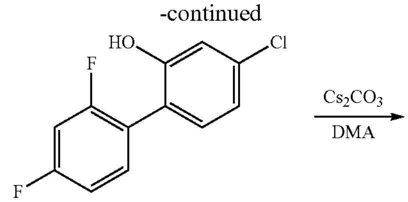
129-4
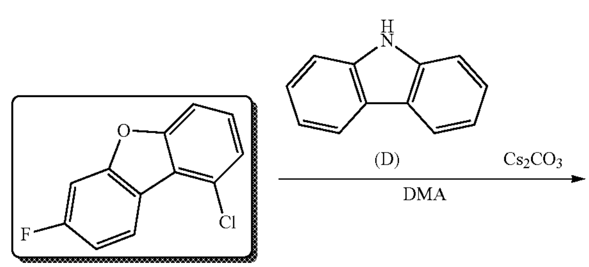
129-3

-continued

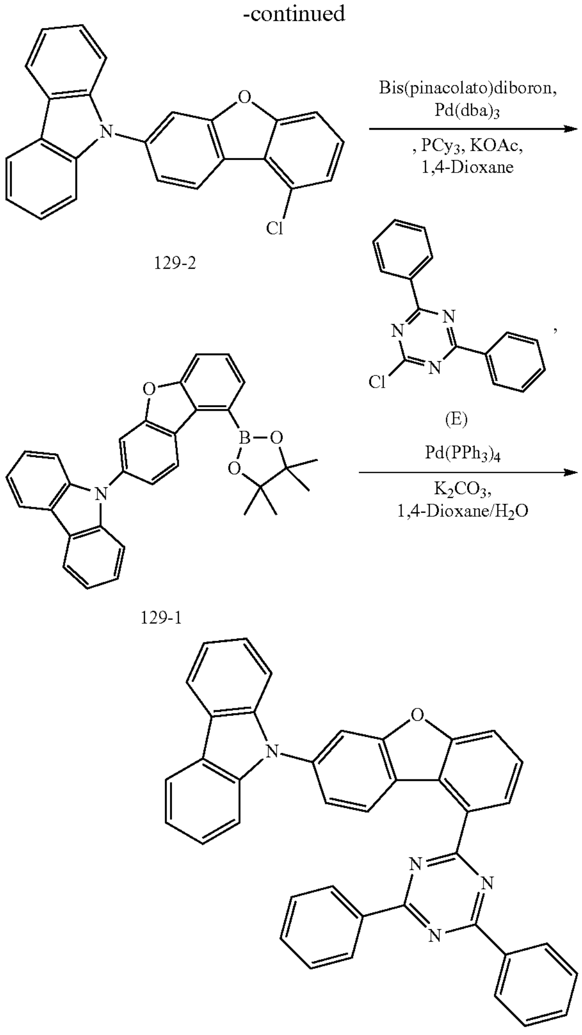

129-2

129-1

129(H)

Preparation of Compound 129-5

In a one neck round bottom flask (r.b.f), a mixture of 1-bromo-2,4-difluorobenzene (40 g, 207 mmol), (2-chloro-6-methoxyphenyl)boronic acid (42.4 g, 227 mmol), tetrakis (triphenylphosphine)palladium(0) (23 g, 20.7 mmol), potassium carbonate (57 g, 414 mmol) and toluene/ethanol/water (600 ml/150 ml/150 ml) was refluxed at 110° C.

The result was extracted with dichloromethane, dried with $MgSO_4$, silica gel filtered and then concentrated to obtain Compound 129-5 (50 g, 94%).

Preparation of Compound 129-4

In a one neck round bottom flask (r.b.f), a mixture of 2'-chloro-2,4-difluoro-6'-methoxy-1,1'-biphenyl (50 g, 196 mmol) and dichloromethane (700 ml) was cooled to 0° C., $BBr_3$ (28.3 mL, 294 mmol) was added dropwise thereto, and, after raising the temperature to room temperature, the result was stirred for 2 hours.

The reaction was terminated with distilled water, and the result was extracted with dichloromethane and dried with $MgSO_4$. The result was silica gel filtered to obtain Compound 129-4 (27.5 g, 58%).

Preparation of Compound 129-3

In a one neck round bottom flask (r.b.f), a dimethylacetamide (300 ml) mixture of 4-chloro-2',4'-difluoro-[1,1'-biphenyl]-2-ol (27 g, 114 mmol) and $Cs_2CO_3$ (83 g, 285 mmol) was stirred at 120° C. The result was cooled and then filtered, and, after removing the solvent of the filtrate, silica gel filtered to obtain Compound 129-3 (23 g, 92%).

Preparation of Compound 129-2

In a one neck round bottom flask (r.b.f), a dimethylacetamide (60 ml) mixture of 1-chloro-7-fluorodibenzo[b,d]furan (5.5 g, 24.9 mmol), 9H-carbazole (4.58 g, 27.4 mmol) and $Cs_2CO_3$ (20 g, 62 mmol) was refluxed for 6 hours at 170° C. The result was cooled and then filtered, and, after removing the solvent of the filtrate, column purified (HX:MC=3:1) to obtain Compound 129-2 (7.6 g, 83%).

Preparation of Compound 129-1

In a one neck round bottom flask (r.b.f), a 1,4-dioxane (80 ml) mixture of 9-(9-chlorodibenzo[b,d]furan-3-yl)-9H-carbazole (7.5 g, 20.3 mmol), bis(pinacolato)diboron (10.3 g, 40.7 mmol), $Pcy_3$ (1.14 g, 4.07 mmol), potassium acetate (5.97 g, 60.9 mmol) and $Pd_2(dba)_3$ (1.85 g, 2.03 mmol) was refluxed at 140° C. The result was cooled, and the filtered filtrate was concentrated and column purified (HX:MC=2:1) to obtain Compound 129-1 (6.5 g, 70%).

Preparation of Compound 129

In a one neck round bottom flask (r.b.f), a mixture of 9-(9-(4,4,5,5-tetramethyl-1,3,2-dioxaborolan-2-yl)dibenzo [b,d]furan-3-yl)-9H-carbazole (6.5 g, 14.1 mmol), 2-chloro-4,6-diphenyl-1,3,5-triazine (4.54 g, 16.9 mmol), tetrakis (triphenylphosphine)palladium(0) (1.6 g, 1.41 mmol), potassium carbonate (3.9 g, 28.2 mmol) and 1,4-dioxane/water (80 ml/28.2 ml) was refluxed for 4 hours at 120° C. The result was filtered at 60° C., and then washed with 60° C. 1,4-dioxane, distilled water and MeOH to obtain Compound 129(H) (5.4 g, 68%).

The following Compound H was synthesized in the same manner as in Preparation of Compound 129 of Preparation Example 11 except that D and E of the following [Table 8] were used as intermediates.

TABLE 8

| Compound | D | E |
|---|---|---|
| 130 | 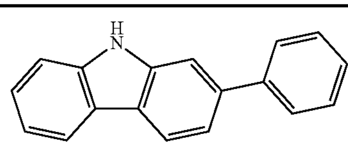 | 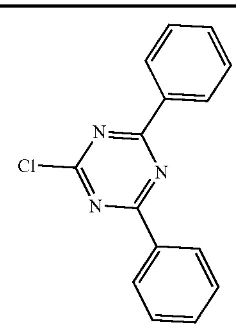 |

TABLE 8-continued
| | | |
|---|---|---|
| 131 | 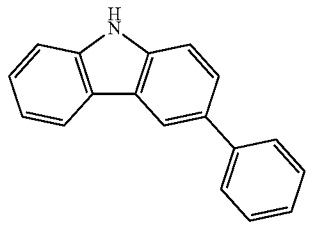 | 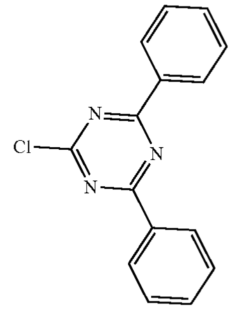 |
| 133 | 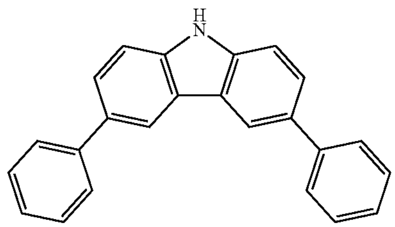 | 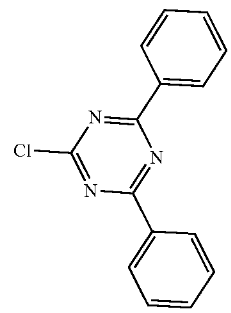 |
| 135 | 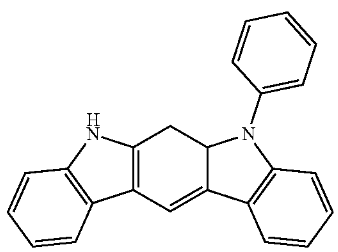 | 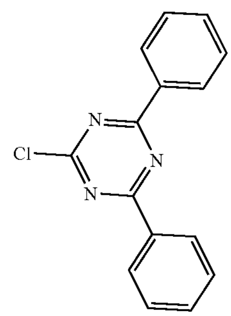 |
| 138 | 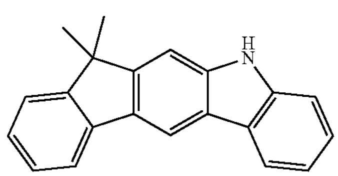 | 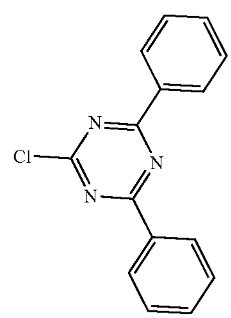 |
| 145 | 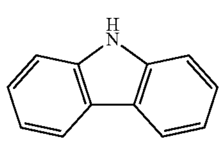 | 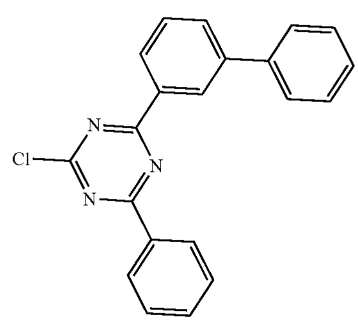 |

TABLE 8-continued
| | | |
|---|---|---|
| 146 | 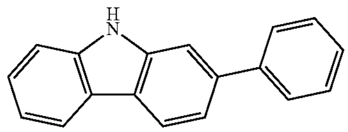 | 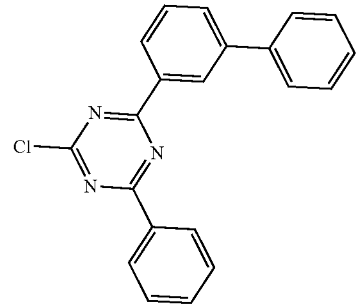 |
| 147 | 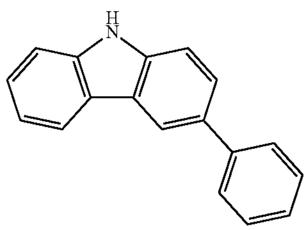 | 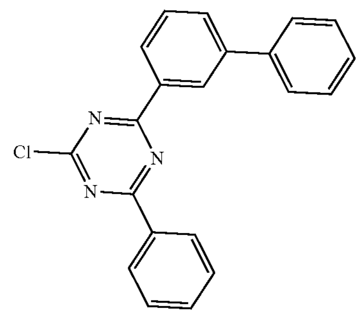 |
| 150 | 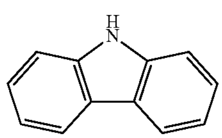 | 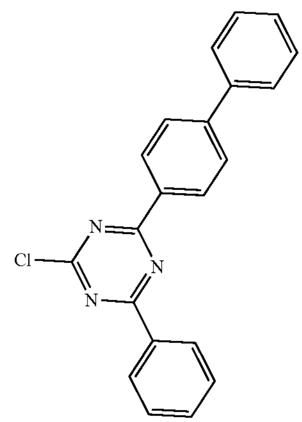 |
| 156 | 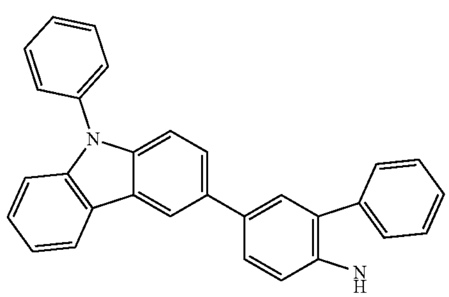 | 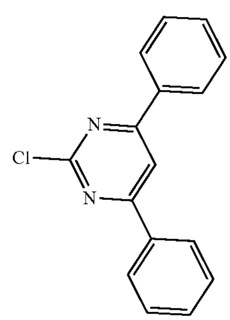 |

TABLE 8-continued
| | | |
|---|---|---|
| 157 | 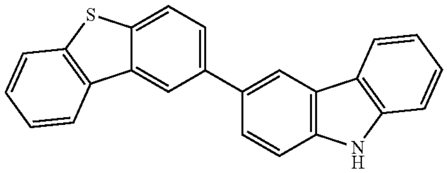 | 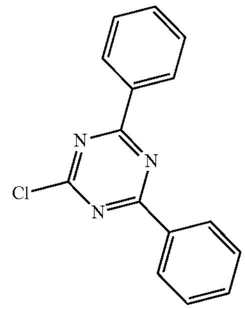 |
| 162 | 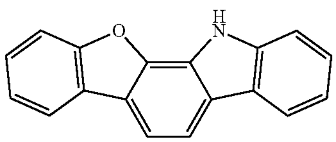 | 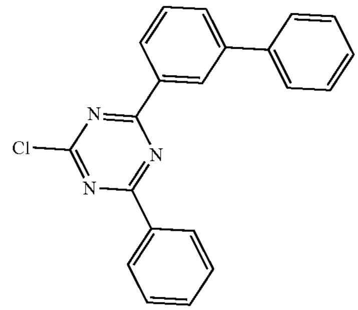 |
| 166 | 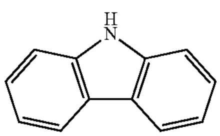 | 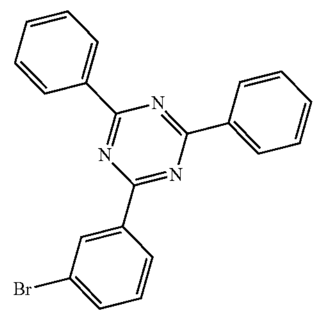 |
| 167 | 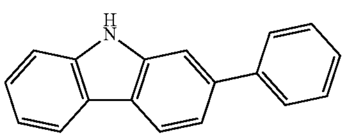 | 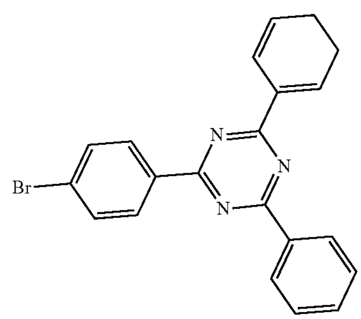 |
| 171 | 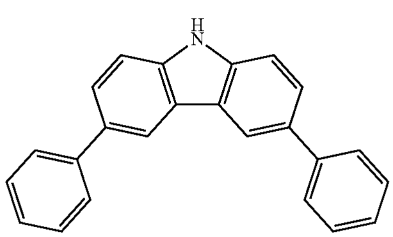 | 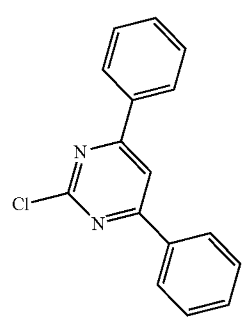 |

TABLE 8-continued
| | | |
|---|---|---|
| 173 | 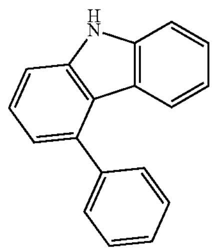 | 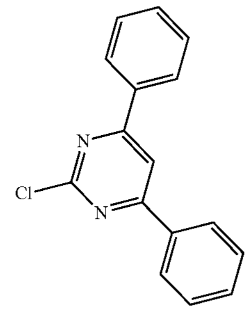 |
| 176 | 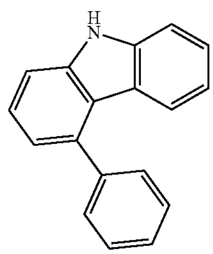 | 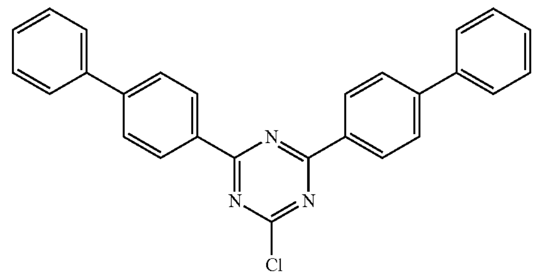 |
| 179 | 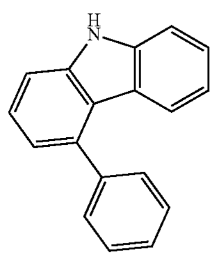 | 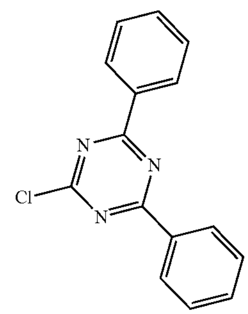 |
| 181 | 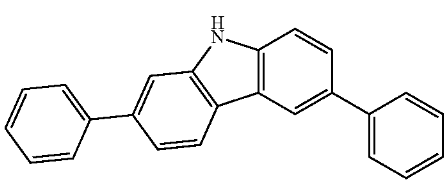 | 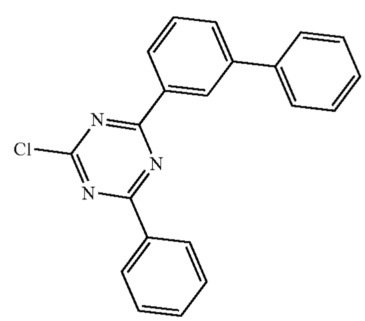 |
| 187 | 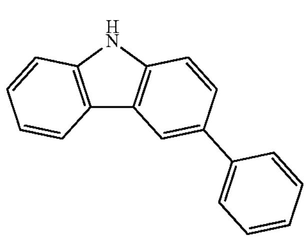 | 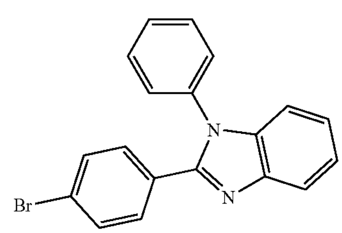 |

TABLE 8-continued
| | | |
|---|---|---|
| 190 | 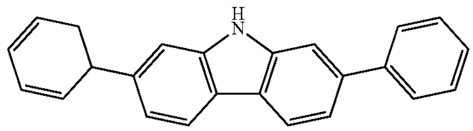 [SMILES: C1=CCC(c2ccc3c(c2)[nH]c2cc(-c4ccccc4)ccc23)C=C1] | 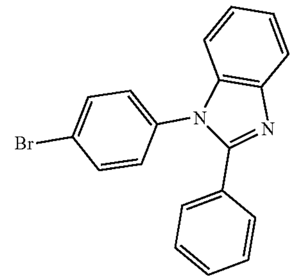 [SMILES: Brc1ccc(-n2c(-c3ccccc3)nc3ccccc32)cc1] |
| 193 | 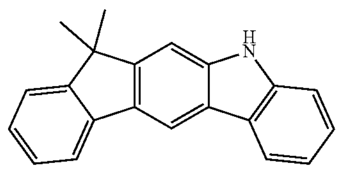 [SMILES: CC1(C)c2ccccc2-c2cc3c(cc21)[nH]c1ccccc13] | 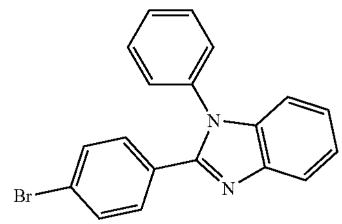 [SMILES: Brc1ccc(-c2nc3ccccc3n2-c2ccccc2)cc1] |
| 195 | 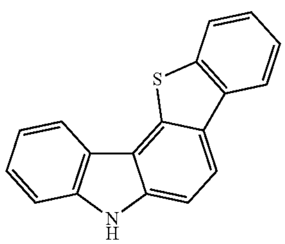 | 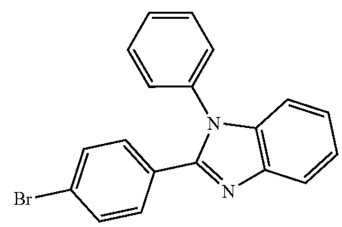 [SMILES: Brc1ccc(-c2nc3ccccc3n2-c2ccccc2)cc1] |
| 198 | 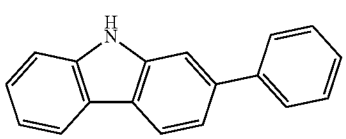 [SMILES: c1ccc(-c2ccc3c(c2)[nH]c2ccccc23)cc1] | 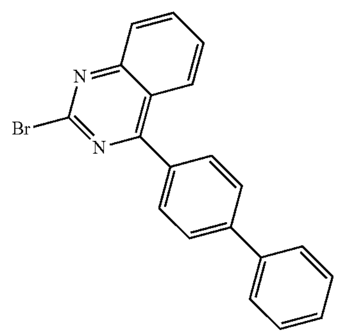 [SMILES: Brc1nc(-c2ccc(-c3ccccc3)cc2)c2ccccc2n1] |
| 199 | 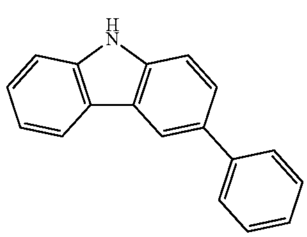 [SMILES: c1ccc(-c2ccc3[nH]c4ccccc4c3c2)cc1] | 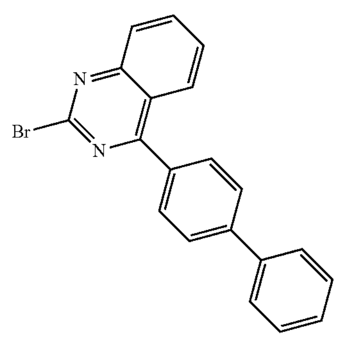 [SMILES: Brc1nc(-c2ccc(-c3ccccc3)cc2)c2ccccc2n1] |

TABLE 8-continued
| | | |
|---|---|---|
| 203 | 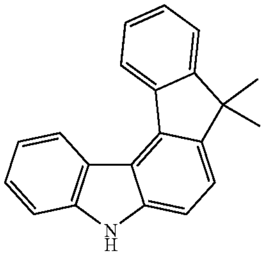 [SMILES: CC1(C)c2ccccc2-c2c1ccc1[nH]c3ccccc3c21] | 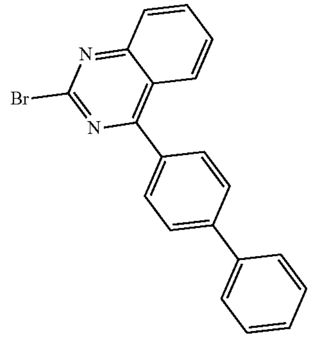 [SMILES: Brc1nc(-c2ccc(-c3ccccc3)cc2)c2ccccc2n1] |
| 205 | 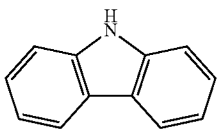 [SMILES: c1ccc2c(c1)[nH]c1ccccc12] | 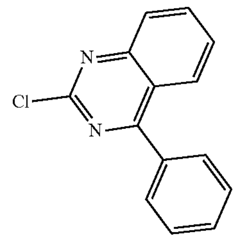 [SMILES: Clc1nc(-c2ccccc2)c2ccccc2n1] |
| 208 | 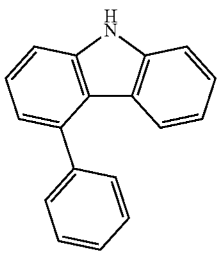 [SMILES: c1ccc(-c2cccc3[nH]c4ccccc4c23)cc1] | 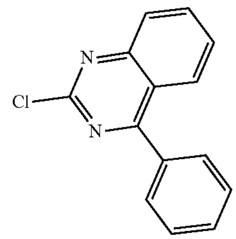 [SMILES: Clc1nc(-c2ccccc2)c2ccccc2n1] |
| 211 | 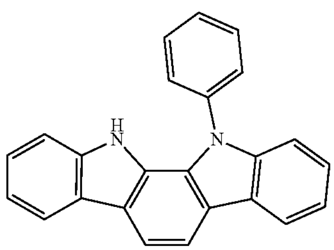 [SMILES: c1ccc(-n2c3ccccc3c3ccc4c5ccccc5[nH]c4c32)cc1] | 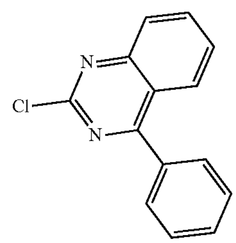 [SMILES: Clc1nc(-c2ccccc2)c2ccccc2n1] |
| 214 | 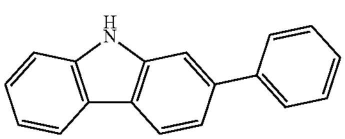 [SMILES: c1ccc(-c2ccc3c(c2)[nH]c2ccccc23)cc1] | 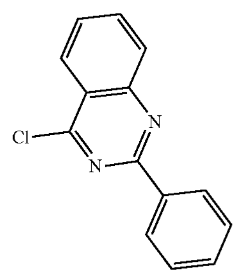 [SMILES: Clc1nc(-c2ccccc2)nc2ccccc12] |
| 218 | 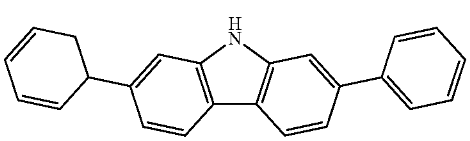 [SMILES: C1=CCC(c2ccc3c(c2)[nH]c2cc(-c4ccccc4)ccc23)C=C1] | 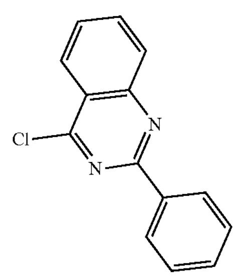 [SMILES: Clc1nc(-c2ccccc2)nc2ccccc12] |

TABLE 8-continued
| | | |
|---|---|---|
| 220 | 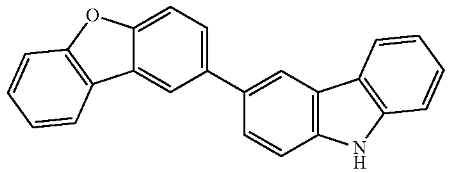 [SMILES: c1ccc2c(c1)[nH]c1ccc(-c3ccc4oc5ccccc5c4c3)cc12] | 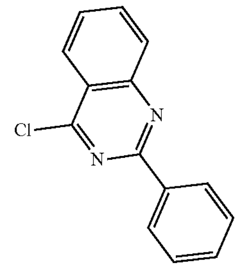 [SMILES: Clc1nc(-c2ccccc2)nc2ccccc12] |
| 223 | 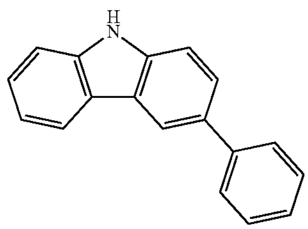 [SMILES: c1ccc(-c2ccc3[nH]c4ccccc4c3c2)cc1] | 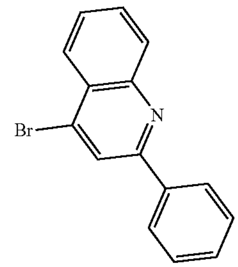 |
| 228 | 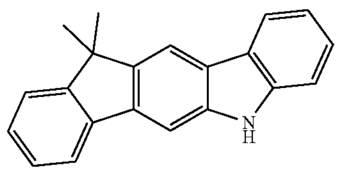 [SMILES: CC1(C)c2ccccc2-c2cc3[nH]c4ccccc4c3cc21] | 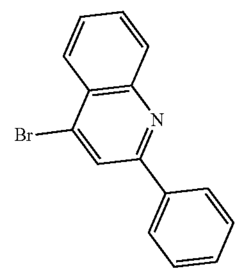 [SMILES: Brc1cc(-c2ccccc2)nc2ccccc12] |
| 229 | 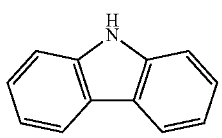 [SMILES: c1ccc2c(c1)[nH]c1ccccc12] | 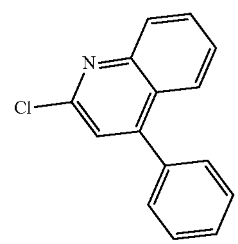 [SMILES: Clc1cc(-c2ccccc2)c2ccccc2n1] |
| 238 | 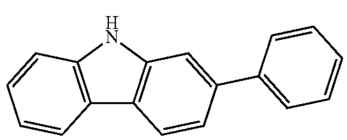 [SMILES: c1ccc(-c2ccc3c(c2)[nH]c2ccccc23)cc1] | 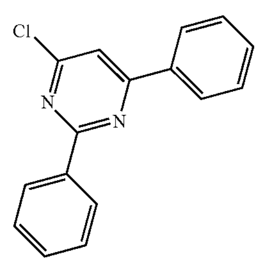 [SMILES: Clc1cc(-c2ccccc2)nc(-c2ccccc2)n1] |
| 241 | 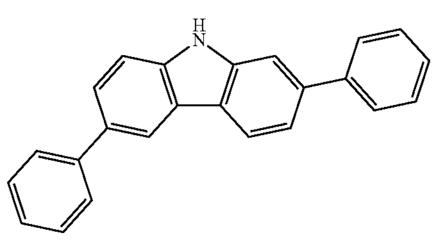 [SMILES: c1ccc(-c2ccc3c(c2)[nH]c2ccc(-c4ccccc4)cc23)cc1] | 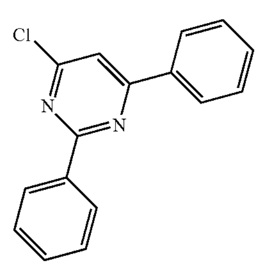 [SMILES: Clc1cc(-c2ccccc2)nc(-c2ccccc2)n1] |

TABLE 8-continued
| | | |
|---|---|---|
| 246 | 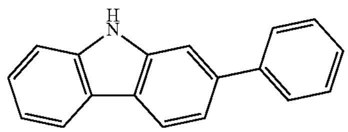 [SMILES: c1ccc(-c2ccc3c(c2)[nH]c2ccccc23)cc1] | 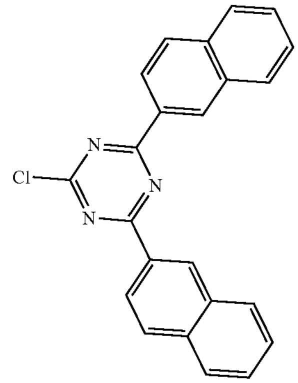 [SMILES: Clc1nc(-c2ccc3ccccc3c2)nc(-c2ccc3ccccc3c2)n1] |
| 247 | 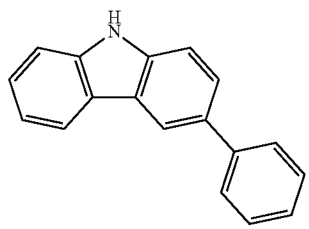 [SMILES: c1ccc(-c2ccc3[nH]c4ccccc4c3c2)cc1] | 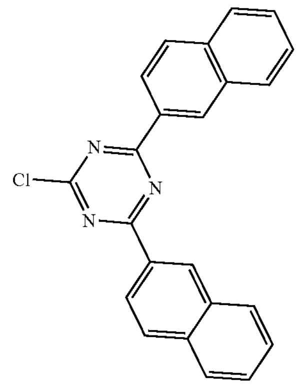 [SMILES: Clc1nc(-c2ccc3ccccc3c2)nc(-c2ccc3ccccc3c2)n1] |
| 249 | 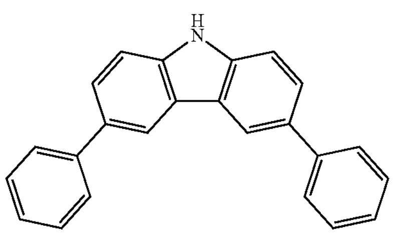 [SMILES: c1ccc(-c2ccc3[nH]c4ccc(-c5ccccc5)cc4c3c2)cc1] | 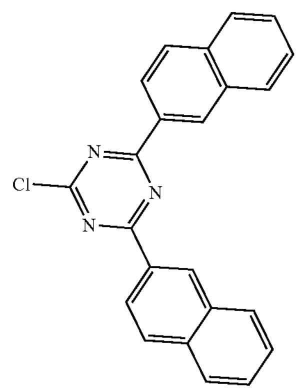 [SMILES: Clc1nc(-c2ccc3ccccc3c2)nc(-c2ccc3ccccc3c2)n1] |
| 253 | 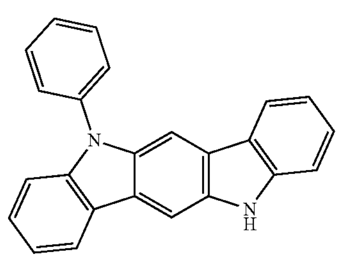 [SMILES: c1ccc(-n2c3ccccc3c3cc4[nH]c5ccccc5c4cc32)cc1] | 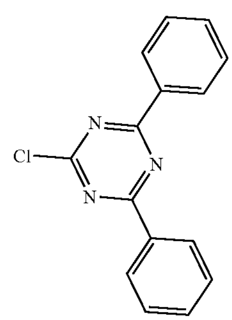 [SMILES: Clc1nc(-c2ccccc2)nc(-c2ccccc2)n1] |

TABLE 8-continued
| | | |
|---|---|---|
| 255 | 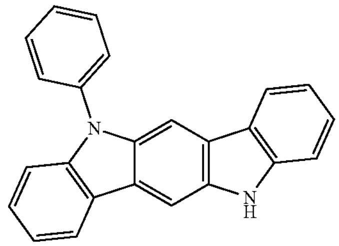 [SMILES: c1ccc(-n2c3ccccc3c3cc4[nH]c5ccccc5c4cc32)cc1] | 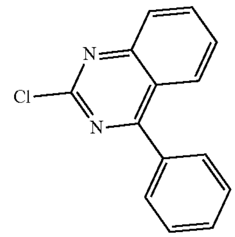 [SMILES: Clc1nc(-c2ccccc2)c2ccccc2n1] |
| 263 | 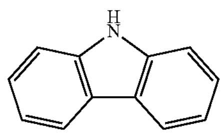 [SMILES: c1ccc2c(c1)[nH]c1ccccc12] | 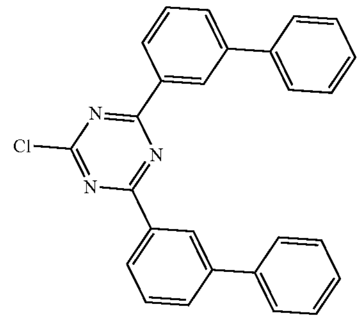 [SMILES: Clc1nc(-c2cccc(-c3ccccc3)c2)nc(-c2cccc(-c3ccccc3)c2)n1] |
| 264 | 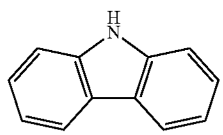 [SMILES: c1ccc2c(c1)[nH]c1ccccc12] | 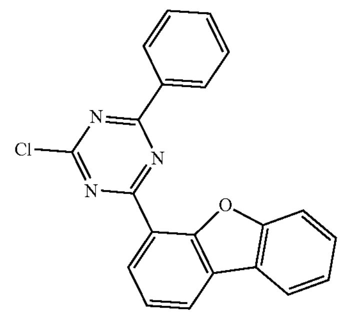 [SMILES: Clc1nc(-c2ccccc2)nc(-c2cccc3c2oc2ccccc23)n1] |
| 265 | 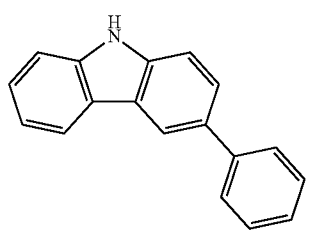 [SMILES: c1ccc(-c2ccc3[nH]c4ccccc4c3c2)cc1] | 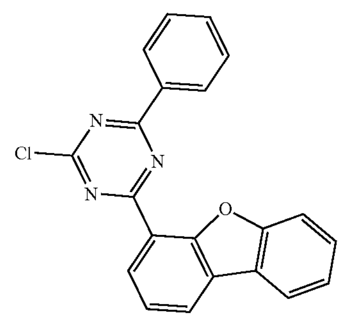 [SMILES: Clc1nc(-c2ccccc2)nc(-c2cccc3c2oc2ccccc23)n1] |
| 271 | 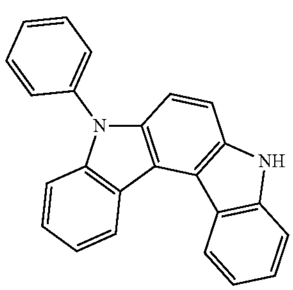 [SMILES: c1ccc(-n2c3ccccc3c3c4c(ccc32)[nH]c2ccccc24)cc1] | 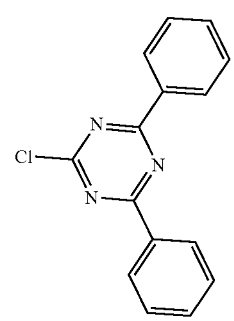 [SMILES: Clc1nc(-c2ccccc2)nc(-c2ccccc2)n1] |

TABLE 8-continued
| | | |
|---|---|---|
| 272 | 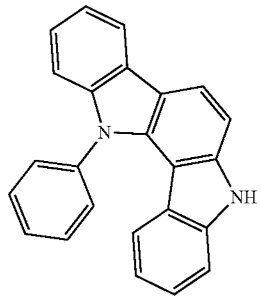 [SMILES: c1ccc(-n2c3ccccc3c3ccc4[nH]c5ccccc5c4c32)cc1] | 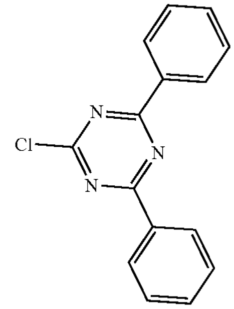 [SMILES: Clc1nc(-c2ccccc2)nc(-c2ccccc2)n1] |
| 282 | 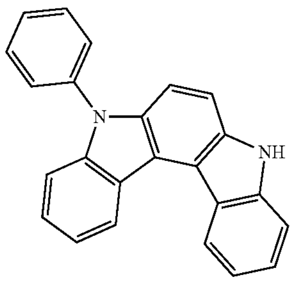 [SMILES: c1ccc(-n2c3ccccc3c3c4c(ccc32)[nH]c2ccccc24)cc1] | 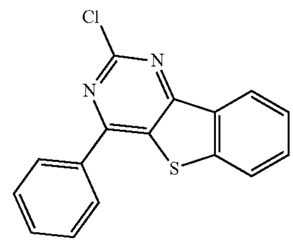 [SMILES: Clc1nc(-c2ccccc2)c2sc3ccccc3c2n1] |
| 285 | 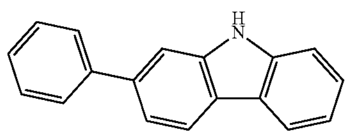 [SMILES: c1ccc(-c2ccc3c(c2)[nH]c2ccccc23)cc1] | 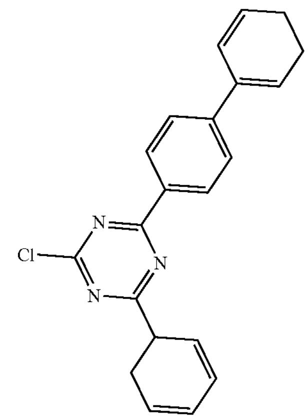 [SMILES: Clc1nc(-c2ccc(C3=CCCC=C3)cc2)nc(C2C=CC=CC2)n1] |
| Compound | H | Yield (129-3 to H) |
|---|---|---|
| 130 | 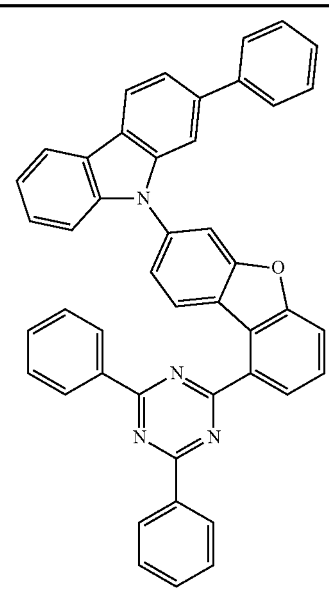 | 69% |

TABLE 8-continued
131
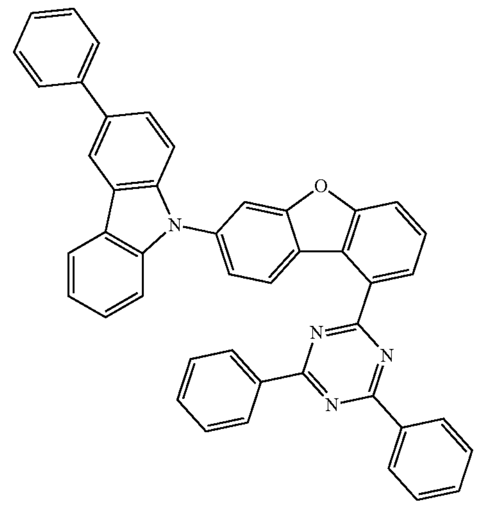 [SMILES: c1ccc(-c2ccc3c(c2)c2ccccc2n3-c2ccc3c(c2)oc2cccc(-c4nc(-c5ccccc5)nc(-c5ccccc5)n4)c23)cc1]
72%
133
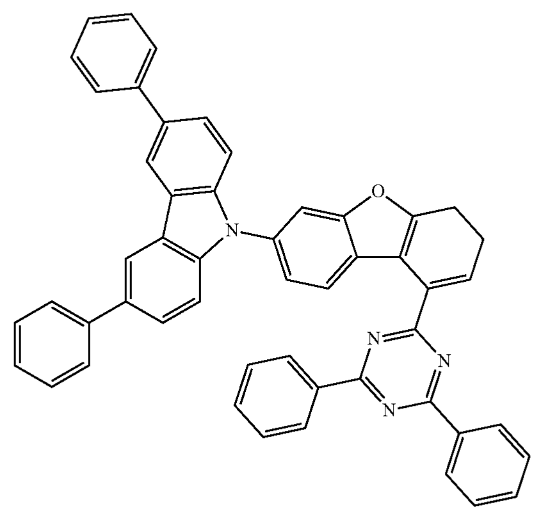 [SMILES: C1=C(c2nc(-c3ccccc3)nc(-c3ccccc3)n2)c2c(oc3cc(-n4c5ccc(-c6ccccc6)cc5c5cc(-c6ccccc6)ccc54)ccc23)CC1]
70%
135
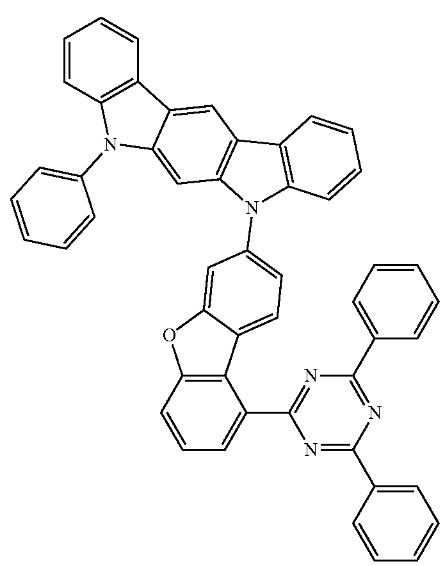 [SMILES: c1ccc(-c2nc(-c3ccccc3)nc(-c3cccc4oc5cc(-n6c7ccccc7c7cc8c9ccccc9n(-c9ccccc9)c8cc76)ccc5c34)n2)cc1]
61%

TABLE 8-continued
138
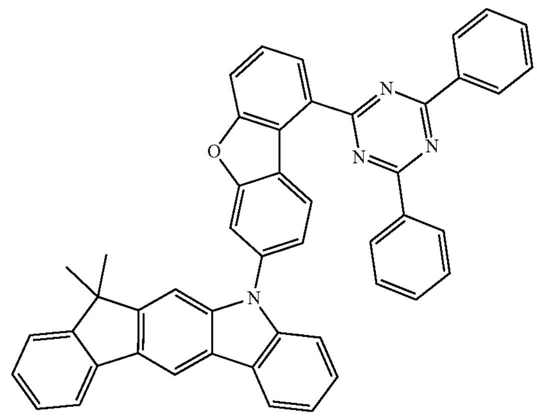 [SMILES: CC1(C)c2ccccc2-c2cc3c4ccccc4n(-c4ccc5c(c4)oc4cccc(-c6nc(-c7ccccc7)nc(-c7ccccc7)n6)c45)c3cc21]
63%
145
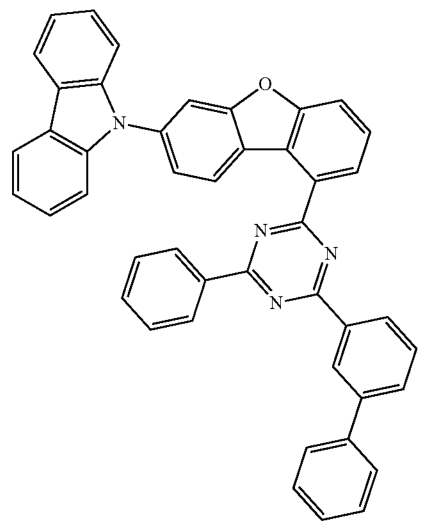 [SMILES: c1ccc(-c2cccc(-c3nc(-c4ccccc4)nc(-c4cccc5oc6cc(-n7c8ccccc8c8ccccc87)ccc6c45)n3)c2)cc1]
64%
146
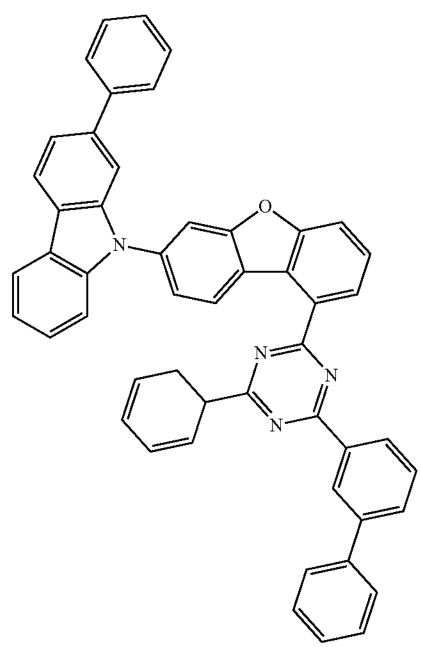 [SMILES: C1=CCC(c2nc(-c3cccc(-c4ccccc4)c3)nc(-c3cccc4oc5cc(-n6c7ccccc7c7ccc(-c8ccccc8)cc76)ccc5c34)n2)C=C1]
70%

TABLE 8-continued
| | | |
|---|---|---|
| 147 | 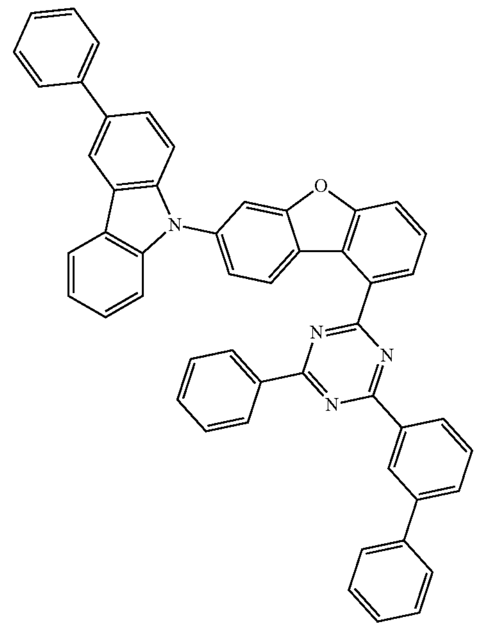 | 68% |
| 150 | 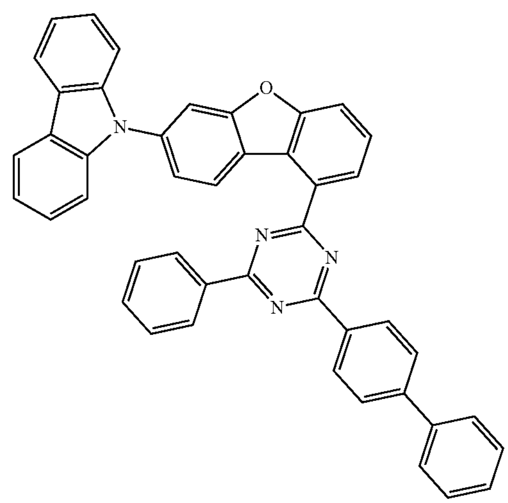 | 66% |
| 156 | 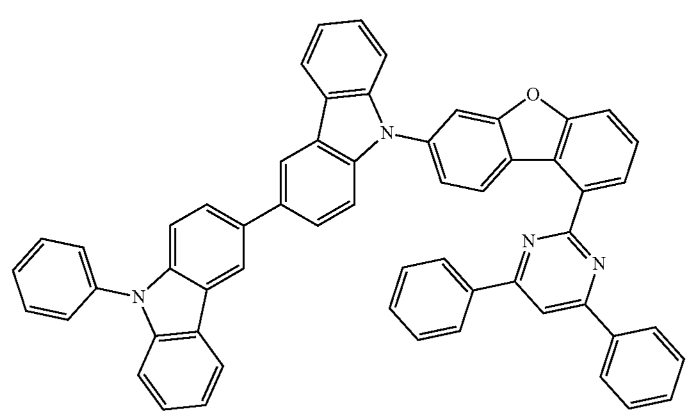 | 69% |

TABLE 8-continued
157 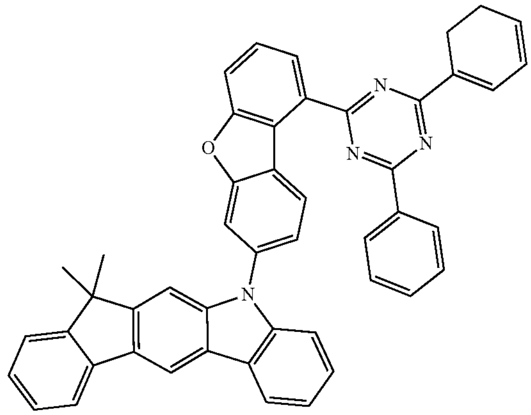 [SMILES: CC1(C)c2ccccc2-c2cc3c4ccccc4n(-c4ccc5c(c4)oc4cccc(-c6nc(C7=CC=CCC7)nc(-c7ccccc7)n6)c45)c3cc21] 58%
162 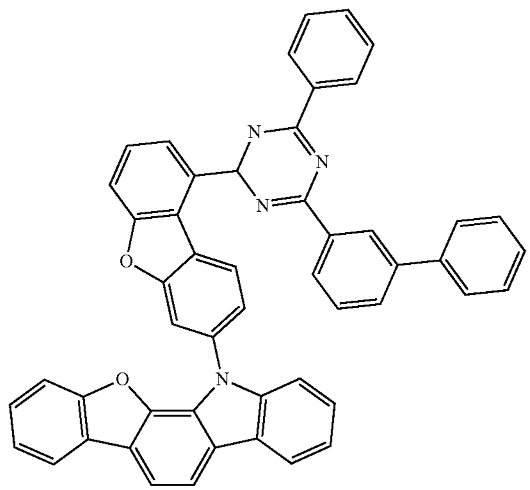 [SMILES: c1ccc(C2=NC(c3cccc(-c4ccccc4)c3)=NC(c3cccc4oc5cc(-n6c7ccccc7c7ccc8c9ccccc9oc8c76)ccc5c34)N2)cc1] 62%
166 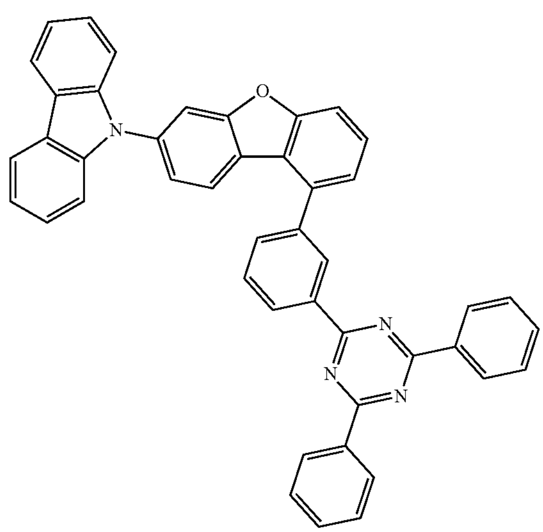 [SMILES: c1ccc(-c2nc(-c3ccccc3)nc(-c3cccc(-c4cccc5oc6cc(-n7c8ccccc8c8ccccc87)ccc6c45)c3)n2)cc1] 70%

TABLE 8-continued
| | | |
|---|---|---|
| 167 | 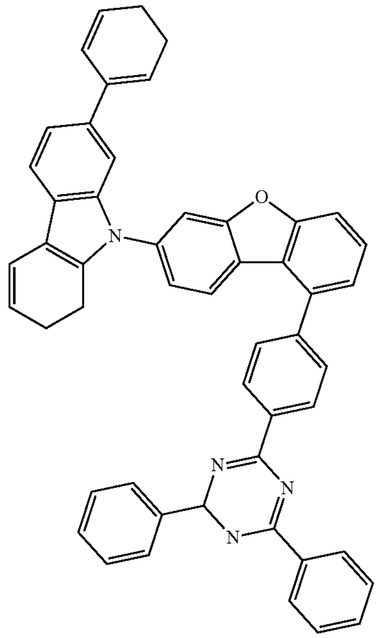 | 71% |
| 171 | 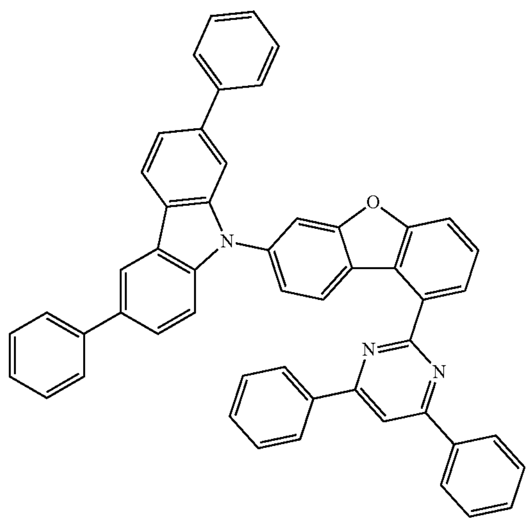 | 68% |
| 173 | 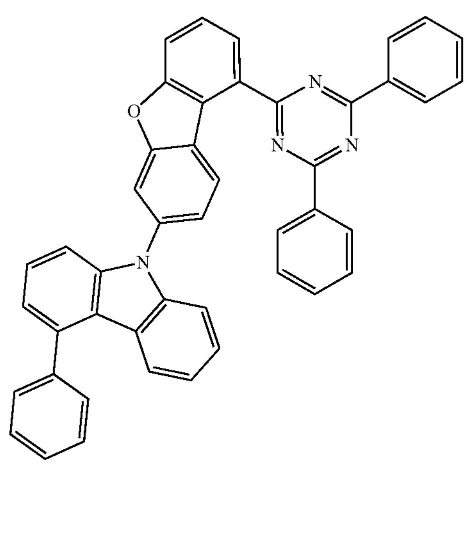 | 42% |

TABLE 8-continued
176 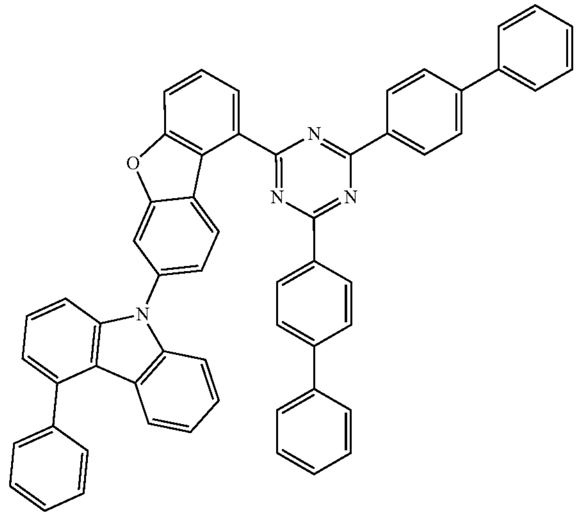 [SMILES: c1ccc(-c2ccc(-c3nc(-c4ccc(-c5ccccc5)cc4)nc(-c4cccc5oc6cc(-n7c8ccccc8c8c(-c9ccccc9)cccc87)ccc6c45)n3)cc2)cc1] 48%
179 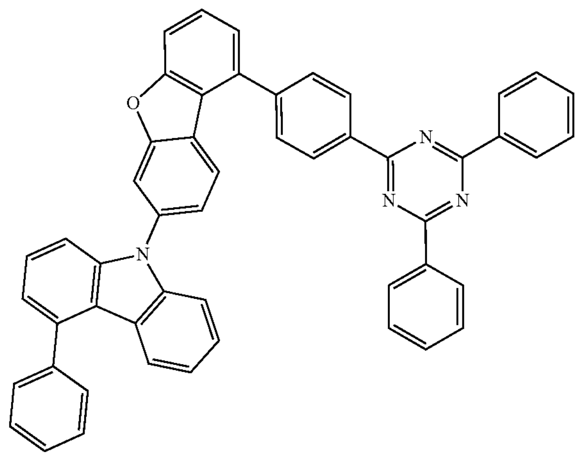 [SMILES: c1ccc(-c2nc(-c3ccccc3)nc(-c3ccc(-c4cccc5oc6cc(-n7c8ccccc8c8c(-c9ccccc9)cccc87)ccc6c45)cc3)n2)cc1] 53%
181 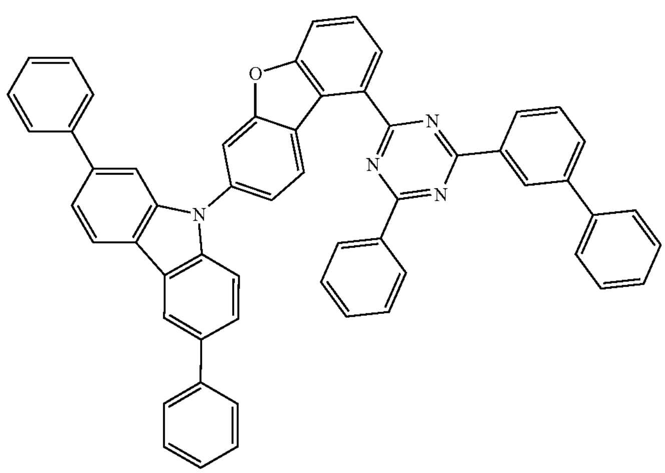 [SMILES: c1ccc(-c2cccc(-c3nc(-c4ccccc4)nc(-c4cccc5oc6cc(-n7c8ccc(-c9ccccc9)cc8c8ccc(-c9ccccc9)cc87)ccc6c45)n3)c2)cc1] 51%

TABLE 8-continued
| | | |
|---|---|---|
| 187 | 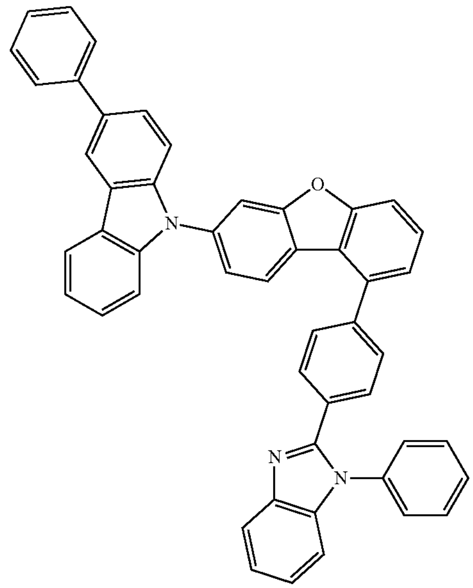 | 66% |
| 190 | 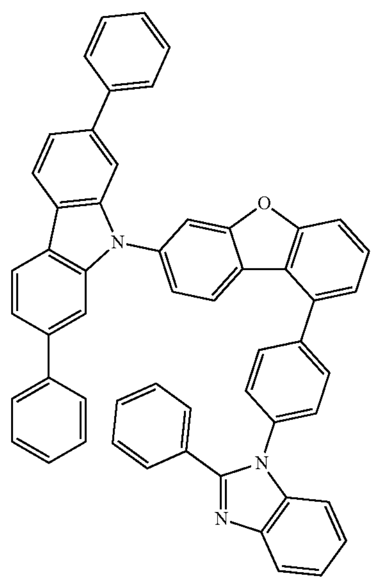 | 65% |
| 193 | 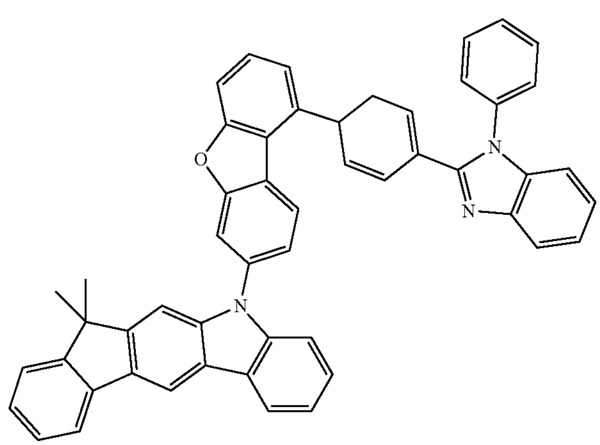 | 67% |

TABLE 8-continued
| | | |
|---|---|---|
| 195 | 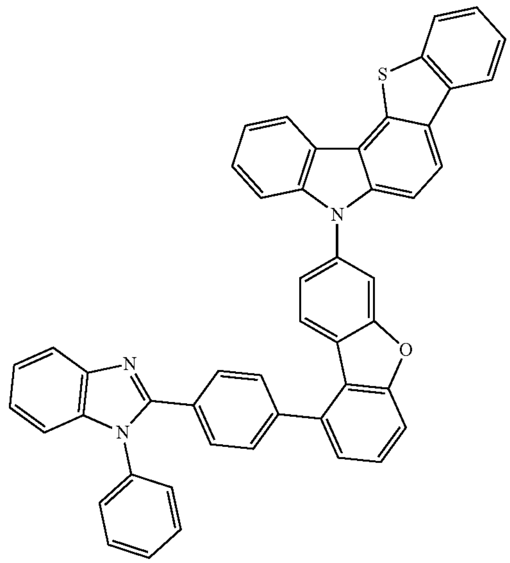 | 61% |
| 198 | 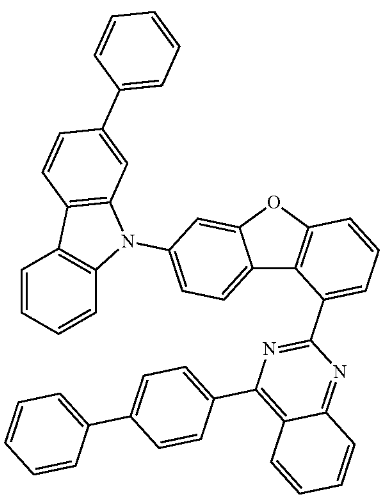 | 69% |
| 199 | 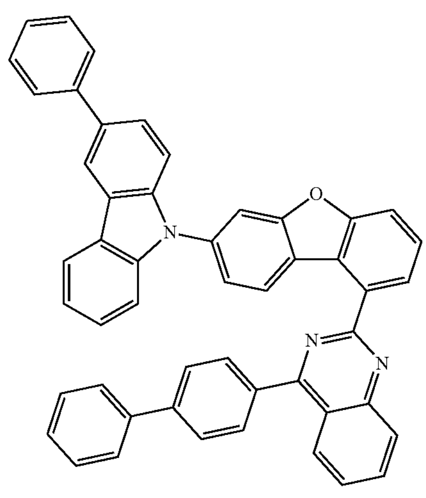 | 63% |

TABLE 8-continued
| | | |
|---|---|---|
| 203 | 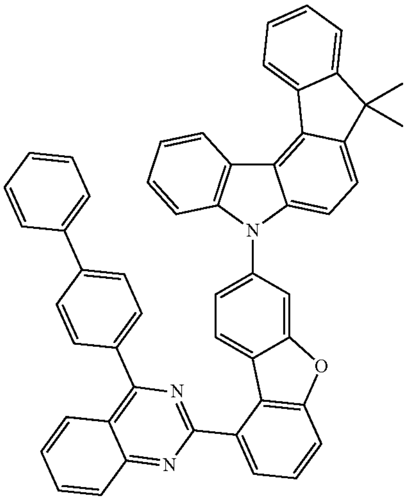 [SMILES: CC1(C)c2ccccc2-c2c1ccc1c2c2ccccc2n1-c1ccc2c(c1)oc1cccc(-c3nc(-c4ccc(-c5ccccc5)cc4)c4ccccc4n3)c12] | 64% |
| 205 | 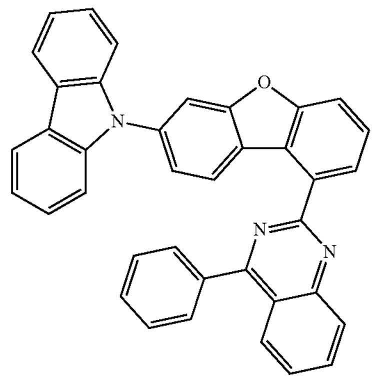 | 64% |
| 208 | 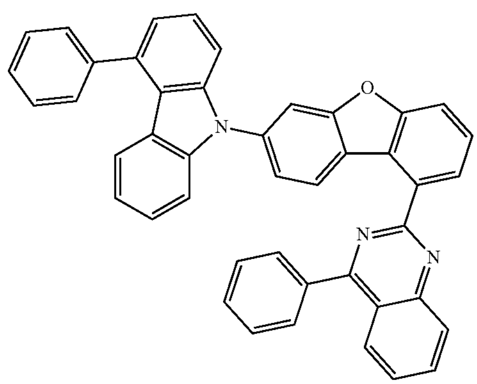 [SMILES: c1ccc(-c2nc(-c3cccc4oc5cc(-n6c7ccccc7c7c(-c8ccccc8)cccc76)ccc5c34)nc3ccccc23)cc1] | 70% |
| 211 | 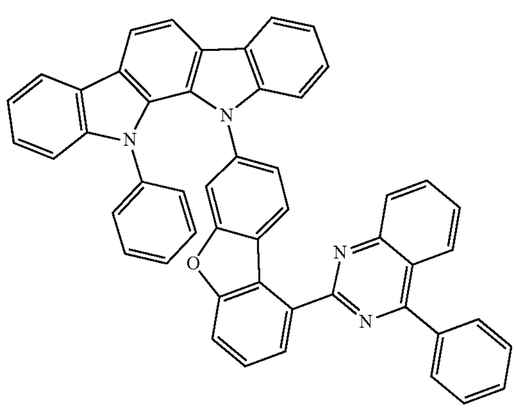 [SMILES: c1ccc(-c2nc(-c3cccc4oc5cc(-n6c7ccccc7c7ccc8c9ccccc9n(-c9ccccc9)c8c76)ccc5c34)nc3ccccc23)cc1] | 68% |

TABLE 8-continued
| | | |
|---|---|---|
| 214 | 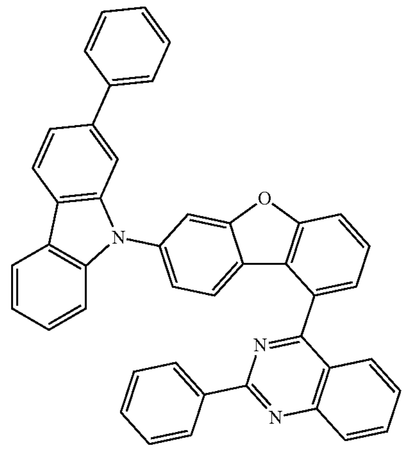 [SMILES: c1ccc(-c2ccc3c4ccccc4n(-c4ccc5c(c4)oc4cccc(-c6nc(-c7ccccc7)nc7ccccc67)c45)c3c2)cc1] | 60% |
| 218 | 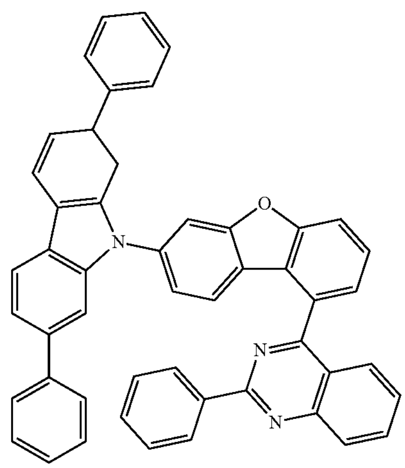 [SMILES: C1=CC(c2ccccc2)Cc2c1c1ccc(-c3ccccc3)cc1n2-c1ccc2c(c1)oc1cccc(-c3nc(-c4ccccc4)nc4ccccc34)c12] | 66% |
| 220 | 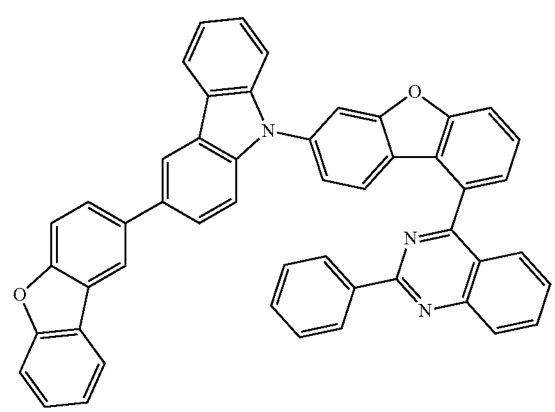 [SMILES: c1ccc(-c2nc(-c3cccc4oc5cc(-n6c7ccccc7c7cc(-c8ccc9oc%10ccccc%10c9c8)ccc76)ccc5c34)c3ccccc3n2)cc1] | 61% |

TABLE 8-continued
| | | |
|---|---|---|
| 223 | 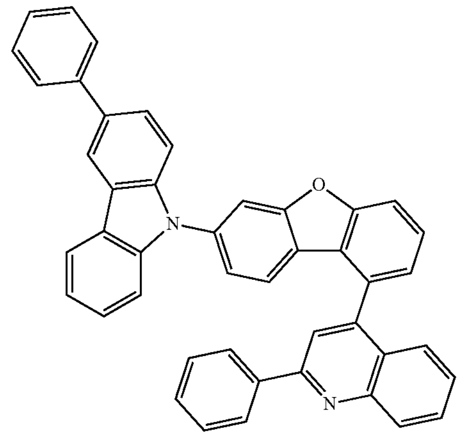 [SMILES: c1ccc(-c2ccc3c(c2)c2ccccc2n3-c2ccc3c(c2)oc2cccc(-c4cc(-c5ccccc5)nc5ccccc45)c23)cc1] | 51%% |
| 228 | 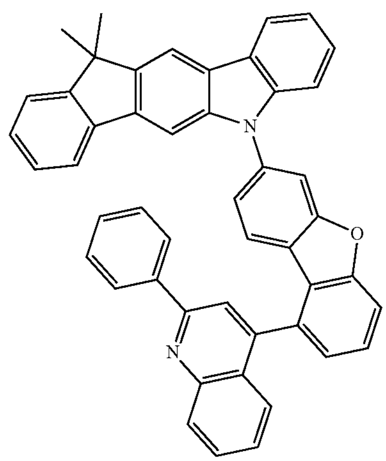 [SMILES: CC1(C)c2ccccc2-c2cc3c(cc21)c1ccccc1n3-c1ccc2c(c1)oc1cccc(-c3cc(-c4ccccc4)nc4ccccc34)c12] | 54% |
| 229 | 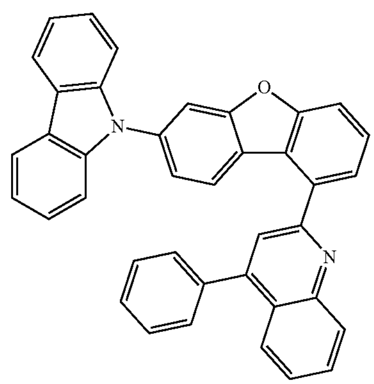 [SMILES: c1ccc(-c2cc(-c3cccc4oc5cc(-n6c7ccccc7c7ccccc76)ccc5c34)nc3ccccc23)cc1] | 49% |
| 238 | 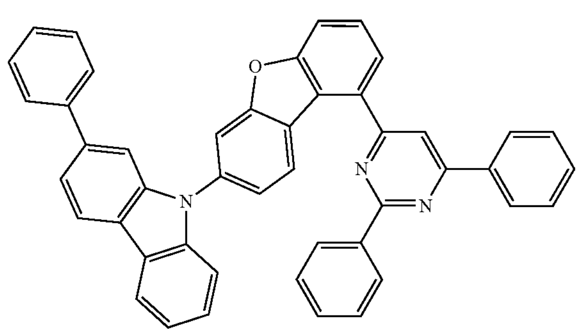 [SMILES: c1ccc(-c2ccc3c4ccccc4n(-c4ccc5c(c4)oc4cccc(-c6cc(-c7ccccc7)nc(-c7ccccc7)n6)c45)c3c2)cc1] | 54% |

TABLE 8-continued
| | | |
|---|---|---|
| 241 | 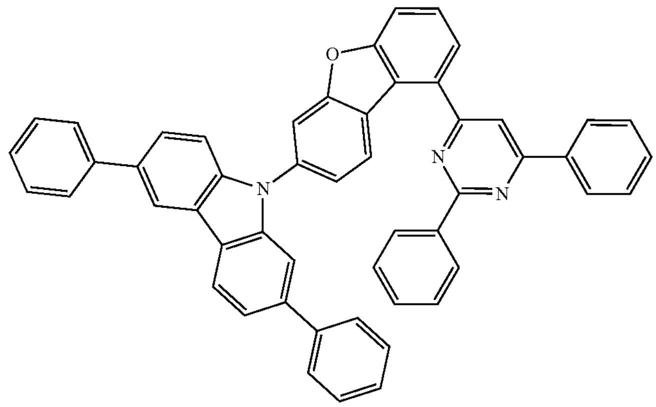 [SMILES: c1ccc(-c2ccc3c(c2)c2ccc(-c4ccccc4)cc2n3-c2ccc3c(c2)oc2cccc(-c4cc(-c5ccccc5)nc(-c5ccccc5)n4)c23)cc1] | 69% |
| 246 | 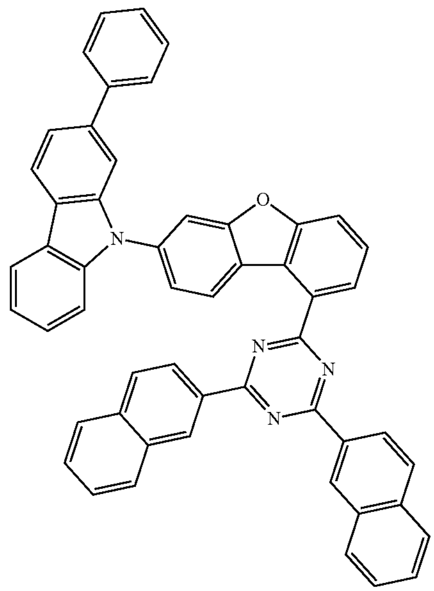 [SMILES: c1ccc(-c2ccc3c4ccccc4n(-c4ccc5c(c4)oc4cccc(-c6nc(-c7ccc8ccccc8c7)nc(-c7ccc8ccccc8c7)n6)c45)c3c2)cc1] | 60% |
| 247 | 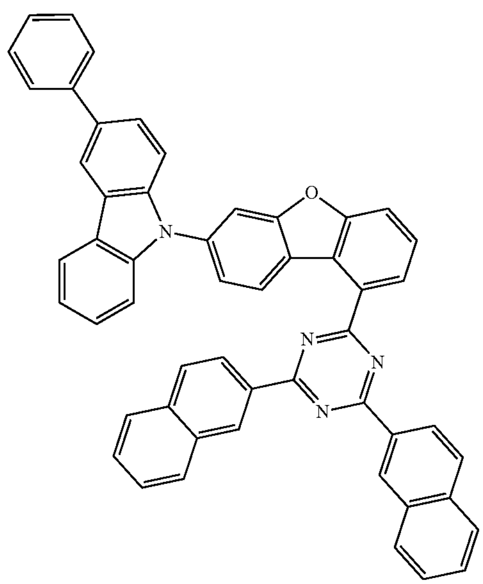 [SMILES: c1ccc(-c2ccc3c(c2)c2ccccc2n3-c2ccc3c(c2)oc2cccc(-c4nc(-c5ccc6ccccc6c5)nc(-c5ccc6ccccc6c5)n4)c23)cc1] | 62% |

TABLE 8-continued
| | | |
|---|---|---|
| 249 | 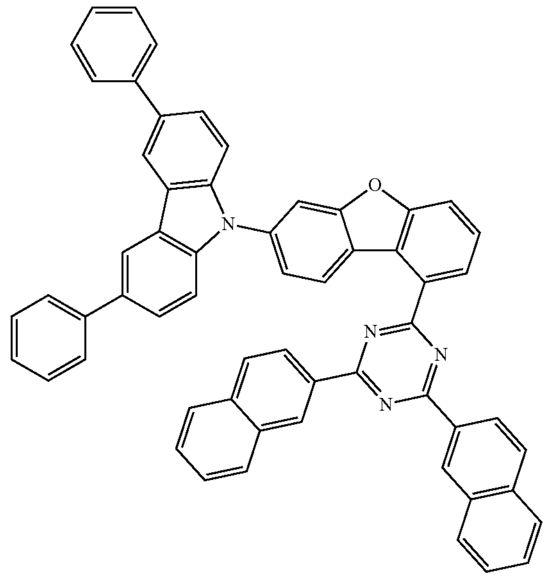 [SMILES: c1ccc(-c2ccc3c(c2)c2cc(-c4ccccc4)ccc2n3-c2ccc3c(c2)oc2cccc(-c4nc(-c5ccc6ccccc6c5)nc(-c5ccc6ccccc6c5)n4)c23)cc1] | 63% |
| 253 | 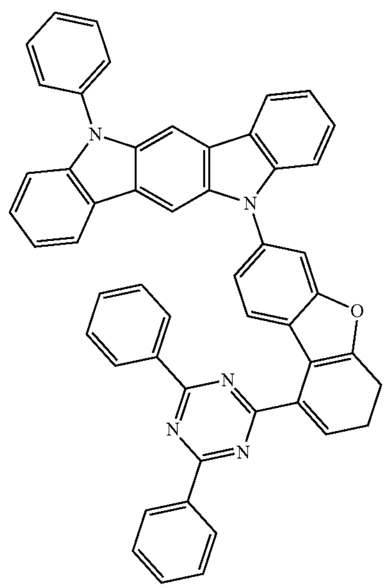 [SMILES: C1=C(c2nc(-c3ccccc3)nc(-c3ccccc3)n2)c2c(oc3cc(-n4c5ccccc5c5cc6c(cc54)c4ccccc4n6-c4ccccc4)ccc23)CC1] | 70% |
| 255 | 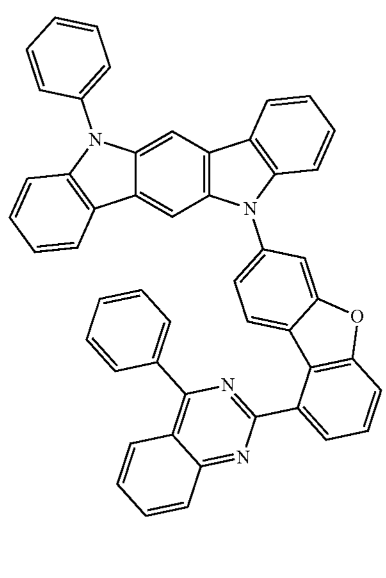 [SMILES: c1ccc(-c2nc(-c3cccc4oc5cc(-n6c7ccccc7c7cc8c(cc76)c6ccccc6n8-c6ccccc6)ccc5c34)nc3ccccc23)cc1] | 64% |

TABLE 8-continued
| | | |
|---|---|---|
| 263 | 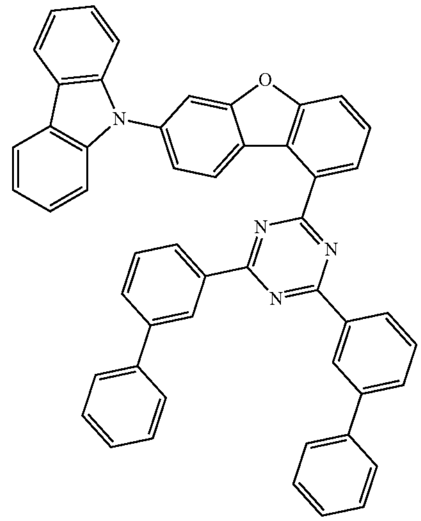 [SMILES: c1ccc(-c2cccc(-c3nc(-c4cccc(-c5ccccc5)c4)nc(-c4cccc5oc6cc(-n7c8ccccc8c8ccccc87)ccc6c45)n3)c2)cc1] | 68% |
| 264 | 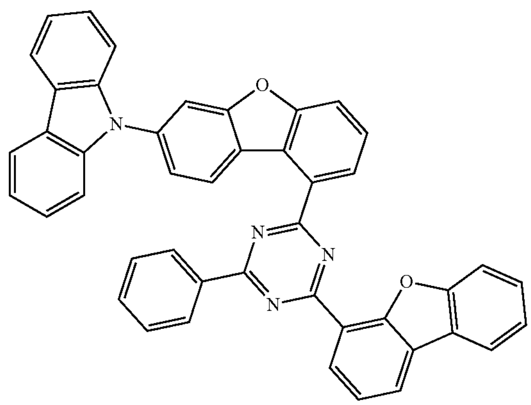 [SMILES: c1ccc(-c2nc(-c3cccc4c3oc3ccccc34)nc(-c3cccc4oc5cc(-n6c7ccccc7c7ccccc76)ccc5c34)n2)cc1] | 71% |
| 265 | 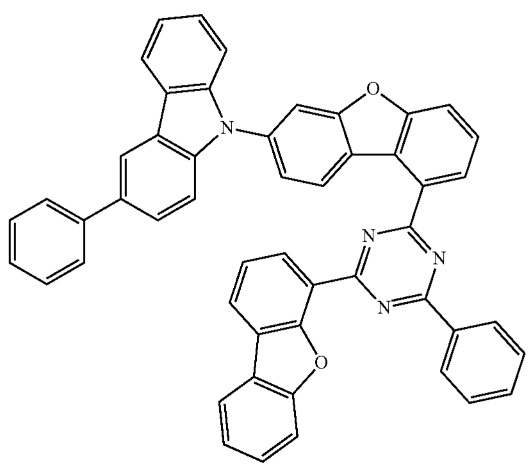 [SMILES: c1ccc(-c2ccc3c(c2)c2ccccc2n3-c2ccc3c(c2)oc2cccc(-c4nc(-c5ccccc5)nc(-c5cccc6c5oc5ccccc56)n4)c23)cc1] | 62% |

TABLE 8-continued
| | | |
|---|---|---|
| 271 | 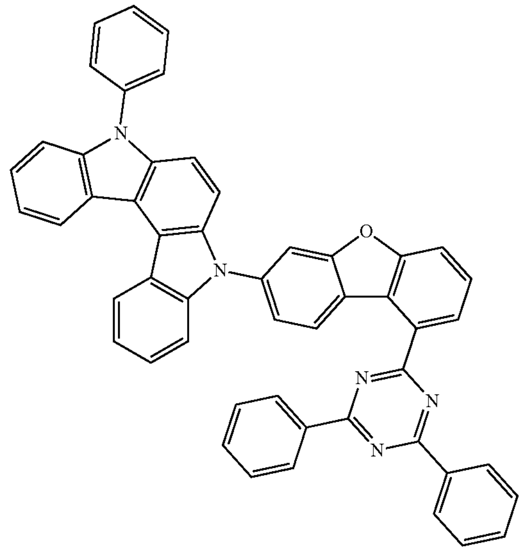 [SMILES: c1ccc(-c2nc(-c3ccccc3)nc(-c3cccc4oc5cc(-n6c7ccccc7c7c8c9ccccc9n(-c9ccccc9)c8ccc76)ccc5c34)n2)cc1] | 60% |
| 272 | 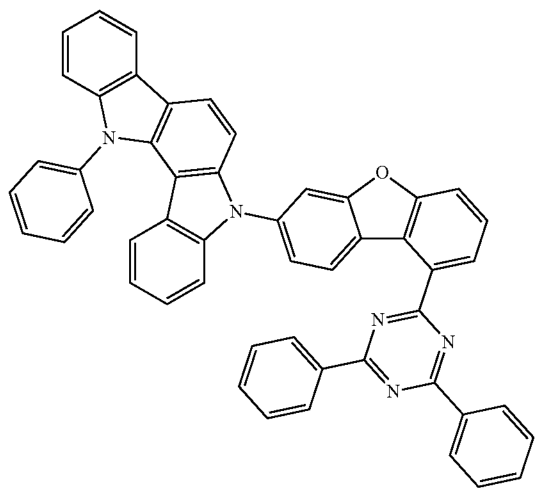 [SMILES: c1ccc(-c2nc(-c3ccccc3)nc(-c3cccc4oc5cc(-n6c7ccccc7c7c6ccc6c8ccccc8n(-c8ccccc8)c67)ccc5c34)n2)cc1] | 67% |
| 282 | 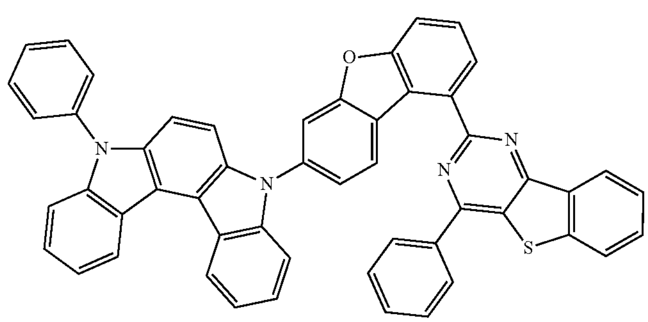 [SMILES: c1ccc(-c2nc(-c3cccc4oc5cc(-n6c7ccccc7c7c8c9ccccc9n(-c9ccccc9)c8ccc76)ccc5c34)nc3c2sc2ccccc23)cc1] | 62% |

TABLE 8-continued

| | | |
|---|---|---|
| 285 | 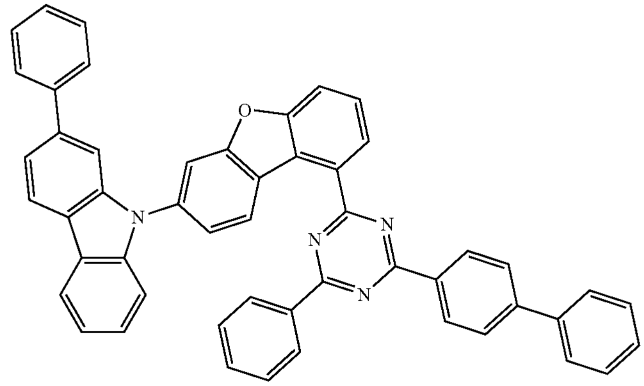 [SMILES: c1ccc(-c2ccc(-c3nc(-c4ccccc4)nc(-c4cccc5oc6cc(-n7c8ccccc8c8ccc(-c9ccccc9)cc87)ccc6c45)n3)cc2)cc1] | 68% |

Compounds of Group 2 other than the compounds described in Tables 7 and 8 were also prepared in the same manner as in the preparation examples described above.

Synthesis identification data of the compounds prepared above are as follows. Specifically, FD-Mass data of the compounds represented by Chemical Formula 24 according to one embodiment of the present application are as shown in the following Table 9, FD-Mass data of the compounds of Group 1 represented by Chemical Formula 1 according to one embodiment of the present application are as shown in the following Table 10, and FD-Mass data of the compounds of Group 2 represented by Chemical Formula 1 according to one embodiment of the present application are as shown in the following Table 11.

TABLE 9

| Compound | FD-Mass | Compound | FD-MASS |
|---|---|---|---|
| 1 | m/z = 742.94 (C54H34N2S = 742.24) | 2 | m/z = 666.84 (C48H30N2S = 666.21) |
| 3 | m/z = 742.94 (C54H34N2S = 742.24) | 4 | m/z = 742.94 (C54H34N2S = 742.24) |
| 5 | m/z = 716.90 (C52H32N2S = 716.23) | 6 | m/z = 716.90 (C52H32N2S = 716.23) |
| 7 | m/z = 783.00 (C58H38N2S = 782.28) | 8 | m/z = 783.00 (C58H38N2S = 782.28) |
| 9 | m/z = 772.98 (C54H32N2S = 772.20) | 10 | m/z = 772.98 (C54H32N2S = 772.20) |
| 11 | m/z = 756.92 (C54H32N2OS = 756.22) | 12 | m/z = 756.92 (C54H32N2OS = 756.22) |
| 13 | m/z = 666.84 (C48H30N2S = 666.21) | 14 | m/z = 742.94 (C54H34N2S = 742.24) |
| 15 | m/z = 742.94 (C54H34N2S = 742.24) | 16 | m/z = 716.90 (C52H32N2S = 716.23) |
| 17 | m/z = 716.90 (C52H32N2S = 716.23) | 18 | m/z = 783.00 (C58H38N2S = 782.28) |
| 19 | m/z = 783.00 (C58H38N2S = 782.28) | 20 | m/z = 772.98 (C54H32N2S = 772.20) |
| 21 | m/z = 756.92 (C54H32N2OS = 756.22) | 22 | m/z = 756.92 (C54H32N2OS = 756.22) |
| 23 | m/z = 772.98 (C54H32N2S = 772.20) | 24 | m/z = 666.84 (C48H30N2S = 666.21) |
| 25 | m/z = 742.94 (C54H34N2S = 742.24) | 26 | m/z = 742.94 (C54H34N2S = 742.24) |
| 27 | m/z = 783.00 (C58H38N2S = 782.28) | 28 | m/z = 772.98 (C54H32N2S = 772.20) |
| 29 | m/z = 756.92 (C54H32N2OS = 756.22 | 30 | m/z = 772.98 (C54H32N2S = 772.20) |
| 31 | m/z = 783.00 (C58H38N2S = 782.28) | 32 | m/z = 756.92 (C54H32N2OS = 756.22) |
| 33 | m/z = 666.84 (C48H30N2S = 666.21) | 34 | m/z = 742.94 (C54H34N2S = 742.24) |
| 35 | m/z = 742.94 (C54H34N2S = 742.24) | 36 | m/z = 772.98 (C54H32N2S = 772.20) |
| 37 | m/z = 756.92 (C54H32N2OS = 756.22 | 38 | m/z = 772.98 (C54H32N2S = 772.20) |
| 39 | m/z = 783.00 (C58H38N2S = 782.28) | 40 | m/z = 756.92 (C54H32N2OS = 756.22 |
| 41 | m/z = 666.84 (C48H30N2S = 666.21) | 42 | m/z = 742.94 (C54H34N2S = 742.24) |
| 43 | m/z = 742.94 (C54H34N2S = 742.24) | 44 | m/z = 772.98 (C54H32N2S = 772.20) |
| 45 | m/z = 756.92 (C54H32N2OS = 756.22 | 46 | m/z = 772.98 (C54H32N2S = 772.20) |
| 47 | m/z = 783.00 (C58H38N2S = 782.28) | 48 | m/z = 756.92 (C54H32N2OS = 756.22 |
| 49 | m/z = 666.84 (C48H30N2S = 666.21) | 50 | m/z = 742.94 (C54H34N2S = 742.24) |
| 51 | m/z = 742.94 (C54H34N2S = 742.24) | 52 | m/z = 772.98 (C54H32N2S = 772.20) |
| 53 | m/z = 756.92 (C54H32N2OS = 756.22 | 54 | m/z = 772.98 (C54H32N2S = 772.20) |
| 55 | m/z = 783.00 (C58H38N2S = 782.28) | 56 | m/z = 756.92 (C54H32N2OS = 756.22 |
| 57 | m/z = 666.84 (C48H30N2S = 666.21) | 58 | m/z = 742.94 (C54H34N2S = 742.24) |
| 59 | m/z = 742.94 (C54H34N2S = 742.24) | 60 | m/z = 772.98 (C54H32N2S = 772.20) |
| 61 | m/z = 756.92 (C54H32N2OS = 756.22 | 62 | m/z = 772.98 (C54H32N2S = 772.20) |
| 63 | m/z = 783.00 (C58H38N2S = 782.28) | 64 | m/z = 756.92 (C54H32N2OS = 756.22 |
| 65 | m/z = 666.84 (C48H30N2S = 666.21) | 66 | m/z = 742.94 (C54H34N2S = 742.24) |
| 67 | m/z = 742.94 (C54H34N2S = 742.24) | 68 | m/z = 772.98 (C54H32N2S = 772.20) |
| 69 | m/z = 756.92 (C54H32N2OS = 756.22 | 70 | m/z = 772.98 (C54H32N2S = 772.20) |
| 71 | m/z = 783.00 (C58H38N2S = 782.28) | 72 | m/z = 756.92 (C54H32N2OS = 756.22 |
| 73 | m/z = 666.84 (C48H30N2S = 666.21) | 74 | m/z = 742.94 (C54H34N2S = 742.24) |
| 75 | m/z = 742.94 (C54H34N2S = 742.24) | 76 | m/z = 772.98 (C54H32N2S = 772.20) |
| 77 | m/z = 756.92 (C54H32N2OS = 756.22 | 78 | m/z = 772.98 (C54H32N2S = 772.20) |
| 79 | m/z = 783.00 (C58H38N2S = 782.28) | 80 | m/z = 756.92 (C54H32N2OS = 756.22 |
| 81 | m/z = 666.84 (C48H30N2S = 666.21) | 82 | m/z = 742.94 (C54H34N2S = 742.24) |
| 83 | m/z = 742.94 (C54H34N2S = 742.24) | 84 | m/z = 772.98 (C54H32N2S = 772.20) |
| 85 | m/z = 756.92 (C54H32N2OS = 756.22 | 86 | m/z = 772.98 (C54H32N2S = 772.20) |
| 87 | m/z = 783.00 (C58H38N2S = 782.28) | 88 | m/z = 756.92 (C54H32N2OS = 756.22 |
| 89 | m/z = 666.84 (C48H30N2S = 666.21) | 90 | m/z = 742.94 (C54H34N2S = 742.24) |

TABLE 9-continued

| Compound | FD-Mass | Compound | FD-MASS |
|---|---|---|---|
| 91 | m/z = 742.94 (C54H34N2S = 742.24) | 92 | m/z = 772.98 (C54H32N2S = 772.20) |
| 93 | m/z = 756.92 (C54H32N2OS = 756.22 | 94 | m/z = 772.98 (C54H32N2S = 772.20) |
| 95 | m/z = 783.00 (C58H38N2S = 782.28) | 96 | m/z = 756.92 (C54H32N2OS = 756.22 |
| 97 | m/z = 666.84 (C48H30N2S = 666.21) | 98 | m/z = 742.94 (C54H34N2S = 742.24) |
| 99 | m/z = 742.94 (C54H34N2S = 742.24) | 100 | m/z = 772.98 (C54H32N2S = 772.20) |
| 101 | m/z = 756.92 (C54H32N2OS = 756.22 | 102 | m/z = 772.98 (C54H32N2S = 772.20) |
| 103 | m/z = 783.00 (C58H38N2S = 782.28) | 104 | m/z = 756.92 (C54H32N2OS = 756.22 |

TABLE 10

| Compound | FD-Mass | Compound | FD-Mass |
|---|---|---|---|
| 1 | m/z = 564.63 (C39H24N4O = 564.20) | 2 | m/z = 640.73 (C45H28N4O = 640.23) |
| 3 | m/z = 640.73 (C45H28N4O = 640.23) | 4 | m/z = 716.83 (C51H32N4O = 717.26) |
| 5 | m/z = 716.83 (C51H32N4O = 717.26) | 6 | m/z = 729.82 (C51H31N5O = 729.25) |
| 7 | m/z = 729.82 (C51H31N5O = 729.25) | 8 | m/z = 805.92 (C57H35N5O = 805.28) |
| 9 | m/z = 730.81 (C51H30N4O2 = 730.81) | 10 | m/z = 680.79 (C48H32N4O = 680.26) |
| 11 | m/z = 680.79 (C48H32N4O = 680.26) | 12 | m/z = 680.79 (C48H32N4O = 680.26) |
| 13 | m/z = 670.78 (C45H26N4OS = 670.18) | 14 | m/z = 654.71 (C45H26N4O2 = 654.21) |
| 15 | m/z = 654.71 (C45H26N4O2 = 654.21) | 16 | m/z = 670.78 (C45H26N4OS = 670.18) |
| 17 | m/z = 640.73 (C45H2N4O = 640.23) | 18 | m/z = 716.83 (C51H32N4O = 716.26) |
| 19 | m/z = 716.83 (C51H32N4O = 716.26) | 20 | m/z = 792.92 (C57H36N4O = 792.29) |
| 21 | m/z = 792.92 (C57H36N4O = 792.29) | 22 | m/z = 640.73 (C45H2N4O = 640.23) |
| 23 | m/z = 792.92 (C57H36N4O = 792.29) | 24 | m/z = 792.92 (C57H36N4O = 792.29) |
| 25 | m/z = 792.92 (C57H36N4O = 792.29) | 26 | m/z = 728.84 (C52H32N4O = 728.26) |
| 27 | m/z = 728.84 (C52H32N4O = 728.26) | 28 | m/z = 804.93 (C58H36N4O = 804.29) |
| 29 | m/z = 746.21 (C51H30N4OS = 746.21) | 30 | m/z = 756.89 (C54H36N4O = 756.29) |
| 31 | m/z = 756.89 (C54H36N4O = 756.29) | 32 | m/z = 679.81 (C49H33N3O = 679.26) |
| 33 | m/z = 746.88 (C51H30N4OS = 746.21) | 34 | m/z = 730.81 (C51H30N4O2 = 730.24 |
| 35 | m/z = 730.81 (C51H30N4O2 = 730.24 | 36 | m/z = 669.79 (C46H27N3OS = 669.19) |
| 37 | m/z = 640.73 (C45H28N4O = 640.23) | 38 | m/z = 640.73 (C45H28N4O = 640.23) |
| 39 | m/z = 716.83 (C51H32N4O = 717.26) | 40 | m/z = 716.83 (C51H32N4O = 717.26) |
| 41 | m/z = 716.83 (C51H43N4O = 716.26) | 42 | m/z = 716.83 (C51H32N4O = 717.26) |
| 43 | m/z = 715.84 (C52H33N3O = 715.26) | 44 | m/z = 715.84 (C52H33N3O = 715.26) |
| 45 | m/z = 640.73 (C45H28N4O = 640.23 | 46 | m/z = 716.83 (C51H32N4O = 716.26) |
| 47 | m/z = 716.83 (C51H32N4O = 716.26) | 48 | m/z = 792.92 (C57H36N4O = 792.29) |
| 49 | m/z = 756.89 (C54H36N4O = 756.29) | 50 | m/z = 716.83 (C51H32N4O = 716.26) |
| 51 | m/z = 716.83 (C51H32N4O = 716.26) | 52 | m/z = 716.83 (C51H32N4O = 716.26) |
| 53 | m/z = 792.92 (C57H36N4O = 792.29) | 54 | m/z = 792.92 (C57H36N4O = 792.29) |
| 55 | m/z = 601.69 (C43H27N3O = 601.69) | 56 | m/z = 601.69 (C43H27N3O = 601.69) |
| 57 | m/z = 677.79 (C49H31N3O = 677.25) | 58 | m/z = 677.79 (C49H31N3O = 677.25) |
| 59 | m/z = 677.79 (C49H31N3O = 677.25) | 60 | m/z = 677.79 (C49H31N3O = 677.25) |
| 61 | m/z = 753.89 (C55H35N3O = 753.28) | 62 | m/z = 753.89 (C55H35N3O = 753.28) |
| 63 | m/z = 753.89 (C55H35N3O = 753.28) | 64 | m/z = 753.89 (C55H35N3O = 753.28) |
| 65 | m/z = 717.85 (C52H35N3O = 717.28) | 66 | m/z = 717.85 (C52H35N3O = 717.28) |
| 67 | m/z = 707.84 (C49H29N3OS = 707.20) | 68 | m/z = 691.77 (C49H29N3O2 = 691.23) |
| 69 | m/z = 613.70 (C44H27N3O = 613.22) | 70 | m/z = 689.80 (C50H31N3O = 689.25) |
| 71 | m/z = 689.80 (C50H31N3O = 689.25) | 72 | m/z = 689.80 (C50H31N3O = 689.25) |
| 73 | m/z = 765.90 (C56H35N3O = 765.28) | 74 | m/z = 765.90 (C56H35N3O = 765.28) |
| 75 | m/z = 729.86 (C53H35N3O = 729.28) | 76 | m/z = 719.20 (C50H29N3OS = 719.20) |
| 77 | m/z = 537.61 (C38H23N3O = 537.18) | 78 | m/z = 613.70 (C44H27N3O = 613.22) |
| 79 | m/z = 613.70 (C44H27N3O = 613.22) | 80 | m/z = 613.70 (C44H27N3O = 613.22) |
| 81 | m/z = 689.80 (C50H31N3O = 689.25) | 82 | m/z = 689.80 (C50H31N3O = 689.25) |
| 83 | m/z = 702.80 (C50H30N4O = 702.24) | 84 | m/z = 702.80 (C50H30N4O = 702.24) |
| 85 | m/z = 537.61 (C38H23N3O = 537.18) | 86 | m/z = 613.70 (C44H27N3O = 613.22) |
| 87 | m/z = 613.70 (C44H27N3O = 613.22) | 88 | m/z = 613.70 (C44H27N3O = 613.22) |
| 89 | m/z = 689.80 (C50H31N3O = 689.25) | 90 | m/z = 689.80 (C50H31N3O = 689.25) |
| 91 | m/z = 778.90 (C56H34N4O = 78.27) | 92 | m/z = 703.78 (C50H29N3O2 = 703.23) |
| 93 | m/z = 536.62 (C39H24N2O = 536.19) | 94 | m/z = 612.72 (C45H28N2O = 612.22) |
| 95 | m/z = 612.72 (C45H28N2O = 612.22) | 96 | m/z = 612.72 (C45H28N2O = 612.22) |
| 97 | m/z = 688.81 (C51H32N2O = 688.25) | 98 | m/z = 688.81 (C51H32N2O = 688.25) |
| 99 | m/z = 652.78 (C48H32N2O = 652.25) | 100 | m/z = 652.78 (C48H32N2O = 652.25) |
| 101 | m/z = 536.62 (C39H24N2O = 536.19) | 102 | m/z = 612.72 (C45H28N2O = 612.22) |
| 103 | m/z = 612.72 (C45H28N2O = 612.22) | 104 | m/z = 612.72 (C45H28N2O = 612.22) |
| 105 | m/z = 688.81 (C51H32N2O = 688.25) | 106 | m/z = 688.81 (C51H32N2O = 688.25) |
| 107 | m/z = 642.77 (C45H26N2OS = 642.18) | 108 | m/z = 626.70 (C45H27N2O2 = 626.20) |
| 109 | m/z = 587.67 (C42H25N3O = 587.20) | 110 | m/z = 663.76 (C48H29N3O = 663.23) |
| 111 | m/z = 663.76 (C48H29N3O = 663.23) | 112 | m/z = 663.76 (C48H29N3O = 663.23) |
| 113 | m/z = 739.86 (C54H33N3O = 739.26) | 114 | m/z = 739.86 (C54H33N3O = 739.26) |
| 115 | m/z = 677.75 (C48H27N3O2 = 677.21) | 116 | m/z = 693.81 (C48H27NOS = 693.19) |
| 117 | m/z = 563.65 (C40H25N3O = 563.20) | 118 | m/z = 639.73 (C46H29N3O = 639.23) |
| 119 | m/z = 639.73 (C46H29N3O = 639.23) | 120 | m/z = 715.84 (C52H33N3O = 715.26) |
| 121 | m/z = 715.84 (C52H33N3O = 715.26) | 122 | m/z = 715.84 (C52H33N3O = 715.26) |
| 123 | m/z = 639.74 (C46H29N3O = 639.23) | 124 | m/z = 715.84 (C52H33N3O = 715.26) |
| 125 | m/z = 664.75 (C47H28N4O = 664.23) | 126 | m/z = 740.85 (C53H32N4O = 740.26) |

TABLE 10-continued

| Compound | FD-Mass | Compound | FD-Mass |
|---|---|---|---|
| 127 | m/z = 740.85 (C53H32N4O = 740.26) | 128 | m/z = 740.85 (C53H32N4O = 740.26) |
| 129 | m/z = 816.94 (C59H36N4O = 816.29) | 130 | m/z = 816.94 (C59H36N4O = 816.29) |
| 131 | m/z = 829.94 (C59H35N5O = 829.28) | 132 | m/z = 829.94 (C59H35N5O = 829.28) |
| 133 | m/z = 729.82 (C51H31N5O = 729.25) | 134 | m/z = 805.92 (C57H35N5O = 805.28) |
| 135 | m/z = 702.80 (C50H30N4O = 702.24) | 136 | m/z = 766.27 (C55H34N4O = 766.27) |
| 137 | m/z = 564.63 (C39H24N4O = 564.20) | 138 | m/z = 640.73 (C45H28N4O = 640.23) |
| 139 | m/z = 640.73 (C45H28N4O = 640.23) | 140 | m/z = 716.83 (C51H32N4O = 717.26) |
| 141 | m/z = 716.83 (C51H32N4O = 717.26) | 142 | m/z = 729.82 (C51H31N5O = 729.25) |
| 143 | m/z = 729.82 (C51H31N5O = 729.25) | 144 | m/z = 805.92 (C57H35N5O = 805.28) |
| 145 | m/z = 730.81 (C51H30N4O2 = 730.81) | 146 | m/z = 680.79 (C48H32N4O = 680.26) |
| 147 | m/z = 680.79 (C48H32N4O = 680.26) | 148 | m/z = 680.79 (C48H32N4O = 680.26) |
| 149 | m/z = 670.78 (C45H26N4OS = 670.18) | 150 | m/z = 654.71 (C45H26N4O2 = 654.21) |
| 151 | m/z = 654.71 (C45H26N4O2 = 654.21) | 152 | m/z = 670.78 (C45H26N4OS = 670.18) |
| 153 | m/z = 640.73 (C45H2N4O = 640.23) | 154 | m/z = 716.83 (C51H32N4O = 716.26) |
| 155 | m/z = 716.83 (C51H32N4O = 716.26) | 156 | m/z = 792.92 (C57H36N4O = 792.29) |
| 157 | m/z = 792.92 (C57H36N4O = 792.29) | 158 | m/z = 640.73 (C45H2N4O = 640.23) |
| 159 | m/z = 792.92 (C57H36N4O = 792.29) | 160 | m/z = 792.92 (C57H36N4O = 792.29) |
| 161 | m/z = 792.92 (C57H36N4O = 792.29) | 162 | m/z = 728.84 (C52H32N4O = 728.26) |
| 163 | m/z = 728.84 (C52H32N4O = 728.26) | 164 | m/z = 804.93 (C58H36N4O = 804.29) |
| 165 | m/z = 746.21 (C51H30N4OS = 746.21) | 166 | m/z = 756.89 (C54H36N4O = 756.29) |
| 167 | m/z = 756.89 (C54H36N4O = 756.29) | 168 | m/z = 679.81 (C49H33N3O = 679.26) |
| 169 | m/z = 746.88 (C51H3ON4OS = 746.21) | 170 | m/z = 730.81 (C51H30N4O2 = 730.24 |
| 171 | m/z = 730.81 (C51H30N4O2 = 730.24 | 172 | m/z = 669.79 (C46H27N3OS = 669.19) |
| 173 | m/z = 640.73 (C45H28N4O = 640.23) | 174 | m/z = 640.73 (C45H28N4O = 640.23) |
| 175 | m/z = 716.83 (C51H32N4O = 717.26) | 176 | m/z = 716.83 (C51H32N4O = 717.26) |
| 177 | m/z = 716.83 (C51H43N4O = 716.26) | 178 | m/z = 716.83 (C51H32N4O = 717.26) |
| 179 | m/z = 715.84 (C52H33N3O = 715.26) | 180 | m/z = 715.84 (C52H33N3O = 715.26) |
| 181 | m/z = 664.75 (C47H28N4O = 664.23) | 182 | m/z = 740.85 (C53H32N4O = 740.26) |
| 183 | m/z = 740.85 (C53H32N4O = 740.26) | 184 | m/z = 740.85 (C53H32N4O = 740.26) |
| 185 | m/z = 816.94 (C59H36N4O = 816.29) | 186 | m/z = 816.94 (C59H36N4O = 816.29) |
| 187 | m/z = 829.94 (C59H35N5O = 829.28) | 188 | m/z = 829.94 (C59H35N5O = 829.28) |
| 189 | m/z = 564.63 (C39H24N4O = 564.20) | 190 | m/z = 640.73 (C45H28N4O = 640.23) |
| 191 | m/z = 640.73 (C45H28N4O = 640.23) | 192 | m/z = 716.83 (C51H32N4O = 717.26) |
| 193 | m/z = 716.83 (C51H32N4O = 717.26) | 194 | m/z = 729.82 (C51H31N5O = 729.25) |
| 195 | m/z = 729.82 (C51H31N5O = 729.25) | 196 | m/z = 805.92 (C57H35N5O = 805.28) |
| 197 | m/z = 730.81 (C51H30N4O2 = 730.81) | 198 | m/z = 680.79 (C48H32N4O = 680.26) |
| 199 | m/z = 680.79 (C48H32N4O = 680.26) | 200 | m/z = 680.79 (C48H32N4O = 680.26) |
| 201 | m/z = 670.78 (C45H26N4OS = 670.18) | 202 | m/z = 654.71 (C45H26N4O2 = 654.21) |
| 203 | m/z = 654.71 (C45H26N4O2 = 654.21) | 204 | m/z = 670.78 (C45H26N4OS = 670.18) |
| 205 | m/z = 640.73 (C45H2N4O = 640.23) | 206 | m/z = 716.83 (C51H32N4O = 716.26) |
| 207 | m/z = 716.83 (C51H32N4O = 716.26) | 208 | m/z = 792.92 (C57H36N4O = 792.29) |
| 209 | m/z = 792.92 (C57H36N4O = 792.29) | 210 | m/z = 640.73 (C45H2N4O = 640.23) |
| 211 | m/z = 792.92 (C57H36N4O = 792.29) | 212 | m/z = 792.92 (C57H36N4O = 792.29) |
| 213 | m/z = 792.92 (C57H36N4O = 792.29) | 214 | m/z = 728.84 (C52H32N4O = 728.26) |
| 215 | m/z = 728.84 (C52H32N4O = 728.26) | 216 | m/z = 804.93 (C58H36N4O = 804.29) |
| 217 | m/z = 746.21 (C51H3ON4OS = 746.21) | 218 | m/z = 756.89 (C54H36N4O = 756.29) |
| 219 | m/z = 756.89 (C54H36N4O = 756.29) | 220 | m/z = 679.81 (C49H33N3O = 679.26) |
| 221 | m/z = 746.88 (C51H30N4OS = 746.21) | 222 | m/z = 730.81 (C51H30N4O2 = 730.24 |
| 223 | m/z = 730.81 (C51H30N4O2 = 730.24 | 224 | m/z = 669.79 (C46H27N3OS = 669.19) |
| 225 | m/z = 640.73 (C45H28N4O = 640.23) | 226 | m/z = 640.73 (C45H28N4O = 640.23) |
| 227 | m/z = 716.83 (C51H32N4O = 717.26) | 228 | m/z = 716.83 (C51H32N4O = 717.26) |
| 229 | m/z = 716.83 (C51H43N4O = 716.26) | 230 | m/z = 716.83 (C51H32N4O = 717.26) |
| 231 | m/z = 715.84 (C52H33N3O = 715.26) | 232 | m/z = 715.84 (C52H33N3O = 715.26) |
| 233 | m/z = 664.75 (C47H28N4O = 664.23) | 234 | m/z = 740.85 (C53H32N4O = 740.26) |
| 235 | m/z = 740.85 (C53H32N4O = 740.26) | 236 | m/z = 740.85 (C53H32N4O = 740.26) |
| 237 | m/z = 816.94 (C59H36N4O = 816.29) | 238 | m/z = 816.94 (C59H36N4O = 816.29) |
| 239 | m/z = 829.94 (C59H35N5O = 829.28) | 240 | m/z = 829.94 (C59H35N5O = 829.28) |
| 241 | m/z = 564.63 (C39H24N4O = 564.20) | 242 | m/z = 640.73 (C45H28N4O = 640.23) |
| 243 | m/z = 640.73 (C45H28N4O = 640.23) | 244 | m/z = 716.83 (C51H32N4O = 717.26) |
| 245 | m/z = 716.83 (C51H32N4O = 717.26) | 246 | m/z = 729.82 (C51H31N5O = 729.25) |
| 247 | m/z = 729.82 (C51H31N5O = 729.25) | 248 | m/z = 805.92 (C57H35N5O = 805.28) |
| 249 | m/z = 730.81 (C51H30N4O2 = 730.81) | 250 | m/z = 680.79 (C48H32N4O = 680.26) |
| 251 | m/z = 680.79 (C48H32N4O = 680.26) | 252 | m/z = 680.79 (C48H32N4O = 680.26) |
| 253 | m/z = 670.78 (C45H26N4OS = 670.18) | 254 | m/z = 654.71 (C45H26N4O2 = 654.21) |
| 255 | m/z = 654.71 (C45H26N4O2 = 654.21) | 256 | m/z = 670.78 (C45H26N4OS = 670.18) |
| 257 | m/z = 640.73 (C45H2N4O = 640.23) | 258 | m/z = 716.83 (C51H32N4O = 716.26) |
| 259 | m/z = 716.83 (C51H32N4O = 716.26) | 260 | m/z = 792.92 (C57H36N4O = 792.29) |
| 261 | m/z = 792.92 (C57H36N4O = 792.29) | 262 | m/z = 640.73 (C45H2N4O = 640.23) |
| 263 | m/z = 792.92 (C57H36N4O = 792.29) | 264 | m/z = 792.92 (C57H36N4O = 792.29) |
| 265 | m/z = 792.92 (C57H36N4O = 792.29) | 266 | m/z = 728.84 (C52H32N4O = 728.26) |
| 267 | m/z = 728.84 (C52H32N4O = 728.26) | 268 | m/z = 804.93 (C58H36N4O = 804.29) |
| 269 | m/z = 746.21 (C51H3ON4OS = 746.21) | 270 | m/z = 756.89 (C54H36N4O = 756.29) |
| 271 | m/z = 756.89 (C54H36N4O = 756.29) | 272 | m/z = 679.81 (C49H33N3O = 679.26) |
| 273 | m/z = 746.88 (C51H30N4OS = 746.21) | 274 | m/z = 730.81 (C51H30N4O2 = 730.24 |
| 275 | m/z = 730.81 (C51H30N4O2 = 730.24 | 276 | m/z = 669.79 (C46H27N3OS = 669.19) |
| 277 | m/z = 640.73 (C45H28N4O = 640.23) | 278 | m/z = 640.73 (C45H28N4O = 640.23) |
| 279 | m/z = 716.83 (C51H32N4O = 717.26) | 280 | m/z = 716.83 (C51H32N4O = 717.26) |
| 281 | m/z = 716.83 (C51H43N4O = 716.26) | 282 | m/z = 716.83 (C51H32N4O = 717.26) |

TABLE 10-continued

| Compound | FD-Mass | Compound | FD-Mass |
|---|---|---|---|
| 283 | m/z = 715.84 (C52H33N3O = 715.26) | 284 | m/z = 715.84 (C52H33N3O = 715.26) |
| 285 | m/z = 664.75 (C47H28N4O = 664.23) | 286 | m/z = 740.85 (C53H32N4O = 740.26) |
| 287 | m/z = 740.85 (C53H32N4O = 740.26) | 288 | m/z = 740.85 (C53H32N4O = 740.26) |
| 289 | m/z = 816.94 (C59H36N4O = 816.29) | 290 | m/z = 816.94 (C59H36N4O = 816.29) |
| 291 | m/z = 829.94 (C59H35N5O = 829.28) | 292 | m/z = 829.94 (C59H35N5O = 829.28) |
| 293 | m/z = 716.83 (C51H32N4O = 716.26) | 294 | m/z = 654.71 (C45H26N4O2 = 654.21) |
| 295 | m/z = 730.81 (C51H30N4O2 = 730.24) | 296 | m/z = 654.71 (C45H26N4O2 = 654.21) |
| 297 | m/z = 730.81 (C51H30N4O2 = 730.24) | 298 | m/z = 730.81 (C51H30N4O2 = 730.24) |
| 299 | m/z = 716.83 (C51H32N4O = 716.26) | 300 | m/z = 654.71 (C45H26N4O2 = 654.21) |
| 301 | m/z = 730.81 (C51H30N4O2 = 730.24) | 302 | m/z = 730.81 (C51H30N4O2 = 730.24) |
| 303 | m/z = 746.88 (C51H30N4OS = 741.21) | 304 | m/z = 756.89 (C54H36N4O = 756.29) |
| 305 | m/z = 716.83 (C51H32N4O = 716.26) | 306 | m/z = 654.71 (C45H26N4O2 = 654.21) |
| 307 | m/z = 730.81 (C51H30N4O2 = 730.24) | 308 | m/z = 746.88 (C51H3ON4OS = 741.21) |
| 309 | m/z = 730.81 (C51H30N4O2 = 730.24) | 310 | m/z = 730.81 (C51H30N4O2 = 730.24) |
| 311 | m/z = 756.89 (C54H36N4O = 756.29) | 312 | m/z = 716.83 (C51H32N4O = 716.26) |
| 313 | m/z = 730.81 (C51H30N4O2 = 730.24) | 314 | m/z = 654.71 (C45H26N4O2 = 654.21) |
| 315 | m/z = 730.81 (C51H30N4O2 = 730.24) | 316 | m/z = 730.81 (C51H30N4O2 = 730.24) |

TABLE 11

| Compound | FD-Mass | Compound | FD-Mass |
|---|---|---|---|
| 1 | m/z = 564.63 (C39H24N4O = 564.20) | 2 | m/z = 640.73 (C45H28N4O = 640.23) |
| 3 | m/z = 640.73 (C45H28N4O = 640.23) | 4 | m/z = 716.83 (C51H32N4O = 717.26) |
| 5 | m/z = 716.83 (C51H32N4O = 717.26) | 6 | m/z = 729.82 (C51H31N5O = 729.25) |
| 7 | m/z = 729.82 (C51H31N5O = 729.25) | 8 | m/z = 805.92 (C57H35N5O = 805.28) |
| 9 | m/z = 730.81 (C51H30N4O2 = 730.81) | 10 | m/z = 680.79 (C48H32N4O = 680.26) |
| 11 | m/z = 680.79 (C48H32N4O = 680.26) | 12 | m/z = 680.79 (C48H32N4O = 680.26) |
| 13 | m/z = 670.78 (C45H26N4OS = 670.18) | 14 | m/z = 654.71 (C45H26N4O2 = 654.21) |
| 15 | m/z = 654.71 (C45H26N4O2 = 654.21) | 16 | m/z = 670.78 (C45H26N4OS = 670.18) |
| 17 | m/z = 640.73 (C45H2N4O = 640.23) | 18 | m/z = 716.83 (C51H32N4O = 716.26) |
| 19 | m/z = 716.83 (C51H32N4O = 716.26) | 20 | m/z = 792.92 (C57H36N4O = 792.29) |
| 21 | m/z = 792.92 (C57H36N4O = 792.29) | 22 | m/z = 640.73 (C45H2N4O = 640.23) |
| 23 | m/z = 792.92 (C57H36N4O = 792.29) | 24 | m/z = 792.92 (C57H36N4O = 792.29) |
| 25 | m/z = 792.92 (C57H36N4O = 792.29) | 26 | m/z = 728.84 (C52H32N4O = 728.26) |
| 27 | m/z = 728.84 (C52H32N4O = 728.26) | 28 | m/z = 804.93 (C58H36N4O = 804.29) |
| 29 | m/z = 746.21 (C51H30N4OS = 746.21) | 30 | m/z = 756.89 (C54H36N4O = 756.29) |
| 31 | m/z = 756.89 (C54H36N4O = 756.29) | 32 | m/z = 679.81 (C49H33N3O = 679.26) |
| 33 | m/z = 746.88 (C51H30N4OS = 746.21) | 34 | m/z = 730.81 (C51H30N4O2 = 730.24 |
| 35 | m/z = 730.81 (C51H30N4O2 = 730.24 | 36 | m/z = 669.79 (C46H27N3OS = 669.19) |
| 37 | m/z = 640.73 (C45H28N4O = 640.23) | 38 | m/z = 640.73 (C45H28N4O = 640.23) |
| 39 | m/z = 716.83 (C51H32N4O = 717.26) | 40 | m/z = 716.83 (C51H32N4O = 717.26) |
| 41 | m/z = 716.83 (C51H43N4O = 716.26) | 42 | m/z = 716.83 (C51H32N4O = 717.26) |
| 43 | m/z = 715.84 (C52H33N3O = 715.26) | 44 | m/z = 715.84 (C52H33N3O = 715.26) |
| 45 | m/z = 640.73 (C45H28N4O = 640.23 | 46 | m/z = 716.83 (C51H32N4O = 716.26) |
| 47 | m/z = 716.83 (C51H32N4O = 716.26) | 48 | m/z = 792.92 (C57H36N4O = 792.29) |
| 49 | m/z = 756.89 (C54H36N4O = 756.29) | 50 | m/z = 716.83 (C51H32N4O = 716.26) |
| 51 | m/z = 716.83 (C51H32N4O = 716.26) | 52 | m/z = 716.83 (C51H32N4O = 716.26) |
| 53 | m/z = 792.92 (C57H36N4O = 792.29) | 54 | m/z = 792.92 (C57H36N4O = 792.29) |
| 55 | m/z = 601.69 (C43H27N3O = 601.69) | 56 | m/z = 601.69 (C43H27N3O = 601.69) |
| 57 | m/z = 677.79 (C49H31N3O = 677.25) | 58 | m/z = 677.79 (C49H31N3O = 677.25) |
| 59 | m/z = 677.79 (C49H31N3O = 677.25) | 60 | m/z = 677.79 (C49H31N3O = 677.25) |
| 61 | m/z = 753.89 (C55H35N3O = 753.28) | 62 | m/z = 753.89 (C55H35N3O = 753.28) |
| 63 | m/z = 753.89 (C55H35N3O = 753.28) | 64 | m/z = 753.89 (C55H35N3O = 753.28) |
| 65 | m/z = 717.85 (C52H35N3O = 717.28) | 66 | m/z = 717.85 (C52H35N3O = 717.28) |
| 67 | m/z = 707.84 (C49H29N3OS = 707.20) | 68 | m/z = 691.77 (C49H29N3O2 = 691.23) |
| 69 | m/z = 613.70 (C44H27N3O = 613.22) | 70 | m/z = 689.80 (C50H31N3O = 689.25) |
| 71 | m/z = 689.80 (C50H31N3O = 689.25) | 72 | m/z = 689.80 (C50H31N3O = 689.25) |
| 73 | m/z = 765.90 (C56H35N3O = 765.28) | 74 | m/z = 765.90 (C56H35N3O = 765.28) |
| 75 | m/z = 729.86 (C53H35N3O = 729.28) | 76 | m/z = 719.20 (C50H29N3OS = 719.20) |
| 77 | m/z = 537.61 (C38H23N3O = 537.18) | 78 | m/z = 613.70 (C44H27N3O = 613.22) |
| 79 | m/z = 613.70 (C44H27N3O = 613.22) | 80 | m/z = 613.70 (C44H27N3O = 613.22) |
| 81 | m/z = 689.80 (C50H31N3O = 689.25) | 82 | m/z = 689.80 (C50H31N3O = 689.25) |
| 83 | m/z = 702.80 (C50H30N4O = 702.24) | 84 | m/z = 702.80 (C50H30N4O = 702.24) |
| 85 | m/z = 537.61 (C38H23N3O = 537.18) | 86 | m/z = 613.70 (C44H27N3O = 613.22) |
| 87 | m/z = 613.70 (C44H27N3O = 613.22) | 88 | m/z = 613.70 (C44H27N3O = 613.22) |
| 89 | m/z = 689.80 (C50H31N3O = 689.25) | 90 | m/z = 689.80 (C50H31N3O = 689.25) |
| 91 | m/z = 778.90 (C56H34N4O = 78.27) | 92 | m/z = 703.78 (C50H29N3O2 = 703.23) |
| 93 | m/z = 536.62 (C39H24N2O = 536.19) | 94 | m/z = 612.72 (C45H28N2O = 612.22) |
| 95 | m/z = 612.72 (C45H28N2O = 612.22) | 96 | m/z = 612.72 (C45H28N2O = 612.22) |
| 97 | m/z = 688.81 (C51H32N2O = 688.25) | 98 | m/z = 688.81 (C51H32N2O = 688.25) |
| 99 | m/z = 652.78 (C48H32N2O = 652.25) | 100 | m/z = 652.78 (C48H32N2O = 652.25) |
| 101 | m/z = 536.62 (C39H24N2O = 536.19) | 102 | m/z = 612.72 (C45H28N2O = 612.22) |
| 103 | m/z = 612.72 (C45H28N2O = 612.22) | 104 | m/z = 612.72 (C45H28N2O = 612.22) |
| 105 | m/z = 688.81 (C51H32N2O = 688.25) | 106 | m/z = 688.81 (C51H32N2O = 688.25) |

TABLE 11-continued

| Compound | FD-Mass | Compound | FD-Mass |
|---|---|---|---|
| 107 | m/z = 642.77 (C45H26N2OS = 642.18) | 108 | m/z = 626.70 (C45H27N2O2 = 626.20) |
| 109 | m/z = 563.65 (C40H25N3O = 563.20) | 110 | m/z = 639.73 (C46H29N3O = 639.23) |
| 111 | m/z = 639.73 (C46H29N3O = 639.23) | 112 | m/z = 715.84 (C52H33N3O = 715.26) |
| 113 | m/z = 715.84 (C52H33N3O = 715.26) | 114 | m/z = 715.84 (C52H33N3O = 715.26) |
| 115 | m/z = 639.74 (C46H29N3O = 639.23) | 116 | m/z = 715.84 (C52H33N3O = 715.26) |
| 117 | m/z = 664.75 (C47H28N4O = 664.23) | 118 | m/z = 740.85 (C53H32N4O = 740.26) |
| 119 | m/z = 740.85 (C53H32N4O = 740.26) | 120 | m/z = 740.85 (C53H32N4O = 740.26) |
| 121 | m/z = 816.94 (C59H36N4O = 816.29) | 122 | m/z = 816.94 (C59H36N4O = 816.29) |
| 123 | m/z = 829.94 (C59H35N5O = 829.28) | 124 | m/z = 829.94 (C59H35N5O = 829.28) |
| 125 | m/z = 729.82 (C51H31N5O = 729.25) | 126 | m/z = 805.92 (C57H35N5O = 805.28) |
| 127 | m/z = 702.80 (C50H30N4O = 702.24) | 128 | m/z = 766.27 (C55H34N4O = 766.27) |
| 129 | m/z = 564.63 (C39H24N4O = 564.20) | 130 | m/z = 640.73 (C45H28N4O = 640.23) |
| 131 | m/z = 640.73 (C45H28N4O = 640.23) | 132 | m/z = 716.83 (C51H32N4O = 717.26) |
| 133 | m/z = 716.83 (C51H32N4O = 717.26) | 134 | m/z = 729.82 (C51H31N5O = 729.25) |
| 135 | m/z = 729.82 (C51H31N5O = 729.25) | 136 | m/z = 805.92 (C57H35N5O = 805.28) |
| 137 | m/z = 730.81 (C51H30N4O2 = 730.81) | 138 | m/z = 680.79 (C48H32N4O = 680.26) |
| 139 | m/z = 680.79 (C48H32N4O = 680.26) | 140 | m/z = 680.79 (C48H32N4O = 680.26) |
| 141 | m/z = 670.78 (C45H26N4OS = 670.18) | 142 | m/z = 654.71 (C45H26N4O2 = 654.21) |
| 143 | m/z = 654.71 (C45H26N4O2 = 654.21) | 144 | m/z = 670.78 (C45H26N4OS = 670.18) |
| 145 | m/z = 640.73 (C45H2N4O = 640.23) | 146 | m/z = 716.83 (C51H32N4O = 716.26) |
| 147 | m/z = 716.83 (C51H32N4O = 716.26) | 148 | m/z = 792.92 (C57H36N4O = 792.29) |
| 149 | m/z = 792.92 (C57H36N4O = 792.29) | 150 | m/z = 640.73 (C45H2N4O = 640.23) |
| 151 | m/z = 792.92 (C57H36N4O = 792.29) | 152 | m/z = 792.92 (C57H36N4O = 792.29) |
| 153 | m/z = 792.92 (C57H36N4O = 792.29) | 154 | m/z = 728.84 (C52H32N4O = 728.26) |
| 155 | m/z = 728.84 (C52H32N4O = 728.26) | 156 | m/z = 804.93 (C58H36N4O = 804.29) |
| 157 | m/z = 746.21 (C51H30N4OS = 746.21) | 158 | m/z = 756.89 (C54H36N4O = 756.29) |
| 159 | m/z = 756.89 (C54H36N4O = 756.29) | 160 | m/z = 679.81 (C49H33N3O = 679.26) |
| 161 | m/z = 746.88 (C51H30N4OS = 746.21) | 162 | m/z = 730.81 (C51H30N4O2 = 730.24 |
| 163 | m/z = 730.81 (C51H30N4O2 = 730.24 | 164 | m/z = 669.79 (C46H27N3OS = 669.19) |
| 165 | m/z = 640.73 (C45H28N4O = 640.23) | 166 | m/z = 640.73 (C45H28N4O = 640.23) |
| 167 | m/z = 716.83 (C51H32N4O = 717.26) | 168 | m/z = 716.83 (C51H32N4O = 717.26) |
| 169 | m/z = 716.83 (C51H43N4O = 716.26) | 170 | m/z = 716.83 (C51H32N4O = 717.26) |
| 171 | m/z = 715.84 (C52H33N3O = 715.26) | 172 | m/z = 715.84 (C52H33N3O = 715.26) |
| 173 | m/z = 640.73 (C45H28N4O = 640.23 | 174 | m/z = 716.83 (C51H32N4O = 716.26) |
| 175 | m/z = 716.83 (C51H32N4O = 716.26) | 176 | m/z = 792.92 (C57H36N4O = 792.29) |
| 177 | m/z = 756.89 (C54H36N4O = 756.29) | 178 | m/z = 716.83 (C51H32N4O = 716.26) |
| 179 | m/z = 716.83 (C51H32N4O = 716.26) | 180 | m/z = 716.83 (C51H32N4O = 716.26) |
| 181 | m/z = 792.92 (C57H36N4O = 792.29) | 182 | m/z = 792.92 (C57H36N4O = 792.29) |
| 183 | m/z = 601.69 (C43H27N3O = 601.69) | 184 | m/z = 601.69 (C43H27N3O = 601.69) |
| 185 | m/z = 677.79 (C49H31N3O = 677.25) | 186 | m/z = 677.79 (C49H31N3O = 677.25) |
| 187 | m/z = 677.79 (C49H31N3O = 677.25) | 188 | m/z = 677.79 (C49H31N3O = 677.25) |
| 189 | m/z = 753.89 (C55H35N3O = 753.28) | 190 | m/z = 753.89 (C55H35N3O = 753.28) |
| 191 | m/z = 753.89 (C55H35N3O = 753.28) | 192 | m/z = 753.89 (C55H35N3O = 753.28) |
| 193 | m/z = 717.85 (C52H35N3O = 717.28) | 194 | m/z = 717.85 (C52H35N3O = 717.28) |
| 195 | m/z = 707.84 (C49H29N3OS = 707.20) | 196 | m/z = 691.77 (C49H29N3O2 = 691.23) |
| 197 | m/z = 613.70 (C44H27N3O = 613.22) | 198 | m/z = 689.80 (C50H31N3O = 689.25) |
| 199 | m/z = 689.80 (C50H31N3O = 689.25) | 200 | m/z = 689.80 (C50H31N3O = 689.25) |
| 201 | m/z = 765.90 (C56H35N3O = 765.28) | 202 | m/z = 765.90 (C56H35N3O = 765.28) |
| 203 | m/z = 729.86 (C53H35N3O = 729.28) | 204 | m/z = 719.20 (C50H29N3OS = 719.20) |
| 205 | m/z = 537.61 (C38H23N3O = 537.18) | 206 | m/z = 613.70 (C44H27N3O = 613.22) |
| 207 | m/z = 613.70 (C44H27N3O = 613.22) | 208 | m/z = 613.70 (C44H27N3O = 613.22) |
| 209 | m/z = 689.80 (C50H31N3O = 689.25) | 210 | m/z = 689.80 (C50H31N3O = 689.25) |
| 211 | m/z = 702.80 (C50H30N4O = 702.24) | 212 | m/z = 702.80 (C50H30N4O = 702.24) |
| 213 | m/z = 537.61 (C38H23N3O = 537.18) | 214 | m/z = 613.70 (C44H27N3O = 613.22) |
| 215 | m/z = 613.70 (C44H27N3O = 613.22) | 216 | m/z = 613.70 (C44H27N3O = 613.22) |
| 217 | m/z = 689.80 (C50H31N3O = 689.25) | 218 | m/z = 689.80 (C50H31N3O = 689.25) |
| 219 | m/z = 778.90 (C56H34N4O = 78.27) | 220 | m/z = 703.78 (C50H29N3O2 = 703.23) |
| 221 | m/z = 536.62 (C39H24N2O = 536.19) | 222 | m/z = 612.72 (C45H28N2O = 612.22) |
| 223 | m/z = 612.72 (C45H28N2O = 612.22) | 224 | m/z = 612.72 (C45H28N2O = 612.22) |
| 225 | m/z = 688.81 (C51H32N2O = 688.25) | 226 | m/z = 688.81 (C51H32N2O = 688.25) |
| 227 | m/z = 652.78 (C48H32N2O = 652.25) | 228 | m/z = 652.78 (C48H32N2O = 652.25) |
| 229 | m/z = 536.62 (C39H24N2O = 536.19) | 230 | m/z = 612.72 (C45H28N2O = 612.22) |
| 231 | m/z = 612.72 (C45H28N2O = 612.22) | 232 | m/z = 612.72 (C45H28N2O = 612.22) |
| 233 | m/z = 688.81 (C51H32N2O = 688.25) | 234 | m/z = 688.81 (C51H32N2O = 688.25) |
| 235 | m/z = 642.77 (C45H26N2OS = 642.18) | 236 | m/z = 626.70 (C45H27N2O2 = 626.20) |
| 237 | m/z = 563.65 (C40H25N3O = 563.20) | 238 | m/z = 639.73 (C46H29N3O = 639.23) |
| 239 | m/z = 639.73 (C46H29N3O = 639.23) | 240 | m/z = 715.84 (C52H33N3O = 715.26) |
| 241 | m/z = 715.84 (C52H33N3O = 715.26) | 242 | m/z = 715.84 (C52H33N3O = 715.26) |
| 243 | m/z = 639.74 (C46H29N3O = 639.23) | 244 | m/z = 715.84 (C52H33N3O = 715.26) |
| 245 | m/z = 664.75 (C47H28N4O = 664.23) | 246 | m/z = 740.85 (C53H32N4O = 740.26) |
| 247 | m/z = 740.85 (C53H32N4O = 740.26) | 248 | m/z = 740.85 (C53H32N4O = 740.26) |
| 249 | m/z = 816.94 (C59H36N4O = 816.29) | 250 | m/z = 816.94 (C59H36N4O = 816.29) |
| 251 | m/z = 829.94 (C59H35N5O = 829.28) | 252 | m/z = 829.94 (C59H35N5O = 829.28) |
| 253 | m/z = 729.82 (C51H31N5O = 729.25) | 254 | m/z = 805.92 (C57H35N5O = 805.28) |
| 255 | m/z = 702.80 (C50H30N4O = 702.24) | 256 | m/z = 766.27 (C55H34N4O = 766.27) |
| 257 | m/z = 716.83 (C51H32N4O = 716.26) | 258 | m/z = 654.71 (C45H26N4O2 = 654.21) |
| 259 | m/z = 730.81 (C51H30N4O2 = 730.24) | 260 | m/z = 654.71 (C45H26N4O2 = 654.21) |
| 261 | m/z = 730.81 (C51H30N4O2 = 730.24) | 262 | m/z = 730.81 (C51H30N4O2 = 730.24) |

TABLE 11-continued

| Compound | FD-Mass | Compound | FD-Mass |
|---|---|---|---|
| 263 | m/z = 716.83 (C51H32N4O = 716.26) | 264 | m/z = 654.71 (C45H26N4O2 = 654.21) |
| 265 | m/z = 730.81 (C51H30N4O2 = 730.24) | 266 | m/z = 730.81 (C51H30N4O2 = 730.24) |
| 267 | m/z = 746.88 (C51H30N4OS = 741.21) | 268 | m/z = 756.89 (C54H36N4O = 756.29) |
| 269 | m/z = 614.71 (C43H26N4O = 614.21) | 270 | m/z = 664.77 (C47H28N4O = 664.23) |
| 271 | m/z = 729.84 (C51H31N5O = 729.25) | 272 | m/z = 729.84 (C51H31N5O = 729.25) |
| 273 | m/z = 654.73 (C45H26N4O2 = 654.21) | 274 | m/z = 670.79 (C45H26N4OS = 670.18) |
| 275 | m/z = 779.90 (C55H33N5O = 779.27) | 276 | m/z = 829.96 (C59H35N5O = 829.28) |
| 277 | m/z = 704.79 (C49H28N4O2 = 704.22) | 278 | m/z = 720.85 (C49H28N4OS = 720.20) |
| 279 | m/z = 754.85 (C53H30N4O2 = 754.24) | 280 | m/z = 770.91 (C53H30N4OS = 770.21) |
| 281 | m/z = 693.82 (C48H27N3OS = 693.19) | 282 | m/z = 758.90 (C52H30N4OS = 758.21) |
| 283 | m/z = 799.97 (C54H29N3OS2 = 799.18 | 284 | m/z = 783.90 (C54H29N3O2S = 783.20) |
| 285 | m/z = 716.83 (C51H32N4O = 717.26) | 286 | m/z = 716.83 (C51H32N4O = 717.26) |

In addition, synthesis identification data of the compounds prepared above are as follows. Specifically, $^1$H NMR ($CDCl_3$, 200 Mz) data of the compounds represented by Chemical Formula 24 according to one embodiment of the present application are as shown in the following Table 12, $^1$H NMR ($CDCl_3$, 200 Mz) data of the compounds of Group 1 represented by Chemical Formula 1 according to one embodiment of the present application are as shown in the following Table 13, and $^1$H NMR ($CDCl_3$, 200 Mz) data of the compounds of Group 2 represented by Chemical Formula 1 according to one embodiment of the present application are as shown in the following Table 14.

TABLE 12

| Compound | $^1$H NMR ($CDCl_3$, 200 Mz) |
|---|---|
| 1 | δ = 8.55 (1H, d), 8.45 (1H, d), 8.30 (1H, d), 8.19 (1H, d), 8.13 (1H, d), 8.00~7.89 (8H, m), 7.79~7.77 (4H, m), 7.62~7.35 (15H, m), 7.20~7.16 (2H, m) |
| 2 | δ = 8.55 (1H, d), 8.45 (1H, d), 8.30 (1H, d), 8.19 (1H, d), 8.13 (1H, d), 8.00~7.89 (6H, m), 7.77 (2H, m) 7.62~7.35 (15H, m), 7.20~7.16 (2H, m) |
| 3 | δ = 8.55 (1H, d), 8.45 (1H, d), 8.30 (1H, d), 8.19 (1H, d), 8.13 (1H, d), 8.00~7.89 (6H, m), 7.77~7.75 (4H, m), 7.62~7.41 (13H, m), 7.25~7.16 (6H, m) |
| 4 | δ = 8.55 (1H, d), 8.45 (1H, d), 8.30 (1H, d), 8.19 (1H, d), 8.13 (1H, d), 8.00~7.89 (7H, m), 7.77~7.73 (5H, m) 7.61~7.35 (15H, m), 7.20~7.16 (2H, m) |
| 5 | δ = 8.55 (1H, d), 8.45 (1H, d), 8.30 (1H, d), 8.19~7.89 (11H, m), 7.77 (2H, m) 7.63~7.49 (12H, m), 7.38~7.35 (2H, m), 7.20~7.16 (2H, m) |
| 6 | δ = 8.55 (1H, d), 8.55~8.45 (3H, m), 8.30 (1H, d), 8.20~8.09 (4H, m), 8.00~7.89 (6H, m), 7.77 (3H, m), 7.62~7.35 (12H, m), 7.20~7.16 (2H, m) |
| 7 | δ = 8.55 (1H, d), 8.45 (1H, d), 8.19~8.09 (3H, m), 8.00~7.89 (8H, m), 7.78~7.77 (3H, m), 7.62~7.49 (10H, m), 7.38~7.16 (5H, m), 1.69 (6H, s) |
| 8 | δ = 8.55 (1H, d), 8.45 (1H, d), 8.30 (1H, d), 8.19~8.13 (2H, m), 8.00~7.89 (7H, m), 7.78~7.77 (3H, m), 7.65~7.16 (17H, m), 1.69 (6H, s) |
| 9 | δ = 8.55 (1H, d), 8.45 (1H, d), 8.30 (1H, d), 8.19~8.12 (4H, m), 8.00~7.89 (8H, m), 7.77 (2H, m), 7.62~7.49 (11H, m), 7.35 (1H, t), 7.21~7.16 (2H, m) |
| 10 | δ = 8.55 (1H, d), 8.45 (2H, d), 8.32~8.30 (2H, m), 8.19 (1H, d), 8.12 (1H, d), 8.00~7.89 (7H, m), 7.77~7.49 (14H, m), 7.35 (1H, t), 7.21~7.16 (2H, m) |
| 11 | δ = 8.55 (1H, d), 8.45 (1H, d), 8.30 (1H, d), 8.19 (1H, d), 8.13 (1H, d), 8.00~7.77 (12H, m), 7.62~7.31 (13H, m), 7.20~7.16 (2H, m) 7.35 (1H, t), 7.21~7.16 (2H, m) |
| 12 | δ = 8.55 (1H, d), 8.45 (1H, d), 8.30 (1H, d), 8.19~7.89 (11H, m), 7.77 (2H, m), 7.62~7.31 (14H, m), 7.20~7.16 (2H, m) |

TABLE 13

| Compound | $^1$H NMR ($CDCl_3$, 200 Mz) |
|---|---|
| 1 | δ = 8.55 (1H, d), 8.28 (4H, d), 8.12 (1H, d), 7.95~7.89 (3H, m)6, 7.75 (1H, d), 7.64~7.63 (2H, d), 7.51~7.32 (12H, m) |
| 2 | δ = 8.55 (1H, d), 8.28 (4H, d), 8.18 (1H, d), 7.95~7.89 (3H, m), 7.79~7.75 (2H, q), 7.64~7.62 (2H, d), 7.52~7.32 (15H, m) |
| 3 | δ = 8.55 (1H, d), 8.28 (4H, d), 7.95~7.89 (4H, m), 7.77~7.89 (3H, m), 7.75 (1H, d), 7.63~7.32 (26H, m) |
| 5 | δ = 8.28 (1H, m), 8.18 (1H, d), 8.00~7.87 (4H, m), 7.77~7.64 (5H, m), 7.52~7.32 (18H, m) |
| 7 | δ = 8.55 (1H, d), 8.28 (4H, d), 8.12 (1H, d), 7.95~7.89 (3H, m), 7.75 (1H, d), 7.63~7.32 (26H, m) |

TABLE 13-continued

| Compound | $^1$H NMR ($CDCl_3$, 200 Mz) |
|---|---|
| 20 | δ = 8.49 (1H, d), 8.28~8.14 (4H, m), 8.10 (1H, d), 7.95 (1H, d), 7.89 (1H, d), 7.79~7.32 (25H, m) |
| 30 | δ = 8.39 (1H, s), 8.28~8.24 (3H, m), 8.12~8.09 (2H, d) 7.95 (1H, d), 7.89 (1H, d), 7.75~7.24 (22H, m), 1.72 (6H, s) |
| 126 | δ = 9.09 (2H, s) 8.49 (2H, d), 8.55 (1H, d), 8.18 (1H, d), 8.00~7.92 (9H, m), 7.79~7.75 (2H, m), 7.59~7.32 (15H, m) |
| 137 | δ = 8.55 (1H, d), 8.25 (4H, d), 8.12 (2H, d) 7.95~7.89 (3H., m), 7.75~7.73 (2H, m), 7.64~7.63 (2H, m), 7.51~7.25 (1H, m) |
| 138 | δ = 8.57 (1H, d), 8.28 (4H, d), 8.12 (1H, d), 7.95~7.89 (3H, m), 7.79~7.73 (3H, m), 7.64~7.62 (2H, d), 7.51~7.25 (14H, m) |
| 139 | δ = 8.55 (1H, d), 8.28 (4H, d), 7.95~7.87 (4H, m), 7.77~7.73 (5H, m), 7.52~7.25 (14H, m) |
| 141 | δ = 8.27 (4H, d), 8.17 (1H, d), 8.00~7.87 (4H, m), 7.77~7.73 (6H, m), 7.52~7.41 (17H, m) |
| 173 | δ = 8.55 (1H, d), 8.28 (4H, d), 8.12 (1H, d), 7.95~7.85 (5H, m), 7.75~7.73 (2H, d), 7.64~7.63 (2H, d), 7.51~7.25 (13H, m) |
| 174 | δ = 8.55 (1H, d), 8.28 (4H, d), 8.12 (1H, d), 7.95~7.89 (3H, m), 7.70~7.25 (18H, m) |
| 189 | δ = 8.56 (1H, d), 8.28 (4H, d), 8.12 (1H, d), 7.95~7.94 (2H, m), 7.80~7.75 (2H, m), 7.66~7.63 (3H, m), 7.51~7.25 (11H, m) |
| 190 | δ = 8.55 (1H, d), 8.28 (4H, d), 8.18 (1H, d), 7.95~7.94 (2H, m), 7.66~7.62 (3H, m), 7.52~7.25 (14H, m) |
| 242 | δ = 8.55 (1H, d), 8.27~8.26 (4H, d), 8.18 (1H, d), 7.95~7.94 (2H, m), 7.79~7.75 (2H, m), 7.66~7.62 (3H, m), 7.52~7.25 (15H, m) |
| 245 | δ = 8.28 (4H, d), 8.17 (1H, d), 8.00~7.95 (2H, q), 7.87 (1H, d), 7.87 (1H, d), 7.77~7.64 (6H, m), 7.51~7.38 (18H, m) |
| 301 | δ = 8.28 (2H, d), 8.18~8.12 (2H, q), 8.00~7.73 (9H, m), 7.66~7.63 (3H, m), 7.52~7.29 (14H, m) |
| 305 | δ = 8.55 (1H, d), 8.24 (2H, d), 8.12 (1H, d), 7.95~7.94 (2H, d), 7.80~7.25 (26H, m) |
| 314 | δ = 8.55 (1H, d), 8.28 (2H, d) 8.12 (1H, d), 7.94~7.81 (6H, m), 7.66~7.63 (4H, m), 7.51~7.25 (12H, m) |

TABLE 14

| Compound | $^1$H NMR ($CDCl_3$, 200 Mz) |
|---|---|
| 18 | δ = 8.52 (1H, d), 8.28~8.24 (3H, m), 8.12 (1H, d), 7.94~7.89 (2H, d), 7.75~7.70 (2H, m), 7.62~7.25 (19H, m) |
| 19 | δ = 8.53 (1H, d), 8.28~8.18 (4H, m), 7.94~7.89 (2H, q), 7.79~7.70 (3H, m), 7.62~7.25 (22H, m) |
| 131 | δ = 8.55 (1H, d), 8.28 (4H, d), 7.94~7.87 (3H, m), 7.77~7.73 (5H, m), 7.52~7.25 (15H, m) |
| 133 | δ = 8.28 (4H, d), 8.18 (1H, d), 8.0 (1H, d), 7.89~7.87 (2H, t), 7.77~7.73 (5H, m), 7.62 (1H, m), 7.52~7.41 (18H, m) |
| 135 | δ = 8.55 (1H, d), 8.28 (4H, m), 8.12 (1H, d), 7.94~7.89 (2H, m), 7.75~7.73 (2H, d), 7.63~7.25 (21H, m) |
| 138 | δ = 8.39 (1H, d), 8.28 (4H, d), 8.12~8.09 (2H, t), 7.89 (1H, d), 7.75~7.61 (6H, m), 7.51~7.41 (10H, m) |
| 147 | δ = 8.55 (1H, d), 8.28~8.24 (3H, m), 7.94~7.87 (3H, m), 7.73~7.25 (25H, m) |
| 150 | δ = 8.55 (1H, d), 8.28 (2H, d), 8.12 (1H, d), 7.94~7.85 (4H, m), 7.75~7.73 (2H, d), 7.63~7.62 (2H, d), 7.52~7.25 (16H, m) |
| 264 | δ = 8.55 (1H, d), 8.28 (2H, d), 8.12 (1H, d), 7.94~7.25 (22H, m) |
| 265 | δ = 8.28 (2H, m), 8.18~8.12 (2H, m), 8.00 (1H, d), 7.89~7.73 (7H, m), 7.66~7.62 (3H, m), 7.51~7.29 (15H, m) |
| 271 | δ = 8.55 (2H, d), 8.36 (4H, t), 7.98~7.94 (3H, m), 7.82 (1H, d), 7.69~7.50 (15H, m), 7.35 (2H, t), 7.26~7.25 (2H, d), 7.16 (2H, t) |
| 285 | δ = 8.55 (1H, d), 8.28 (2H, d), 8.18 (1H, d), 7.94~7.73 (7H, m), 7.62 (2H, d), 7.52~7.25 (19H, m) |

TABLE 14-continued

| Compound | $^1$H NMR ($CDCl_3$, 200 Mz) |
|---|---|
| 286 | δ = 8.55 (1H, d), 8.28 (2H, d), 7.94~7.85 (5H, m), 7.77~7.69 (3H, m), 7.62 (1H, d), 7.51~7.25 (20H, m) |

<Experimental Example 1> Manufacture of Organic Light Emitting Device

A glass substrate on which indium tin oxide (ITO) was coated as a thin film to a thickness of 1,500 Å was cleaned with distilled water ultrasonic waves. After the cleaning with distilled water was finished, the substrate was ultrasonic cleaned with solvents such as acetone, methanol and isopropyl alcohol, then dried, and UVO treatment was conducted for 5 minutes using UV in a UV cleaner. After that, the substrate was transferred to a plasma cleaner (PT), and after conducting plasma treatment under vacuum for ITO work function and residual film removal, the substrate was transferred to a thermal deposition apparatus for organic deposition.

On the transparent ITO electrode (anode), a hole injection layer 2-TNATA (4,4',4"-tris[2-naphthyl(phenyl)amino]triphenylamine) and a hole transfer layer NPB (N,N'-di(1-naphthyl)-N,N'-diphenyl-(1,1'-biphenyl)-4,4'-diamine), which are common layers, were formed.

A light emitting layer was thermal vacuum deposited thereon as follows. As the light emitting layer, one type of the compound described in Chemical Formula 1 and one type of the compound described in Chemical Formula 24 were deposited to 400 Å in each individual source of supply as a host, and $Ir(ppy)_3$ was deposited by 7% doping as a green phosphorescent dopant. After that, BCP was deposited to 60 Å as a hole blocking layer, and $Alq_3$ was deposited to 200 Å thereon as an electron transfer layer. Lastly, an electron injection layer was formed on the electron transfer layer by depositing lithium fluoride (LiF) to a thickness of 10 Å, and then a cathode was formed on the electron injection layer by depositing an aluminum (Al) cathode to a thickness of 1,200 Å, and as a result, an organic electroluminescent device was manufactured.

Meanwhile, all the organic compounds required to manufacture the OLED were vacuum sublimation purified under $10^{-6}$ torr to $10^{-8}$ torr for each material to be used in the OLED manufacture.

<Experimental Example 2> Manufacture of Organic Light Emitting Device

A glass substrate on which ITO was coated as a thin film to a thickness of 1,500 Å was cleaned with distilled water ultrasonic waves. After the cleaning with distilled water was finished, the substrate was ultrasonic cleaned with solvents such as acetone, methanol and isopropyl alcohol, then dried, and UVO treatment was conducted for 5 minutes using UV in a UV cleaner. After that, the substrate was transferred to a plasma cleaner (PT), and after conducting plasma treatment under vacuum for ITO work function and residual film removal, the substrate was transferred to a thermal deposition apparatus for organic deposition.

On the transparent ITO electrode (anode), a hole injection layer 2-TNATA (4,4',4"-tris[2-naphthyl(phenyl)amino]triphenylamine) and a hole transfer layer NPB (N,N'-di(1-naphthyl)-N,N'-diphenyl-(1,1'-biphenyl)-4,4'-diamine), which are common layers, were formed.

A light emitting layer was thermal vacuum deposited thereon as follows. As the light emitting layer, one type of the compound described in Chemical Formula 1 and one type of the compound described in Chemical Formula 24 were pre-mixed and deposited to 400 Å in one source of supply as a host, and $Ir(ppy)_3$ was deposited by 7% doping as a green phosphorescent dopant. After that, BCP was deposited to 60 Å as a hole blocking layer, and $Alq_3$ was deposited to 200 Å thereon as an electron transfer layer. Lastly, an electron injection layer was formed on the electron transfer layer by depositing lithium fluoride (LiF) to a thickness of 10 Å, and then a cathode was formed on the electron injection layer by depositing an aluminum (Al) cathode to a thickness of 1,200 Å, and as a result, an organic electroluminescent device was manufactured.

Meanwhile, all the organic compounds required to manufacture the OLED were vacuum sublimation purified under $10^{-6}$ torr to $10^{-8}$ torr for each material to be used in the OLED manufacture.

For the organic electroluminescent devices manufactured as above, electroluminescent (EL) properties were measured using M7000 manufactured by McScience Inc., and with the measurement results, $T_{90}$ was measured when standard luminance was 6,000 cd/m$^2$ through a lifetime measurement system (M6000) manufactured by McScience Inc.

The organic electroluminescent devices according to Experimental Example 1 and Experimental Example 2 have driving voltage and light emission efficiency as follows.

The following Table 15 shows driving voltage and light emission efficiency of the organic electroluminescent devices when using the heterocyclic compound of Chemical Formula 24 of the present application alone, the following Table 16 shows driving voltage and light emission efficiency of the organic electroluminescent devices when using the compound of Group 1 of the heterocyclic compound of Chemical Formula 1 of the present application alone, and the following Table 17 shows driving voltage and light emission efficiency of the organic electroluminescent devices when using the compound of Group 2 of the heterocyclic compound of Chemical Formula 1 of the present application alone.

TABLE 15

| | Light Emitting Layer Compound | Driving Voltage (V) | Efficiency (cd/A) | Color Coordinate (x, y) | Lifetime ($T_{90}$) |
|---|---|---|---|---|---|
| Comparative Example 1 | 1 | 4.02 | 65.2 | (0.292, 0.694) | 240 |
| Comparative Example 2 | 2 | 4.05 | 67.2 | (0.294, 0.694) | 272 |
| Comparative Example 3 | 3 | 3.90 | 68.9 | (0.273, 0.673) | 191 |
| Comparative Example 4 | 4 | 4.30 | 62.5 | (0.313, 0.683) | 241 |
| Comparative Example 5 | 5 | 4.29 | 61.1 | (0.291, 0.654) | 201 |
| Comparative Example 6 | 6 | 4.39 | 62.1 | (0.301, 0.654) | 203 |
| Comparative Example 7 | 7 | 4.39 | 62.1 | (0.291, 0.684) | 193 |
| Comparative Example 8 | 8 | 4.19 | 66.1 | (0.317, 0.653) | 213 |
| Comparative Example 9 | 9 | 4.40 | 63.2 | (0.295, 0.674) | 210 |
| Comparative Example 10 | 10 | 3.88 | 69.9 | (0.290, 0.632) | 234 |
| Comparative Example 11 | 11 | 4.01 | 66.6 | (0.286, 0.645) | 219 |
| Comparative Example 12 | 12 | 3.93 | 68.3 | (0.312, 0.653) | 185 |

TABLE 16

| | Light Emitting Layer Compound | Driving Voltage (V) | Efficiency (cd/A) | Color Coordinate (x, y) | Lifetime ($T_{90}$) |
|---|---|---|---|---|---|
| Comparative Example 13 | 139 | 4.22 | 71.2 | (0.282, 0.672) | 171 |
| Comparative Example 14 | 143 | 4.09 | 69.1 | (0.278, 0.669) | 143 |
| Comparative Example 15 | 190 | 4.32 | 78.6 | (0.273, 0.673) | 181 |
| Comparative Example 16 | 191 | 4.27 | 77.3 | (0.278, 0.682) | 176 |
| Comparative Example 17 | 204 | 4.11 | 61.3 | (0.280, 0.664) | 137 |
| Comparative Example 18 | 205 | 4.19 | 65.1 | (0.294, 0.682) | 185 |
| Comparative Example 19 | 219 | 4.24 | 64.9 | (0.272, 0.684) | 176 |

TABLE 17

| | Light Emitting Layer Compound | Driving Voltage (V) | Efficiency (cd/A) | Color Coordinate (x, y) | Lifetime ($T_{90}$) |
|---|---|---|---|---|---|
| Comparative Example 20 | 129 | 3.92 | 73.8 | (0.269, 0.665) | 143 |
| Comparative Example 21 | 136 | 4.02 | 67.3 | (0.274, 0.677) | 153 |
| Comparative Example 22 | 139 | 3.89 | 72.1 | (0.262, 0.688) | 148 |
| Comparative Example 23 | 144 | 4.10 | 80.5 | (0.290, 0.681) | 187 |

In addition, the following Table 18 shows driving voltage and light emission efficiency of the organic electroluminescent devices when mixing and using the heterocyclic compound of Chemical Formula 24 of the present application and the compound of Group 1 of the heterocyclic compound of Chemical Formula 1 of the present application, and specifically, shows data of building the device by varying the ratio of the heterocyclic compound of Chemical Formula 24 and the compound of Group 1 of the heterocyclic compound of Chemical Formula 1. The following Table 19 shows driving voltage and light emission efficiency of the organic electroluminescent devices when mixing and using the heterocyclic compound of Chemical Formula 24 of the present application and the compound of Group 2 of the heterocyclic compound of Chemical Formula 1 of the present application, and specifically, shows data of building the device by varying the ratio of the heterocyclic compound of Chemical Formula 24 and the compound of Group 2 of the heterocyclic compound of Chemical Formula 1.

TABLE 18

| | Chemical Formula 24 | Chemical Formula 1 (Group 1) | Ratio | Driving Voltage (V) | Efficiency (cd/A) | Color Coordinate (x, y) | Lifetime ($T_{90}$) |
|---|---|---|---|---|---|---|---|
| Comparative Example 24 | A | 139 | 1:1 | 4.43 | 102.2 | (0.263, 0.669) | 201 |
| Comparative Example 25 | | 143 | 1:1 | 4.67 | 100.7 | (0.270, 0.671) | 278 |
| Comparative Example 26 | B | 167 | 1:1 | 4.71 | 105.8 | (0.278, 0.680) | 283 |
| Comparative Example 27 | | 191 | 1:1 | 4.29 | 110.7 | (0.271, 0.673) | 247 |
| Comparative Example 28 | C | 202 | 1:1 | 4.38 | 104.3 | (0.268, 0.672) | 309 |
| Comparative Example 29 | | 204 | 1:1 | 4.51 | 112.5 | (0.267, 0.677) | 294 |
| Comparative Example 30 | D | 248 | 1:1 | 4.44 | 107.3 | (0.275, 0.674) | 251 |
| Comparative Example 31 | | 249 | 1:1 | 4.37 | 102.4 | (0.279, 0.675) | 278 |
| Example 9 | | | 8:1 | 4.64 | 114.2 | (0.271, 0.676) | 471 |
| Example 10 | | | 5:1 | 4.47 | 119.4 | (0.263, 0.683) | 531 |
| Example 11 | | | 2:1 | 4.26 | 122.6 | (0.274, 0.680) | 575 |
| Example 12 | 2 | 139 | 1:1 | 4.02 | 125.9 | (0.268, 0.669) | 529 |
| Example 13 | | | 1:2 | 4.13 | 135.1 | (0.280, 0.676) | 513 |
| Example 14 | | | 1:5 | 4.37 | 128.7 | (0.278, 0.674) | 488 |
| Example 15 | | | 1:8 | 4.58 | 119.38 | (0.275, 0.671) | 464 |
| Example 16 | 3 | 142 | 2:1 | 4.68 | 137.5 | (0.268, 0.672) | 499 |
| Example 17 | | | 1:1 | 4.60 | 129.6 | (0.270, 0.671 | 428 |
| Example 18 | 5 | 190 | 2:1 | 4.61 | 118.3 | (0.267, 0.680) | 483 |
| Example 19 | | | 1:1 | 4.13 | 132.1 | (0.270, 0.678) | 459 |
| Example 20 | 7 | 191 | 2:1 | 4.48 | 116.8 | (0.260, 0.674) | 472 |
| Example 21 | | | 1:1 | 4.20 | 130.7 | (0.263, 0.683) | 433 |
| Example 14 | 9 | 204 | 2:1 | 4.62 | 122.5 | (0.267, 0.670) | 412 |
| Example 15 | | | 1:1 | 4.37 | 127.1 | (0.278, 0.683) | 390 |
| Example 16 | 11 | 205 | 2:1 | 4.73 | 124.1 | (0.282, 0.677) | 477 |
| Example 17 | | | 1:1 | 4.27 | 135.8 | (0.282, 0.683) | 431 |

TABLE 19

| | Chemical Formula 24 | Chemical Formula 1 (Group 2) | Ratio | Driving Voltage (V) | Efficiency (cd/A) | Color Coordinate e (x, y) | Lifetime ($T_{90}$) |
|---|---|---|---|---|---|---|---|
| Comparative Example 32 | A | 3 | 1:1 | 4.23 | 105.9 | (0.268, 0.671) | 286 |
| Comparative Example 33 | | 4 | 1:1 | 4.19 | 103.0 | (0.267, 0.674) | 260 |
| Comparative Example 34 | B | 9 | 1:1 | 4.39 | 108.2 | (0.278, 0.681) | 277 |
| Comparative Example 35 | | 33 | 1:1 | 4.62 | 110.4 | (0.269, 0.675) | 259 |
| Comparative Example 36 | C | 135 | 1:1 | 4.47 | 118.2 | (0.268, 0.677) | 213 |
| Comparative Example 37 | | 136 | 1:1 | 4.39 | 107.0 | (0.267, 0.679) | 301 |
| Comparative Example 38 | D | 138 | 1:1 | 4.02 | 106.3 | (0.275, 0.671) | 222 |
| Comparative Example 39 | | 143 | 1:1 | 4.61 | 100.8 | (0.279, 0.670) | 264 |
| Example 18 | 2 | 3 | 8:1 | 4.58 | 100.4 | (0.263, 0.671) | 342 |
| Example 19 | | | 5:1 | 4.40 | 102.7 | (0.265, 0.675) | 375 |
| Example 20 | | | 2:1 | 4.22 | 109.4 | (0.264, 0.670) | 433 |

TABLE 19-continued
| | Chemical Formula 24 | Chemical Formula 1 (Group 2) | Ratio | Driving Voltage (V) | Efficiency (cd/A) | Color Coordinate e (x, y) | Lifetime ($T_{90}$) |
|---|---|---|---|---|---|---|---|
| Example 21 | | | 1:1 | 4.00 | 113.1 | (0.268, 0.674) | 418 |
| Example 22 | | | 1:2 | 4.19 | 120.9 | (0.266, 0.679) | 396 |
| Example 23 | | | 1:5 | 4.41 | 115.3 | (0.271, 0.680) | 377 |
| Example 24 | | | 1:8 | 4.63 | 109.5 | (0.270, 0.679) | 349 |
| Example 22 | 3 | 29 | 2:1 | 4.47 | 133.2 | (0.264, 0.670) | 483 |
| Example 23 | | | 1:1 | 4.22 | 128.7 | (0.278, 0.674 | 457 |
| Example 24 | 5 | 36 | 2:1 | 4.57 | 115.0 | (0.279, 0.684) | 423 |
| Example 25 | | | 1:1 | 4.16 | 119.7 | (0.273, 0.679) | 391 |
| Example 26 | 7 | 144 | 2:1 | 4.43 | 124.3 | (0.268, 0.677) | 516 |
| Example 27 | | | 1:1 | 4.18 | 137.6 | (0.275, 0.681) | 473 |
| Example 28 | 9 | 158 | 2:1 | 4.27 | 118.4 | (0.278, 0.677) | 363 |
| Example 29 | | | 1:1 | 3.83 | 123.6 | (0.282, 0.681) | 317 |
| Example 30 | 11 | 272 | 2:1 | 4.76 | 122.3 | (0.264, 0.673) | 430 |
| Example 31 | | | 1:1 | 4.20 | 127.1 | (0.272, 0.670) | 395 |
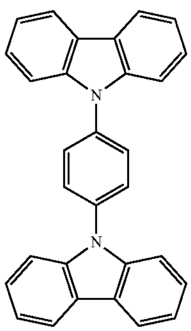
A
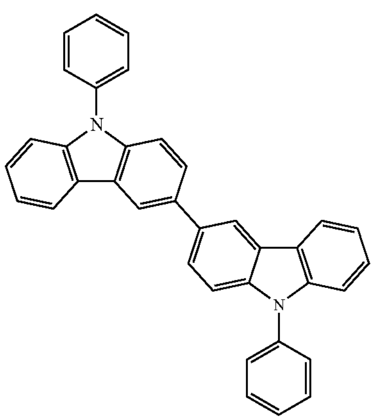
B
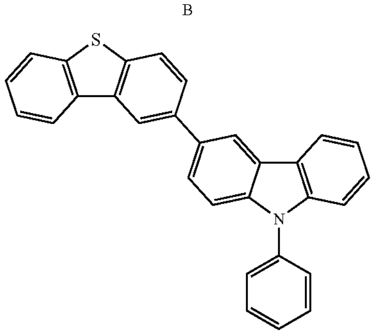
C TABLE 19-continued

| Chemical Formula 24 | Chemical Formula 1 (Group 2) | Ratio | Driving Voltage (V) | Efficiency (cd/A) | Color Coordinate e (x, y) | Lifetime ($T_{90}$) |
|---|---|---|---|---|---|---|

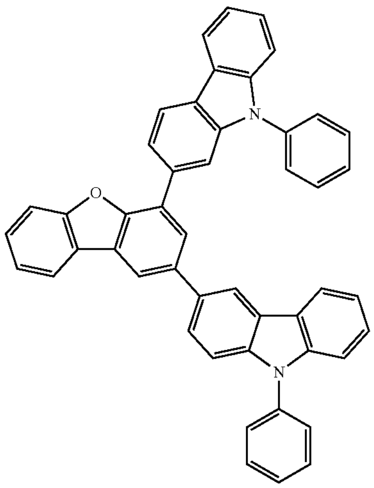

D

The following Table 20 shows driving voltage and light emission efficiency of the organic electroluminescent devices when mixing and using the heterocyclic compound of Chemical Formula 24 of the present application and the compound of Group 1 of the heterocyclic compound of Chemical Formula 1 of the present application, and specifically, shows data of building the device depending on the compound type after fixing the ratio of the heterocyclic compound of Chemical Formula 24 and the compound of Group 1 of the heterocyclic compound of Chemical Formula 1. The following Table 21 shows driving voltage and light emission efficiency of the organic electroluminescent devices when mixing and using the heterocyclic compound of Chemical Formula 24 of the present application and the compound of Group 2 of the heterocyclic compound of Chemical Formula 1 of the present application, and specifically, shows data of building the device depending on the compound type after fixing the ratio of the heterocyclic compound of Chemical Formula 24 and the compound of Group 2 of the heterocyclic compound of Chemical Formula 1.

TABLE 20

| | Chemical Formula 24 | Chemical Formula 1 (Group 1) | Ratio | Driving Voltage (V) | Efficiency (cd/A) | Color Coordinate (x, y) | Lifetime ($T_{90}$) |
|---|---|---|---|---|---|---|---|
| Example 32 | 3 | 3 | 1:1 | 4.11 | 122.5 | (0.282, 0.681) | 345 |
| Example 33 | | 15 | 1:1 | 4.31 | 116.7 | (0.272, 0.679) | 397 |
| Example 34 | 6 | 134 | 1:1 | 4.16 | 109.7 | (0.280, 0.673) | 412 |
| Example 35 | | 155 | 1:1 | 4.28 | 114.5 | (0.276, 0.675) | 356 |
| Example 36 | 10 | 167 | 1:1 | 4.58 | 121.4 | (0.273, 0.687) | 437 |
| Example 37 | | 201 | 1:1 | 4.27 | 123.2 | (0.268, 0.670) | 425 |
| Example 38 | 12 | 248 | 1:1 | 4.21 | 113.5 | (0.279, 0.676) | 399 |
| Example 39 | | 250 | 1:1 | 4.07 | 106.9 | (0.276, 0.671) | 401 |

TABLE 21

| | Chemical Formula 24 | Chemical Formula 1 (Group 2) | Ratio | Driving Voltage (V) | Efficiency (cd/A) | Color Coordinate (x, y) | Lifetime ($T_{90}$) |
|---|---|---|---|---|---|---|---|
| Example 40 | 51 | 27 | 1:1 | 4.63 | 120.5 | (0.274, 0.676) | 455 |
| Example 41 | | 28 | 1:1 | 4.38 | 107.3 | (0.269, 0.684) | 497 |
| Example 42 | 71 | 32 | 1:1 | 4.16 | 114.6 | (0.280, 0.673) | 369 |
| Example 43 | | 67 | 1:1 | 4.29 | 110.7 | (0.284, 0.676) | 422 |
| Example 44 | 89 | 92 | 1:1 | 4.56 | 131.4 | (0.274, 0.682) | 513 |
| Example 45 | | 112 | 1:1 | 4.40 | 133.5 | (0.271, 0.680) | 521 |
| Example 46 | 98 | 157 | 1:1 | 4.13 | 127.7 | (0.275, 0.679) | 485 |
| Example 47 | | 163 | 1:1 | 4.28 | 110.9 | (0.276, 0.671) | 473 |

A

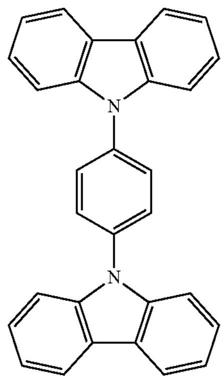

B

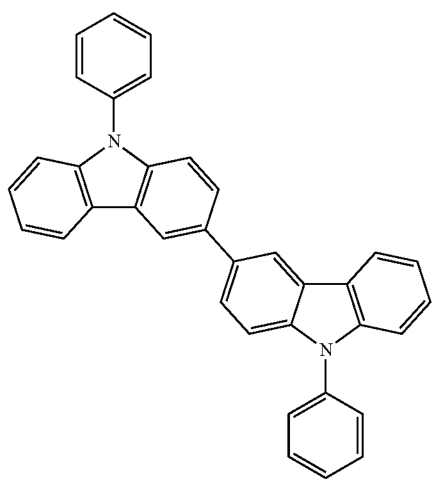

C

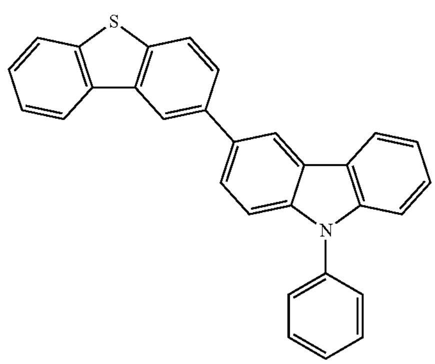

-continued

D

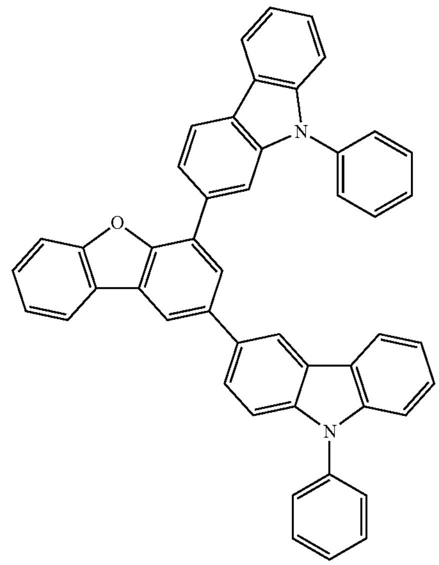

The following Table 22 shows driving voltage and light emission efficiency of the organic electroluminescent devices depending on the doping concentration when mixing and using the heterocyclic compound of Chemical Formula 24 of the present application and the compound of Group 1 of the heterocyclic compound of Chemical Formula 1 of the present application, and the following Table 23 shows driving voltage and light emission efficiency of the organic electroluminescent devices depending on the doping concentration when mixing and using the heterocyclic compound of Chemical Formula 24 of the present application and the compound of Group 2 of the heterocyclic compound of Chemical Formula 1 of the present application.

TABLE 22

| | Chemical Formula 24 | Chemical Formula 1 (Group 1) | Dopant Doping Concentration | Driving Voltage (V) | Efficiency (cd/A) | Color Coordinate (x, y) | Lifetime ($T_{90}$) |
|---|---|---|---|---|---|---|---|
| Example 48 | B | 3 | 3% | 4.22 | 137.3 | (0.282, 0.681) | 322 |
| Example 49 | | | 12% | 4.91 | 112.0 | (0.282, 0.681) | 291 |
| Example 50 | C | 134 | 3% | 4.31 | 129.4 | (0.280, 0.673) | 343 |
| Example 51 | | | 12% | 4.87 | 106.8 | (0.280, 0.673) | 304 |
| Example 52 | 2 | 15 | 3% | 4.33 | 157.2 | (0.272, 0.679) | 517 |
| Example 53 | | | 12% | 4.79 | 153.8 | (0.272, 0.679) | 509 |
| Example 54 | 3 | 155 | 3% | 4.28 | 154.8 | (0.276, 0.675) | 510 |
| Example 55 | | | 12% | 4.81 | 152.6 | (0.276, 0.675) | 503 |
| Example 56 | 5 | 167 | 3% | 4.25 | 149.0 | (0.273, 0.680) | 476 |
| Example 57 | | | 12% | 4.76 | 147.3 | (0.273, 0.680) | 470 |
| Example 58 | 7 | 201 | 3% | 4.37 | 150.7 | (0.281, 0.672) | 492 |
| Example 59 | | | 12% | 4.86 | 147.5 | (0.281, 0.672) | 487 |
| Example 60 | 9 | 248 | 3% | 4.41 | 148.1 | (0.278, 0.669) | 461 |

TABLE 22-continued

| | Chemical Formula 24 | Chemical Formula 1 (Group 1) | Dopant Doping Concentration | Driving Voltage (V) | Efficiency (cd/A) | Color Coordinate (x, y) | Lifetime ($T_{90}$) |
|---|---|---|---|---|---|---|---|
| Example 61 | | | 12% | 4.80 | 145.9 | (0.278, 0.669) | 450 |
| Example 62 | 11 | 250 | 3% | 4.30 | 149.7 | (0.271, 0.674) | 467 |
| Example 63 | | | 12% | 4.62 | 145.1 | (0.271, 0.674) | 455 |

TABLE 23

| | Chemical Formula 24 | Chemical Formula 1 (Group 2) | Dopant Doping Concentration | Driving Voltage (V) | Efficiency (cd/A) | Color Coordinate (x, y) | Lifetime ($T_{90}$) |
|---|---|---|---|---|---|---|---|
| Example 64 | B | 3 | 3% | 4.31 | 135.4 | (0.268, 0.677) | 331 |
| Example 65 | | | 12% | 4.98 | 110.6 | (0.268, 0.677) | 304 |
| Example 66 | C | 27 | 3% | 4.27 | 131.4 | (0.278, 0.674) | 342 |
| Example 67 | | | 12% | 4.76 | 103.7 | (0.278, 0.674) | 308 |
| Example 68 | 2 | 28 | 3% | 4.31 | 156.8 | (0.270, 0.671) | 528 |
| Example 69 | | | 12% | 4.82 | 153.6 | (0.270, 0.671) | 520 |
| Example 70 | 3 | 32 | 3% | 4.37 | 155.1 | (0.282, 0.671) | 508 |
| Example 71 | | | 12% | 4.93 | 151.0 | (0.282, 0.677) | 505 |
| Example 72 | 5 | 36 | 3% | 4.27 | 147.7 | (0.274, 0.682) | 481 |
| Example 73 | | | 12% | 4.70 | 141.1 | (0.274, 0.682) | 477 |
| Example 74 | 7 | 144 | 3% | 4.37 | 145.6 | (0.273, 0.687) | 463 |
| Example 75 | | | 12% | 4.90 | 140.8 | (0.273, 0.687) | 455 |
| Example 76 | 9 | 137 | 3% | 4.36 | 149.4 | (0.263, 0.683) | 464 |
| Example 77 | | | 12% | 4.82 | 146.9 | (0.263, 0.683) | 459 |
| Example 78 | 11 | 162 | 3% | 4.31 | 149.4 | (0.274, 0.677) | 455 |
| Example 79 | | | 12% | 4.79 | 146.4 | (0.274, 0.677) | 447 |

As seen from Table 15 to Table 23, it was identified that, when comprising both the heterocyclic compound represented by Chemical Formula 1 and the heterocyclic compound represented by Chemical Formula 24 in an organic material layer of an organic light emitting device, more superior efficiency and lifetime effects were obtained compared to when comprising either the heterocyclic compound of Chemical Formula 1 alone or the heterocyclic compound of Chemical Formula 24 alone in an organic material layer. Such results leaded to a forecast that an exciplex phenomenon occurs when comprising the two compounds at the same time.

The exciplex phenomenon is a phenomenon of releasing energy having sizes of a donor (p-host) HOMO level and an acceptor (n-host) LUMO level due to electron exchanges between two molecules. When the exciplex phenomenon occurs between two molecules, reverse intersystem crossing (RISC) occurs, and as a result, internal quantum efficiency of fluorescence may increase up to 100%. When a donor (p-host) having a favorable hole transfer ability and an acceptor (n-host) having a favorable electron transfer ability are used as a host of a light emitting layer, holes are injected to the p-host and electrons are injected to the n-host, and therefore, a driving voltage may decrease, which resultantly helps with enhancement in the lifetime.

Particularly, it was identified that the heterocyclic compound represented by Chemical Formula 24 introduces a dibenzothiophene group that is a heteroaryl group to a biscarbazole form, and superior properties in terms of efficiency were obtained by expanding the HOMO and thereby enhancing a hole transfer ability. When comparing Comparative Examples 30 and 31 of Table 18 with the organic light emitting devices of the present application, it was identified that, when having dibenzothiophene as the heterocyclic compound of Chemical Formula 24 of the present application, stronger aromaticity was obtained compared to dibenzofuran, and accordingly, properties of longer lifetime were obtained due to structural stability.

When comparing Comparative Examples 28 and 29 of Table 18 with the organic light emitting devices of the present application, it was identified that inhibiting reactivity by introducing a substituent to the number 4 carbon, a position having relatively favorable reactivity, in the dibenzothiophene was also a factor resulting in properties of long lifetime.

In addition, Table 22 and Table 23 made measurements by varying a dopant concentration, and in a general light emitting device, driving voltage and efficiency decrease and a lifetime increases as the dopant concentration decreases, and as the dopant concentration increases, an effect of increasing efficiency may be expected due to increased probability of energy transfer from a host to the dopant, however, this is known to have disadvantages of inhibiting a lifetime of the device itself due to the occurrence of charge trapping, and increasing a driving voltage.

However, as identified in Table 22 and Table 23, efficiency in the low dopant doping was identified to have a similar or enhanced effect compared to in high doping in the present disclosure. This is considered to be due to the fact that the host used in the present disclosure (mix of Chemical Formula 1 and Chemical Formula 24 of the present application) had a favorable charge transfer ability, which facilitated energy transfer from the host to the dopant even in low doping contributing to an increase in the efficiency and the lifetime, and accordingly, an advantage of using a small dopant amount when using the dopant together with the host used in the present disclosure was identified.

REFERENCE NUMERAL

100: Substrate
200: Anode

300: Organic Material Layer
301: Hole Injection Layer
302: Hole Transfer Layer
303: Light Emitting Layer
304: Hole Blocking Layer
305: Electron Transfer Layer
306: Electron Injection Layer
400: Cathode

The invention claimed is:

1. An organic light emitting device comprising:

a first electrode;

a second electrode; and one or more organic material layers provided between the first electrode and the second electrode, wherein one or more layers of the organic material layers comprise a heterocyclic compound represented by the following Chemical Formula 1 and a heterocyclic compound represented by the following Chemical Formula 24:

[Chemical Formula 1]

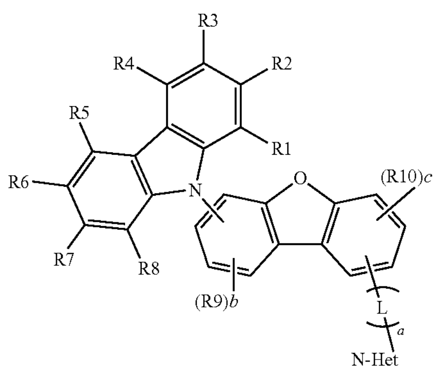

[Chemical Formula 24]

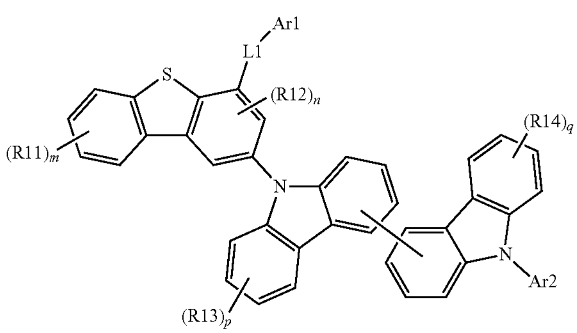

in Chemical Formulae 1 and 24,

N-Het is a monocyclic or polycyclic heterocyclic group substituted or unsubstituted and comprising one or more Ns;

L and L1 are a direct bond; a substituted or unsubstituted C6 to C60 arylene group; or a substituted or unsubstituted C2 to C60 heteroarylene group, a is an integer of 1 to 3, and when a is 2 or greater, Ls are the same as or different from each other;

R1 to R14 are the same as or different from each other, and each independently selected from the group consisting of hydrogen; deuterium; halogen; a cyano group; a substituted or unsubstituted C1 to C60 alkyl group; a substituted or unsubstituted C2 to C60 alkenyl group; a substituted or unsubstituted C2 to C60 alkynyl group; a substituted or unsubstituted C2 to C60 alkoxy group; a substituted or unsubstituted C3 to C60 cycloalkyl group; a substituted or unsubstituted C2 to C60 heterocycloalkyl group; a substituted or unsubstituted C6 to C60 aryl group; a substituted or unsubstituted C2 to C60 heteroaryl group; a substituted or unsubstituted phosphine oxide group; and a substituted or unsubstituted amine group, or two or more groups adjacent to each other bond to each other to form a substituted or unsubstituted C6 to C60 aromatic hydrocarbon ring or a substituted or unsubstituted C2 to C60 heteroring;

b and c are each an integer of 1 to 3;

when b is 2 or greater, R9s are the same as or different from each other, and when c is 2 or greater, R10s are the same as or different from each other;

m, p and q are an integer of 0 to 4;

n is an integer of 0 to 2;

when m is 2 or greater, R11s are the same as or different from each other, when n is an integer of 2, R12s are the same as or different from each other, when p is 2 or greater, R13s are the same as or different from each other, and when q is 2 or greater, R14s are the same as or different from each other;

Ar1 is a substituted or unsubstituted C6 to C60 aryl group; or a C2 to C60 heteroaryl group substituted or unsubstituted and comprising at least one of S and O; and Ar2 is a substituted or unsubstituted C6 to C60 aryl group; or a substituted or unsubstituted C2 to C60 heteroaryl group.

2. The organic light emitting device of claim 1, wherein Chemical Formula 1 is represented by the following Chemical Formula 2 or Chemical Formula 3:

[Chemical Formula 2]

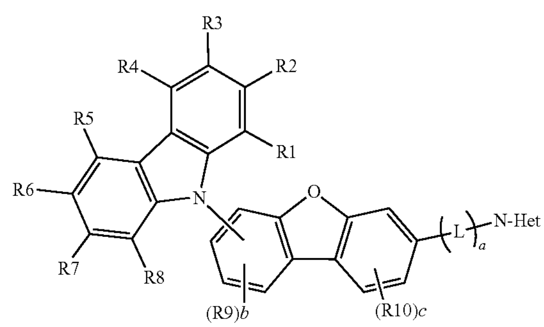

[Chemical Formula 3]

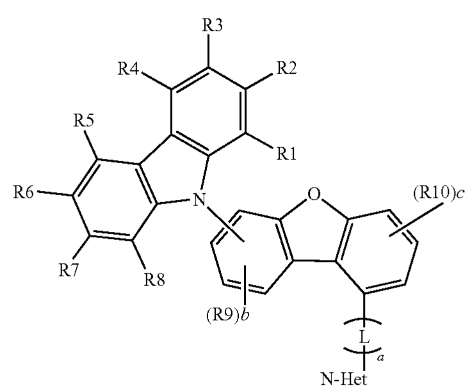

in Chemical Formulae 2 and 3,

R1 to R10, L, N-Het, a, b and c have the same definitions as in Chemical Formula 1.

3. The organic light emitting device of claim 1, wherein Chemical Formula 1 is represented by one of the following Chemical Formulae 12 to 14:

[Chemical Formula 12]

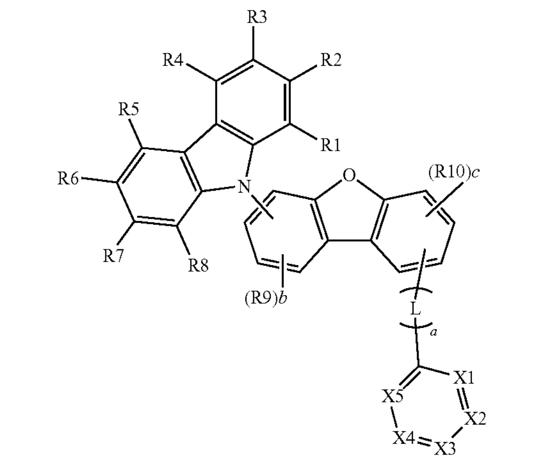

[Chemical Formula 13]

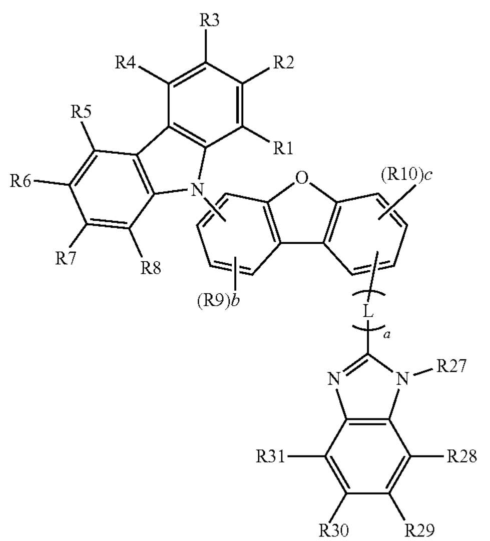

[Chemical Formula 14]

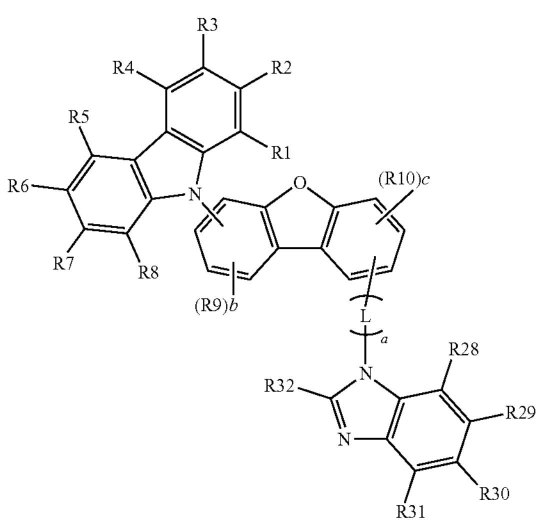

in Chemical Formulae 12 to 14,

X1 is CR21 or N, X2 is CR22 or N, X3 is CR23 or N, X4 is CR24 or N, X5 is CR25 or N, and at least one of X1 to X5 is N; and R21 to R25 and R27 to R32 are the same as or different from each other, and each independently selected from the group consisting of hydrogen; deuterium; halogen; a cyano group; a substituted or unsubstituted C1 to C60 alkyl group; a substituted or unsubstituted C2 to C60 alkenyl group; a substituted or unsubstituted C2 to C60 alkynyl group; a substituted or unsubstituted C2 to C60 alkoxy group; a substituted or unsubstituted C3 to C60 cycloalkyl group; a substituted or unsubstituted C2 to C60 heterocycloalkyl group; a substituted or unsubstituted C6 to C60 aryl group; a substituted or unsubstituted C2 to C60 heteroaryl group; a substituted or unsubstituted phosphine oxide group; and a substituted or unsubstituted amine group, or two or more groups adjacent to each other bond to each other to form a substituted or unsubstituted C6 to C60 aromatic hydrocarbon ring or a substituted or unsubstituted C2 to C60 heteroring.

4. The organic light emitting device of claim 3, wherein

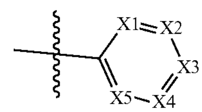

of Chemical Formula 12 is represented by one of the following Chemical Formulae 15 to 18:

[Chemical Formula 15]

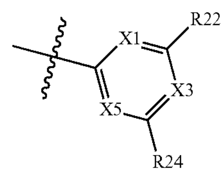

[Chemical Formula 16]

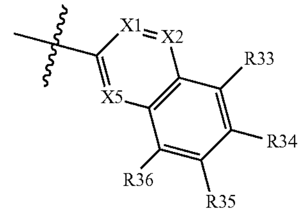

[Chemical Formula 17]

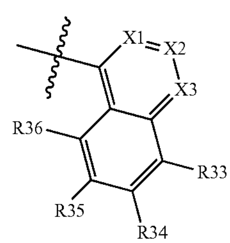

[Chemical Formula 18]

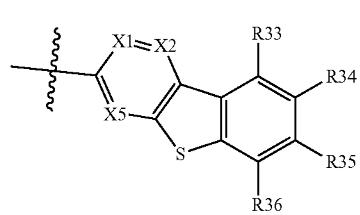

in Chemical Formula 15, one or more of X1, X3 and X5 are N, and the rest have the same definitions as in Chemical Formula 12;

in Chemical Formula 16, one or more of X1, X2 and X5 are N, and the rest have the same definitions as in Chemical Formula 12;

in Chemical Formula 17, one or more of X1 to X3 are N, and the rest have the same definitions as in Chemical Formula 12;

in Chemical Formula 18, one or more of X1, X2 and X5 are N, and the rest have the same definitions as in Chemical Formula 12; and R22, R24 and R33 to R36 are the same as or different from each other, and each independently selected from the group consisting of hydrogen; deuterium; halogen; a cyano group; a substituted or unsubstituted C1 to C60 alkyl group; a substituted or unsubstituted C2 to C60 alkenyl group; a substituted or unsubstituted C2 to C60 alkynyl group; a substituted or unsubstituted C2 to C60 alkoxy group; a substituted or unsubstituted C3 to C60 cycloalkyl group; a substituted or unsubstituted C2 to C60 heterocycloalkyl group; a substituted or unsubstituted C6 to C60 aryl group; a substituted or unsubstituted C2 to C60 heteroaryl group; a substituted or unsubstituted phosphine oxide group; and a substituted or unsubstituted amine group, or two or more groups adjacent to each other bond to each other to form a substituted or unsubstituted C6 to C60 aromatic hydrocarbon ring or a substituted or unsubstituted C2 to C60 heteroring.

5. The organic light emitting device of claim 4, wherein Chemical Formula 15 is selected from among the following structural formulae:

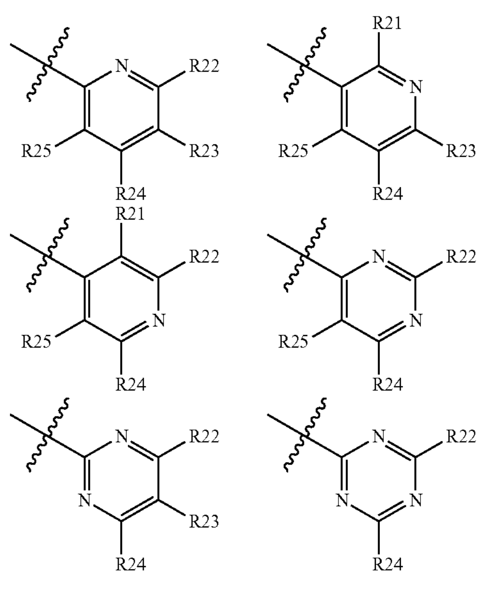

in the structures,

R21 to R25 have the same definitions as in Chemical Formula 15.

6. The organic light emitting device of claim 1, wherein Chemical Formula 24 is represented by any one of the following Chemical Formulae 25 to 28:

[Chemical Formula 25]

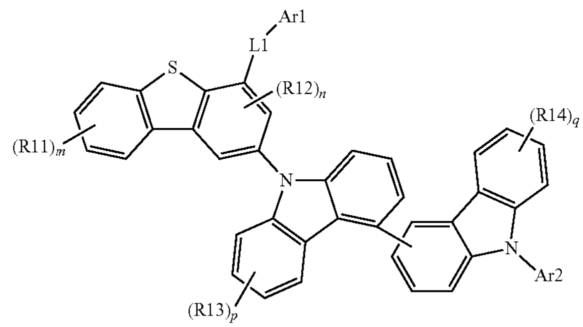

[Chemical Formula 26]

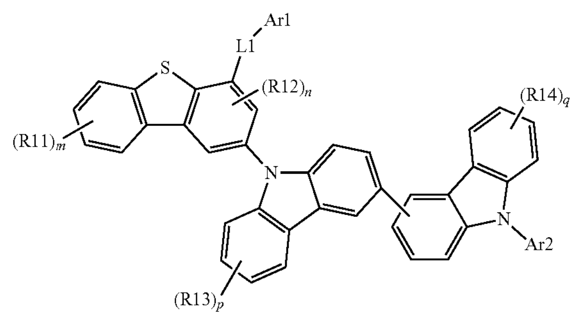

[Chemical Formula 27]

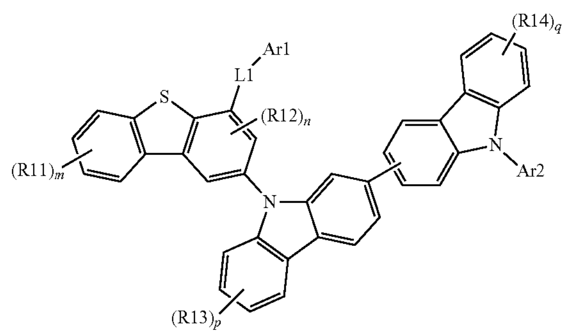

[Chemical Formula 28]

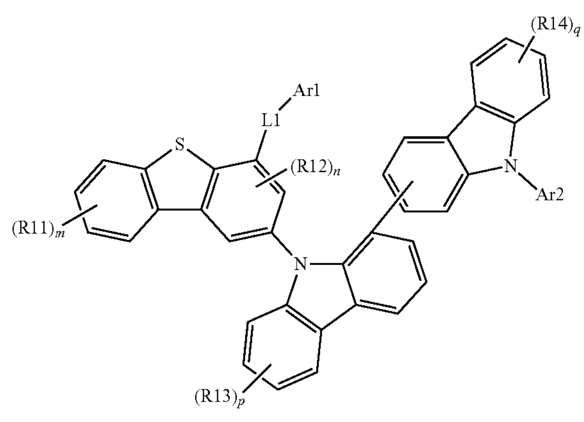

in Chemical Formulae 25 to 28,

R11 to R14, L1, Ar1, Ar2, m, n, p and q have the same definitions as in Chemical Formula 24.

7. The organic light emitting device of claim 1, wherein Art of Chemical Formula 24 is a C6 to C20 monocyclic or polycyclic aryl group unsubstituted or substituted with a C1 to C10 alkyl group; or a polycyclic C2 to C20 heteroaryl group comprising at least one of S and O; and
Ar2 of Chemical Formula 24 is a C6 to C20 aryl group.
8. The organic light emitting device of claim 1, wherein Chemical Formula 1 is represented by any one of compounds of the following Group 1 and Group 2:
[Group 1]
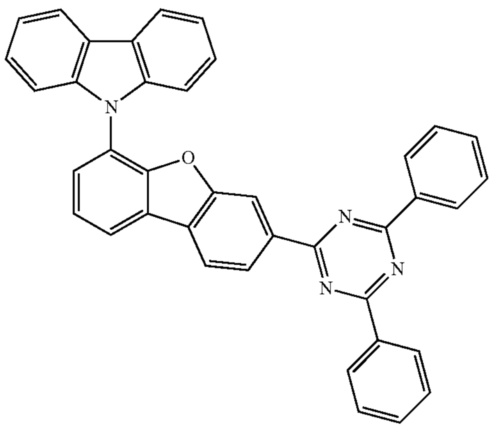
1
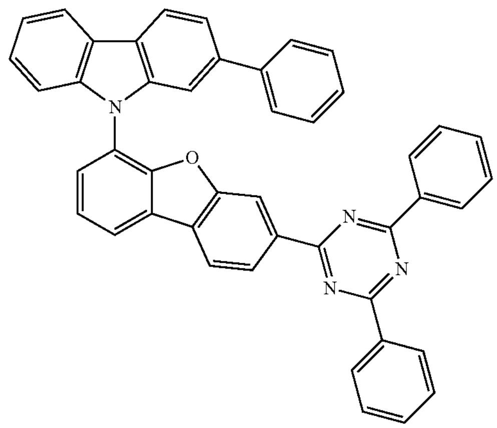
2
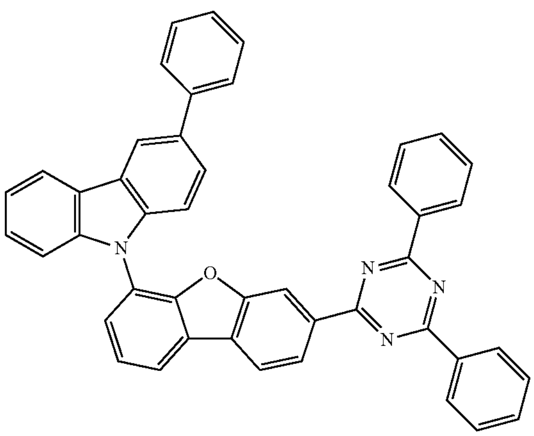
3
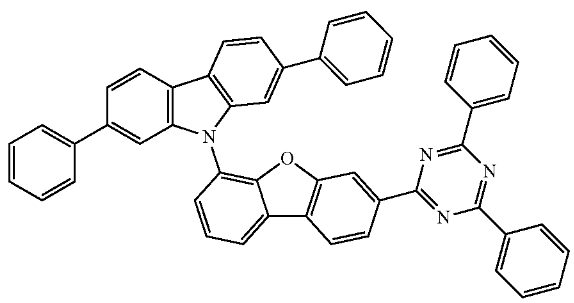
4
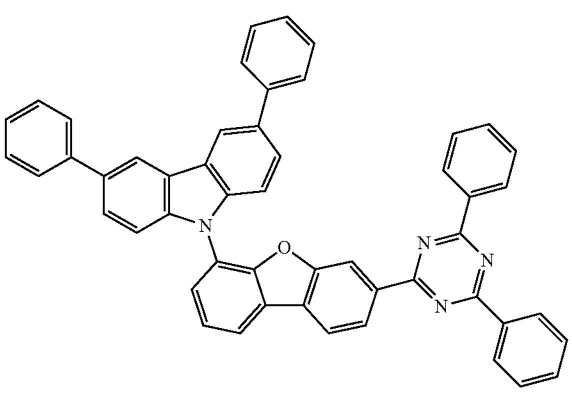
5
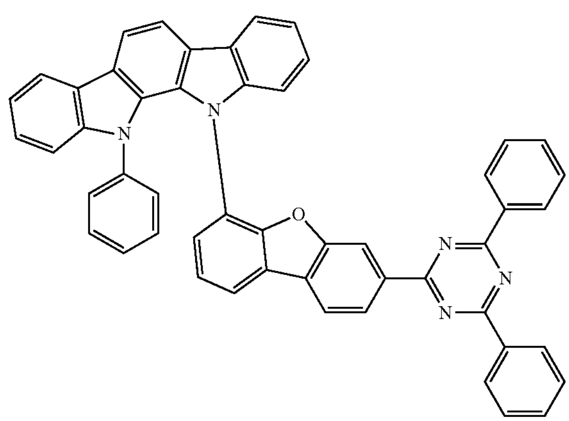
6

-continued
7
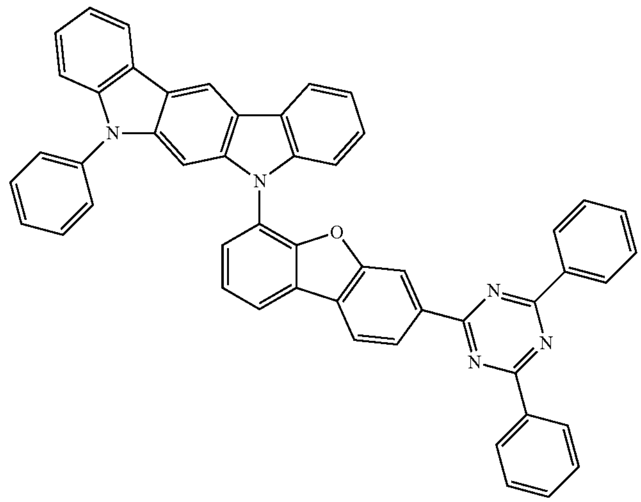
8
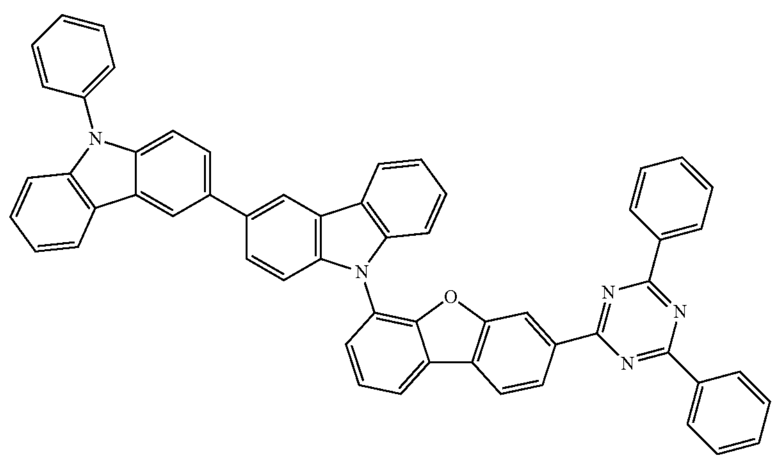
9
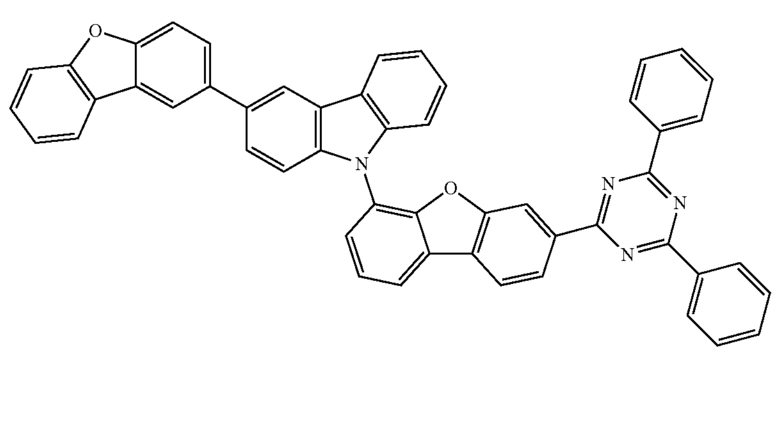

-continued
10
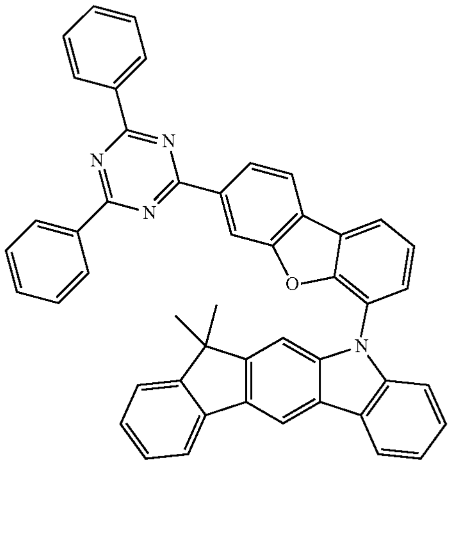
11
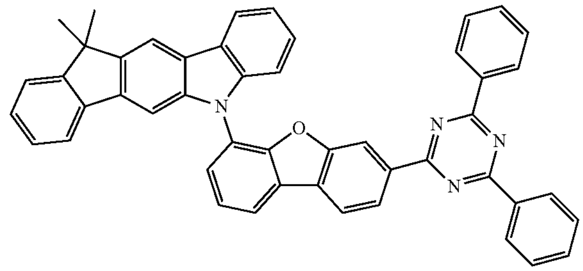
12
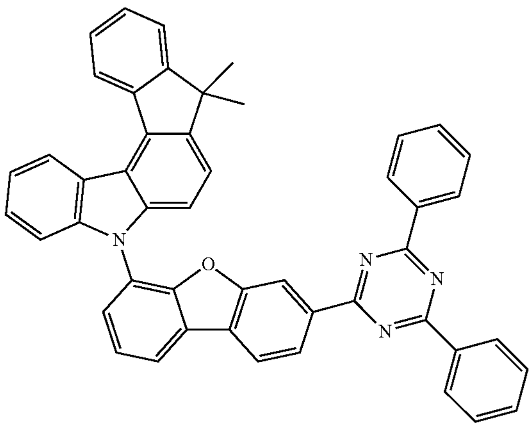
13
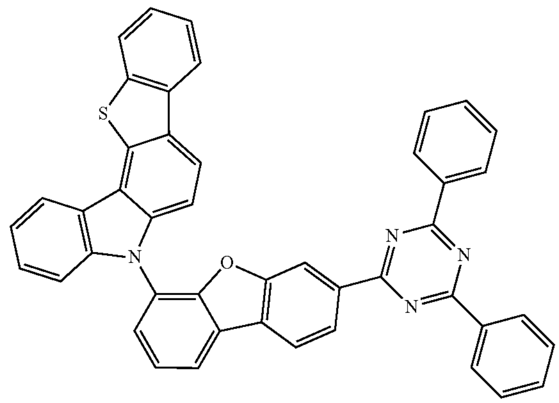
14
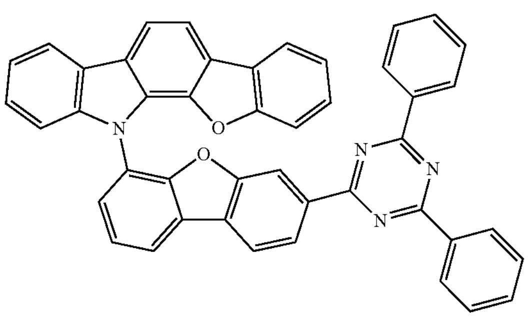
15
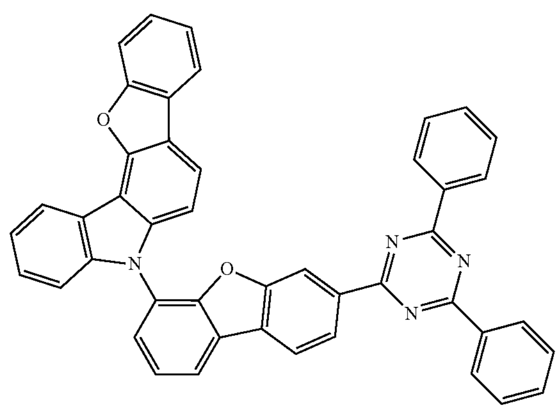

-continued
16
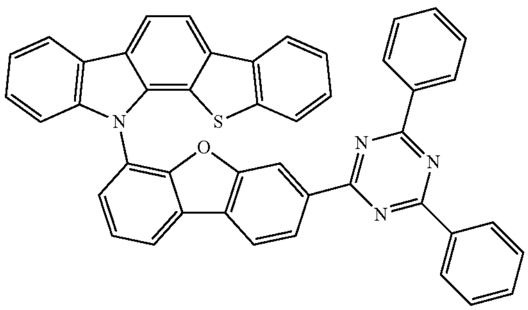
17
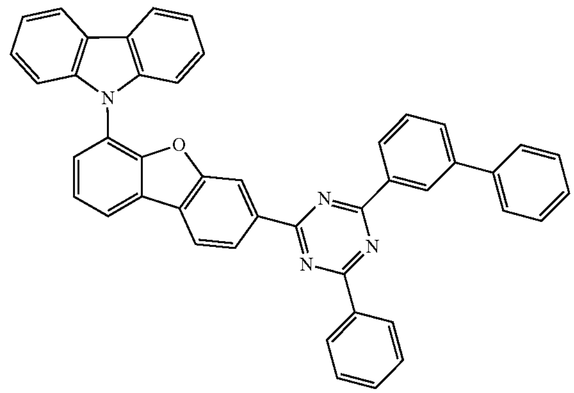
18
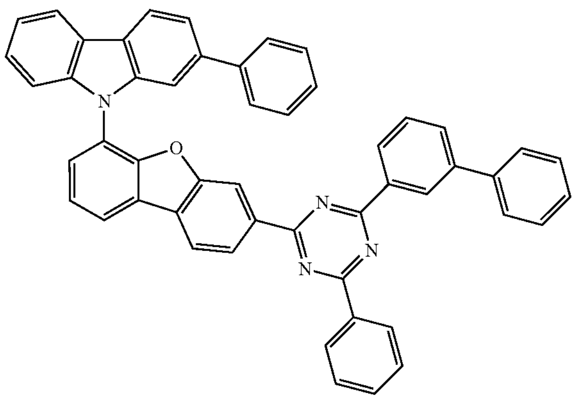
19
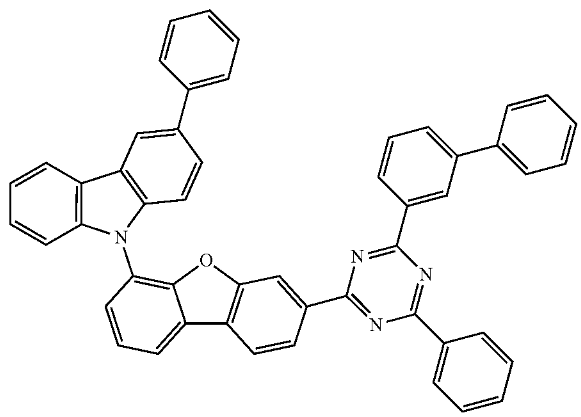
20
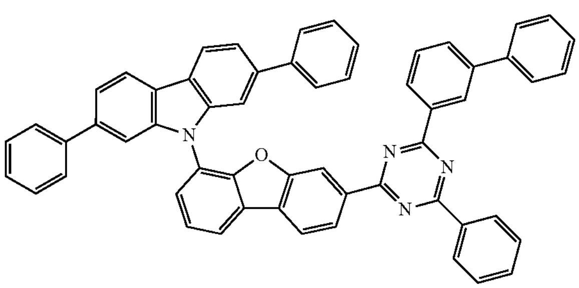
21
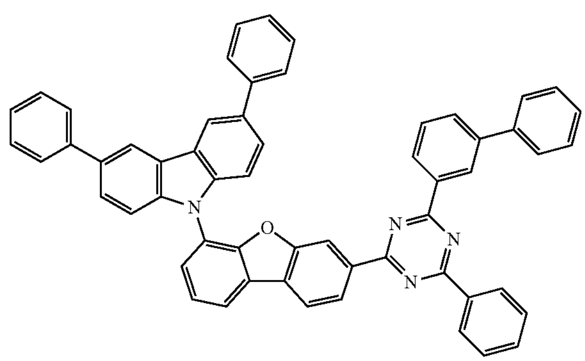

-continued
22
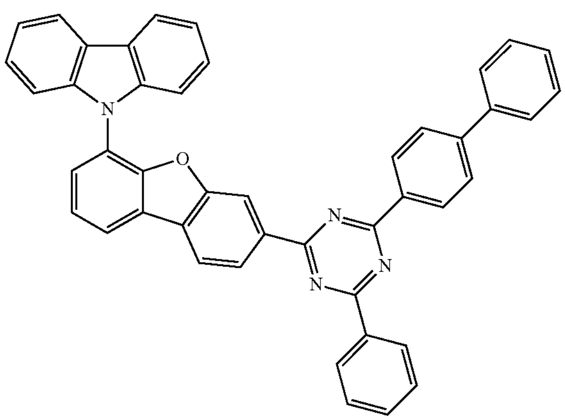
23
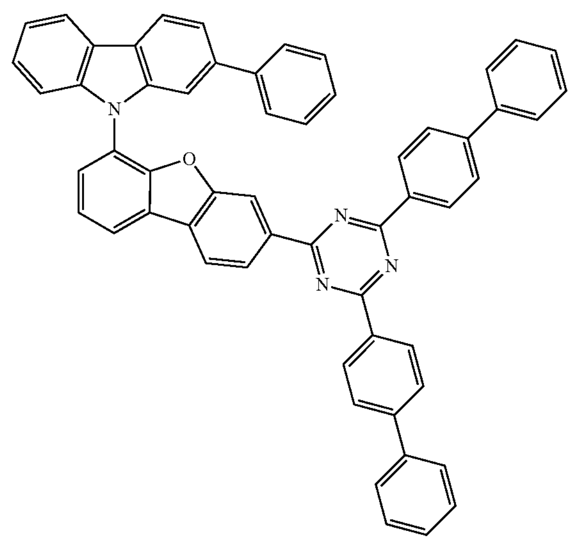
24
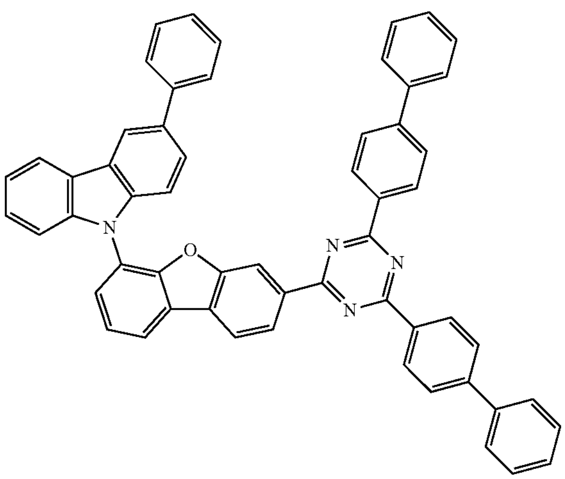
25
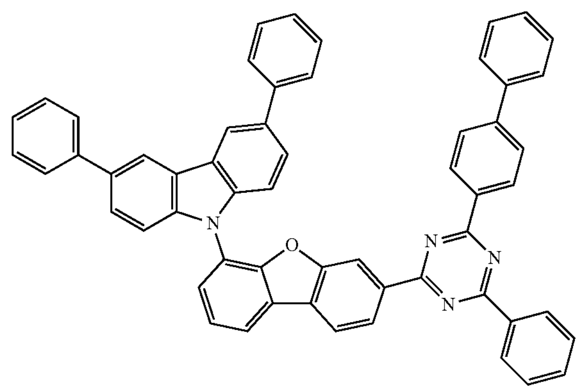
26
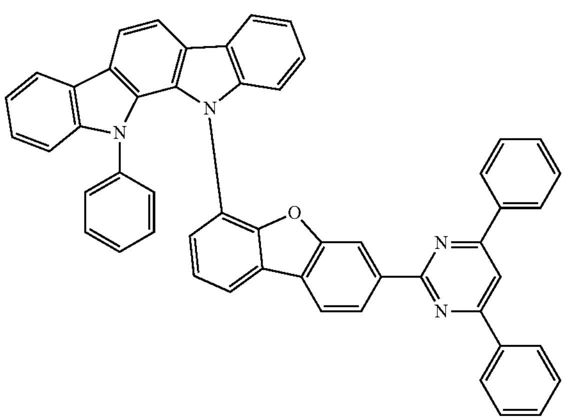
27
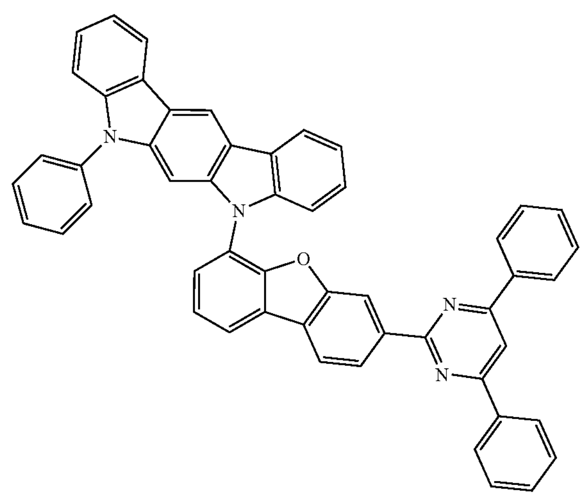

-continued
28
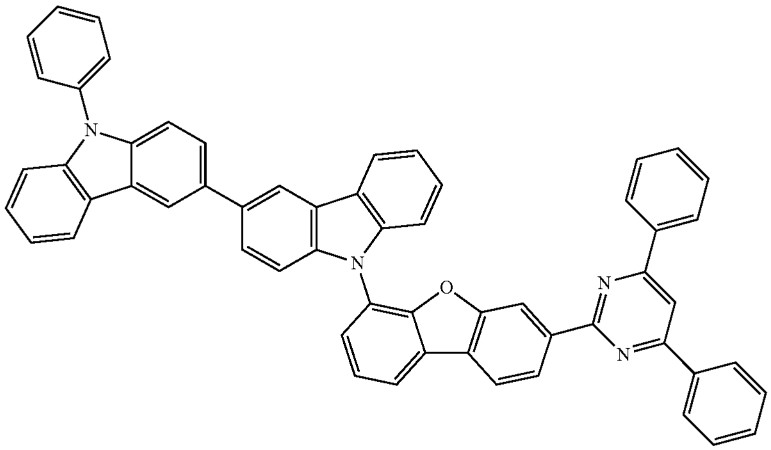
29
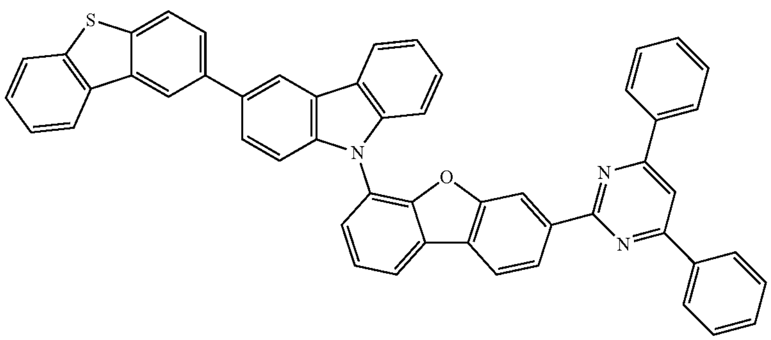
30
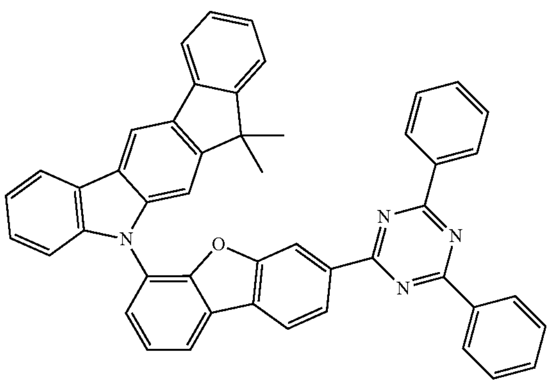
31
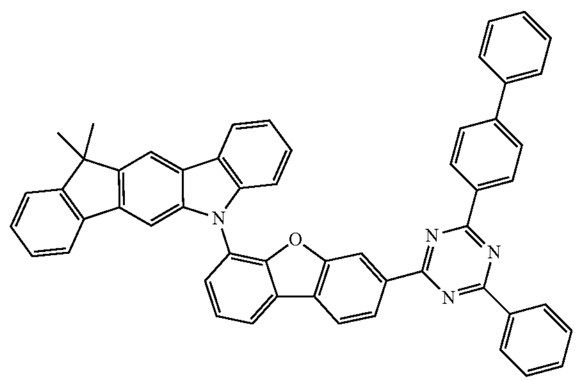
32
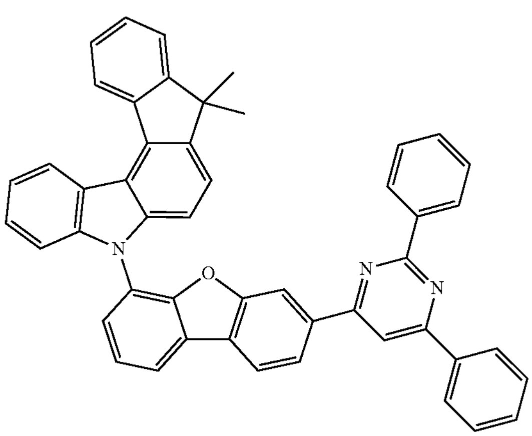
33
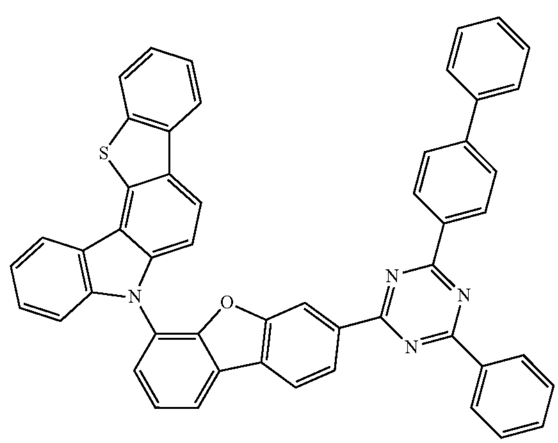

-continued
34
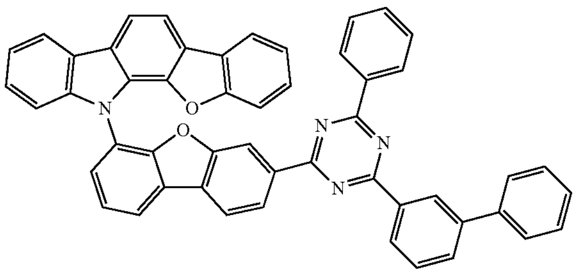
35
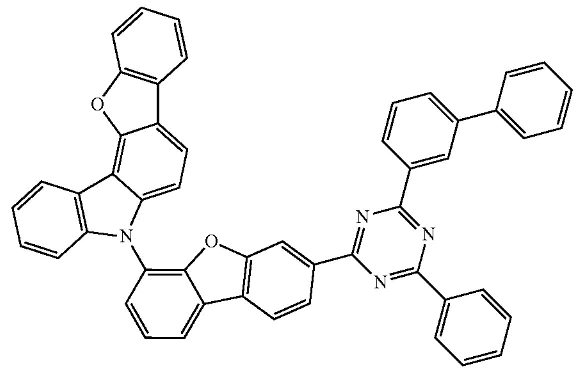
36
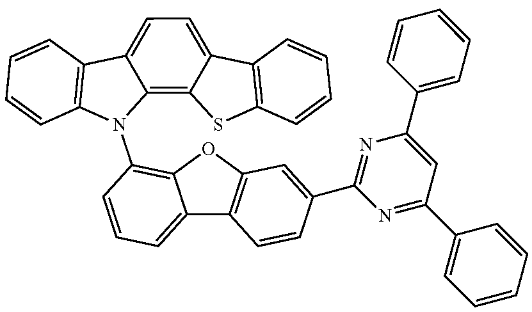
37
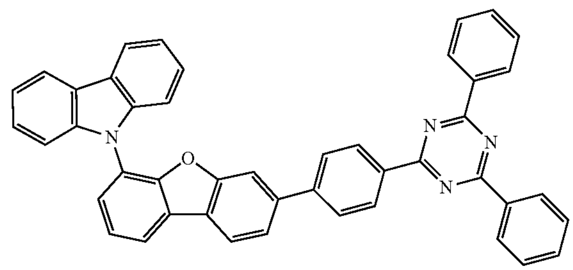
38
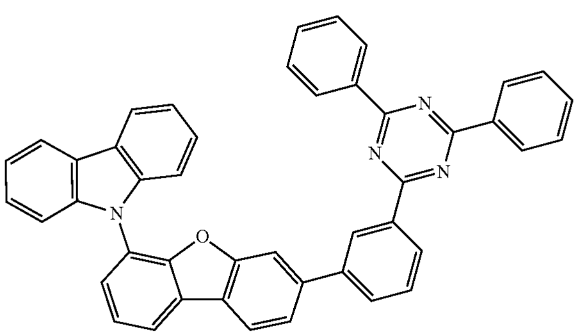
39
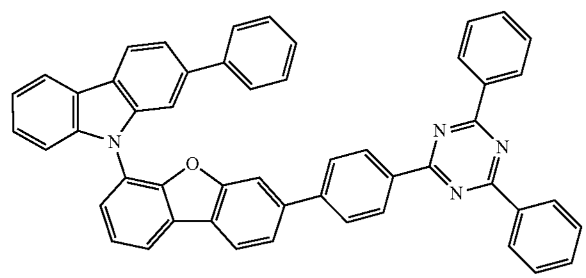
40
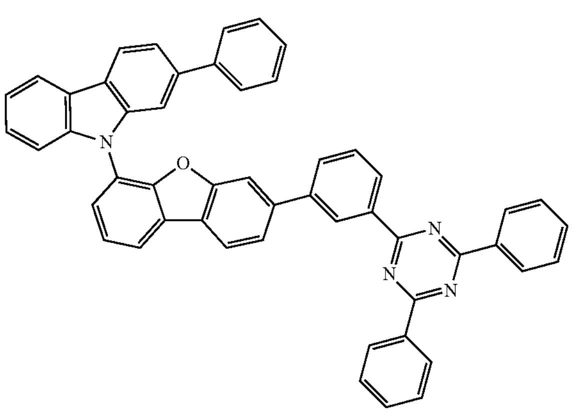
41
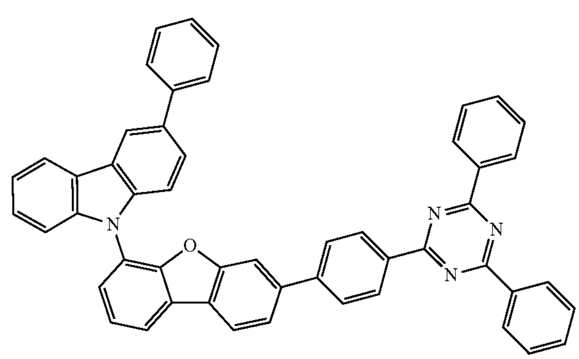

-continued
42
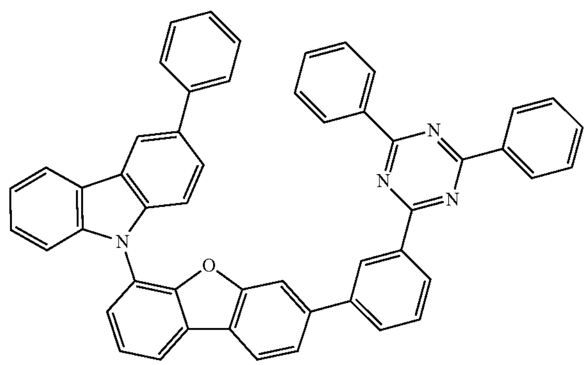
43
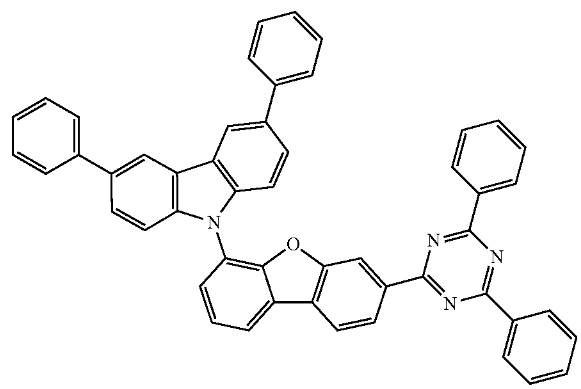
44
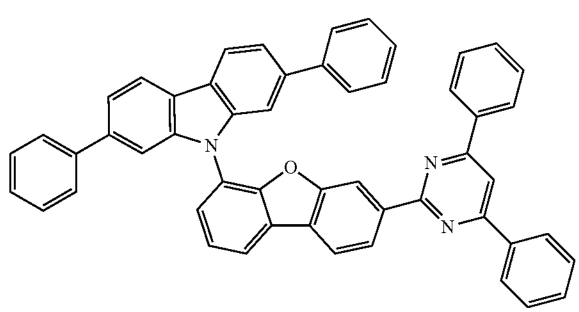
45
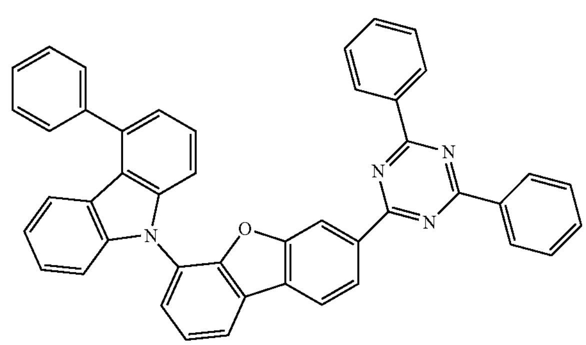
46
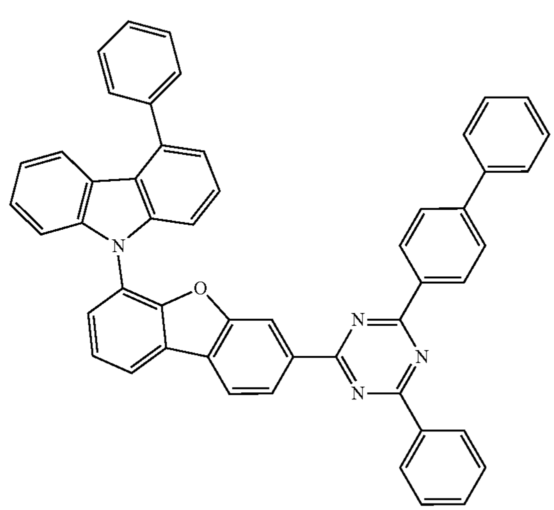
47
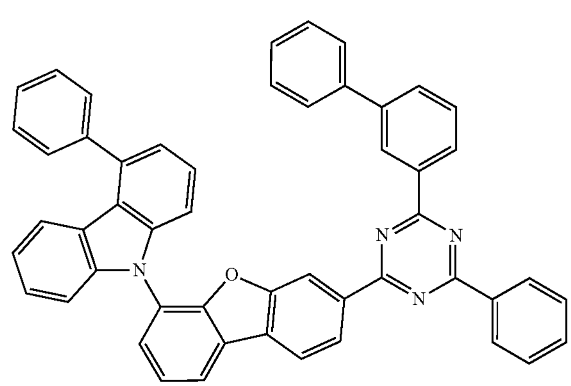

-continued
48
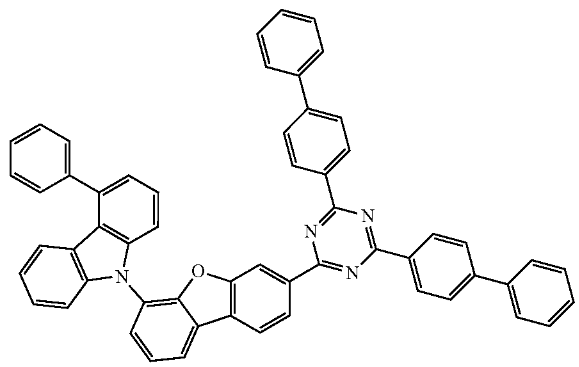
49
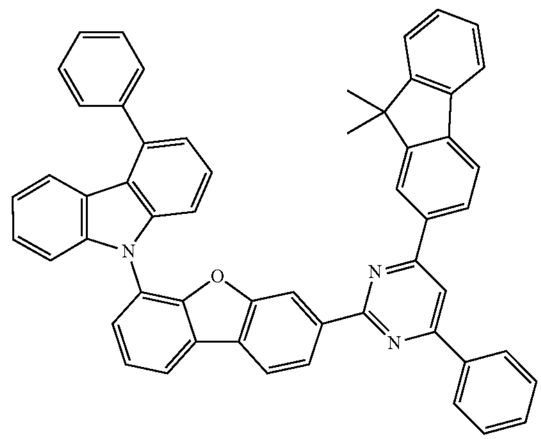
50
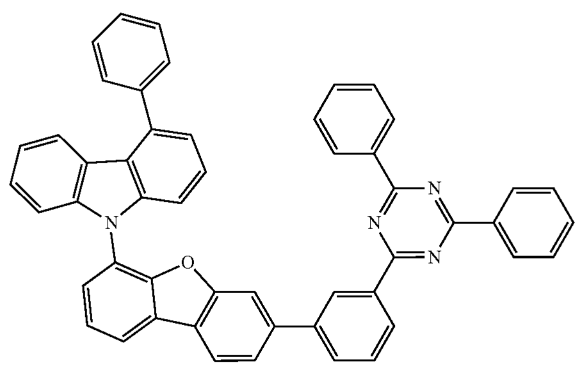
51
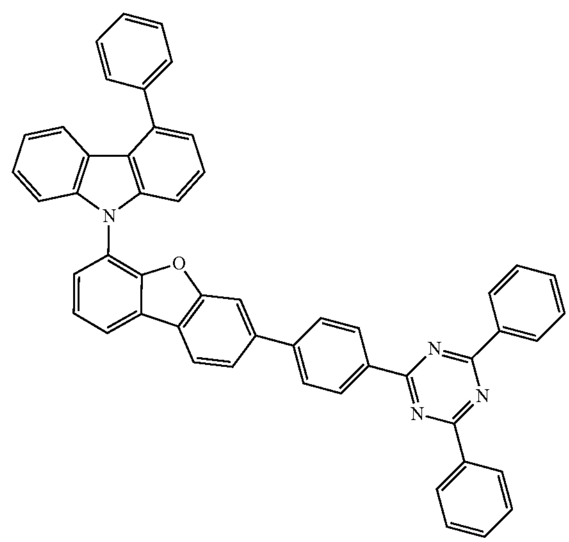
52
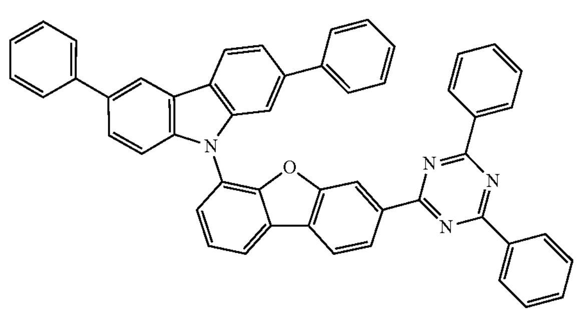
53
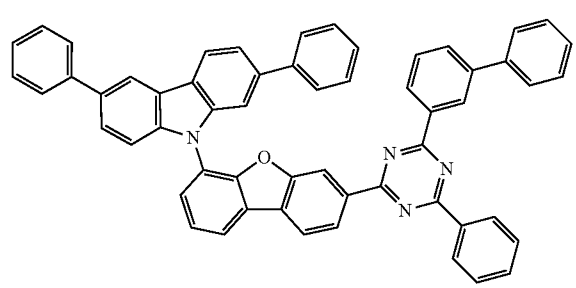

-continued
54
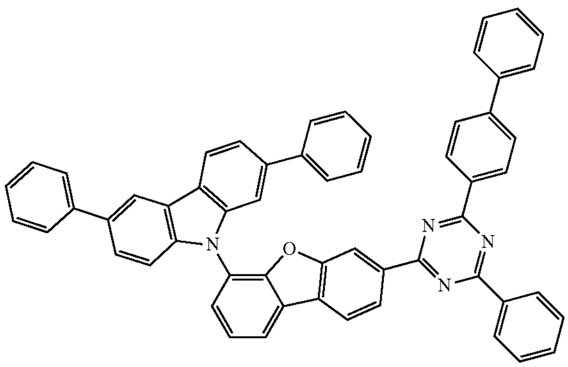
55
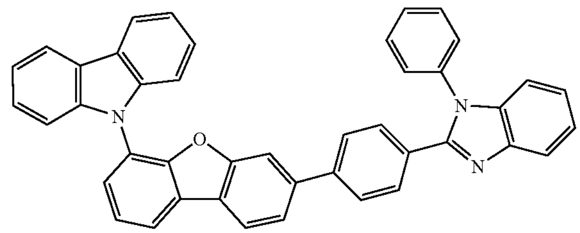
56
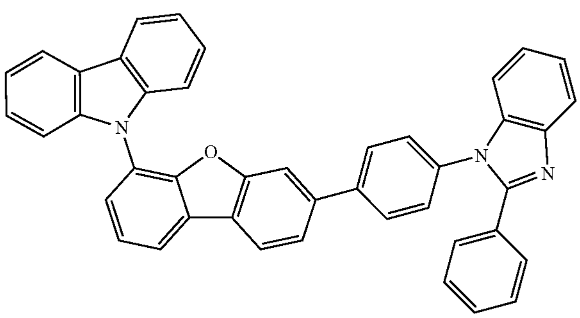
57
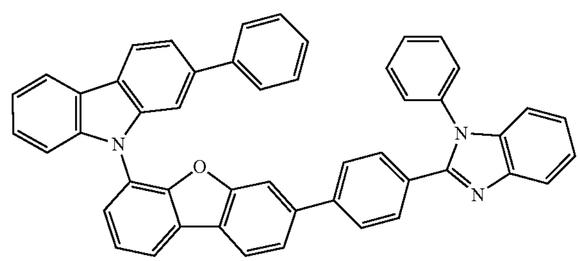
58
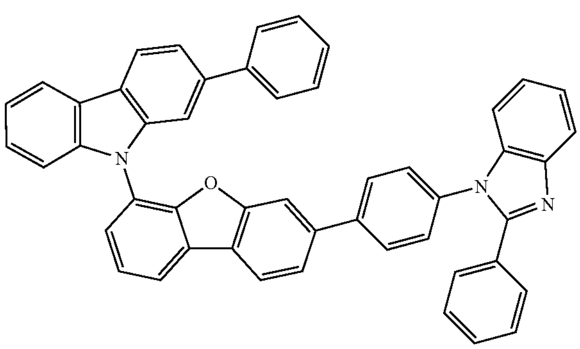
59
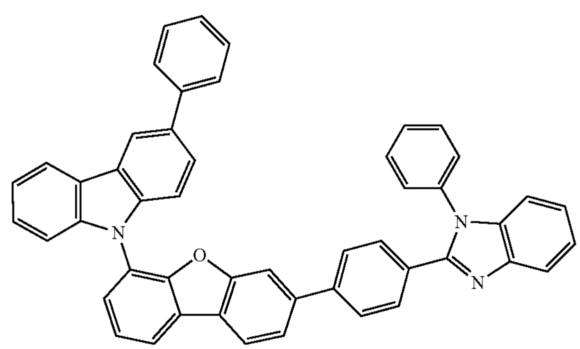
60
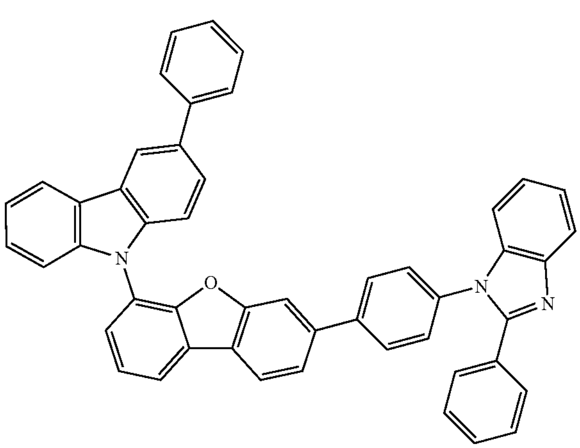
61
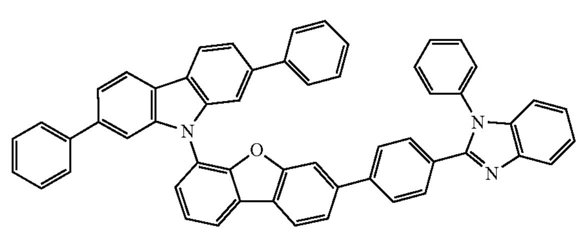

-continued
62
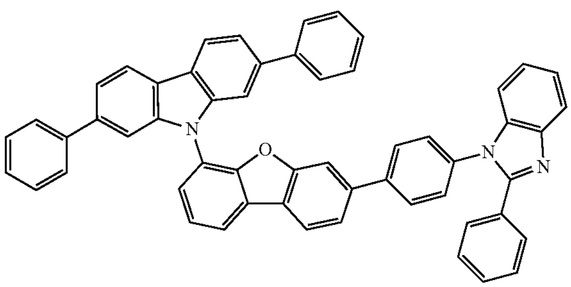
63
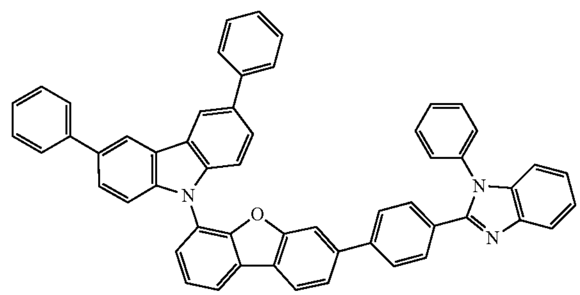
64
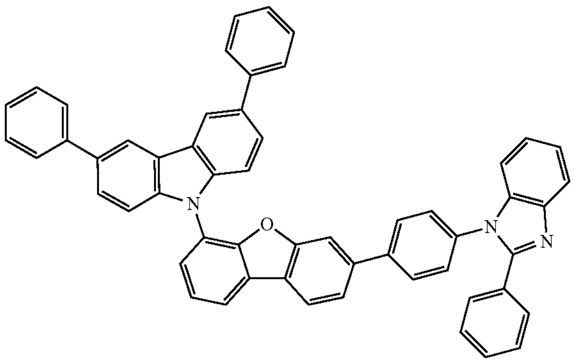
65
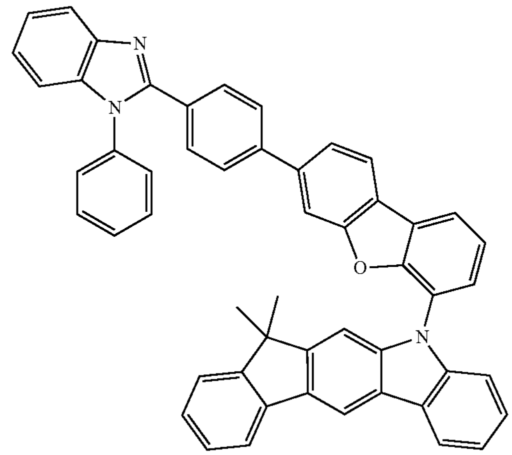
66
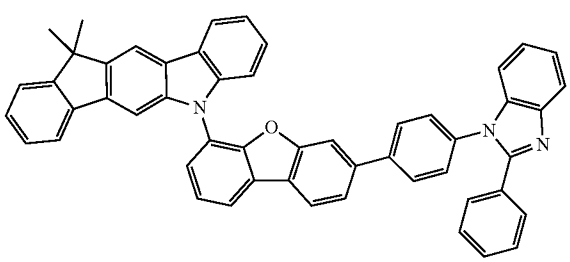
67
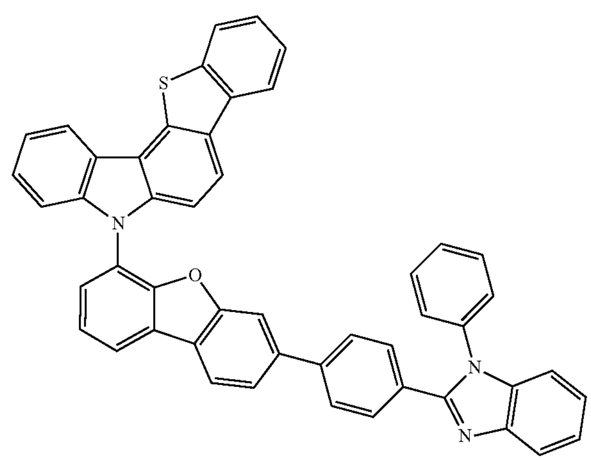
68
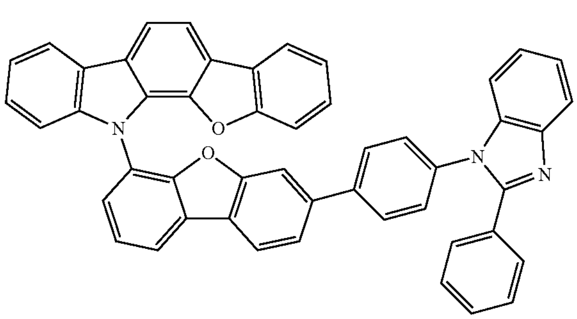
69
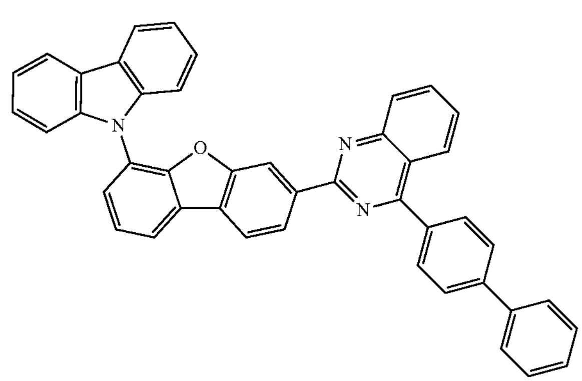

-continued
70
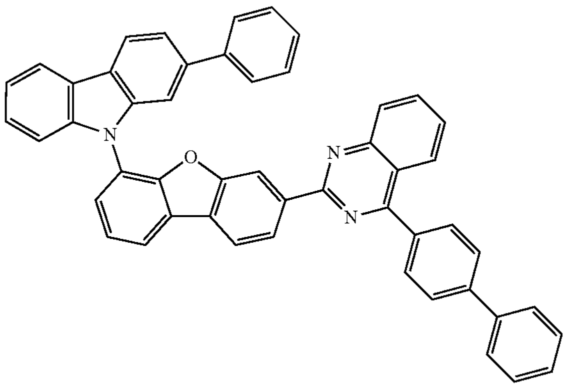
71
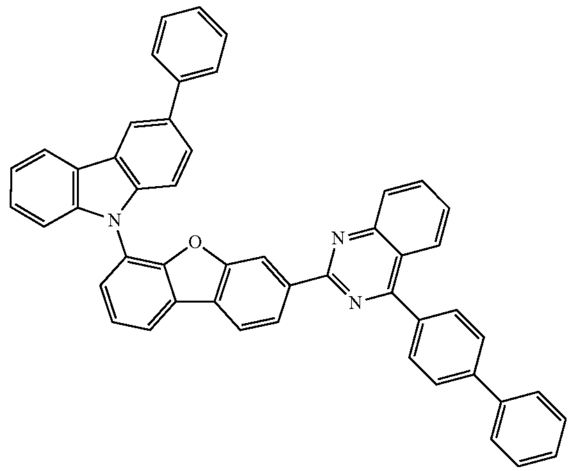
72
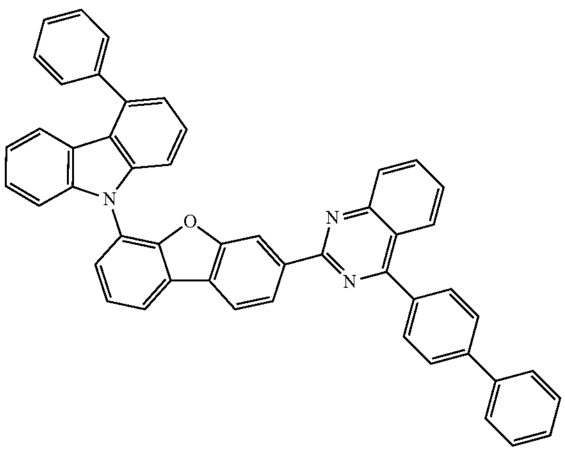
73
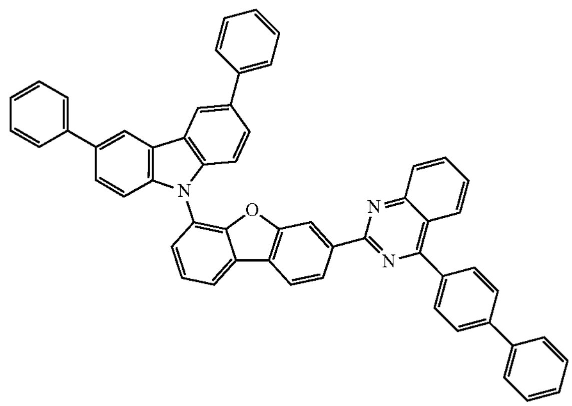
74
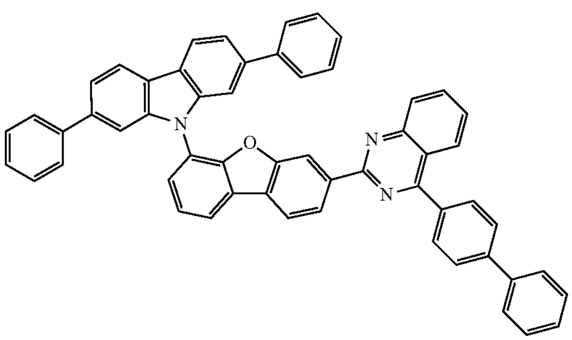
75
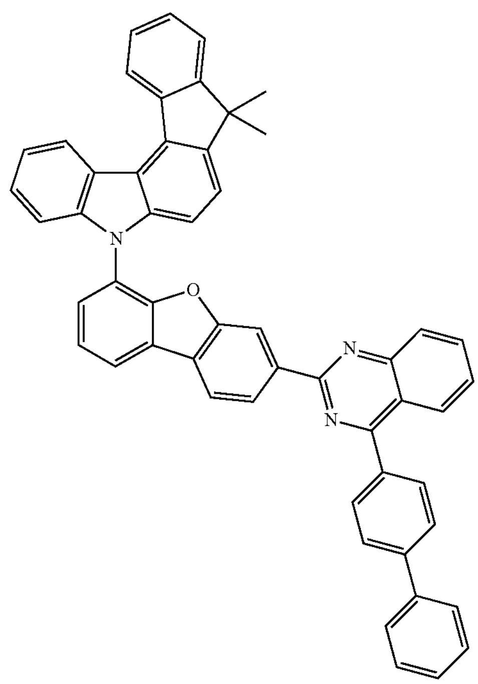

-continued
76
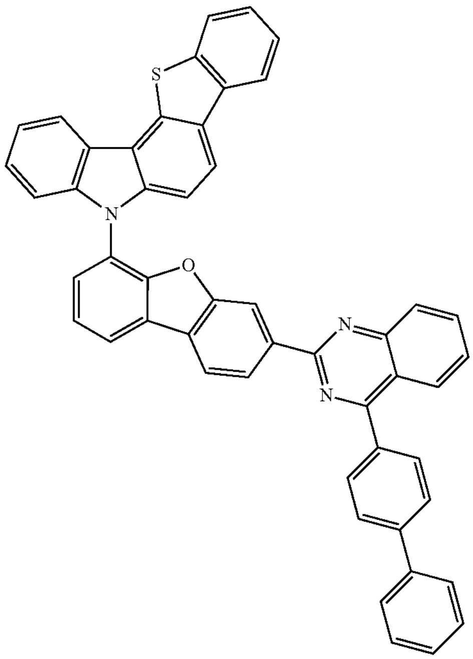
77
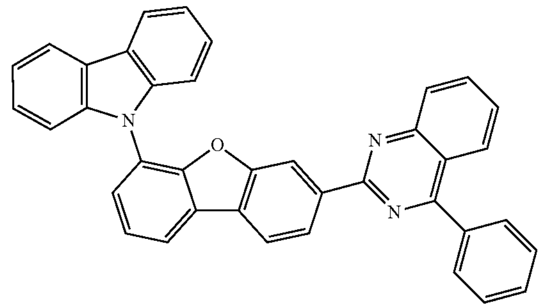
78
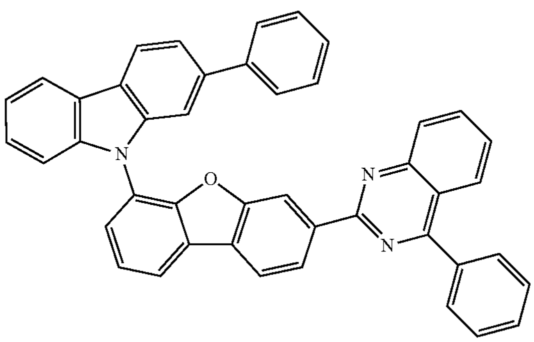
79
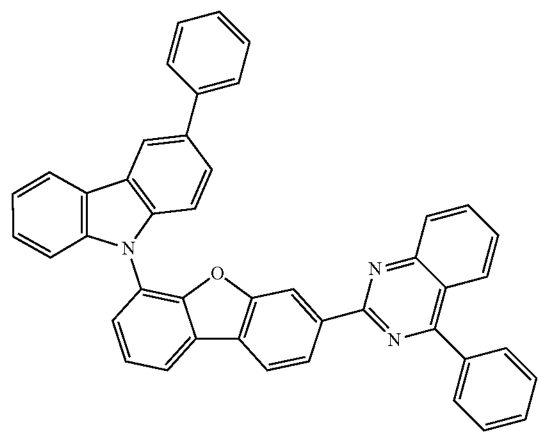
80
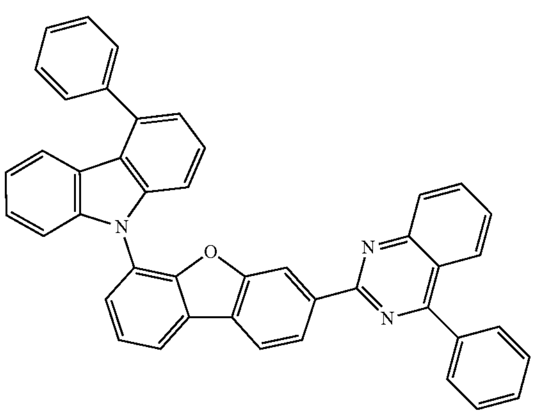
81
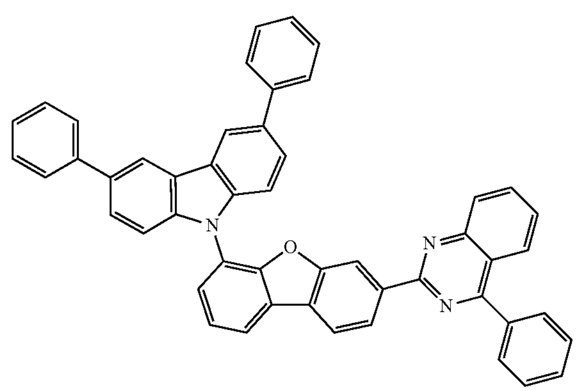

-continued
82
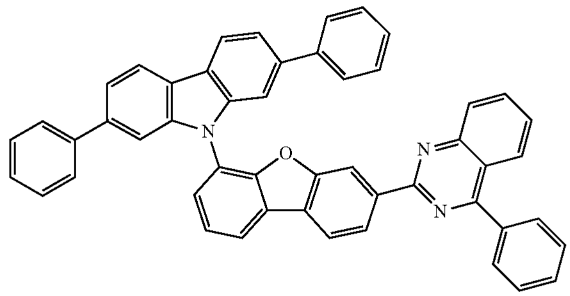
83
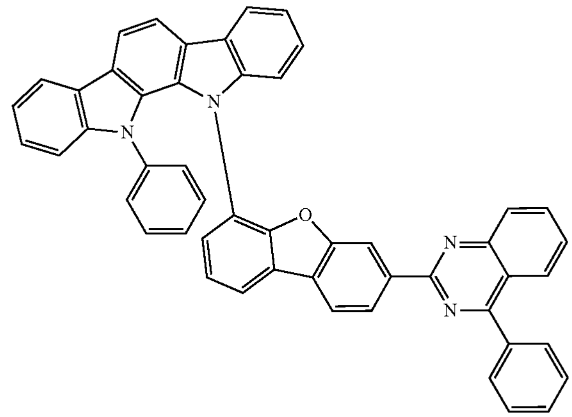
84
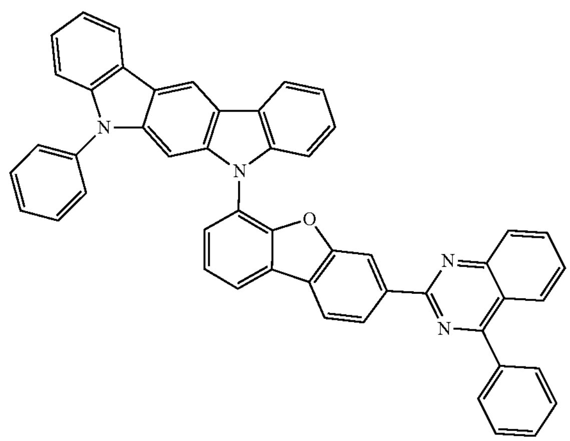
85
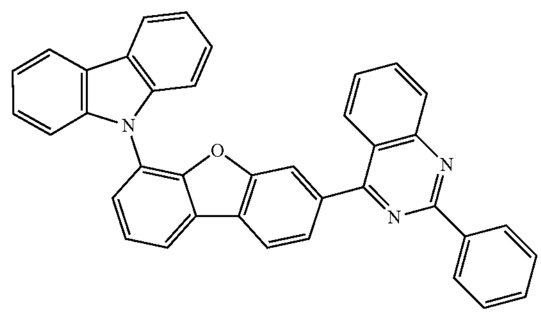
86
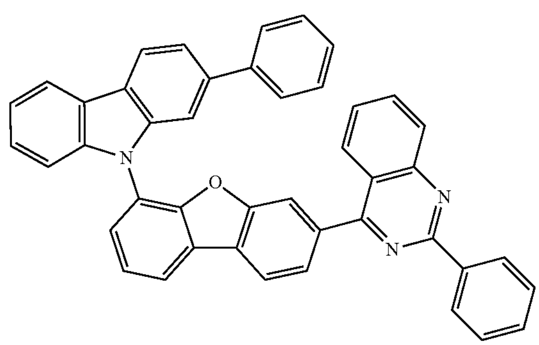
87
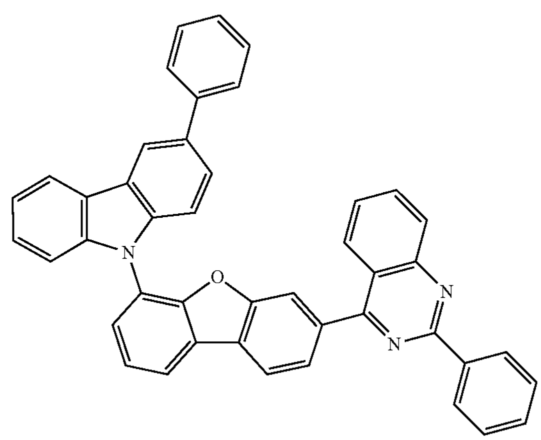

-continued
88
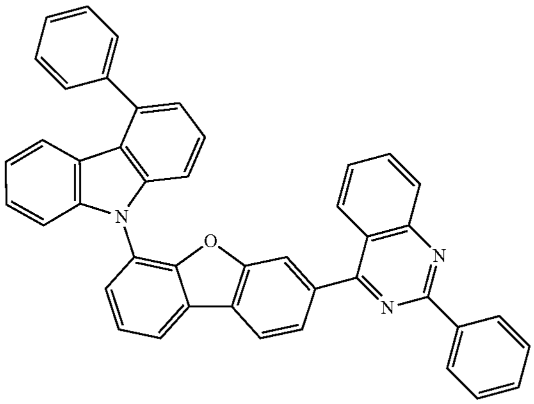
89
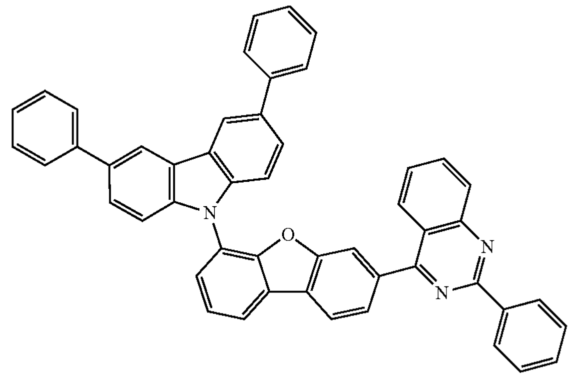
90
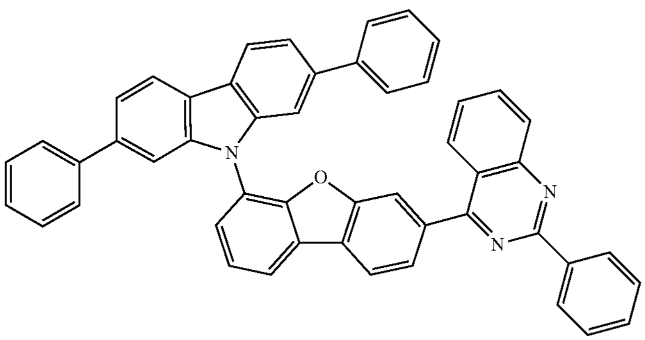
91
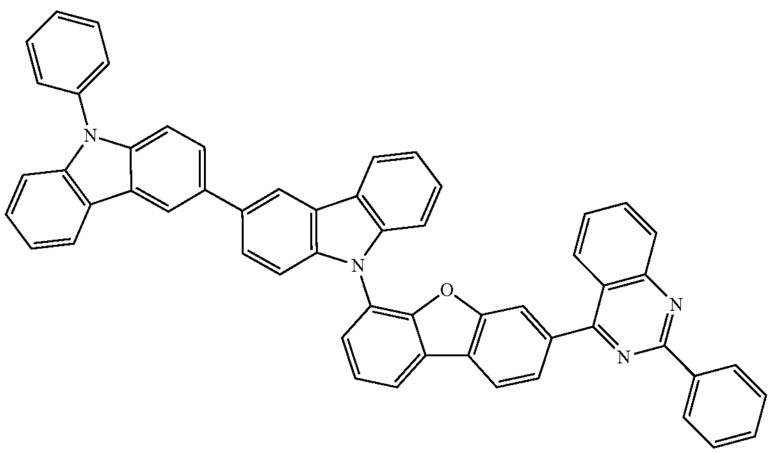
92
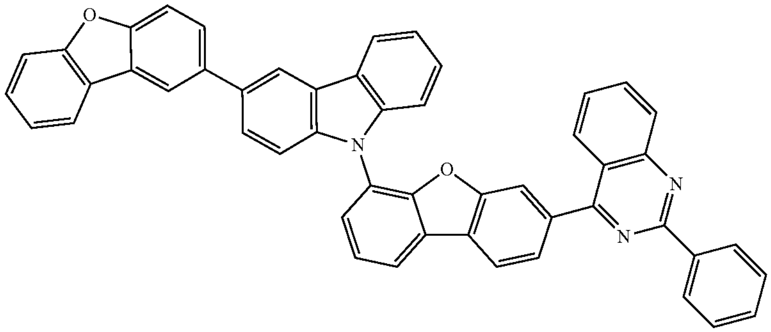

-continued
93
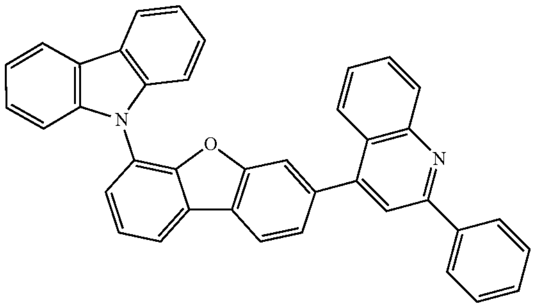
94
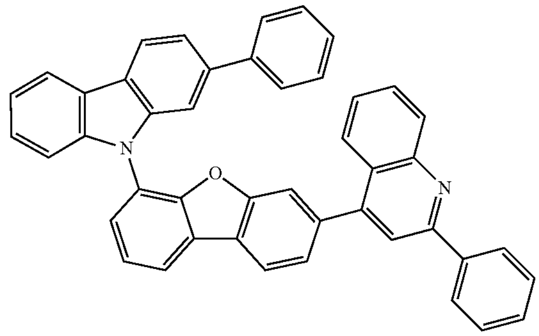
95
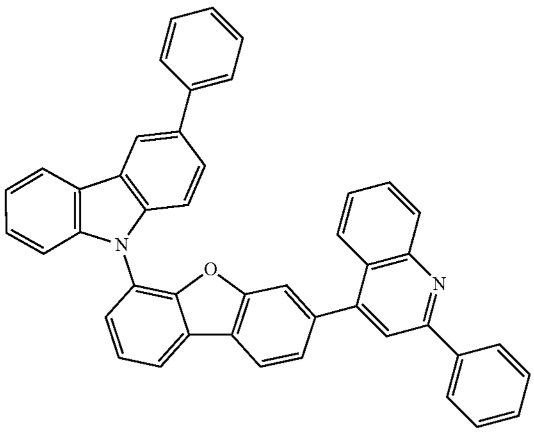
96
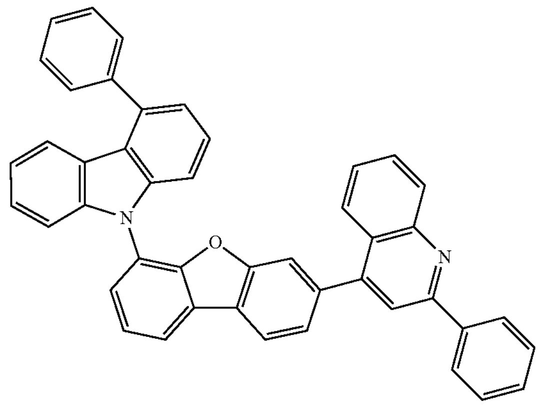
97
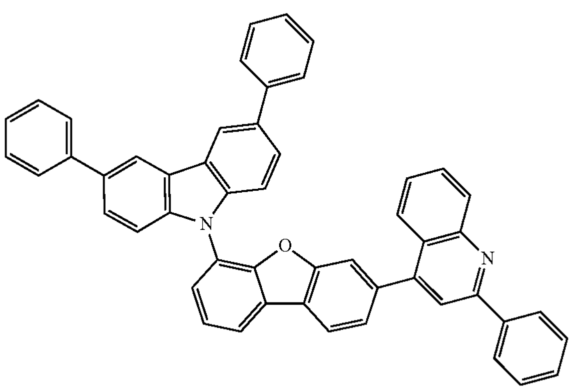
98
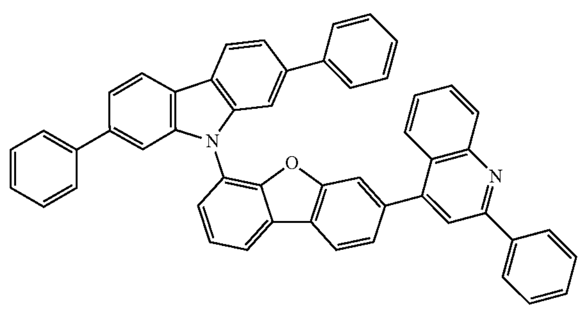
99
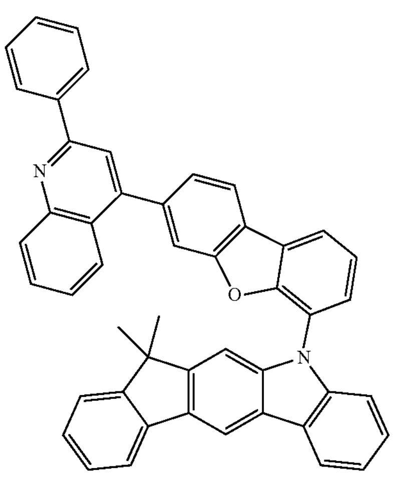
100
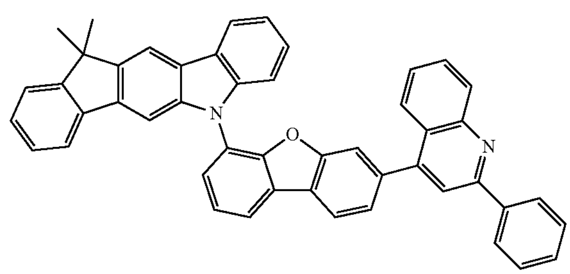

-continued
101
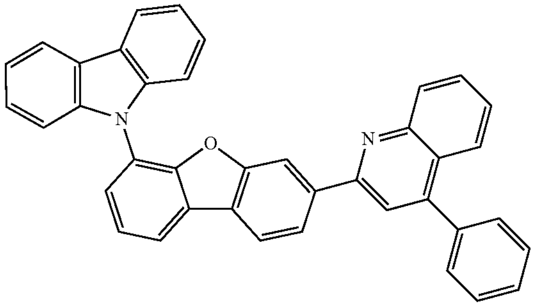
102
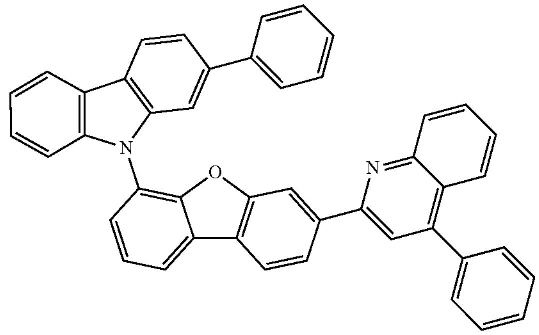
103
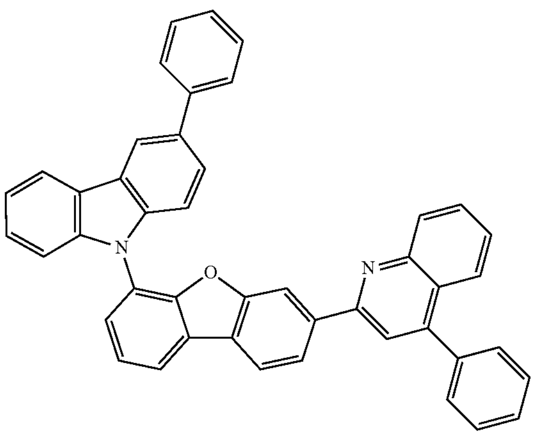
104
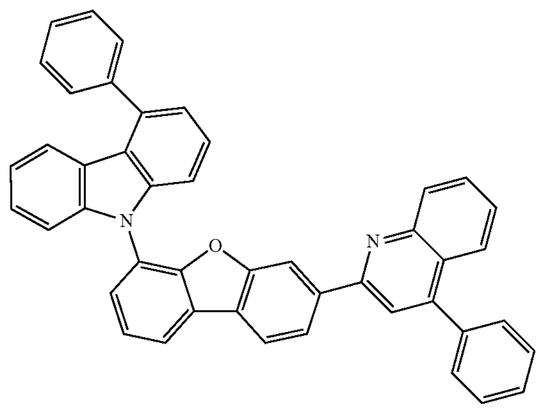
105
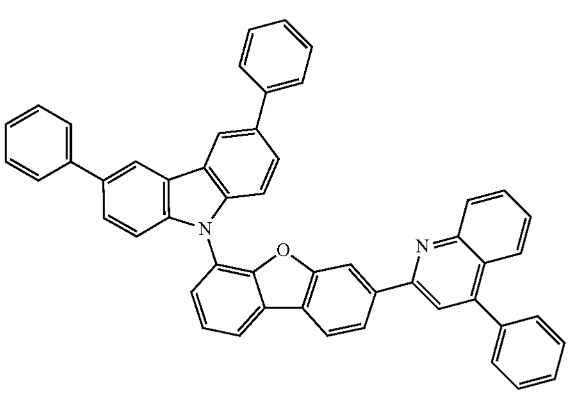
106
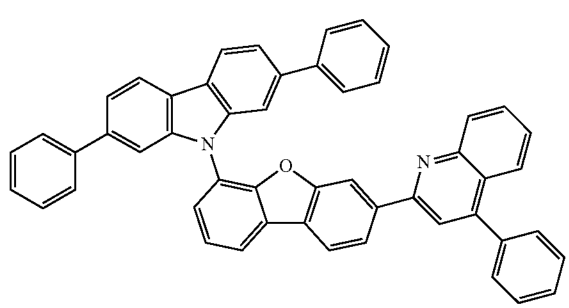

-continued
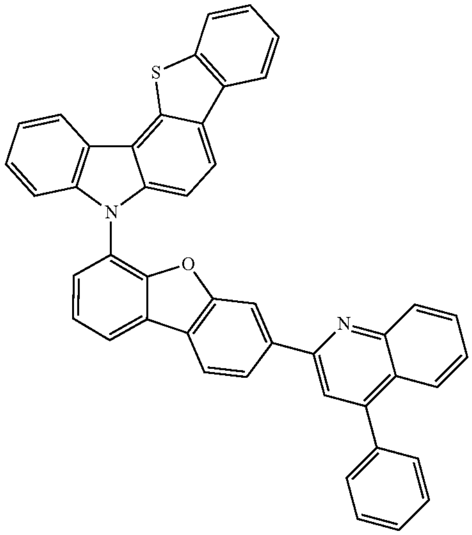
107
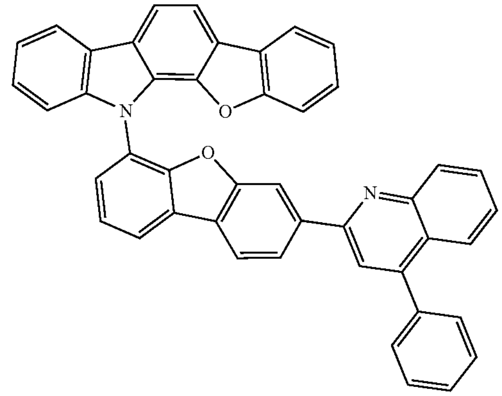
108
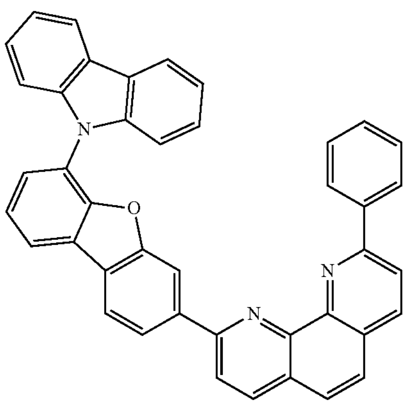
109
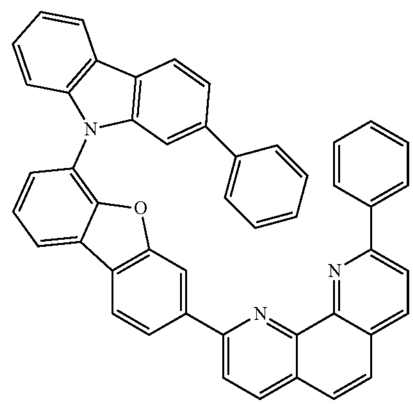
110
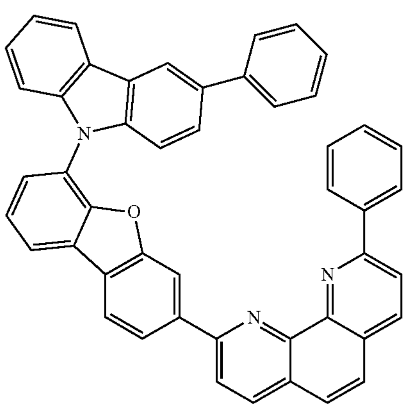
111
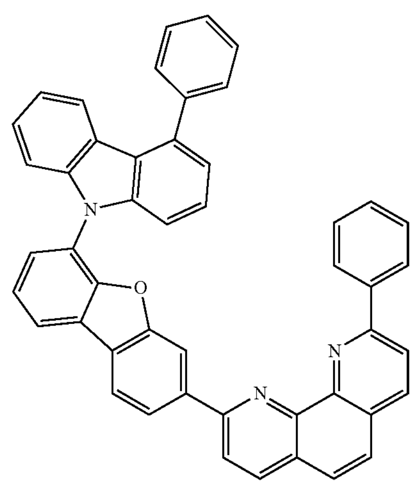
112

-continued
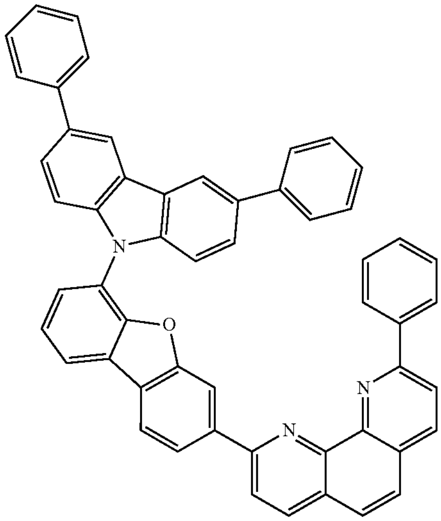
113
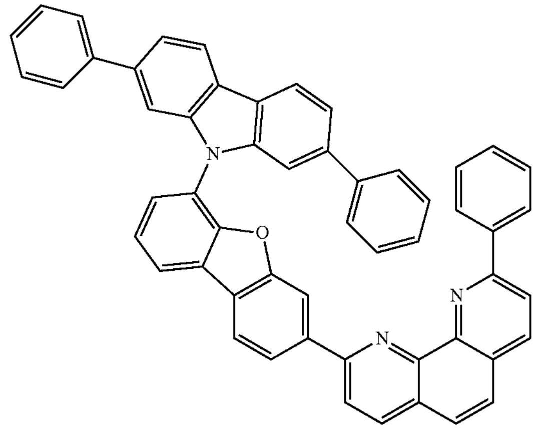
114
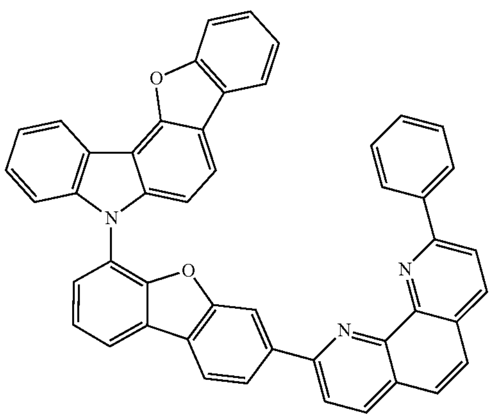
115
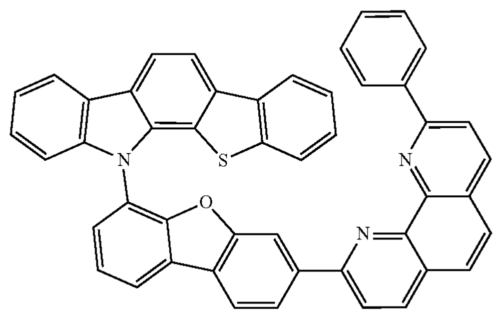
116
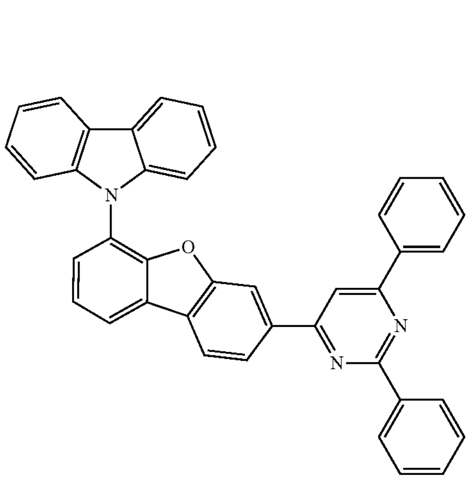
117
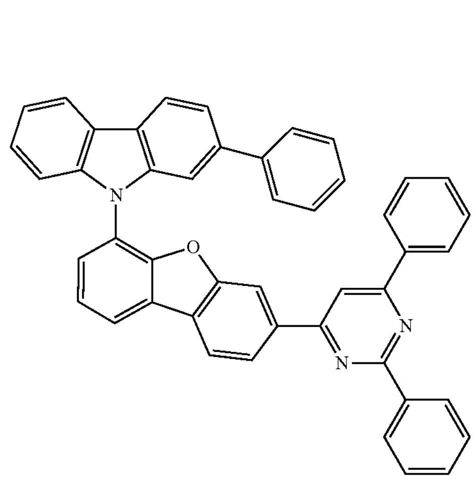
118

-continued
119
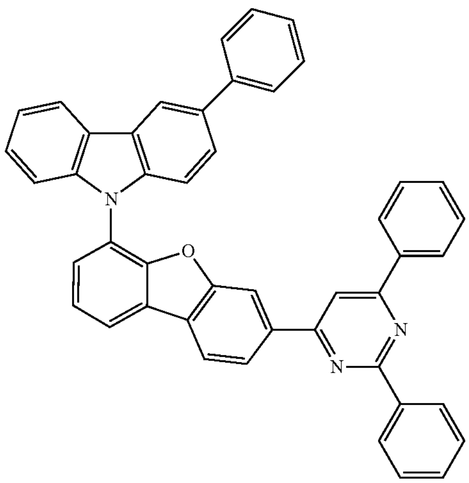
120
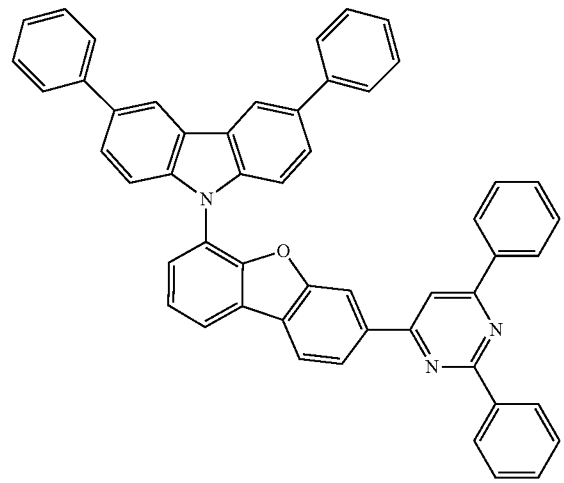
121
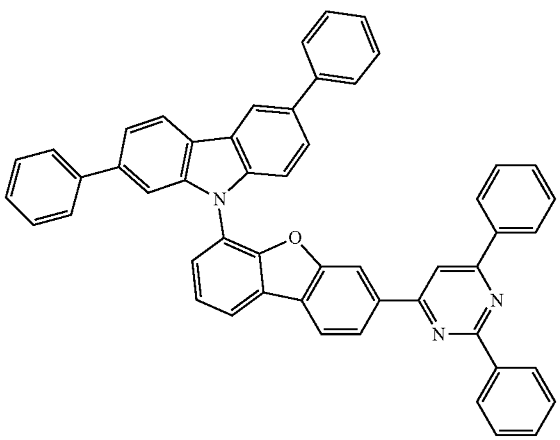
122
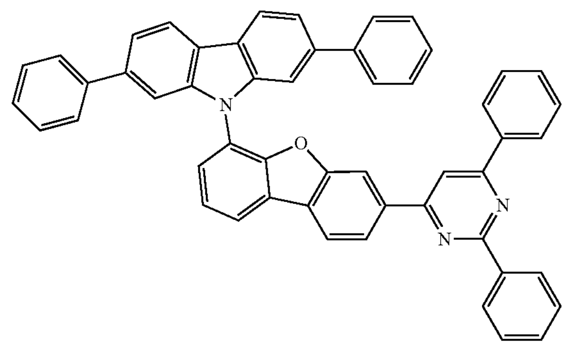
123
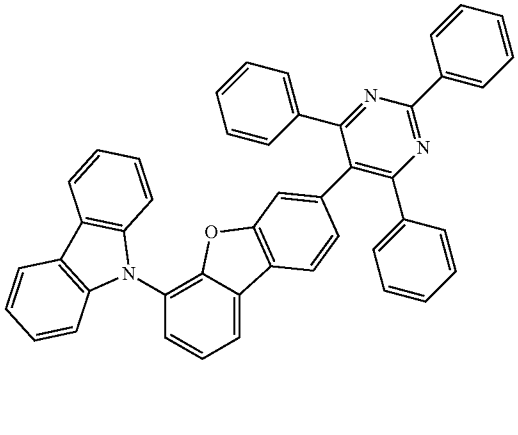
124
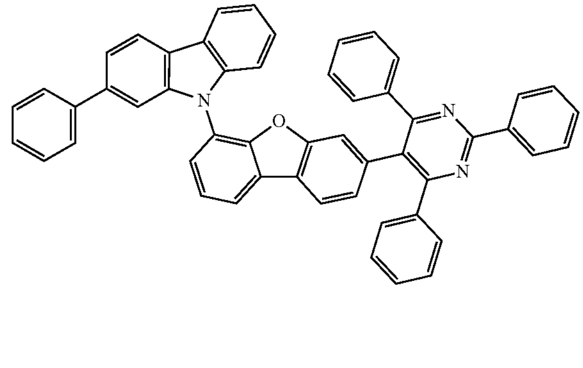

-continued
125
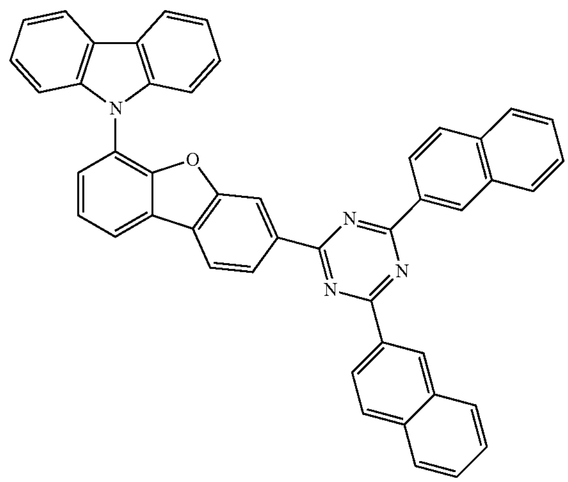
126
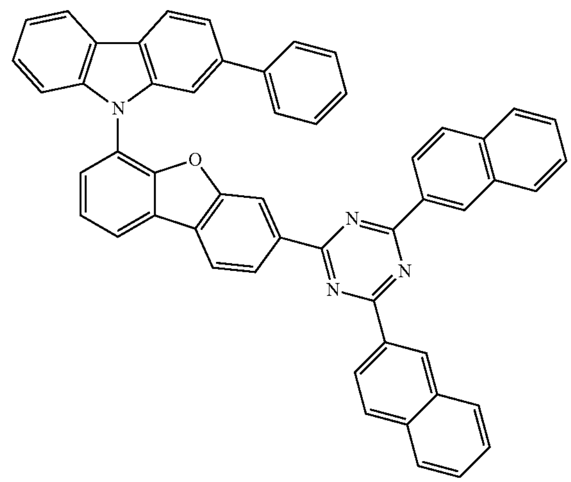
127
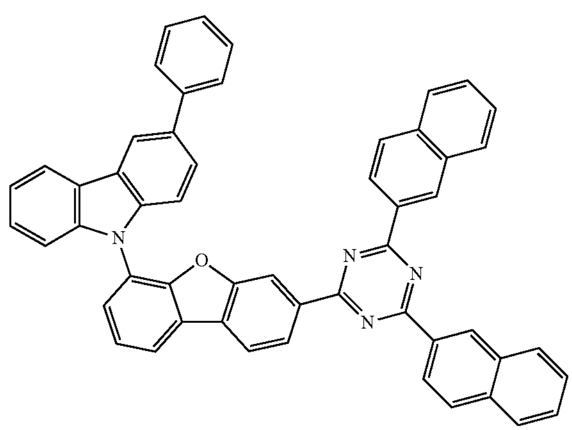
128
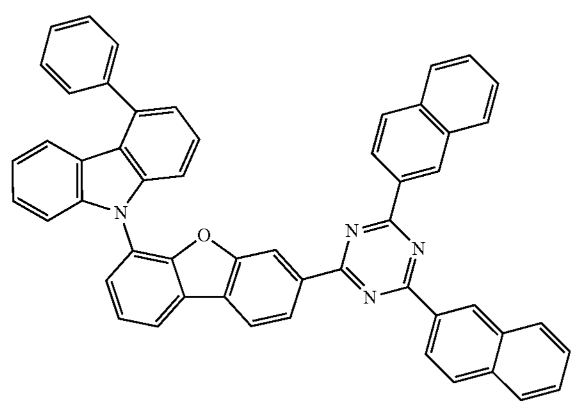
129
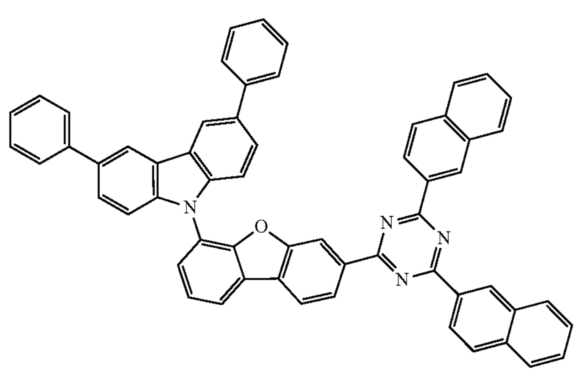
130
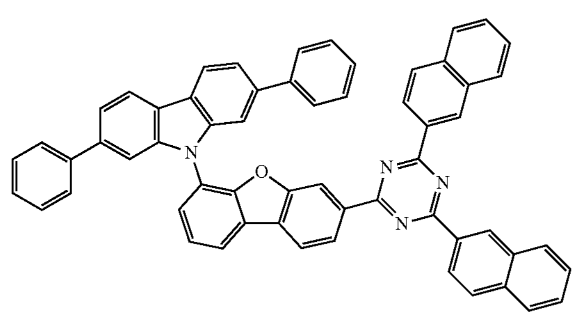

-continued
131
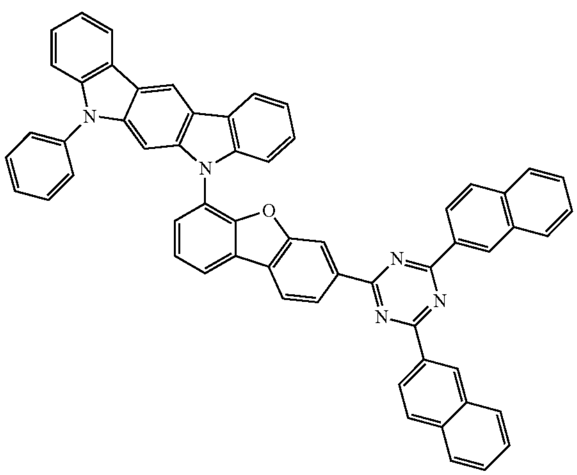
132
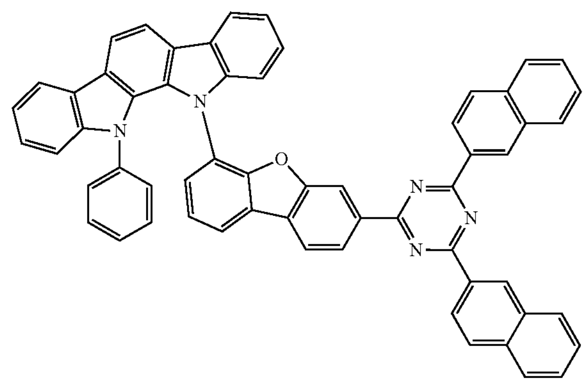
133
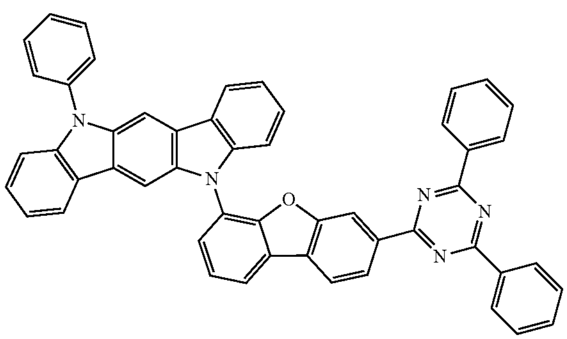
134
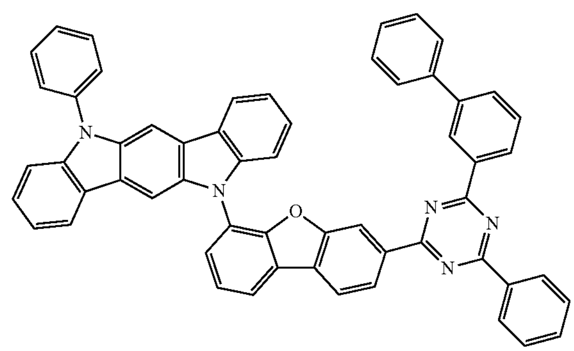
135
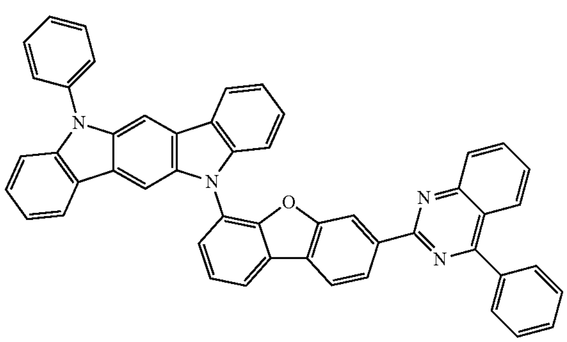
136
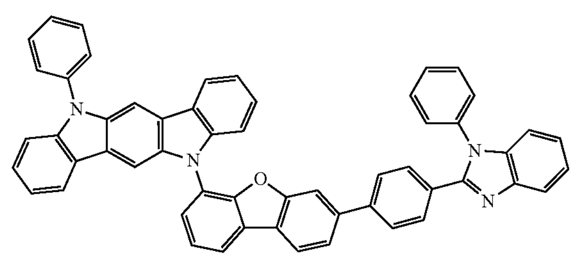

-continued
137
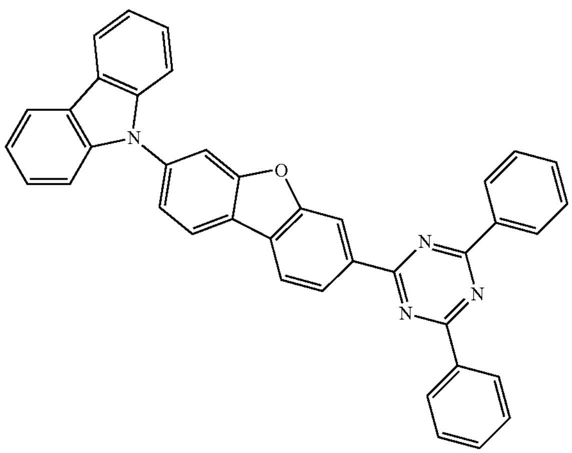
138
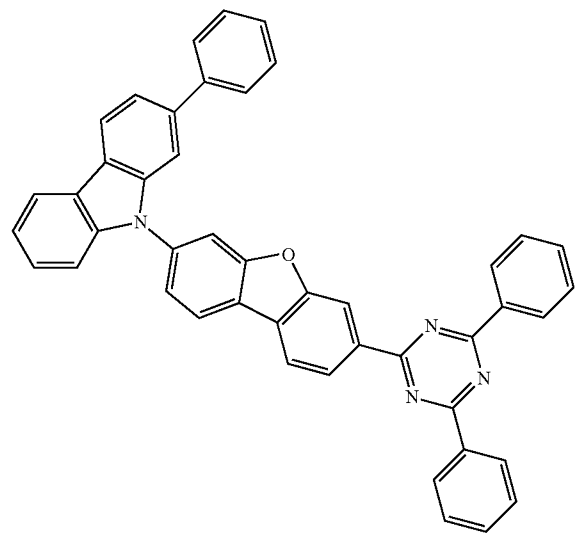
139
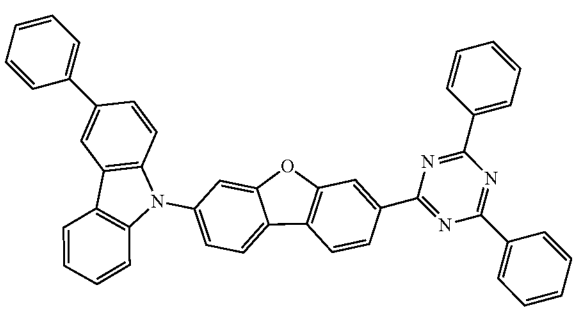
140
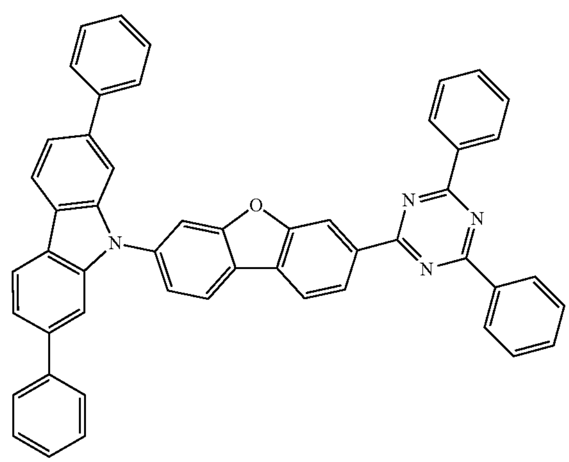
141
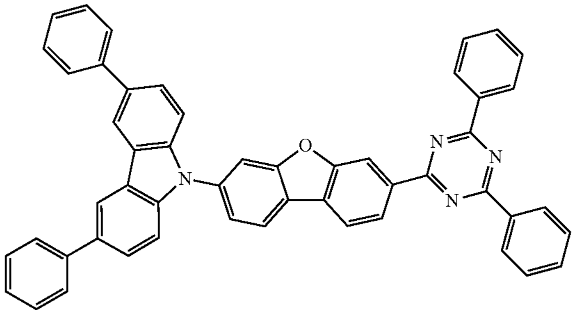
142
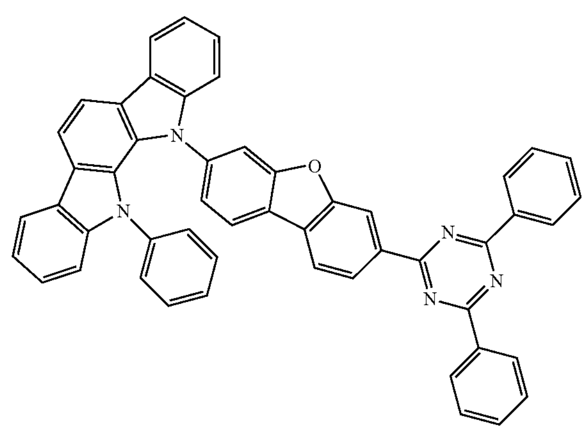

-continued
143
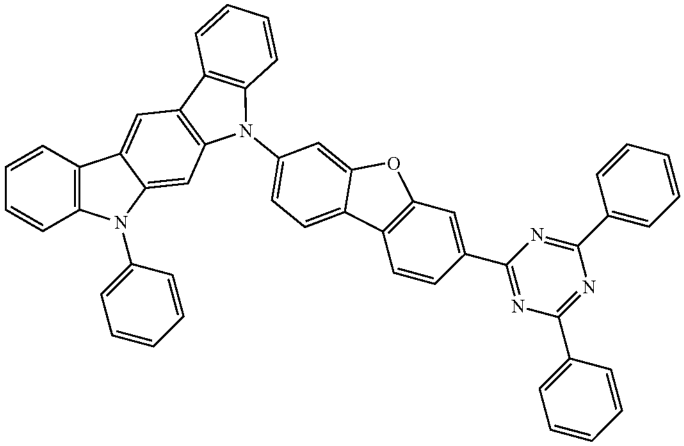
144
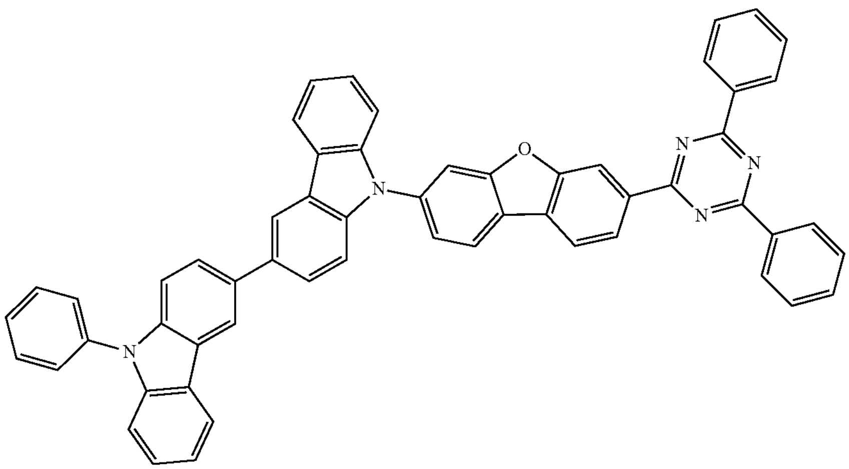
145
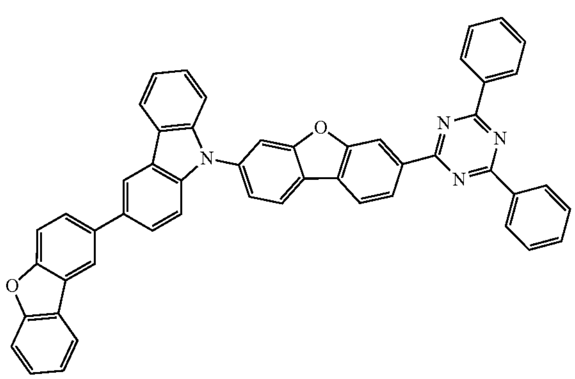
146
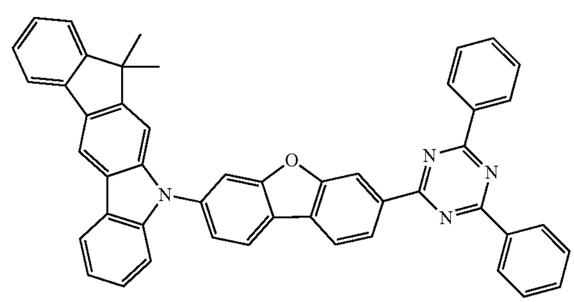

-continued
147
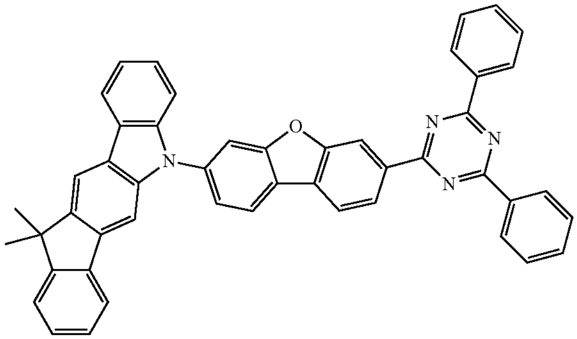
148
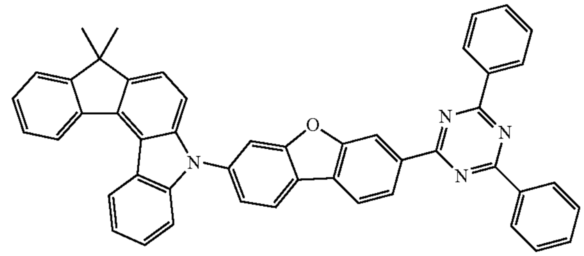
149
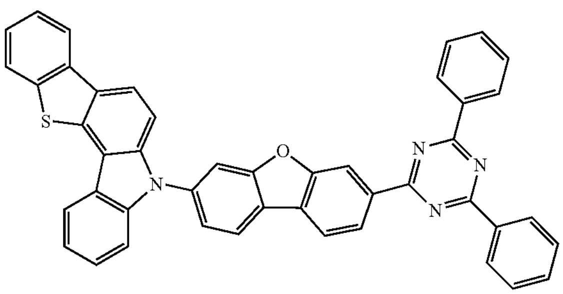
150
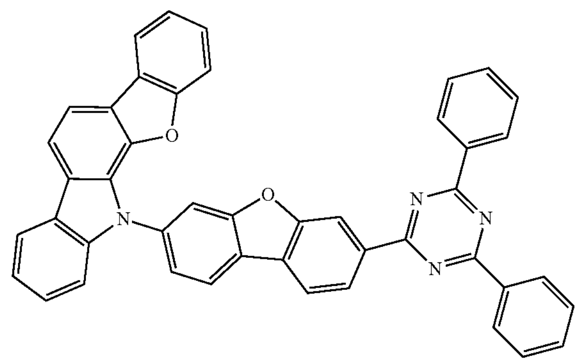
151
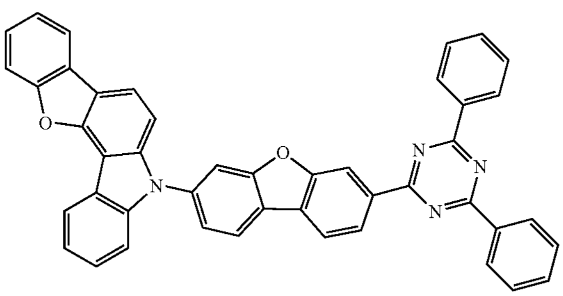
152
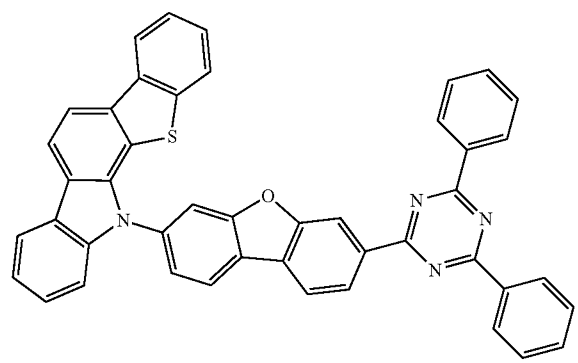
153
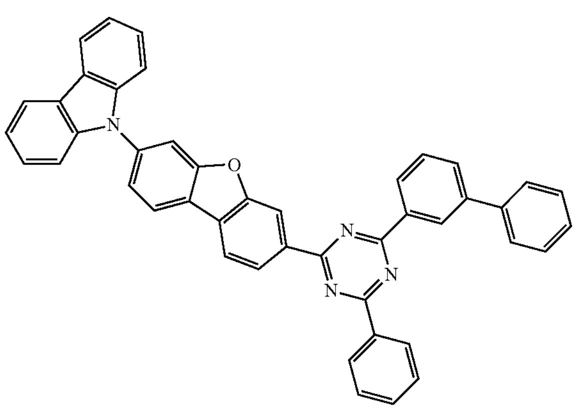
154
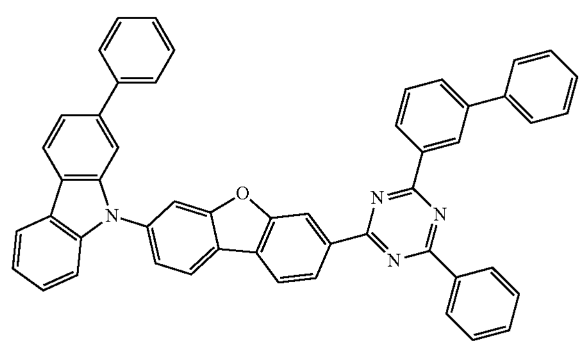

-continued
155
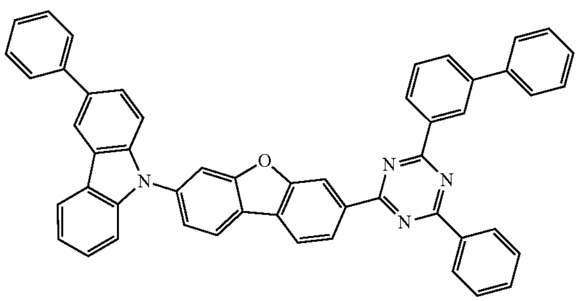
156
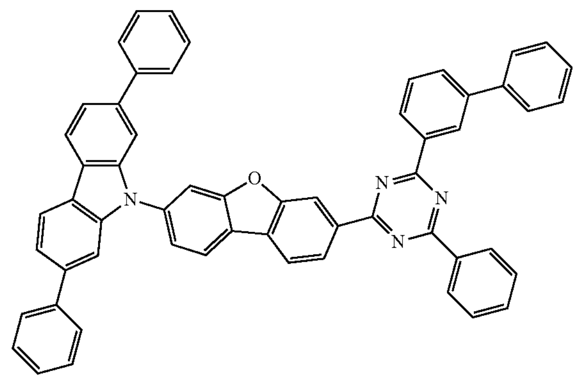
157
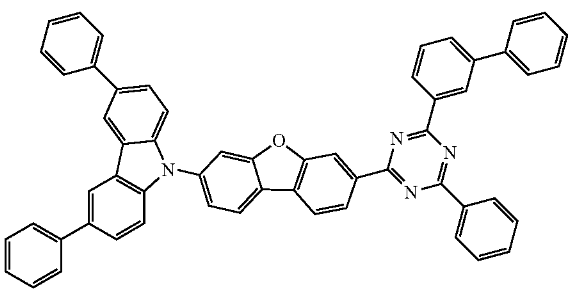
158
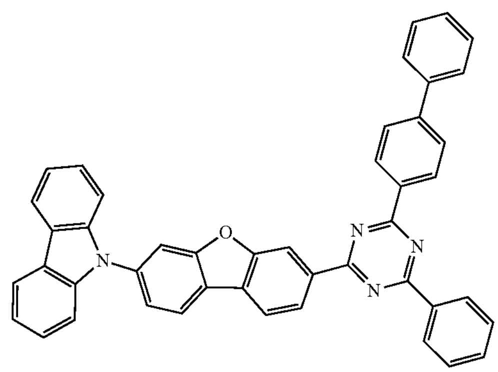
159
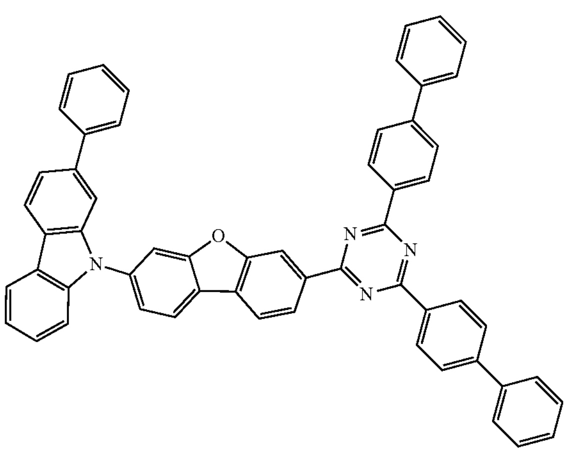
160
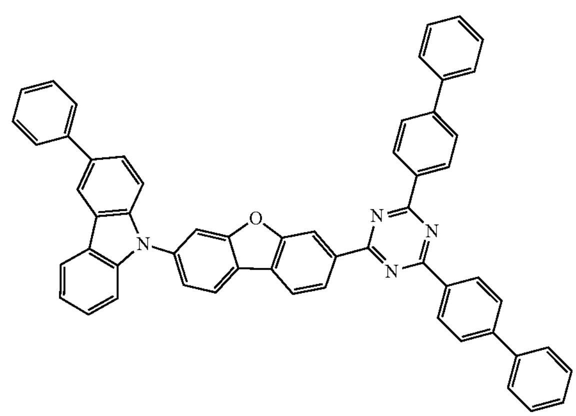

-continued
161
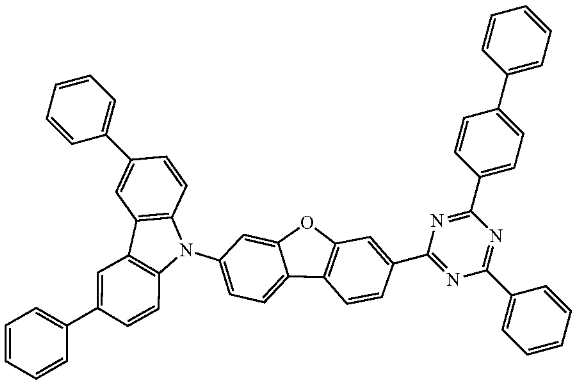
162
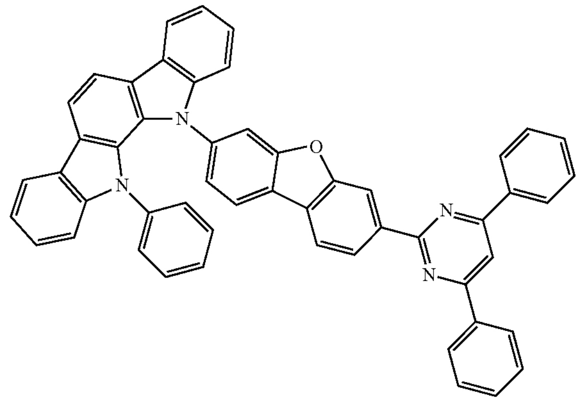
163
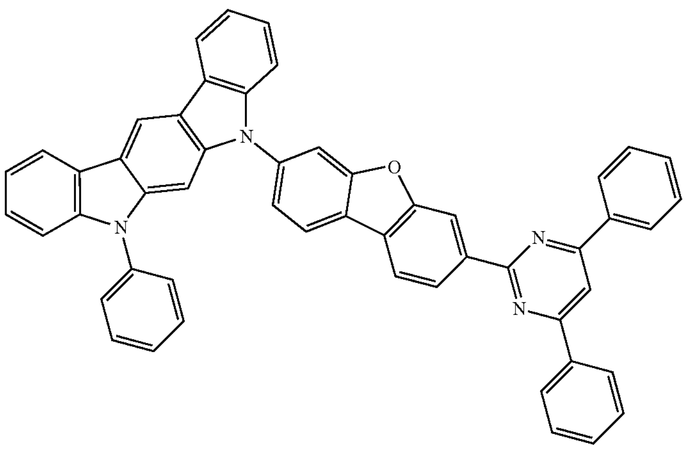
164
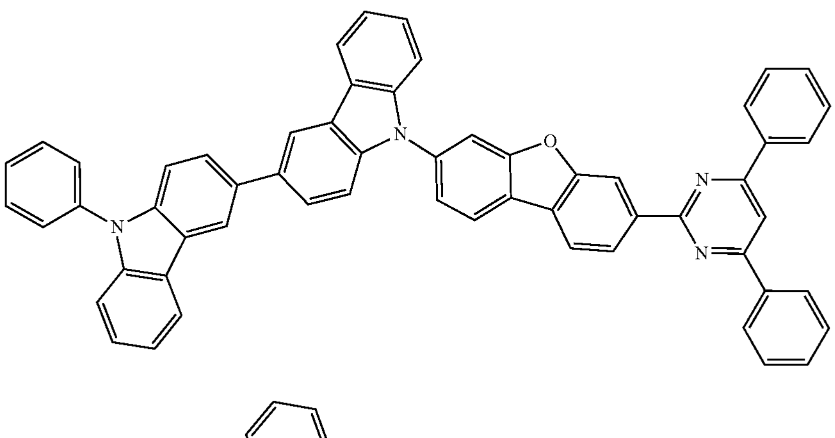
165
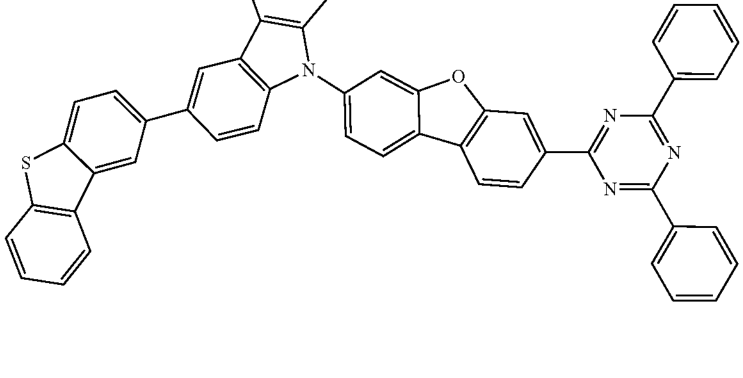

-continued
166
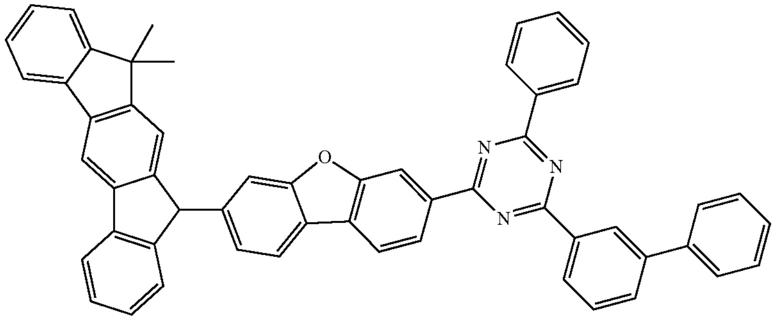
167
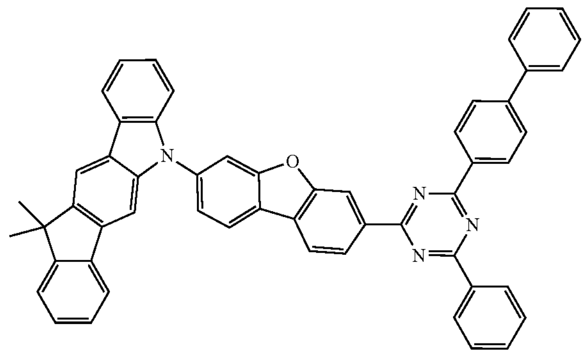
168
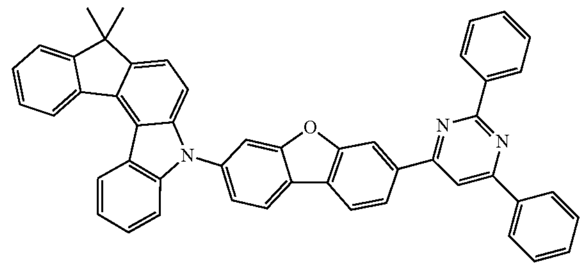
169
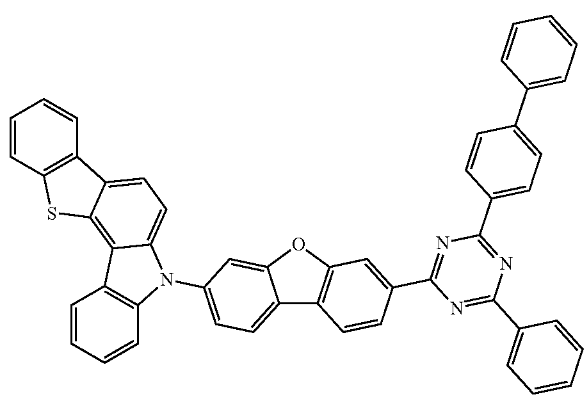
170
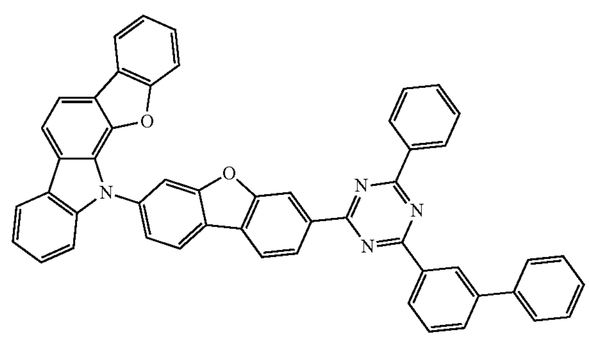
171
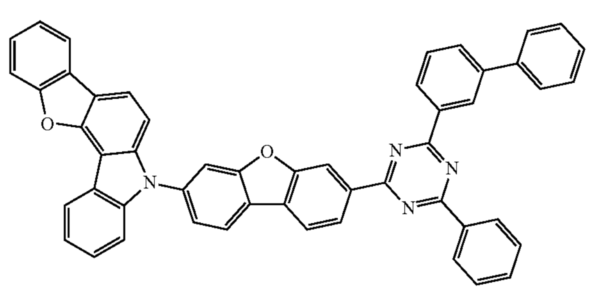
172
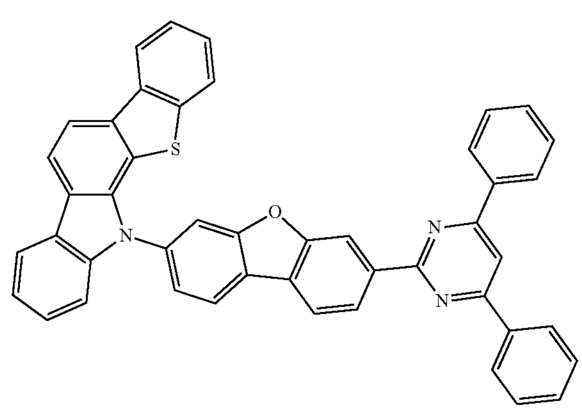

-continued
173
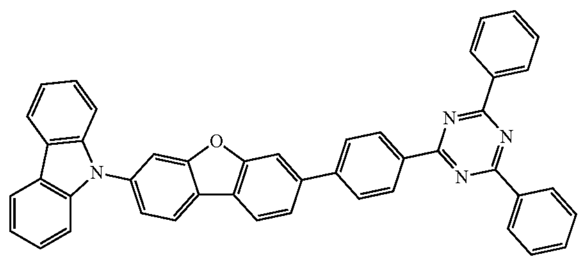
174
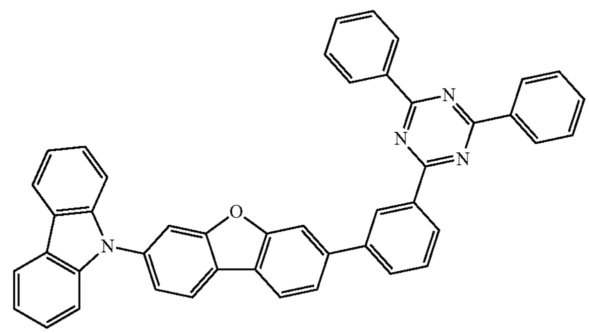
175
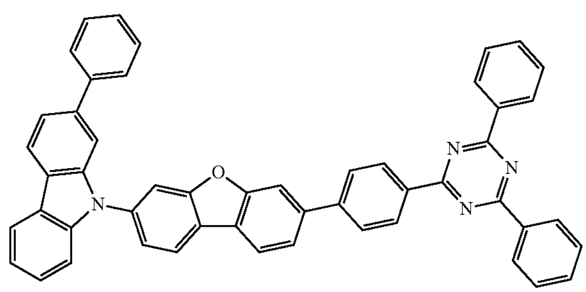
176
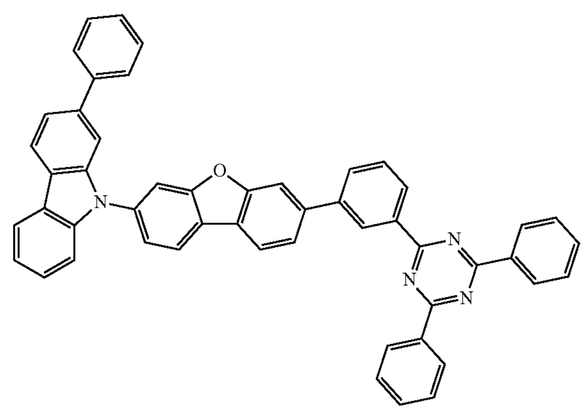
177
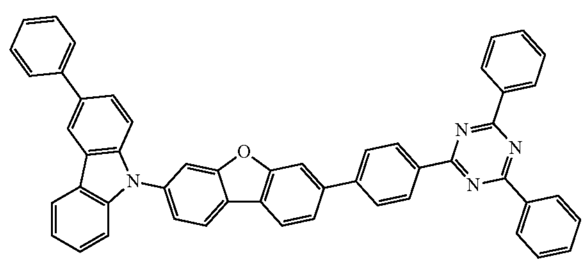
178
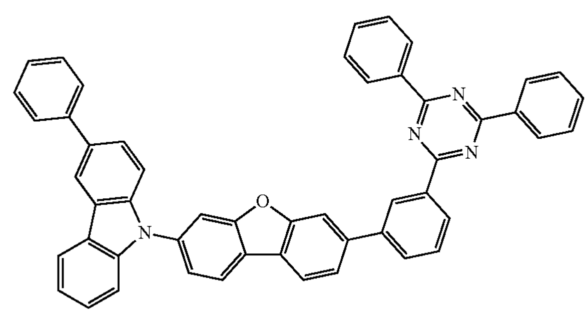
179
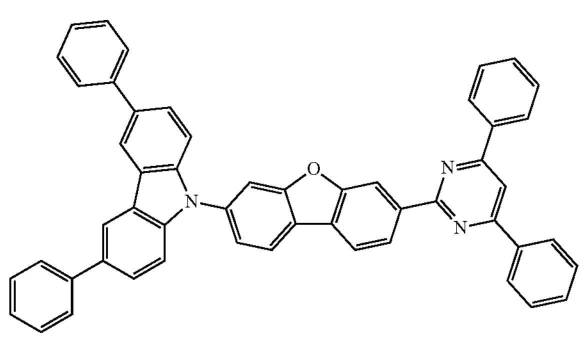
180
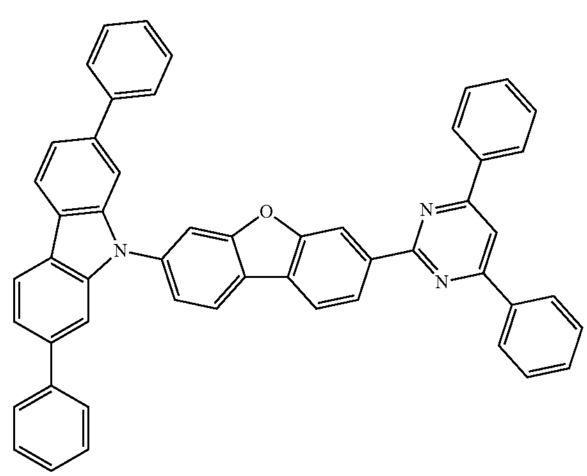

-continued
181
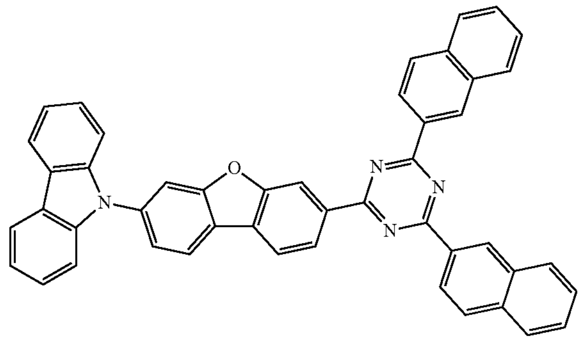
182
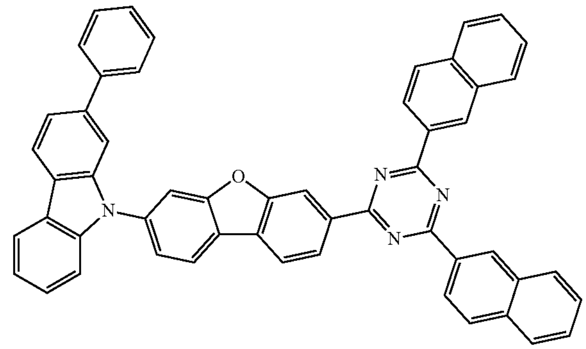
183
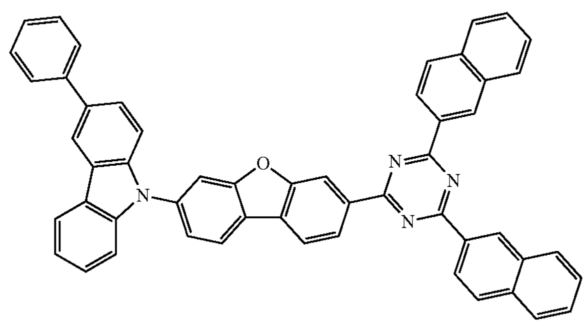
184
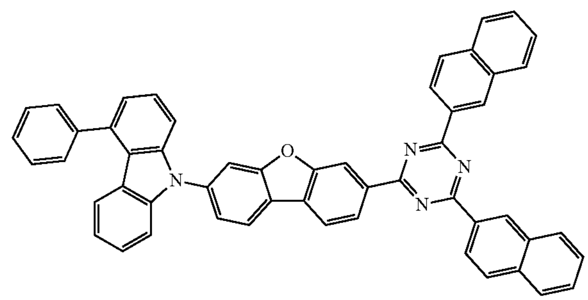
185
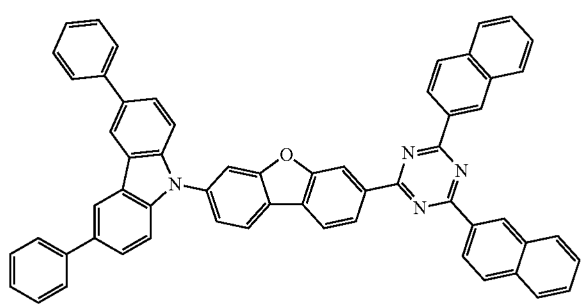
186
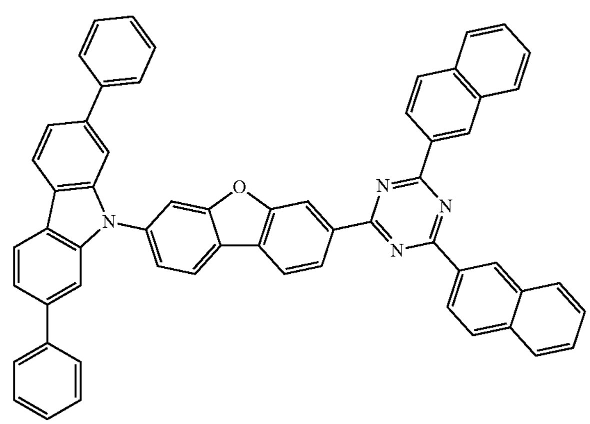
187
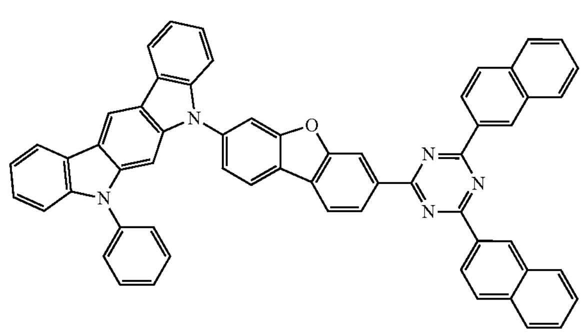
188
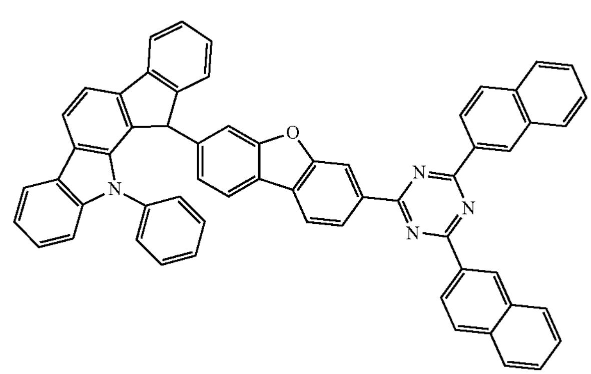

-continued
189
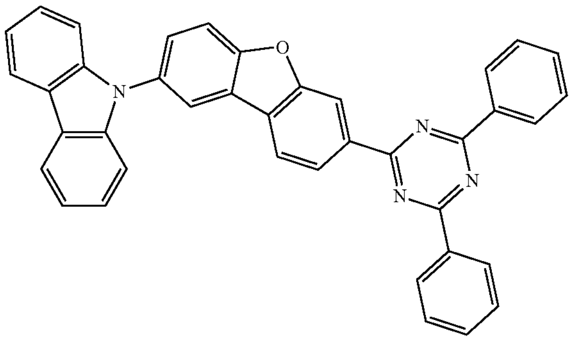
190
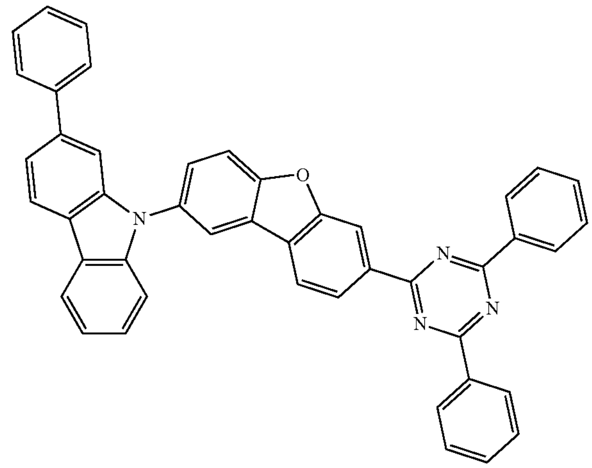
191
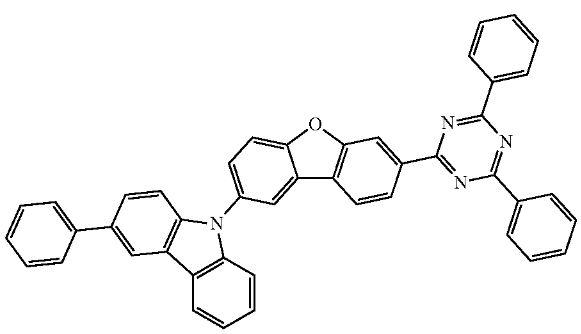
192
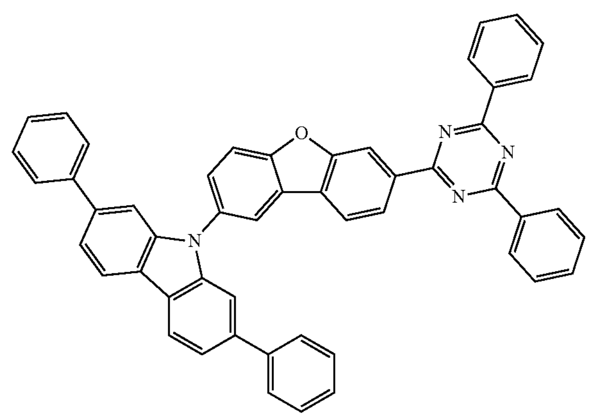
193
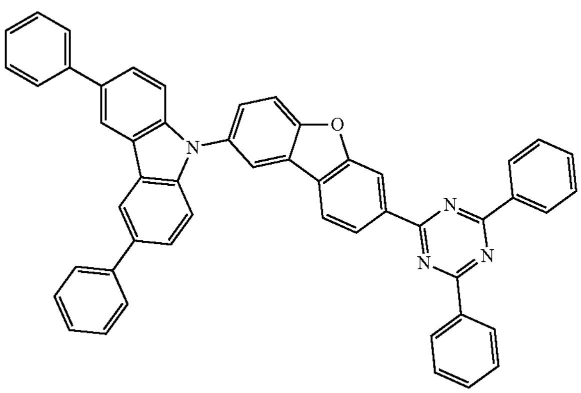
194
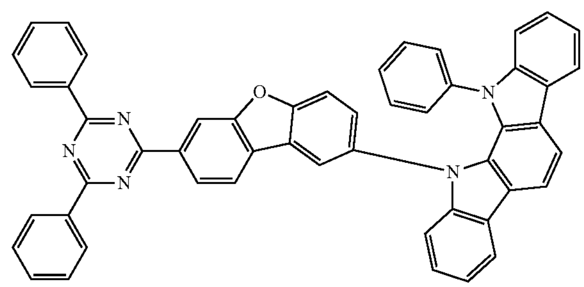

-continued
195
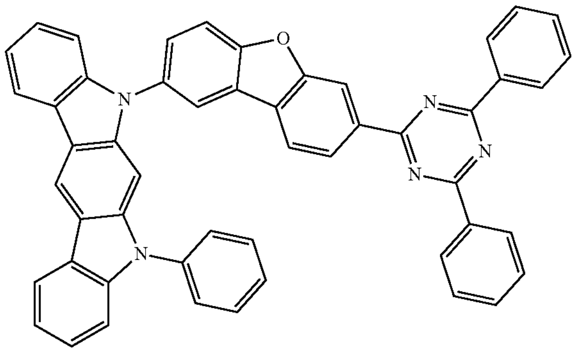
196
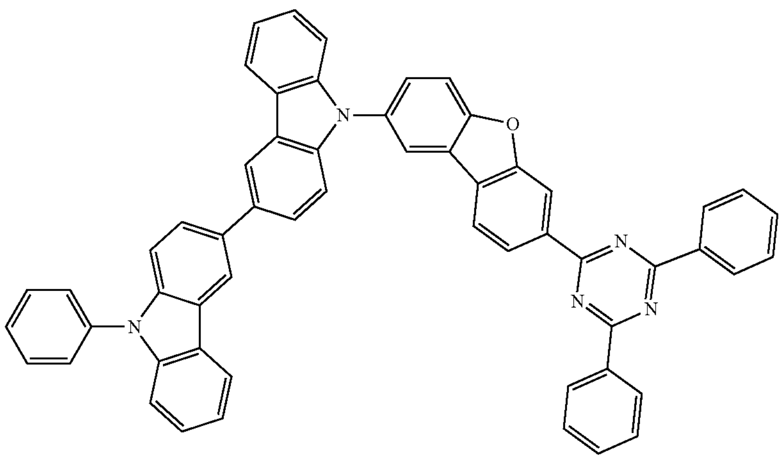
197
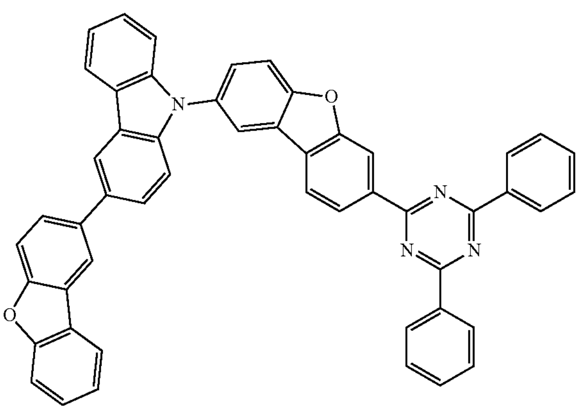
198
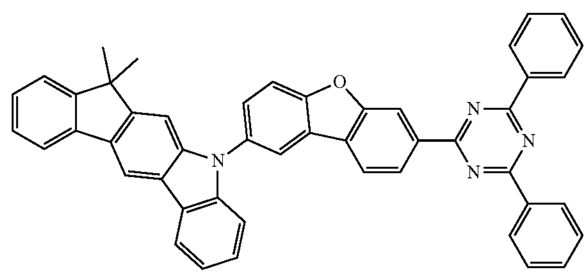
199
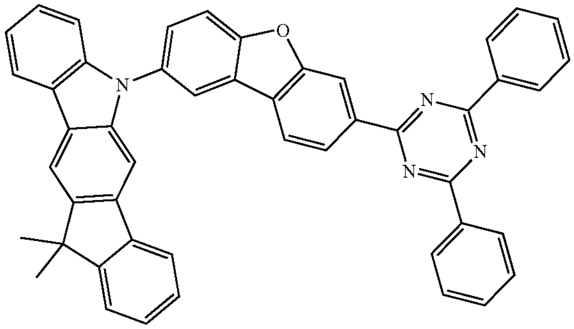
200
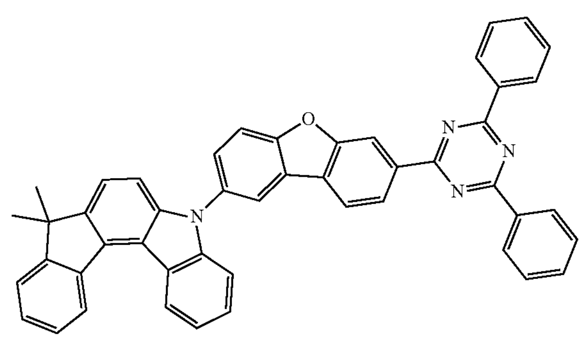

-continued
201
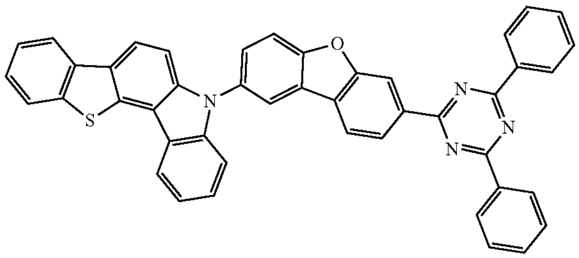
202
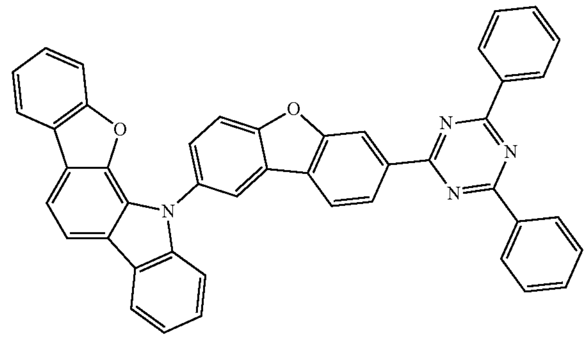
203
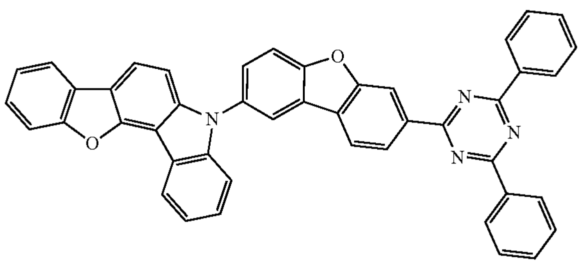
204
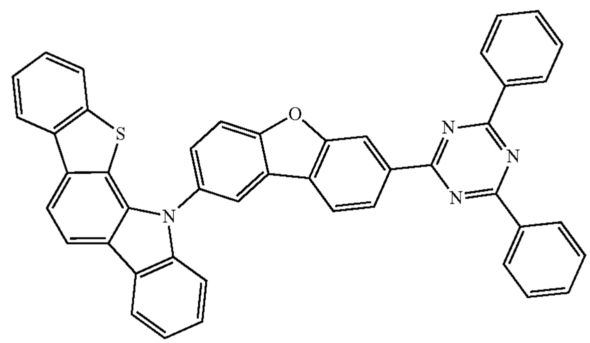
205
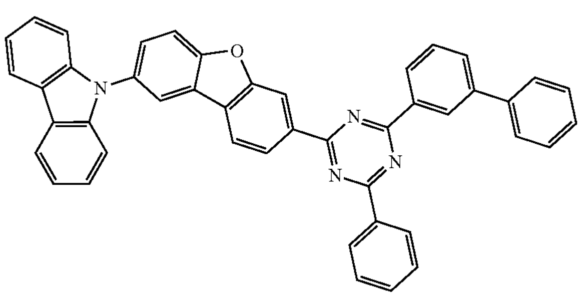
206
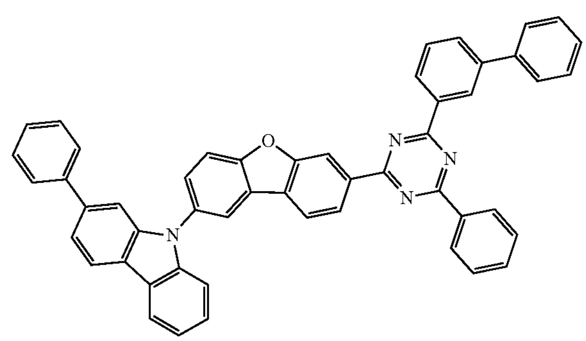
207
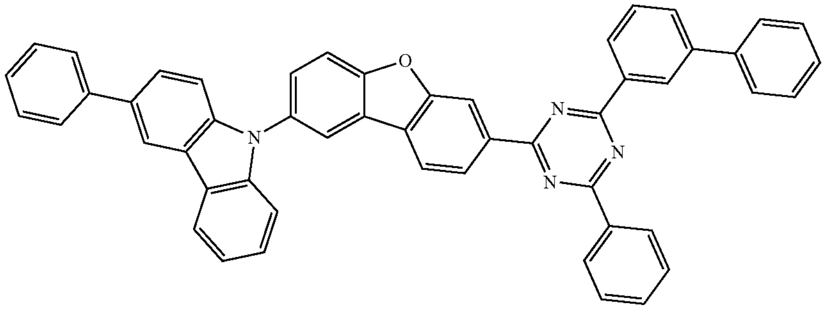

-continued
208
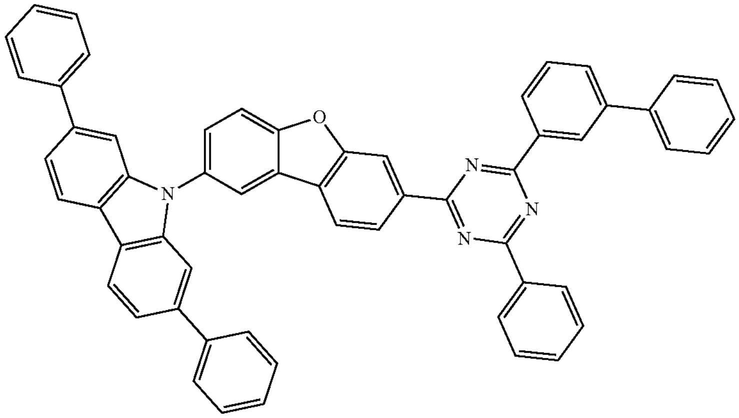
209
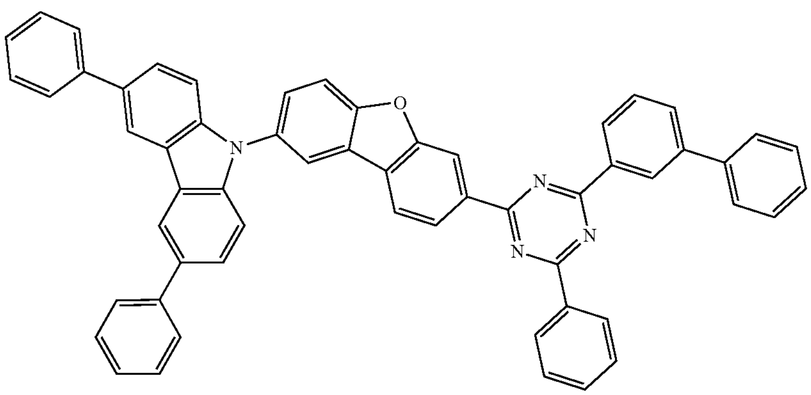
210
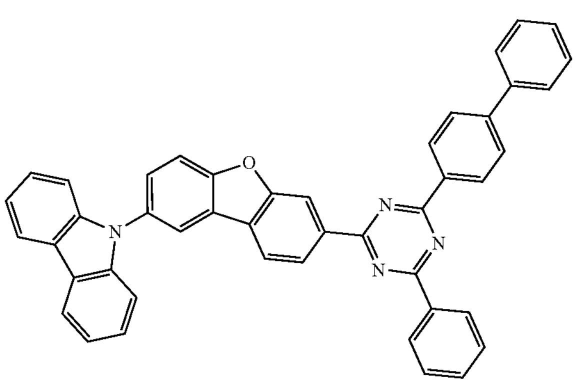
211
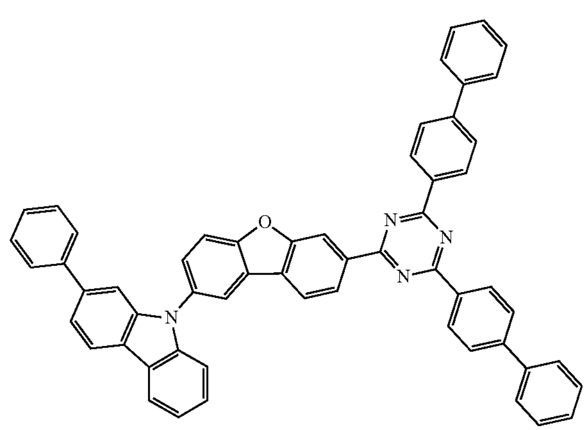

-continued
212
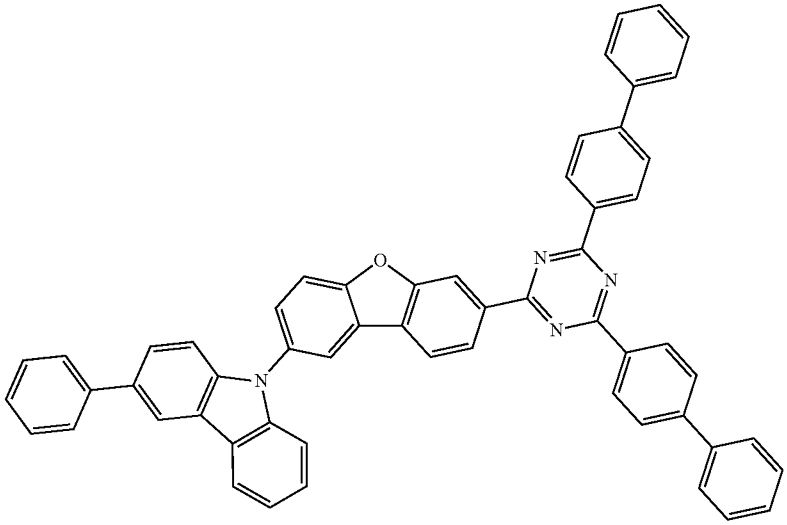
213
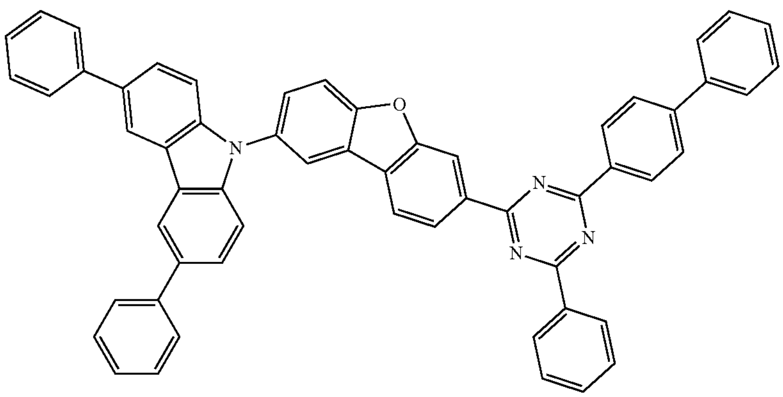
214
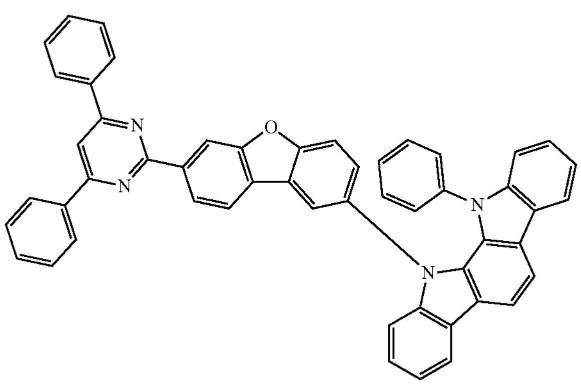
215
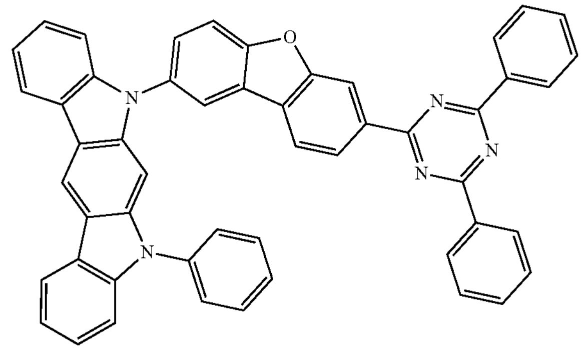

-continued
216
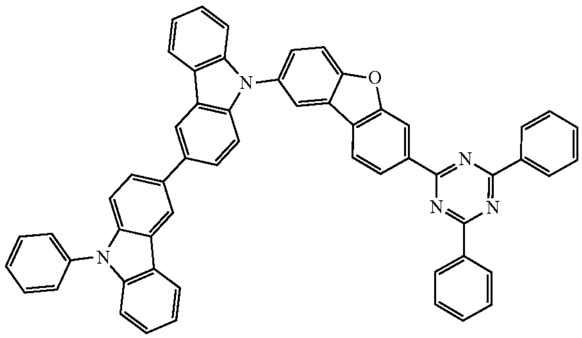
217
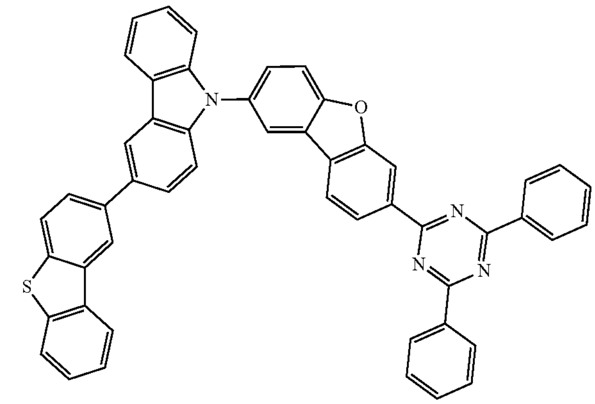
218
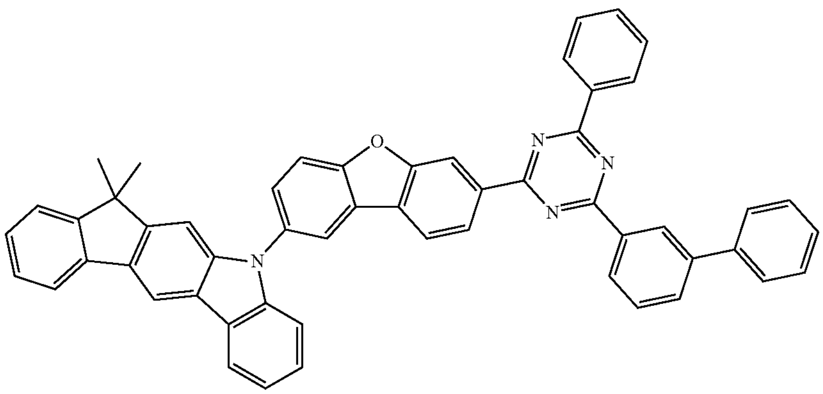
219
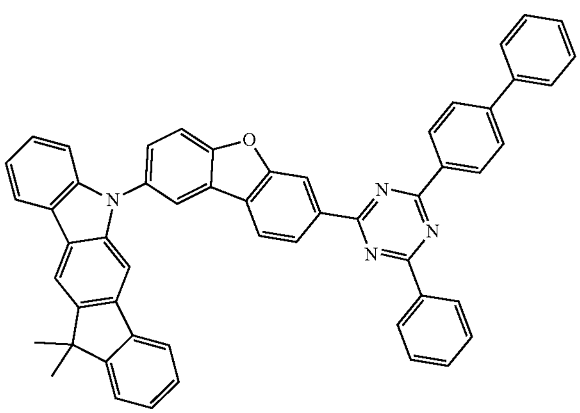
220
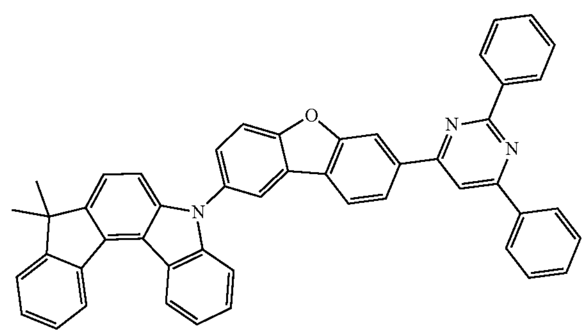
221
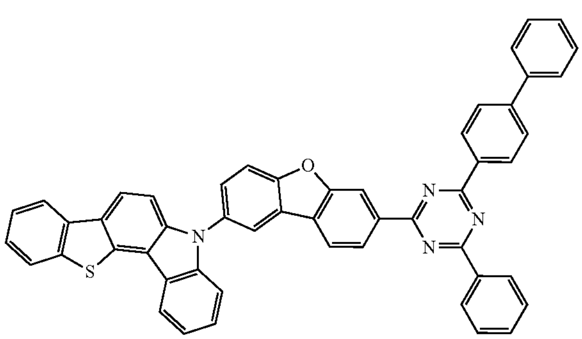
222
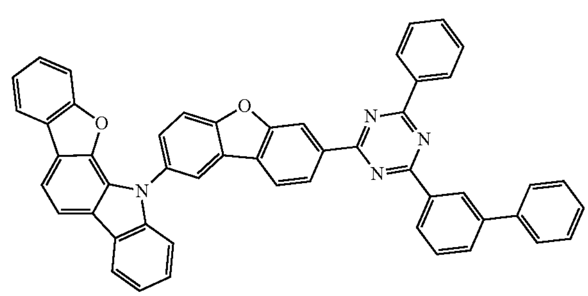

-continued
223
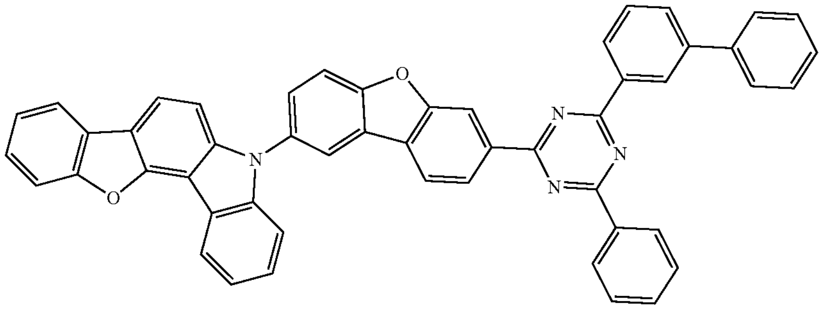
224
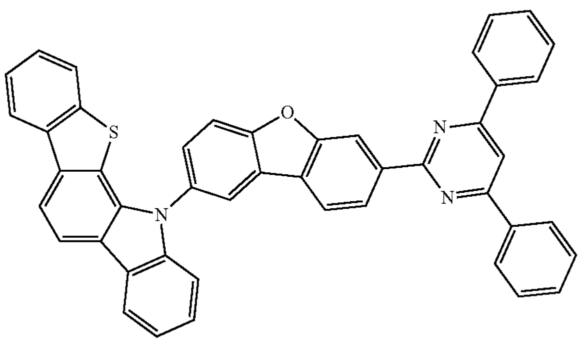
225
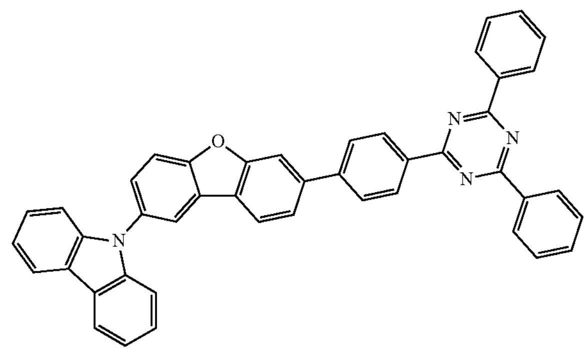
226
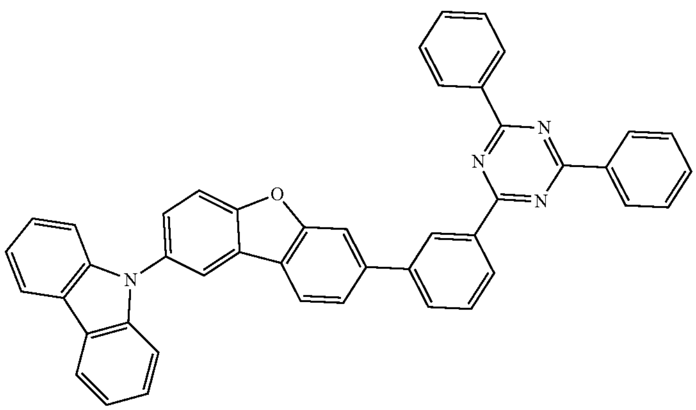
227
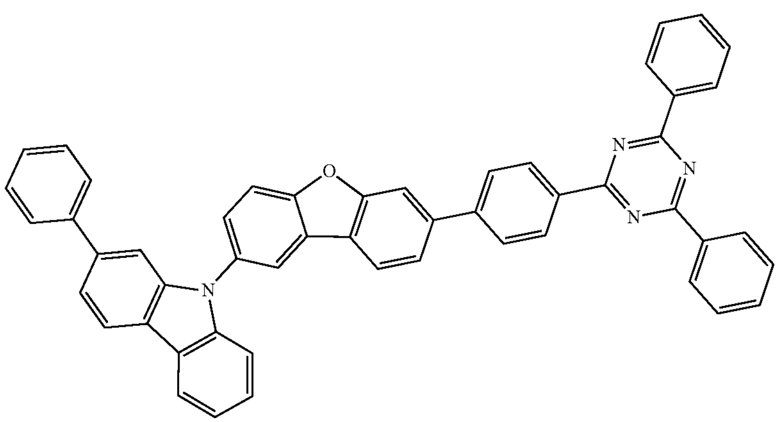

-continued
228
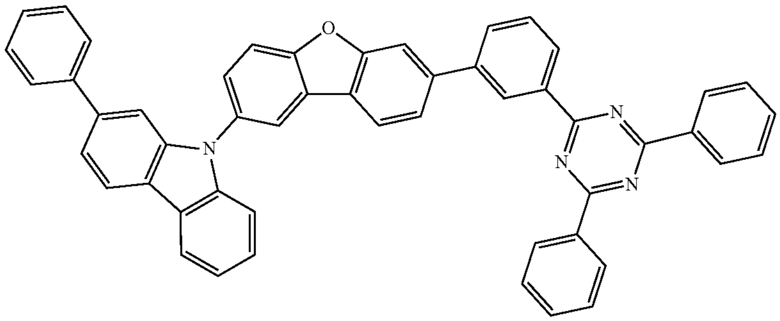
229
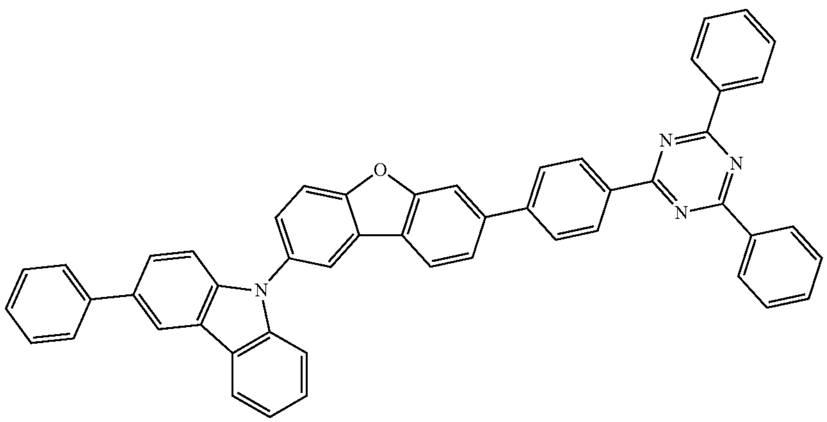
230
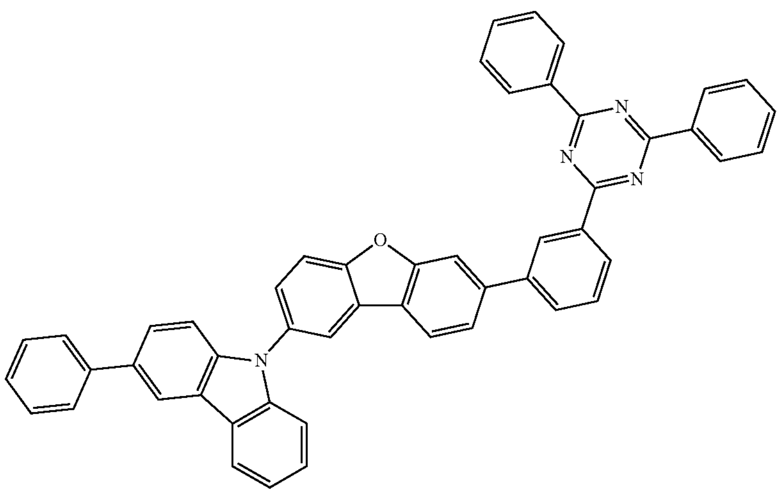
231
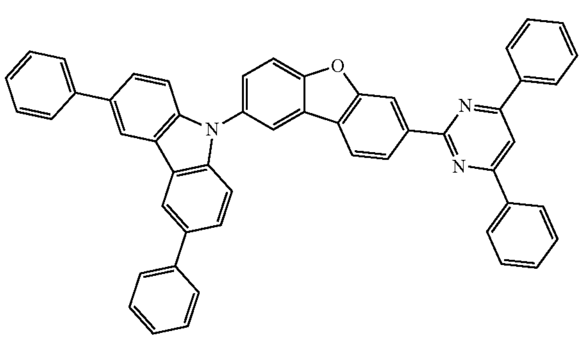
232
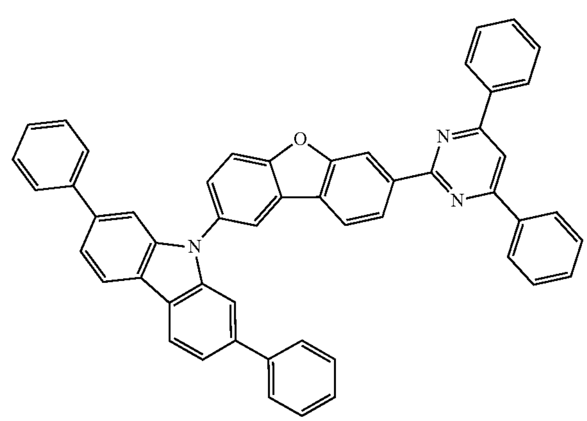

-continued
233
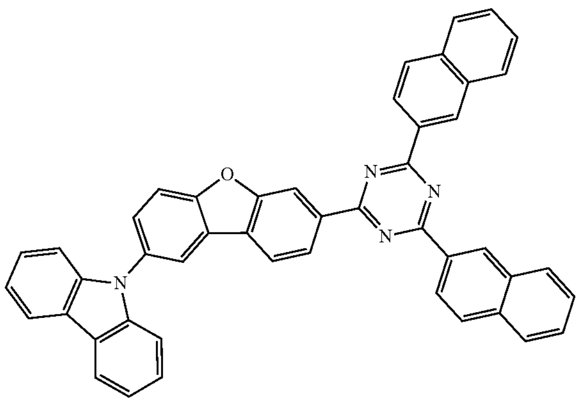
234
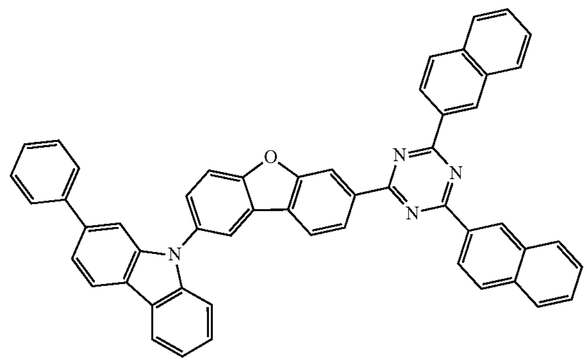
235
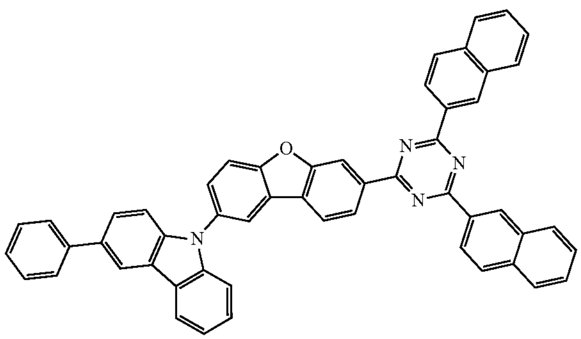
236
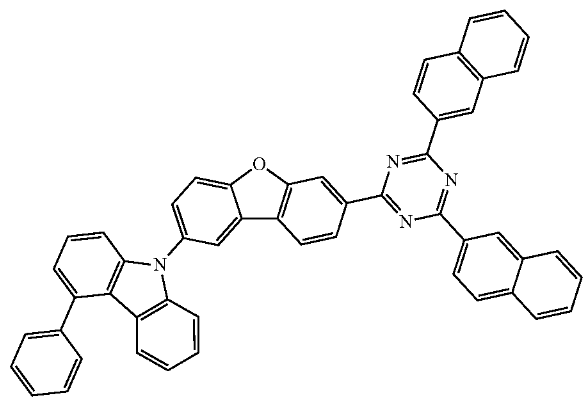
237
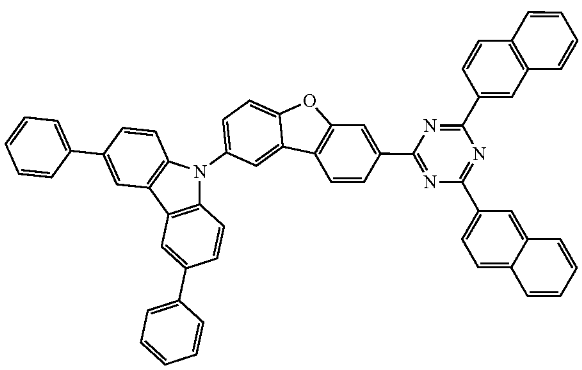
238
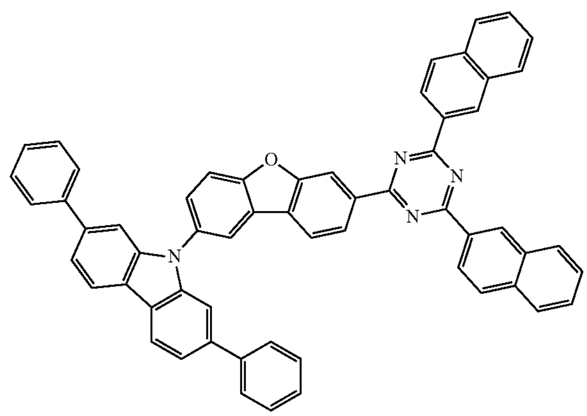
239
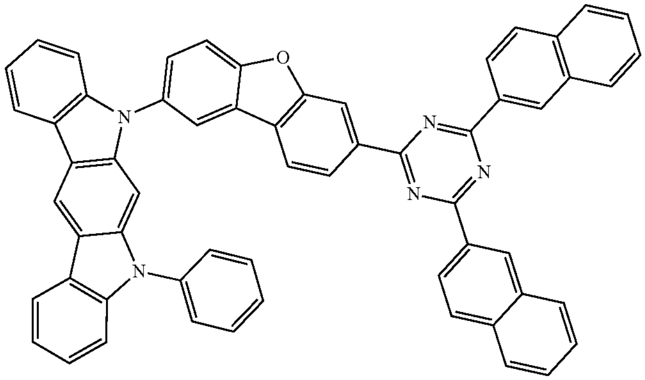

-continued
240
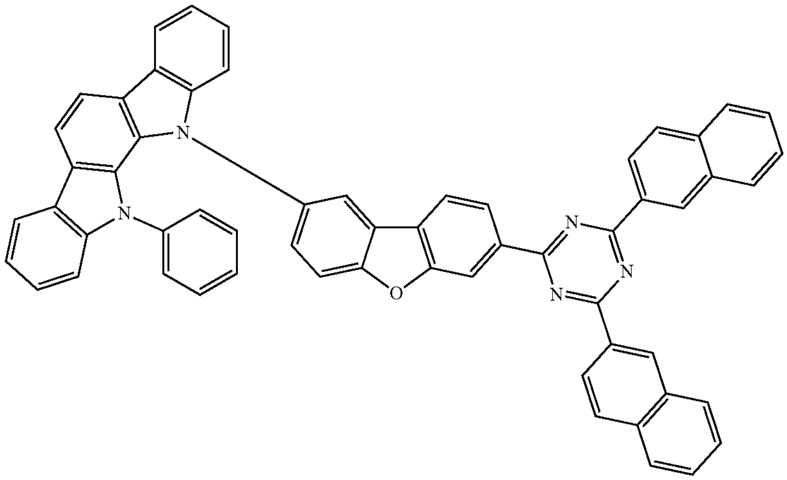
241
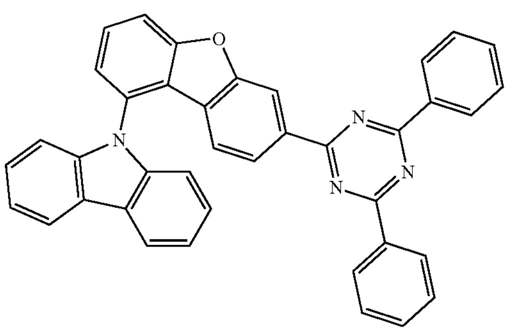
242
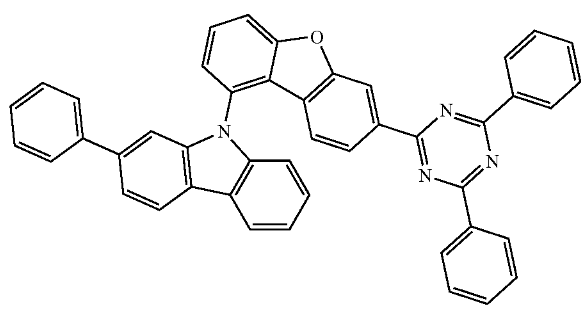
243
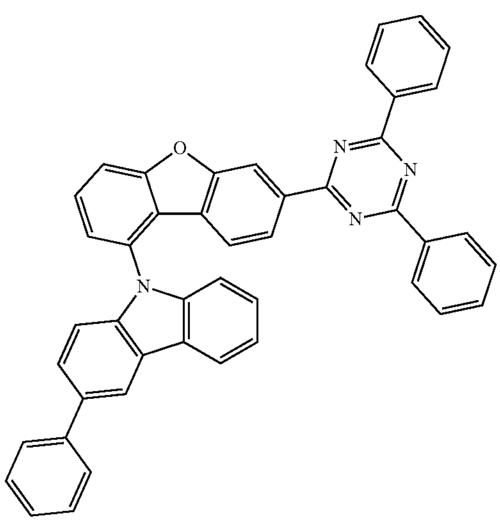
244
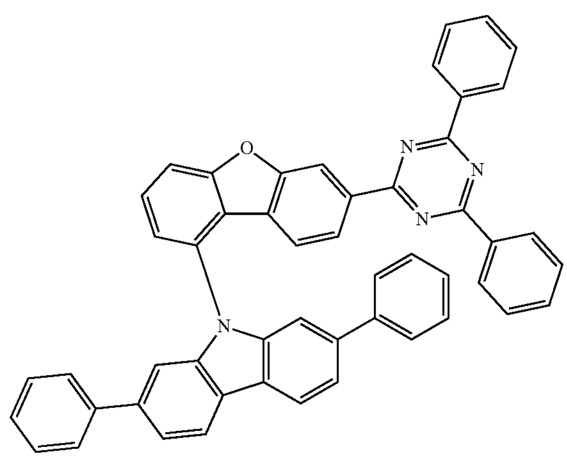

-continued
245
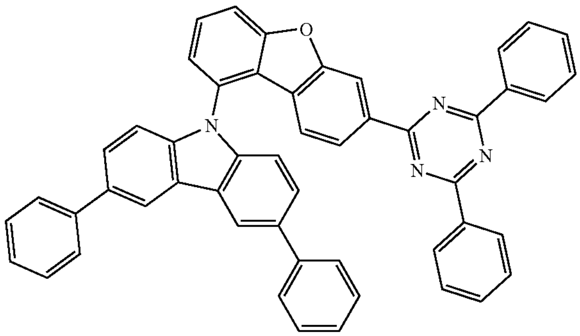
246
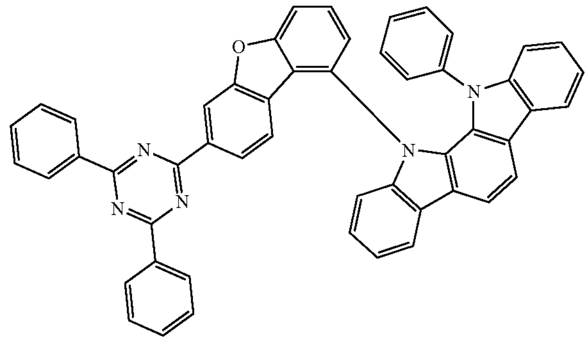
247
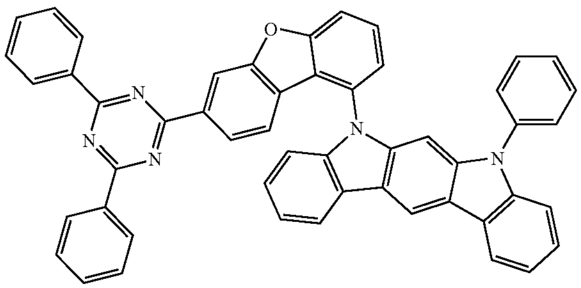
248
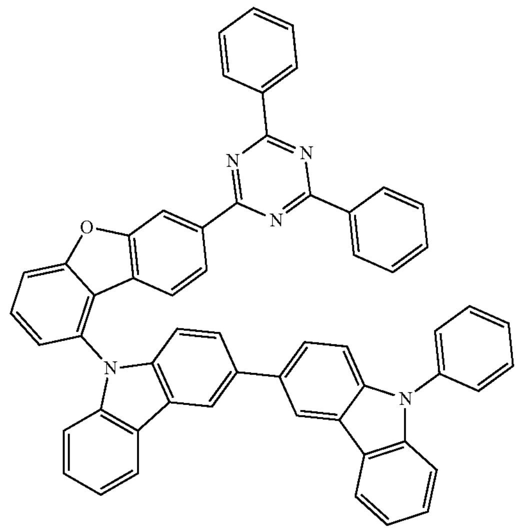
249
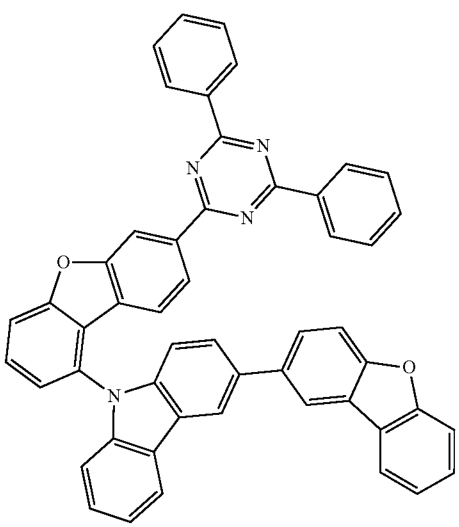
250
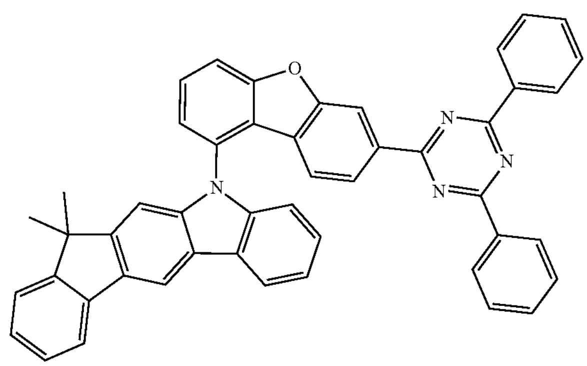

-continued
251
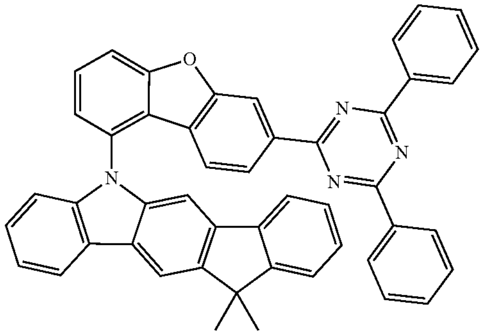
252
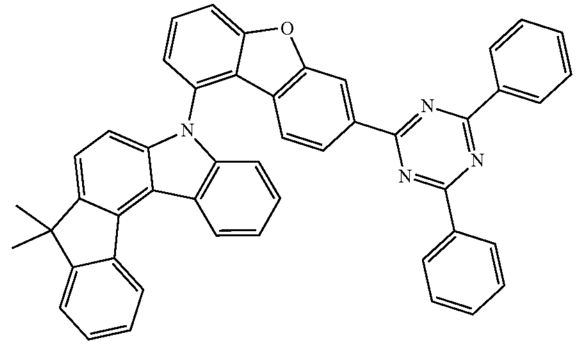
253
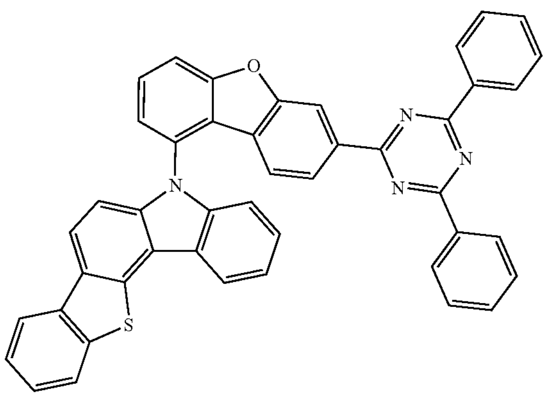
254
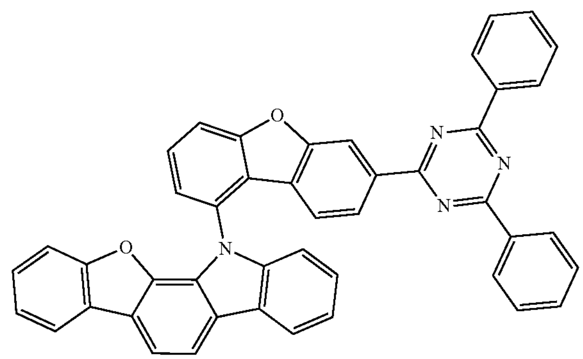
255
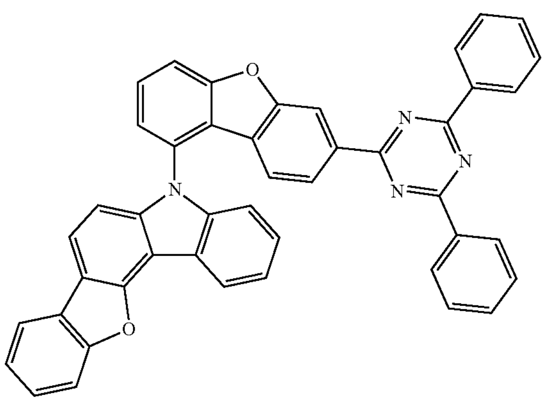
256
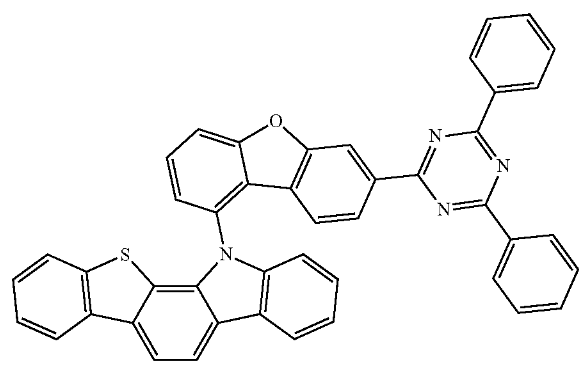
257
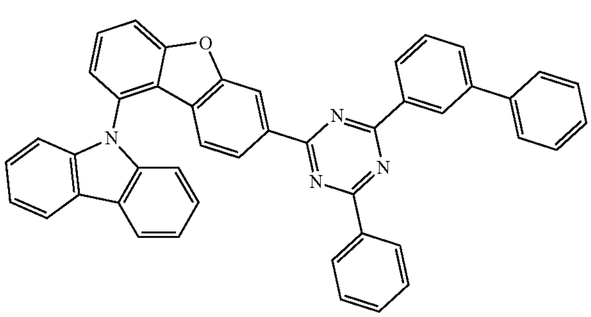
258
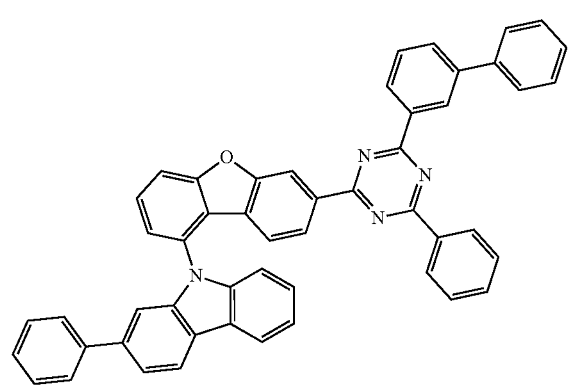

-continued
259
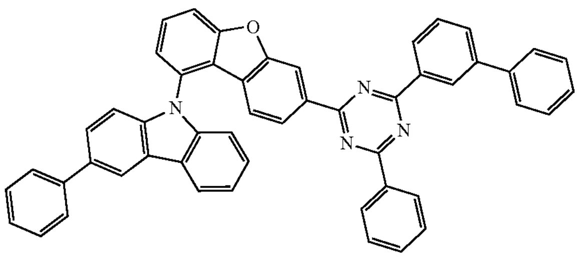
260
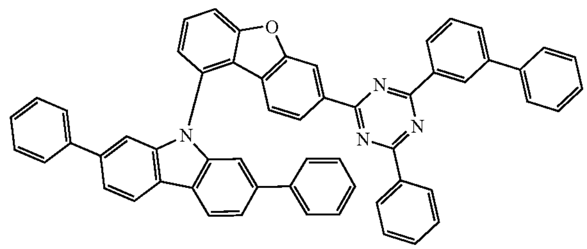
261
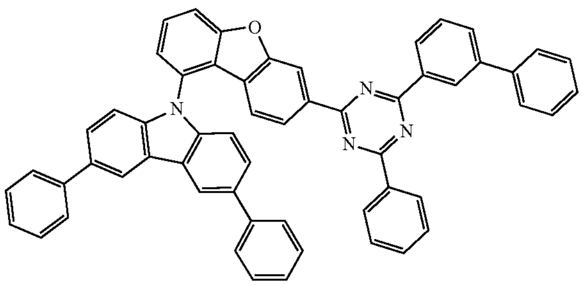
262
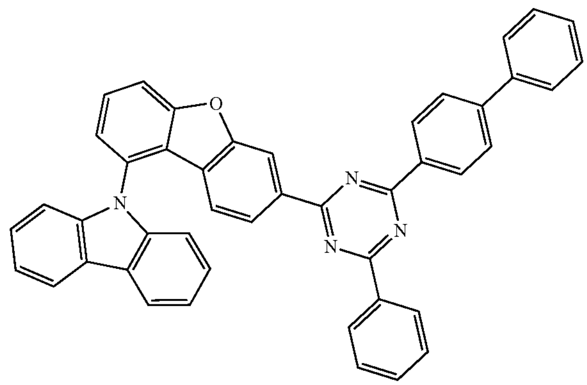
263
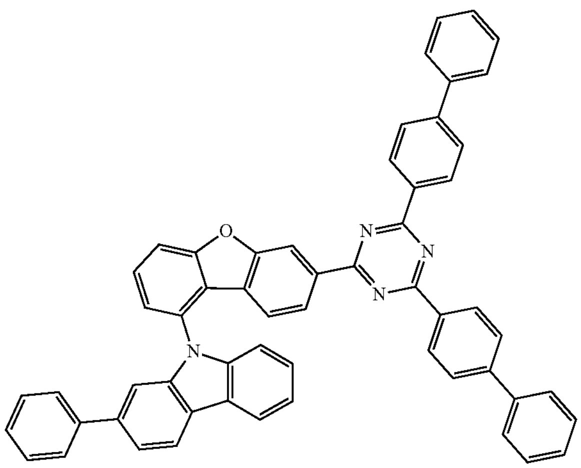
264
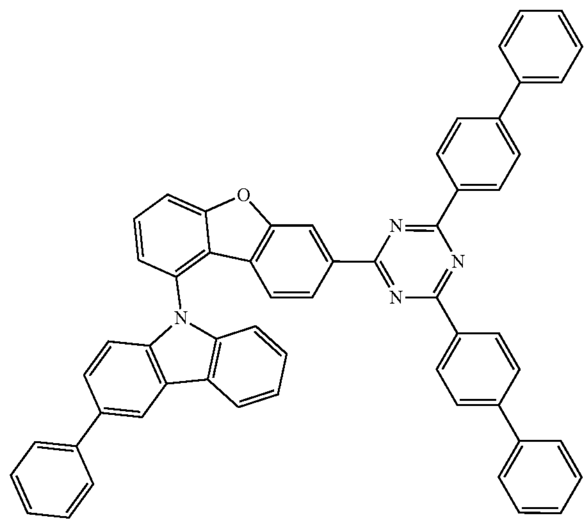
265
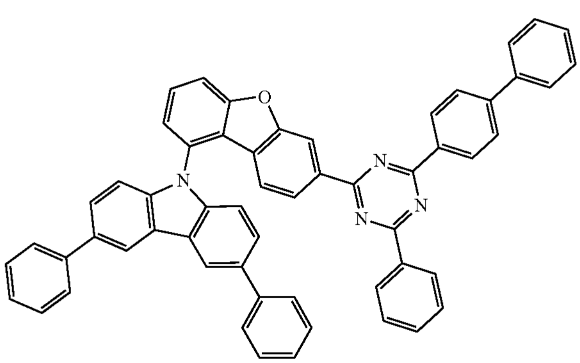
266
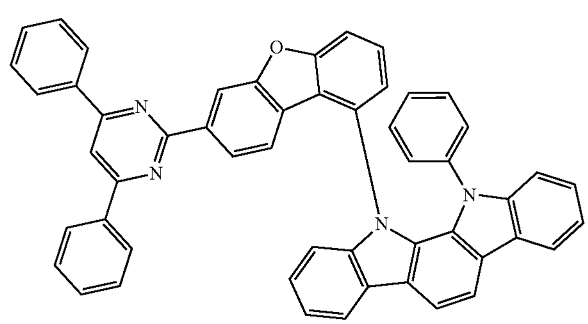

-continued
267
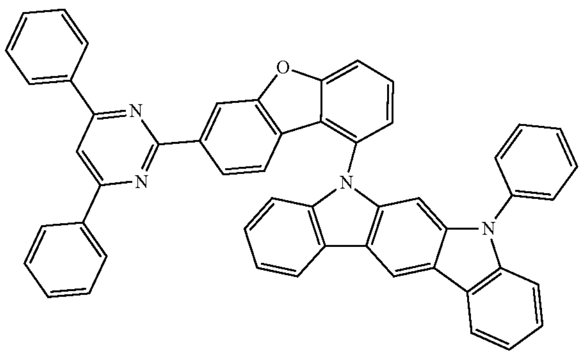
268
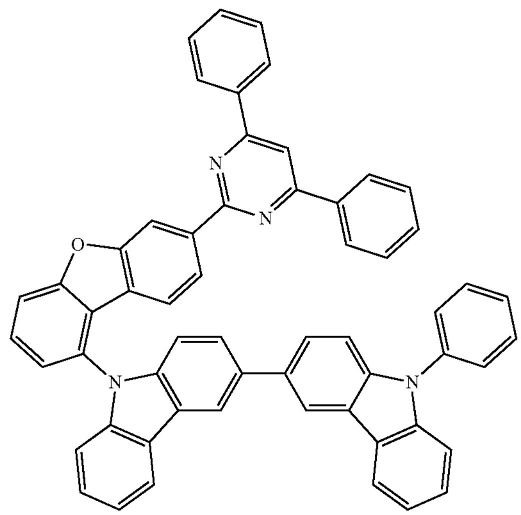
269
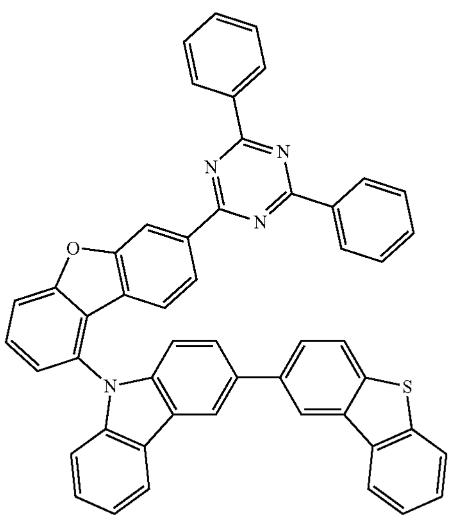
270
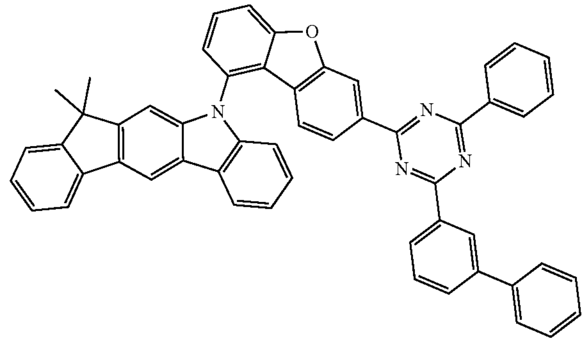
271
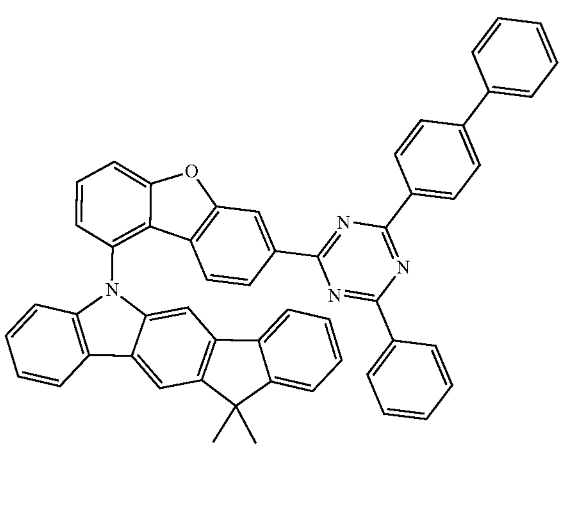

-continued
272
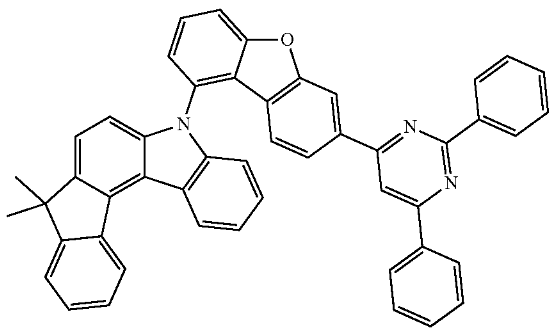
273
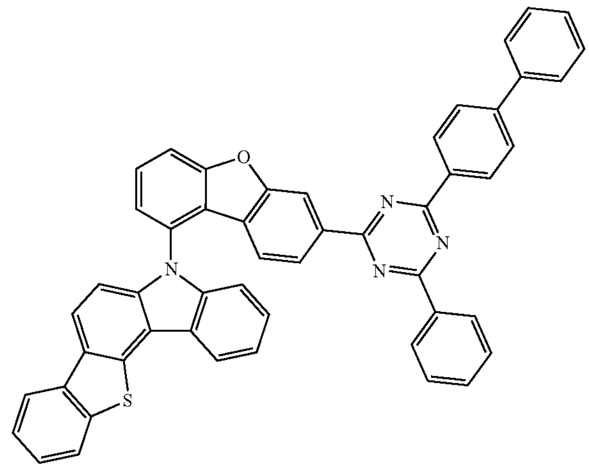
274
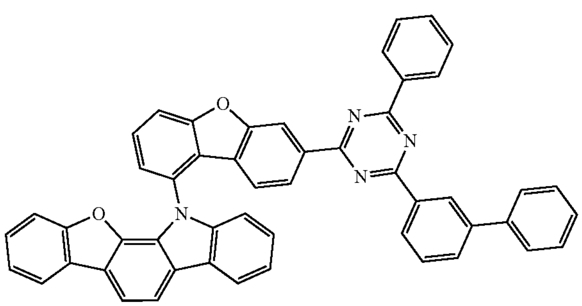
275
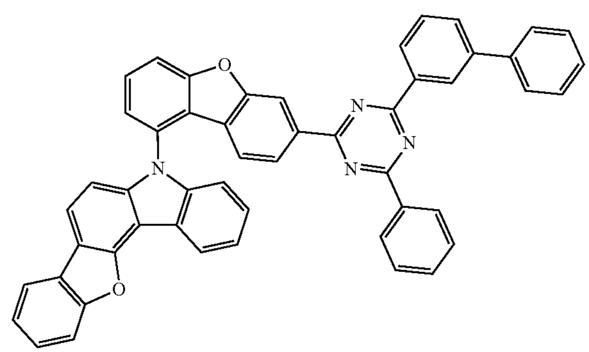
276
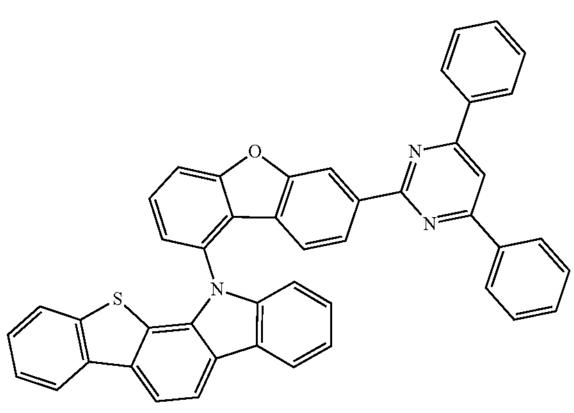
277
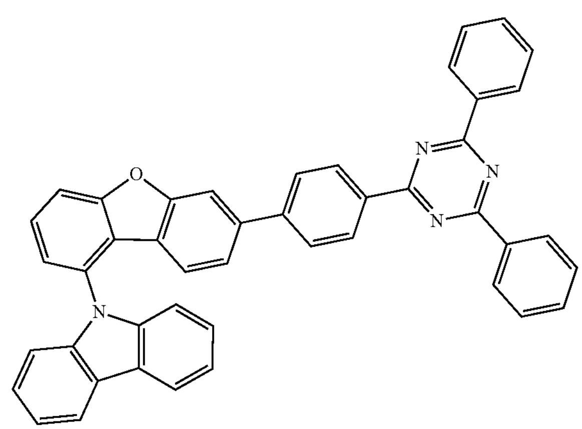

-continued
278
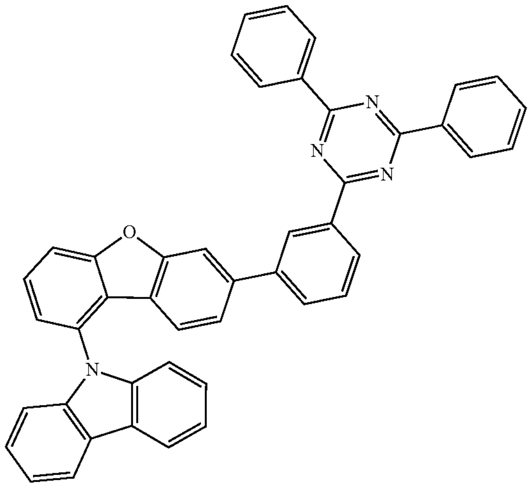
279
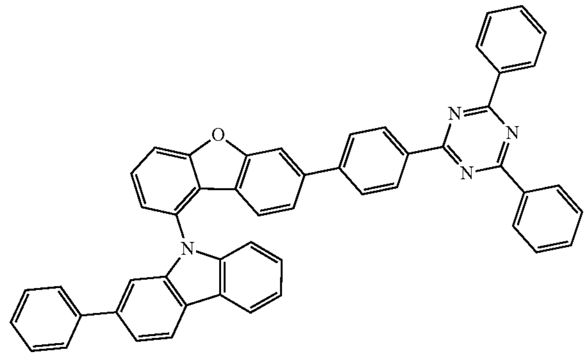
280
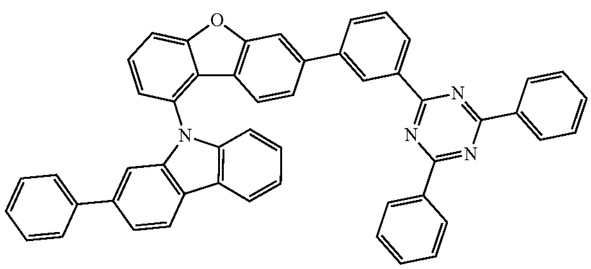
281
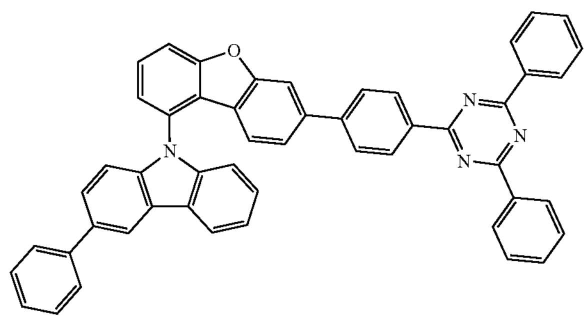
282
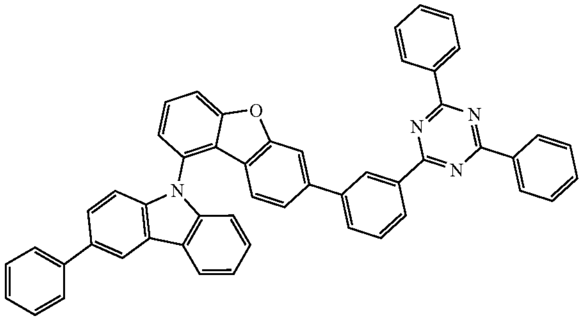
283
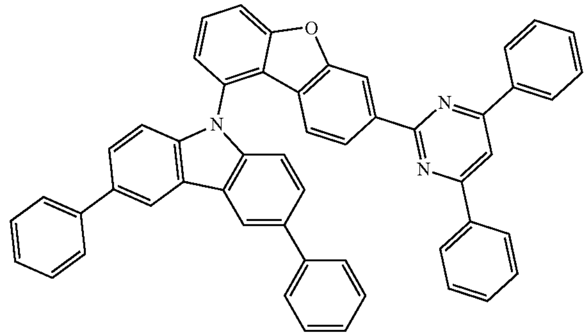

-continued
284
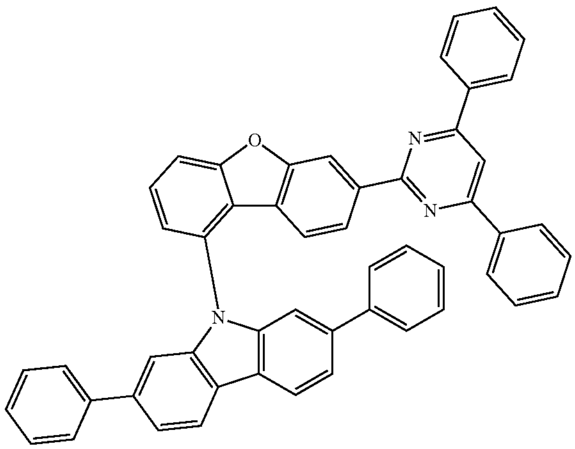
285
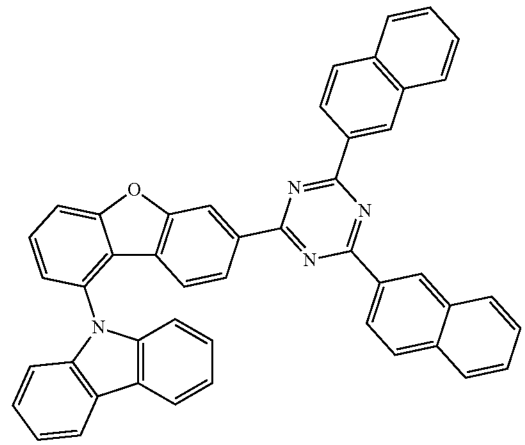
286
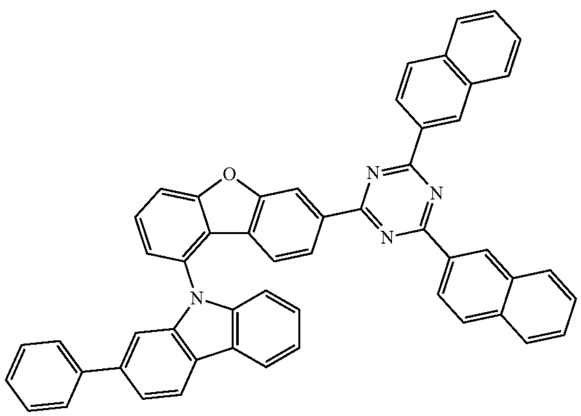
287
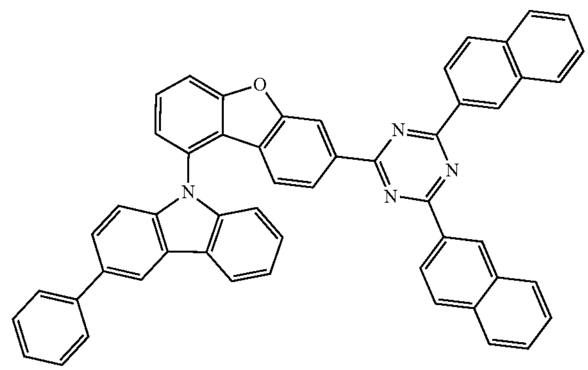
288
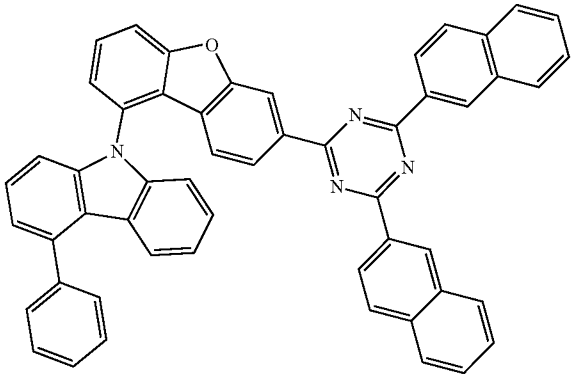
289
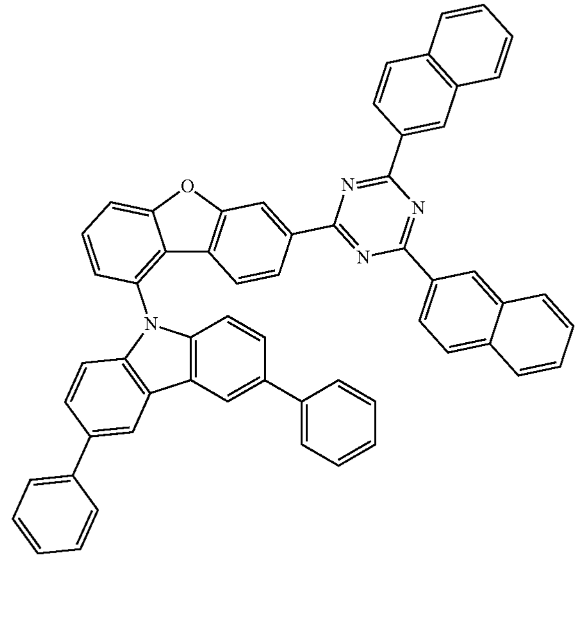

-continued
290
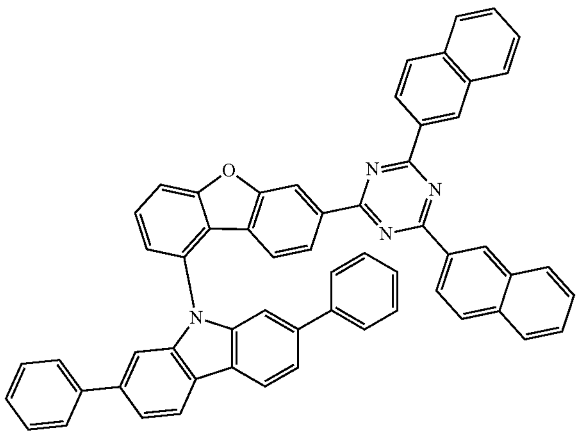
291
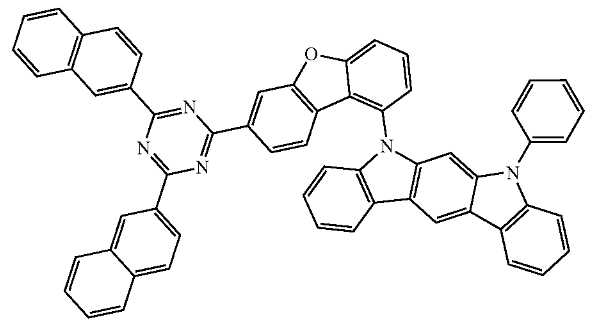
292
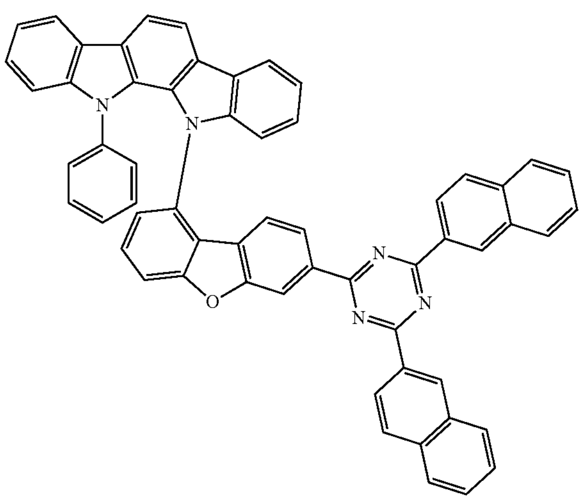
293
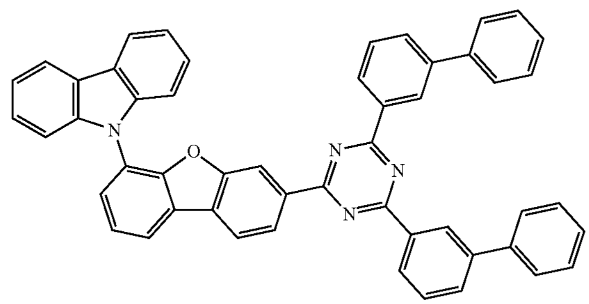
294
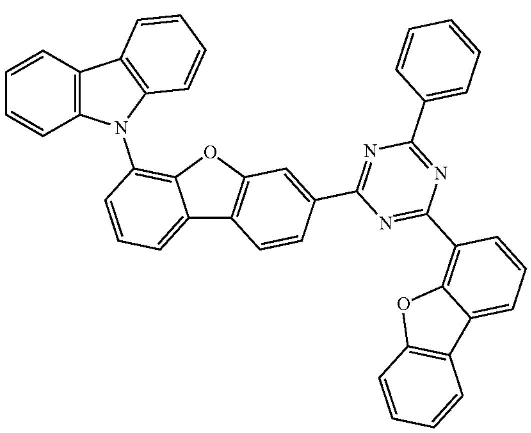
295
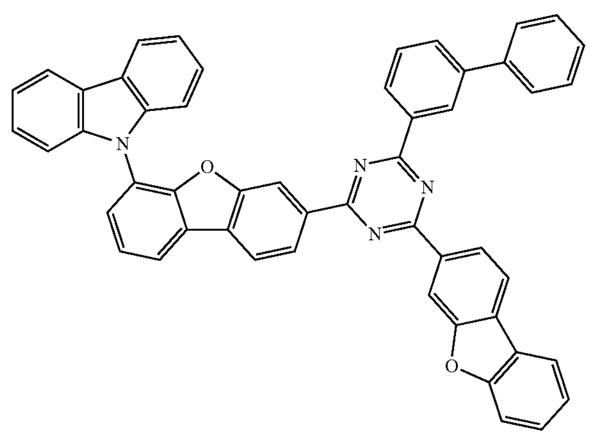

-continued
296
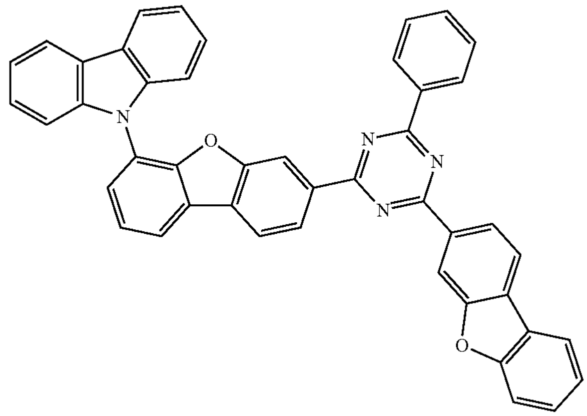
297
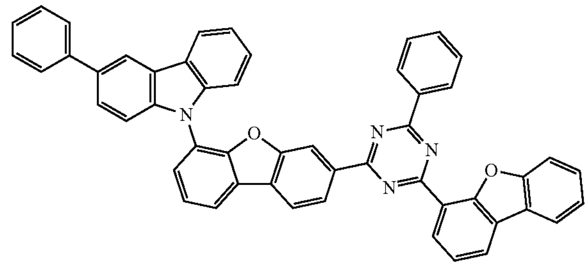
298
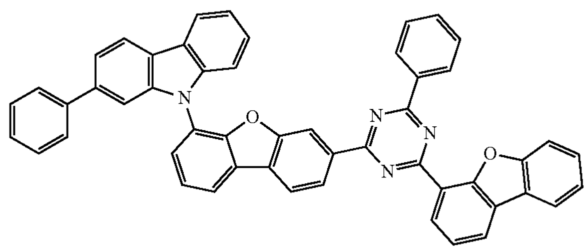
299
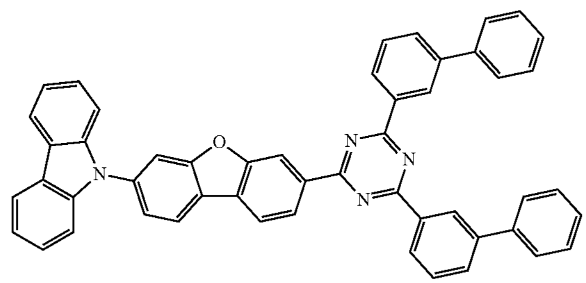
300
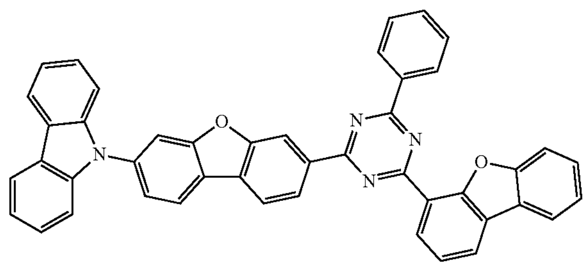
301
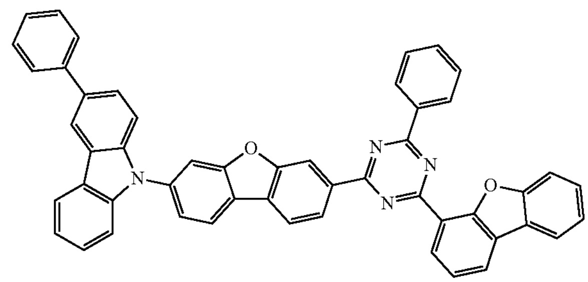
302
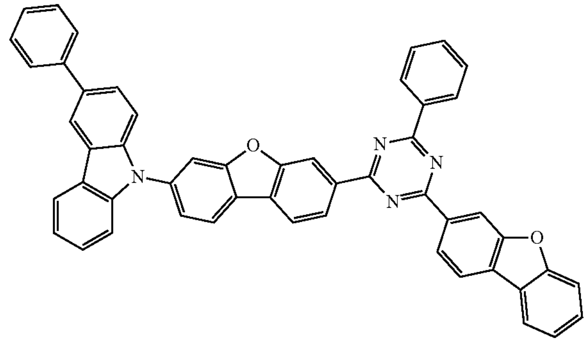
303
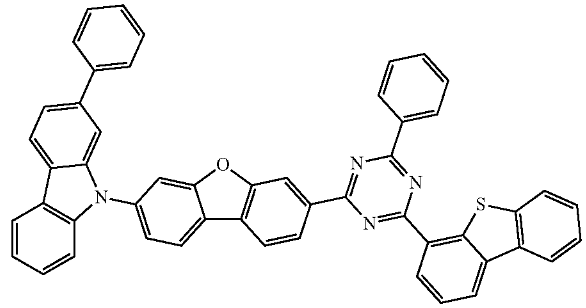

-continued
304
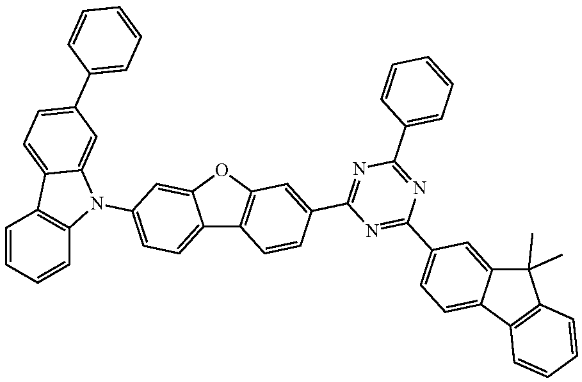
305
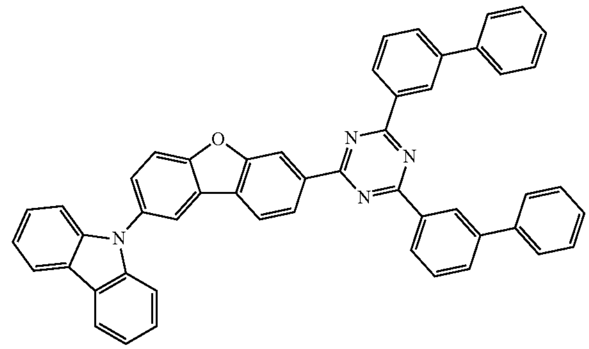
306
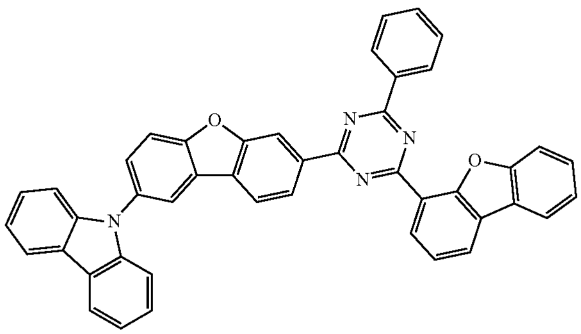
307
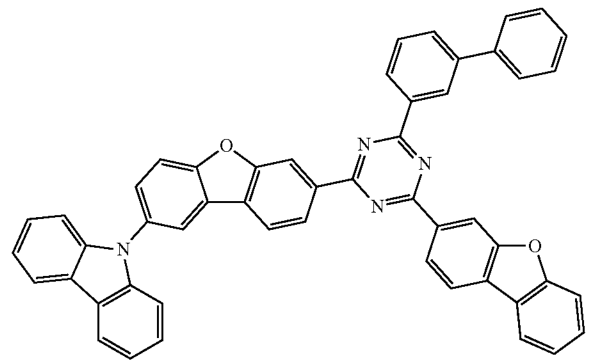
308
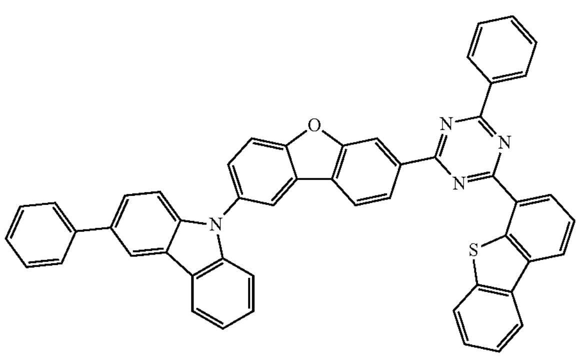
309
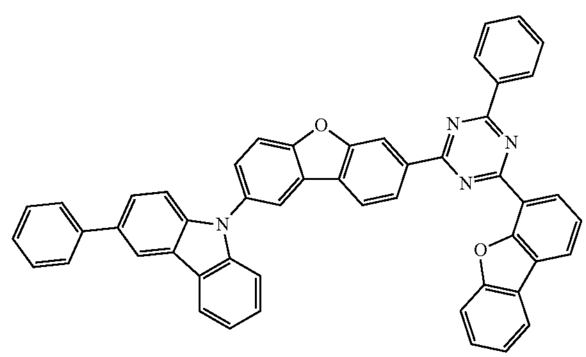
310
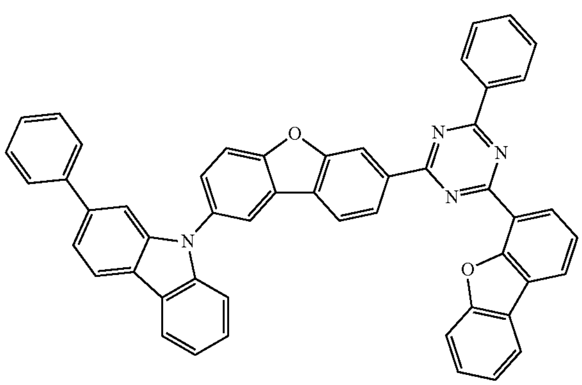
311
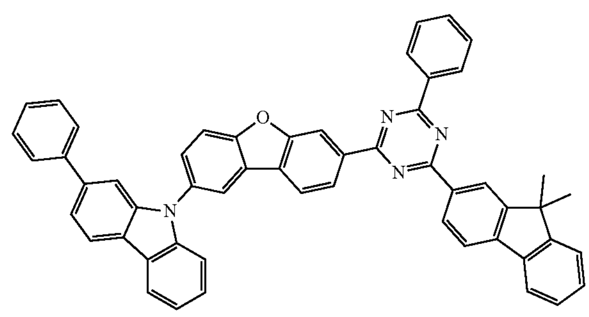

-continued
312
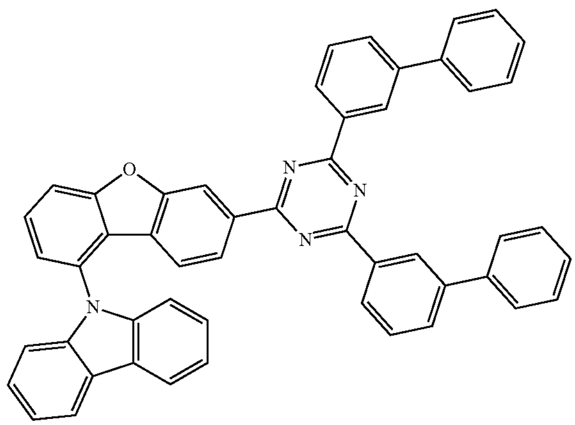
313
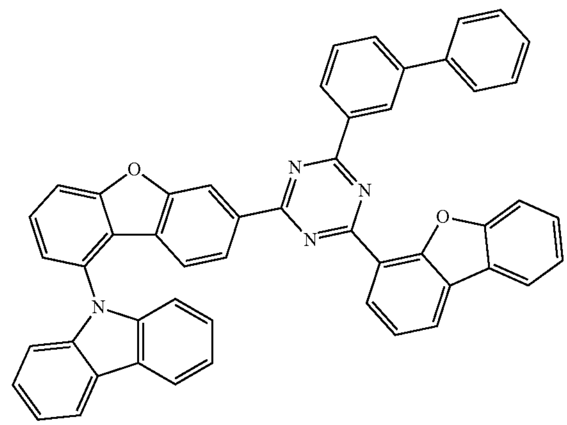
314
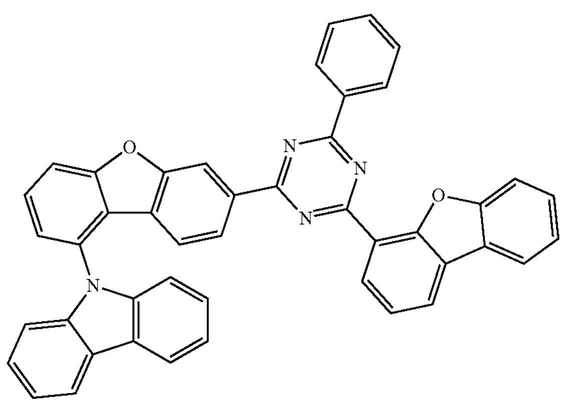
315
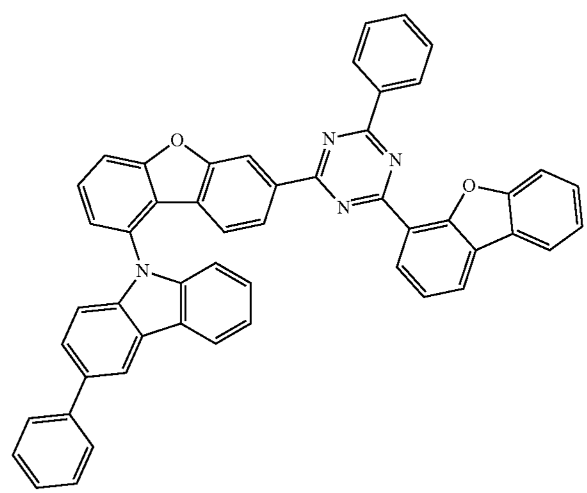
316
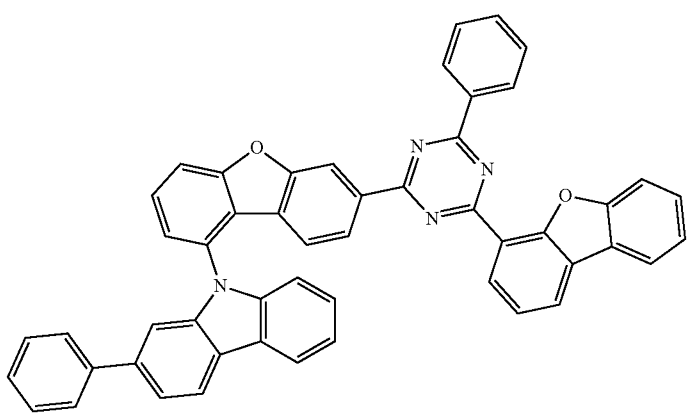

[Group 2]
1
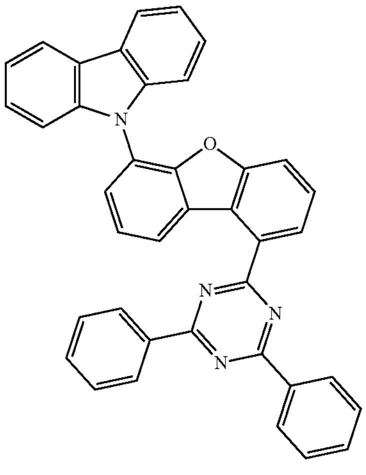
2
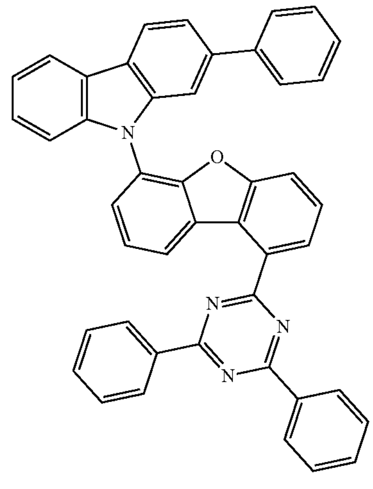
3
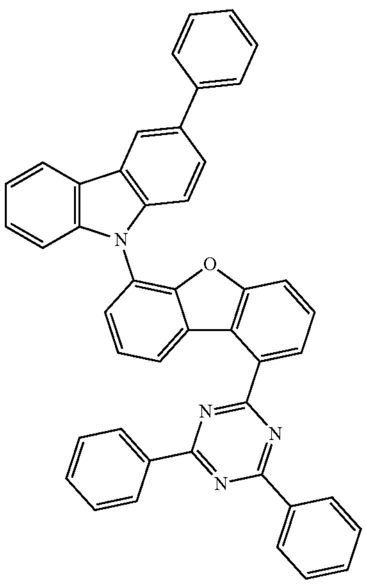
4
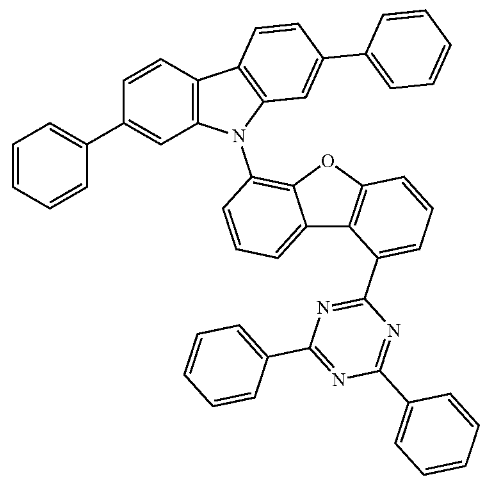
5
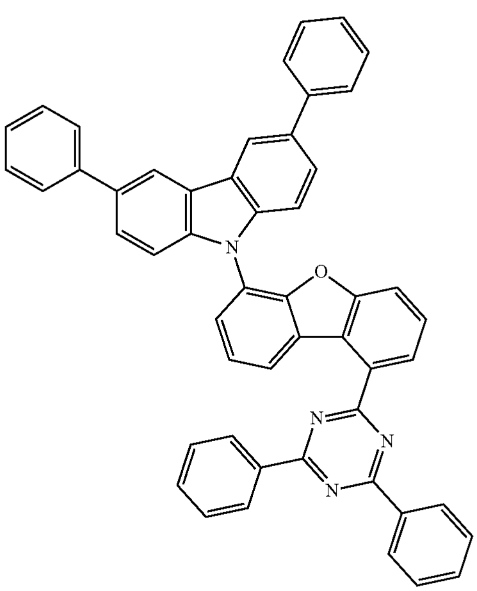
6
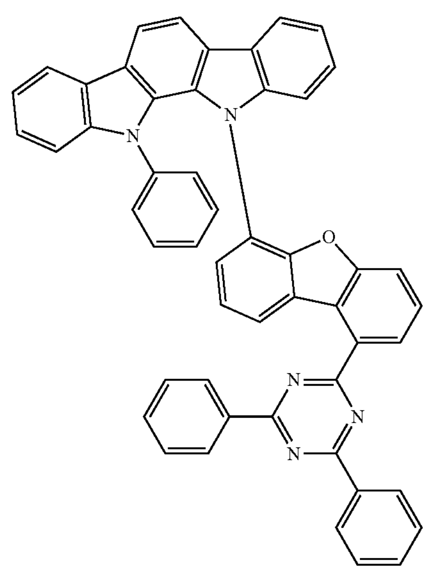

-continued
7
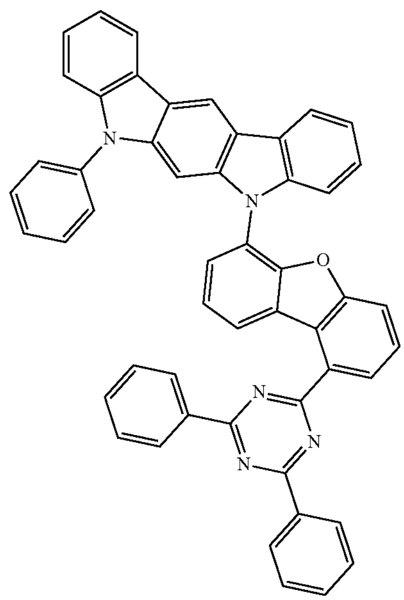
8
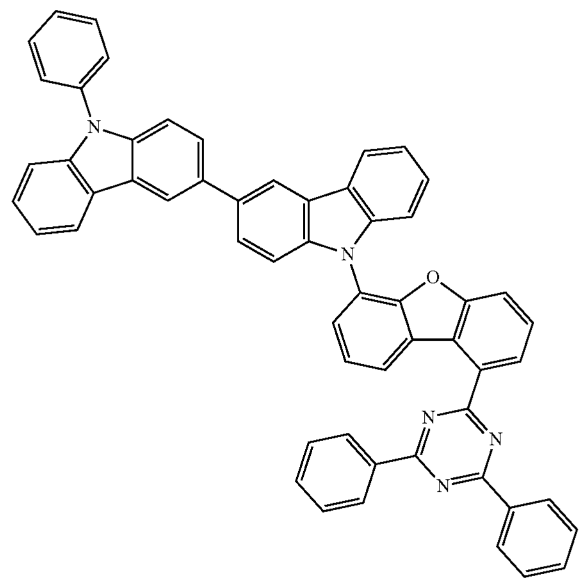
9
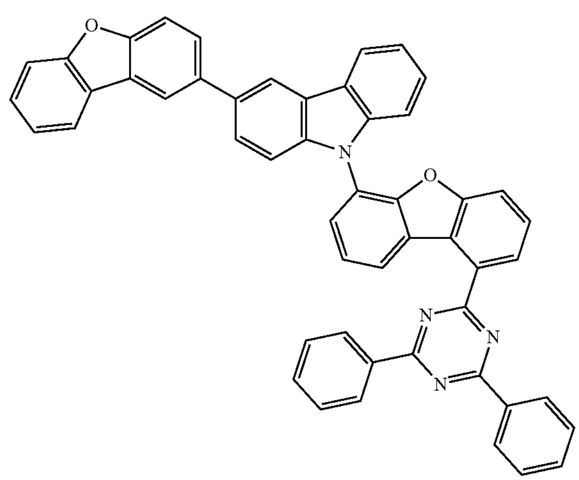
10
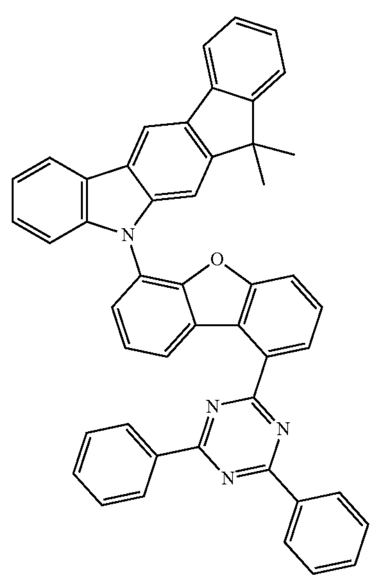

-continued
11
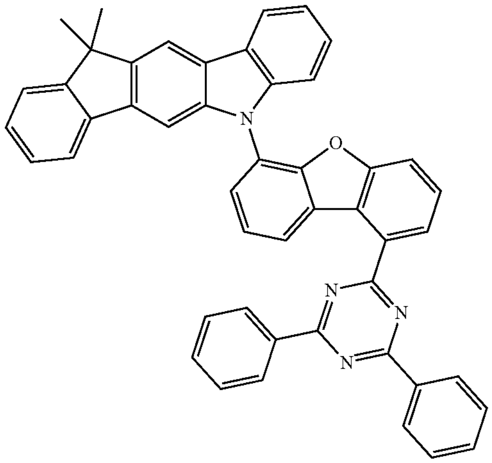
12
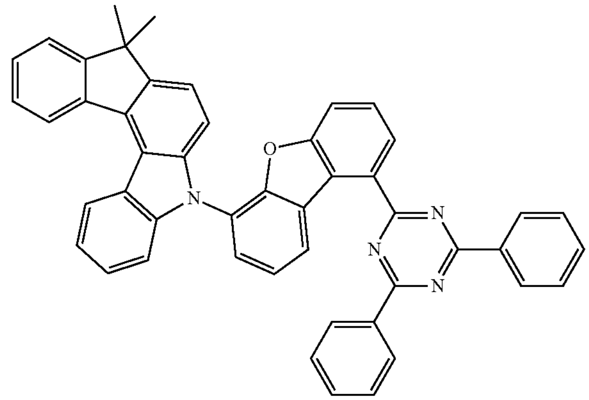
13
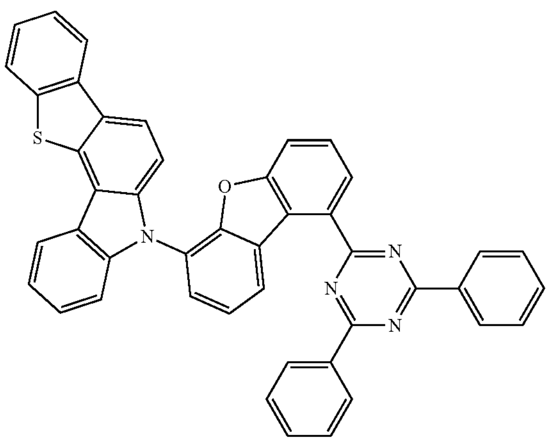
14
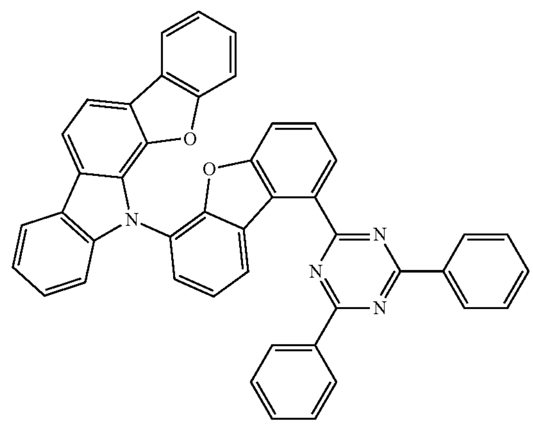
15
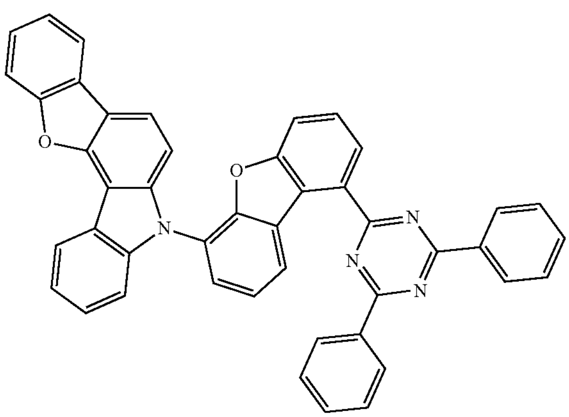
16
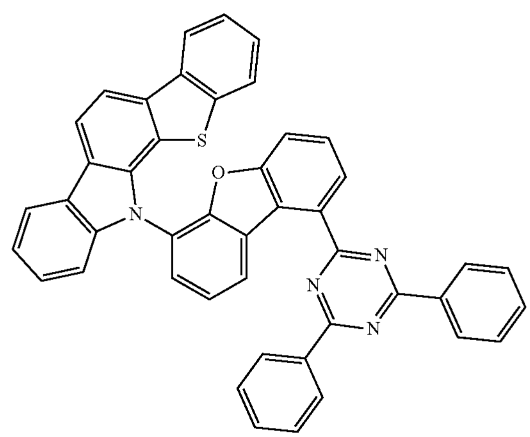

-continued
17
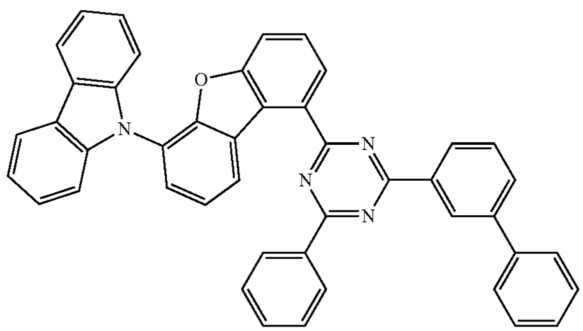
17
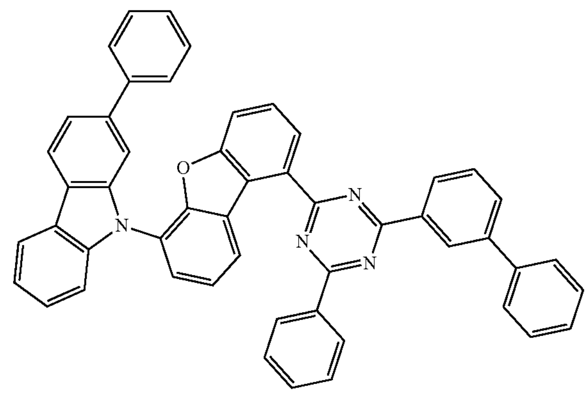
19
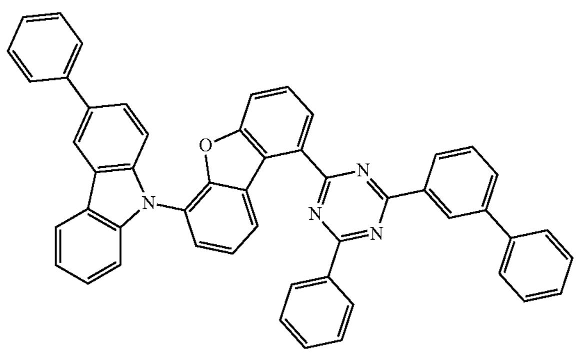
20
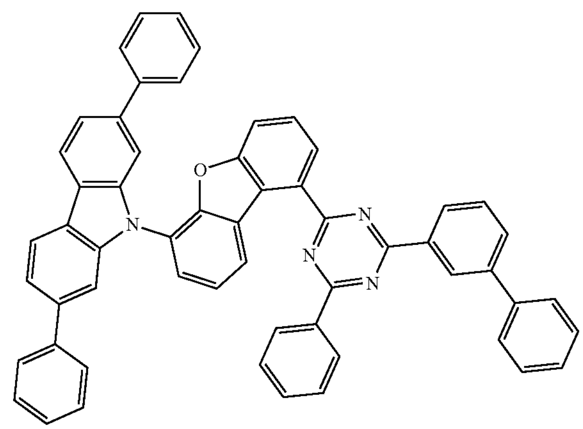
21
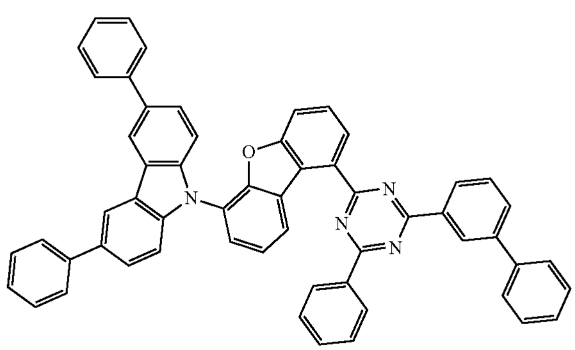
22
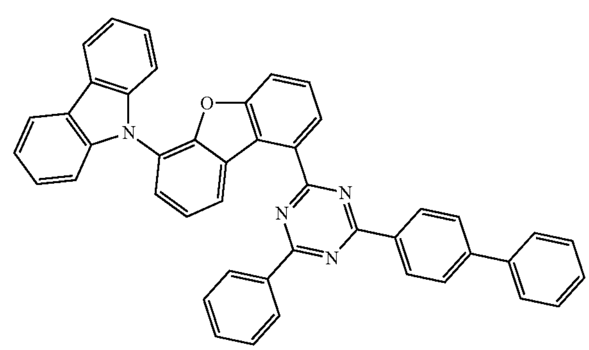

-continued
23
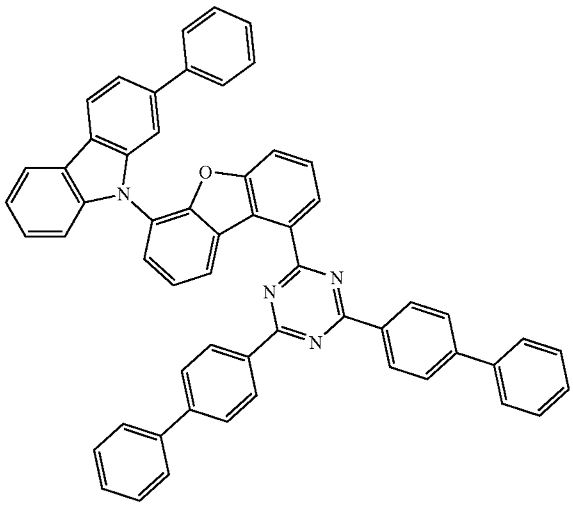
24
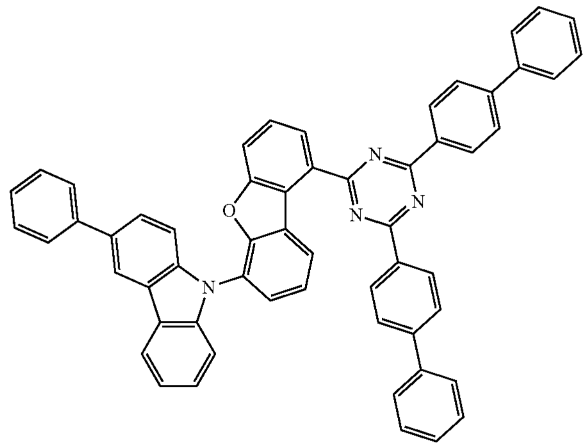
25
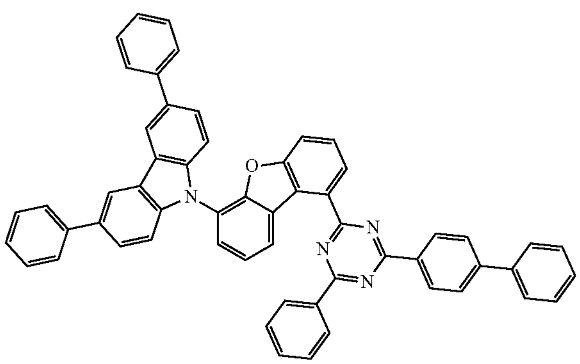
26
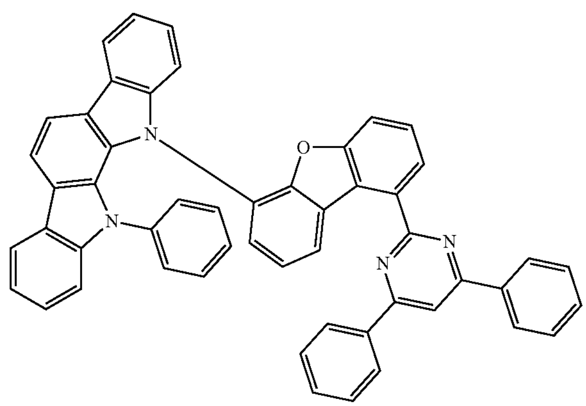
27
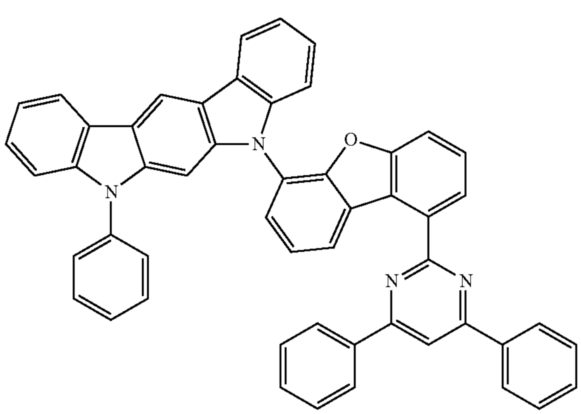
28
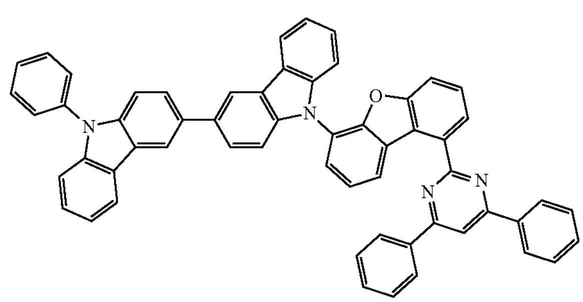

-continued
29
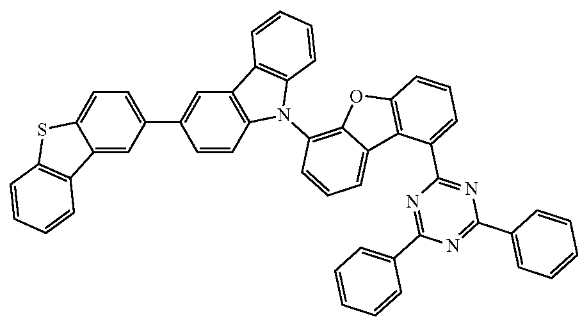
30
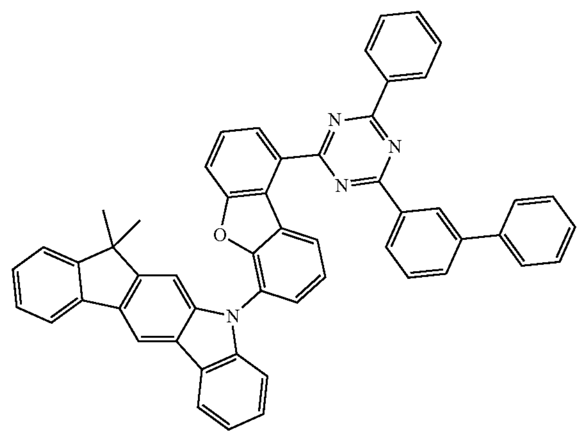
31
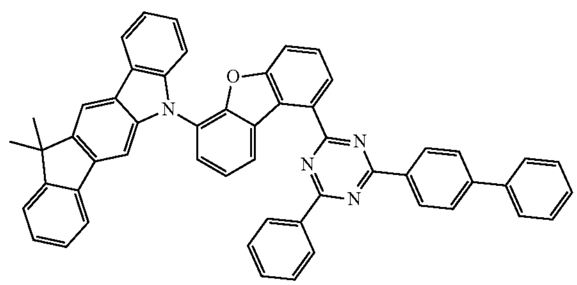
32
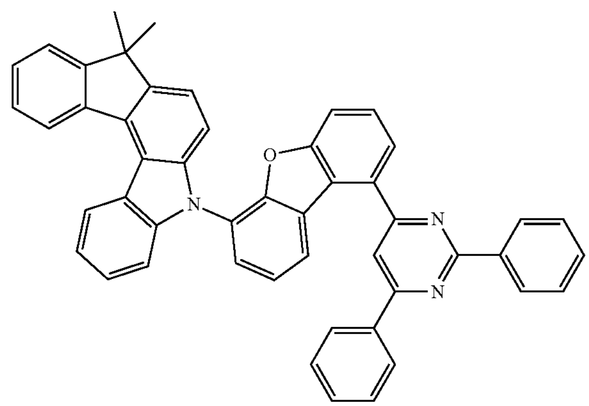
33
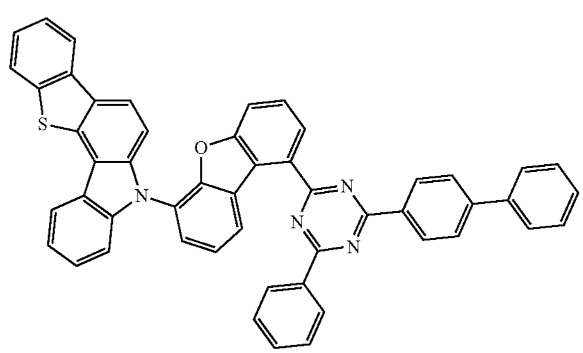
34
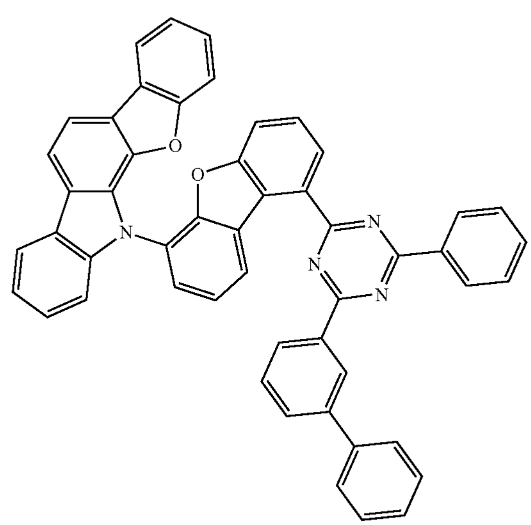

-continued
35
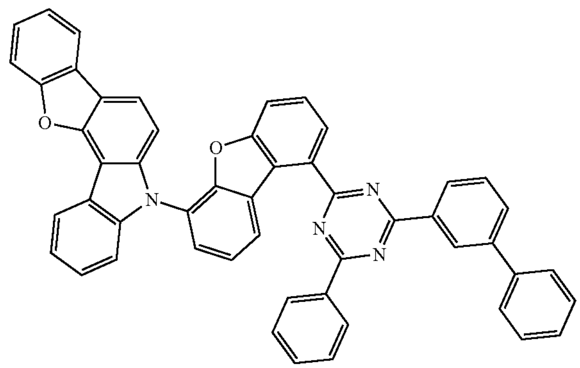
36
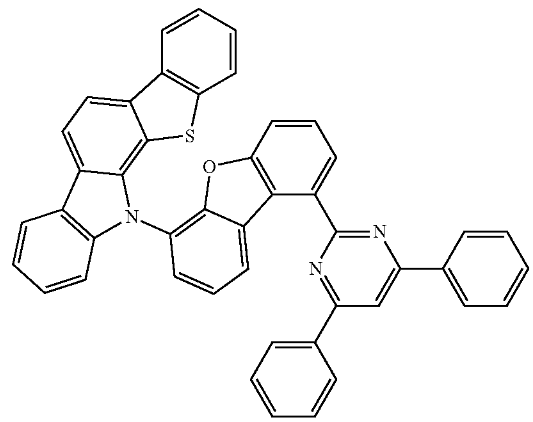
37
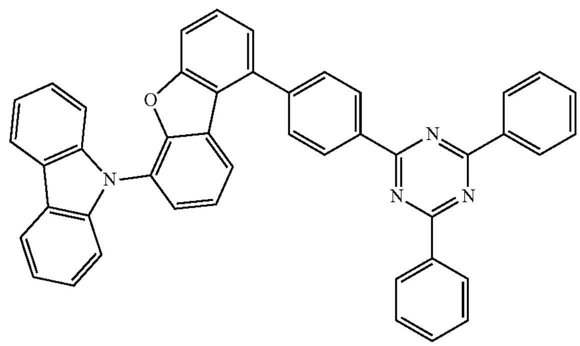
38
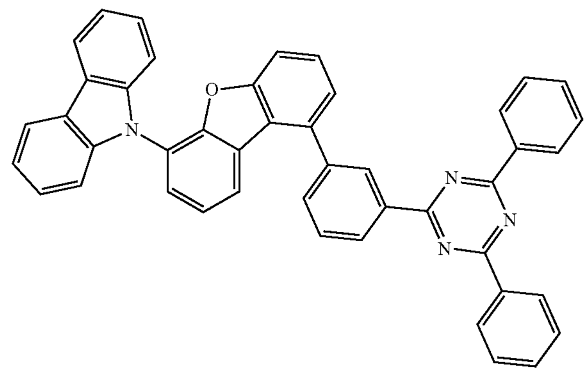
39
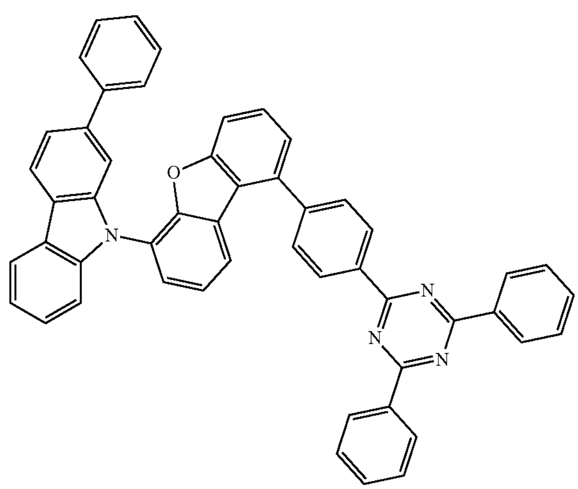
40
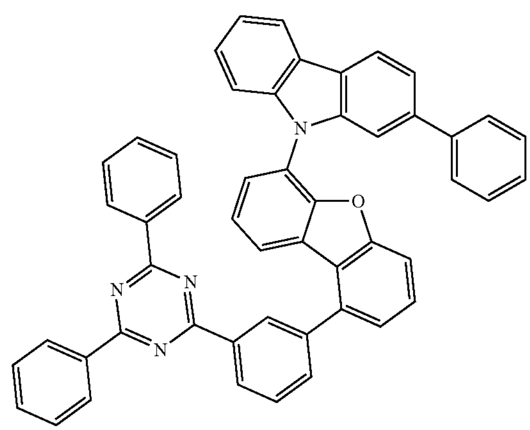

-continued
41
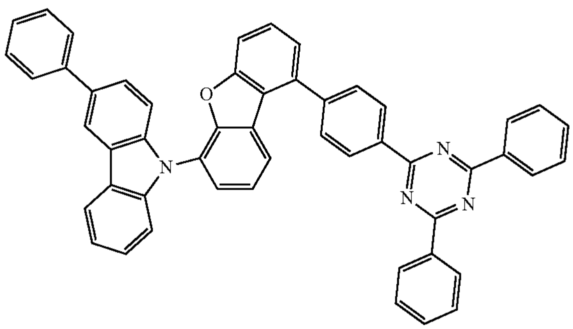
42
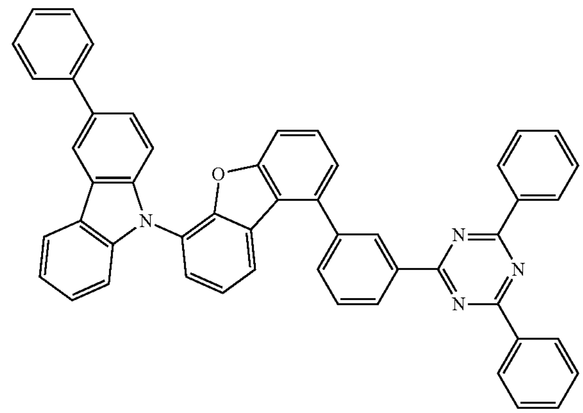
43
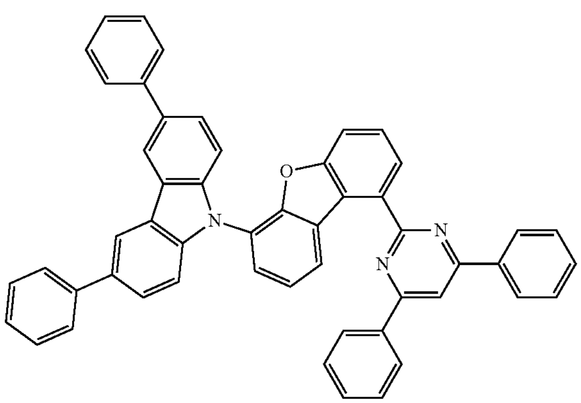
44
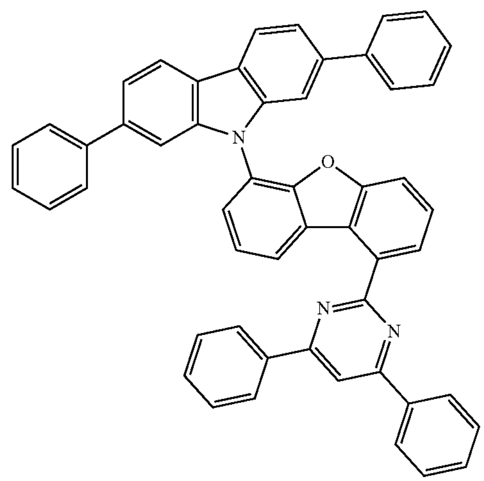
45
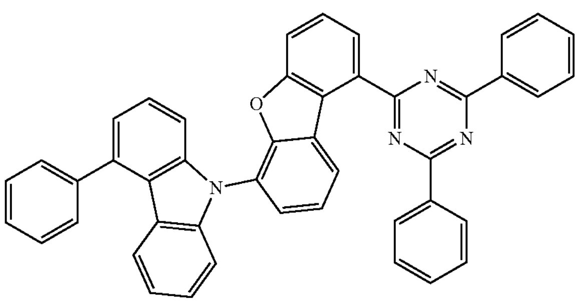
46
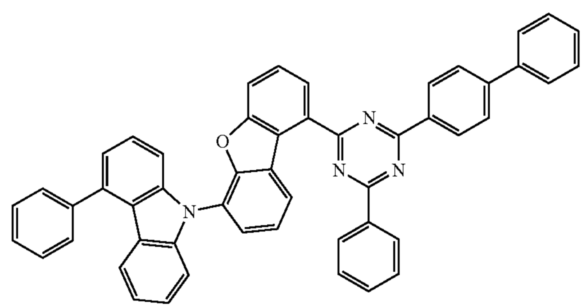

-continued
47
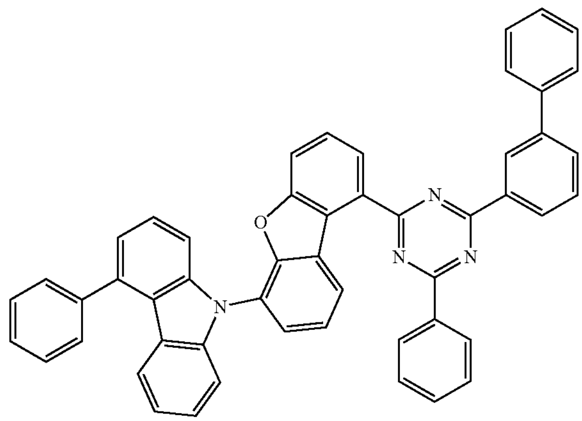
48
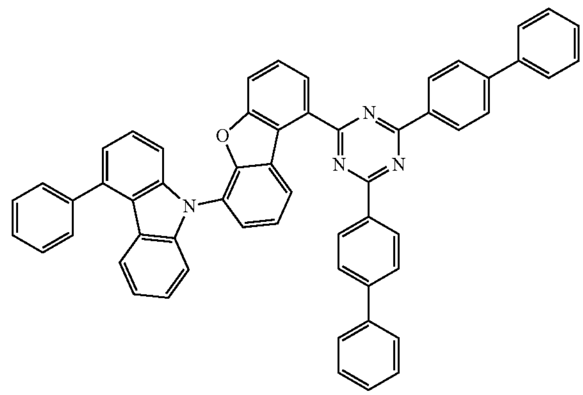
49
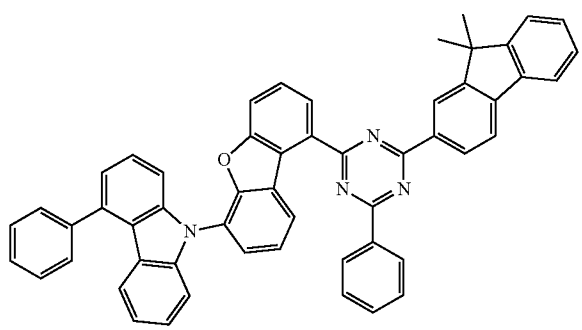
50
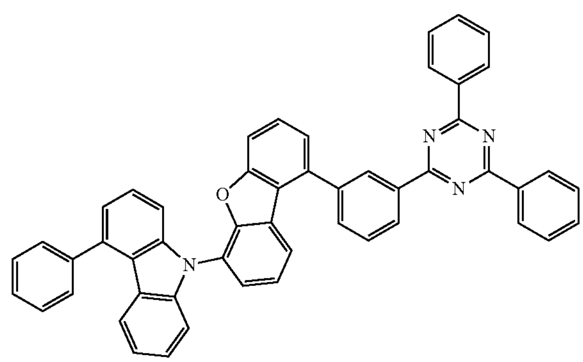
51
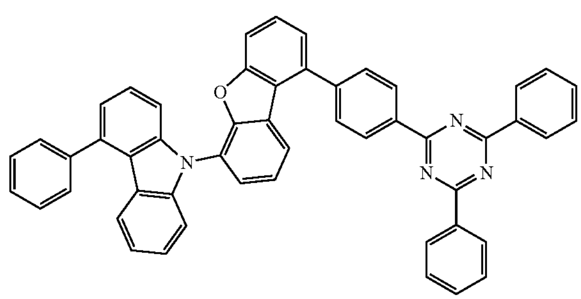
52
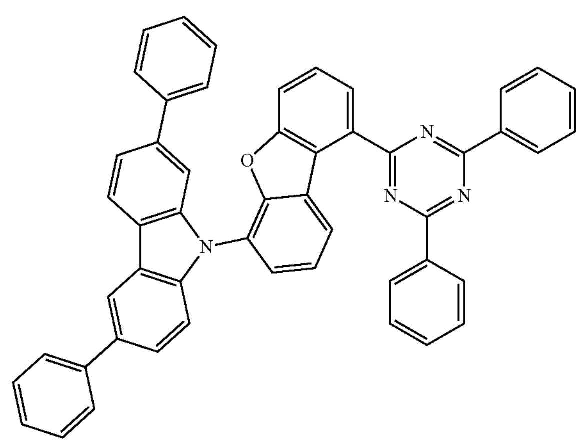

-continued
53
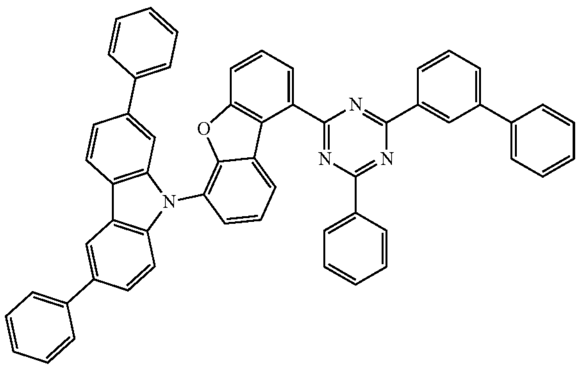
54
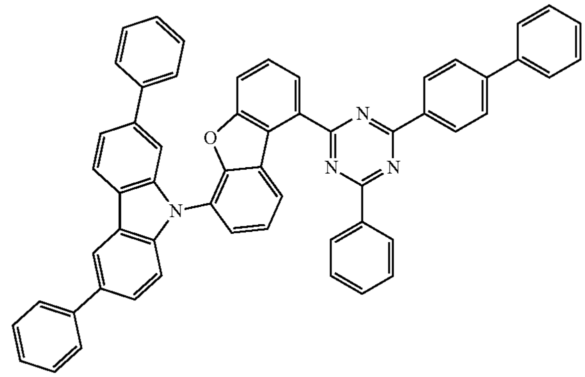
55
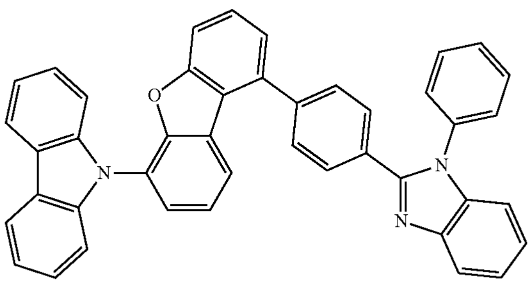
56
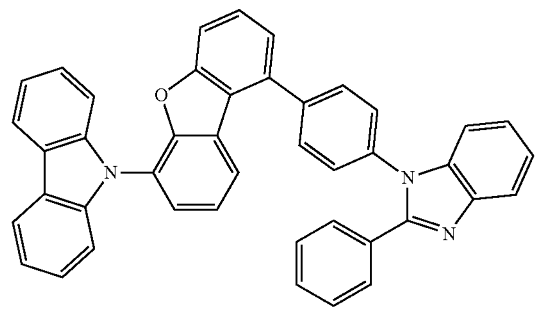
57
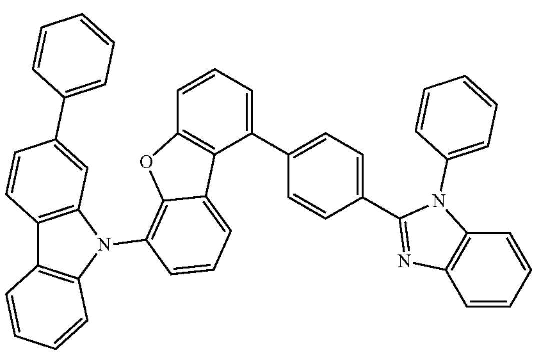
58
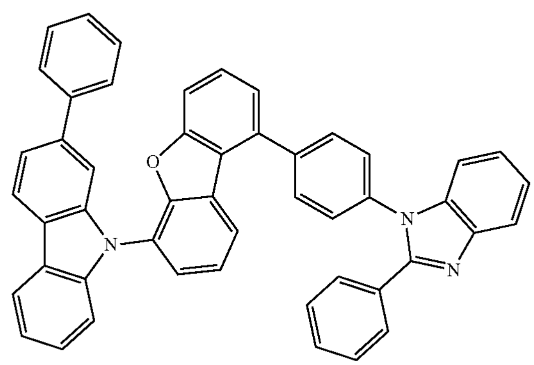
59
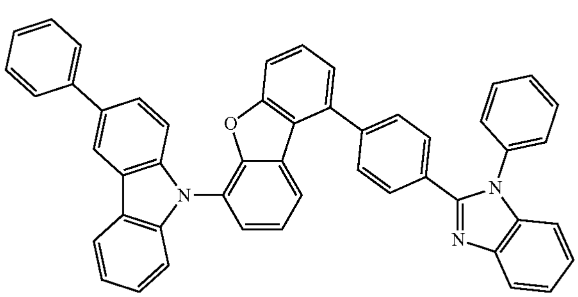
60
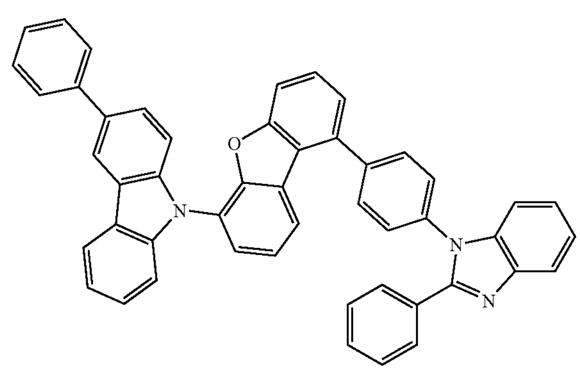

-continued
61
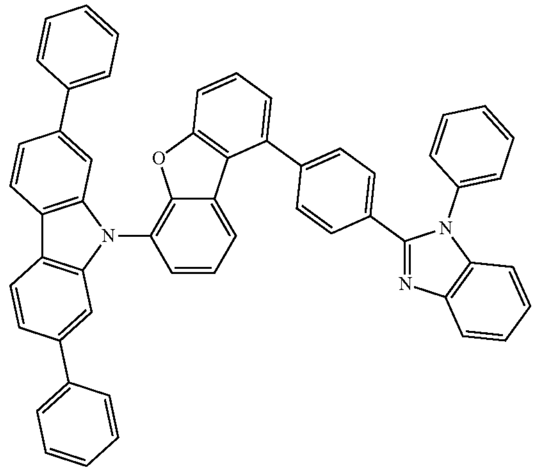
62
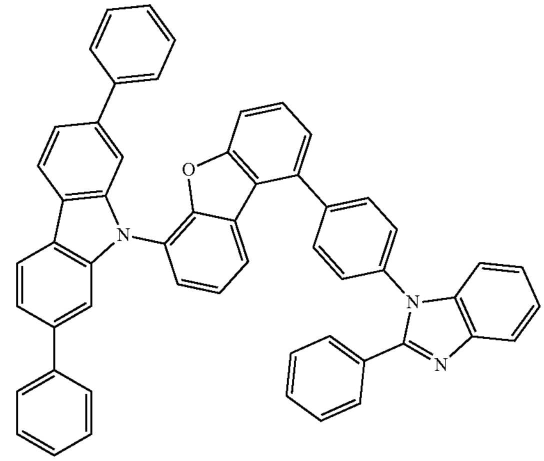
63
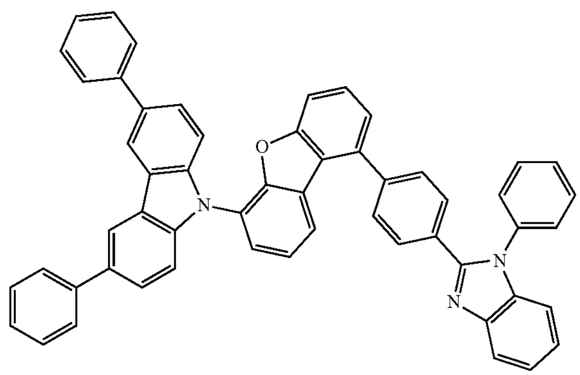
64
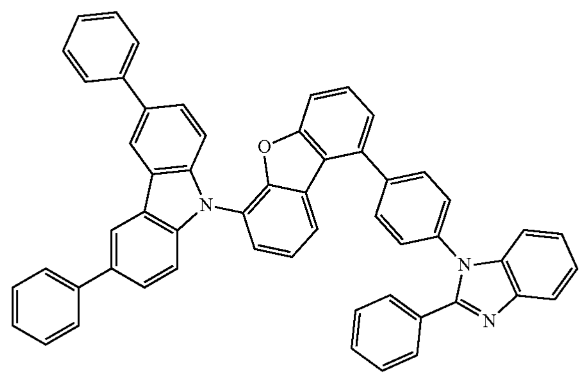
65
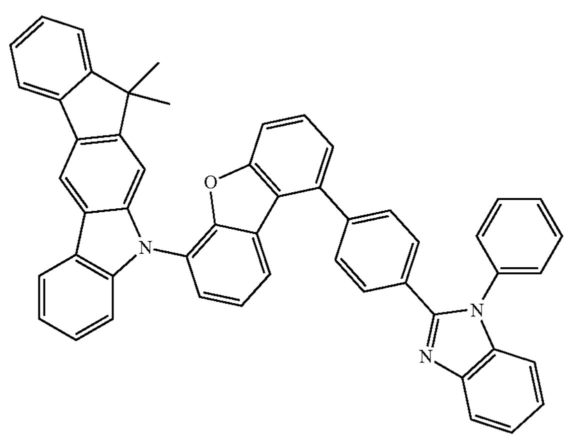
66
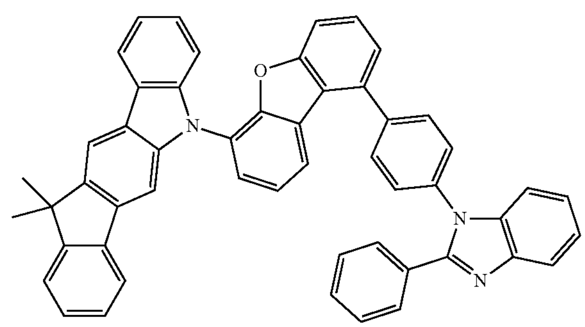

-continued
67
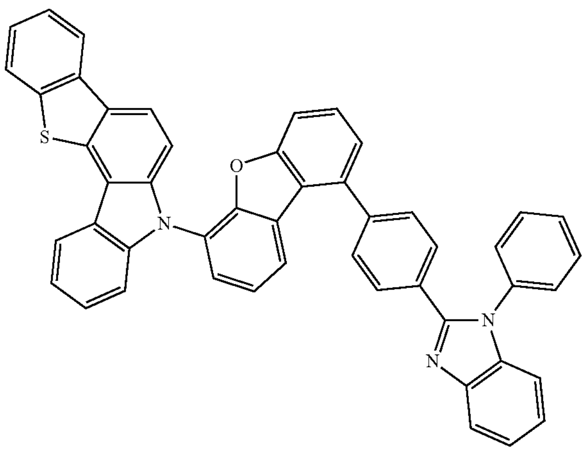
68
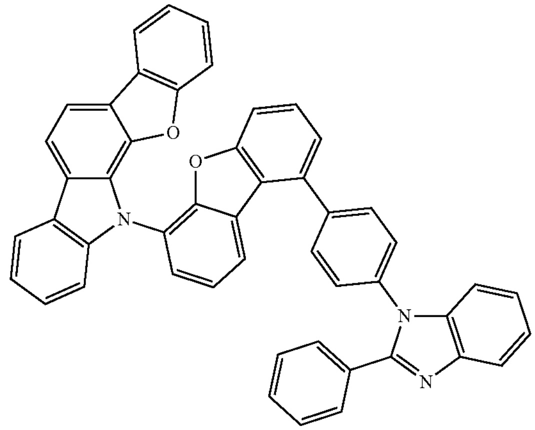
69
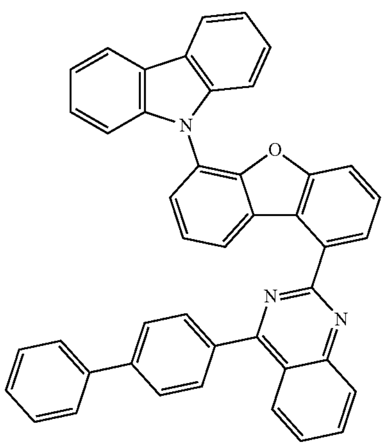
70
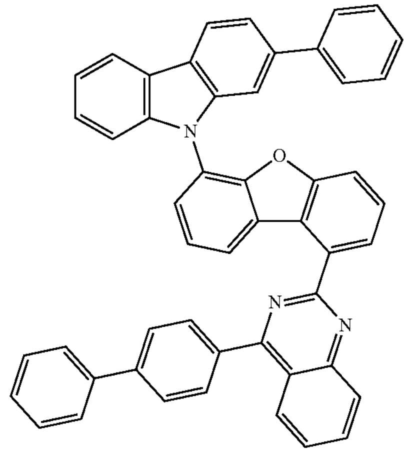
71
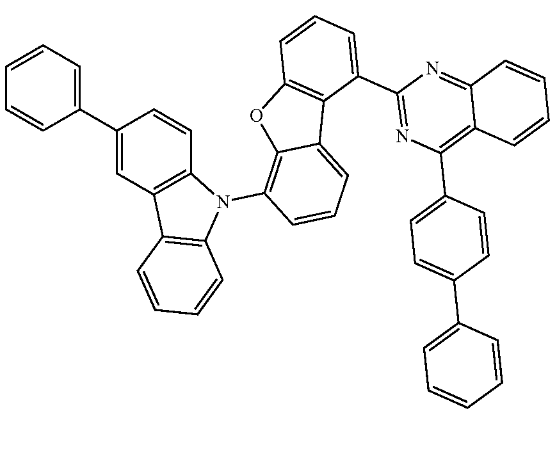
72
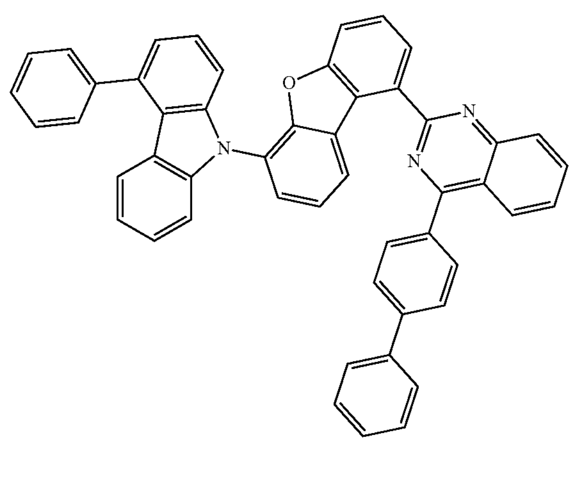

-continued
73
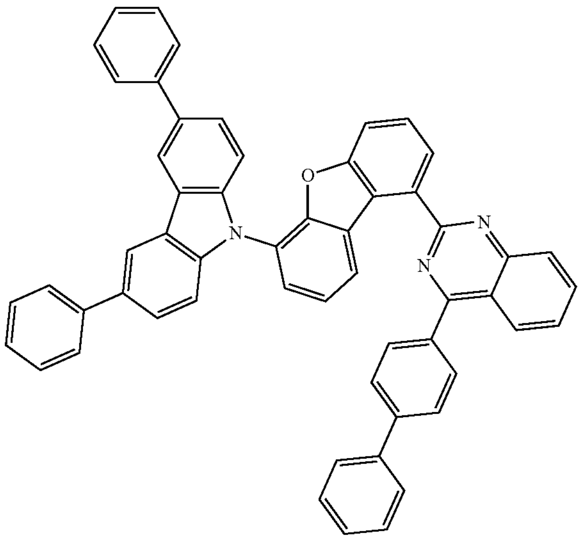
74
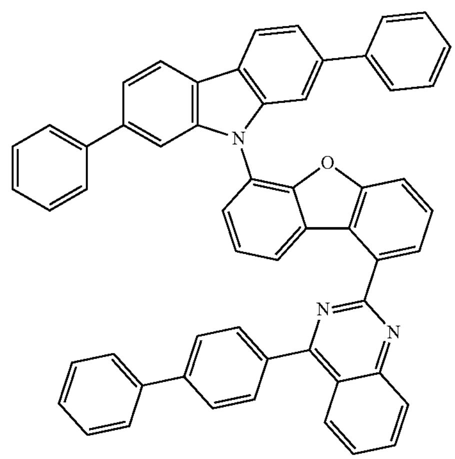
75
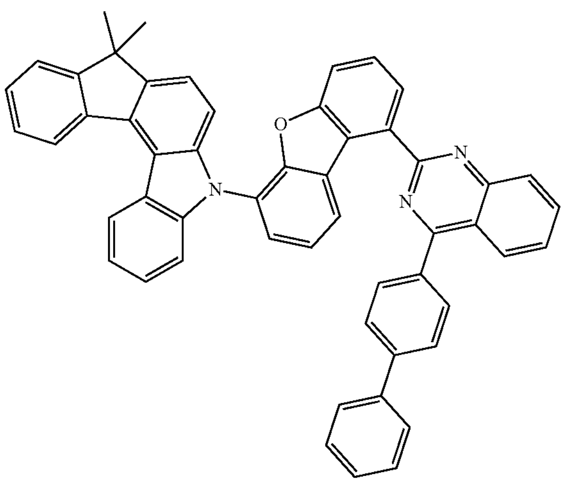
76
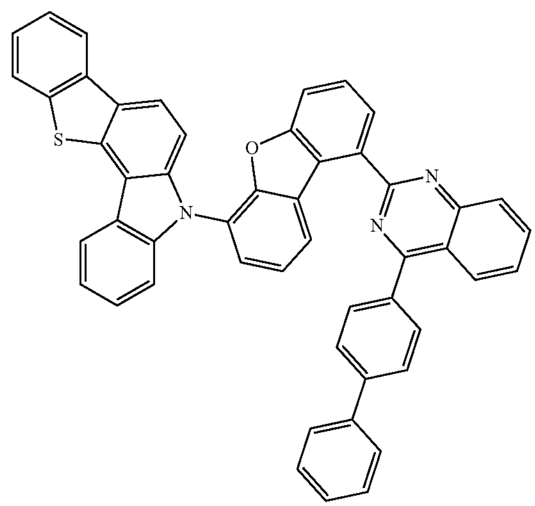
77
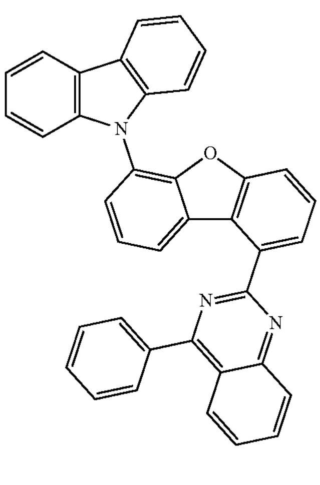
78
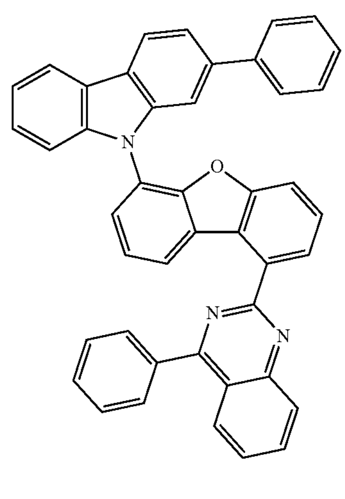

-continued
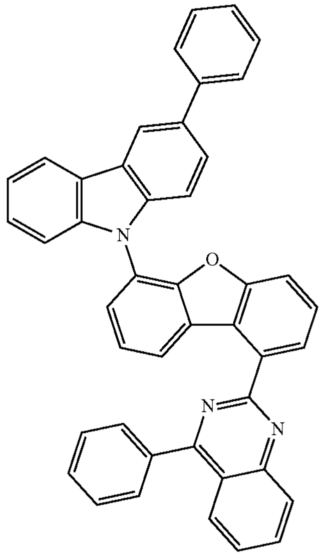
79
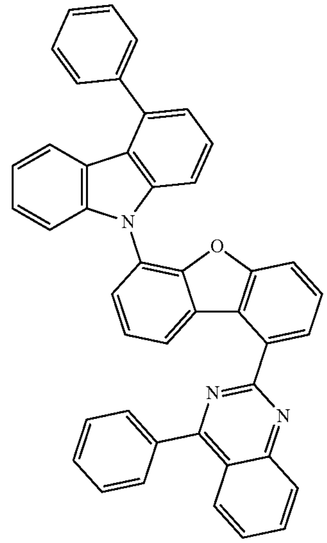
80
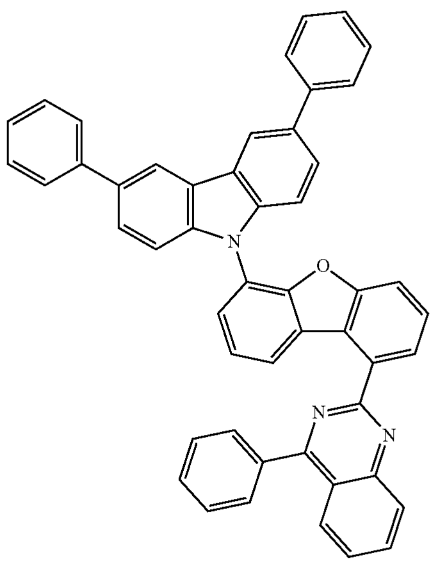
81
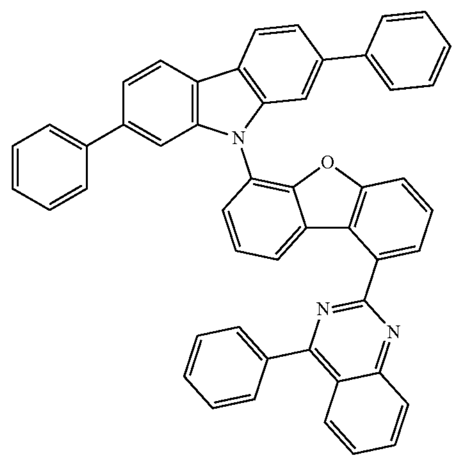
82
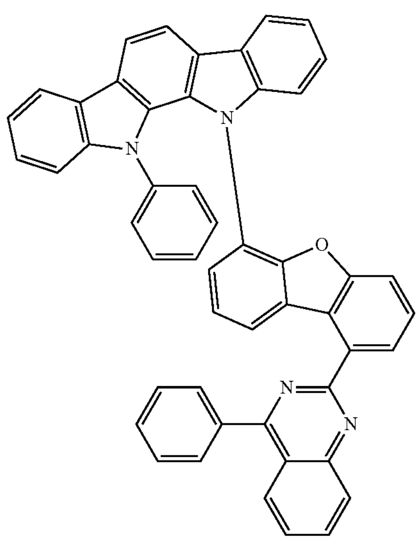
83
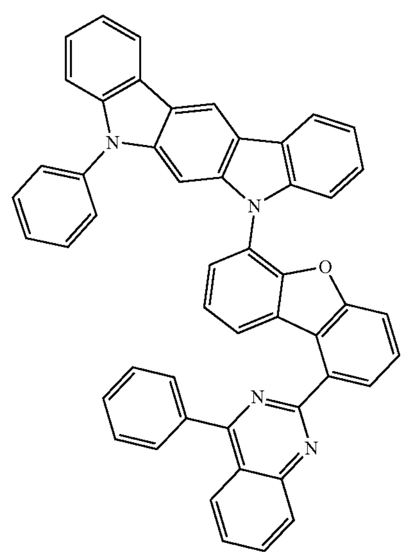
84

-continued
85
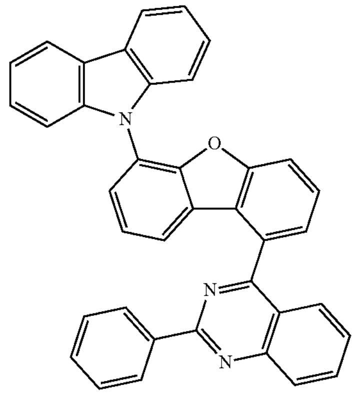
86
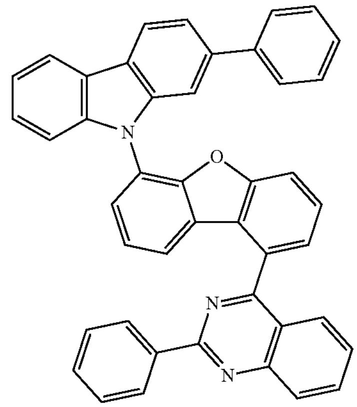
87
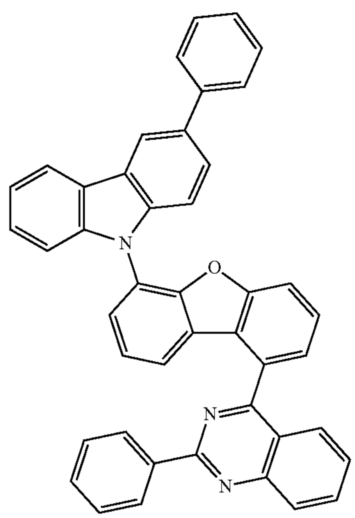
88
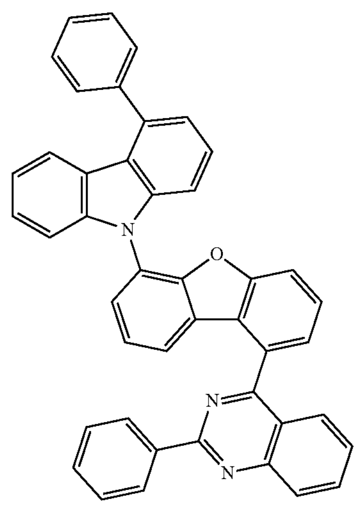
89
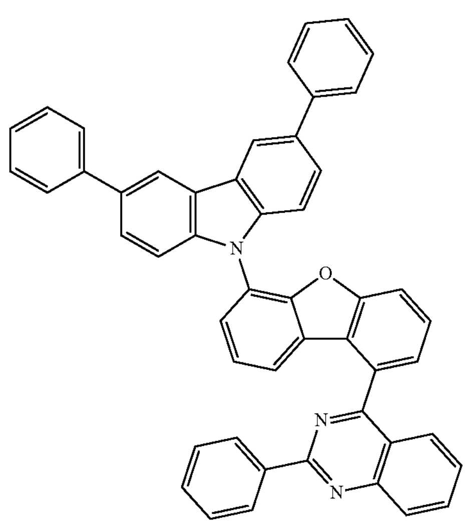
90
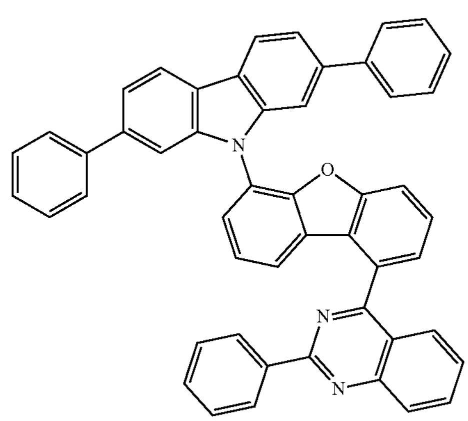

-continued
91
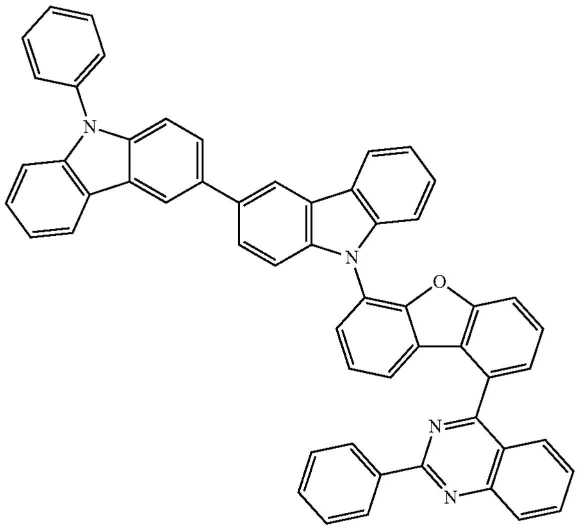
92
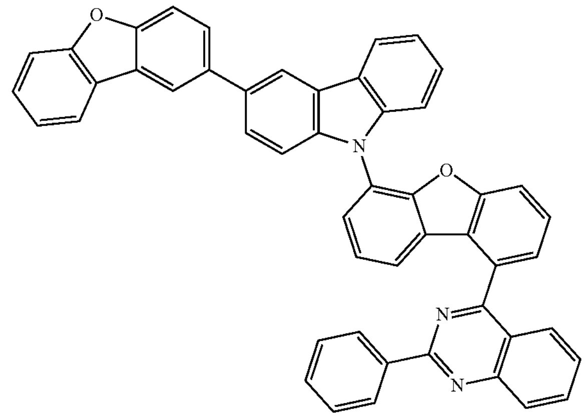
93
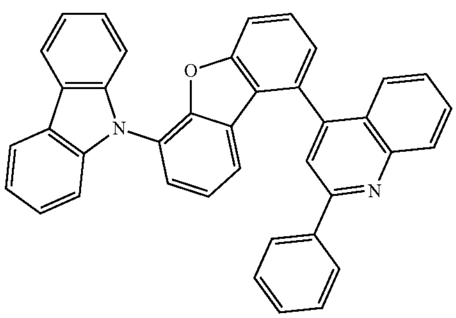
94
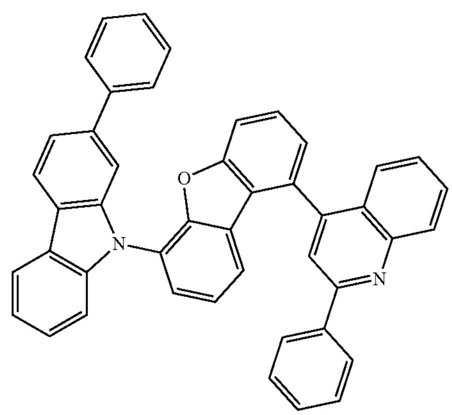
95
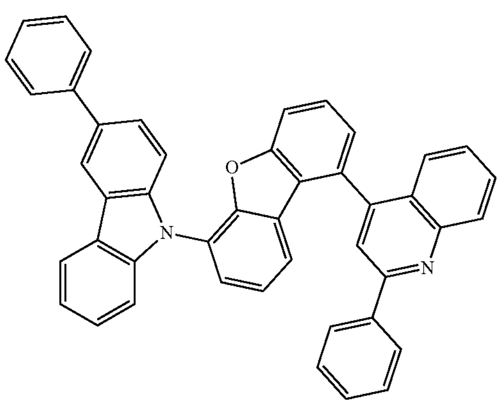
96
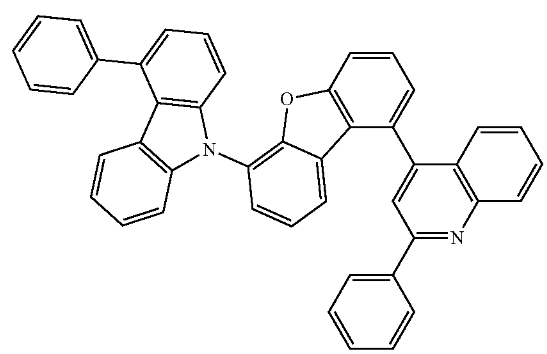

-continued
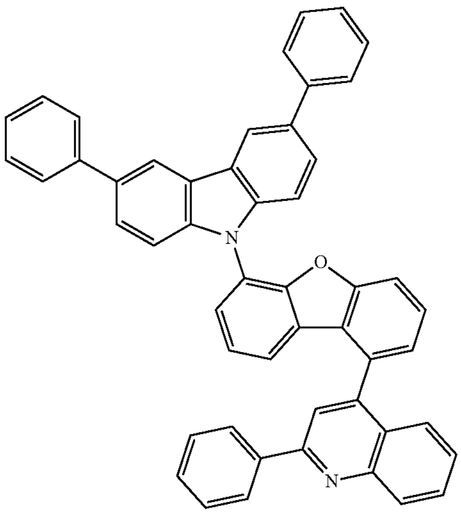
97
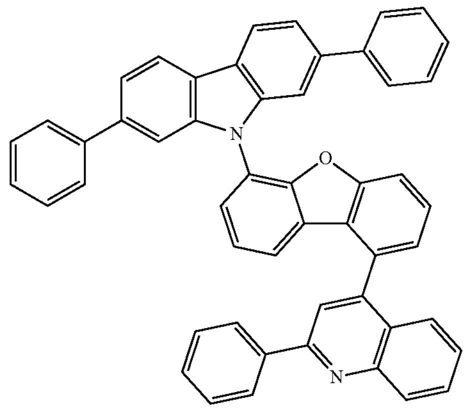
98
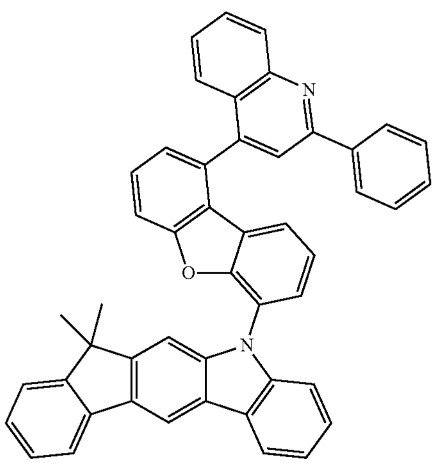
99
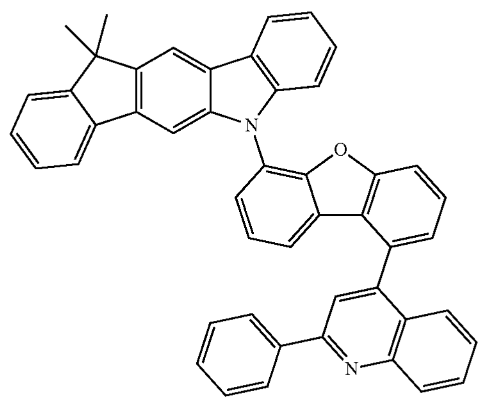
100
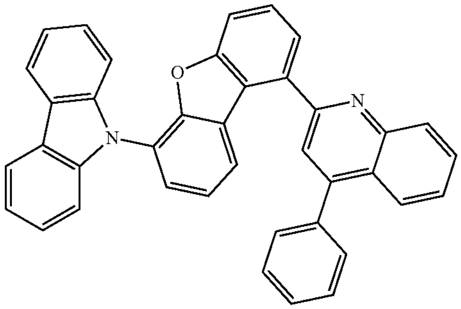
101
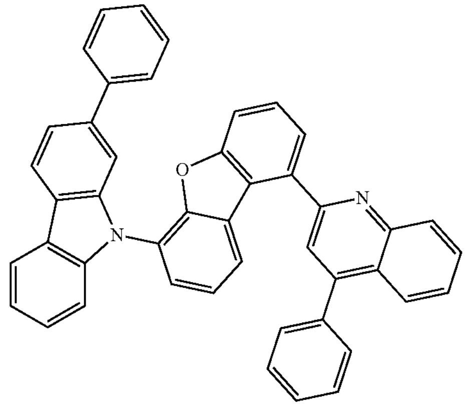
102

-continued
103
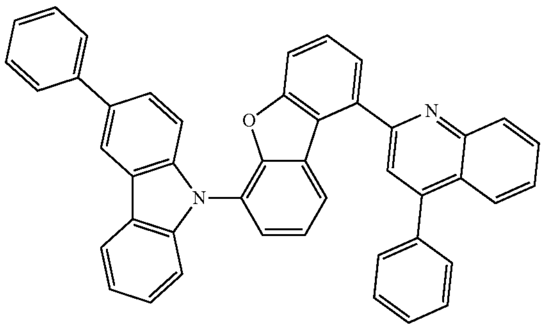
104
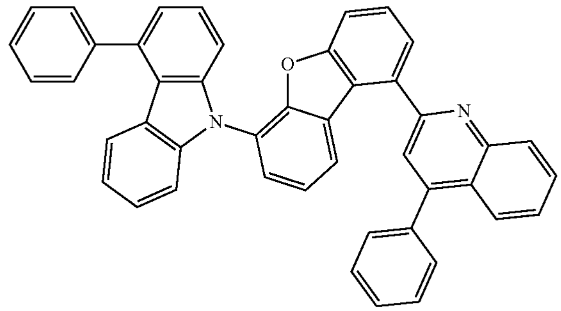
105
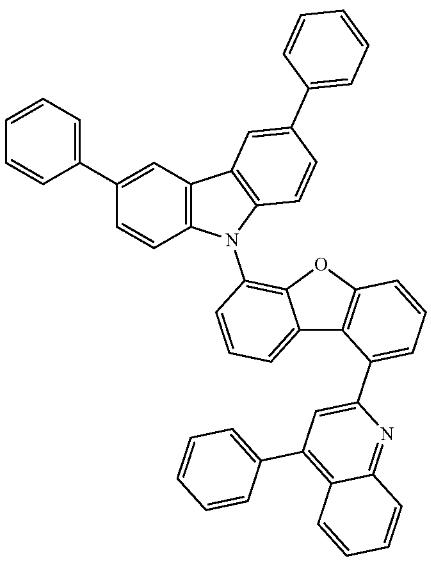
106
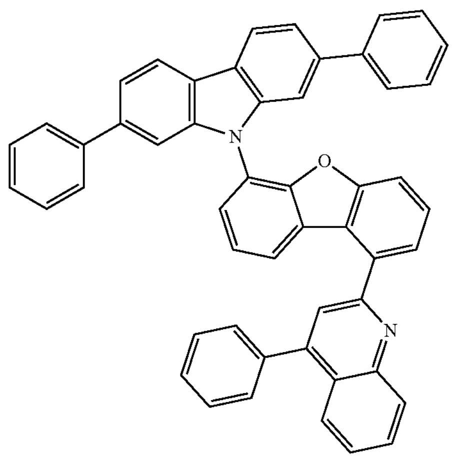
107
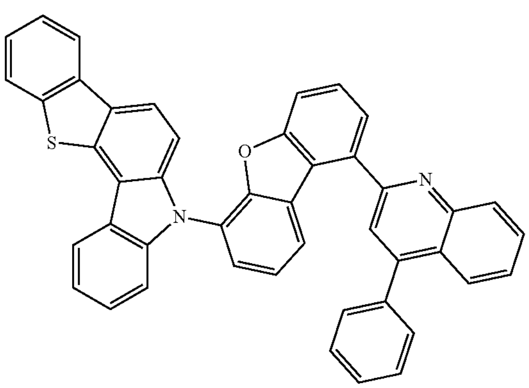
108
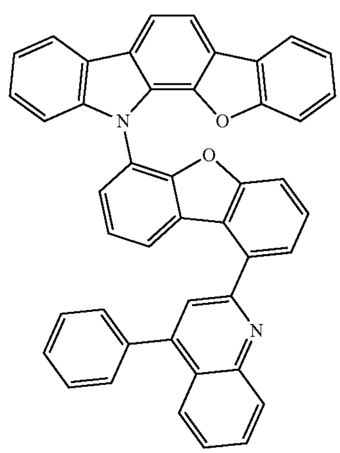

-continued
109
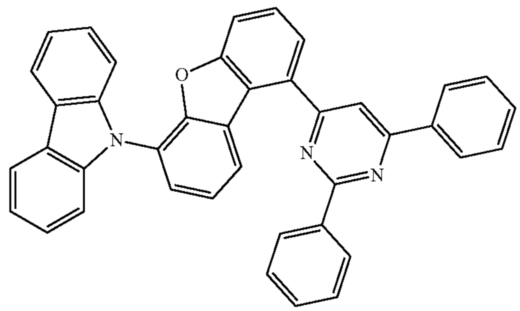
110
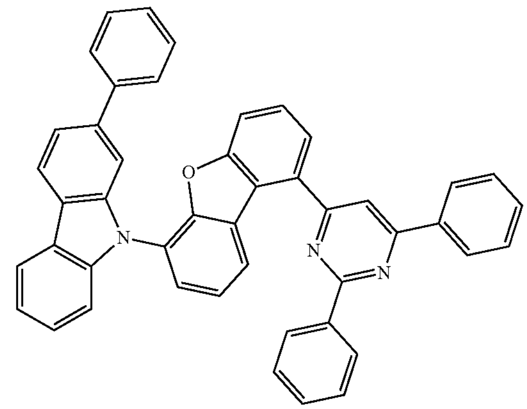
111
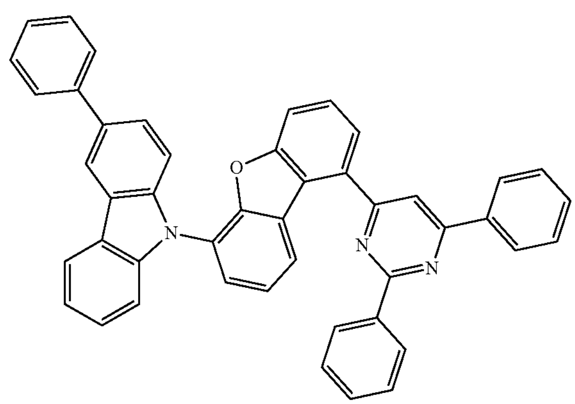
112
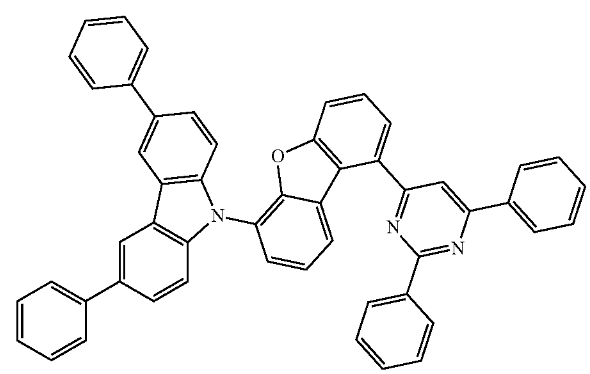
113
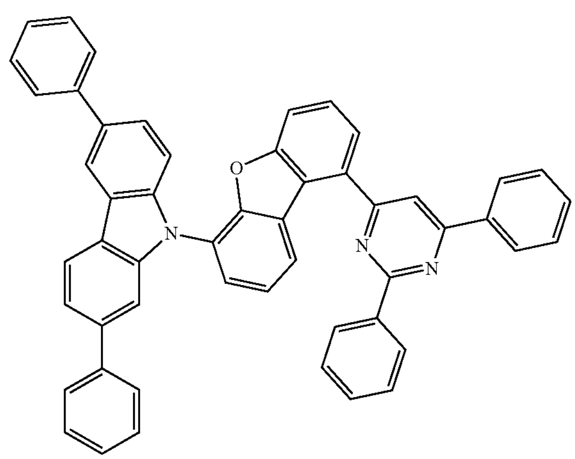
114
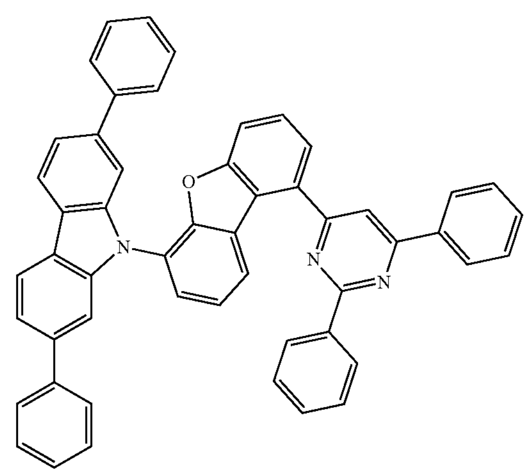

-continued
115
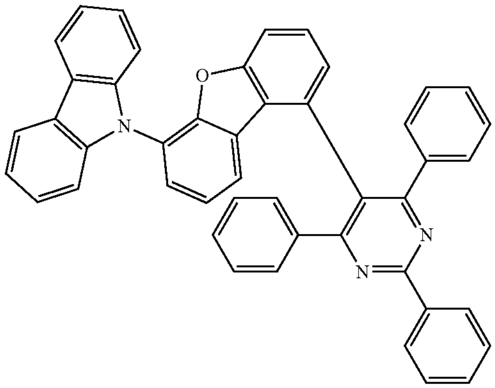
116
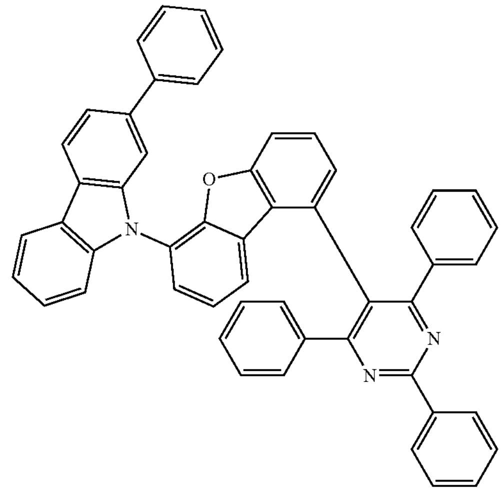
117
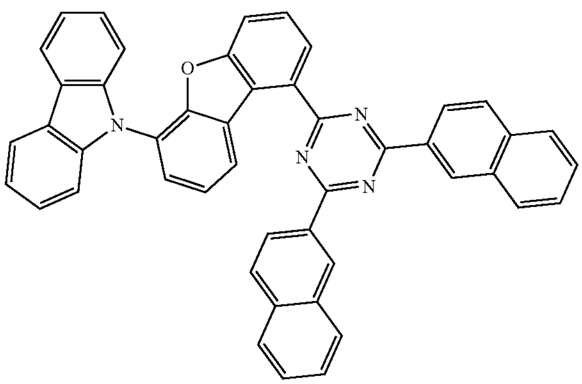
118
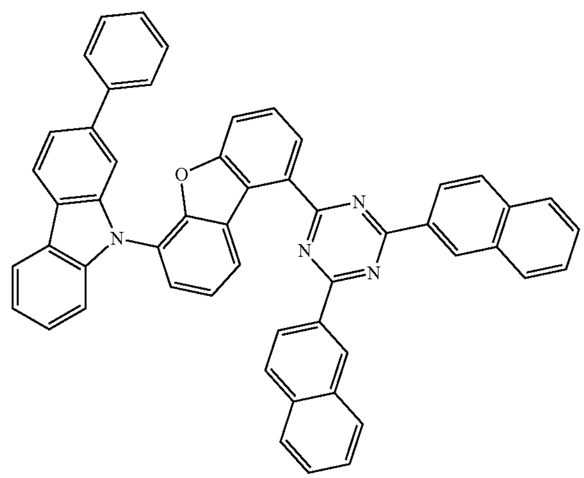
119
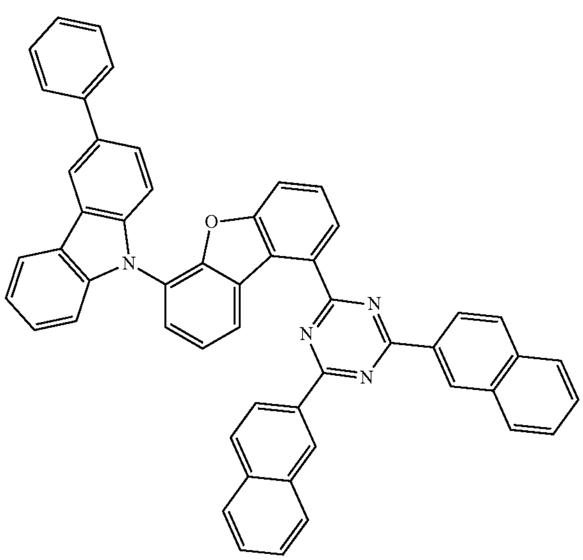
120
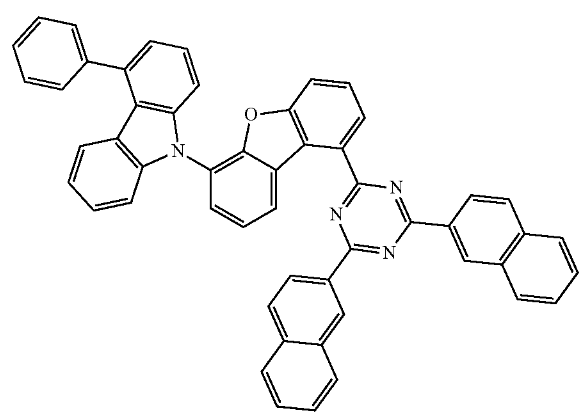

-continued
121
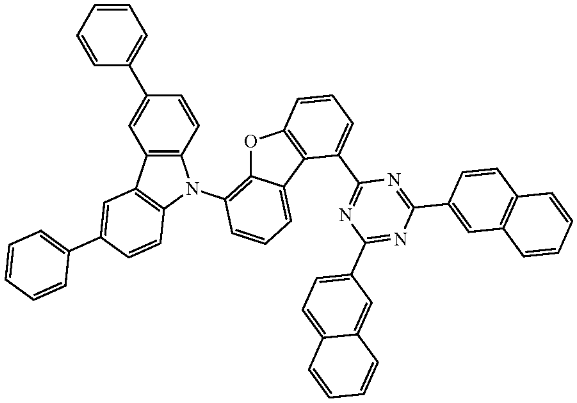
122
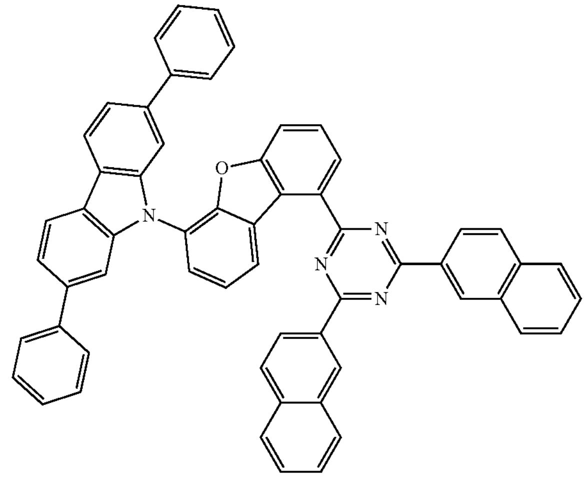
123
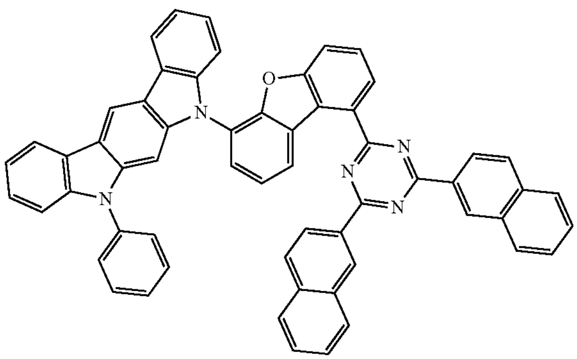
124
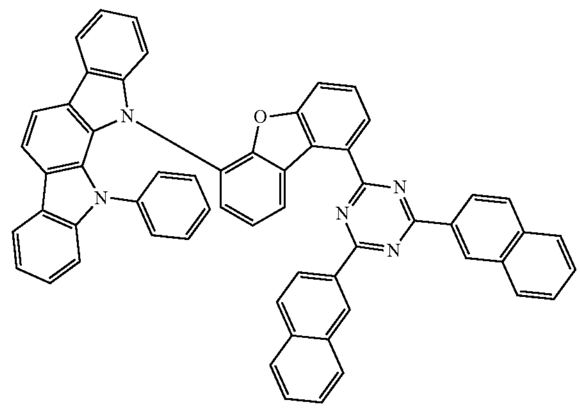
125
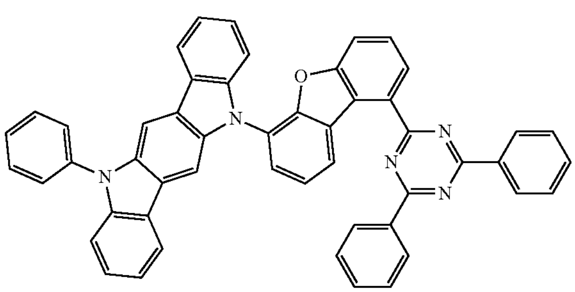
126
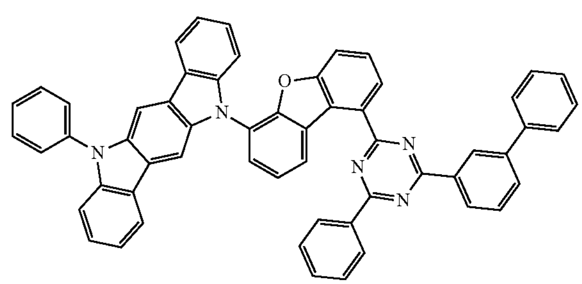
127
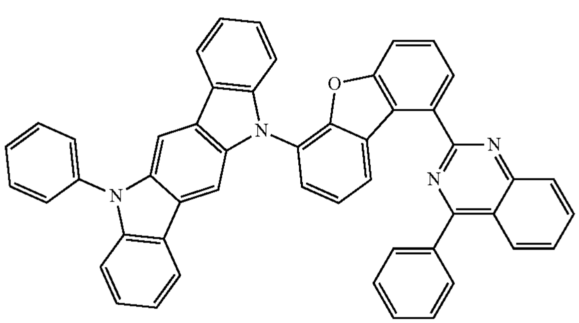
128
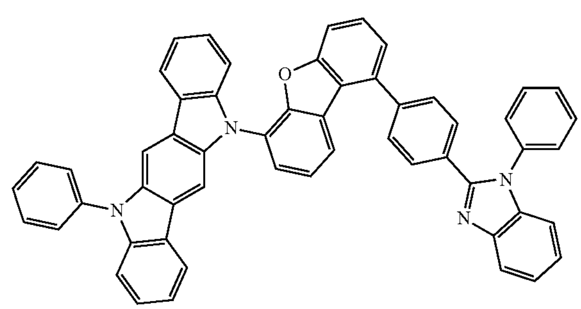

-continued
129
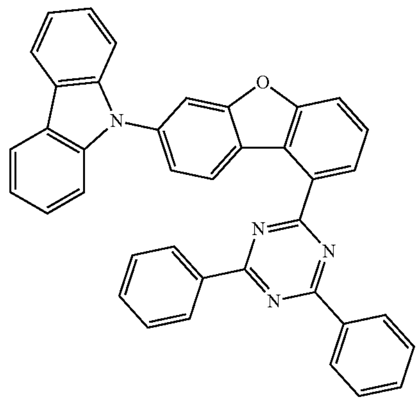
130
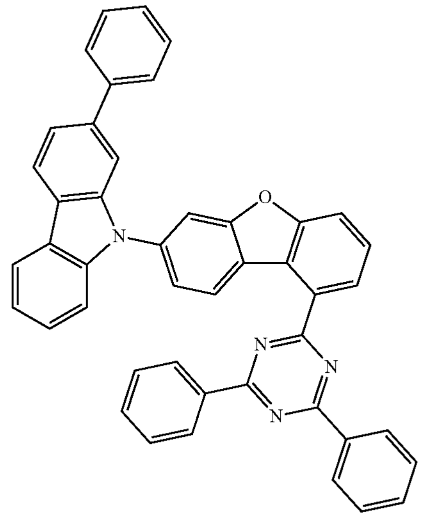
131
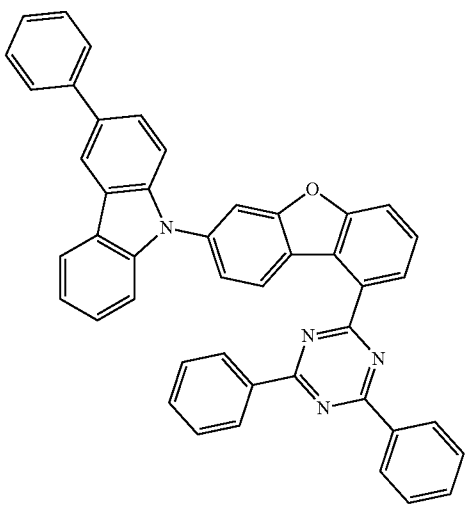
132
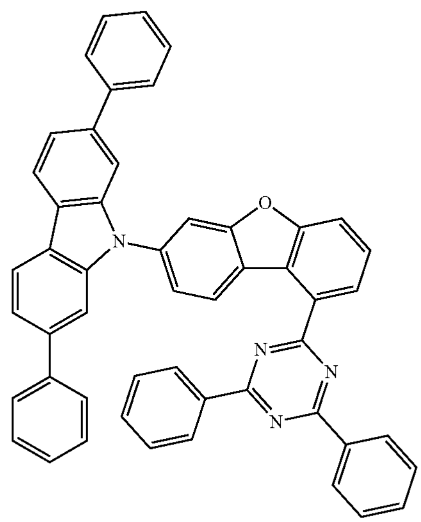
133
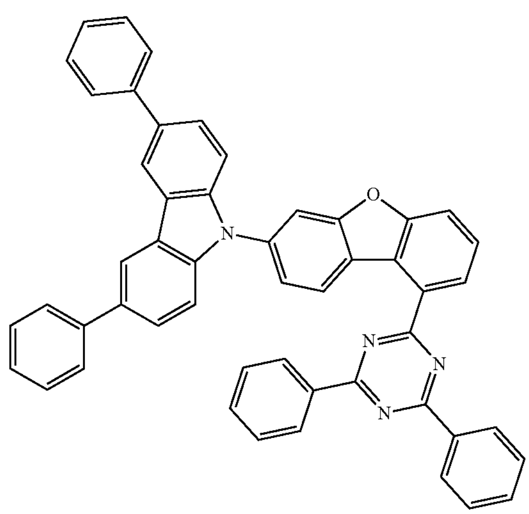
134
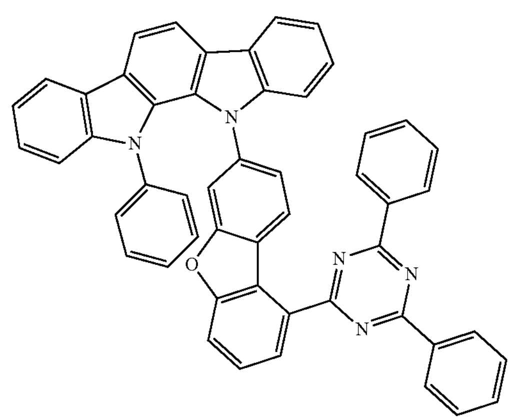

-continued
135
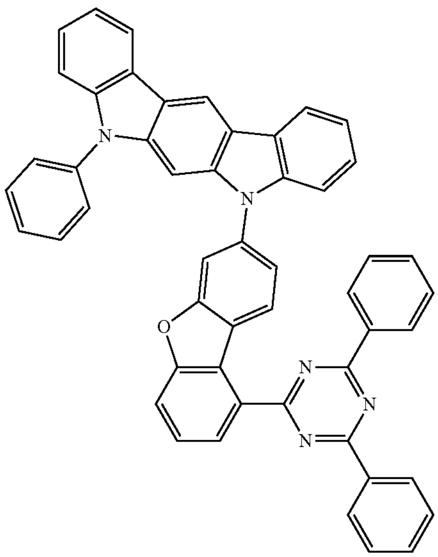
136
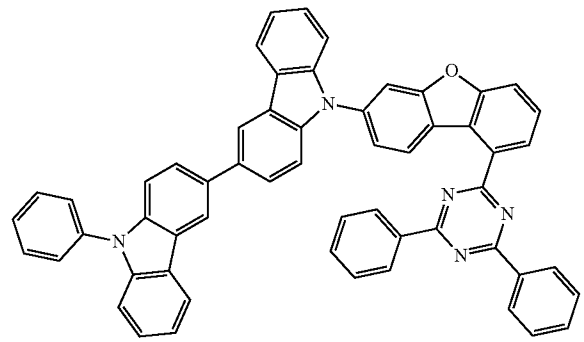
137
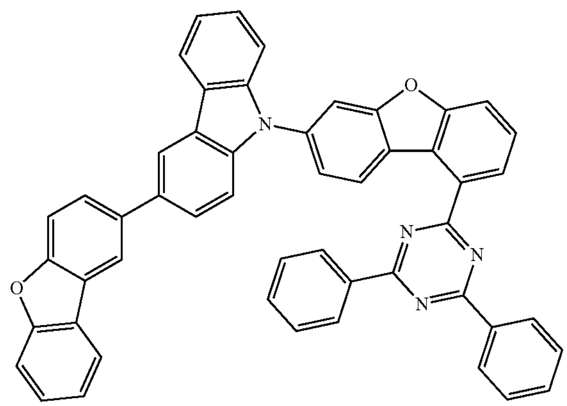
138
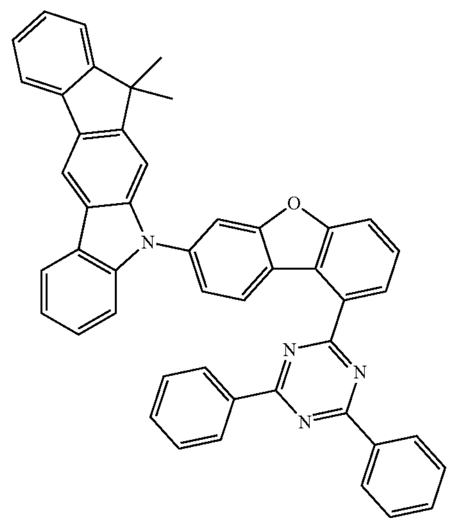
139
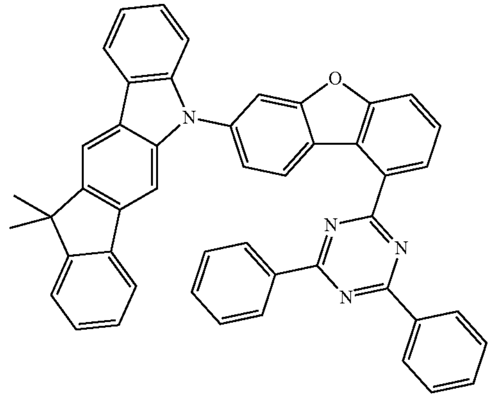
140
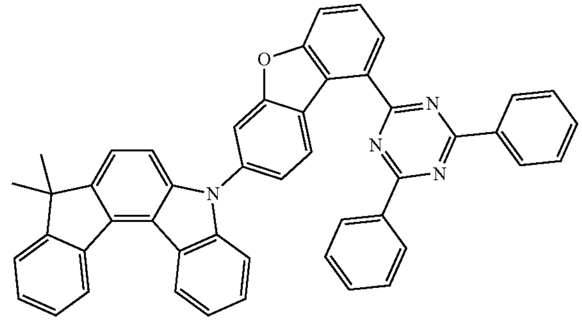

-continued
141
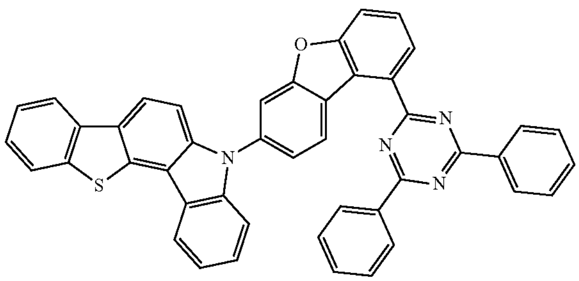
142
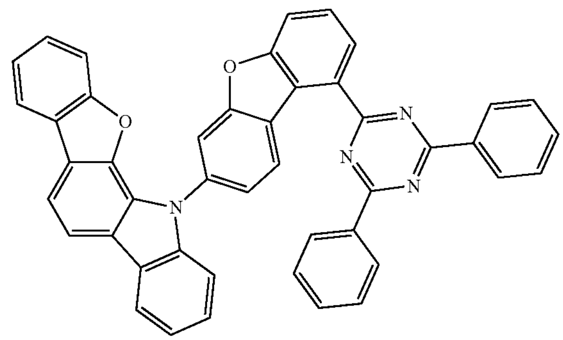
143
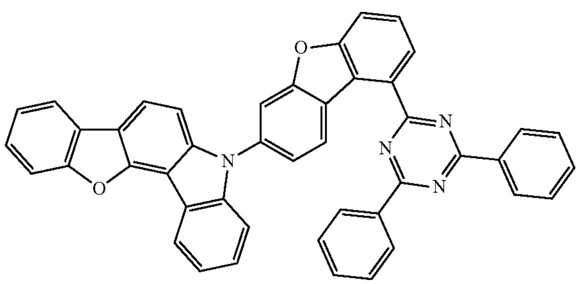
144
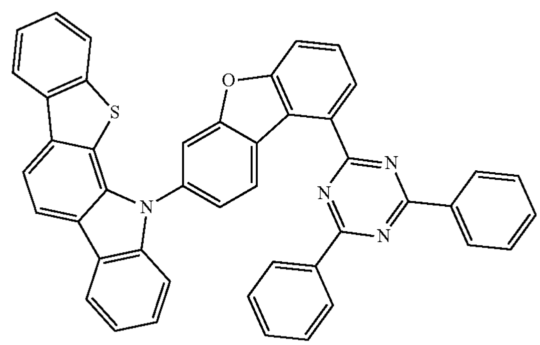
145
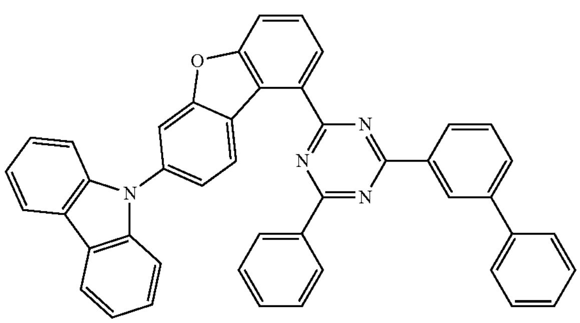
146
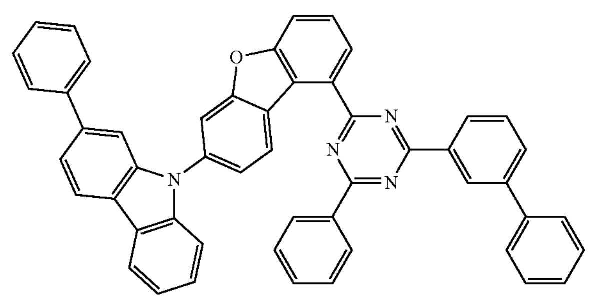
147
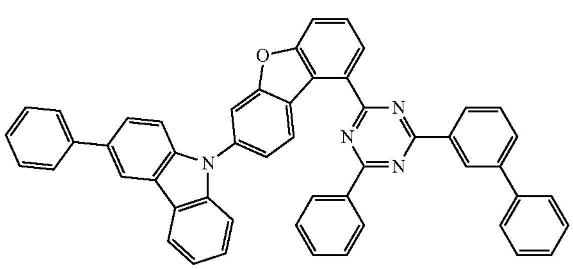
148
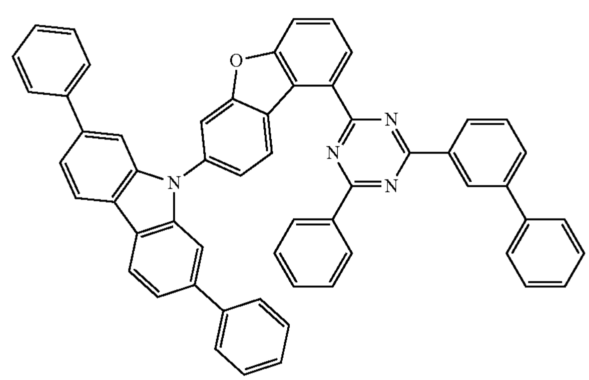

-continued
149
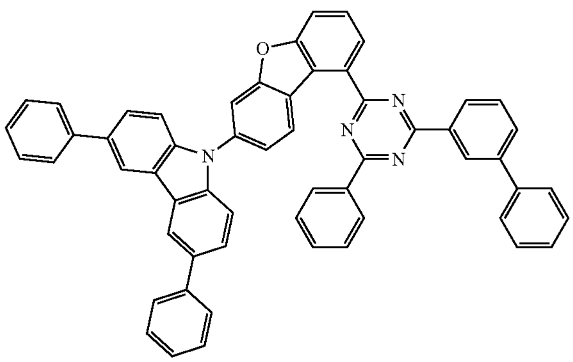
150
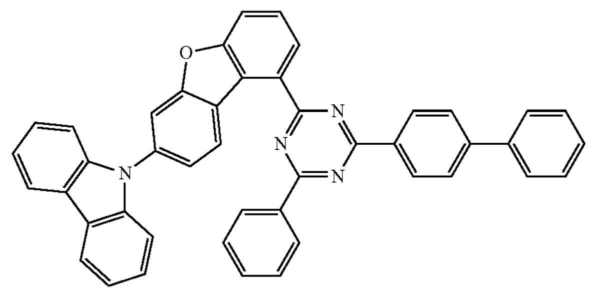
151
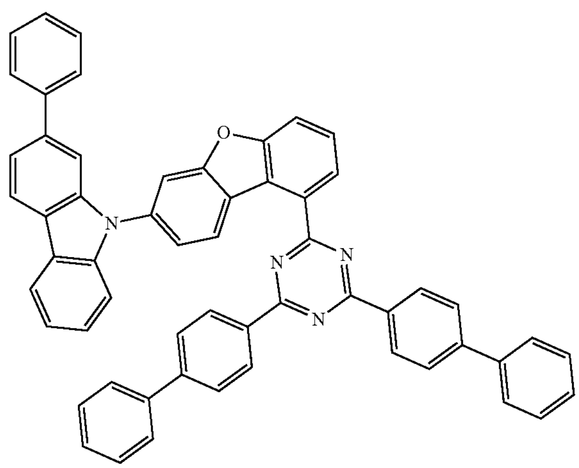
152
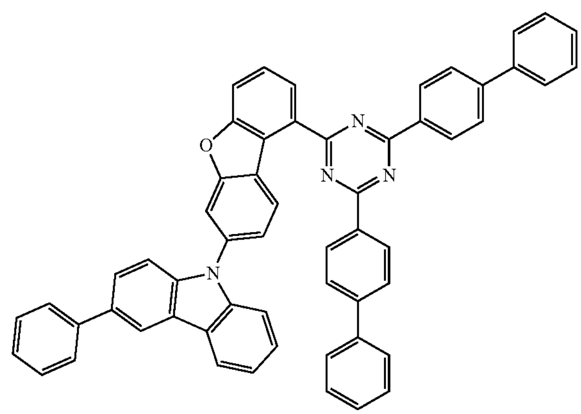
153
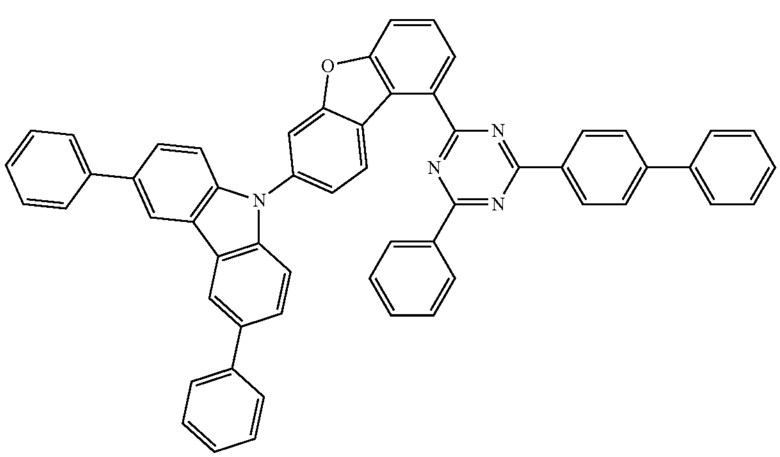

-continued
154
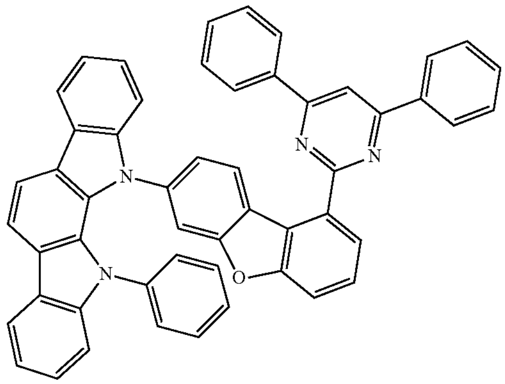
155
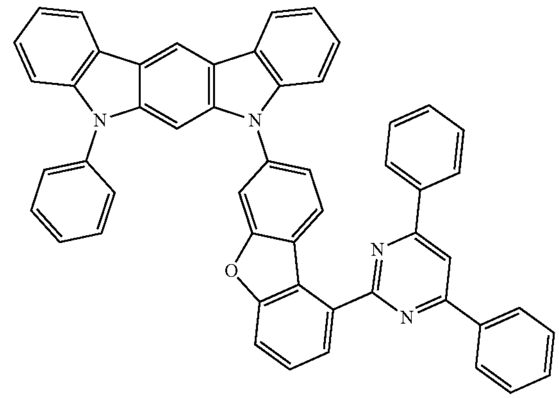
156
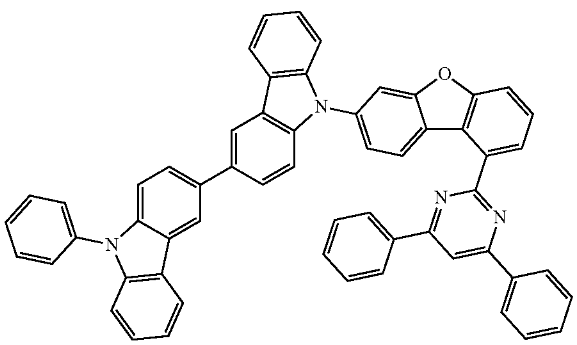
157
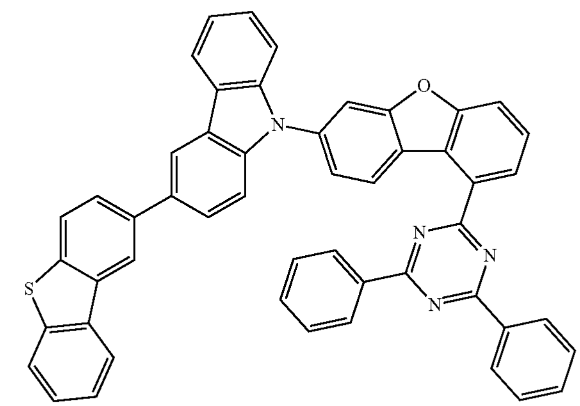
158
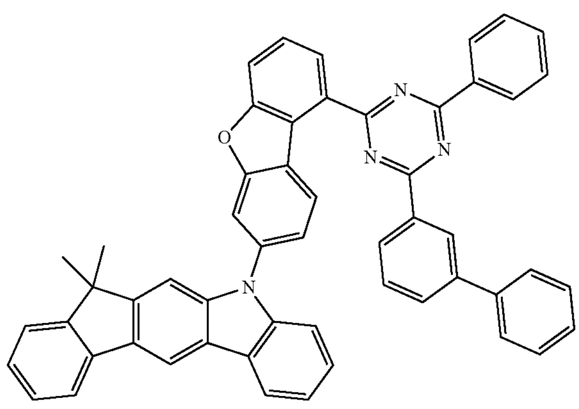
159
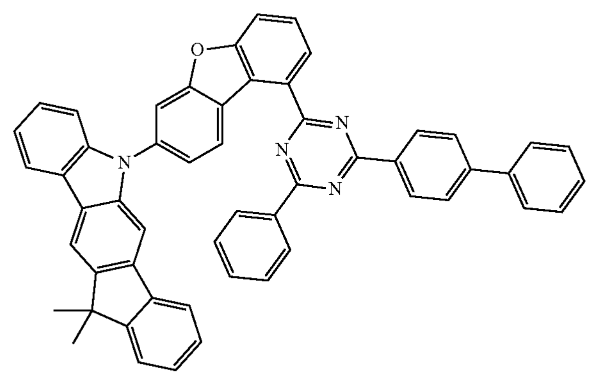
160
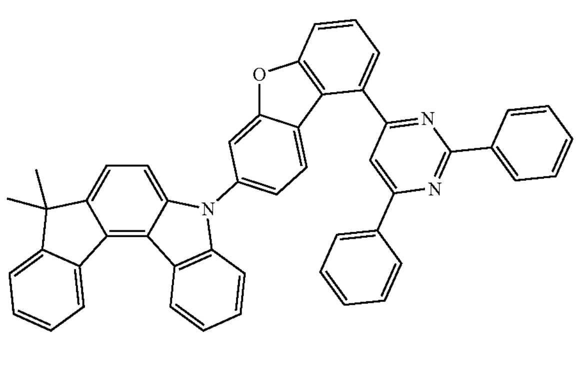
161
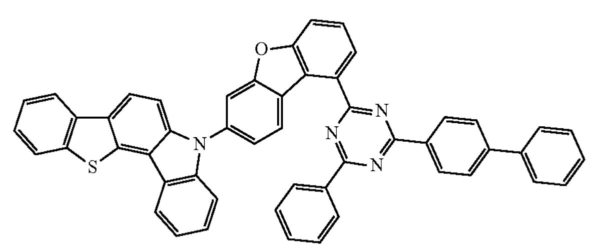

-continued
162
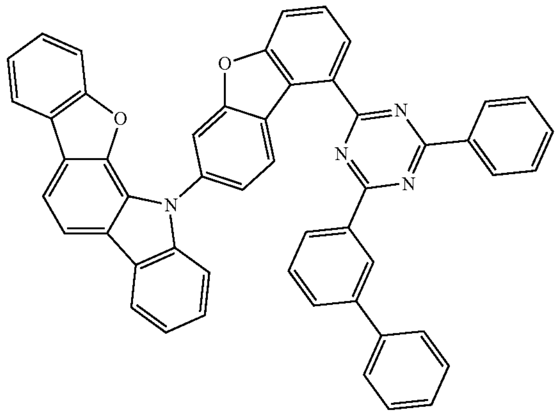
163
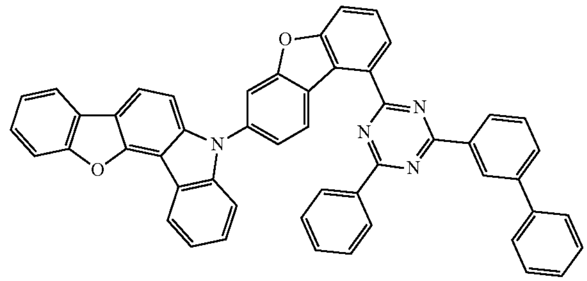
164
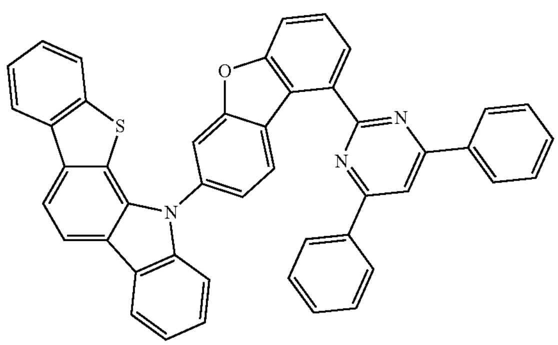
165
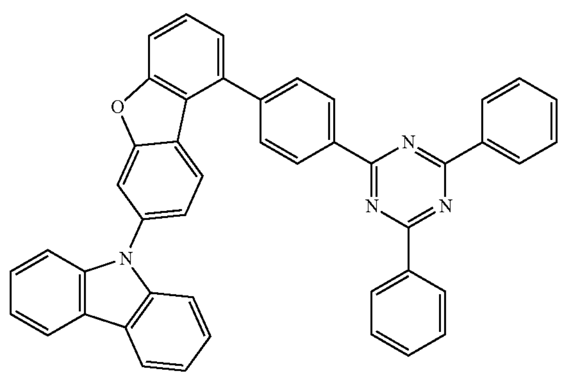
166
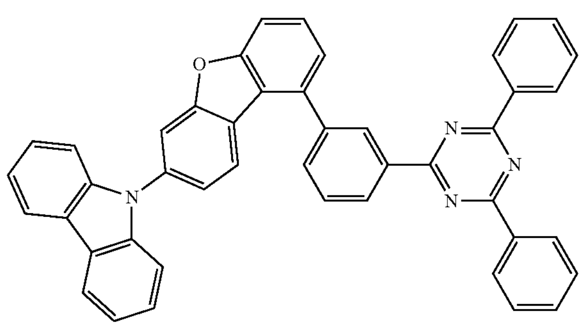
167
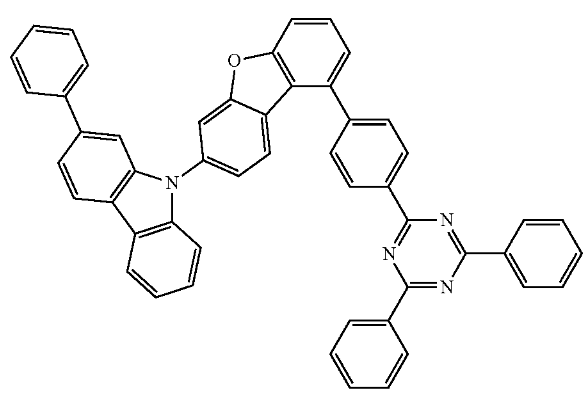

-continued
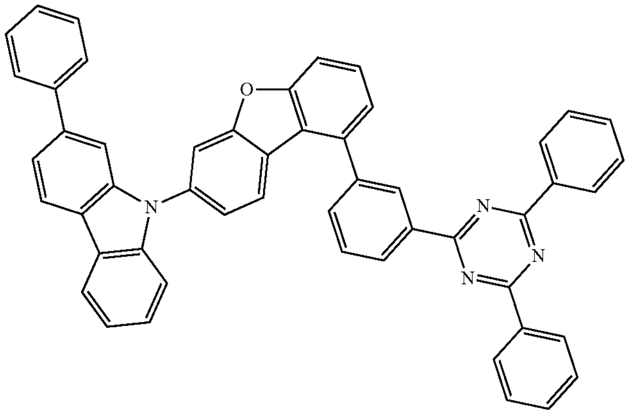
168
169
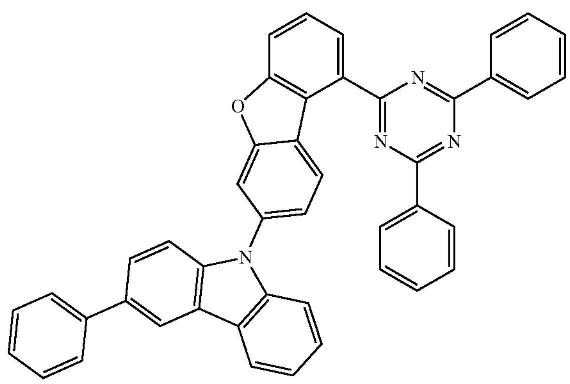
170
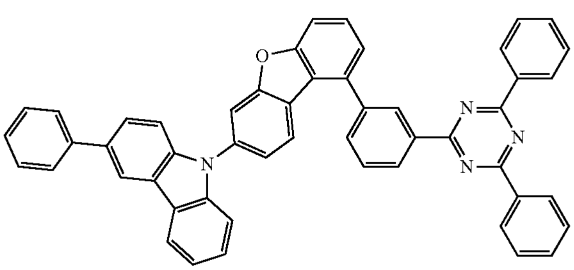
171
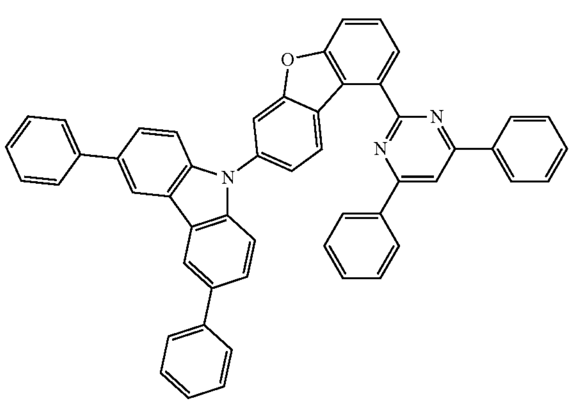
-continued
172
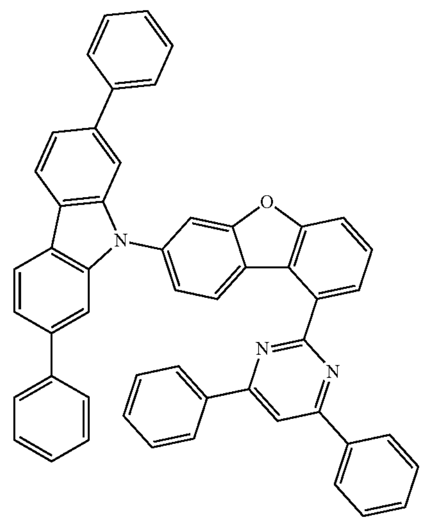
173
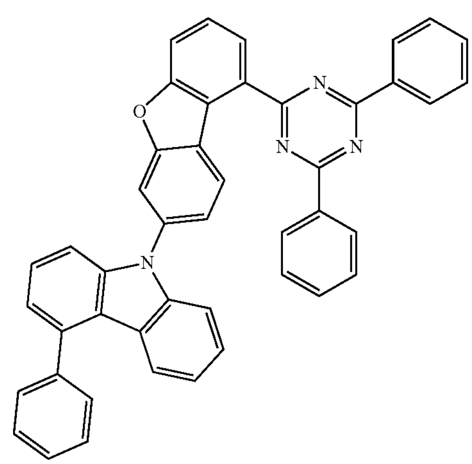

-continued
174
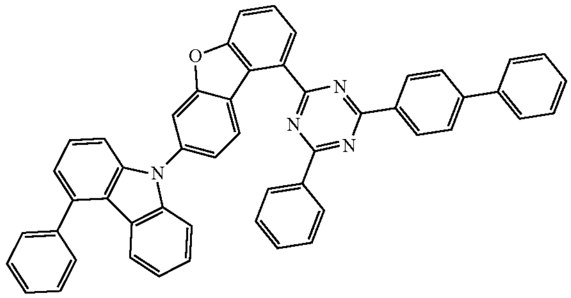
175
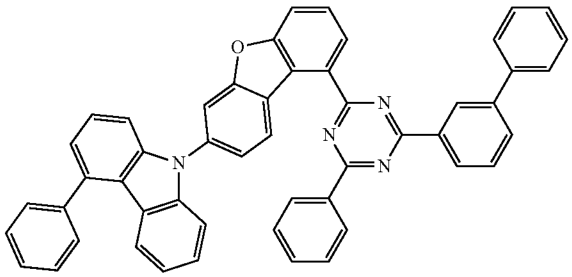
176
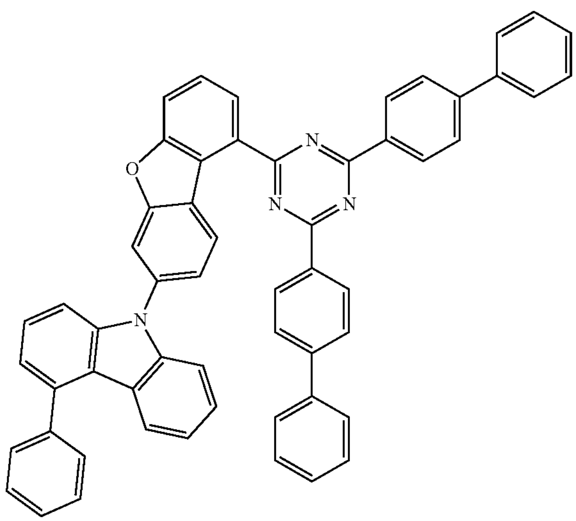
177
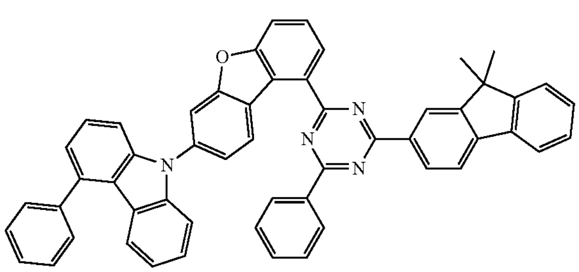
-continued
178
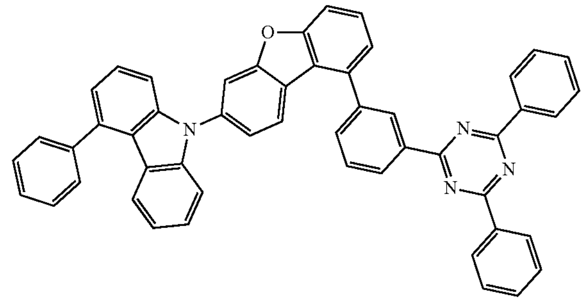
179
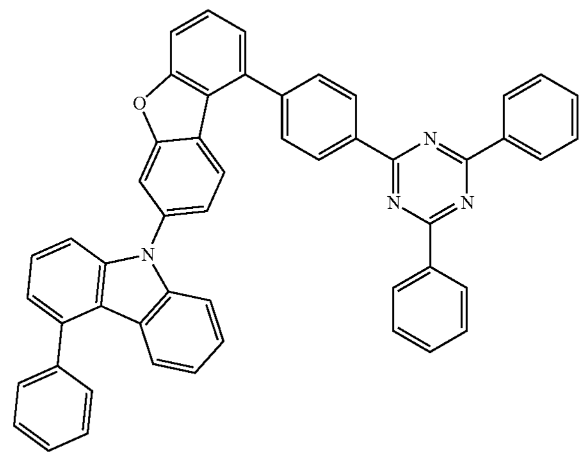
180
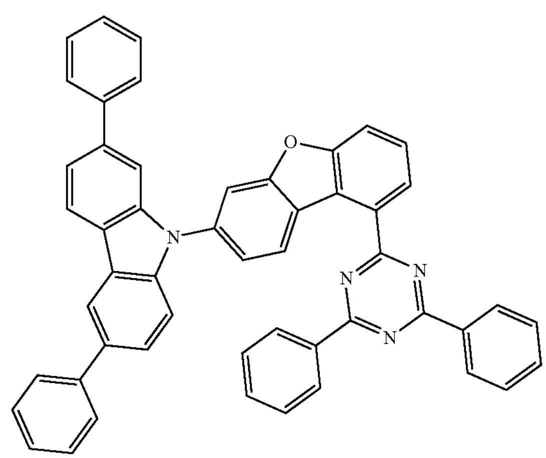

181
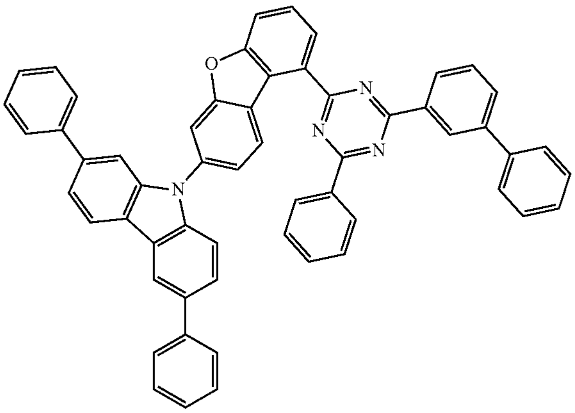
182
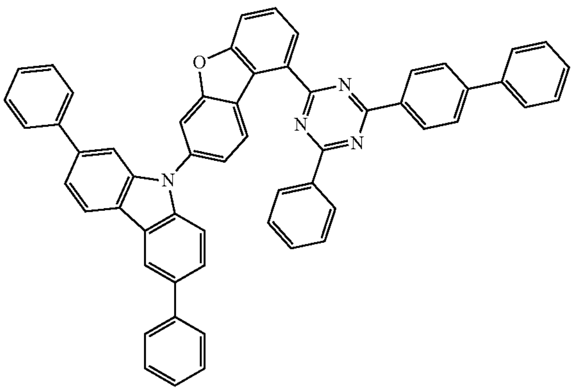
183
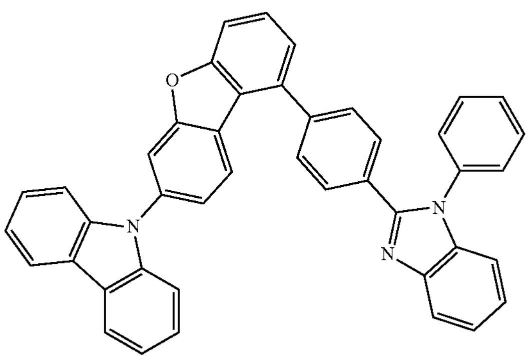
184
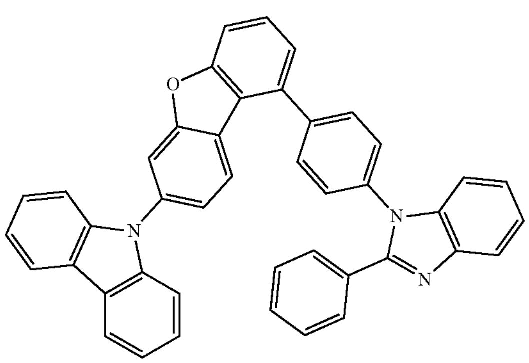
185
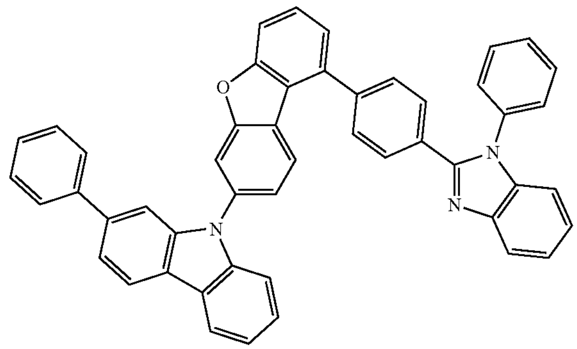
186
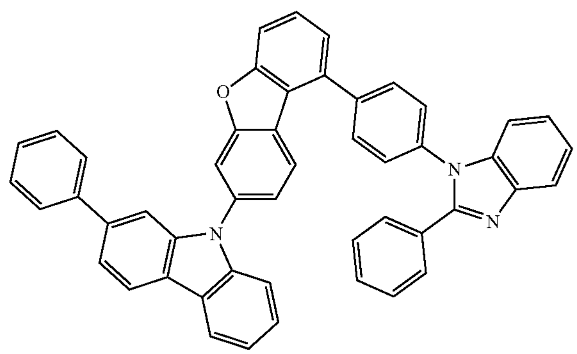
187
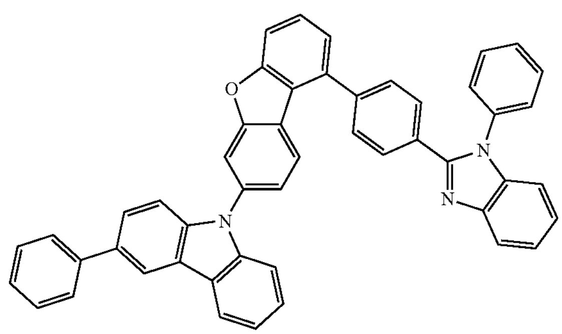
188
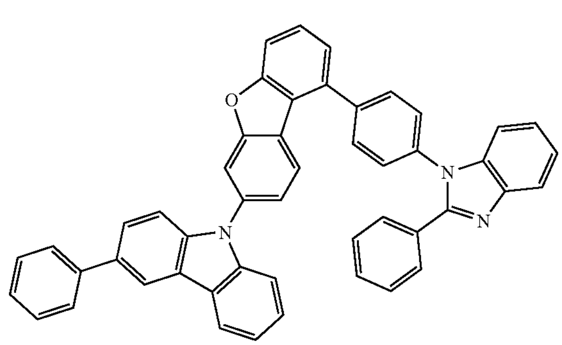

-continued
189
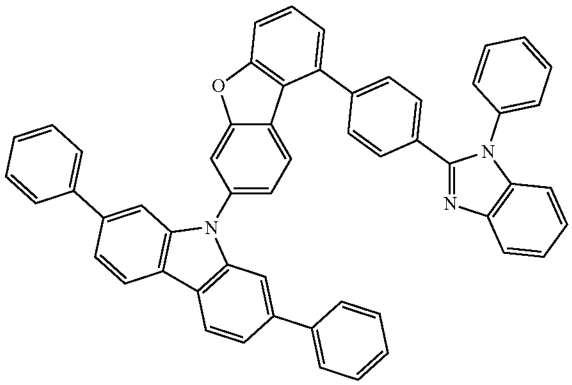
190
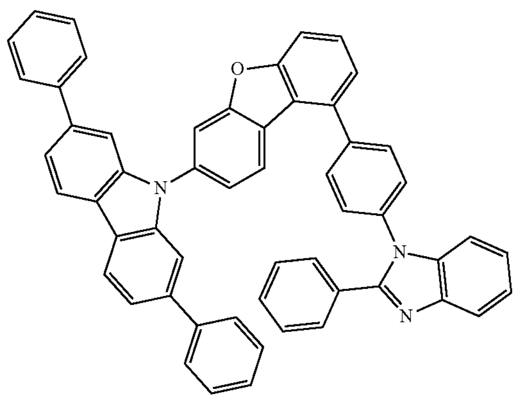
191
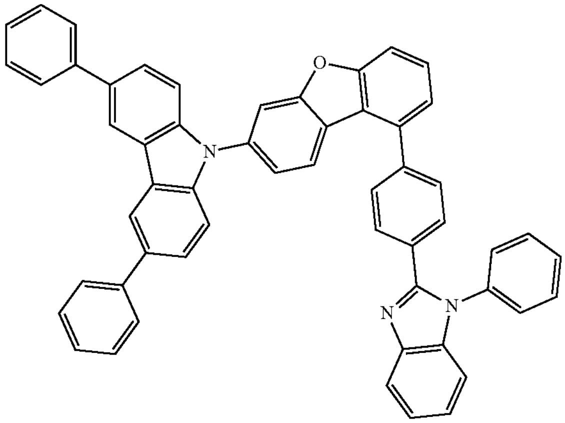
-continued
192
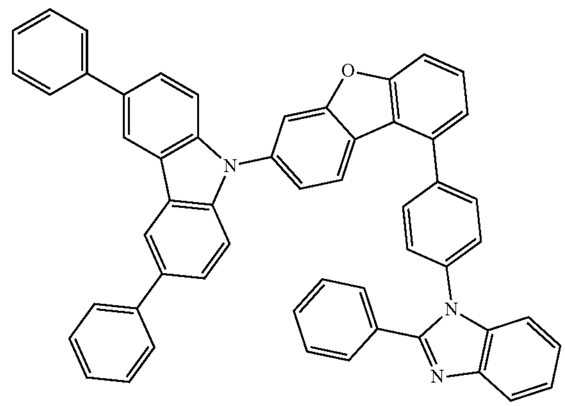
193
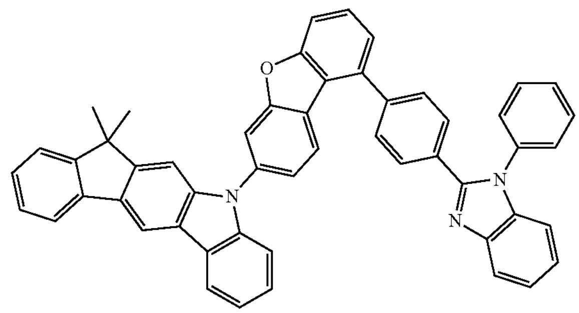
194
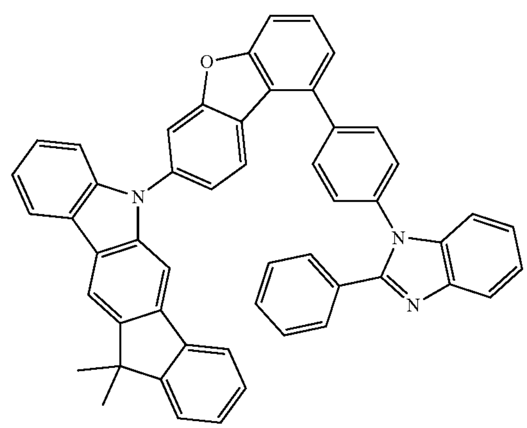
195
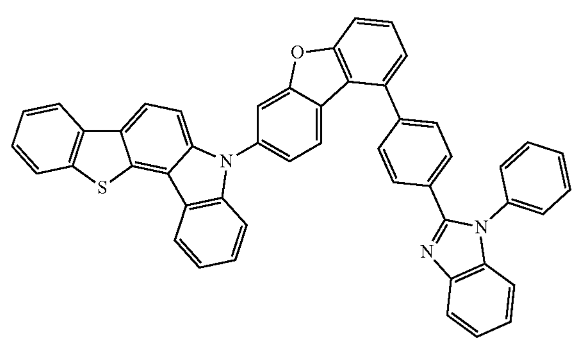

196
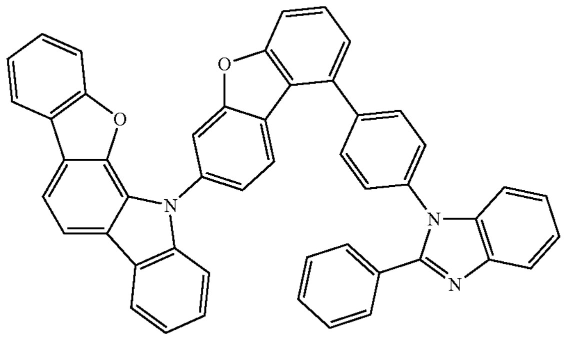
197
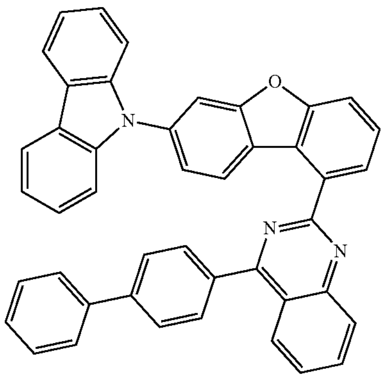
198
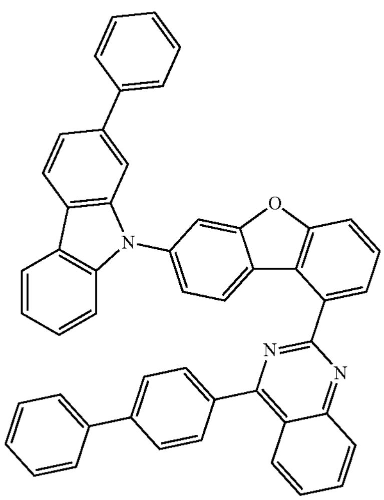
199
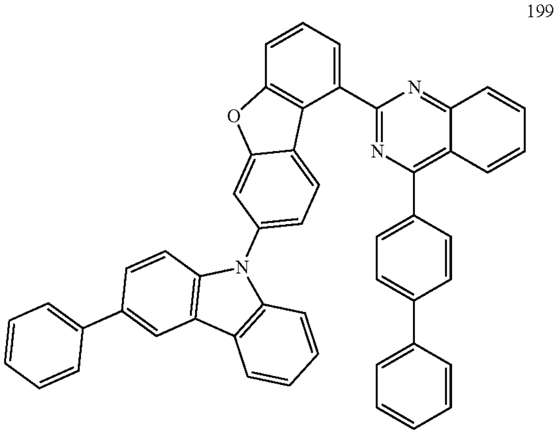
200
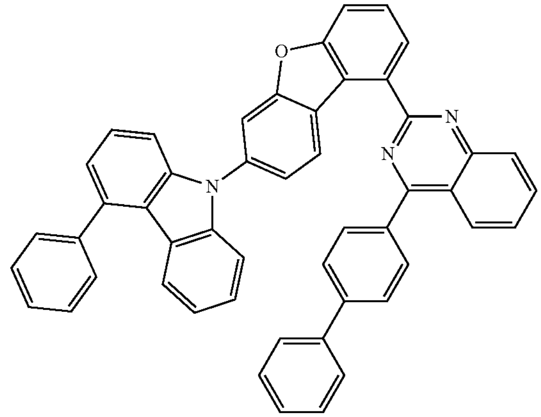
201
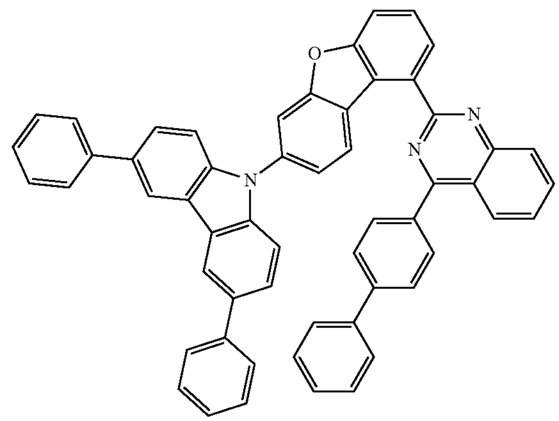
202
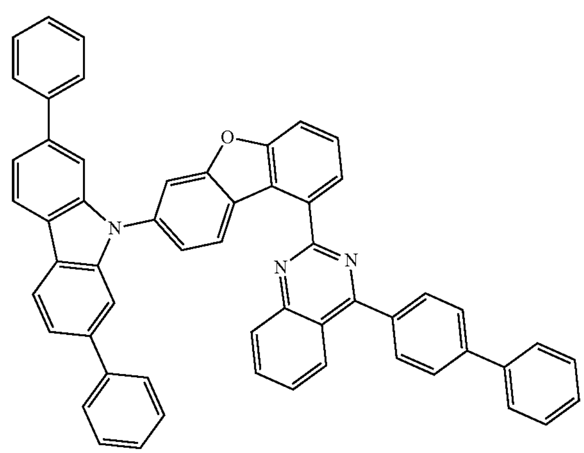

-continued
203
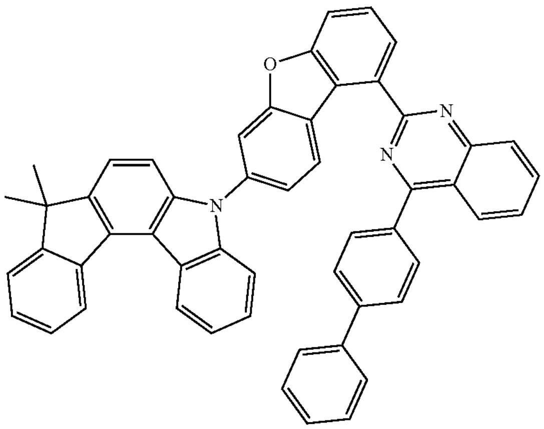
204
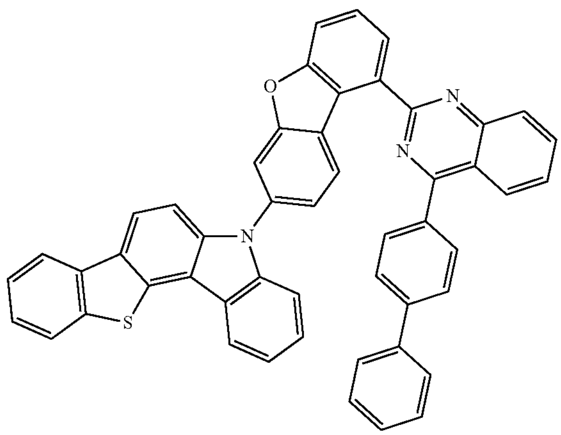
205
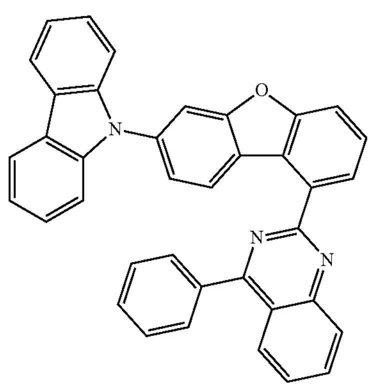
-continued
206
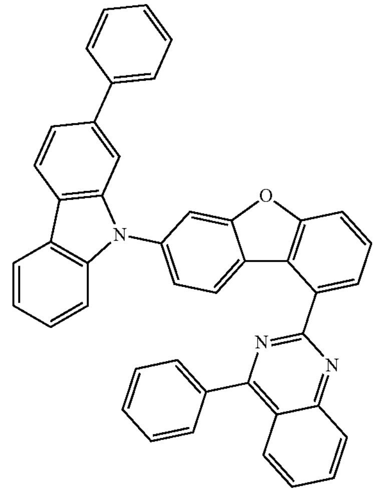
207
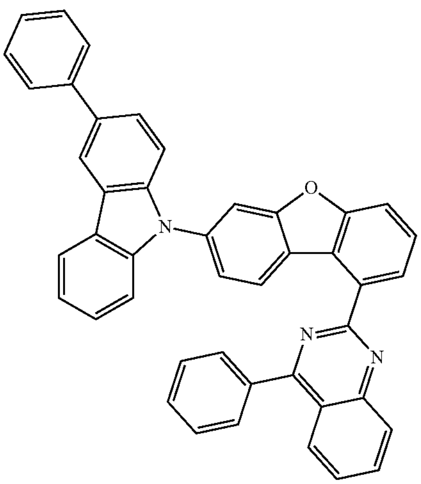
208
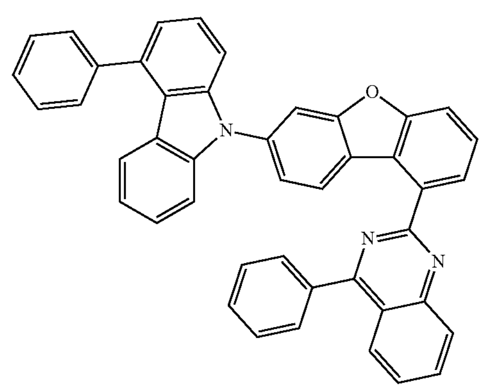

-continued
209
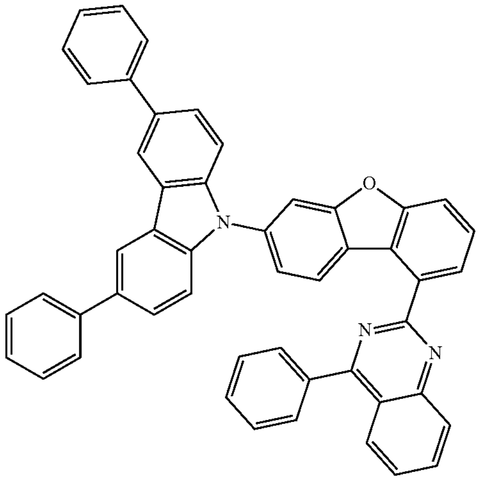
210
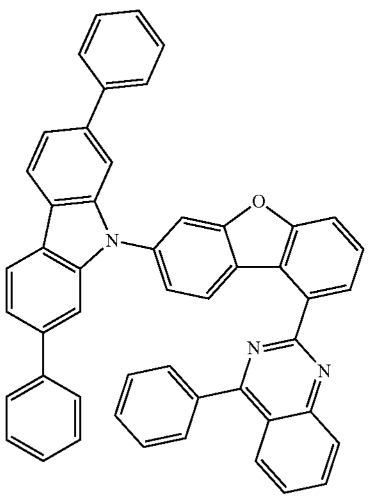
211
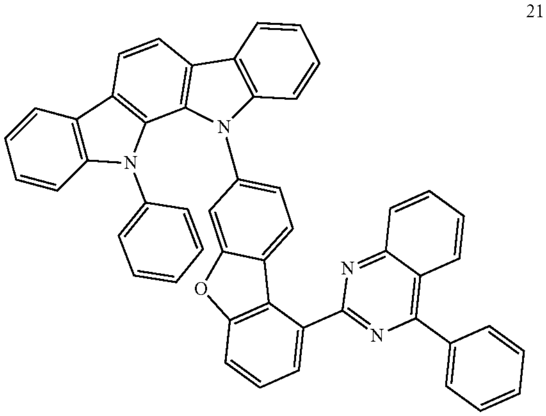
-continued
212
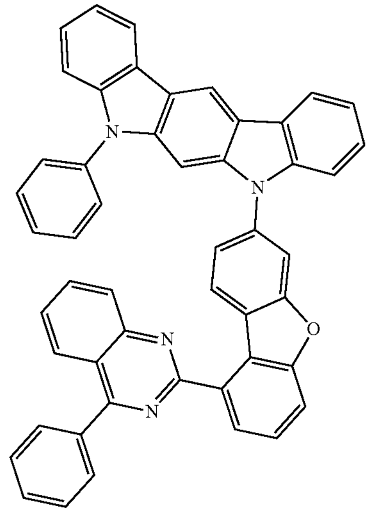
213
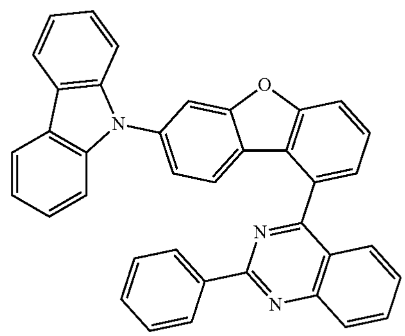
214
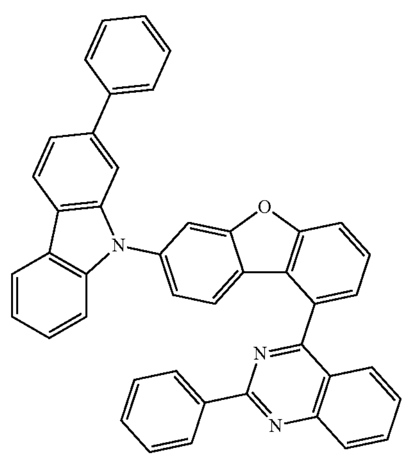

-continued
215
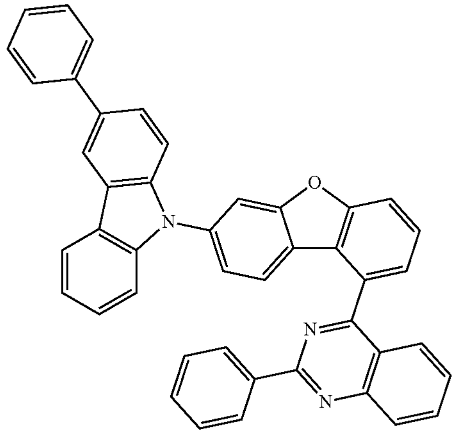
216
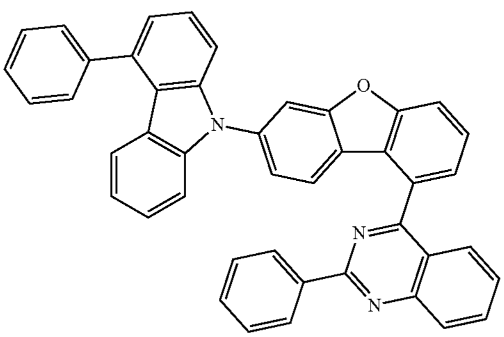
217
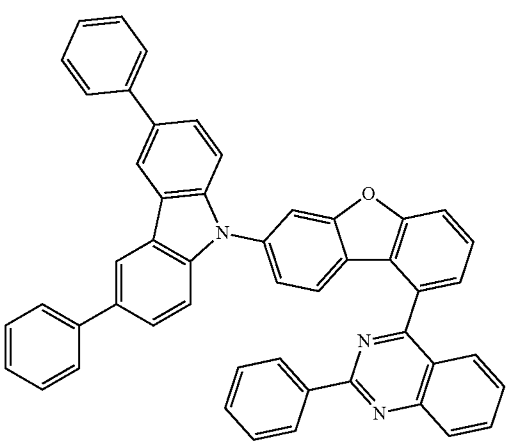
-continued
218
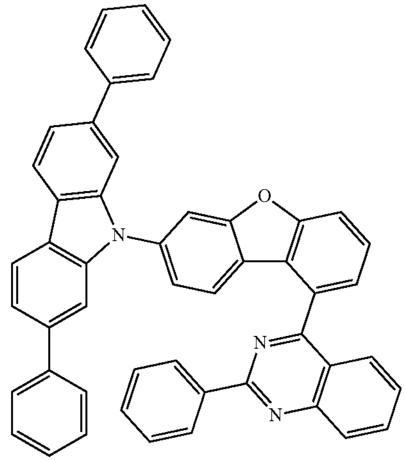
219
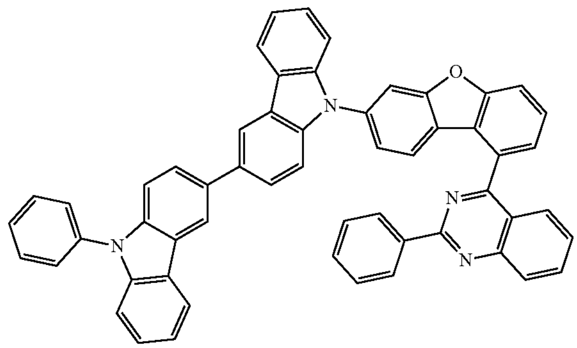
220
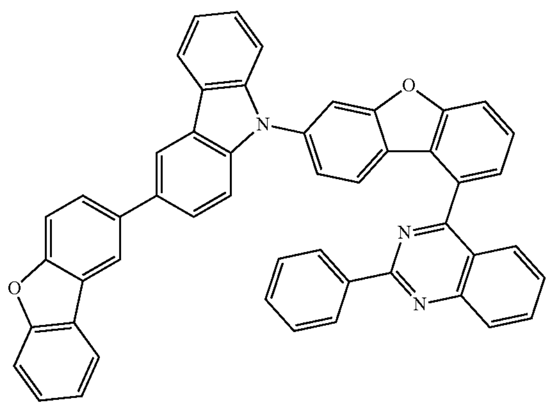
221
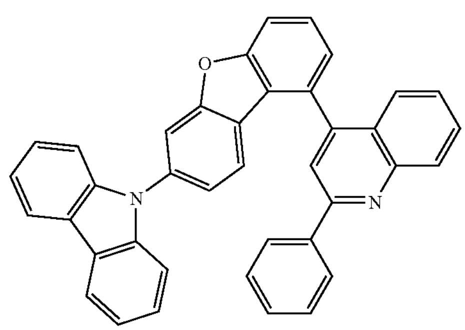

-continued
222
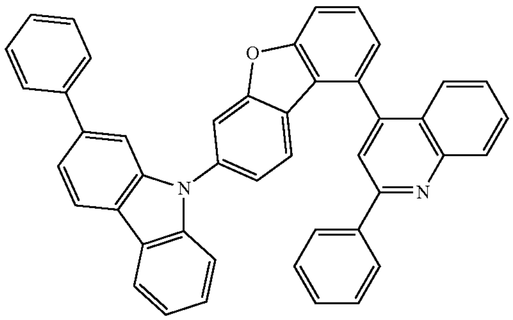
223
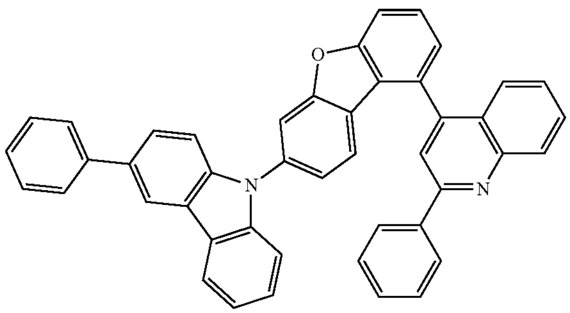
224
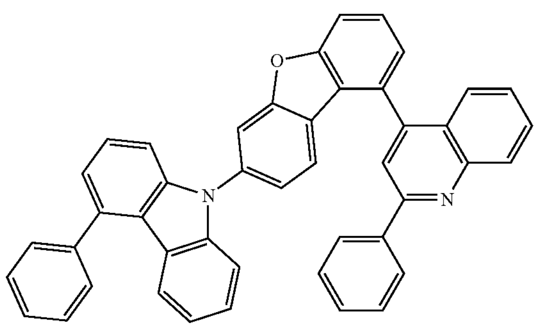
225
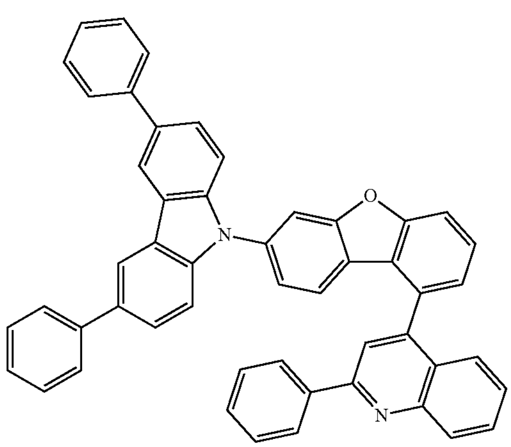
-continued
226
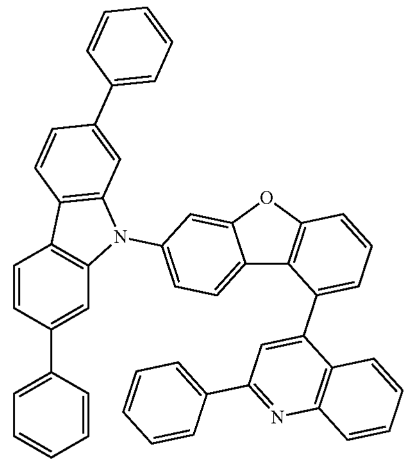
227
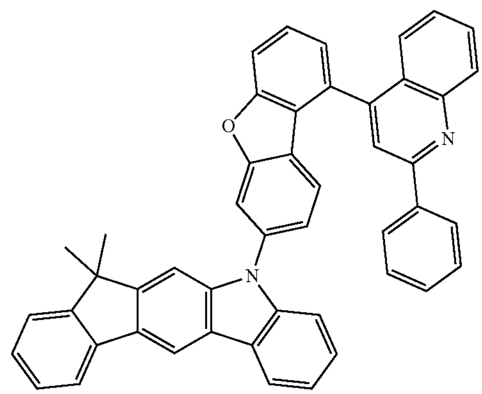
228
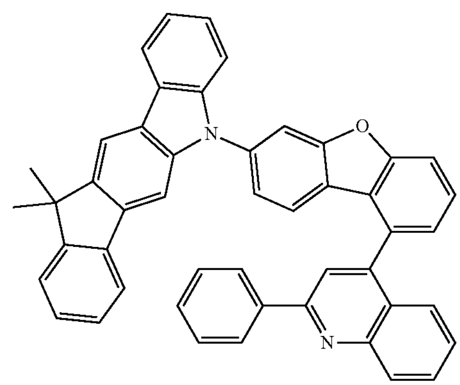
229
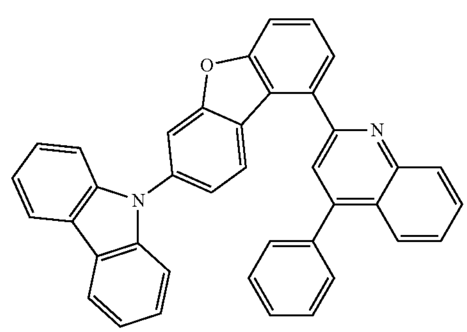

-continued
230
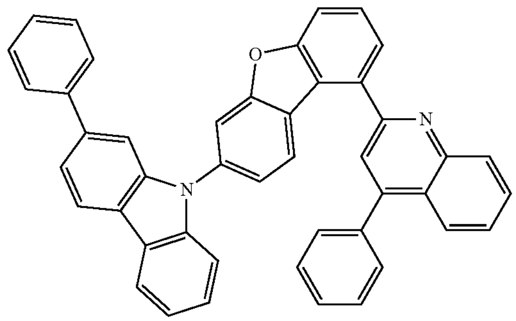
231
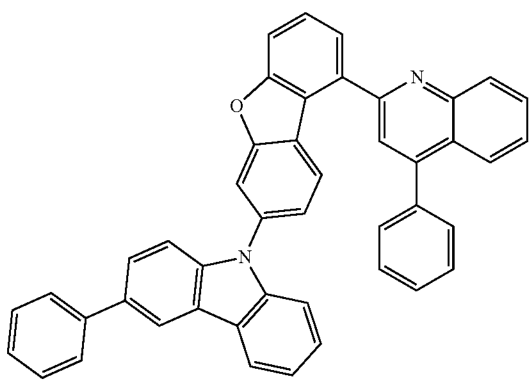
232
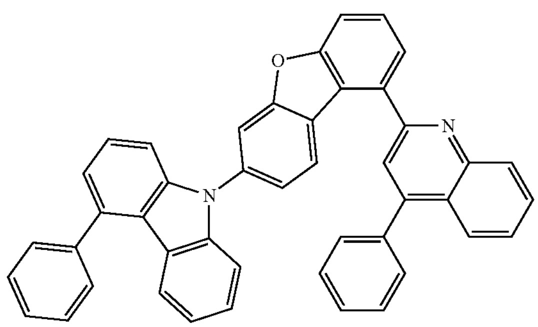
233
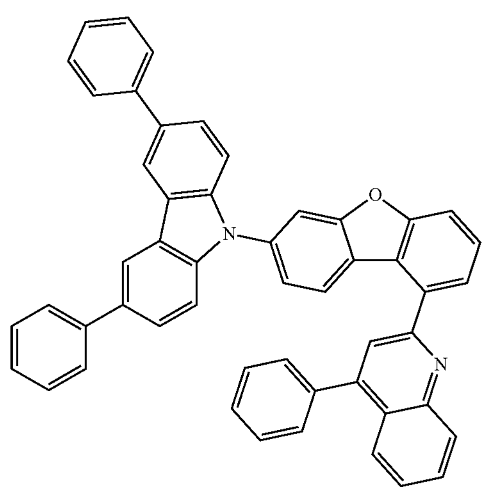
-continued
234
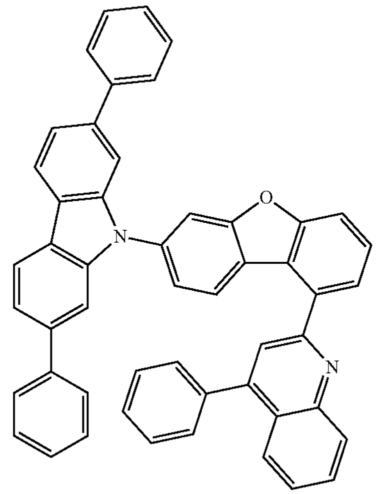
236
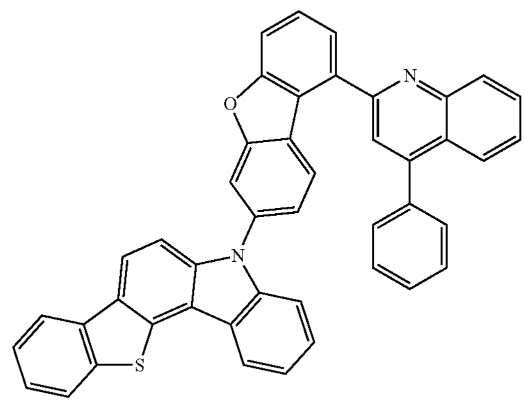
236
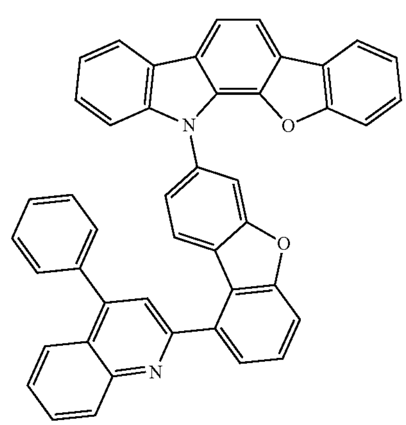

-continued
237
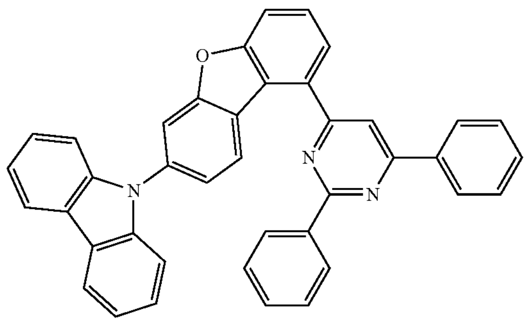
238
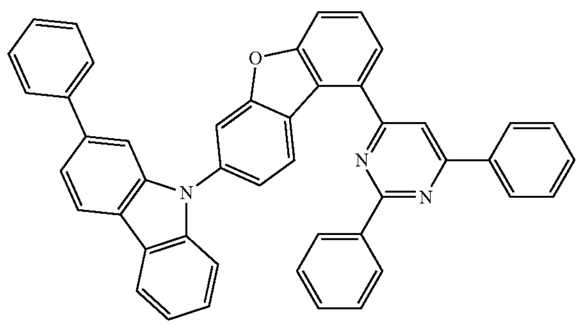
239
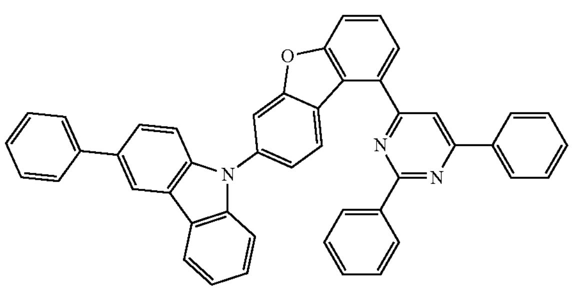
240
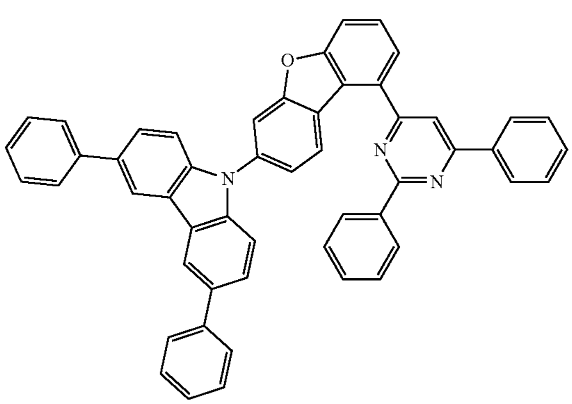
-continued
241
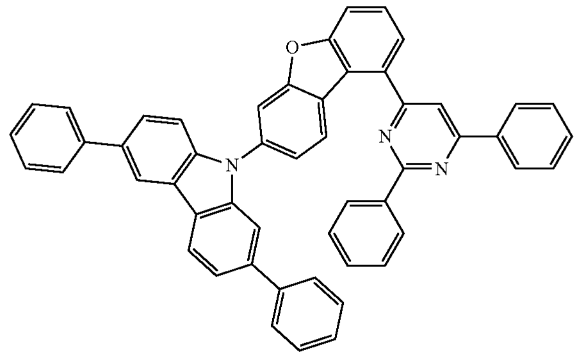
242
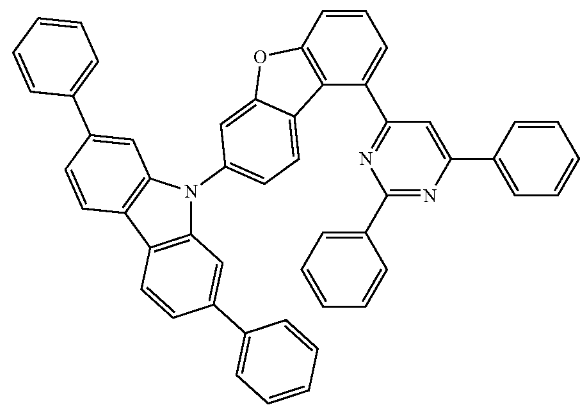
243
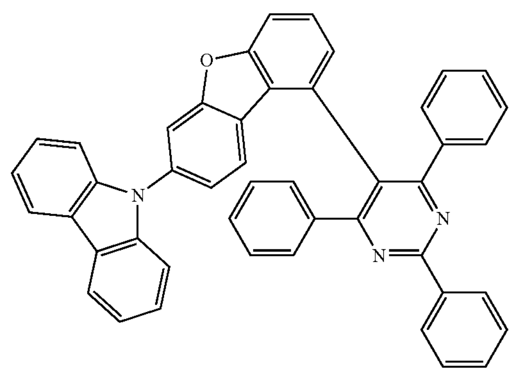
244
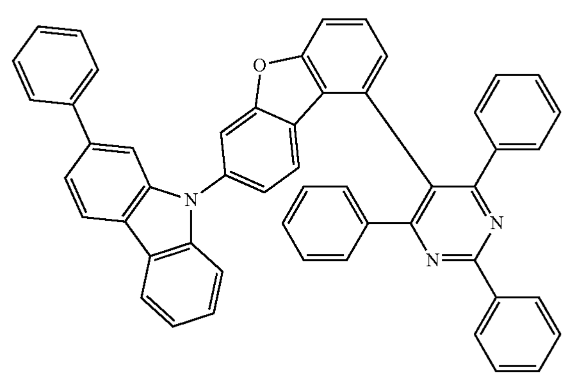

-continued
245
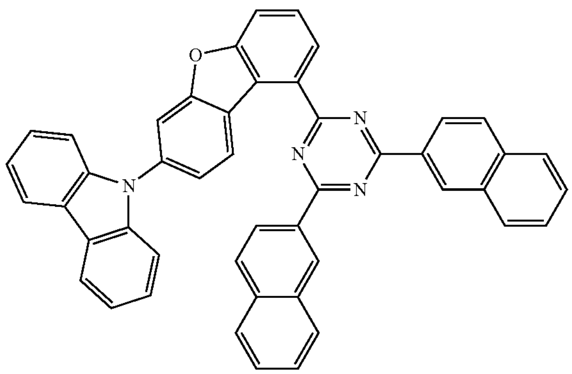
246
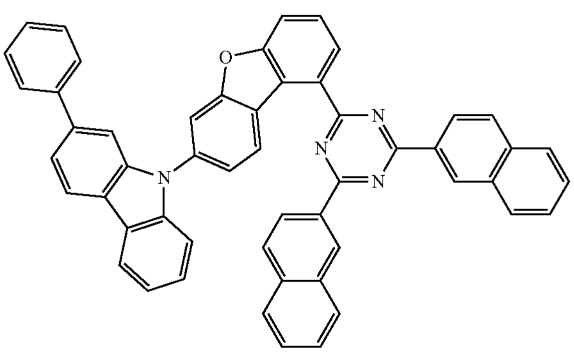
247
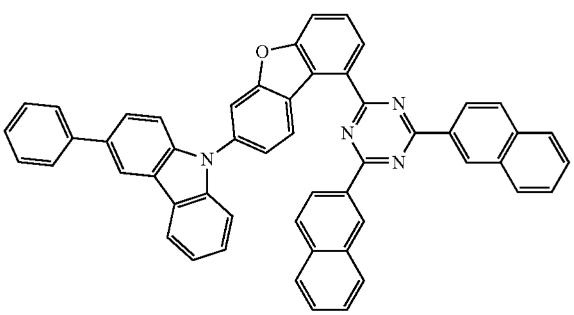
248
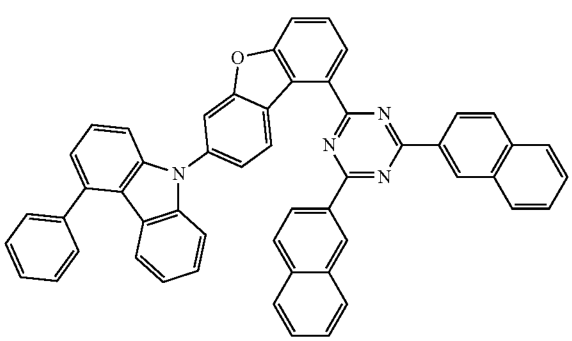
-continued
249
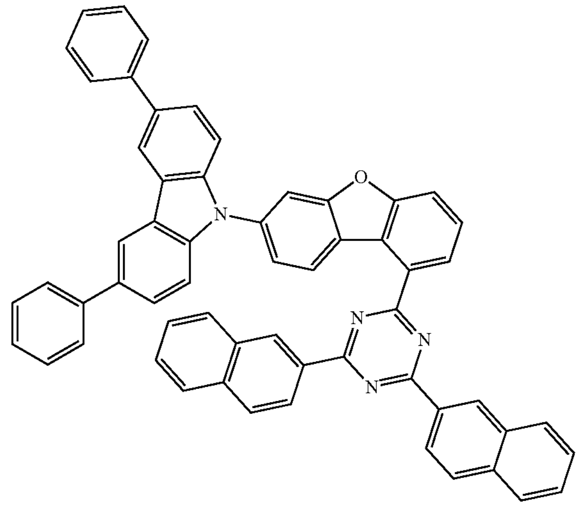
250
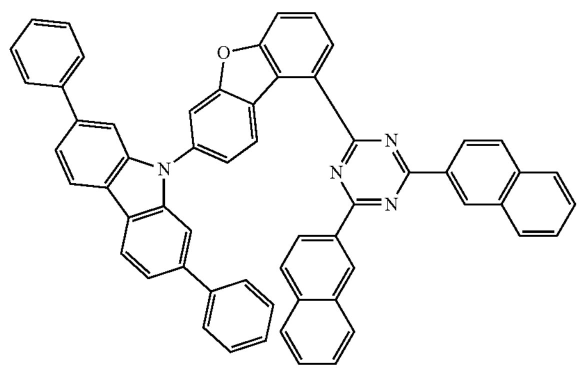
251
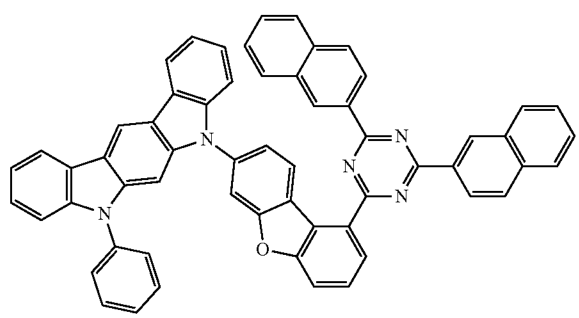
252
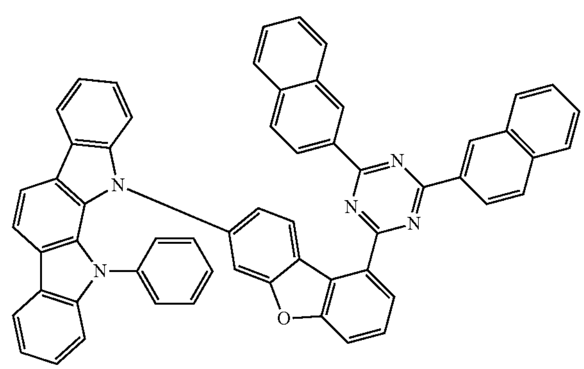

-continued
253
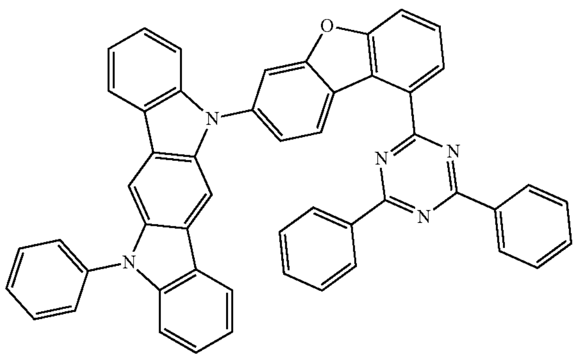
254
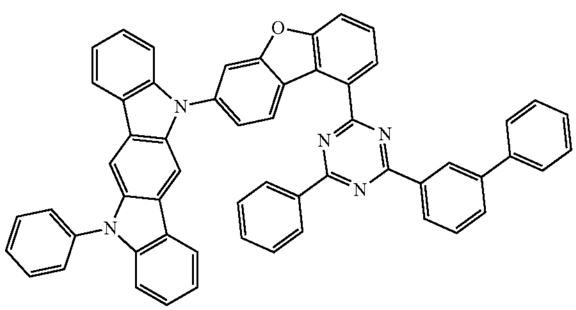
255
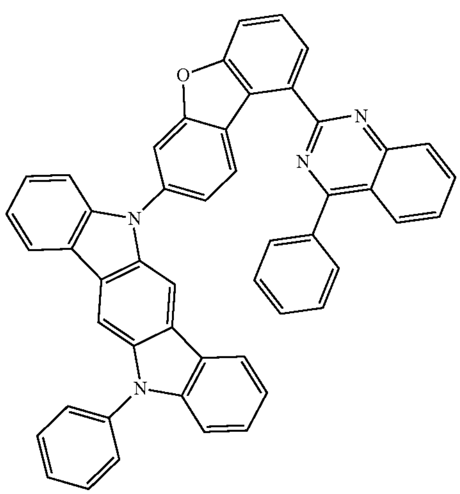
-continued
256
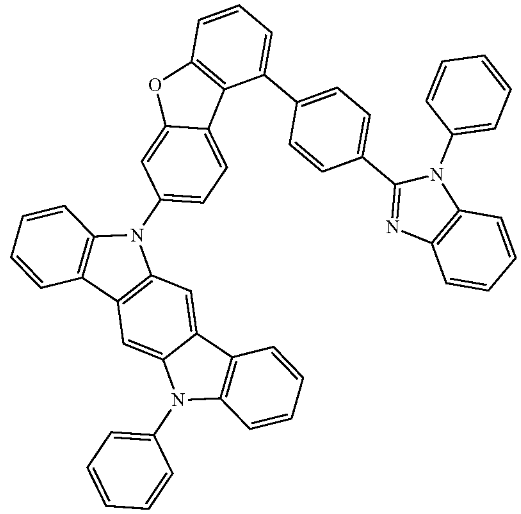
257
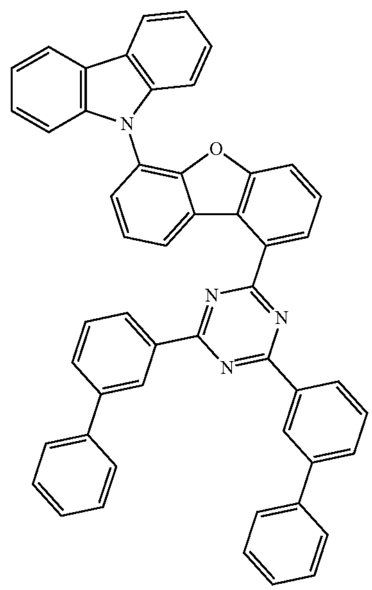
258
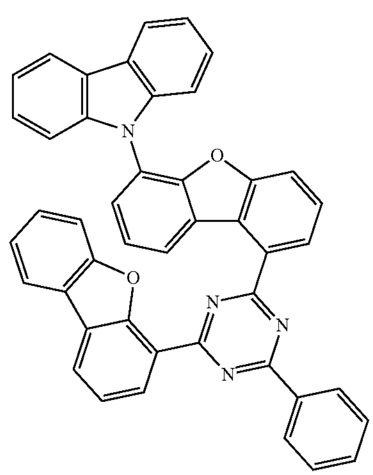

-continued
259
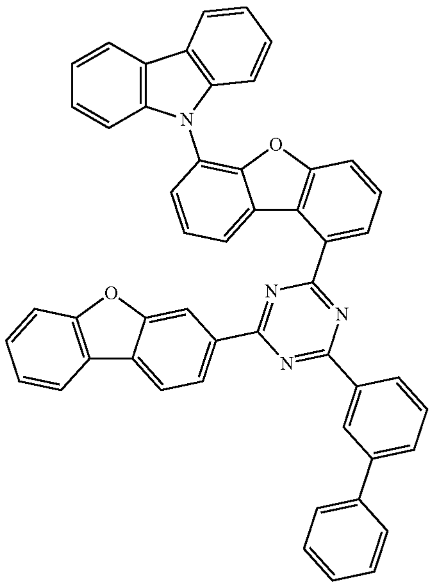
260
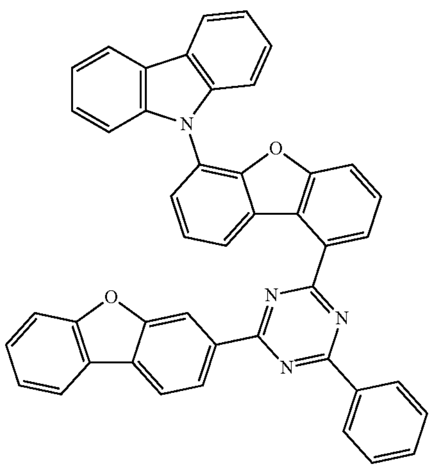
261
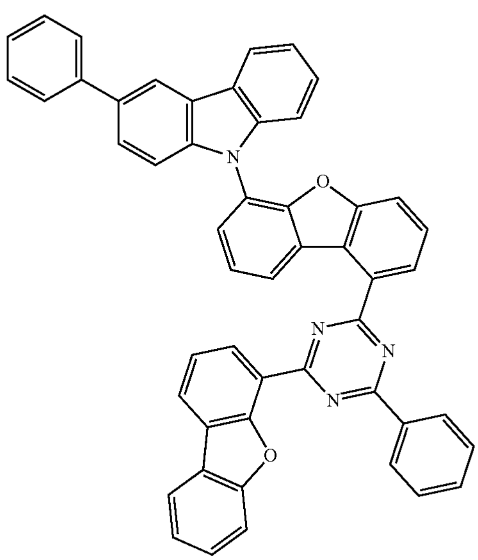
-continued
262
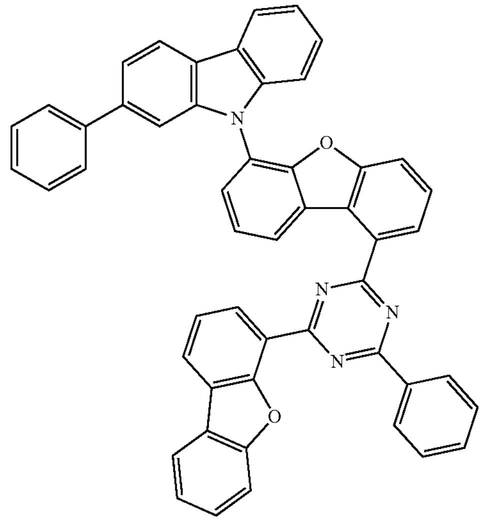
263
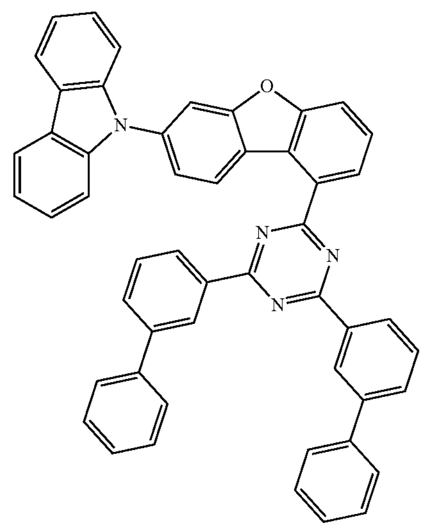
264
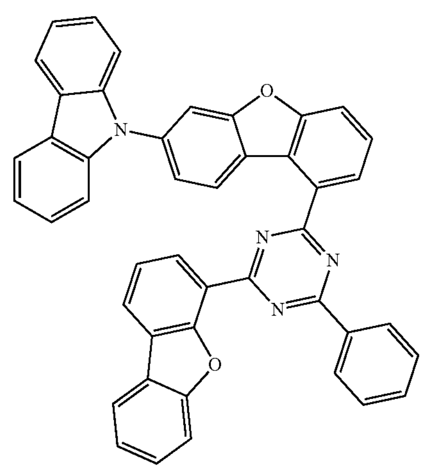

-continued
265
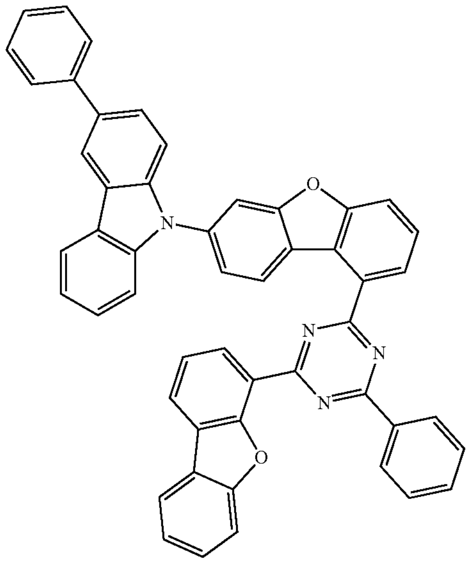
266
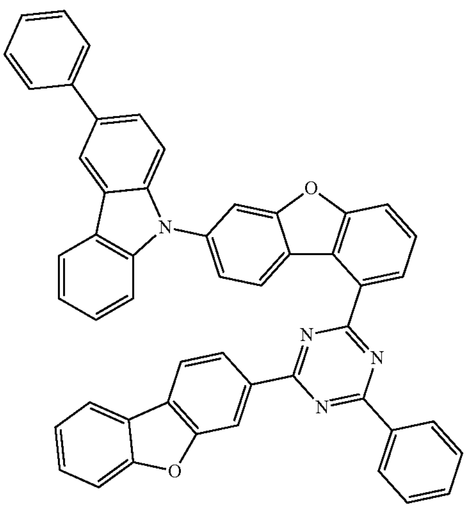
267
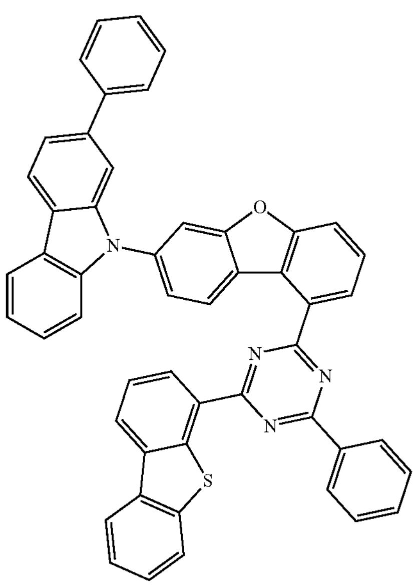
-continued
268
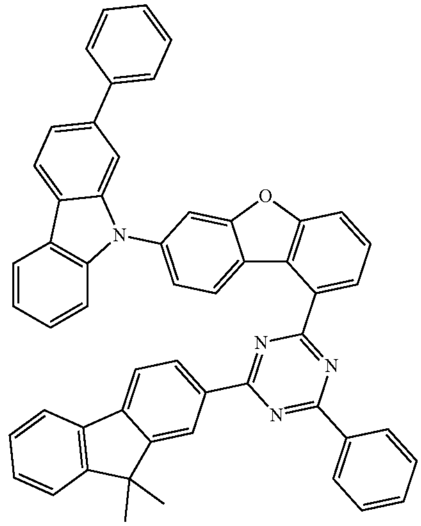
269
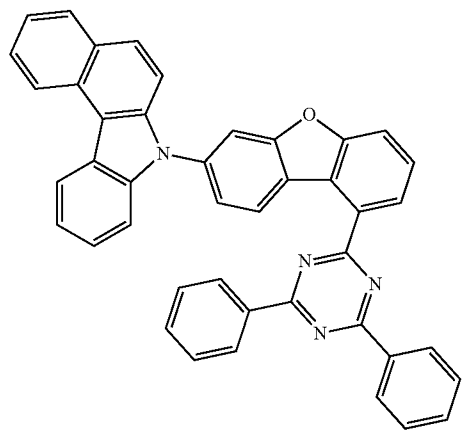
270
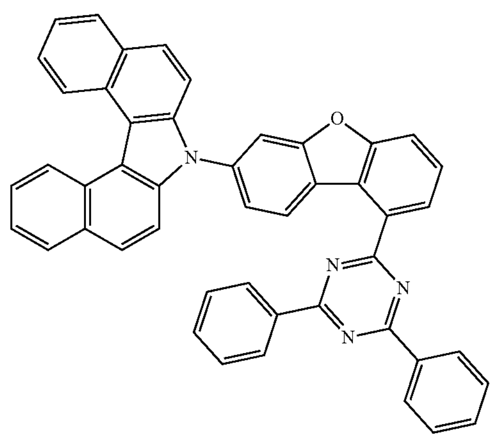

-continued
271
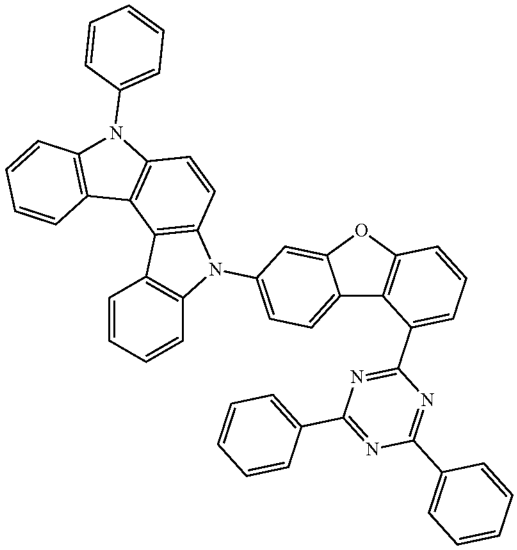
272
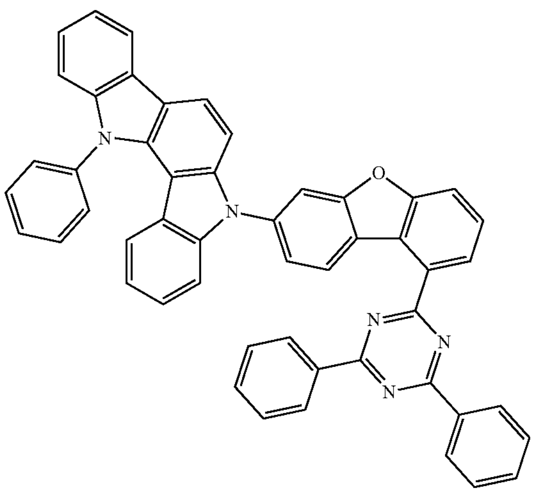
273
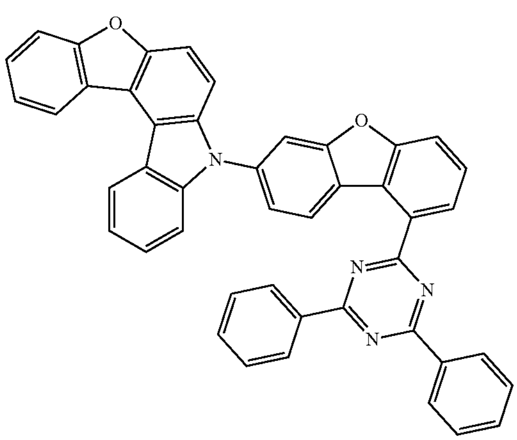
-continued
274
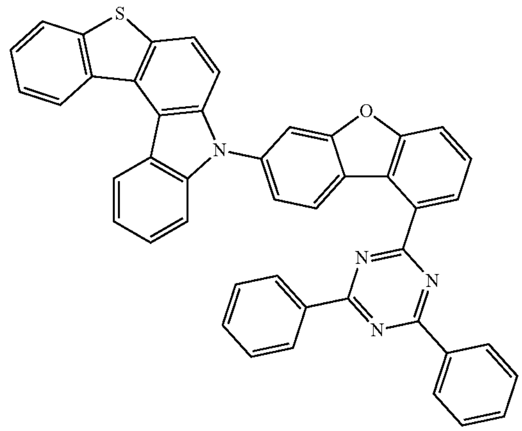
275
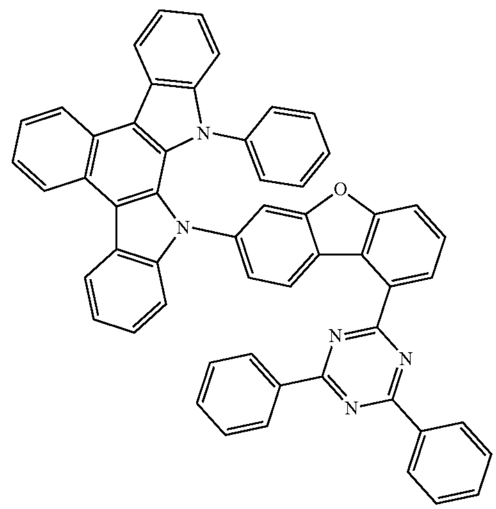
276
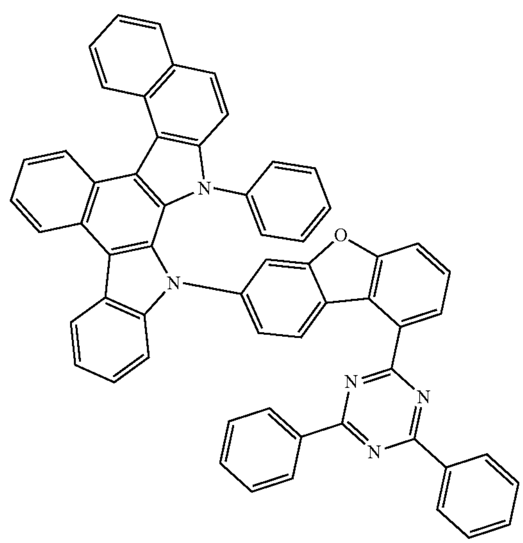

-continued
277
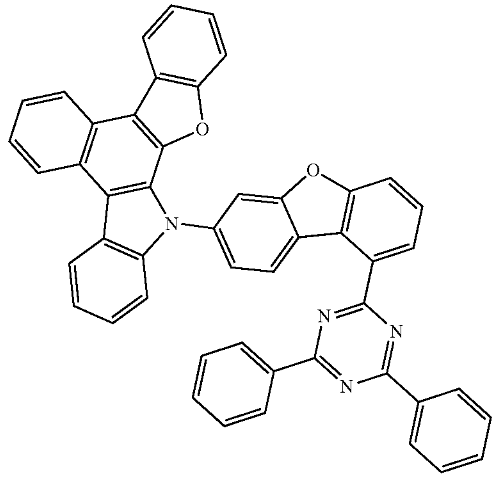
278
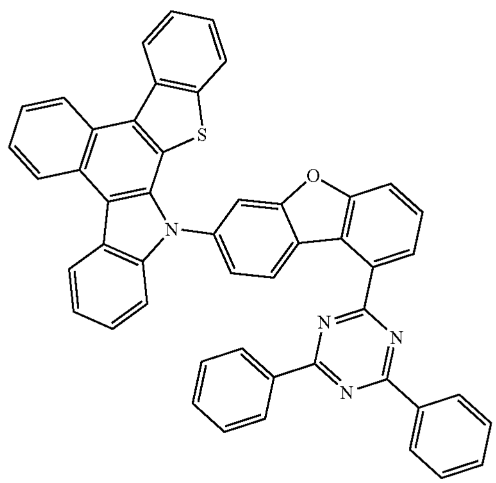
279
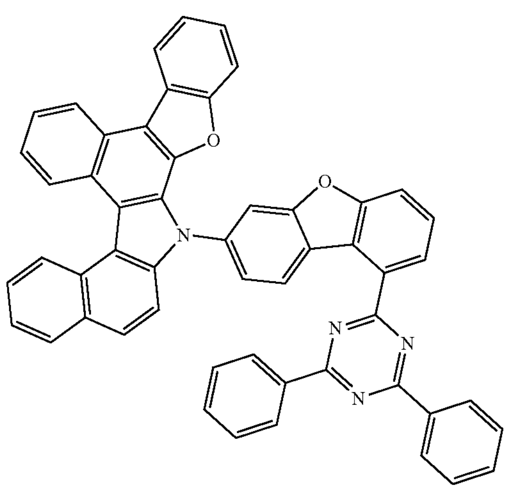
-continued
280
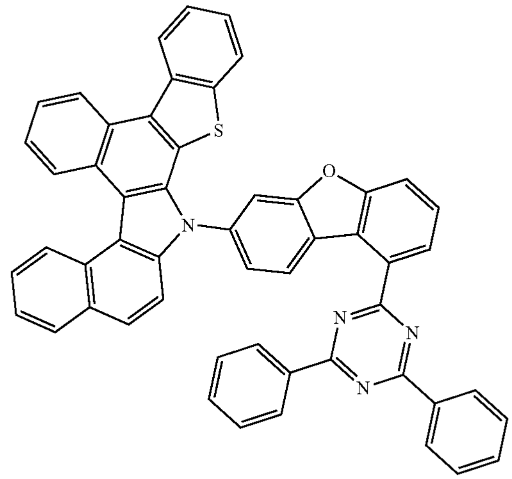
281
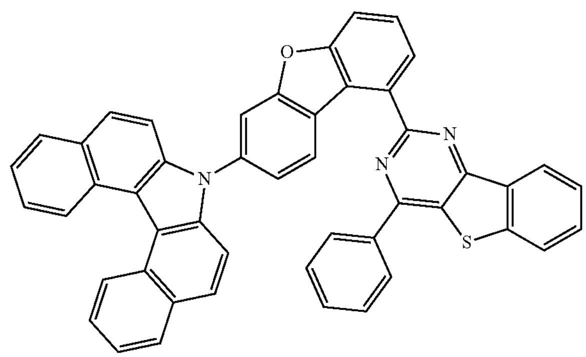
282
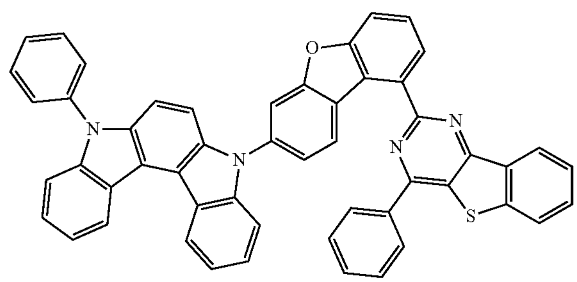
283
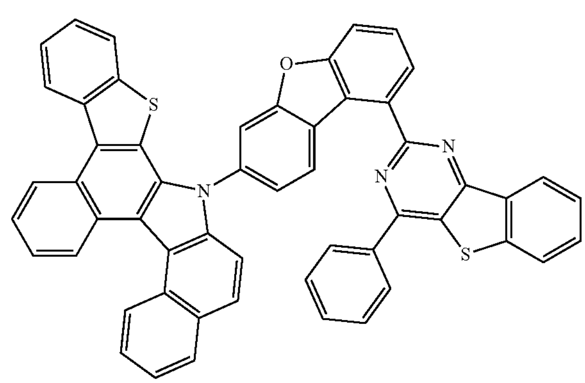

-continued
284
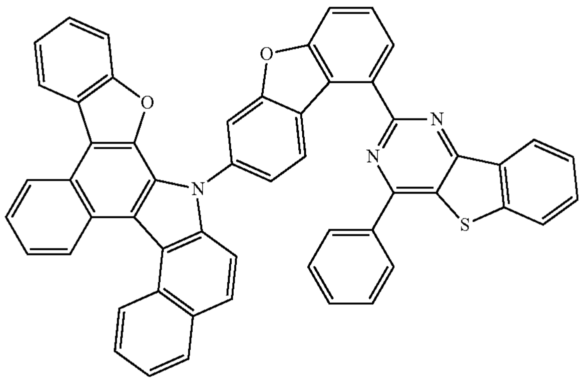
285
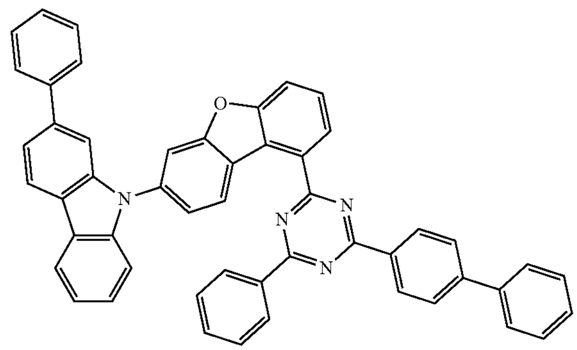
286
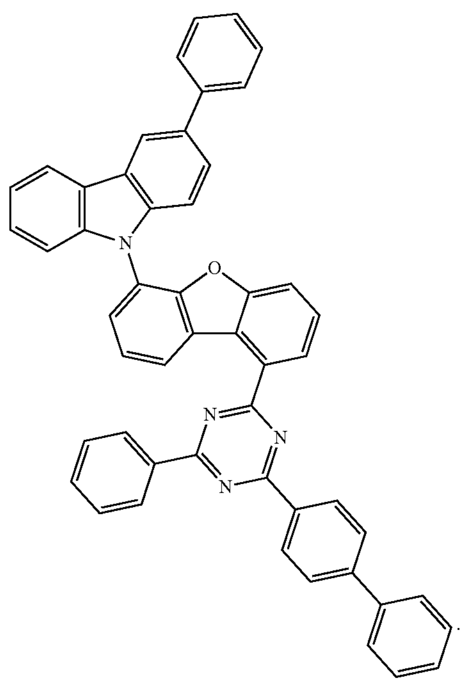
9. The organic light emitting device of claim 1, wherein Chemical Formula 24 is represented by any one of the following compounds:
1
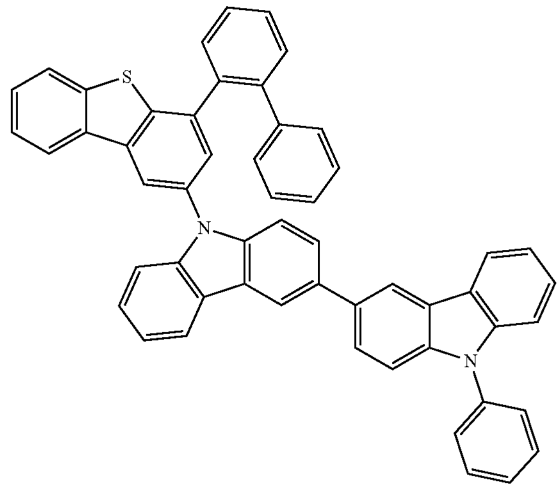
2
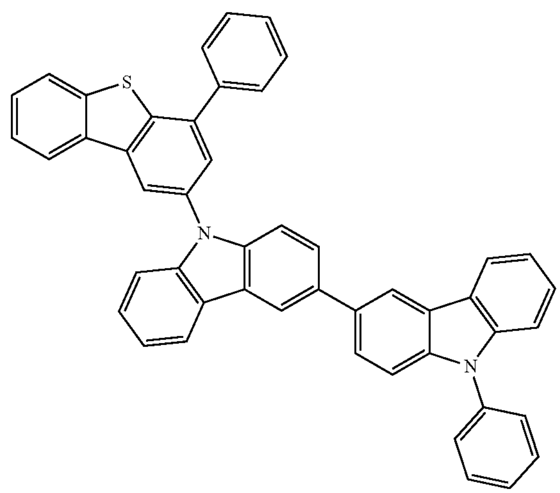
3
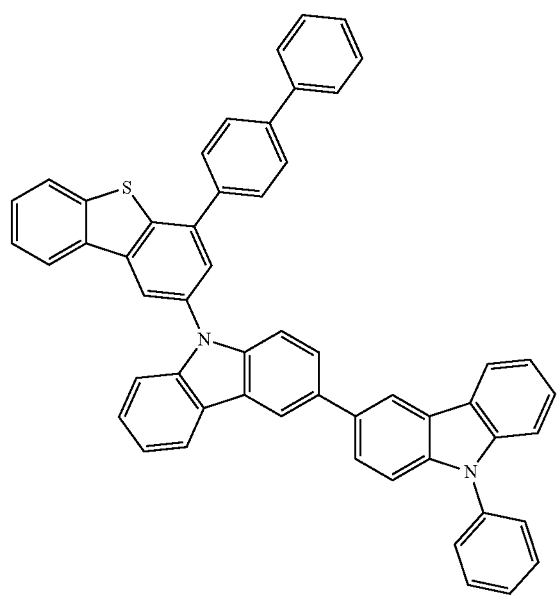

-continued
4
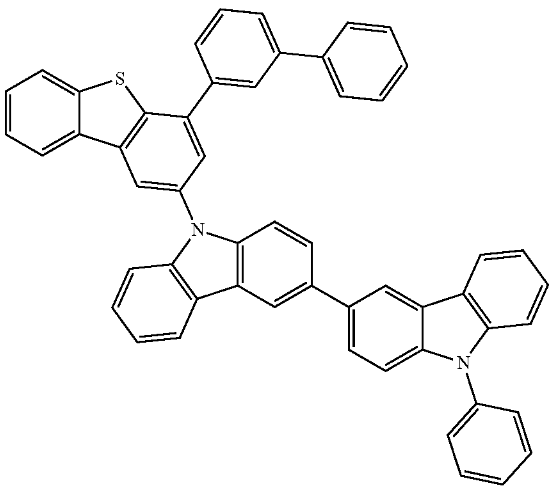
5
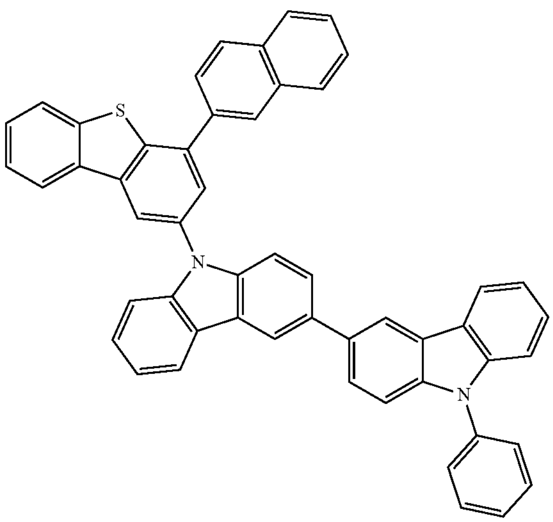
6
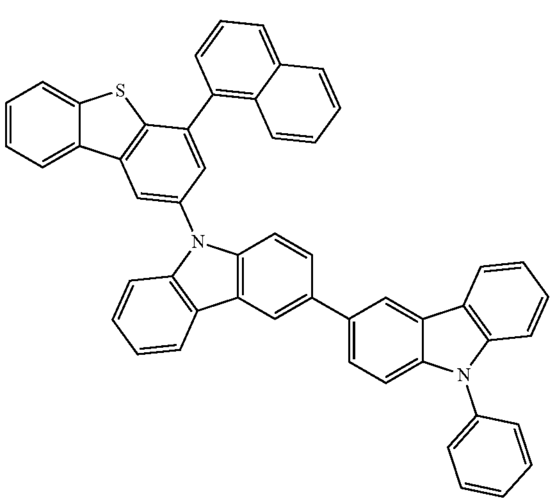
-continued
7
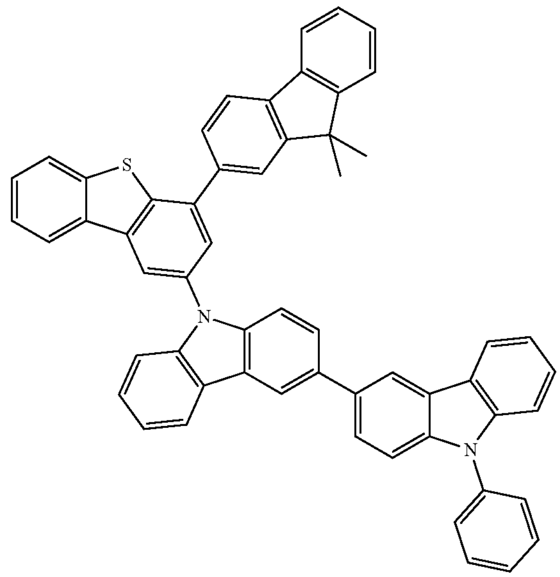
8
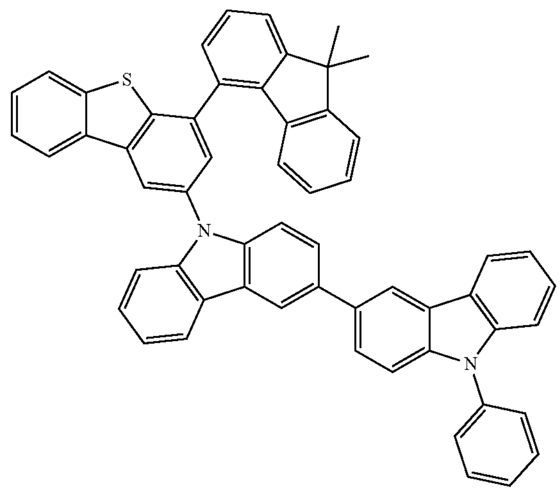
9
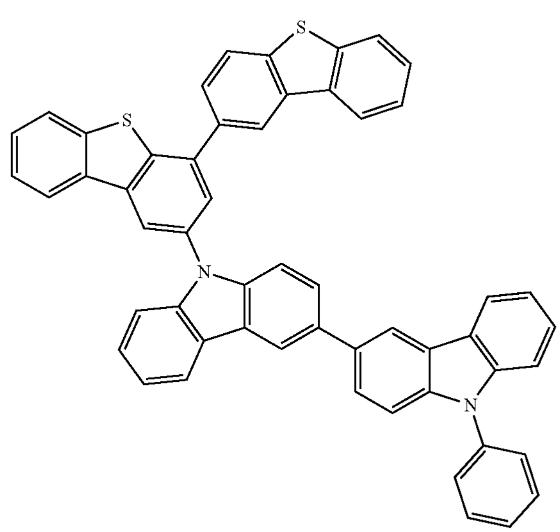

-continued
10
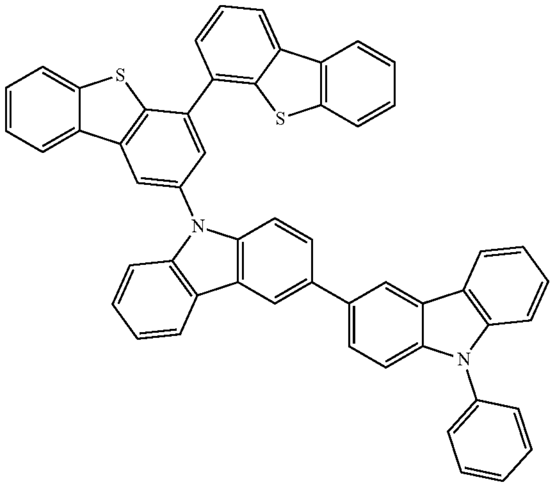
11
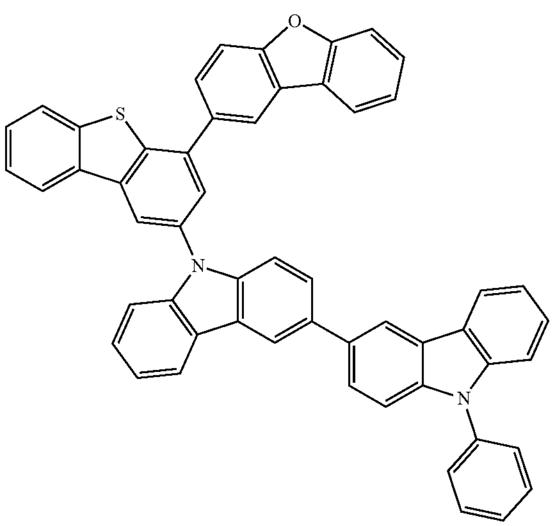
12
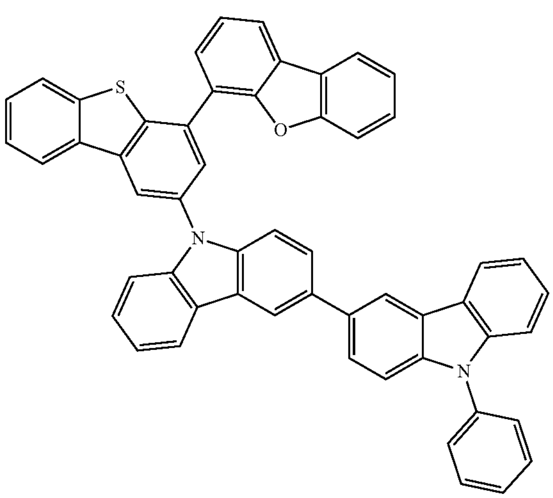
-continued
13
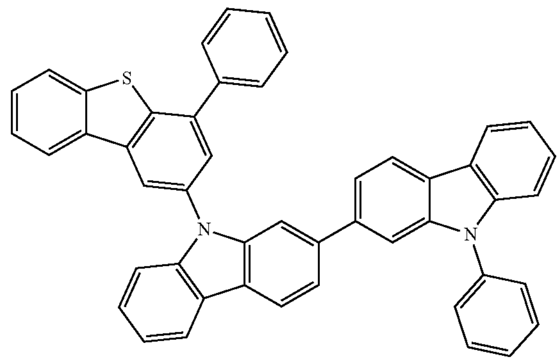
14
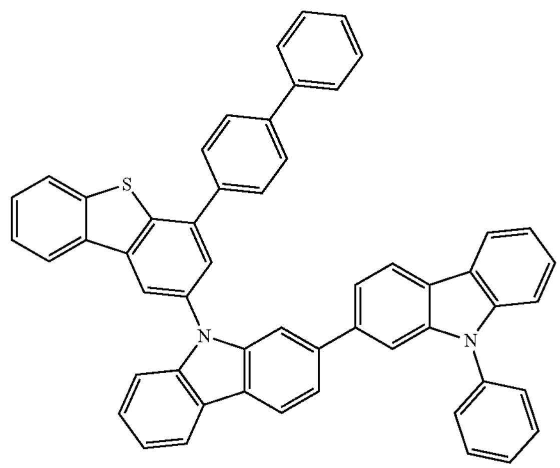
15
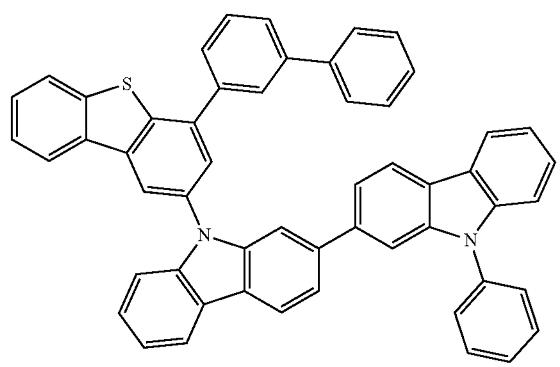
16
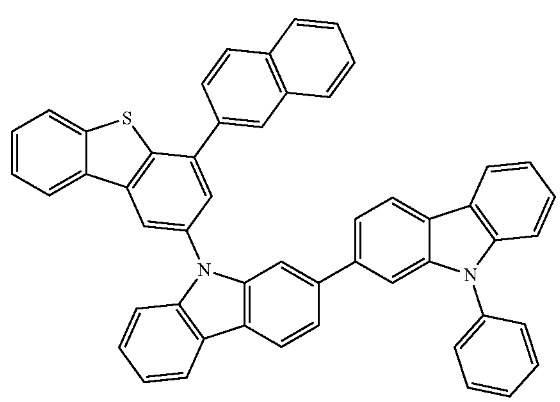

-continued
17
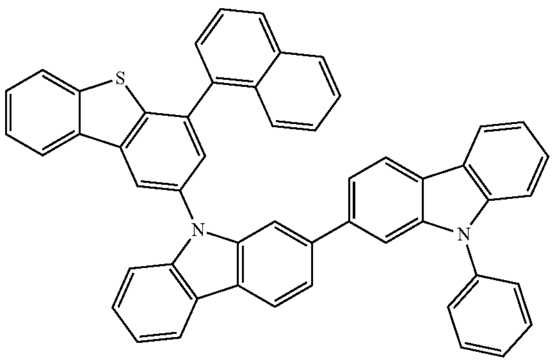
18
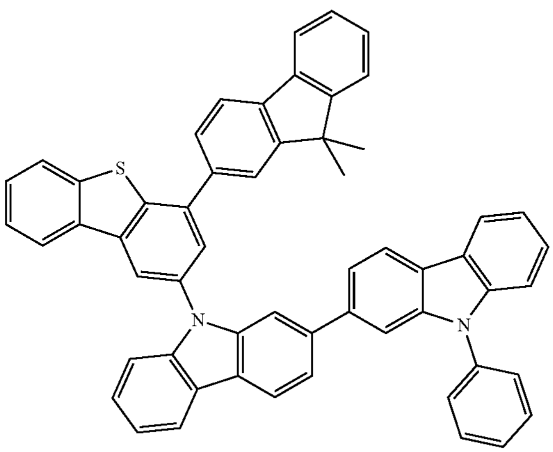
19
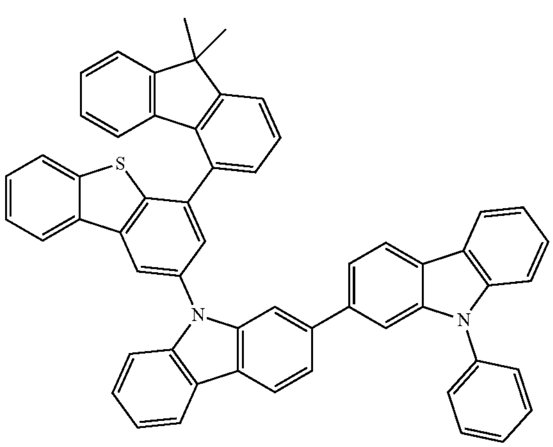
-continued
20
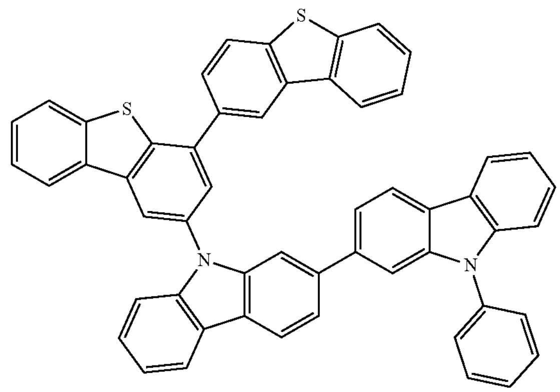
21
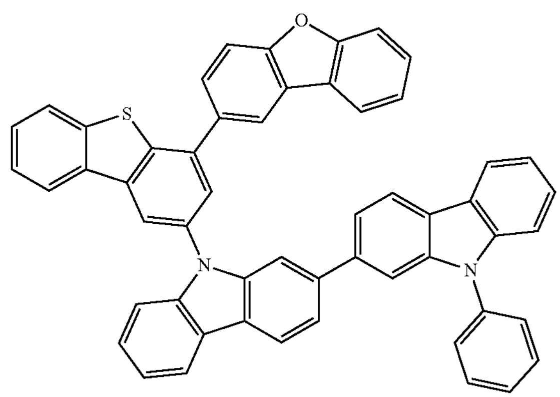
22
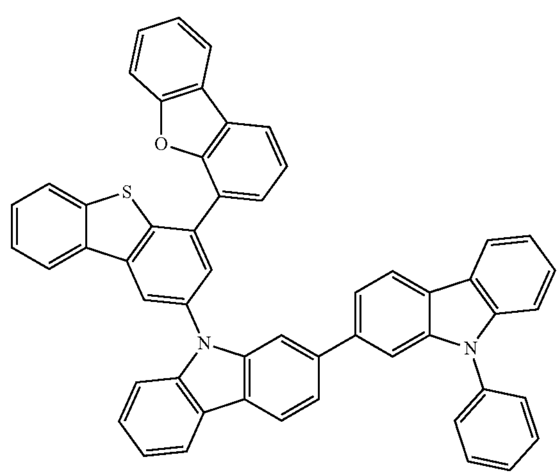

23
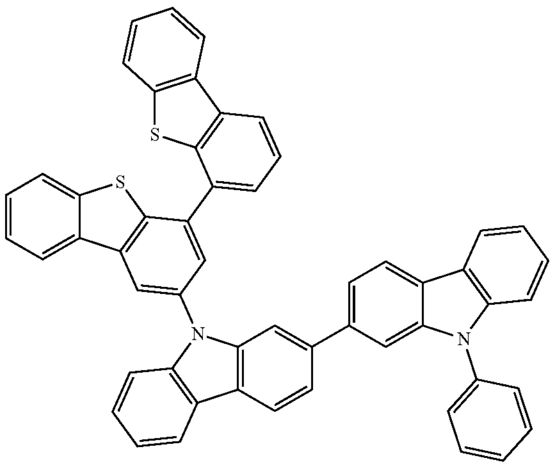
24
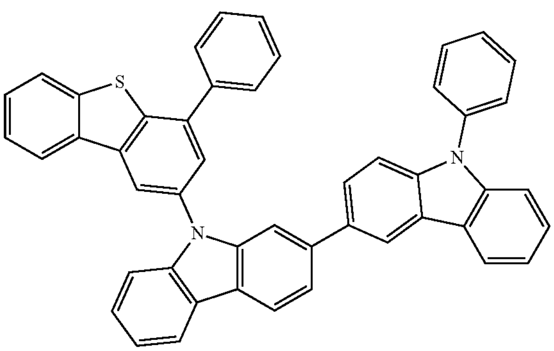
25
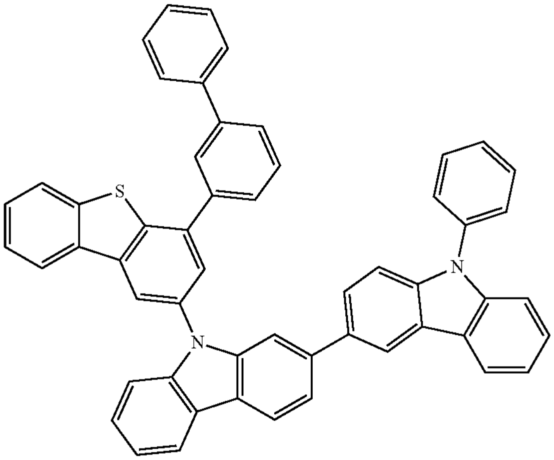
26
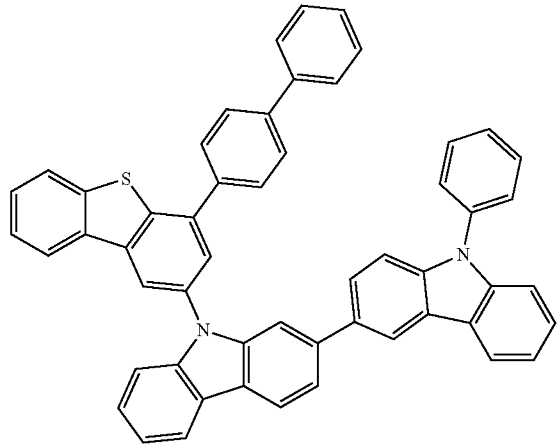
27
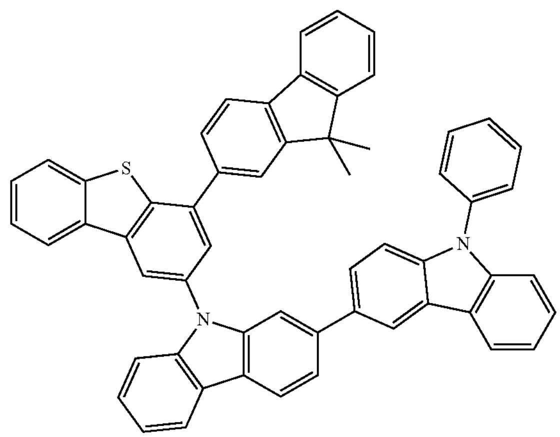
28
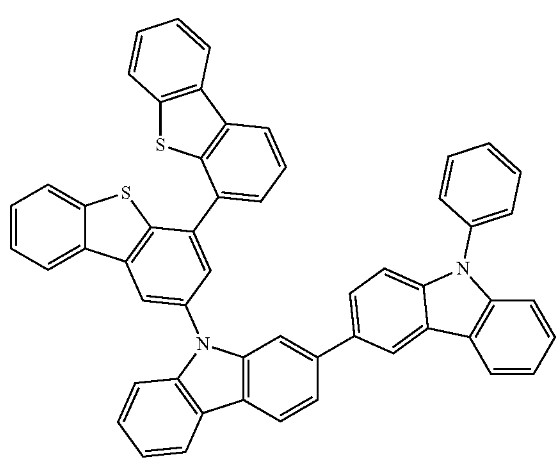

-continued
29
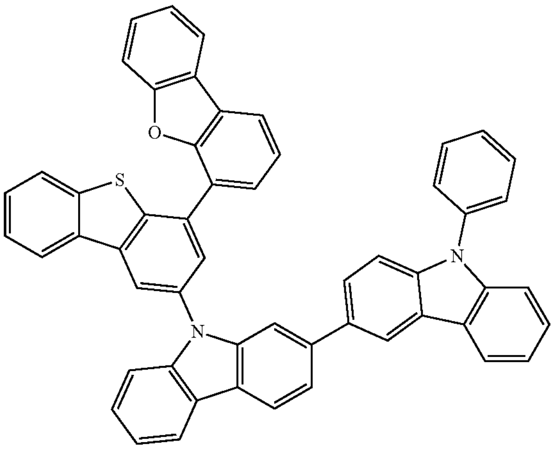
30
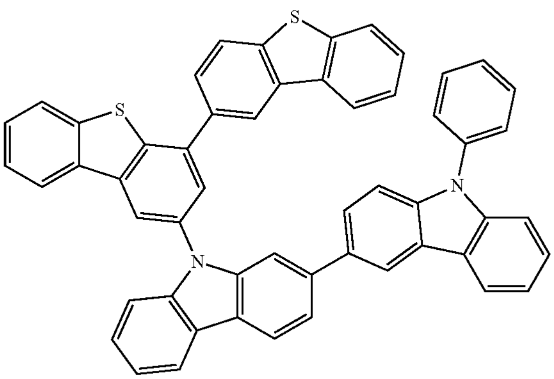
31
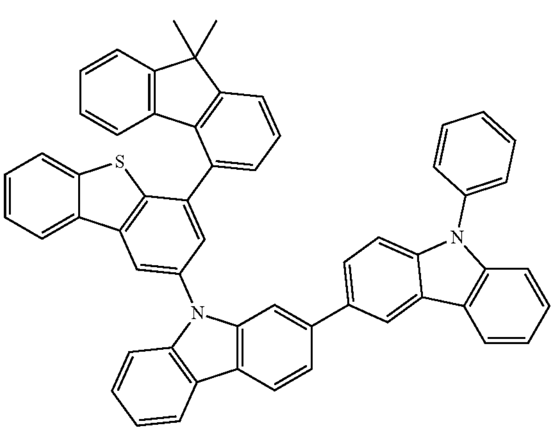
-continued
32
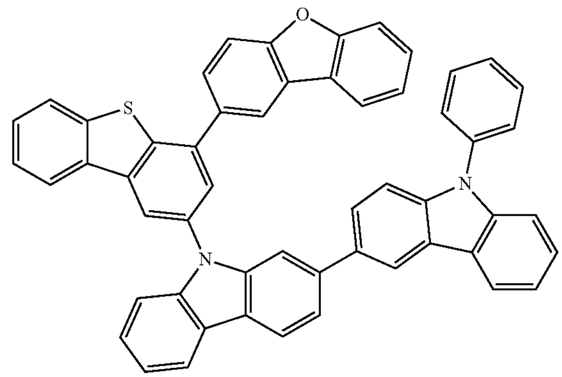
33
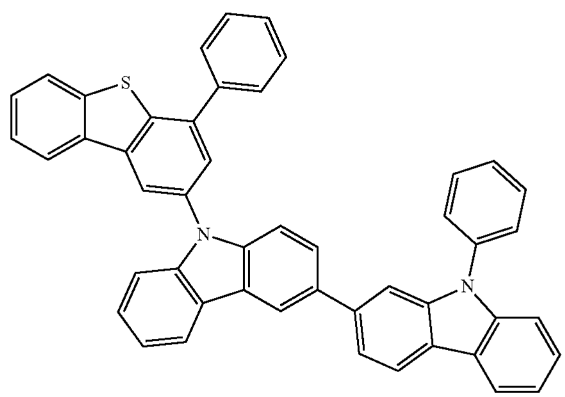
34
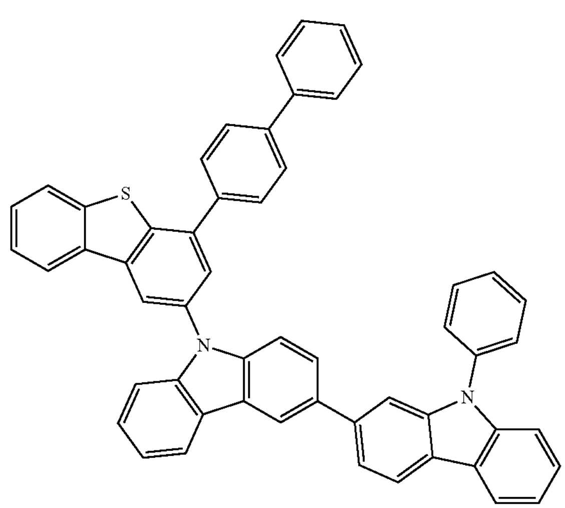

-continued
35
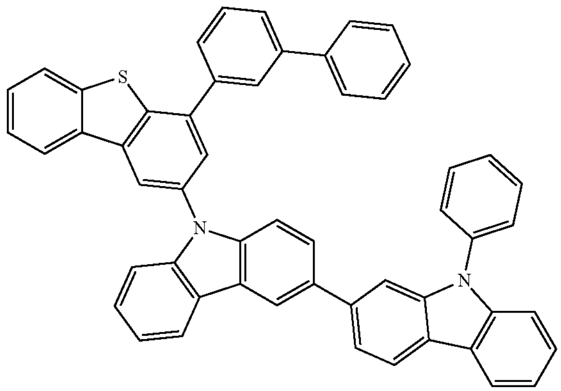
36
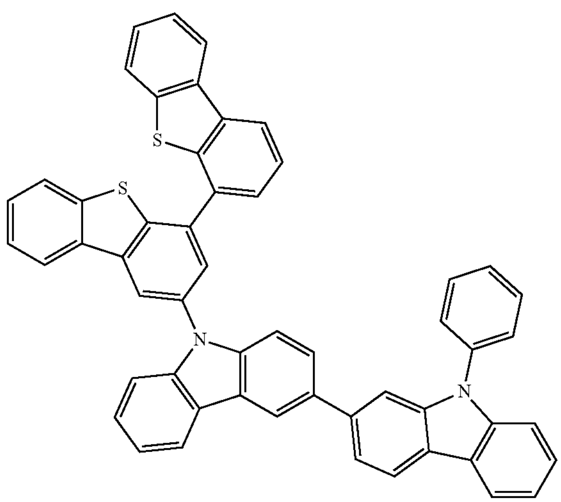
37
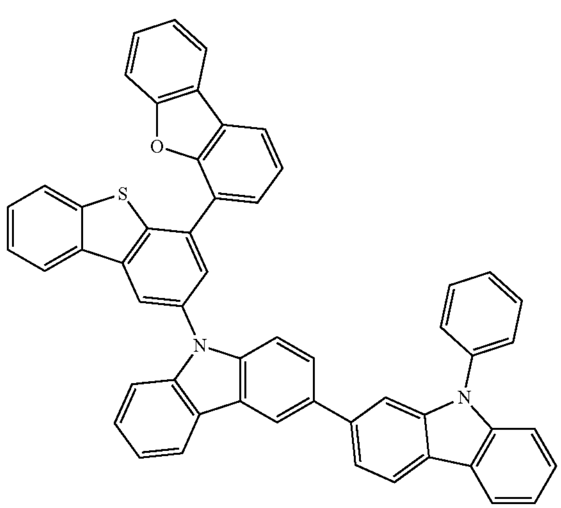
-continued
38
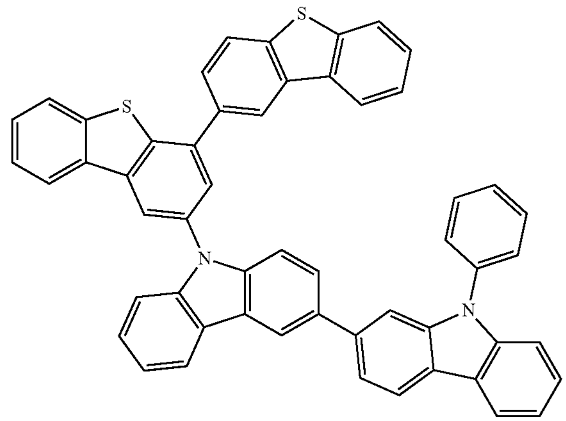
39
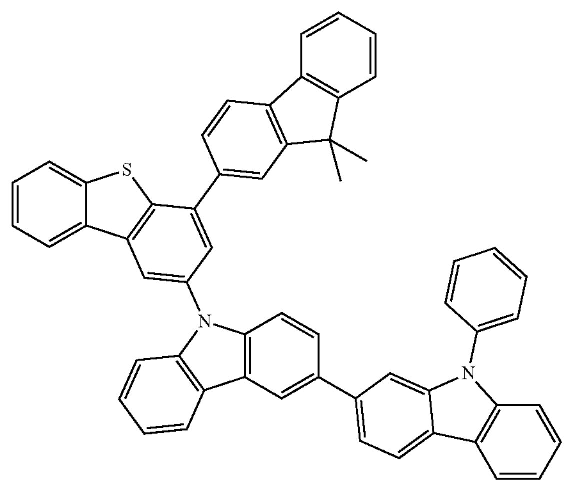
40
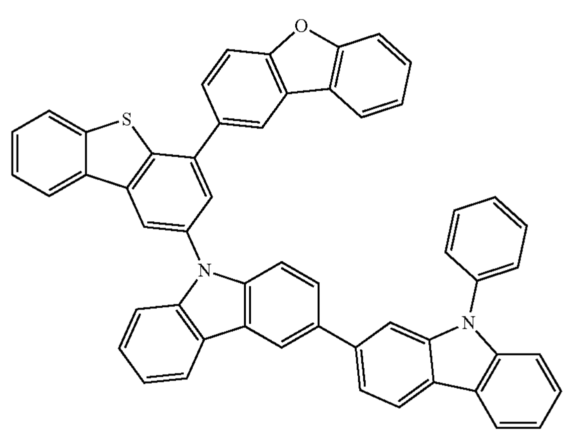

-continued
41
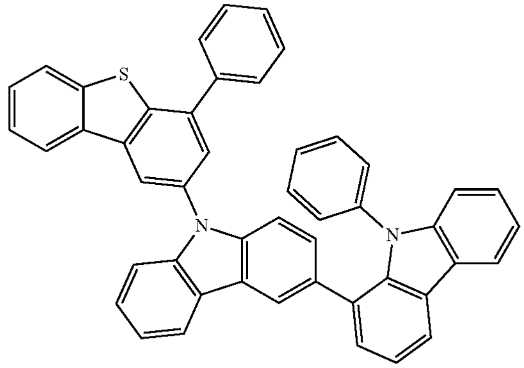
42
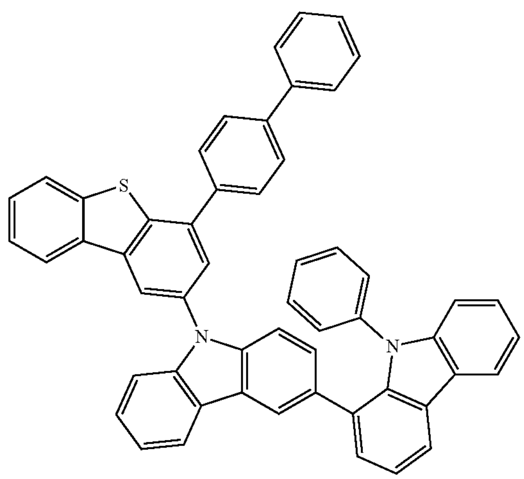
43
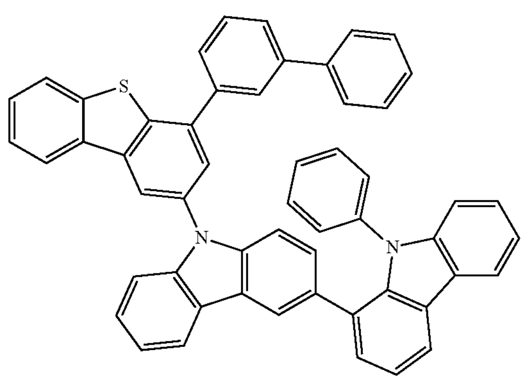
-continued
44
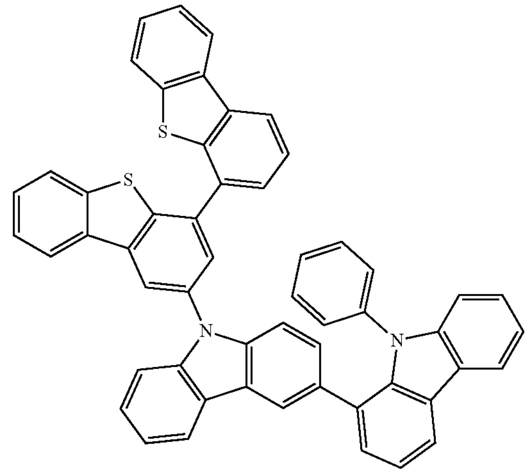
45
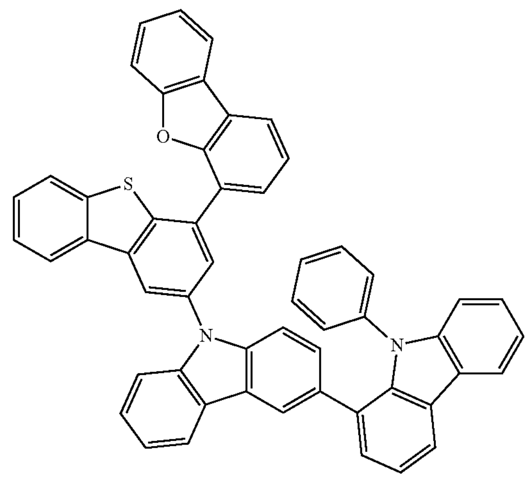
46
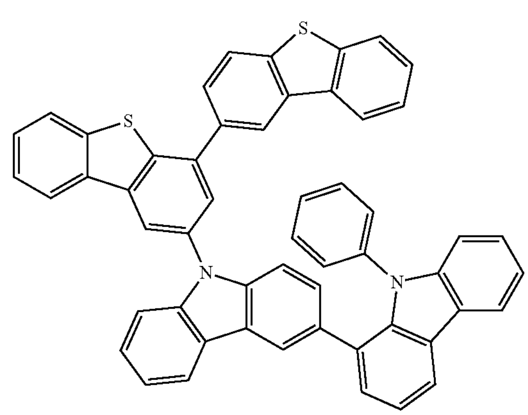

-continued
47
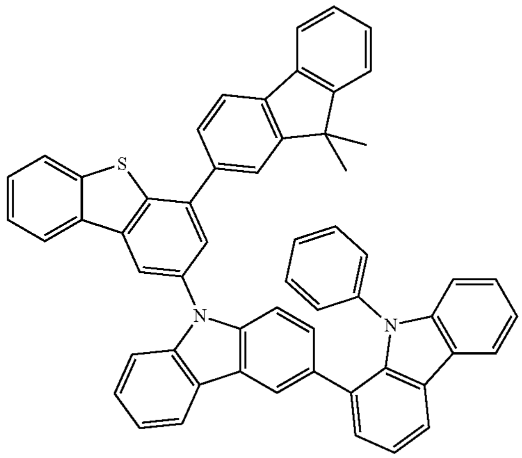
48
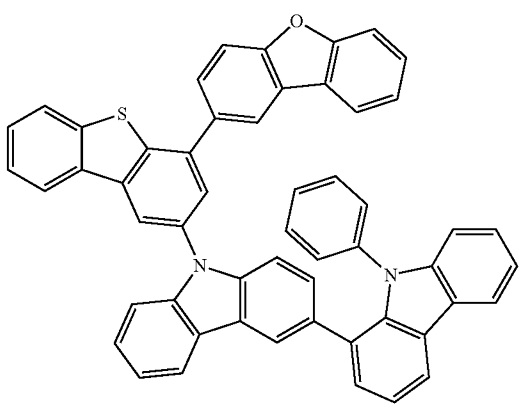
49
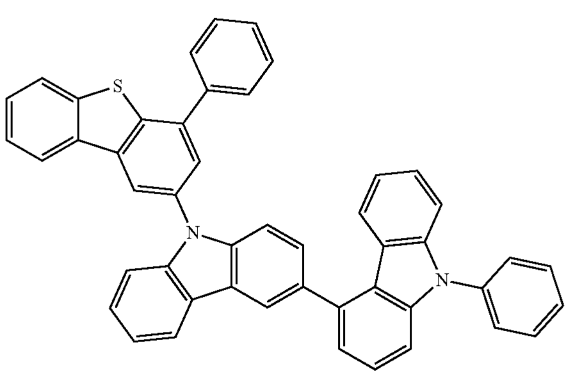
-continued
50
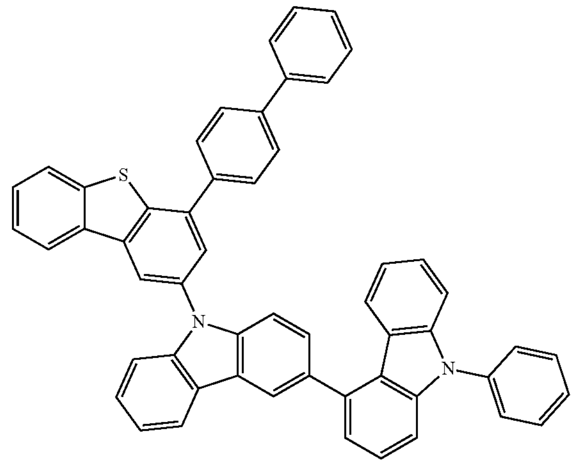
51
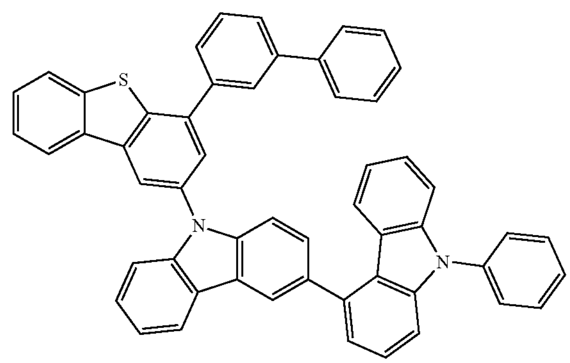
52
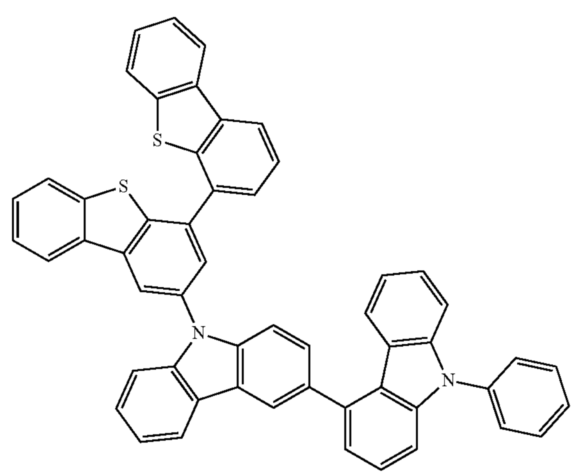

-continued
53
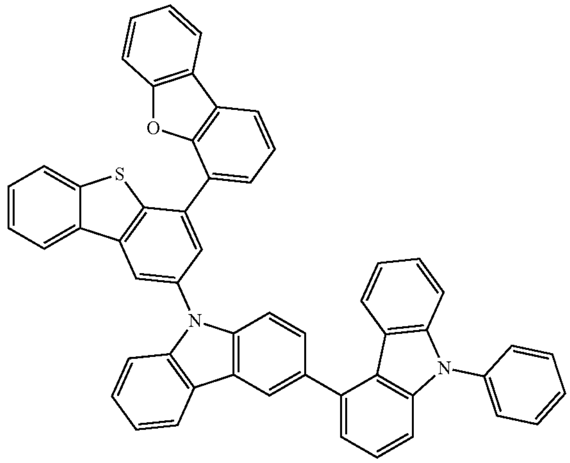
54
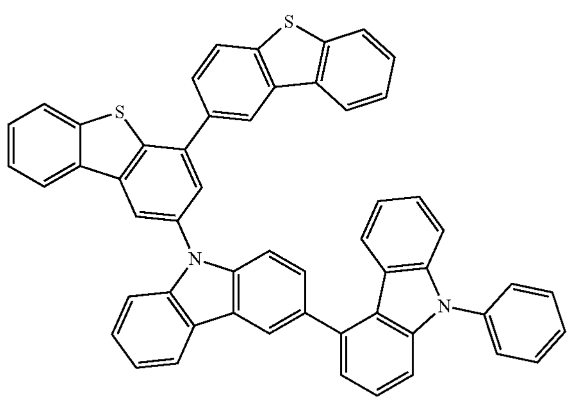
55
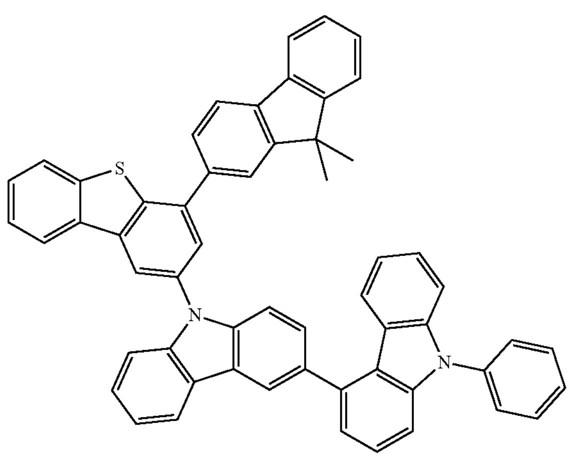
-continued
56
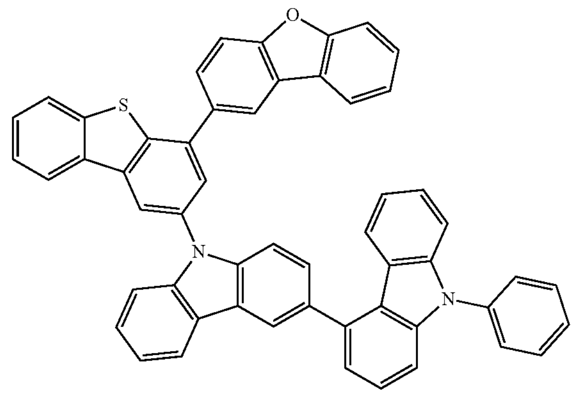
57
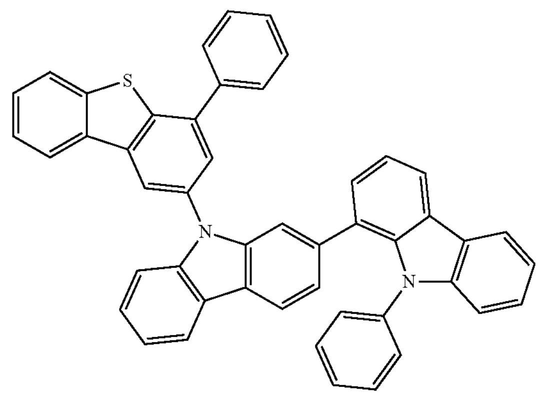
58
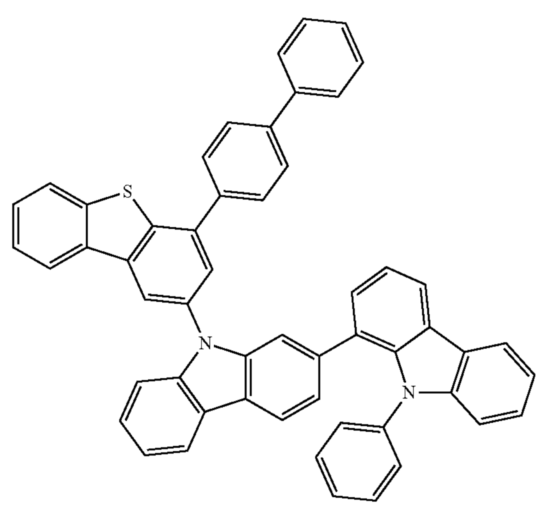

-continued
59
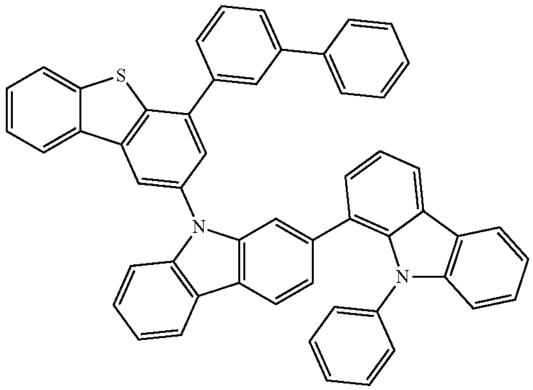
60
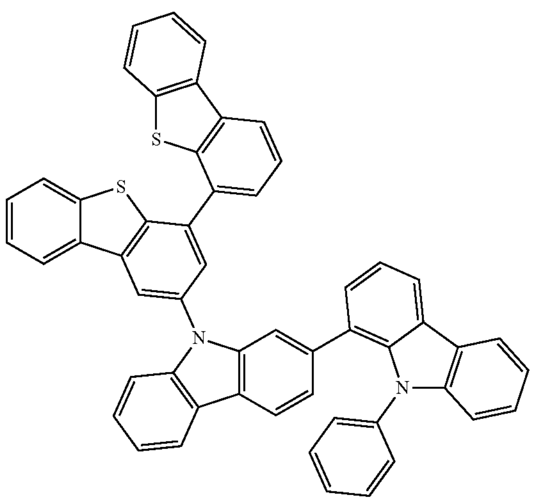
61
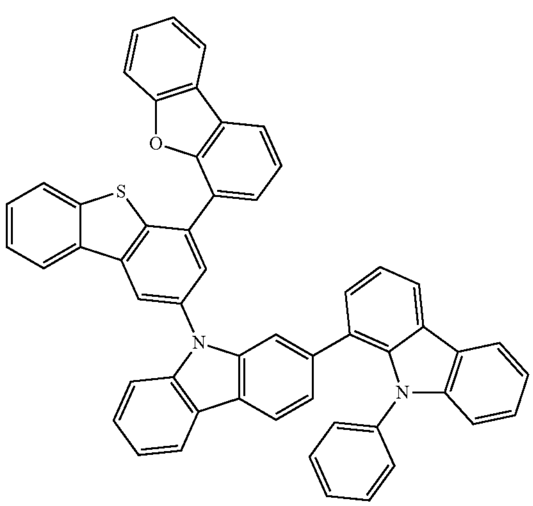
-continued
62
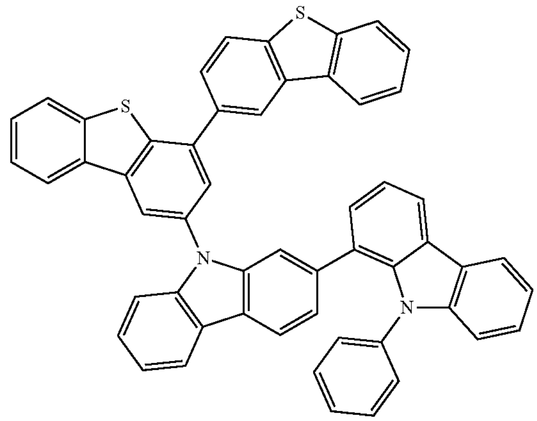
63
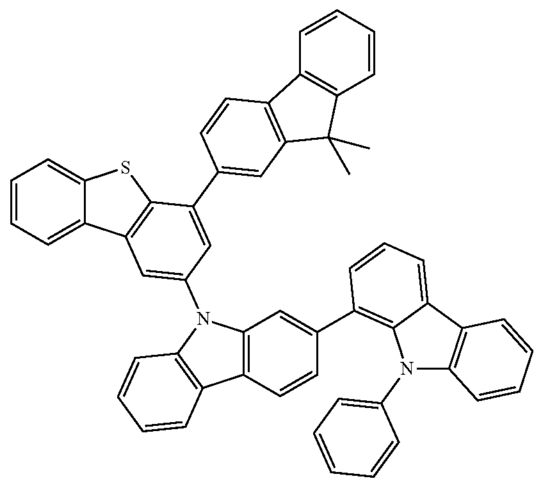
64
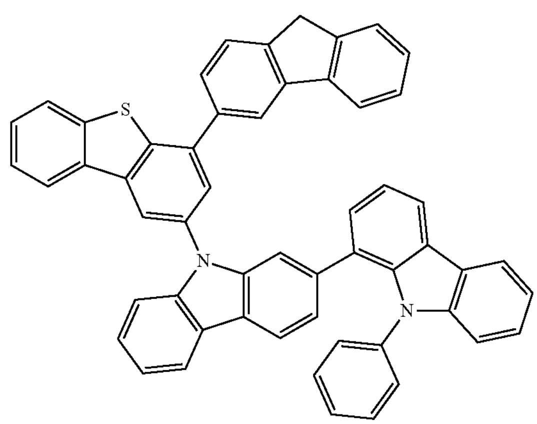

-continued
65
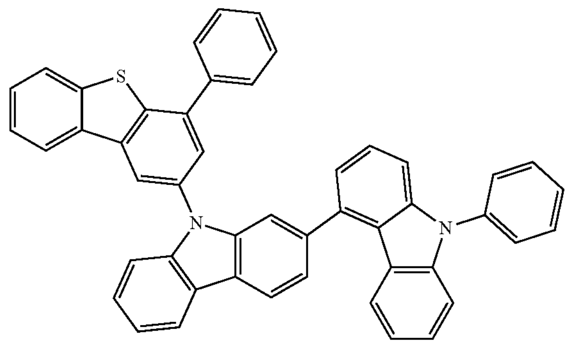
66
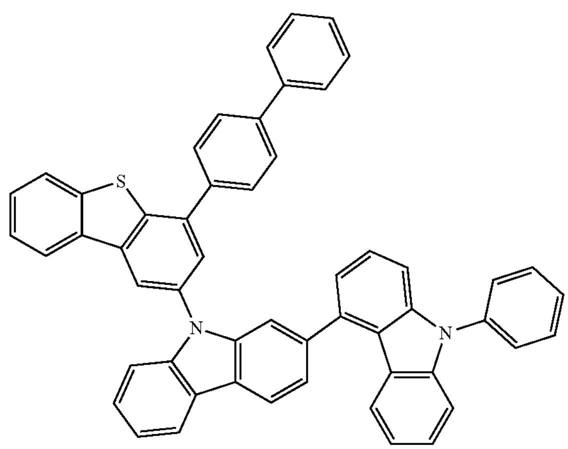
67
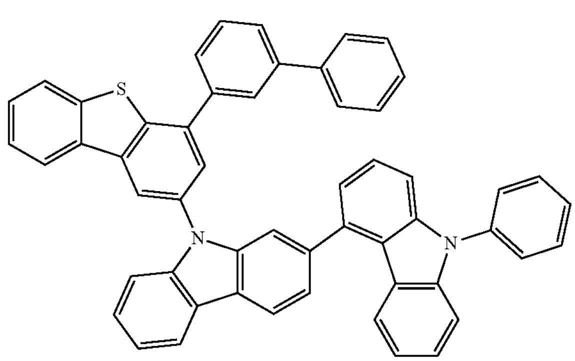
-continued
68
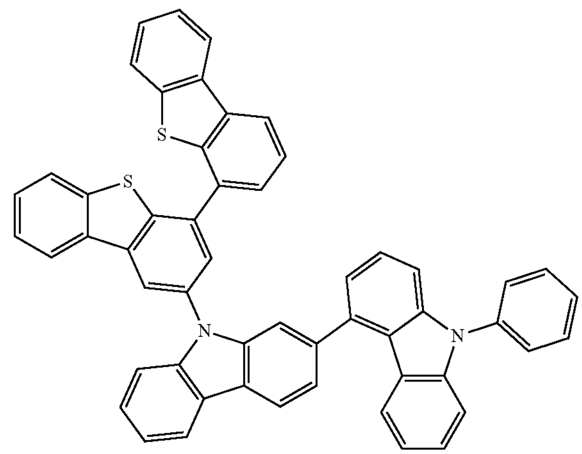
69
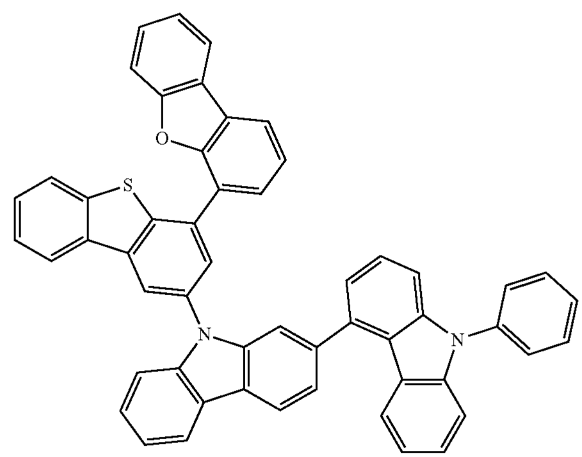
70
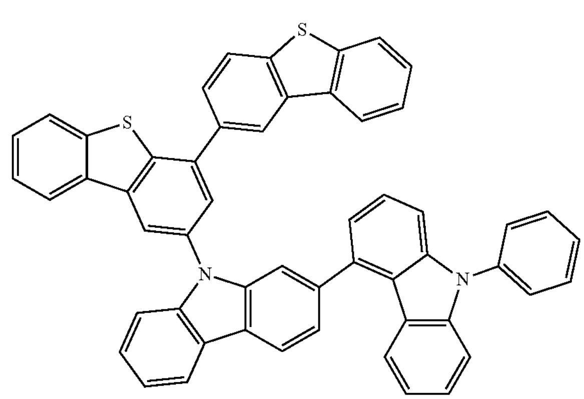

-continued
71
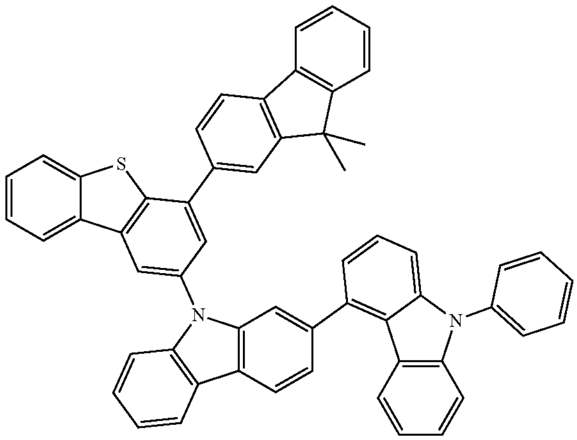
72
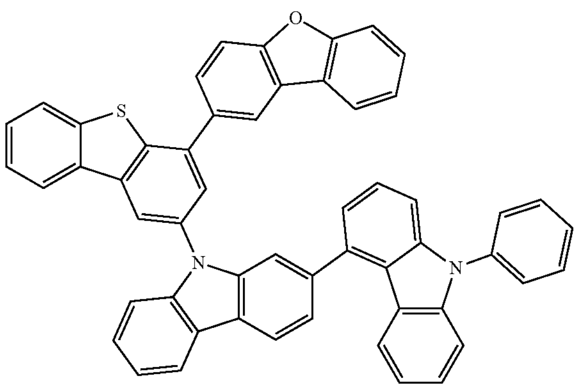
73
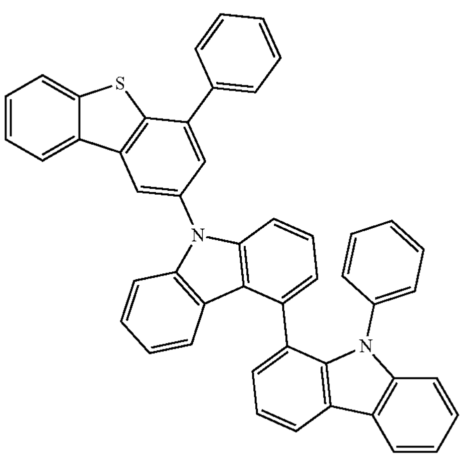
-continued
74
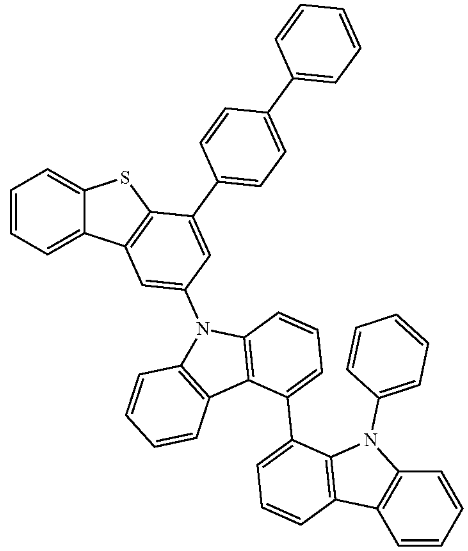
75
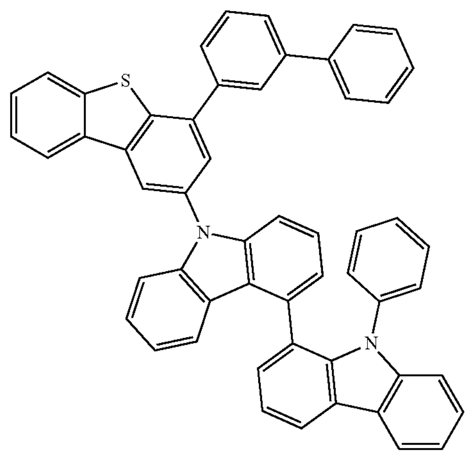
76
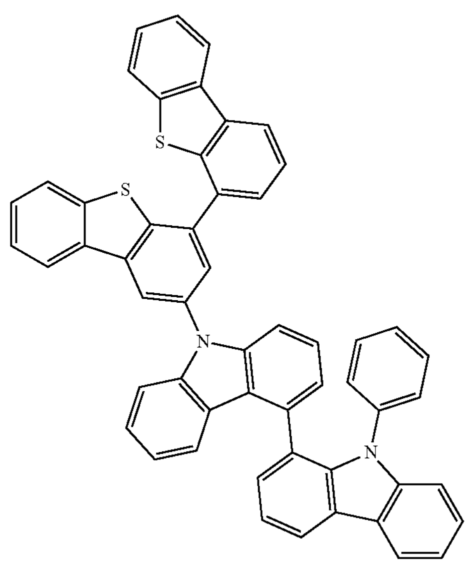

-continued
77
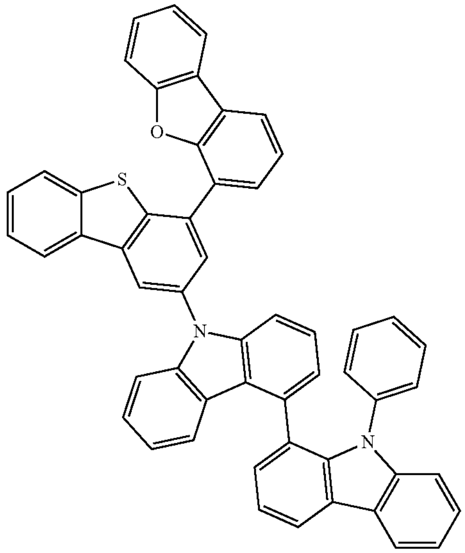
78
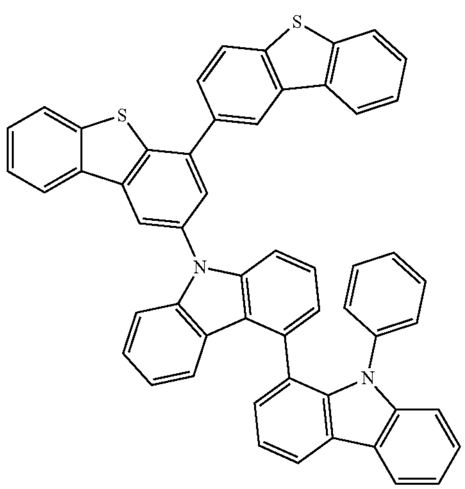
79
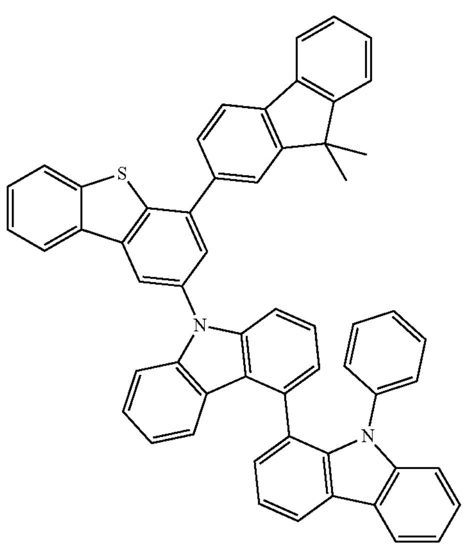
-continued
80
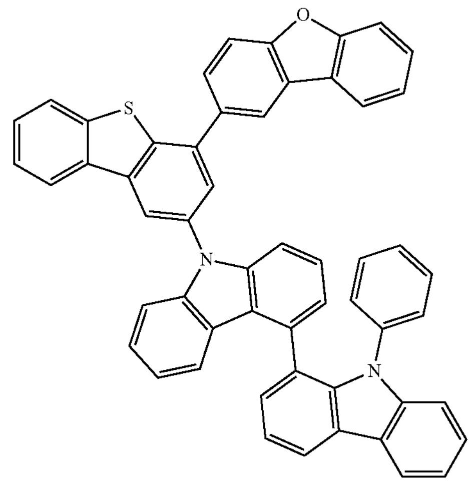
81
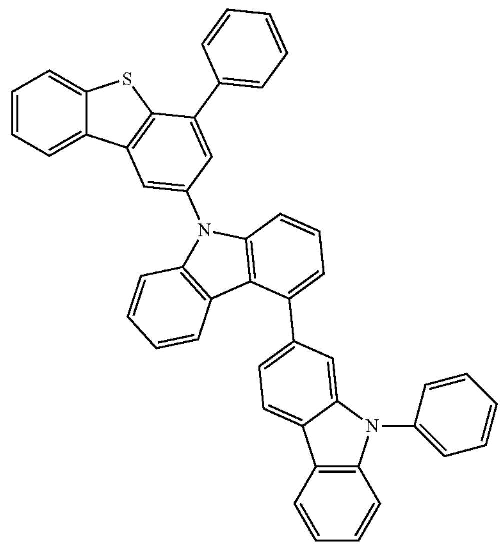
82
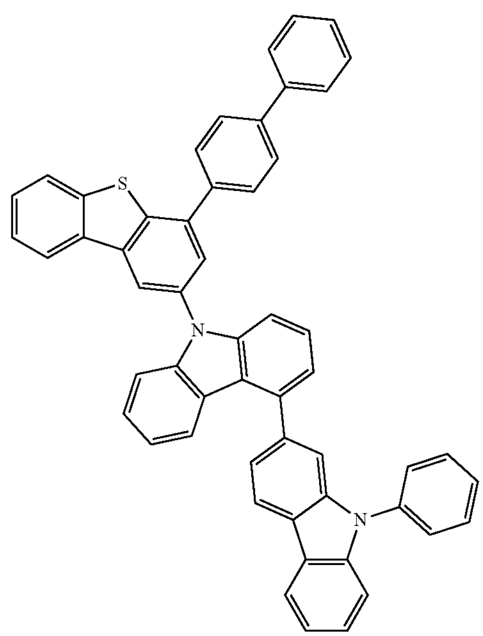

-continued
83
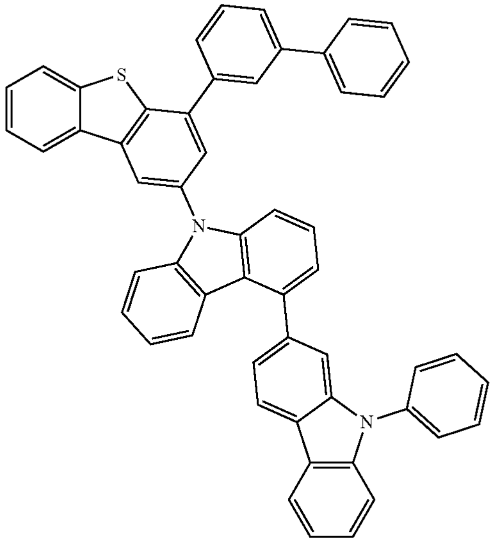
84
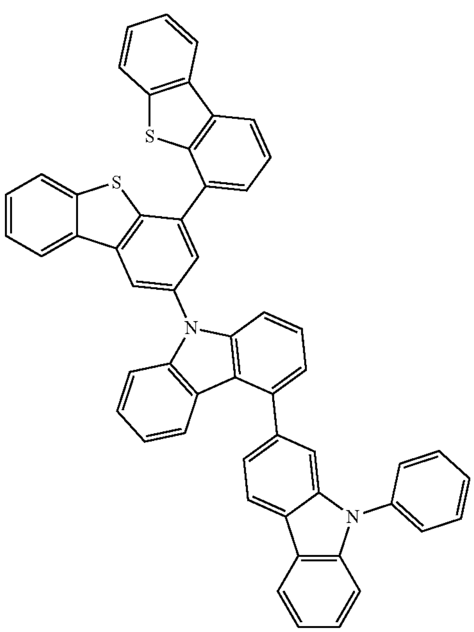
-continued
85
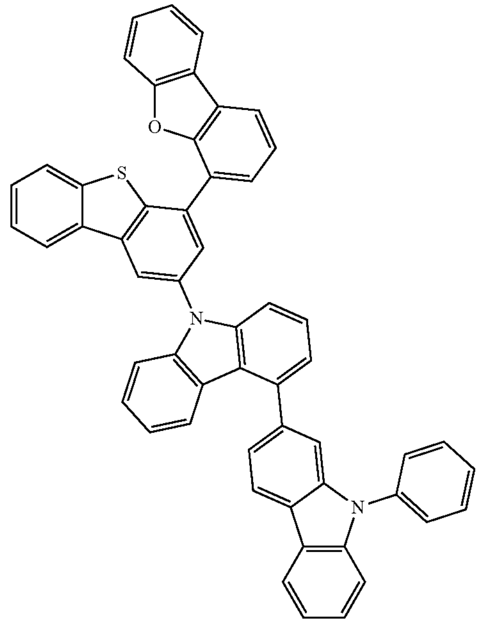
86
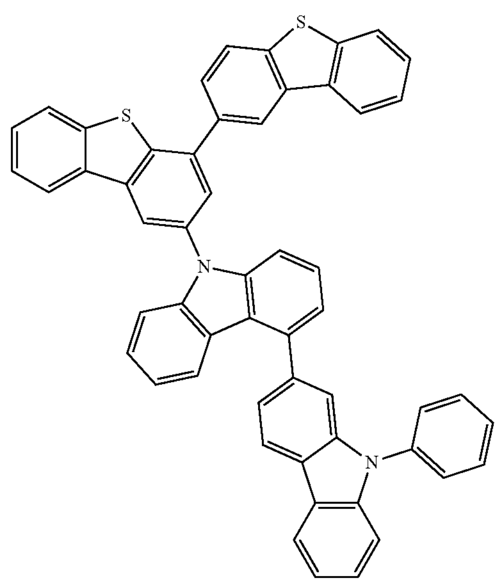

-continued
87
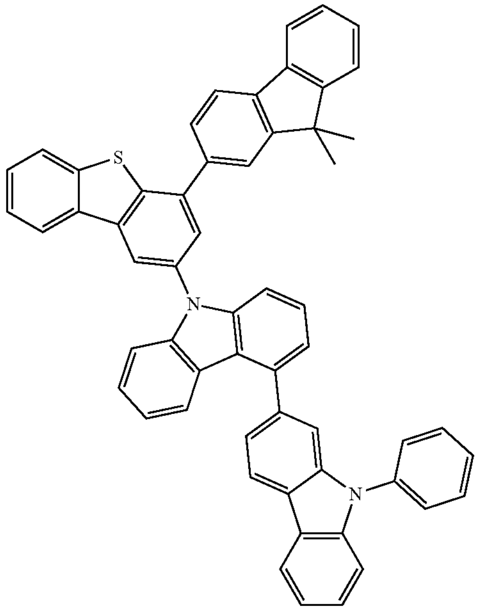
88
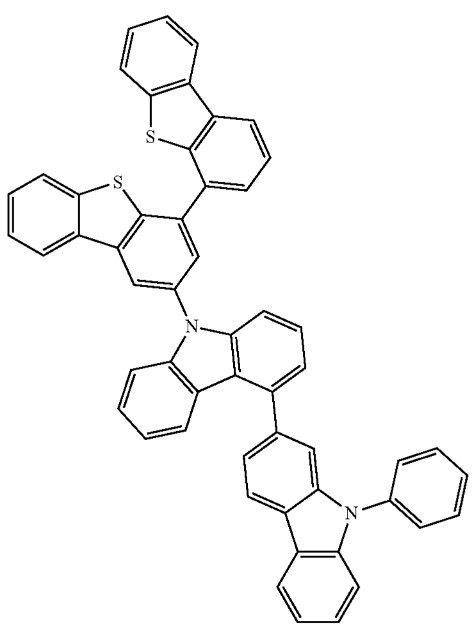
-continued
89
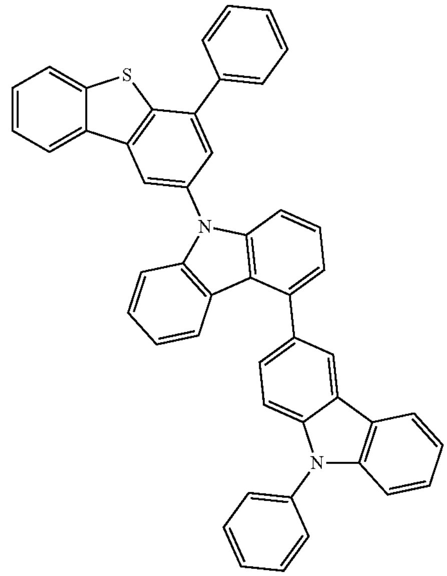
90
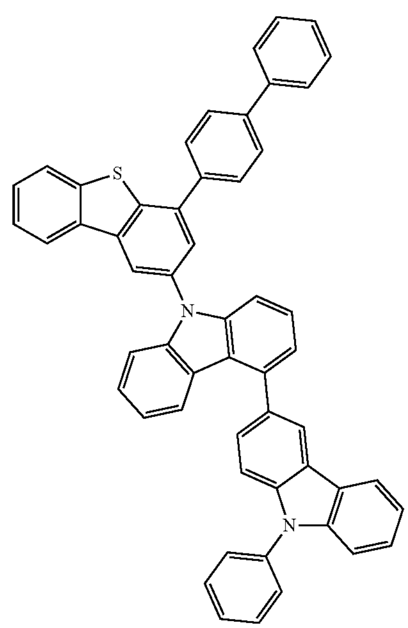

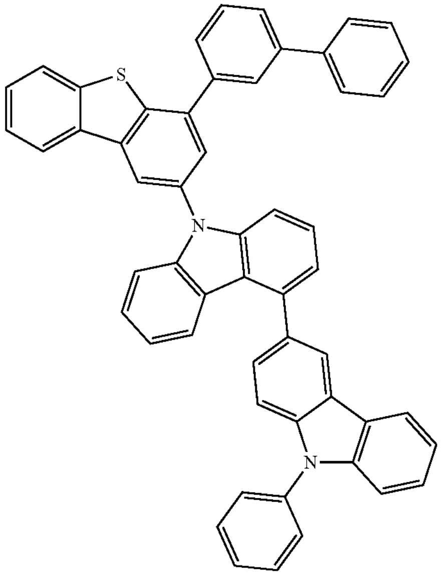
91
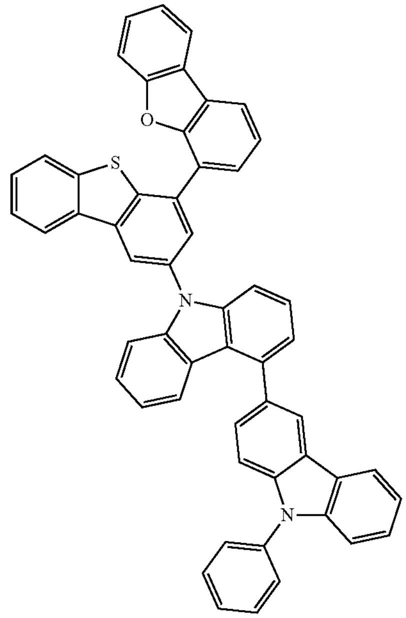
93
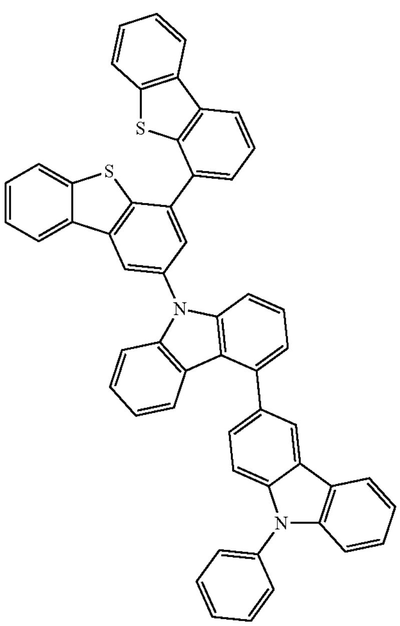
92
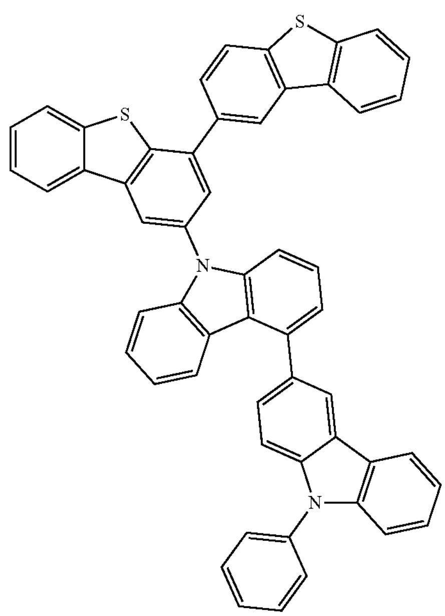
94

95
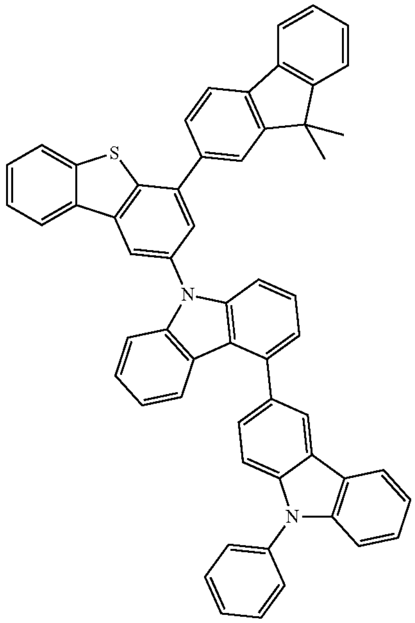
96
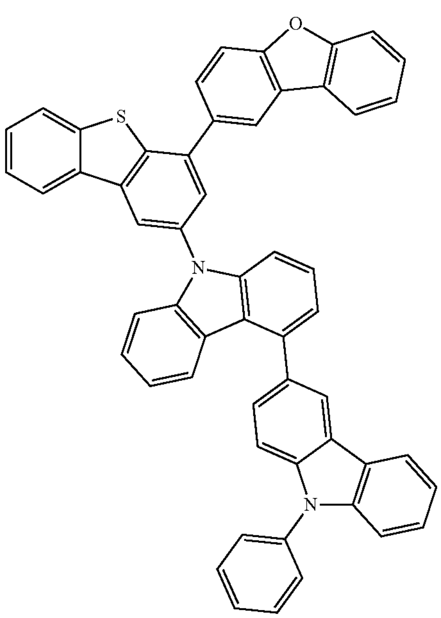
97
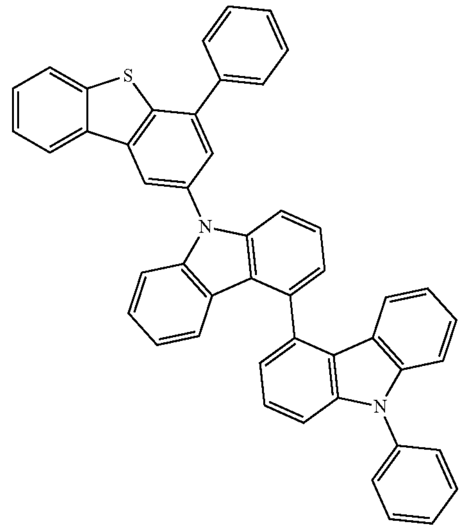
98
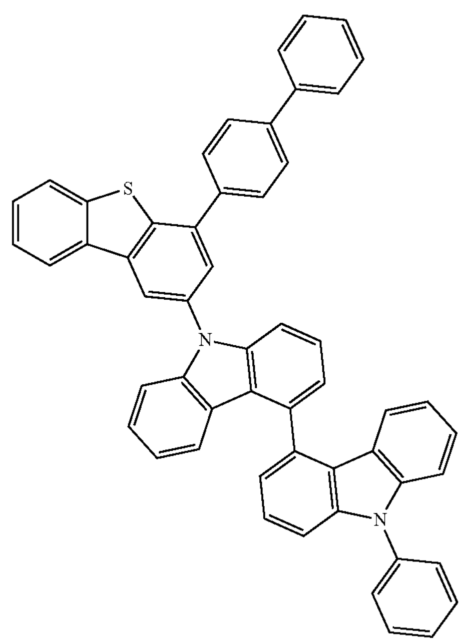

-continued
99
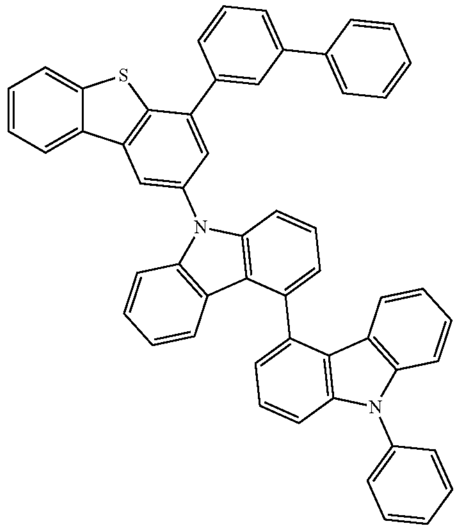
100
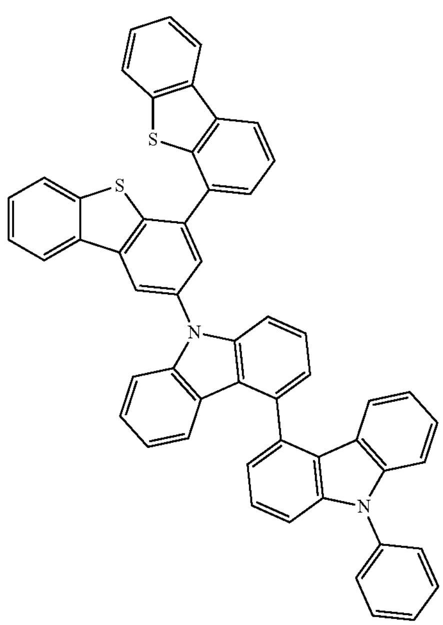
-continued
101
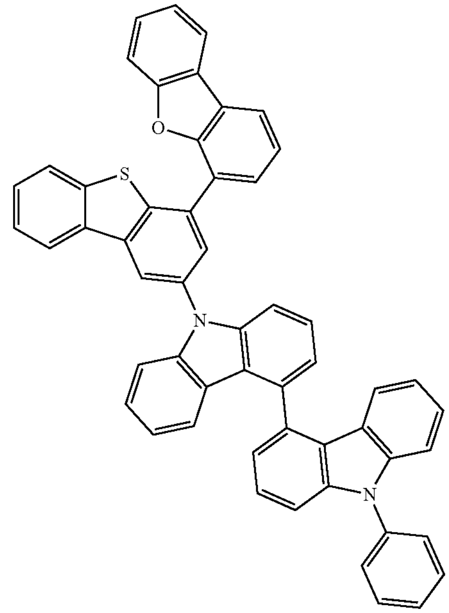
102
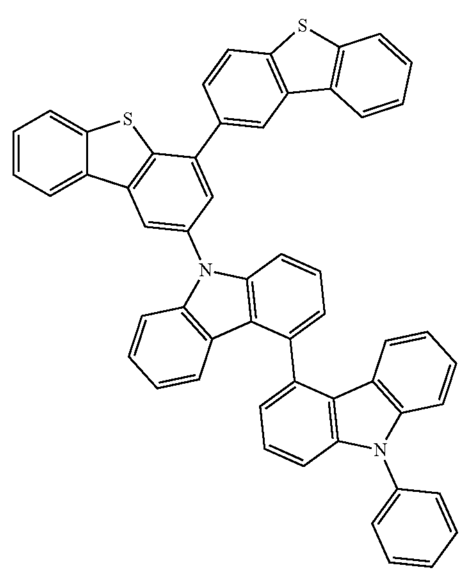

-continued

103

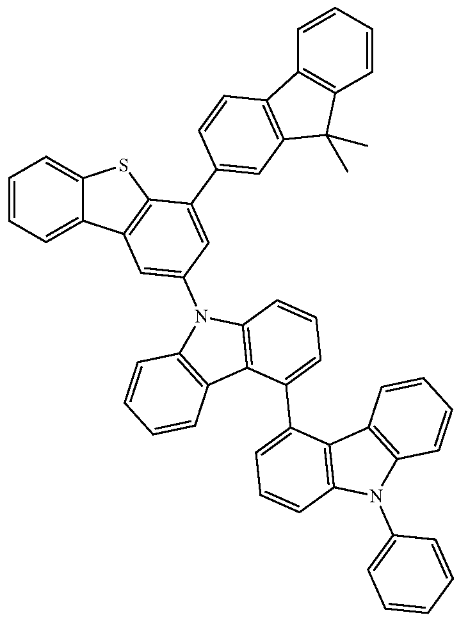

104

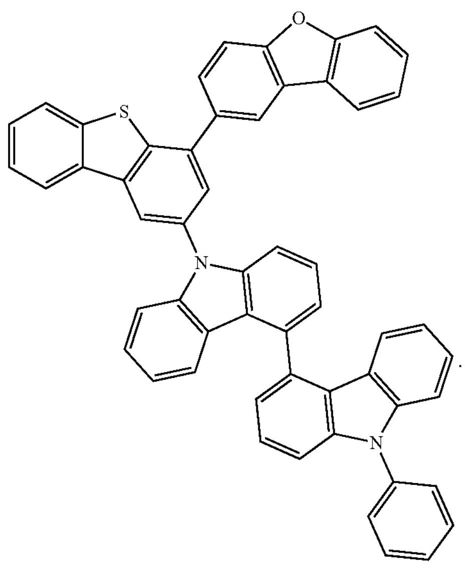

10. The organic light emitting device of claim 1, wherein the organic material layer comprises at least one of a hole blocking layer, an electron injection layer and an electron transfer layer, and at least one of the hole blocking layer, the electron injection layer and the electron transfer layer comprises the heterocyclic compound represented by Chemical Formula 1 and the heterocyclic compound represented by Chemical Formula 24.

11. The organic light emitting device of claim 1, wherein the organic material layer comprises a light emitting layer, the light emitting layer comprises a host material, and the host material comprises the heterocyclic compound represented by Chemical Formula 1 and the heterocyclic compound represented by Chemical Formula 24.

12. The organic light emitting device of claim 1, wherein the organic material layer comprises a light emitting layer, the light emitting layer comprises a host material and a dopant material, and the host material comprises the heterocyclic compound represented by Chemical Formula 1 and the heterocyclic compound represented by Chemical Formula 24; and the dopant material is included in greater than or equal to 1 parts by weight and less than or equal to 15 parts by weight with respect to 100 parts by weight of the host material.

13. The organic light emitting device of claim 1, comprising one, two or more layers selected from the group consisting of a light emitting layer, a hole injection layer, a hole transfer layer, an electron injection layer, an electron transfer layer, an electron blocking layer and a hole blocking layer.

14. A composition for an organic material layer of an organic light emitting device, the composition comprising:

a heterocyclic compound represented by the following Chemical Formula 1; and a compound represented by the following Chemical Formula 24:

[Chemical Formula 1]

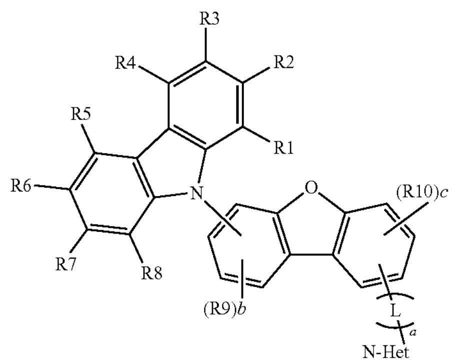

[Chemical Formula 24]

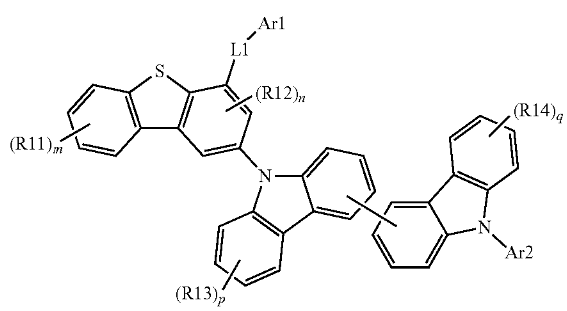

in Chemical Formulae 1 and 24,

N-Het is a monocyclic or polycyclic heterocyclic group substituted or unsubstituted and comprising one or more Ns;

L and L1 are a direct bond; a substituted or unsubstituted C6 to C60 arylene group; or a substituted or unsubstituted C2 to C60 heteroarylene group, a is an integer of 1 to 3, and when a is 2 or greater, Ls are the same as or different from each other;

R1 to R14 are the same as or different from each other, and each independently selected from the group consisting of hydrogen; deuterium; halogen; a cyano group; a substituted or unsubstituted C1 to C60 alkyl group; a substituted or unsubstituted C2 to C60 alkenyl group; a substituted or unsubstituted C2 to C60 alkynyl group; a substituted or unsubstituted C2 to C60 alkoxy group; a substituted or unsubstituted C3 to C60 cycloalkyl group; a substituted or unsubstituted C2 to C60 heterocycloalkyl group; a substituted or unsubstituted C6 to C60 aryl group; a substituted or unsubstituted C2 to C60 heteroaryl group; a substituted or unsubstituted phosphine oxide group; and a substituted or unsubstituted amine group, or two or more groups adjacent to each other bond to each other to form a substituted or unsubstituted C6 to C60 aromatic hydrocarbon ring or a substituted or unsubstituted C2 to C60 heteroring;

b and c are each an integer of 1 to 3;

when b is 2 or greater, R9s are the same as or different from each other, and when c is 2 or greater, R10s are the same as or different from each other;

m, p and q are an integer of 0 to 4;

n is an integer of 0 to 2;

when m is 2 or greater, R11s are the same as or different from each other, when n is an integer of 2, R12s are the same as or different from each other, when p is 2 or greater, R13s are the same as or different from each other, and when q is 2 or greater, R14s are the same as or different from each other;

Ar1 is a substituted or unsubstituted C6 to C60 aryl group; or a C2 to C60 heteroaryl group substituted or unsubstituted and comprising at least one of S and O; and Ar2 is a substituted or unsubstituted C6 to C60 aryl group; or a substituted or unsubstituted C2 to C60 heteroaryl group.

15. The composition for an organic material layer of an organic light emitting device of claim 14, wherein, in the composition, the heterocyclic compound represented by Chemical Formula 1: the heterocyclic compound represented by Chemical Formula 24 have a weight ratio of 1:10 to 10:1.

16. A method for manufacturing an organic light emitting device, the method comprising:

preparing a substrate;

forming a first electrode on the substrate;

forming one or more organic material layers on the first electrode; and forming a second electrode on the organic material layer, wherein the forming of organic material layers comprises forming one or more organic material layers using the composition for an organic material layer of claim 14.

17. The method for manufacturing an organic light emitting device of claim 16, wherein the forming of organic material layers is forming using a method of thermal vacuum deposition after pre-mixing the heterocyclic compound of Chemical Formula 1 and the heterocyclic compound of Chemical Formula 24.

* * * * *